(12) United States Patent
Liu et al.

(10) Patent No.: US 11,121,176 B2
(45) Date of Patent: Sep. 14, 2021

(54) NEARLY 2D ELECTRONIC MICROPARTICLES

(71) Applicant: MASSACHUSETTS INSTITUTE OF TECHNOLOGY, Cambridge, MA (US)

(72) Inventors: Tianxiang Liu, Cambridge, MA (US); Pingwei Liu, Malden, MA (US); Volodymyr Koman, Cambridge, MA (US); Daichi Kozawa, Cambridge, MA (US); Michael S. Strano, Lexington, MA (US)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 0 days.

(21) Appl. No.: 16/114,185

(22) Filed: Aug. 27, 2018

(65) Prior Publication Data

US 2020/0027921 A1  Jan. 23, 2020

Related U.S. Application Data

(63) Continuation of application No. PCT/US2018/039876, filed on Jun. 27, 2018.
(Continued)

(51) Int. Cl.
*H01L 27/24* (2006.01)
*H01L 31/02* (2006.01)
(Continued)

(52) U.S. Cl.
CPC ........ *H01L 27/24* (2013.01); *H01L 31/02021* (2013.01); *H01L 31/022425* (2013.01);
(Continued)

(58) Field of Classification Search
CPC .......... B01J 13/02; B82Y 10/00; B82Y 15/00; G01N 27/12; H01G 11/36; H01L 27/24;
(Continued)

(56) References Cited

U.S. PATENT DOCUMENTS 9,580,325 B2  2/2017  Zhamu et al.
9,656,862 B2  5/2017  Xie et al.
(Continued)

FOREIGN PATENT DOCUMENTS

WO  2009143405  11/2009
WO  2012006657  1/2012
(Continued)

OTHER PUBLICATIONS

International Search Report an Written Opinion of the International Searching Authority, PCT/US2018/039876, dated Nov. 9, 2018.
(Continued)

*Primary Examiner* — Jennifer Wecker
(74) *Attorney, Agent, or Firm* — Honigman LLP

(57) ABSTRACT

An particle can include a first sheet comprising a layer including a first material, wherein the first sheet includes a first outer surface and a first inner surface; and a second sheet comprising a layer including a second material, where the second sheet includes a second outer surface and a second inner surface, wherein the first sheet and the second sheet form a space, the space is encapsulated by the first sheet and the second sheet.

25 Claims, 227 Drawing Sheets

Related U.S. Application Data

(60) Provisional application No. 62/525,752, filed on Jun. 28, 2017.

(51) Int. Cl.
    *H01L 31/18*     (2006.01)
    *H01L 45/00*     (2006.01)
    *G01N 27/12*     (2006.01)
    *H01L 31/0224*     (2006.01)
    *H01L 31/072*     (2012.01)

(52) U.S. Cl.
    CPC ........ *H01L 31/072* (2013.01); *H01L 31/1864* (2013.01); *H01L 45/1253* (2013.01); *H01L 45/142* (2013.01); *H01L 45/1608* (2013.01); *G01N 27/12* (2013.01)

(58) Field of Classification Search
    CPC ............. H01L 29/0673; H01L 29/0847; H01L 29/78681; H01L 31/02021; H01L 31/022425; H01L 31/072; H01L 31/1864; H01L 45/1253; H01L 45/142; H01L 45/1608

See application file for complete search history.

(56) References Cited

U.S. PATENT DOCUMENTS

| | | | |
|---|---|---|---|
| 2011/0089403 A1* | 4/2011 | Woo | B82Y 10/00 257/29 |
| 2012/0121973 A1 | 5/2012 | Seo et al. | |
| 2012/0208088 A1 | 8/2012 | Xie et al. | |
| 2013/0295374 A1* | 11/2013 | Tang | B82Y 30/00 428/323 |
| 2014/0030590 A1* | 1/2014 | Wang | H01G 11/32 429/211 |
| 2014/0159181 A1 | 6/2014 | Kim et al. | |
| 2014/0162390 A1* | 6/2014 | Afzali-Ardakani | G01N 33/5438 438/49 |
| 2015/0218003 A1 | 8/2015 | Zhamu et al. | |
| 2015/0238929 A1* | 8/2015 | Wei | C01B 32/174 502/401 |

FOREIGN PATENT DOCUMENTS

| | | | | |
|---|---|---|---|---|
| WO | 2012109665 | | 8/2012 | |
| WO | WO-2012109665 A1 * | | 8/2012 | ............ H01M 8/065 |

OTHER PUBLICATIONS

Written Opinion of the International Preliminary Examining Authority, PCT/US2018/039876, dated Nov. 9, 2018.

Notification Concerning Transmittal of International Preliminary Report on Patentability for PCT/US2018/039876 dated Jan. 9, 2020.

* cited by examiner

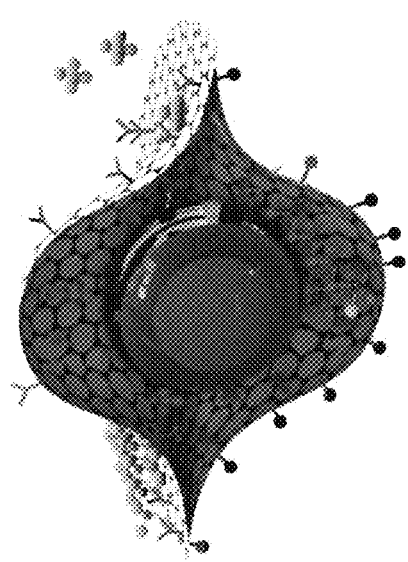
FIG. 1A
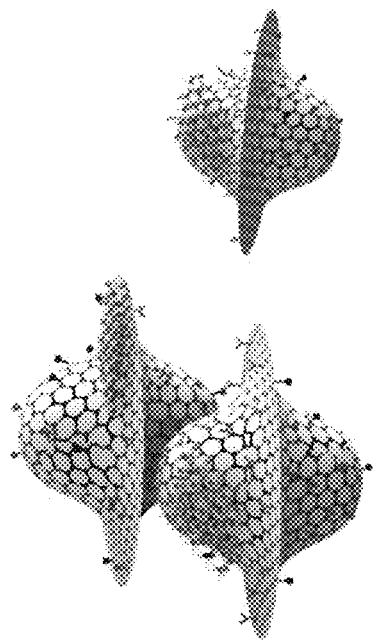
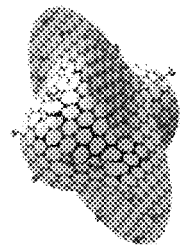
FIG. 1B

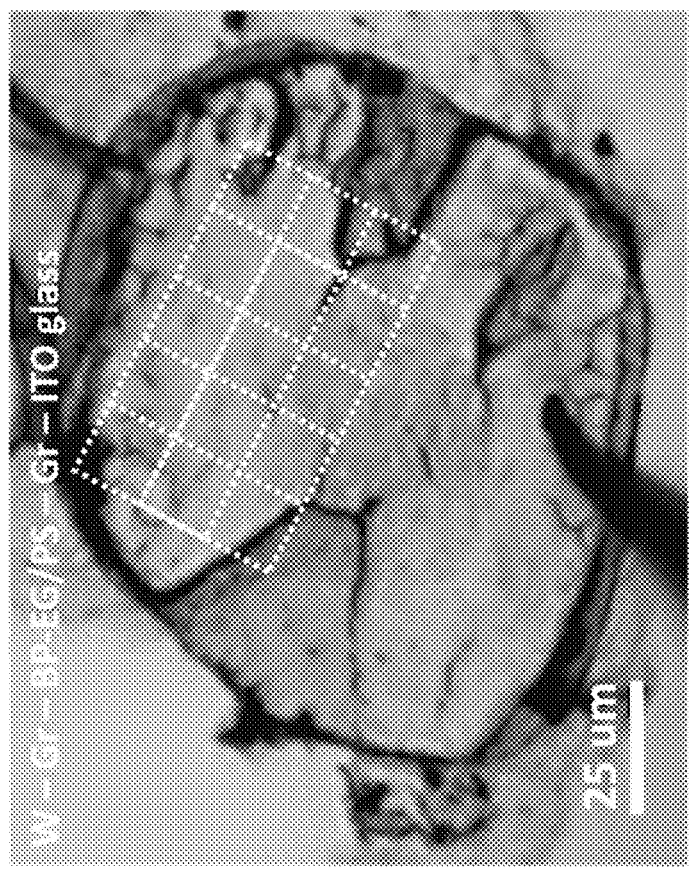
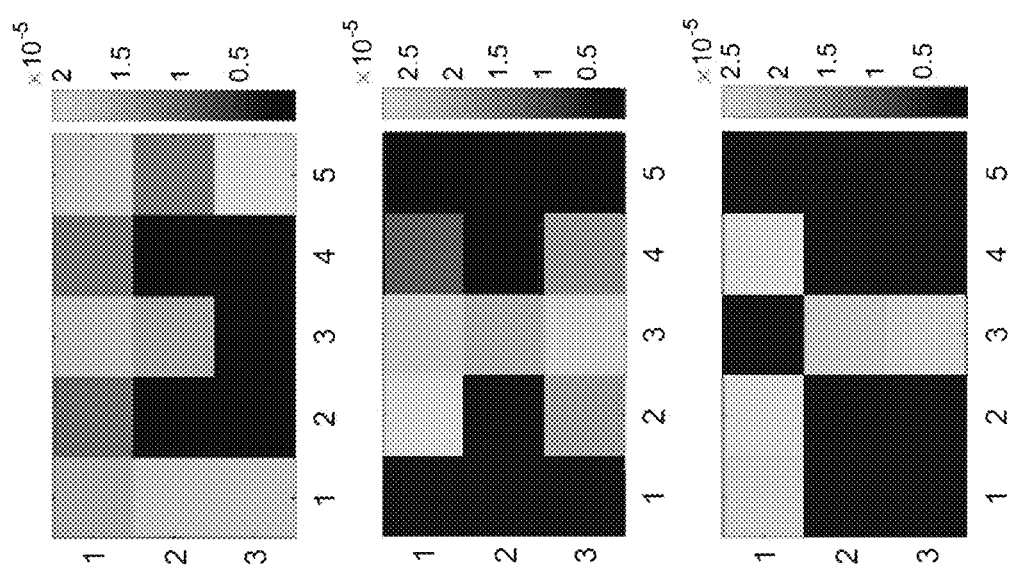
FIG. 5

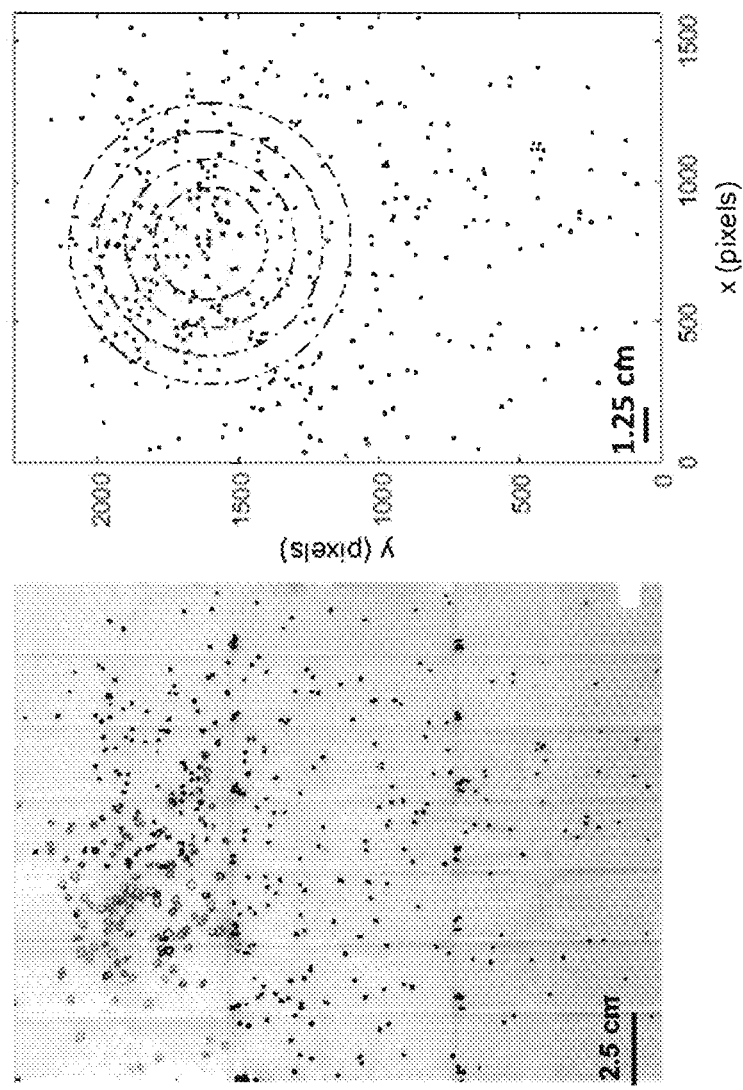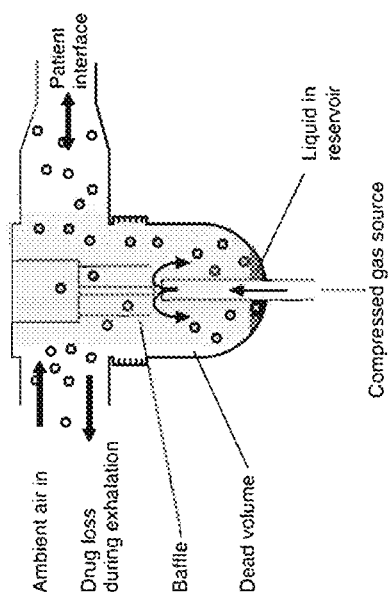
FIG. 6

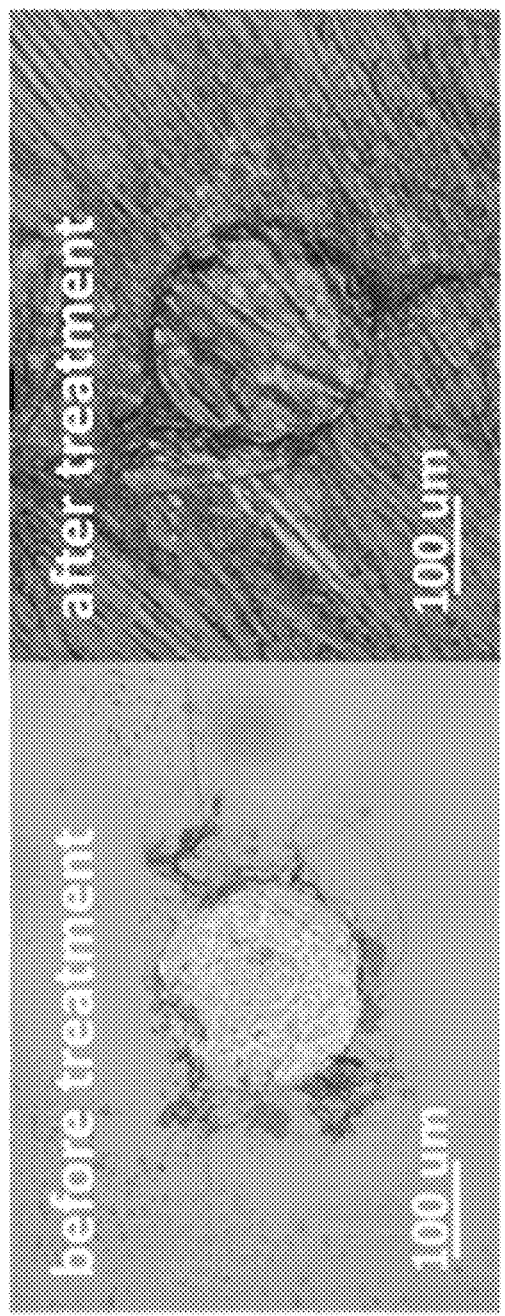
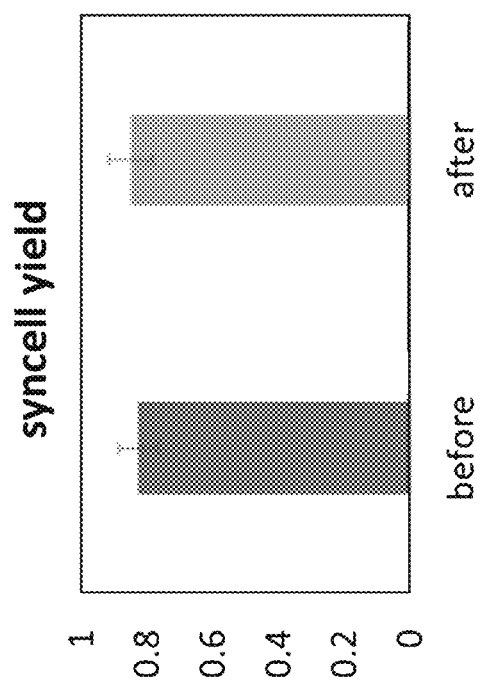
FIG. 8

FIG. 9A

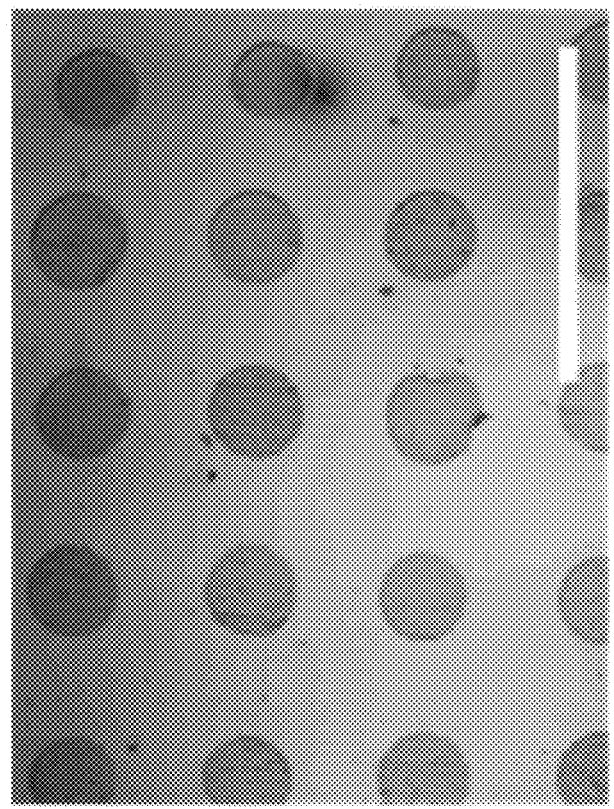
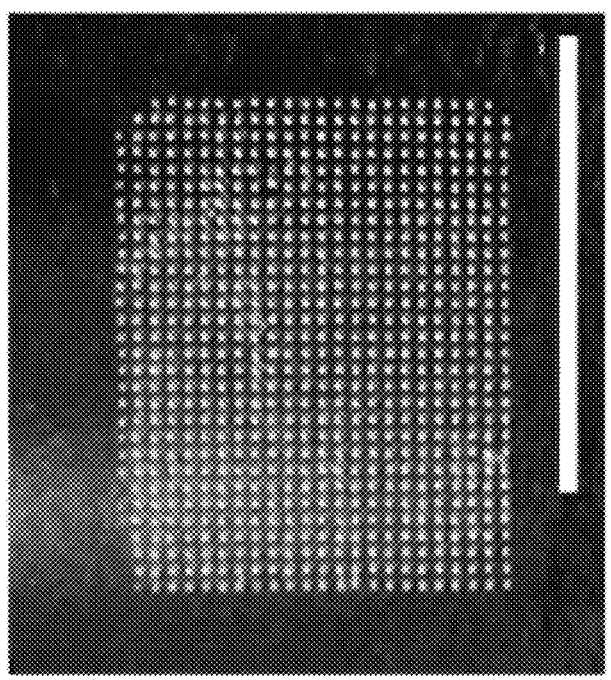
FIG. 11E

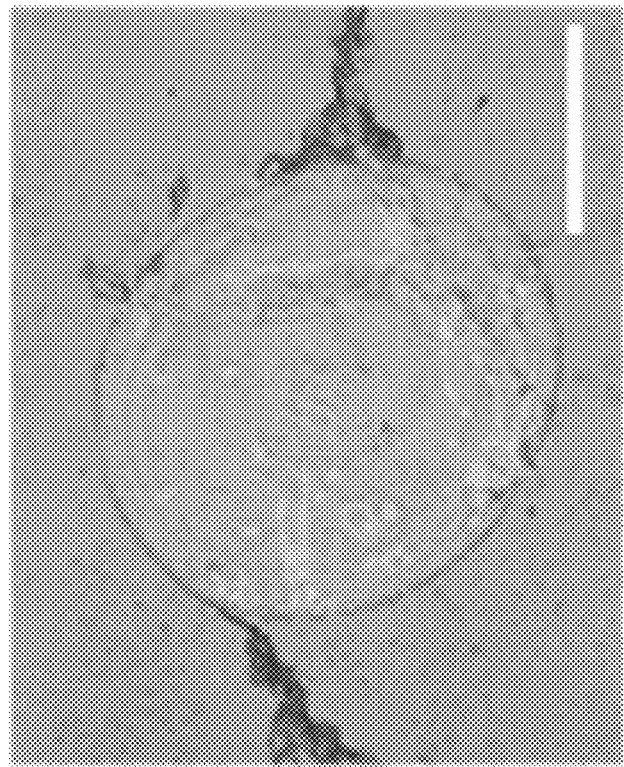
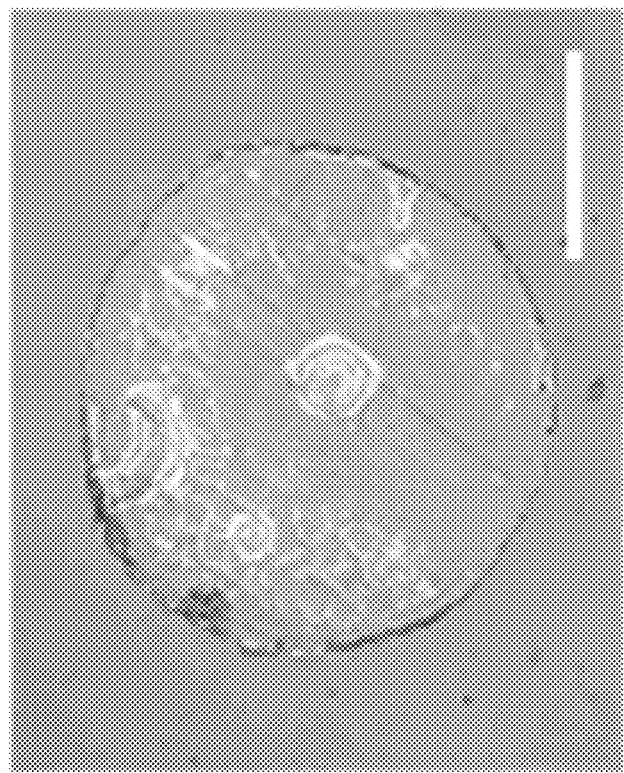
FIG. 11G

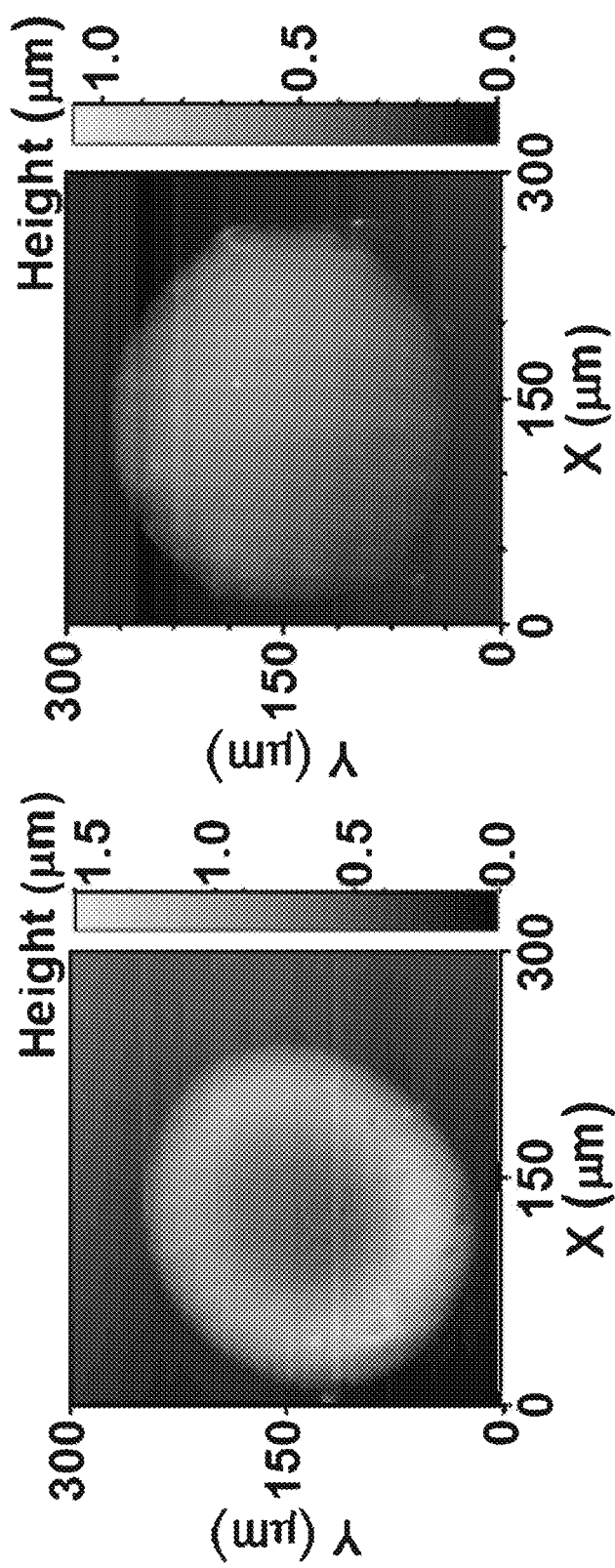
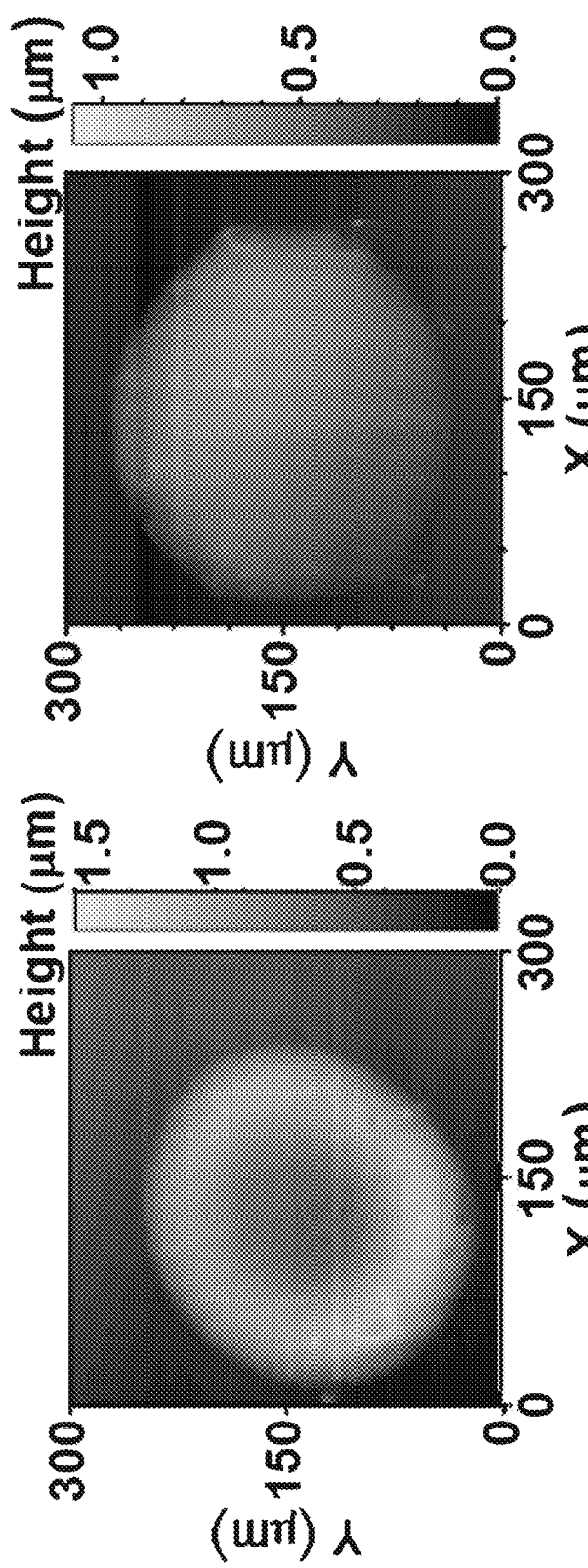
FIG. 12C
FIG. 12B

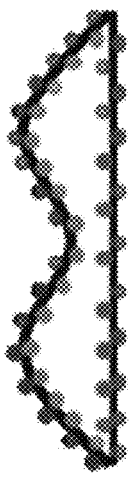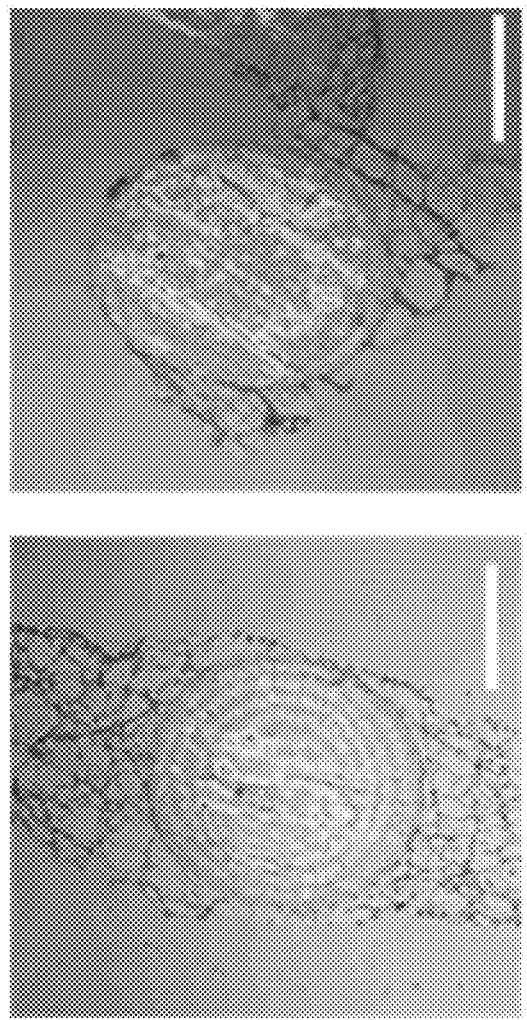
FIG. 12F

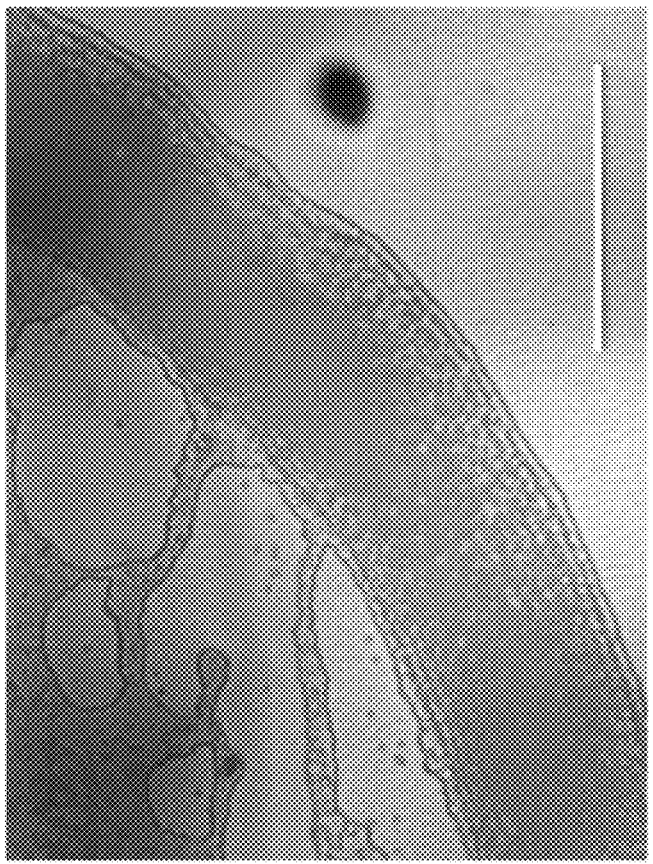
FIG. 15A

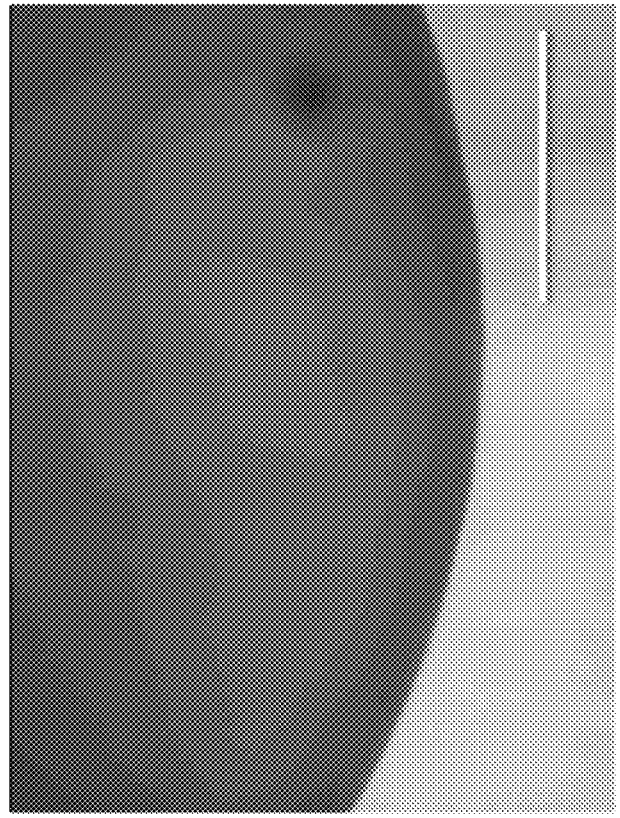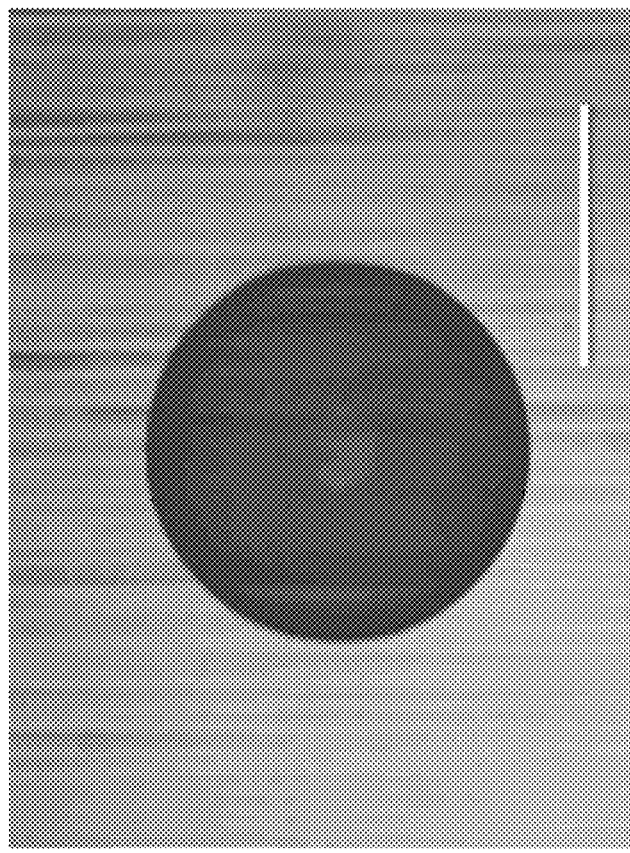
FIG. 15B

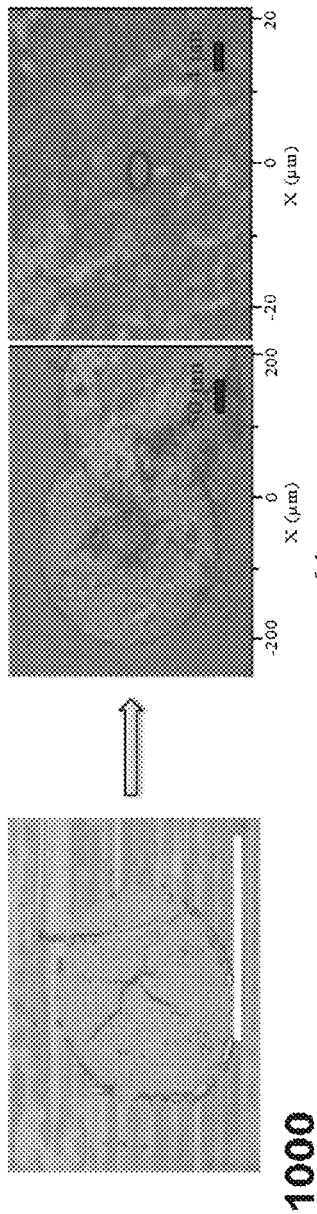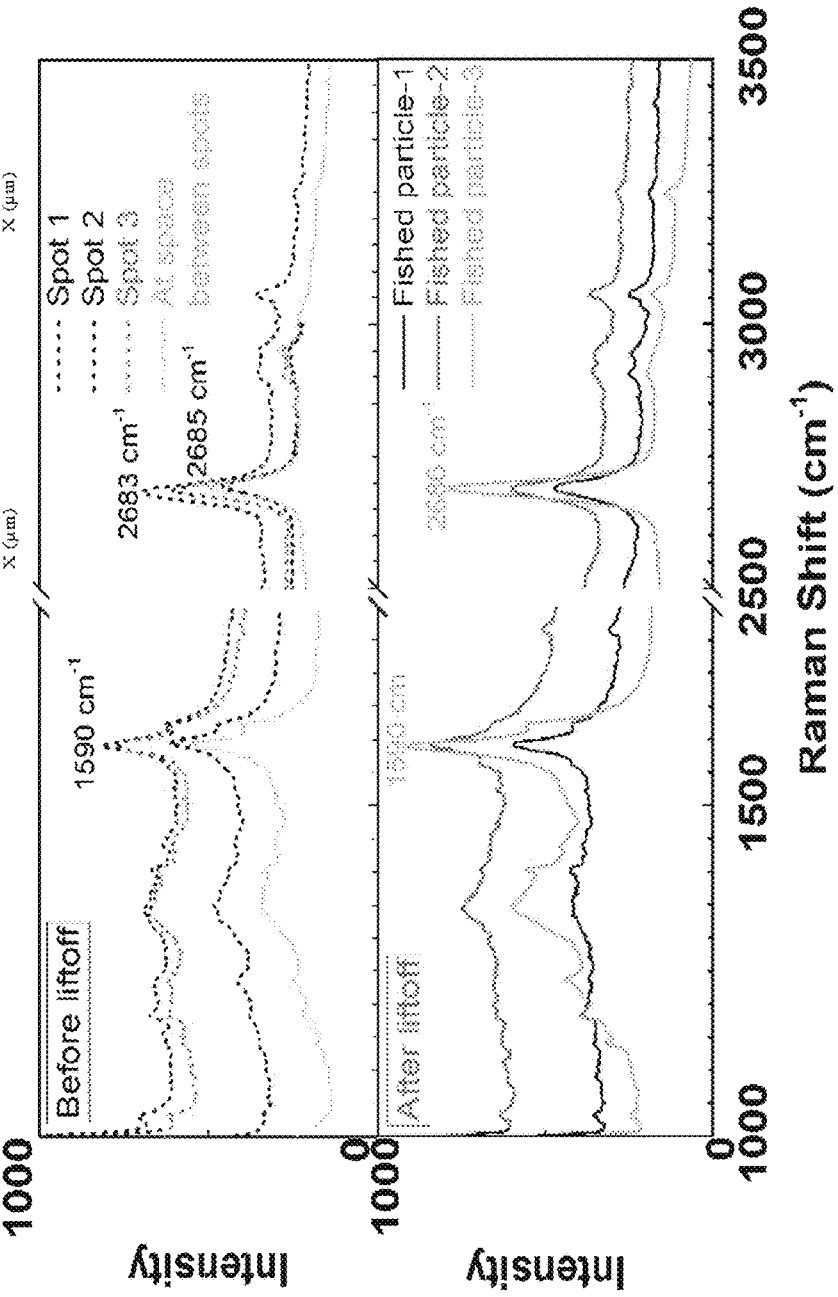
FIG. 23A
FIG. 23B

| Spot | Before liftoff | | | After liftoff | | | |
|---|---|---|---|---|---|---|---|
| | G peak intensity | 2D Peak intensity | $I_{2D}/I_G$ | Fished particle | G Peak intensity | 2D peak intensity | $I_{2D}/I_G$ |
| 1 | 204 | 210 | 1.0 | 1 | 222 | 250 | 1.1 |
| 2 | 176 | 356 | 2.0 | 2 | 215 | 260 | 1.2 |
| 3 | 255 | 341 | 1.3 | 3 | 504 | 613 | 1.2 |
| At Space | 265 | 270 | 1.0 | | | | |

FIG. 23C

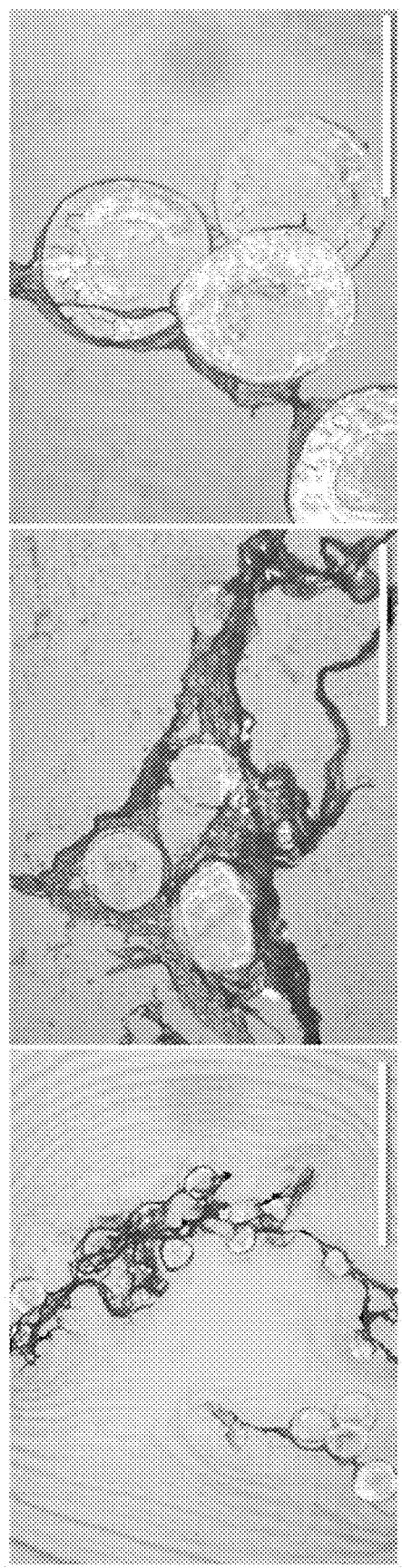

FIG. 36

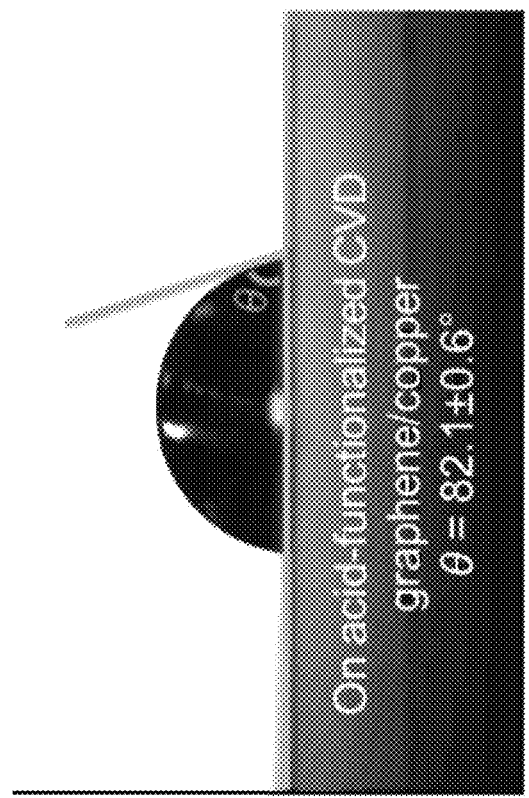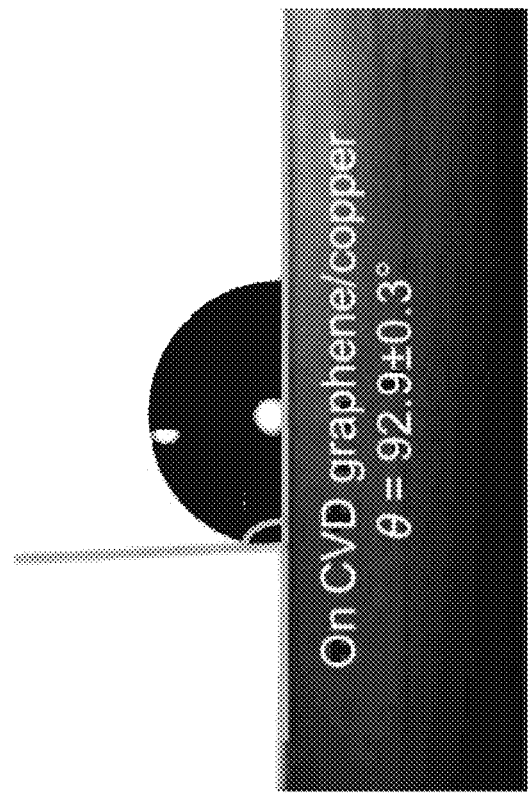
FIG. 37D $$R = 2R_c + \frac{R_{sh}}{W}L$$

$R_c$ = Contact resistance
$R_{sh}$ = sheet resistance
L = electrode distance
W = 5 μm

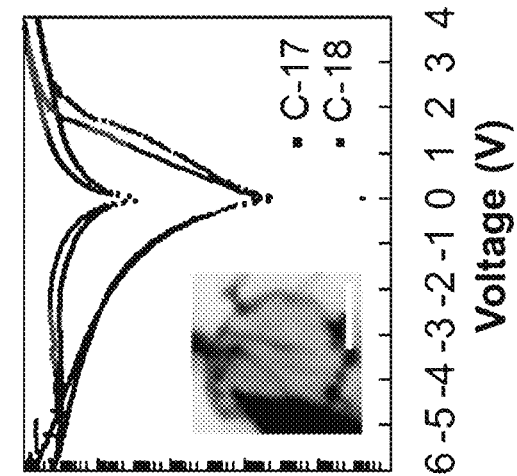
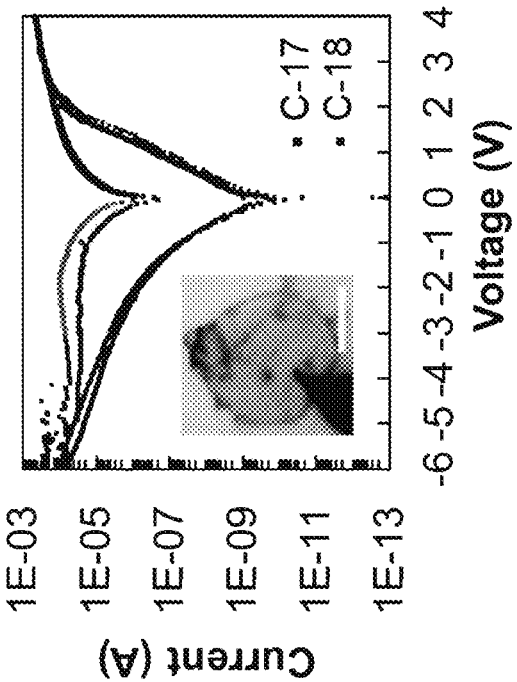
FIG. 53A
FIG. 53B

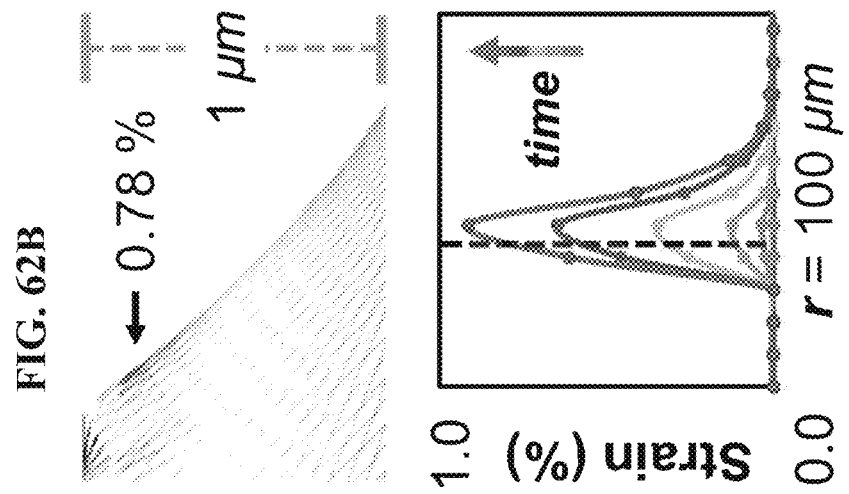
FIG. 62B
FIG. 62C
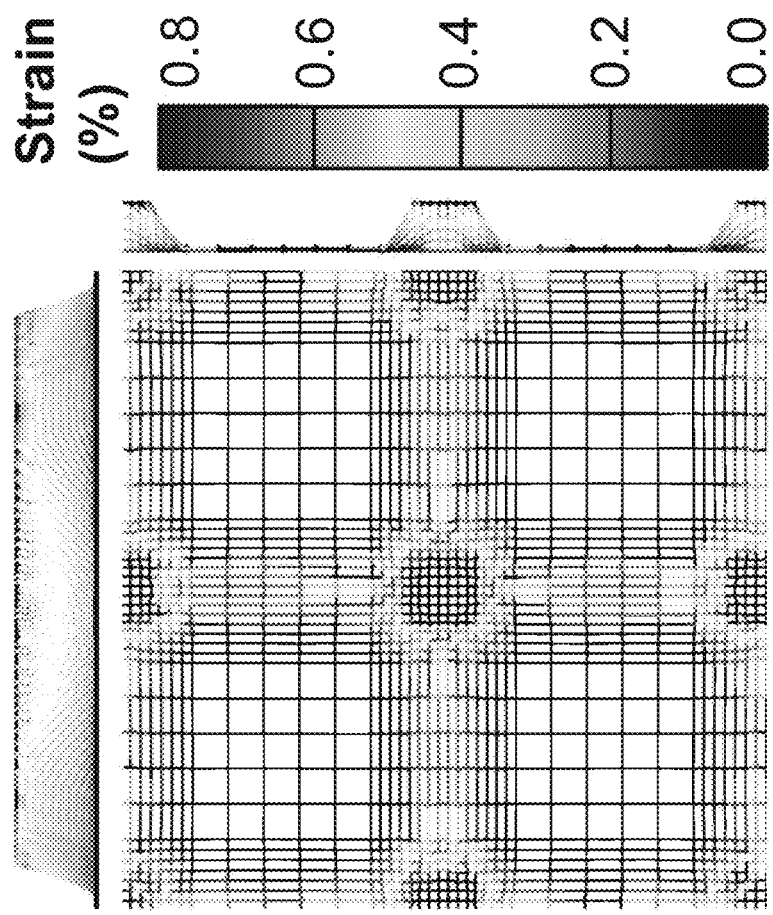
FIG. 62A

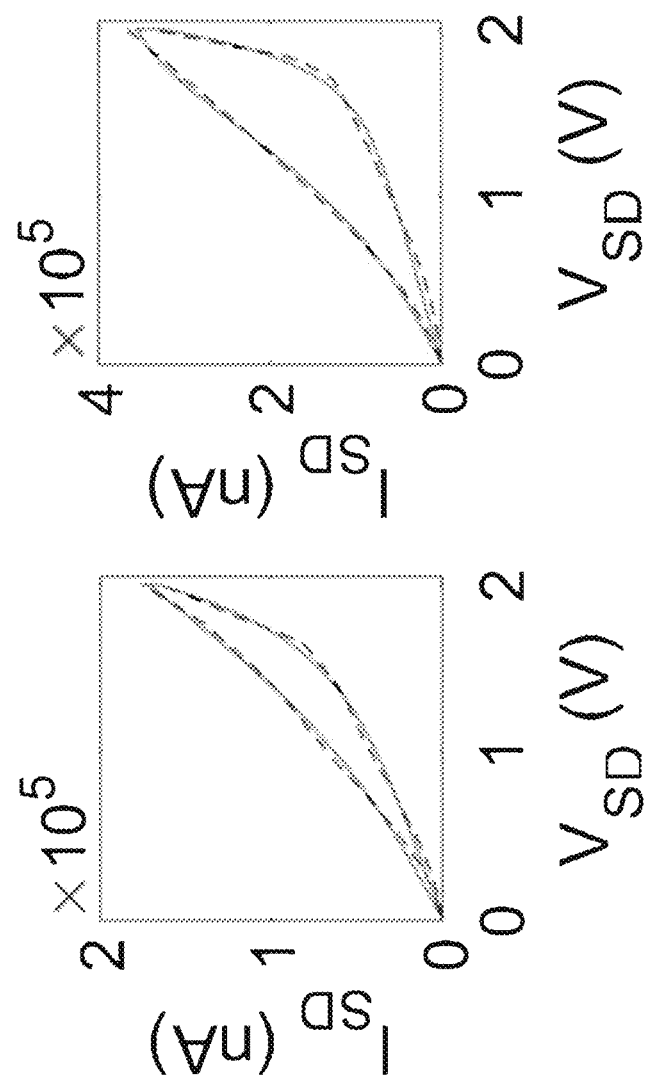

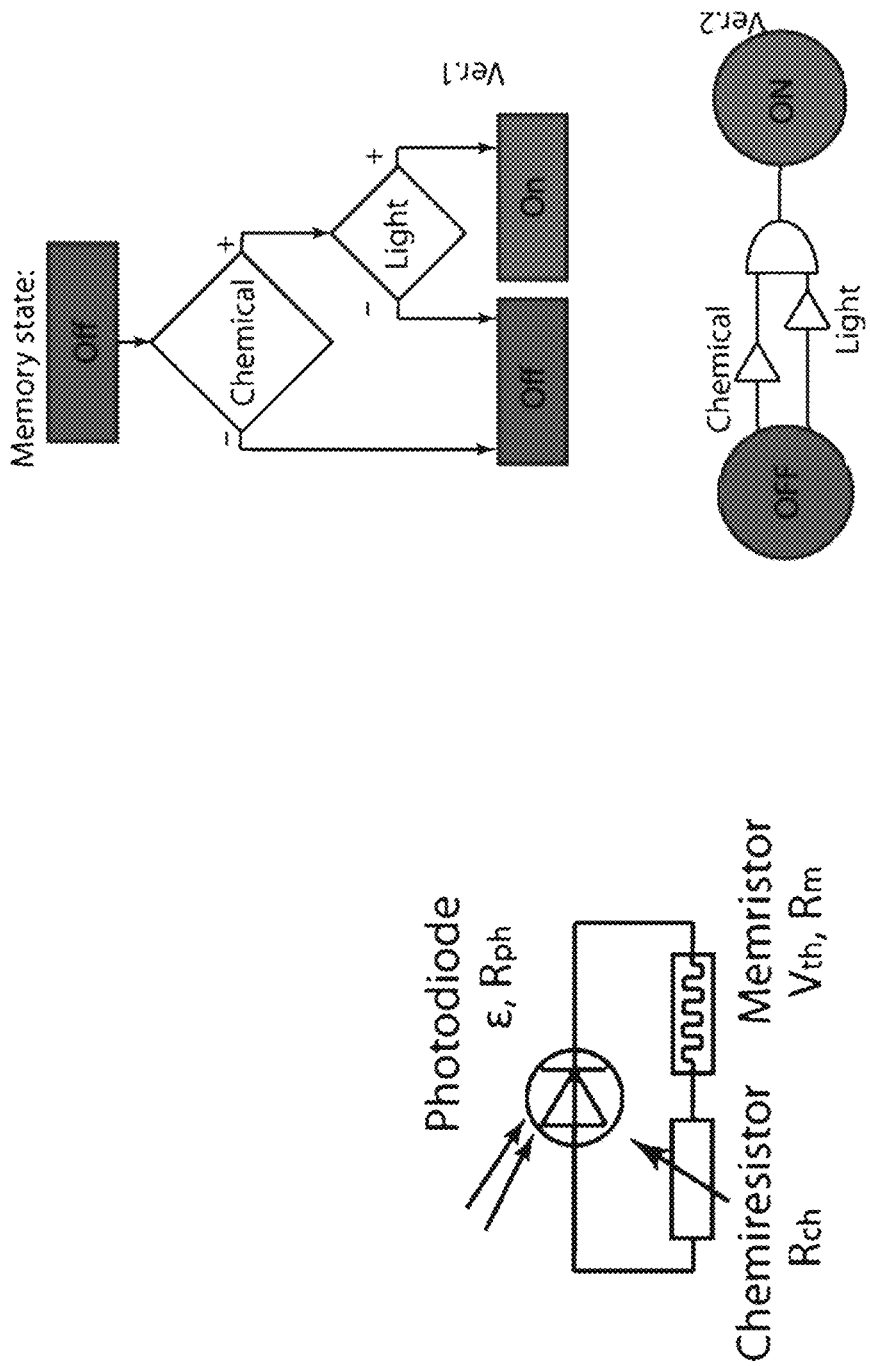

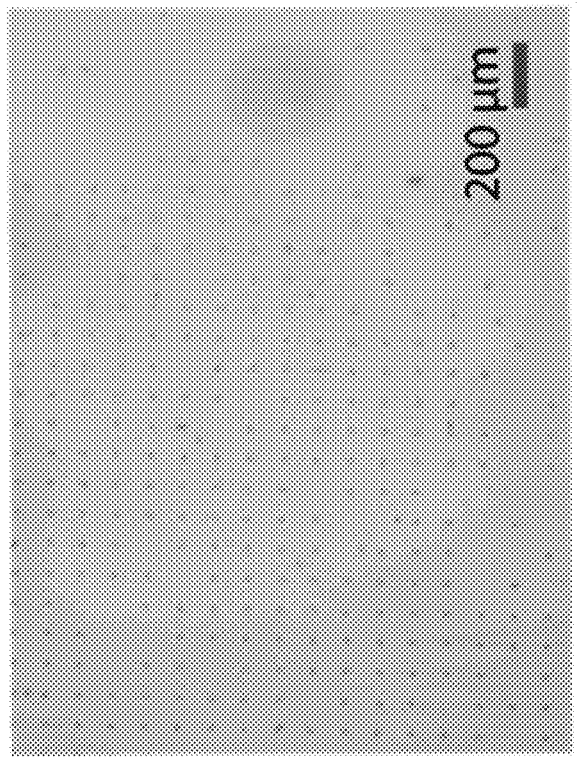
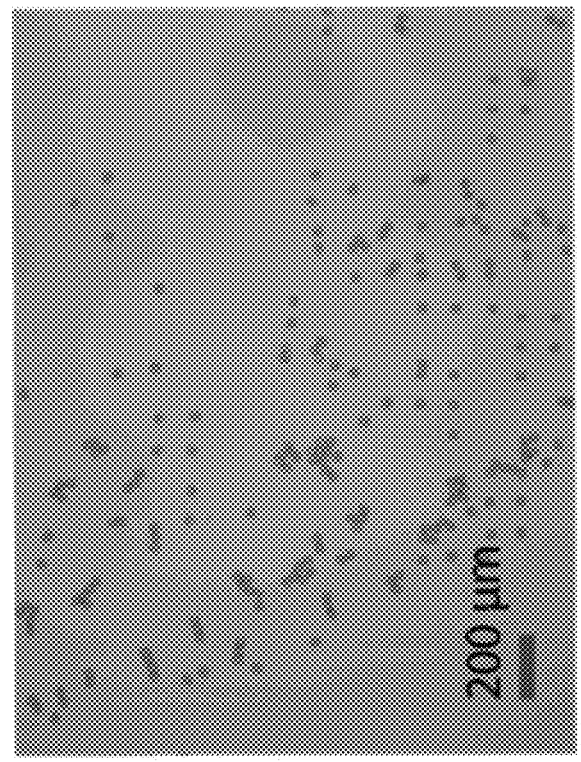
FIG. 71 (continued)

(1): Turbulent distortion during propulsion

Nozzle

CSMs in liquid droplets (2) Collision during landing (3) Capillary forces during drying

FIG. 75A

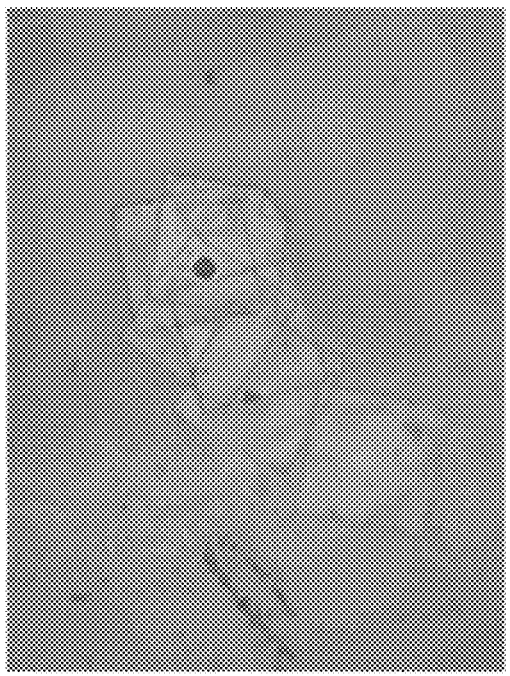
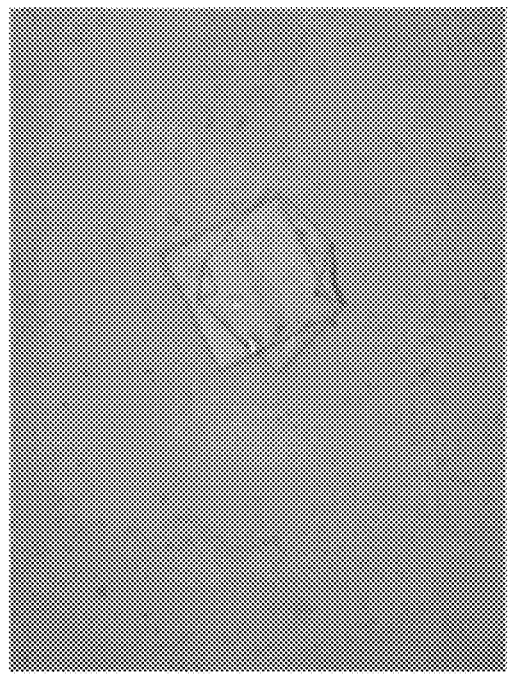
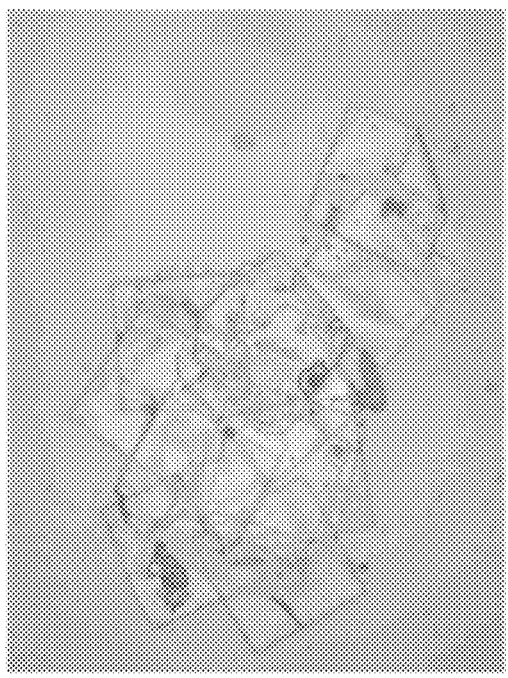
FIG. 75B

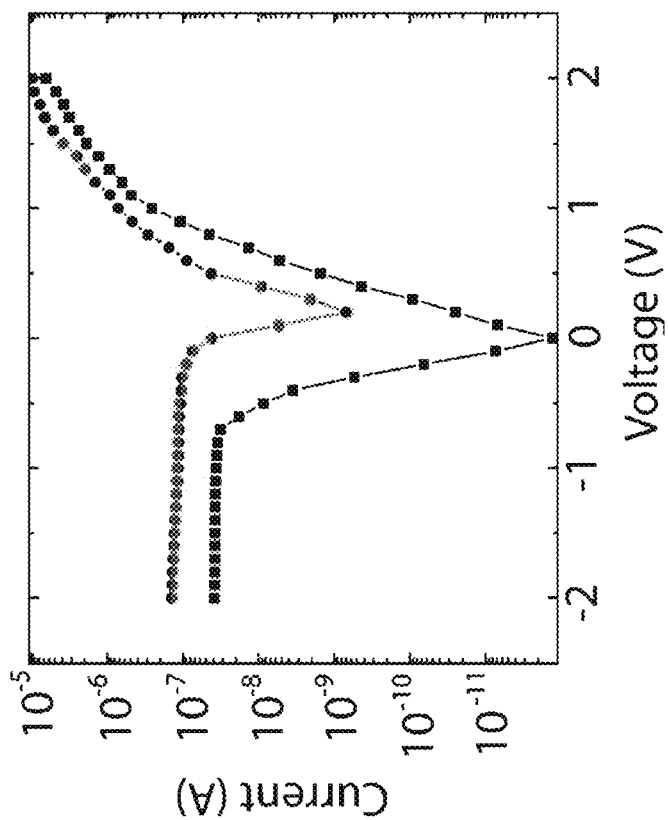
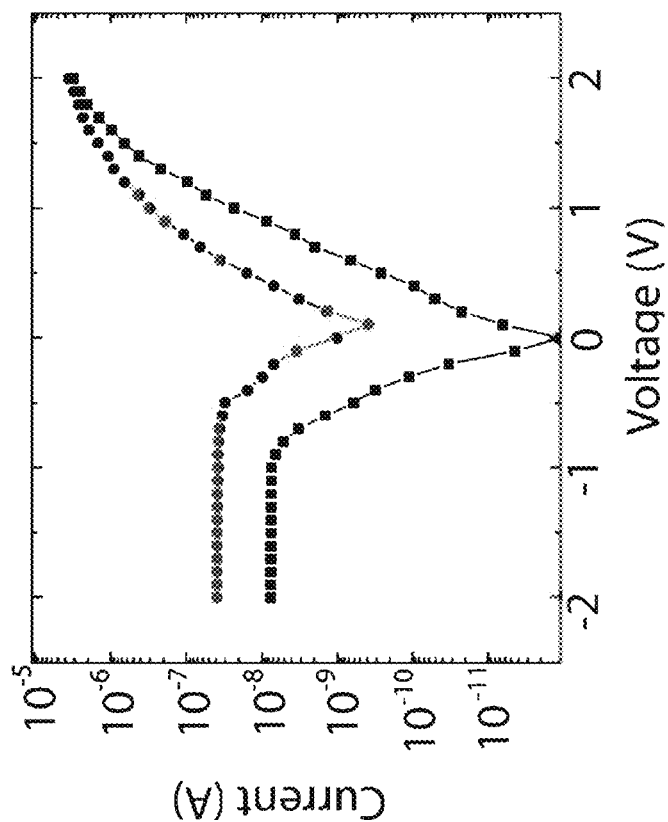
FIG. 81A
FIG. 81B

FIG. 100A

NEARLY 2D ELECTRONIC MICROPARTICLES

CLAIM OF PRIORITY

This application is a continuation which claims priority to International Application No.: PCT/US2018/39876, filed Jun. 27, 2018, which claims the benefit of prior U.S. Provisional Application No. 62/525,752, filed on Jun. 28, 2017, which is incorporated by reference in its entirety.

TECHNICAL FIELD

This invention relates to electronic microparticles.

BACKGROUND

Graphene and other 2D materials with atomic thickness exhibit exotic mechanical strength and flexibility and/or functional properties that have significantly advanced numerous fields of science and technology in the past decade. See, Novoselov, K. S. et al. Electric Field Effect in Atomically Thin Carbon Films. Science 306, 666-669, doi: 10.1126/science.1102896 (2004), which is incorporated by reference in its entirety. Heterojunctions or composites (e.g. with other nanoparticles) derived from such materials can generate various micro- or nanosized functional hybrids as electronics, optoelectronics, catalysts, sensors, energy storage/generation devices amongst others. See, Liu, Y. et al. Van der Waals heterostructures and devices. *Nature Reviews Materials* 1, 16042, doi:10.1038/natrevmats.2016.42 (2016), Novoselov, K. S., Mishchenko, A., Carvalho, A. & Castro Neto, A. H. 2D materials and van der Waals heterostructures. *Science* 353, doi:10.1126/science.aac9439 (2016), Yin, P. T., Shah, S., Chhowalla, M. & Lee, K.-B. Design, Synthesis, and Characterization of Graphene-Nanoparticle Hybrid Materials for Bioapplications. *Chemical Reviews* 115, 2483-2531, doi:10.1021/cr500537t (2015), Fiori, G. et al. Electronics based on two-dimensional materials. Nat Nano 9, 768-779, doi:10.1038/nnano.2014.207 (2014), Wang, Q. H., Kalantar-Zadeh, K., Kis, A., Coleman, J. N. & Strano, M. S. Electronics and optoelectronics of two-dimensional transition metal dichalcogenides. *Nat Nano* 7, 699-712 (2012), Deng, D. et al. Catalysis with two-dimensional materials and their heterostructures. *Nat Nano* 11, 218-230, doi:10.1038/nnano.2015.340 (2016), Shao, Y. et al. Graphene Based Electrochemical Sensors and Biosensors: A Review. *Electroanalysis* 22, 1027-1036, doi: 10.1002/elan.200900571 (2010), El-Kady, M. F., Shao, Y. & Kaner, R. B. Graphene for batteries, supercapacitors and beyond. *Nature Reviews Materials* 1, 16033, doi:10.1038/natrevmats.2016.33 (2016), and Ferrari, A. C. et al. Science and technology roadmap for graphene, related two-dimensional crystals, and hybrid systems. *Nanoscale* 7, 4598-4810, doi:10.1039/C4NR01600A (2015), each of which is incorporated by reference in its entirety.

SUMMARY

In general, a particle can include a first sheet comprising a layer including a first material, wherein the first sheet includes a first outer surface and a first inner surface; and a second sheet comprising a layer including a second material, where the second sheet includes a second outer surface and a second inner surface, wherein the first sheet and the second sheet form a space, the space is encapsulated by the first sheet and the second sheet.

In certain embodiments, the first sheet further can include a second layer including the first material.

In certain embodiments, the second sheet can further include a second layer including the second material.

In certain embodiments, the first material can be graphene, molybdenum disulfide, hexagonal boron nitride (hBN), molybdenum diselenide, tungsten disulfide, tungsten diselenide, rhenium diselenide, rhenium disulfide, black phosphorus, platinum diselenide, tin sulfide, or tin selenide.

In certain embodiments, the second material can be graphene, molybdenum disulfide, hexagonal boron nitride (hBN), molybdenum diselenide, tungsten disulfide, tungsten diselenide, rhenium diselenide, rhenium disulfide, black phosphorus, platinum diselenide, tin sulfide, or tin selenide.

In certain embodiments, the first outer surface can be functionalized.

In certain embodiments, the first outer surface can be covalently functionalized.

In certain embodiments, the first outer surface can be noncovalently functionalized.

In certain embodiments, the first outer surface can be functionalized via π-π stacking.

In certain embodiments, the first inner surface can be functionalized.

In certain embodiments, the first outer surface can be covalently functionalized.

In certain embodiments, the first outer surface can be noncovalently functionalized.

In certain embodiments, the first outer surface can be functionalized via π-π stacking.

In certain embodiments, the second outer surface can be functionalized.

In certain embodiments, the first outer surface can be covalently functionalized.

In certain embodiments, the first outer surface can be noncovalently functionalized.

In certain embodiments, the first outer surface can be functionalized via π-π stacking.

In certain embodiments, the second inner surface can be functionalized.

In certain embodiments, the first outer surface can be covalently functionalized.

In certain embodiments, the first outer surface can be noncovalently functionalized.

In certain embodiments, the first outer surface can be functionalized via π-π stacking.

In certain embodiments, the first sheet can include a plurality of nanopores.

In certain embodiments, the second sheet can include a plurality of nanopores.

In certain embodiments, the space can include a composition.

In certain embodiments, the composition can include electronics.

In certain embodiments, the composition can include liquid.

In certain embodiments, the composition can include gel.

In certain embodiments, the composition can include a nanoparticle.

In another aspect, a method of making a particle can include preparing a first sheet including a first substrate and a first layer comprising a first material on a first substrate, wherein the first sheet includes a first outer surface and a first inner surface, depositing a composition, preparing a second sheet including a second substrate and a second sheet comprising a second material on the second substrate, wherein the second sheet includes a second outer surface and a first inner surface, annealing the first sheet and the second sheet, and autoperforating the first sheet and the second sheet.

In certain embodiments, the method can further include functionalizing the first outer surface.

In certain embodiments, the functionalizing can include covalent bonds.

In certain embodiments, the functionalizing can include non-covalent bonds.

In certain embodiments, the functionalizing can include π-π stacking.

In certain embodiments, the autoperforating can include selectively dissolving the first substrate and the second substrate.

In certain embodiments, the autoperforating can include applying mechanical force or heat treatment.

In certain embodiments, the first sheet can further include a second layer including the first material.

In certain embodiments, the second sheet can further include a second layer including the second material.

In certain embodiments, the composition can include electronics.

In certain embodiments, the composition can include liquid.

In certain embodiments, the composition can include gel.

In certain embodiments, the composition can include a nanoparticle.

In another aspect, a method of detecting an analyte can include applying the particle including a first sheet comprising a layer including a first material, wherein the first sheet includes a first outer surface and a first inner surface; and a second sheet comprising a layer including a second material, where the second sheet includes a second outer surface and a second inner surface, wherein the first sheet and the second sheet form a space, the space is encapsulated by the first sheet and the second sheet, wherein the space includes a sensor and detecting the analyte with the sensor.

In certain embodiments, the particle can be present in a solution.

In certain embodiments, the applying the particle can include aerosolizing the particle in a solution.

In another aspect, a device can include a sheet including a substrate material, a power source on the substrate, a switch on the substrate and a memory element on the substrate.

In certain embodiments, the power source can be a photodetector.

In certain embodiments, the photodetector can generate voltage when it is illuminated with light.

In certain embodiments, the photodetector can include a p-n heterojunction.

In certain embodiments, the photodetector can include a monolayer including $MoS_2$ and a monolayer including $WSe_2$.

In certain embodiments, the switch can be a chemiresistor.

In certain embodiments, the chemiresistor can change conductance upon interaction with an analyte.

In certain embodiments, the chemiresistor can include a monolayer including $MoS_2$.

In certain embodiments, the memory element can be a memristor.

In certain embodiments, the memristor can be turned on when a voltage from the power source exceeds a threshold voltage and the chemiresistor detects an analyte.

In certain embodiments, the memristor can be positioned between a first electrode and a second electrode.

In certain embodiments, the first electrode can include gold.

In certain embodiments, the second electrode can include silver.

In certain embodiments, the memristor can include a material including $MoS_2$.

In certain embodiments, the substrate material can include a polymer

In certain embodiments, the polymer can include an epoxy polymer.

In certain embodiments, a thickness of the sheet can be no more than 5 μm.

In another aspect, a method of making a device can include preparing a substrate, depositing a first monolayer of including $MoS_2$ on the substrate, depositing a second monolayer including $WSe_2$ at least partially in contact with the monolayer including $MoS_2$, depositing a gold electrode on a portion of the first monolayer, depositing a gold electrode on a portion of the second monolayer, depositing a material including $MoS_2$ in contact with the gold electrode on the first monolayer and in contact with the second monolayer, depositing a silver electrode in contact with the gold electrode, and depositing a silver electrode in contact with the material including $MoS_2$.

In another aspect, a method of detecting an analyte can include applying the device including a sheet including a substrate material, a power source on the substrate, a switch on the substrate and a memory element on the substrate and detecting the analyte with the device.

In certain embodiments, the device can be present in a solution.

In certain embodiments, the applying the device can include aerosolizing the device in a solution.

Other aspects, embodiments, and features will be apparent from the following description, the drawings, and the claims.

BRIEF DESCRIPTION OF THE DRAWINGS

FIG. 1A shows an example of syncell: two graphene sheets encapsulate nanoparticle and nearly 2D devices. FIG. 1B shows different syncells form a functional aggregate.

FIG. 5 shows multiple bit memory mapping of the syncell surface (retrieved from a free-standing water solution).

FIG. 6 shows a commercial nebulizer was used to aerosolize the syncells and they travel through air for 30 cm before recaptured.

FIG. 8 shows optical micrographs and syncell yield before and after the SBET test.

FIGS. 9A-9E show syncells to detect solution droplets. FIG. 9A shows schematic of syncells in water sprayed, collected and dried. Droplet size <300 μm. FIGS. 9B-9C show electrical measurements and FIGS. 9D-9E show photoluminescence measurements before (red) and after (blue) exposure to triethylamine. Statistics in FIGS. 9C and 9E is collected over 25 different syncells.

FIG. 10A shows schematic of syncells incubated in saturated ammonia vapor (10 kPa) for 1 h. FIGS. 10B and 10C show electrical measurements and FIGS. 10D and 10E show photoluminescence measurements before (red) and after (green) exposure to ammonia. Statistics in FIGS. 10C and 10E is collected over 25 different syncells.

FIGS. 11A-11G show autoperforation of graphene for microparticle consisting of nanoparticles enclosed within graphene membrane. FIG. 11A shows the folding dynamics (or strain deveration) when stacking a thin polymer film (200 nm) onto a micropsot; microcylinder with an aspect ratio (radius/height=100/1) was used in the finite element analysis. FIG. 11B shows one-dimensional mechanical model of a thin film with an island under stretching force F, $\varepsilon_1$ and $\varepsilon_2$ are the strain of the film interior and exterior to the spot and his the height of the island. FIG. 11C shows numerical simulation of the fracture propagation of the 2D sheets (e.g. graphene) with encapsulated polymer (e.g. polystyrene) spot (h=1 μm), scale bar, 100 μm. FIG. 11D shows fabrication scheme of the microparticles with graphene: DA1, functionalizing graphene A with M1; DA2, spin-coating poly(methyl methacrylate) (PMMA) and etching out copper; DA3, functionalizing with M2; DB1, functionalizing graphene B with M3; DB2, spin-coating PMMA, etching out copper, and transferring PMMA/GB onto $SiO_2$/Si or PDMS; DB3, functionalizing with M4; AB4, inkjet printing nanoparticle ink; DC1, stacking; DC2, annealing; and DC3, liftoff via dissolving PMMA layers. FIG. 11E shows the spot array before liftoff, scale bars, 1.0 cm and 1.0 mm. FIG. 11F shows fracture and crack propagation of graphene layers around a single spot (t=3.7-4.8 s, scale bars, 100 μm) and multiple spots (t=6.2-9.4 s, 1000 μm) during liftoff under microscope. FIG. 11G shows typical microparticles sampled out from the solution after liftoff, 100 μm.

FIGS. 12A-12G show characterization of the microparticles after liftoff. FIG. 12A shows mapping the 2D peak (2680 $cm^{-1}$) intensity of graphene-PS-graphene (G-PS-G) microparticle via Raman spectroscopy. FIGS. 12B and 12C are the contour profiles of G-PS-G (1 nL, 1.2 wt % ink) and G-BP (0.9 wt %)/PS-G (1 nL, 1.2 wt % ink) microparticle. FIG. 12D is lateral profile curves of various micropartcles printed with 1-nL ink of different concentrations and compositions. FIG. 12E shows plot of the diameter (d) and height of G-PS-G microparticles against the ink volume, the inserted shows a particle with d ~34 μm, scale bar, 20 μm. FIG. 12F shows Janus particles with the broken chemistry symmetry, scale bars, 100 nm. FIG. 12G shows fluorescence images of microparticles with GIG, G/$MoS_2$, and $MoS_2$/$MoS_2$ surface; G is bilayer and $MoS_2$ is monolayer; scale bars, 100 μm.

FIG. 13A shows plot of in-plane conductivity vs. electrode distance for G-PS-G and PS control, the inserted shows the test setup. FIG. 13B shows cross-plane I-V curves of microparticles G-BP (0.9 wt %)/PS-G, G-PS-G, and BP/PS. FIG. 13C shows I-V curves of three successive sweeping of 0→2→0 V (switching 1), 0→4→0 V (2), and 0→6→0 V (3), and their fitting curves based on model. FIGS. 13D and 13E are scanning electron microscopy (SEM) images of BP/PS composites, and FIG. 13E is from energy selective back scattered detector, scale bars, 1 μm. FIG. 13F shows illustration of the percolated composite structure as a single memristor element of the microparticle. FIG. 13G shows writing letters of "M", "I", "T" in a 5×3 grid on a G-BP/PS-G microparticle via selective writing (0→4 V) or erasing (0→−4 V) of the grids with probe, scale bar, 100 μm. FIG. 13H shows plot the ON/OFF ratio N at 0.2 V of G-BP/PS-G against their storage time in ethanol/water (1:1), each hollow symbol represents a data point measured from a random. FIG. 13H shows a plot the ON/OFF ratio N at 0.2 V of G-BP/PS-G against their storage time in ethanol/water (1:1), each hollow symbol represents a data point measured from a random positon of an individual microparticle. Standard deviation represents an average over ~10 microparticles.

FIG. 14A shows aerosolization of G-PS-G via airbrush and their the selected area.

FIGS. 23A-23B shows optical microscopy images (FIG. 23A) and Raman spectra (FIG. 23B) of G-PS-G microparticles before and after liftoff. Bilayer graphene was used in the process and the blue spots represent the positon of the laser bean where the Raman spectroscopy signal was acquired. FIG. 23C is a quantitative analysis of the intensity and the G peak at 1590 $cm^{-1}$ and 2D peak and 2685 $cm^{-1}$ and their ratio before and after liftoff. $Si/SiO_2$ substrate was used in the fabrication. "Space" means the region at the exterior of the printed PS microspots.

FIG. 24A is the full spectra in range of 1000-3500 $cm^{-1}$ and FIG. 24B is the enlarged part at 2600-2800 $cm^{-1}$ to show the 2D peak from graphene. Control samples without graphene coverage is also included for comparison.

FIG. 27E is the study of G-ZnO (30 wt %)/PS-G microparticles after a storage time of 4 months, 24/44. All the microparticles were naturally dried on glass slides after fishing out via dropper and counted under microscopy with 5× or 20× objectives.

FIG. 28A shows fresh, 147 particles of 173 are good, yield=85%. FIG. 28B shows after a storage time of 9 weeks, 70/92, yield=76%. All the microparticles were naturally dried on glass slides after fishing out via dropper and counted under microscopy with 5× or 20× objectives.

FIG. 31A shows the plot of particle diameter, $h_{peak}$, and $h_{valley}$ with the solid content of PS ink, FG means 1-pyrenebutyric acid N-hydroxysuccinimide ester-functionalized bilayer graphene. Profile mapping and statistical data of particles produced with 0.2 wt % (FIG. 31B), 0.5 wt % (FIG. 31C), and 0.8 wt % ink (FIG. 31D). The PS ink is 100 nm latex solution (2.5 wt %) diluted with ethylene glycol (EG) and de-ionized water to the desired content, with an EG:water=1:1 in volume. The sample size is about 15-20 microparticles in the statistical study of each data point.

FIGS. 32A-32D show optical microscopy images of fished microparticles liftoff from bilayer graphene-encapsulated microspot array printed with 0.25 wt % PS latex nanoparticle ink (mean particle size=100 nm, in water/ethylene glycol (1:1) mixture), with $h_{peak}$=0.56±0.06 μm and $h_{valley}$=0.08±0.01 μm, scale bars are 800, 200, 200, and 100 μm respectively. FIG. 32E shows Raman mapping of 2D peak signal at 2680 $cm^{-1}$ of graphene from the particle shown in FIG. 32D.

FIG. 36 shows five functional molecules containing amine, carboxylic acid, —NHS groups as the candidates for M1, M2, M3, and M4. Other functional pyrene or naphthalene molecules with similar structure can also be used for the noncovalent modification of graphene via π-π stacking.

FIG. 37D shows water contact angle of CVD graphene and 1-pyrenebutyric acid-functionalized graphene, acid-functionalized graphene is more hydrophilic with a reduced contact angle. These results illustrate that CVD bilayer graphene can be functionalized noncovalently via functional pyrene molecules directly on copper substrate.

FIGS. 38A-38B show Raman spectra of pristine monolayer graphene, bilayer graphene, and their functionalized counterparts with $SiO_2$/Si wafer as support. FIG. 38C is data for bilayer graphene with PMMA layer on $SiO_2$/Si wafer. From pristine graphene, one-side modification, to both sides, the intensity of 2D peaks reduces while the G peak intensity increases continuously, and more small peaks attribute to —COOH or $NH_2$ groups emerge in range of 1000-1500 $cm^{-1}$ and these peaks become broad and blunt when both sides were functionalized. These demonstrate the successful introduction of functional groups via noncovalent functionalization and the breaking of the chemistry symmetry.

FIG. 39A is the optical image from microscope, scale bar=100 μm. FIG. 39B shows Raman mapping of the 2D peak at 2680 $cm^{-1}$. 1.25% wt % PS latexes (amine-functionalized, 100 nm mean particle size), 1 nL was used for printing.

FIG. 41A shows printed microspot array on $SiO_2$/Si substrate at scale bar of 500 and 200 μms. FIG. 41B shows optical microscopy images of fresh $MoS_2$—PS—$MoS_2$ particles fished out from solution after liftoff. FIG. 41C shows after a storage time of 7 days, and FIG. 41D shows after 21 days. FIG. 41E shows Raman spectrum of monolayer $MoS_2$ grown on $SiO_2$ substrate. FIG. 41F shows X-ray photoelectron spectroscopy (XPS) results of $MoS_2$ with various peaks from Mo and S. FIG. 41G shows XPS characterization of $MoS_2$—PS—$MoS_2$ particle (the inserted picture) and peaks of Mo3d and S2p are identified, illustrating the coverage of $MoS_2$ on particle surface. Raman spectroscopy study of the particles fails due the interference of polystyrene on the characteristic peaks ($E^1_{2g}$ and $A_{1g}$ peaks).

FIG. 42A shows printed microspot array on PDMS substrate at scale bar of 200 μm. FIG. 42B shows optical microscopy images of fresh hBN-PS-hBN particles fished out from solution after liftoff, FIG. 42C shows images of particles fished out after a storage time of 3 days, and FIG. 42D after 21 days. FIG. 42F shows Raman spectrum of multilayer hBN transferred on Cu substrate, the peakof BN-vibration "in plane" is identified at 1370 $cm^{-1}$. FIG. 42G shows X-ray photoelectron spectroscopy (XPS) results of hBN with the identified peaks of N and B.

FIG. 46A shows the optical image of the testing setup. FIG. 46B shows the measured I-V curve. FIGS. 46C-46D are the plots of conductivity and resistance against electrode resistance, respectively. The same calculation method as FIG. 45 was used and the sheet resistance is $4.3*10^{13}$ Ω/sq and the contact resistance is $2.5*10^{14}$Ω.

FIGS. 53A-53C show I-V characteristics of three Gr-BP/PS-Gr microparticles submerged in ethanol/water (4:1) solution for 30 days. Vertical conductivity hysteresis can be observed and ON/OFF ratios over $10^4$ can be found in all samples tested. Each CV scan follows a 0V→4V→0V then 0V→–6V→0V pre-programmed procedure where a larger negative voltage (–6V) is applied to ensure a fully switched-OFF conductivity state. Each plot shows three sets of consecutive cycles, with the cycle number labeled by the data. Insets show the optical image of the microparticle tested, with scale bar marking 100 μm.

FIG. 59A is the airbrush. FIG. 59B is the collecting board of the microparticles. The video of the aerosolization process is shown in Video ? of Supplement materias. FIG. 59C is the postion distribution of all collected microparticles (~460 particles) labled out on the slides using optical microscope. (D) Histograms of the particles against distance to the spraying center.

FIG. 62A shows equilibrium strain field map (top view, last time step of the kinetic model) with adaptive non-uniform spatial grids. Insets are the side views of this 3D simulation, with the top inset a zoom-in of a single microspot. FIG. 62B shows equilibrium strain field of a side-viewed microspot edge, with maximum strain reaching 0.78%. FIG. 62C shows time evolution of the relative strain as a function of radius, r=100 μm corresponds to the edge of the microspot.

FIGS. 65B-65D show experimental (solid red) and model fitted (black dash) for a 2 V cyclic bias voltage scan across the two terminals of a Gr-BP/PS-Gr microparticle, with first scan (FIG. 65B), second scan (FIG. 65C), and third scan (FIG. 65D) conducted consecutively.

FIGS. 66A-66C show syncells as a state machine. FIG. 66A shows summary of syncell fabrication steps with side and top views schematics and top view optical micrographs: (1) SU-8 base fabrication, (2) $MoS_2$ and $WSe_2$ monolayer transfer with gold evaporation forms photodetectors, (3) $MoS_2$ flakes transfer forms memristors, while silver evaporation forms electrical contacts for MoS2 chemiresistor. Scale bars: 25 μm. FIG. 66B shows electrical circuit diagram of syncell: the photodiode converts light into current (generating voltage ε and having the internal resistance $R_{ph}$), which turns on the memristor (having a threshold voltage $V_{th}$ and the internal resistance $R_m$) only if the chemiresistor detected an analyte (resistance $R_{ch}$). FIG. 66C shows a block diagram for the syncell state machine. The initial memory state OFF changes to ON only in the presence of both chemical and light signals.

FIG. 67A shows a diagram and FIG. 67B shows an optical picture of a syncell with a photodetector fabricated of continuous $MoS_2$ monolayer and 25 μm striped monolayer of $WSe_2$. FIG. 67C shows typical current-voltage characteristics of a p-n photodiode composed of $MoS_2$ and $WSe_2$ monolayers under 532 nm laser (black—in the dark, cyan, blue, green and red—under 0.7, 1.75, 3.5 and 7 μW/μm² illumination intensities, respectively). FIG. 67D shows master plot for multiple devices, as in FIG. 67C. FIG. 67E shows a diagram and FIG. 67F shows an optical picture of a syncell with a chemiresistor. FIG. 67G shows several current-voltage curves for a monolayer $MoS_2$ chemiresistor before (red) and after the addition of 10 mM TEA (blue). FIG. 67H shows master plot for multiple devices, as in FIG. 67G. The red line is a guide for the eyes. FIG. 67I shows a diagram and FIG. 67J shows an optical picture of a syncell with a memristor. FIG. 67K shows several current-voltage characteristics for a $MoS_2$ memristor sandwiched between gold and silver electrodes. FIG. 67L shows master plot for multiple devices, as in FIG. 67K. In FIGS. 67D, 67H, and 67L show black denotes as-fabricated devices, red—lifted off, and green—devices dispersed with a nebulizer. Scale bars: 25 μm.

FIG. 68A shows chemiresistor conductance changed due to syncell exposure to TEA droplets (10 mM) during spraying, enabling memory conductance change after illumination with 532 nm laser 7 μW/μm². Black squares denote measurements before exposure and red circles—after exposure and illumination. FIG. 68B shows the same as FIG. 68A but syncells were exposed to a carbon nanotube dispersion (0.2 g/l). FIGS. 68C and 68D show the same as FIGS. 68A and 68B, but for syncells on-the-substrate. Green triangles denote control measurements after illumination, blue diamonds—after exposure. FIGS. 68E and 68F show ranked memory conductance ratio extracted from FIGS. 68C and 68D, respectively.

FIG. 69A shows CSMs sprayed using a nebulizer through 10 mM TEA either 2 mg/l soot dispersed in air. Raster-scanning laser system is then used to find CSMs. FIG. 69B shows retroreflector-CSM reflectance as the function of inclination and rotational angles. The dashed line marks diffuse reflection limit $2 \cdot 10^{-3}\%$. Inset shows a top view of 100 μm-retroreflectors. FIG. 69C shows laser raster-scanning detection of 100 μm CSMs that landed after spraying. FIG. 69D shows CSM positions extracted under a microscope: black circles—CSMs with retroreflectors on the top, red circles—CSMs with flipped retroreflectors, open circles—CSMs that were not detected by the laser scan in FIGS. 69C and 69E. Statistics on CSMs. Schematics on the right demonstrate figure labels. FIGS. 69F-69H show same as FIGS. 69C-69E, but for 30° substrate inclination angle.

FIG. 74A shows a syncell as fabricated. The inclination and rotational angle conventions are depicted below. FIG. 74B shows after lift off and subsequent drying. FIG. 74C shows after spraying syncells in water with 7-100 m/s speed across 0.6 m distance in air. FIGS. 74D and 74E show pictures of experimental tubes where syncells were sprayed. For actual experiments, these tubes were placed in fume hoods. The reference tube was used to spray syncells without any analyte, while the other tube has another nebulizer on top that was used to introduce analytes inside the tube.

FIG. 75A shows schematics of CSM aerosolization experiment. Curved arrows indicate CSM rotation direction. CSM experience mechanical stress and bend during: (1) propulsion inside a nebulizer and propagation in air under turbulent forces; (2) collision during landing; (3) capillary forces during drying. FIG. 75B shows examples of 100 μm syncells aggregating and bent during the drying process.

FIG. 76A shows syncells were collected on glass slides, imaged under the microscope, and marked. Scale bar: 25 mm. FIG. 76B shows digitally-extracted syncell positions. FIG. 76C shows distance from the center diagram extracted from FIG. 76B.

FIG. 77A shows relaxation time decreases with the initial speed due to high non-linear air drag. FIG. 77B shows travel distance until complete stop depends on the droplet diameter and the initial speed. FIG. 77C shows cooling time falls down with the initial speed.

FIG. 78A shows Raman signature peaks. FIG. 78B shows intensity map of 406 $cm^{-1}$ Raman line, showing a monolayer of $MoS_2$ covering a syncell. FIG. 78C shows photoluminescence. AFM mapping (FIG. 78D) and extracted profile scan (FIG. 78E) across the border of $MoS_2$ monolayer, showing 0.65 nm step.

FIG. 79A shows Raman signature peaks. FIG. 79B shows intensity map of 252 $cm^{-1}$ Raman line, showing a monolayer $WSe_2$ patterned in 25 μm wide stipes covering a syncell. FIG. 79C shows photoluminescence. AFM mapping (FIG. 79D) and extracted profile scan (FIG. 79E) across the border of $WSe_2$ monolayer, showing 0.76 nm step.

FIG. 80A shows photoluminescence demonstrates a shift as compared to $WSe_2$ photoluminescence, reflecting band gap alignment between $MoS_2$ and $WSe_2$. FIG. 80B shows Raman measurements demonstrate the presence of both $MoS_2$ and $WSe_2$.

FIGS. 81A-81F show more examples of photodetectors composed of MoS2/WSe2 monolayers (black—in the dark, red—under 7 μW/$μm^2$ illumination with 532 nm laser).

FIG. 83A shows a typical curve for conductance change versus voltage. FIG. 83B shows single memristor device under several cycles. While the first cycle in all the tested devices demonstrated switching, results of further cycles varied. FIG. 83C shows an example of applied voltage to test a memristor shows non-uniform scan rate. FIG. 83D shows initial conductance (black denotes as fabricated devices, red lifted off, and green—devices dispersed with nebulizer). FIG. 83E shows retention test for multiple memory state.

FIG. 84A shows chemiresistor conductance changes due to syncell exposure to triethylamine droplets (10 M), enabling memory conductance change. FIG. 84B shows syncell response from FIG. 84A for individual devices. FIG. 84C shows syncell response from FIG. 84A normalized by initial memory conductance.

FIG. 85A shows chemiresistor conductance changes due to syncell exposure to carbon nanotubes (0.2 g/l), enabling memory conductance change. FIG. 85B shows chemiresistor ratio extracted from FIG. 85A. Upon exposure, chemiresistor ratio ranged from 43400 to $9.72 \cdot 10^6$ due to non-uniform coating of syncell surface. Prefix M stands for millions. FIG. 85C shows memory conductance ratio extracted from FIG. 85A, showing that 16 devices didn't work, while the rest changed its memory conductance ranging from 1.6 to 148.

FIGS. 90A-90C shows Gr-PS-Gr microparticles flowing in a microfluidic chip under optical microscope. The fluid (ethanol/water, 4:1) is flowing is flowed upwards via use of a syringe pump (scale bar represents 200 μm). The microparticle in FIG. 90A spins clockwise while undergoing vertical translation in the direction of the fluid flow. The microparticle in FIG. 90B rotates along its horizontal axis and flips on its back. Two G-PS-G microparticles in FIG. 90C travel at different translational speed and collide, stick with each other, and translate forward together, forming a non-covalent link in between.

FIG. 92B is the Raman spectrum of the particle from the right bottom one of FIG. 92A with the identified G band and 2D peak.

FIG. 99A shows schematic of the pipe segment system (22 mm inner diameter) that uses two separate valves for metering aerosolized CSMs (teal squares) (FIG. 99A) or ammonia (FIG. 99B). To allow for retrieval, a layer of cheesecloth served as a collector at the pipe endpoint. FIG. 99C shows a picture of the experimental setup with a crucible filled with ammonia. Once the lower valve is open, saturated ammonia vapor (~10 kPa) expands into the rest of the system. FIG. 99D shows chemiresistor conductance changes (from $G_{ch}^{in}$=9.1±2.2 nS to $G_{ch}^{f}$=18.5±2.5 nS) due to CSM exposure to ammonia vapor, enabling a memory conductance change (from $G_m^{OFF}$=12.5±3.9 nS to $G_m^{ON}$=14.5±4.3 nS) after illumination with a 532 nm laser (7 µW/µm$^2$). Black squares and red circles denote measurements before exposure and after exposure and illumination, respectively. FIG. 99E is same as FIG. 99D, but for control CSMs on-the-substrate: Chemiresistor conductance changes from $G_{ch}^{in}$=9.5±1.3 nS to $G_{ch}^{f}$=18.6±2.9 nS, enabling the memristor conductance change from $g_m^{OFF}$=11.7±3.8 nS to $G_m^{ON}$=13.7±5.0 nS, p-value equals to 0.0017. Violet triangles denote control measurements after illumination, blue diamonds—after exposure. Dashed lines are guides for eyes. FIG. 99F shows ranked memory conductance ratio extracted from FIG. 99E shows 45 CSMs successfully change their memory conductance with an average ratio of 1.55. N=100 for all experiments.

FIGS. 100A-100D show large area sensing. FIG. 100A shows setup schematic: Soot particles are sprayed at three locations over an area with previously dispersed with CSMs (teal squares). FIG. 100B shows a picture of the experimental setup. FIG. 100C shows digitized positions of aerosolized CSMs. Dashed circles are guide for eyes, highlighting three areas exposed to soot. FIG. 100D shows chemiresistor conductance changes due to CSM exposure to soot, enabling memory conductance changes after illumination with a 532 nm laser (7 µW/µm$^2$).

FIG. 101A shows chemiresistor conductance changes due to CSM exposure to ammonia (~10 kPa), enabling memory conductance change. FIG. 101B shows CSM response from FIG. 101A for individual devices. FIG. 101C shows CSM response from FIG. 101A normalized by initial memory conductance. Black squares denote measurements before exposure and red circles—after exposure and illumination. Green triangles denote control measurements after illumination, blue diamonds—after exposure.

FIG. 102A shows Raman profile under 532 nm laser excitation. FIG. 102B shows particle size distribution extracted from nanoparticle tracking (Nanosight LM10, Malvern).

DETAILED DESCRIPTION

Figure 2:
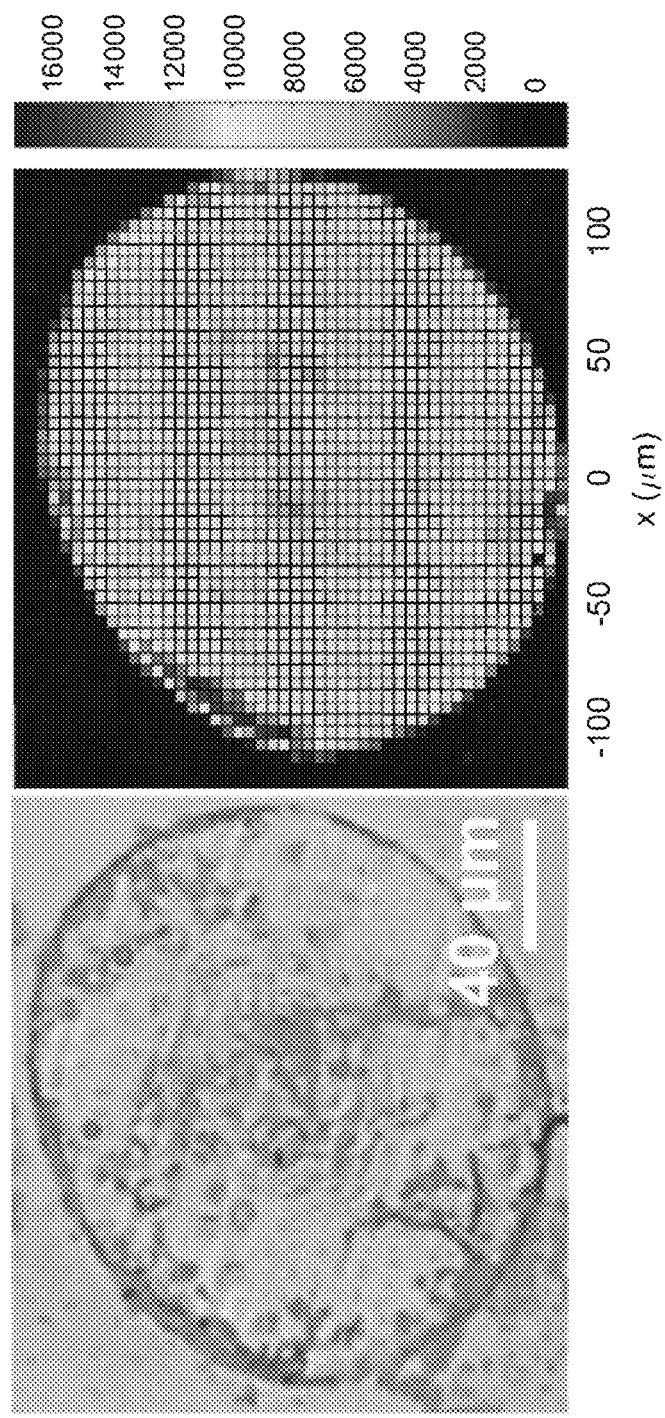
FIG. 2 shows optical (left) and Raman G band map (right) of a graphene syncell that has survived the lift-off process and recaptured on a microscope slide.

Graphene and other two-dimensional (2D) materials possess desirable mechanical, electrical and chemical properties for incorporation into or onto new colloidal particles, potentially granting them unique electronic functions. However, this application has not yet been realized because conventional top-down lithography scales poorly for the production of colloidal solutions. Due to its inherent stochasticity, brittle fracture is seldom used as a fabrication method for materials at the nanometer scale. However, Griffith theory allows for the imposition of a specific strain field that can guide fracture along a pre-set design. Disclosed herein is autoperforation that provides a means of spontaneous assembly for surfaces comprised of 2D molecular surfaces. Chemical vapor deposited mono- and bi-layer graphene, molybdenum disulfide, or hexagonal boron nitride can autoperforate into circular envelopes when sandwiching a microprinted polymer or its composite spot of nanoparticle ink, allowing lift-off into solution and the simultaneous assembly. The resulting colloidal microparticles have two independently addressable, external Janus faces that can function as an intraparticle array of parallel, two-terminal electronic devices. As an example, a 0.9 wt % black phosphorous or 0.07 wt % $MoS_2$ nanoflake-in-polystyrene ink is printed into mono-layer graphene sandwich particles, resulting in micro-particles possessing non-volatile, 15-bit memory storage via a spatially addressable memristor array throughout the particle interior. Such particles form the basis of particulate electronic devices capable of collecting and storing information in their environment. The 2D envelopes demonstrate remarkable chemical and mechanical stability for longer than four months of operation in aqueous buffer or even the highly acidic Human gastrointestinal environment at pH 1.5. Such particulate devices survive aerosolization and recollection for electronic interrogation. They can also possess specific surface chemical functionalities as capture sites to react with particular impurity metals and ions in water samples and soil matrices, respectively, and the ability to be recovered for electrical readout. Autoperforation of 2D materials into such envelope structures allows precise compositing of colloidal particulate devices with exotic functions, extending nanoelectronics into previously inaccessible environments.

Disclosed herein are a versatile colloidal micro-particle and its fabrication technique that integrates fully extended 2-dimentional materials into functional electronic circuits. These are used in the context of electronic state-machines, specifically water resistant multi-bit reversible non-volatile random access memory (RAM) devices, and aerosolizable electronics that functions as a stand-alone micrometer sized unit, and is capable of withstanding extreme conditions and harsh environments.

The particles can be used to measure and track things in a specific environment, for example, in the human body. The particles can act collectively. The particles can be constructed in a way to allow the particles or a collection of particles to respond to and collect near a signaling particle that finds an event, for example, a targeted event. An analogy is the human immune system where an infection causes a macrophage to signal to other macrophages who are recruited to the site to heal an infection. In this example, these 2D particles could form the basis of self healing systems where damage in a material is detected by one particle that then promotes the recruitment of others to the site of damage to start a healing process at the damage site. Other modes can include cellular materials, which are materials that can mimic the function of human tissue and its cellular nature. Materials that consist of semi-autonomous cells can transmit information by repeating the signal in each constituent cell, similar to the human nervous system. These particles can also store and use energy locally, avoiding the problems of fuel diffusion through the media leading to a loss of power density. In one example, human muscle tissue both stores and uses fuel in the form of glycogen using the property of a material made up of multifunctional cells. This type of energy storage can be utilized in the particles described herein.

An article can include a first sheet comprising a layer including a first material, wherein the first sheet includes a first outer surface and a first inner surface; and a second sheet comprising a layer including a second material, where the second sheet includes a second outer surface and a second inner surface, wherein the first sheet and the second sheet form a space, the space is encapsulated by the first sheet and the second sheet. Each surface is functionalized individually. Certain molecules can enter syncell through nanopores (FIG. 1A).

A method of making an particle can include preparing a first sheet including a first substrate and a first layer comprising a first material on a first substrate, wherein the first sheet includes a first outer surface and a first inner surface, depositing a composition, preparing a second sheet including a second substrate and a second sheet comprising a second material on the second substrate, wherein the second sheet includes a second outer surface and a first inner surface, annealing the first sheet and the second sheet, and autoperforating the first sheet and the second sheet.

A method of detecting an analyte can include applying the particle including a first sheet comprising a layer including a first material, wherein the first sheet includes a first outer surface and a first inner surface; and a second sheet comprising a layer including a second material, where the second sheet includes a second outer surface and a second inner surface, wherein the first sheet and the second sheet form a space, the space is encapsulated by the first sheet and the second sheet, wherein the space includes a sensor and detecting the analyte with the sensor. A method of making a device can include preparing a substrate, depositing a first monolayer of including $MoS_2$ on the substrate, depositing a second monolayer including $WSe_2$ at least partially in contact with the monolayer including $MoS_2$, depositing a gold electrode on a portion of the first monolayer, depositing a gold electrode on a portion of the second monolayer, depositing a material including $MoS_2$ in contact with the gold electrode on the first monolayer and in contact with the second monolayer, depositing a silver electrode in contact with the gold electrode, and depositing a silver electrode in contact with the material including $MoS_2$.

A method of detecting an analyte can include applying the device including a sheet including a substrate material, a power source on the substrate, a switch on the substrate and a memory element on the substrate and detecting the analyte with the device.

Microrobots can penetrate inaccessible places and perform various tasks while remaining literally invisible. Furthermore, microrobots can possibly assemble into bigger robots, perform a task and then scatter away. To date, University of Michigan holds a record of miniaturization with millimeter-sized robots. Further reducing size of microrobots is associated with ineffective power supplies and electronics. To overcome this challenge, the synergy between nanotechnology and 2D electronics is used.

As used herein, the term “syncell” is a sub-millimeter programmable state machine, where each syncell is comprised of two sheets with encapsulated 2D electronics, liquid, gel and nanoparticles. The two sheets can be graphene or another 2D layered material. The syncell operates like a synthetic cell, with the ability to hold materials or a payload in an internal cavity between the two sheet layers. The bulged shape is nearly 2D, with an aspect ration of a long dimension to a narrow dimension of at least about 2, at least about 5, at least about 10, or at least about 100. The dimensions of the syncell can be nanoscale, with the average particle size being about 10 nm, 12 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, or 95 nm. For other applications, syncells can have an average particle size of greater than 100 nm, for example, less than 250 nm, less than 200 nm, or between 100 nm and 200 nm. While 2D electronics dramatically reduces size of the syncell, the configuration has further advantages. Firstly, 2D materials can serve as molecular barriers, which define fluid and gel regions separated from the surrounding solution, in very close analogy to a living cell. Secondly, nanopores present in graphene can be used to control mass transport between the interior and exterior of the syncell. Mediated by 2D electronics, syncell nanopores can serve as switches, energy sources or even as detectors of external species. Thirdly, nanoparticle encapsulation extends any advantages of nanoparticles to the syncell. Fourthly, each of four surfaces of two graphene sheets can be functionalized individually. Such broken symmetry particles remain challenging to fabricate with current nanoparticle synthesis. Finally, syncell's broken symmetry is further favorable for creating functional aggregates.

The syncells can be prepare from graphene, transition metal sulfides, or other sheet-like materials that can be fabricated into thin and flat plates.

Figure 14A:
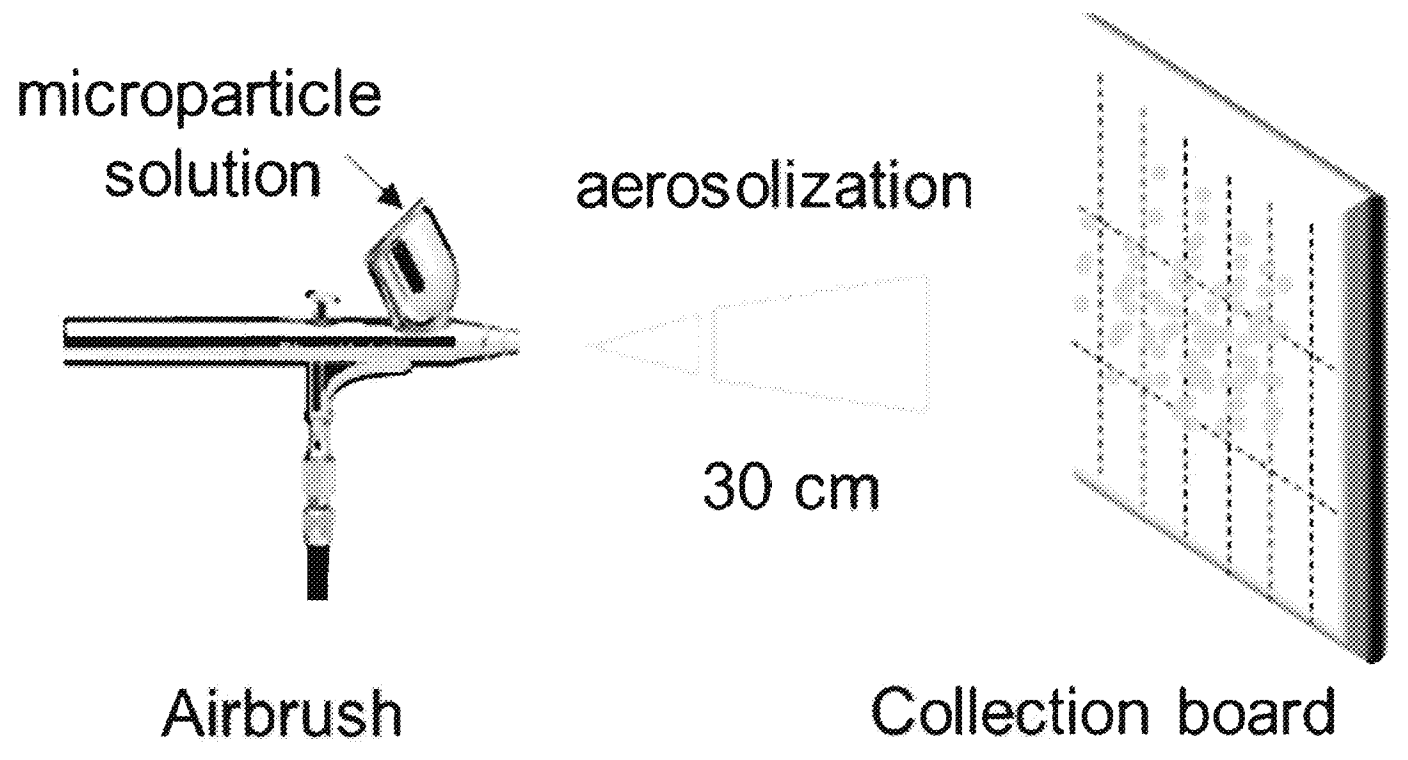
Figure 14B:
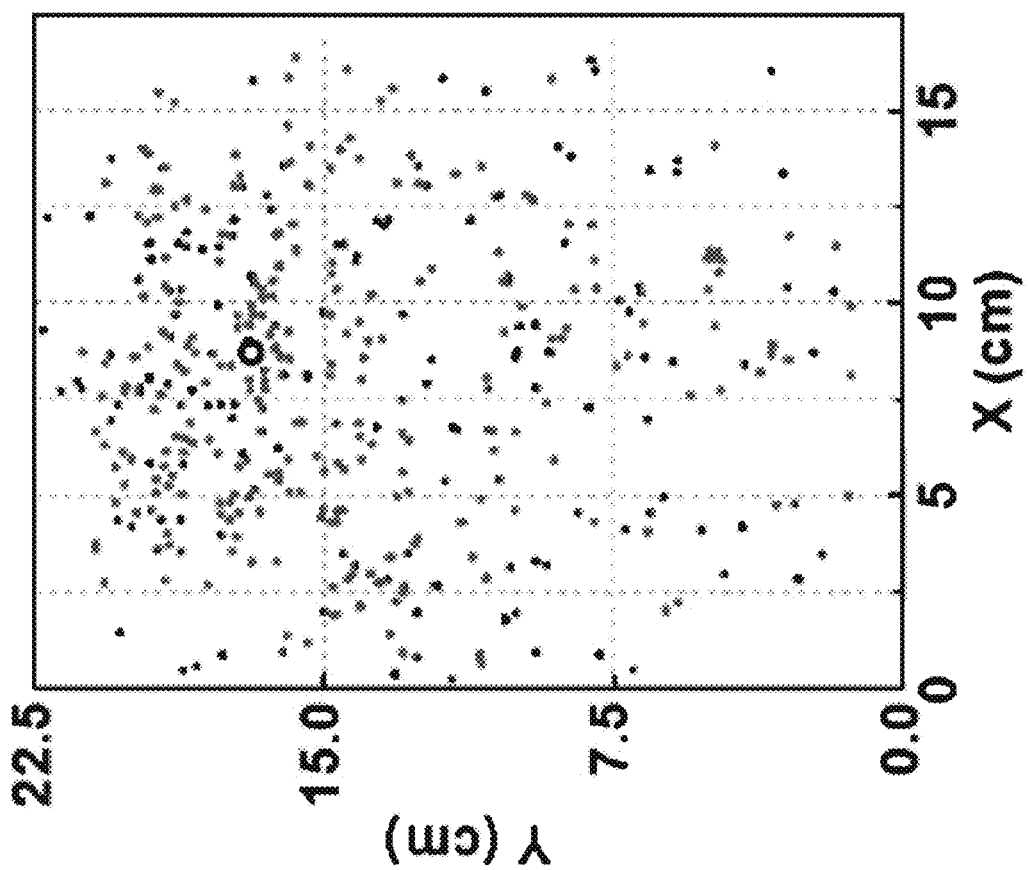
FIGS. 14A-14D show application of G-PS-G microparticles to collect and store environmental information and their aerosolization.

Graphene itself, with high electron-density in its $sp^2$-bonded aromatic rings, is impermeable to all molecules except for protons, making it the thinnest membrane for liquid/biological sample encapsulation (even in vacuum conditions) and the ideal protective barrier against harsh environments. See, Bunch, J. S. et al. Impermeable Atomic Membranes from Graphene Sheets. *Nano Letters* 8, 2458-2462 (2008), Hu, S. et al. Proton transport through one-atom-thick crystals. *Nature* 516, 227-230, doi:10.1038/nature14015 (2014), Mohanty, N., Fahrenholtz, M., Nagaraja, A., Boyle, D. & Berry, V. Impermeable Graphenic Encasement of Bacteria. *Nano Letters* 11, 1270-1275, doi:10.1021/nl104292k (2011), Yuk, J. M. et al. High-Resolution EM of Colloidal Nanocrystal Growth Using Graphene Liquid Cells. *Science* 336, 61-64, doi:10.1126/science.1217654 (2012), and Prasai, D., Tuberquia, J. C., Harl, R. R., Jennings, G. K. & Bolotin, K. I. Graphene: Corrosion-Inhibiting Coating. *ACS Nano* 6, 1102-1108, doi:10.1021/nn203507y (2012), each of which is incorporated by reference in its entirety. Meanwhile, introducing nanopores onto graphene membranes allows transport of biomolecules, salts and water with high selectivity. See, Schneider, G. F. et al. DNA Translocation through Graphene Nanopores. *Nano Letters* 10, 3163-3167 (2010), Garaj, S., Liu, S., Golovchenko, J. A. & Branton, D. Molecule-hugging graphene nanopores. *Proceedings of the National Academy of Sciences* 110, 12192-12196 (2013), Surwade, S. P. et al. Water desalination using nanoporous single-layer graphene. *Nat Nano* 10, 459-464, doi:10.1038/nnano.2015.37 (2015), Celebi, K. et al. Ultimate Permeation Across Atomically Thin Porous Graphene. *Science* 344, 289-292, doi:10.1126/science.1249097 (2014), and Cohen-Tanugi, D. & Grossman, J. C. Water Desalination across Nanoporous Graphene. *Nano Letters* 12, 3602-3608, doi:10.1021/nl3012853 (2012), each of which is incorporated by reference in its entirety. Analogously, the smallest unit of life—cell, consisting of cytoplasm enclosed within a thin plasma membrane, can perform various functions like transport of molecules, chemical reactions (i.e. metabolism), locomotion, and reproduction. Graphene can be used as a membrane material to encapsulate small-sized functional devices, just like those organelles in a biological cell, and by taking advantage of recent advances in 2D materials, to generate prototype "synthetic cells" (SynCell) that can flow freely in solution and perform simple functions. Note that nano or microsized SynCells or state-machines that can perform very simple tasks such as computing, data storing, sensing, and actuation can be interconnected into complex nanonetworks for novel applications in environmental, biomedical, and military technologies. See, Akyildiz, I. F., Jornet, J. M. & Pierobon, M. Nanonetworks: a new frontier in communications. *Commun. ACM* 54, 84-89, doi:10.1145/2018396.2018417 (2011), and Akyildiz, I. F., Brunetti, F. & Blázquez, C. Nanonetworks: A new communication paradigm. *Computer Networks* 52, 2260-2279 (2008), each of which is incorporated by reference in its entirety. Herein, the controlled fracturing (termed "autoperforation") of 2D materials as a scalable fabrication technique for free-flowing microparticles that function as two-terminal electronic devices with multiple embedded memristor elements (FIG. 14D). See, Strukov, D. B., Snider, G. S., Stewart, D. R. & Williams, R. S. The missing memristor found. *Nature* 453, 80-83 (2008), and Tour, J. M. & He, T. Electronics: The fourth element. *Nature* 453, 42-43 (2008), each of which is incorporated by reference in its entirety. These microparticles are stable in aqueous environments, in the mammalian digestive track, and can even survive the turbulent nebulization process inside aerosol droplets. Upon collection onto a conductive indium tin oxide (ITO) surface, each memristor element can be electrically addressed and its bipolar resistance switching behavior can be used as a multi-bit reversible random access memory (RRAM) device.

Recent studies suggests that the classic Griffith criterion of brittle fracture remains valid for graphene. See, Zhang, P. et al. Fracture toughness of graphene. *Nature Communications* 5, 3782 (2014), and Yin, H. et al. Griffith Criterion for Brittle Fracture in Graphene. Nano Letters 15, 1918-1924, doi:10.1021/nl5047686 (2015), each of which is incorporated by reference in its entirety. A crack propagates while new crack surfaces generate to release the elastic energy. See, Griffith, A. A. The Phenomena of Rupture and Flow in Solids. *Philosophical Transactions of the Royal Society of London. Series A, Containing Papers of a Mathematical or Physical Character* 221, 163-198 (1921), which is incorporated by reference in its entirety. A characteristic length scale, known as the Griffith length (L), defined as the ratio of the surface energy (y) to the elastic energy ($E\epsilon^2$, where E is the elastic modulus and E the strain). A crack will not grow when its size is less than L. Large-area graphene or other 2D materials prepared by the chemical vapor deposition (CVD) method (see, Reina, A. et al. Large Area, Few-Layer Graphene Films on Arbitrary Substrates by Chemical Vapor Deposition. *Nano Letters* 9, 30-35 (2009), Kim, K. S. et al. Large-scale pattern growth of graphene films for stretchable transparent electrodes. *Nature* 457, 706-710 (2009), and Li, X. et al. Large-Area Synthesis of High-Quality and Uniform Graphene Films on Copper Foils. *Science* 324, 1312-1314 (2009), each of which is incorporated by reference in its entirety, albeit mechanically robust (see, Lee, G.-H. et al. High-Strength Chemical-Vapor-Deposited Graphene and Grain Boundaries. *Science* 340, 1073-1076 (2013), which is incorporated by reference in its entirety), usually carries intrinsic nanometer-sized defects originated from the CVD and subsequent transfer processes, and these seed crack formation is stochastic in nature. In the Griffith formulation, L depends on ε, thereby allowing us to regulate the strain field on the graphene or other 2D surfaces, and manipulate the fracture trajectory for device fabrication. Placing isolated stiff islands (e.g. semiconductor devices) on top of an otherwise compliant substrate, such as a polymer film, can create a strain field that reduces the tension built-in the substrates covered by the those islands. See, Hsu, P. I. et al. Spherical deformation of compliant substrates with semiconductor device islands. *Journal of Applied Physics* 95, 705-712 (2004); and Sun, J.-Y. et al. Debonding and fracture of ceramic islands on polymer substrates. *Journal of Applied Physics* 111, 013517 (2012), each of which is incorporated by reference in its entirety. A more recent study shows that conforming a flat elastic sheet to a rigid substrate with Gaussian curvature can control the sheet crack growth upon stretching. See, Mitchell, N. P., Koning, V., Vitelli, V. & Irvine, W. T. M. Fracture in sheets draped on curved surfaces. *Nat Mater* 16, 89-93 (2017), which is incorporated by reference in its entirety.

An active area of exploration for constrained environment sensing is external imaging, including ultrasound for geological exploration and human body applications, thermal imaging for chemical reactors and gas leak detection, magnetic resonance to probe the human body and porous material beds. Such imaging methods are necessarily indirect and limited in their penetration depth. Inaccessibility often results from systems where the scaling of sensor networks is highly unfavorable, such as pipelines or geological targets. For other systems, direct methods are available, such as endoscopes and borescopes, while the problem of oil well monitoring has benefited from fiber optic cabling for temperature and other measurements, but such approaches are typically limited to major pathways and arteries of accessibility. See Mooney, W. D. & Brocher, T. M. Coincident seismic reflection/refraction studies of the continental lithosphere: A global review. *Reviews of Geophysics* 25, 723-742 (1987), Frøkjær, J. B., Drewes, A. M. & Gregersen, H. Imaging of the gastrointestinal tract-novel technologies. *World Journal of Gastroenterology: WJG* 15, 160-168 (2009), Jarenwattananon, N. N. et al. Thermal maps of gases in heterogeneous reactions. *Nature* 502, 537 (2013), Murvay, P.-S. & Silea, I. A survey on gas leak detection and localization techniques. *Journal of Loss Prevention in the Process Industries* 25, 966-973 (2012), Amitay-Rosen, T., Cortis, A. & Berkowitz, B. Magnetic Resonance Imaging and Quantitative Analysis of Particle Deposition in Porous Media. *Environmental Science & Technology* 39, 7208-7216 (2005), Hara, A. K., Leighton, J. A., Sharma, V. K., Heigh, R. I. & Fleischer, D. E. Imaging of Small Bowel Disease: Comparison of Capsule Endoscopy, Standard Endoscopy, Barium Examination, and CT. *RadioGraphics* 25, 697-711 (2005), Inaudi, D. & Glisic, B. Long-Range Pipeline Monitoring by Distributed Fiber Optic Sensing. 763-772 (2006), Kurniawan, N. & Keuchel, M. Flexible Gastro-intestinal Endoscopy—Clinical Challenges and Technical Achievements. *Computational and Structural Biotechnology Journal* 15, 168-179 (2017), and Galappaththi, U. I. K., De Silva, A. K. M., Macdonald, M. & Adewale, O. R. Review of inspection and quality control techniques for composite wind turbine blades. *Insight—Non-Destructive Testing and Condition Monitoring* 54, 82-85 (2012), each of which is incorporated by reference in its entirety.

Graphene Syncell as a Stand-Alone Water Resistant Multi-Bit Non-Volatile Random Access Memory (RAM) Device Due to the fabrication process, the syncell top and bottom graphene layers can be electronically insulated, which provides an ideal vertical structure of a duo-electrode system where graphene sheets are used as the two electrical terminals. It should be noted that the coverage of graphene over the syncell surface is perfect, as characterized using Raman spectroscopy of the lifted-off syncells (FIG. 2).

Figure 3:
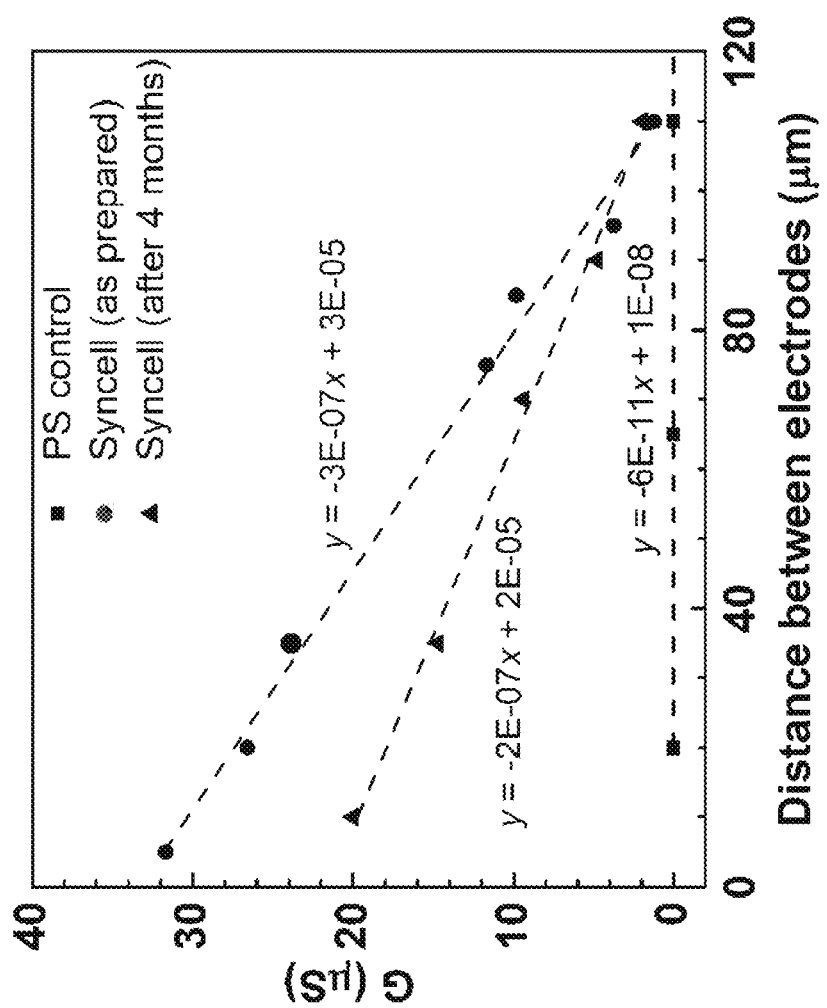
FIG. 3 shows in-plane conductivity of graphene syncells measured as a function of contact distances.

The in-plane conductivity of these colloidal particles was explored and an in-plane sheet resistance was $2\times10^{-4}$ times that of the polystyrene control without the graphene top and bottom layer. This sheet resistance increased 1.5 times after storing the syncells 4 months in solution (water/ethanol mixture) (FIG. 3). The actually material sheet resistance is extrapolated from the slope.

Figure 4:
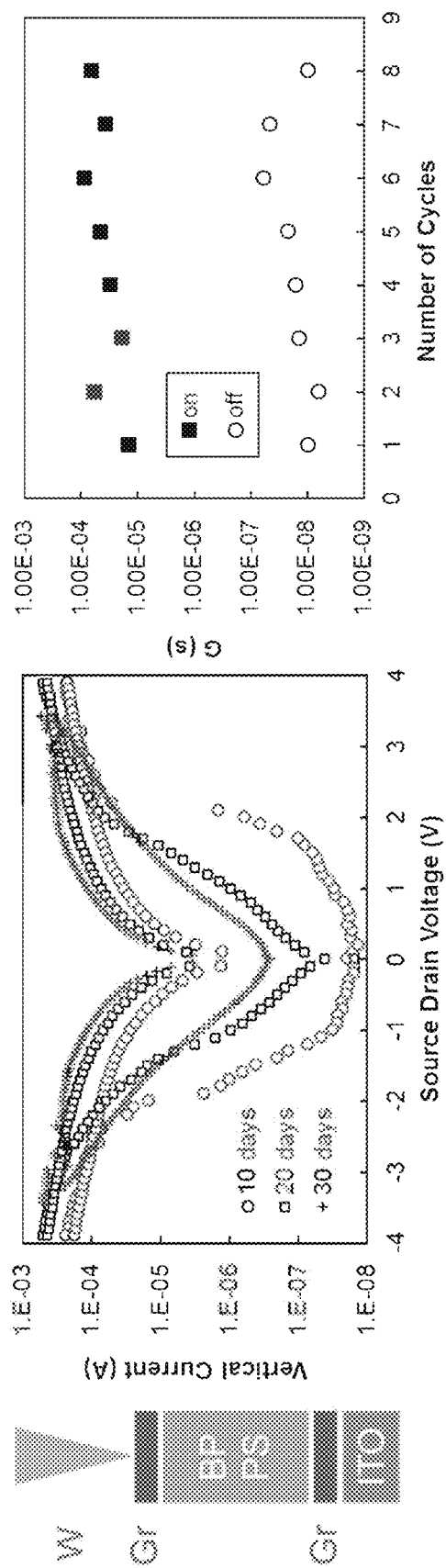
FIG. 4 shows vertical structure of the memory testing platform with syncells in the middle (left), BP syncell stored in $EtOH/H_2O$ for 1 month still have on/off ratio >100 and perfect memory reversibility (middle), and after each cycle the interrogated syncell is immersed in $H_2O$ for 10 mins before drying under vacuum for the next cycle of testing (right).

By placing liquid exfoliated black phosphorus (BP) nanoflakes within the interior of the graphene cell (FIG. 4, left), reversible non-volatile memory was observed upon voltage stimulation, as seen in the current-voltage hysteresis behavior (FIG. 4, middle). This on/off ratio of the syncell vertical conductivity can reach 10,000 for a syncell that has been stored in solution for 10 days. Pro-longed storage of the device in water up to a month showed decreased on/off ratio (~100), but it still remains functional (FIG. 4, middle). The same device gives similar on/off ratios even after been put under water for 10 minutes in between cycles for up to 8 cycles (FIG. 4, right).

Due to the limited range of the spreading current on the syncell surface, multiple bit can be addressed separately over the entire syncell surface (FIG. 5). The letters "M", "I", "T" were purposefully written in and read out on the same syncell surface with an on/off ratio over 100. Each point is treated 0 V or −6 V (depending whether it is supposed to be on or off) before conductivity interrogation at 500 mV. The surveyed area shows reliable activity (on/off>100). The letter "M", "I", "T" are written in sequential order and the memory effect is addressed point by point 5 mins after it is written.

Mechanical and Chemical Stability of Graphene Syncells

Mechanical Stability as Syncells Travel Through Air Like Aerosols

Syncells are capable of surviving highly turbulent area travel after been nebulized from a water solution and sprayed across a 30 cm distance in air with an air brush (FIG. 6, left). The syncells are then intercepted in air with 21 microscope slides where they are being counted under optical microscope (FIG. 6, middle). Here each dot represents a position of a micro-meter sized syncell that are fully intact. Then the photograph was image processed and detailed location profile using MATLAB was generated (FIG. 6, right).

Figure 7:
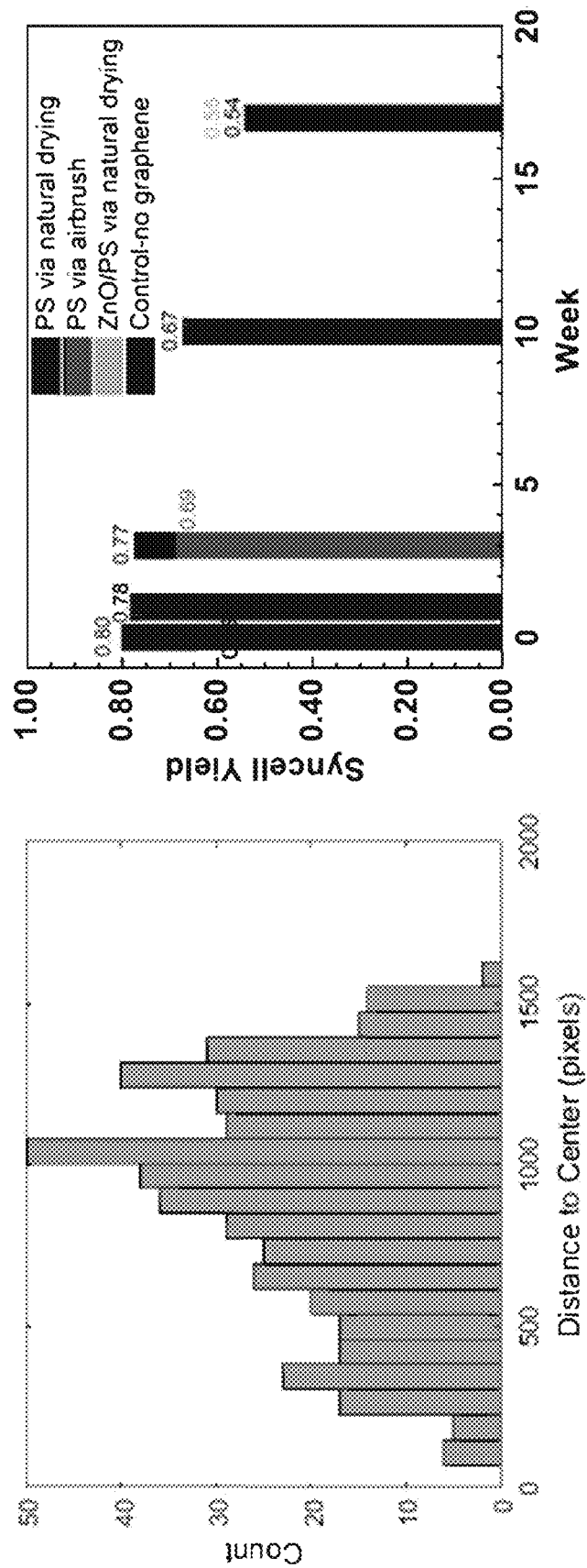
FIG. 7 shows statistics of syncell distribution and survival rate after they have been aerosolized and travelled through air.

The statistics of the syncells survived air travel was plotted as a function of distance to center where the nebulizer points (FIG. 7, left). The linear dependence of # of syncells as a function of their distance to center of spray signify even distribution of syncells. The syncells demonstrate excellent stability as they travel through air in the form of aerosolized particles (69% syncell yield) (FIG. 7, right).

i. Chemical Stability as Syncells Travel Through Mammalian Digestive Track (In Vitro Results Using Stomach Acid Model Solution)

The mammalian digestive track corrosive environment was mimicked to test syncell stability, an in vitro protocol that was widely used was borrowed as the test environment: SBET (Simple Bioaccessibility Extraction Test): 100±0.5 mL extraction fluid (0.4 M glycine adjusted to pH 1.5 with concentrated HCl) is added to 1.0±0.5 g of dry weight of things to be digested. This mixture is rotated end-over-end at 37 C at 30±2 rpm for 1 h. It should be noted that syncells subjected to this test suffers no loss in integrity (FIG. 8). There is no morphological difference in cell structure before and after the in vitro test (note the crystals in the micrograph after treatment is residual glycine).

$MoS_2$ Syncell as Aerosolizable Electronics, Specifically Used as Chemical Sensors Microrobots are not so small, mainly because of power limitations. However, even with basic capabilities, new capabilities of simple chemiresistors can sense analytes over big volumes. Moreover, using 2D materials dramatically reduces size and weight of such devices, making them actually freely flow in air.

Here, aerosolizable electronic microparticles are capable of detecting analytes in air with subsequent to access to the detection event through electronic readout. This will be the first micrometer particle incorporating electrical contact on its surface. In certain embodiment, a microparticle can consist of polymer base, golden contacts and monolayer $MoS_2$ acting as a sensor.

Design

Fog droplets are in the range of 10-100 um, while rain droplets are bigger. Similar design rules apply to the particles: simple calculations on drag show that particles need to be smaller than 100 um to successfully float in air.

While many nanoparticles and microparticles exist that can sense analytes in air, the condition of post-electrical readout puts new constrains. Normally electrical circuits are designed on planar interfaces and only recently starting on bended flexible ones. The difficulty of fabricating a particle with electrical contacts is associated with the careful choice materials and their respective developers that often have to be orthogonal, meaning that independent photolithography steps can be performed. All fabrication steps should not dissolve substrate, but eventually syncell should be lifted off.

$MoS_2$ Sensing $MoS_2$ monolayers are changing their properties when analytes adsorb on their surface. This happens because of electron or holes $MoS_2$ doping, depending on the analyte type. Change in carrier concentration affects $MoS_2$ conductivity σ: $σ=e \times n \times μ$, where e is electron charge, n carrier concentration and μ electron mobility. Number of carrier also modifies non-radiative decay time, affecting $MoS_2$ photoluminescence. Indeed, $MoS_2$ photoluminescence is caused by radiative decay of photoexcited excitons. Modification of non-radiative lifetime leads to photoluminescence modification and peak spectral shift.

Figure 9A:
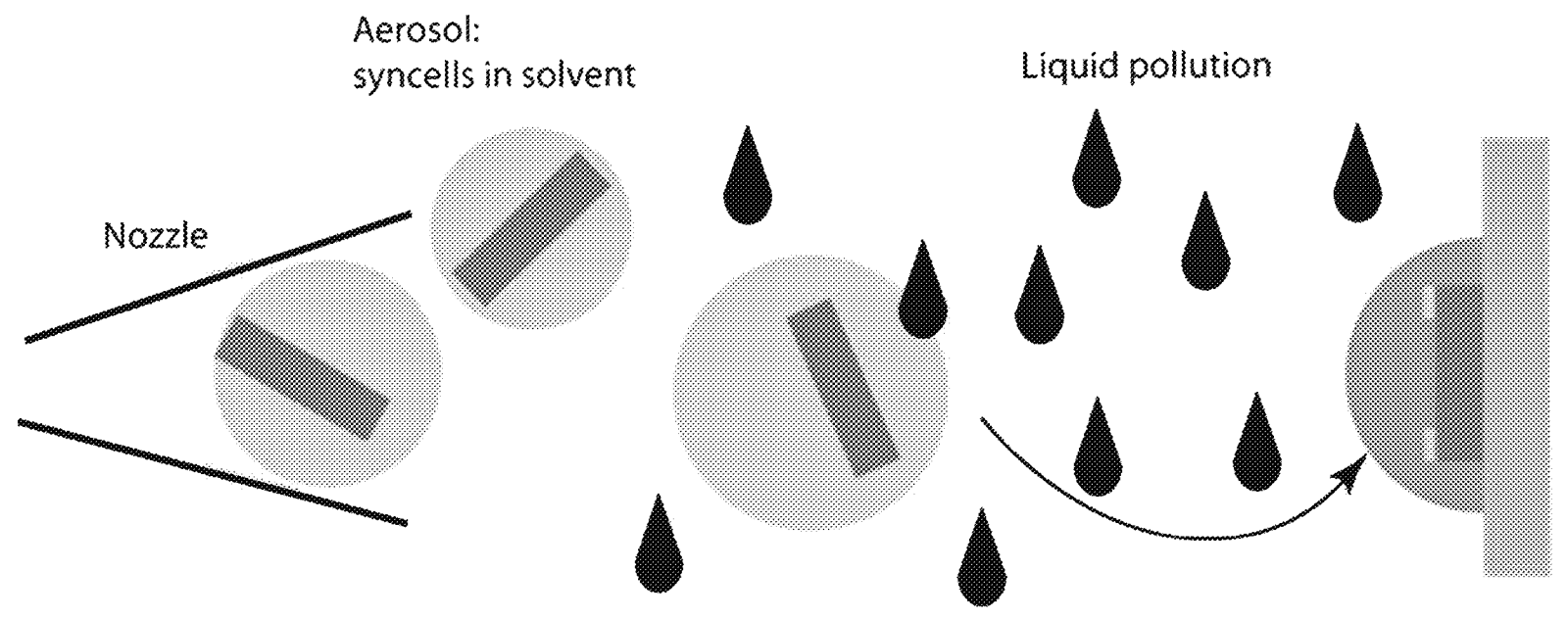
Figures 9B, 9C:
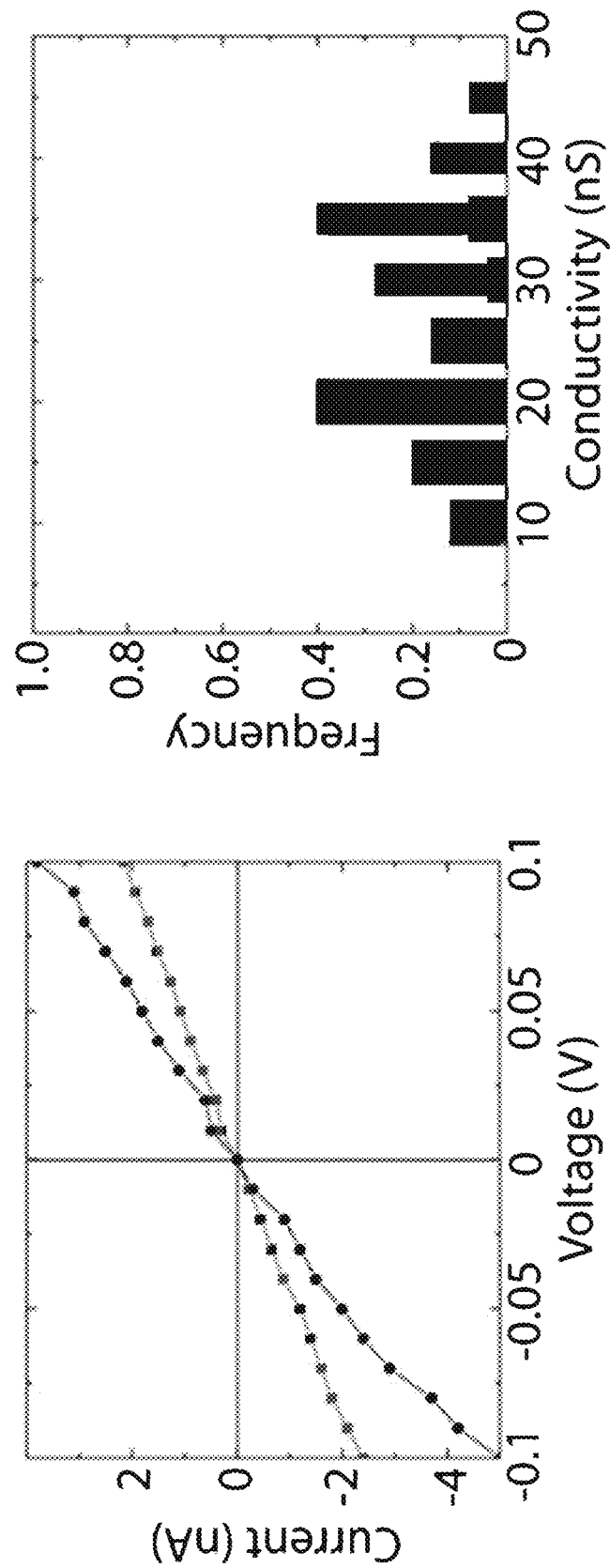
Figure 9E:
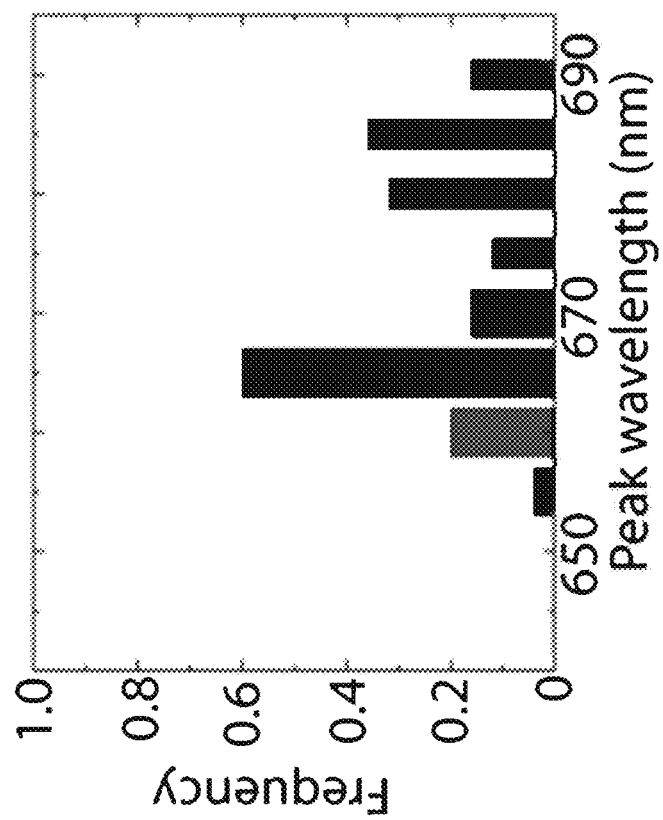
Figure 9D:
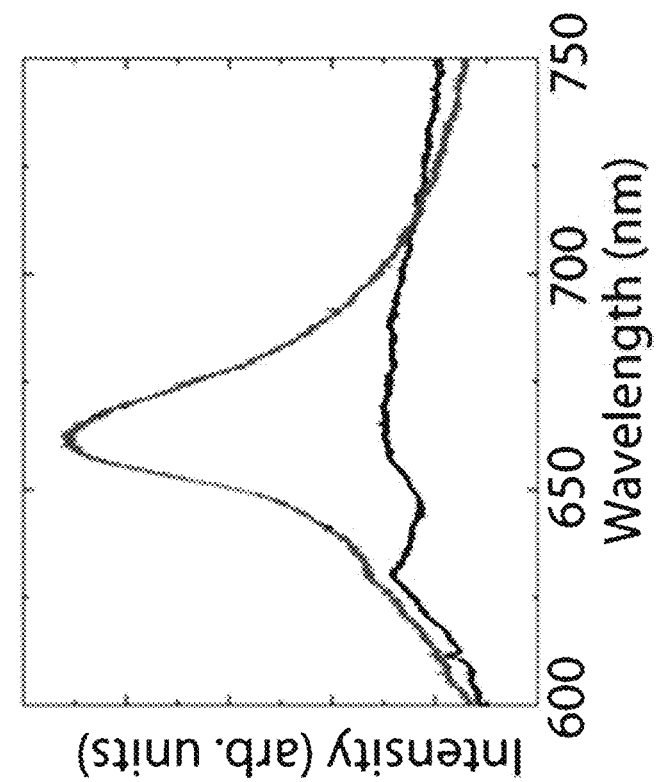

To demonstrate $MoS_2$ sensing capabilities, triethylamine droplets were dispersed on the way of aerosolized syncells (FIG. 9A). FIG. 9A shows schematic of syncells in water sprayed at 150-400 m/s speed across 0.3 m distance of dispersed triethylamine droplets (10 M), collected and dried for 1 h. Droplet size <300 μm. Syncells were collected after 0.3 m long flight in the air, dried and subsequently their optical and electrical properties measured. Change in conductivity was about 36 nS (FIGS. 9B and 9C), while photoluminescence was quenched and red shifted till about 685 nm (FIGS. 9D and 9E).

Figure 10A:
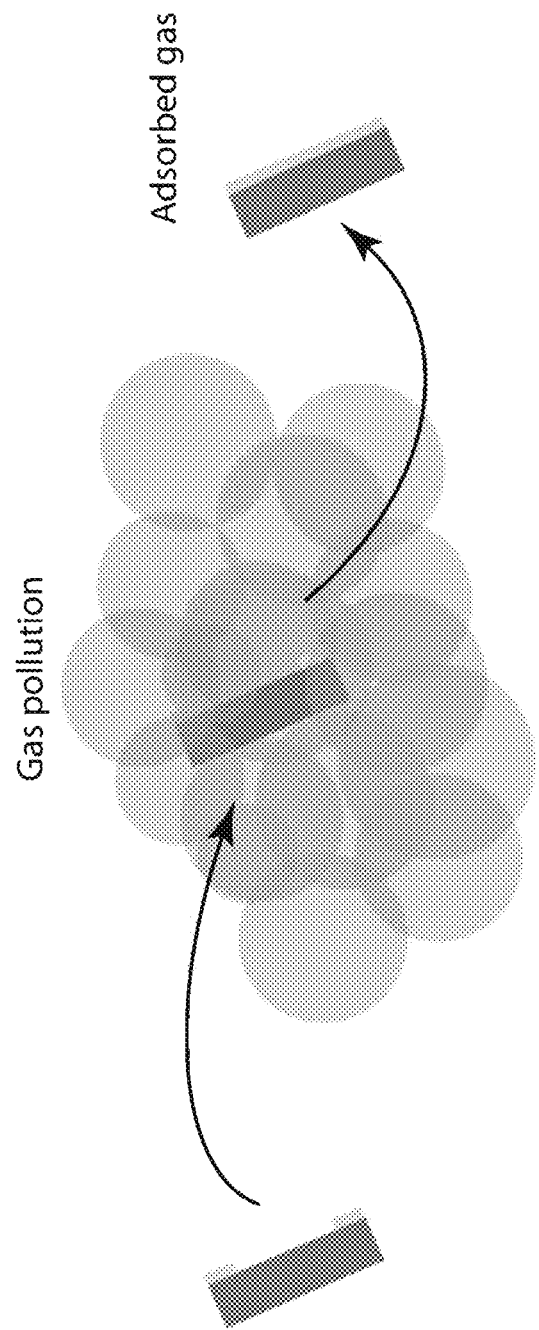
FIGS. 10A-10E show syncells to detect gas adsorption.
Figure 10C:
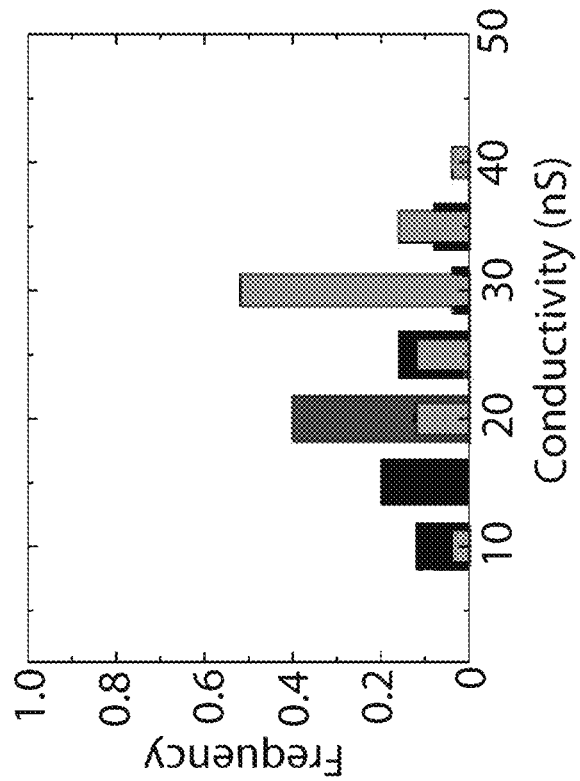
Figure 10B:
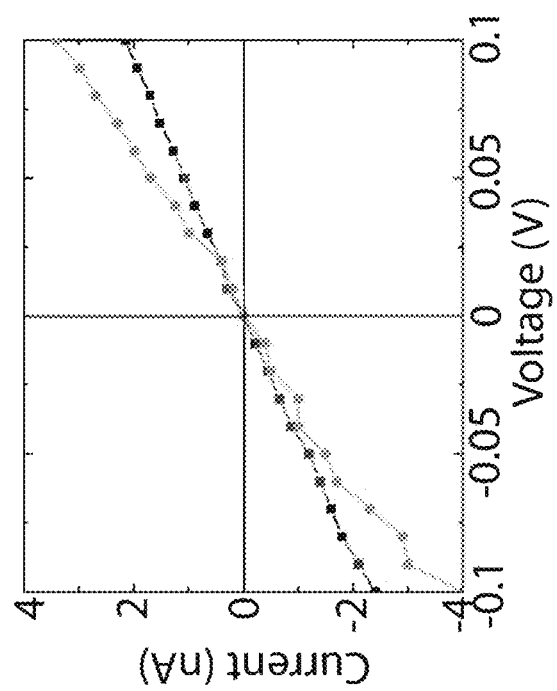
Figure 10E:
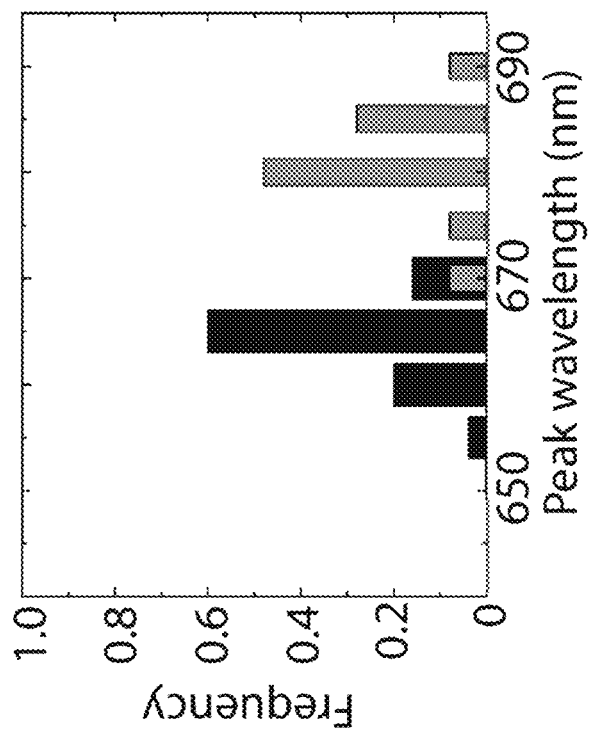
Figure 10D:
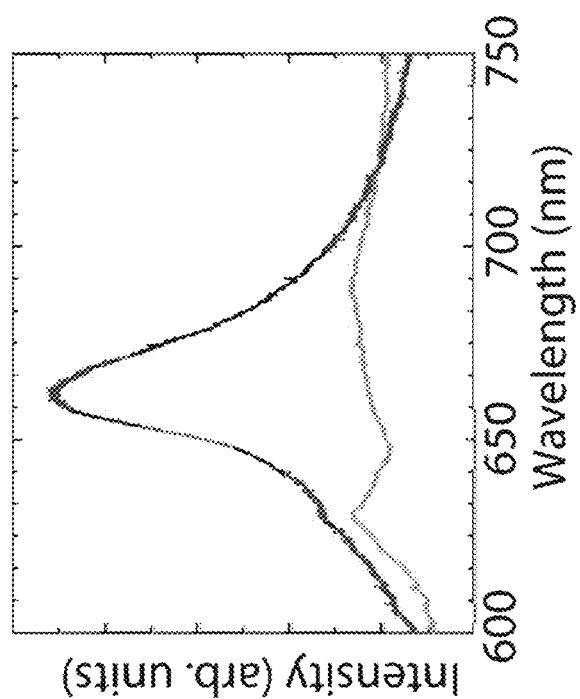

Similarly, gas detection was demonstrated on example of ammonia detection (FIG. 10A). After 1 h exposure to the saturated vapor ammonia vapor pressure (10 kPa), $MoS_2$ resistance increases to about 29 nS (FIGS. 10B and 10C) and photoluminescence quenches, redshifting its peak position to about 682 nm (FIGS. 10D and 10E). When aerosolized, syncells initially travel inside the solvent droplet, which eventually dries out. Drying time is usually faster than gas diffusion into the droplet. Therefore, gas adsorption onto dried syncells is usually a case. Gas adsorption is a slow process; therefore, gas either spread over big volume or have high concentration for flying syncell to detect it. Alternatively, syncell sedimentation speed is very slow and can prolong syncell interaction time with the gas.

The particles described herein can be made using alternative synthetic routes. For example, synthetic cells can be produced from 2D material fracture and self assembly or by top-down lithography. There are other methods that can be used as well. For example, the synthesis of self assembling Janus particles that have different functions incorporated in a radially asymmetric way can form larger clusters with pre-designed functions within. Also, a heirarchy of cellular particles can be used to build up more complex particles from them. This can include placing smaller cells within a larger cell to isolate certain functions. Biological cells do this in the formation of organelles that have specific functions. Smaller 2D material cells that serve the function of memory, energy, sensing, light detection, communications, reproduction and repair (and not limited to this list) could be combined and incorporated into larger particles to serve specific tasks.

Autoperforation of Graphene for Free-Flowing 2D Electronic Microparticles with Memory Due to its inherent stochasticity, brittle fracture is seldom used in fabrication. Herein, fracture in 2D materials can be templated and guided by encapsulating particles that create a local strain field. For polymer-supported chemical vapor deposited graphene, molybdenum disulfide, hexagonal boron nitride (hBN), molybdenum diselenide, tungsten disulfide, tungsten diselenide, rhenium diselenide, rhenium disulfide, black phosphorus, platinum diselenide, tin sulfide, or tin selenide, when sandwiching an printed microspot array and lifted-off into solution, fracture-driven perforation, or "autoperforation", of 2D sheets occurs along the edges of each spot. This generates colloidal microparticles with well-defined 2D surface layers and controllable surface functionalities on either side. Graphene-based particles function as free-flowing electronic devices with complex functionality. For example, printing a mixed ink of polystyrene (PS) nanoparticles and black phosphorous (BP) nanoflakes yields a percolated BP (0.9 wt %)/PS composite spot and turns each particle into a two-terminal memristor array with time-dependent electrical memory. These particles exhibit extraordinary chemical-resistivity and mechanical stability during months of preservation in an aqueous environment, overnight gastrointestinal test, and aerosolization. Autoperforation of the 2D materials, in this way, opens the door to precise compositing of 2D materials with various micro- and nano-objects for function manipulation/generation.

Figure 11A:
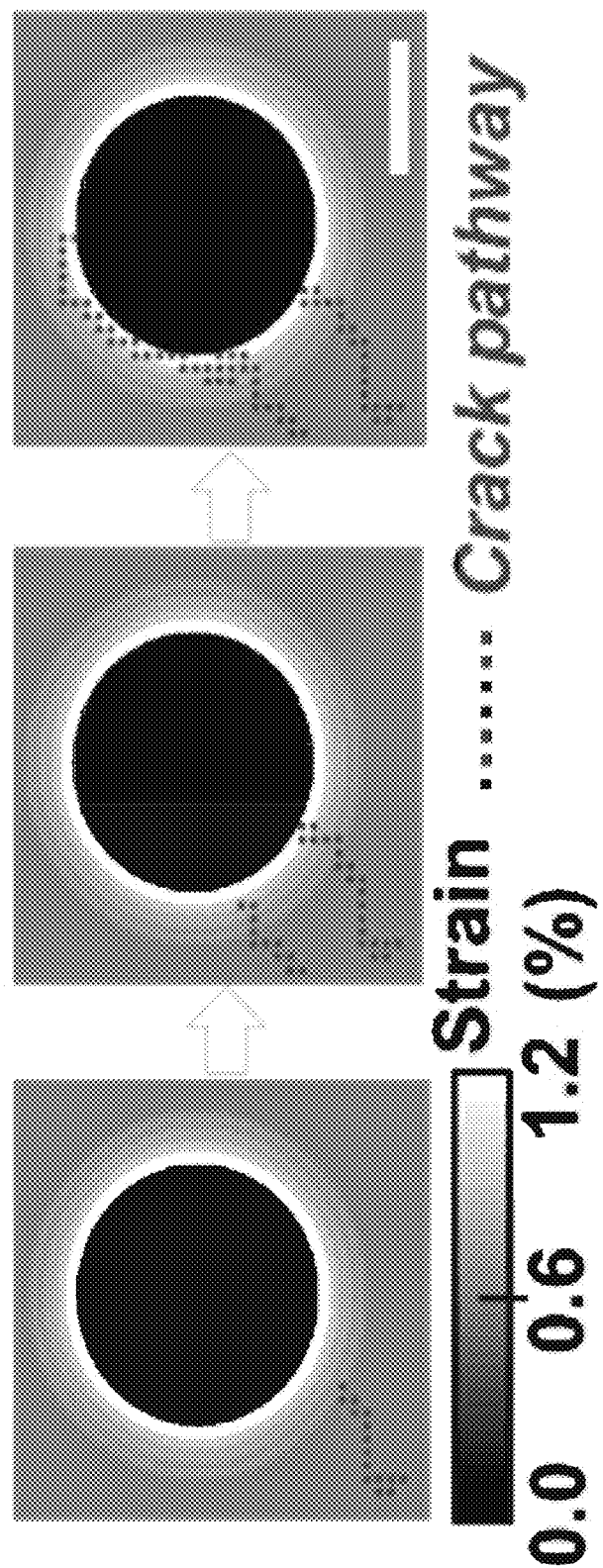
Figure 11B:
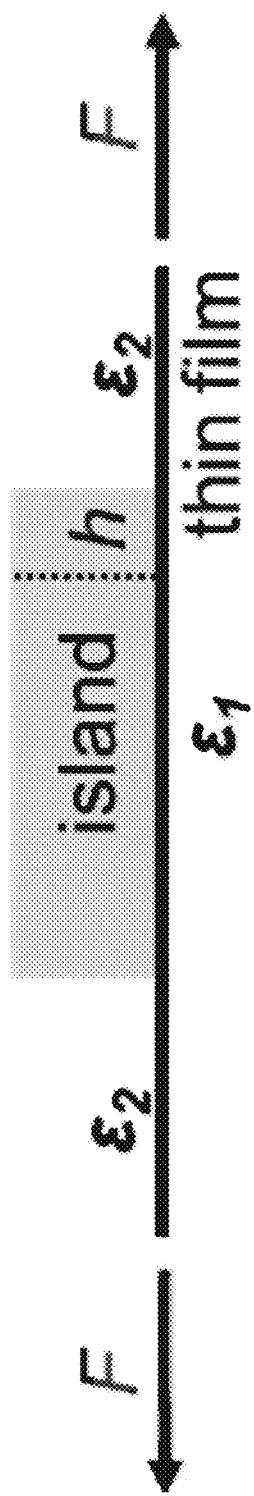
Figure 11C:
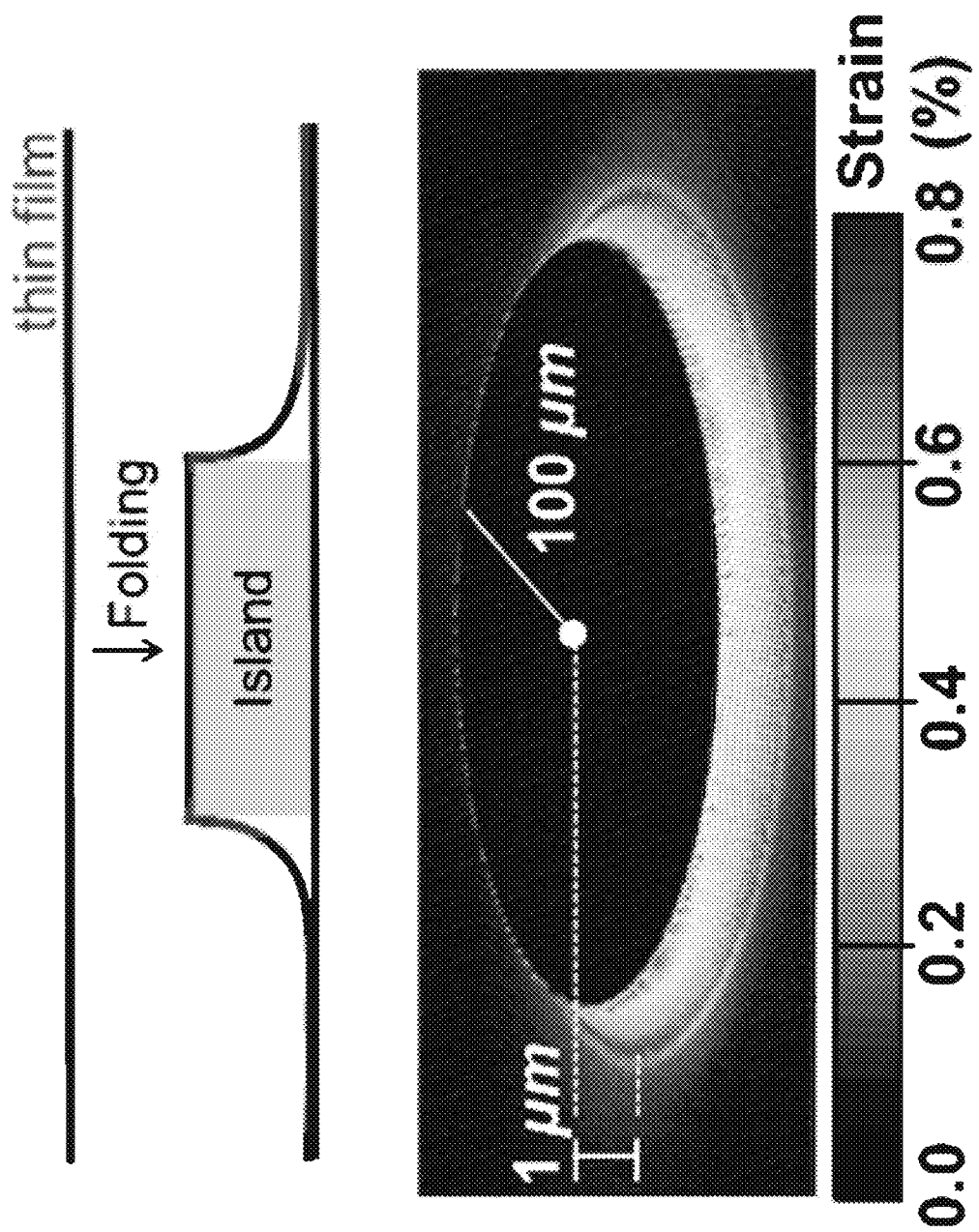
Figure 11D:
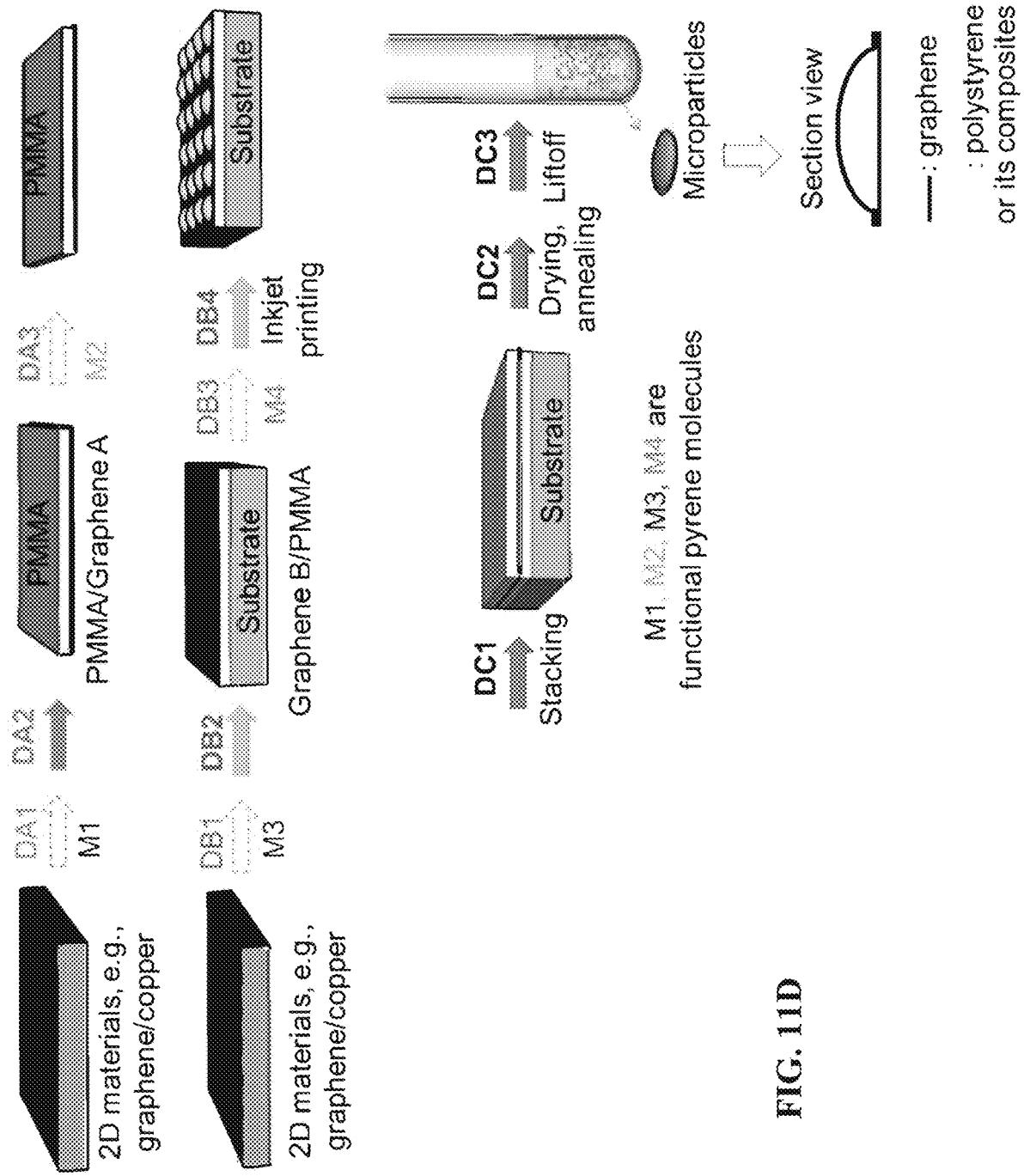
Figure 11F:
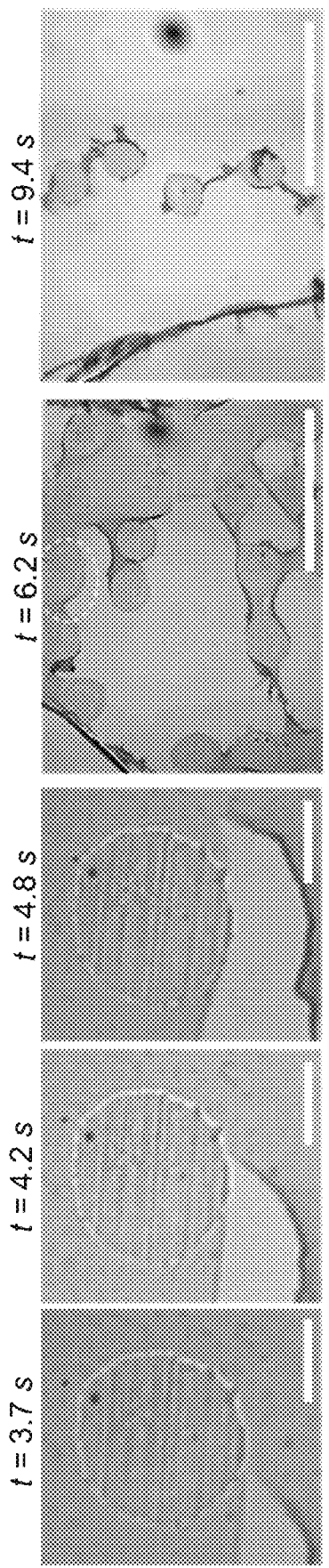
Figures 19A, 19B, 19C:
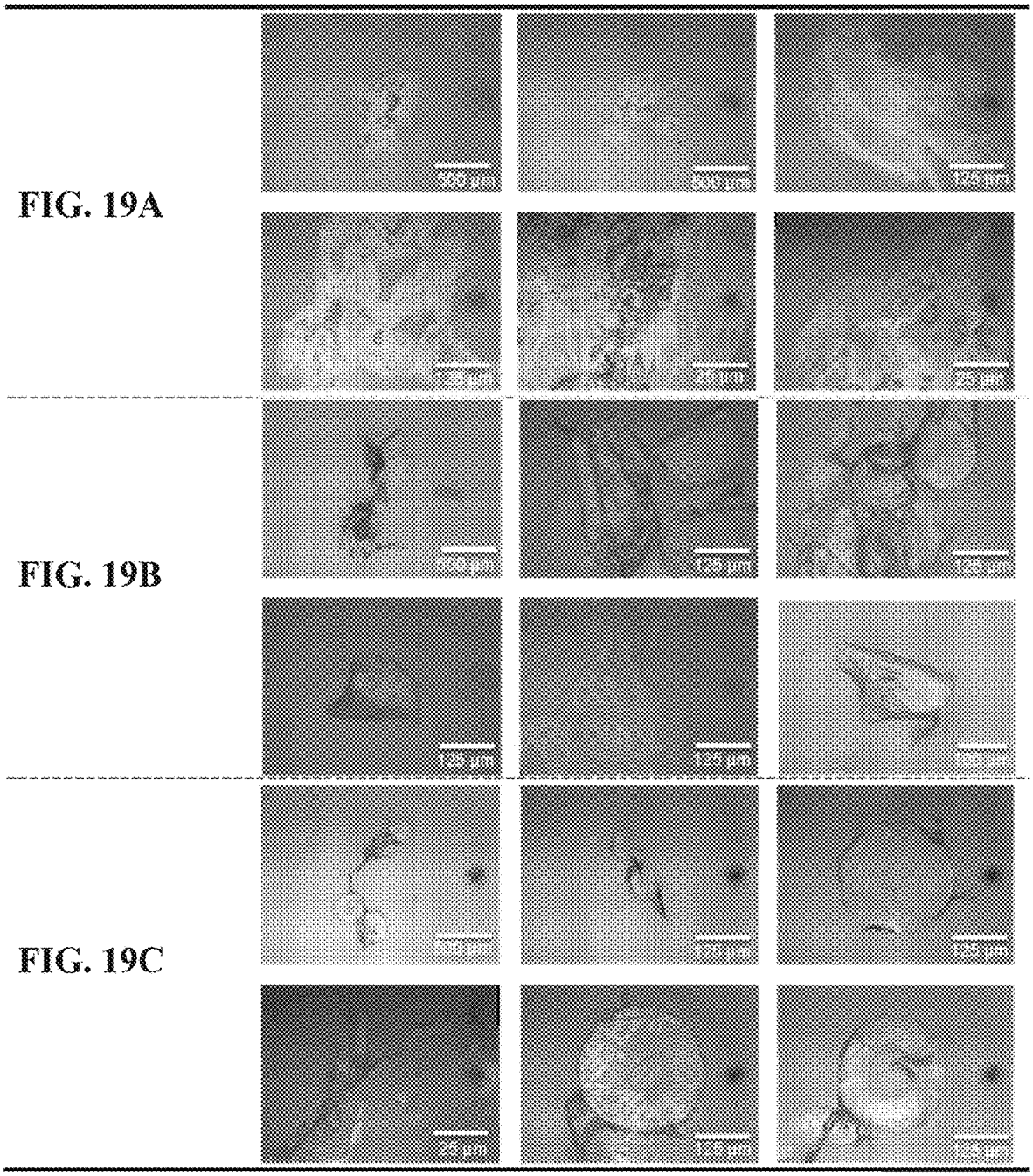
FIG. 19A shows liftoff using $CHCl_3$, a good solvent for both PS latex particles and PMMA layers (FIG. 19A), no particles was found.
FIG. 19B shows liftoff with dimethyl-formamide (DMF) and adding water intermediately to reduce solubility of PS in DMF, PS particles has a poor solubility in $DMF/H_2O$ (3:1 in volume).
FIG. 19C shows liftoff with $EtOH/H_2O$ (80:20 in volume) at temperature 80° C., the solvent can dissolve PMMA layer selectively while not PS, liftoff is successful.
Figures 20A, 20B, 20C:
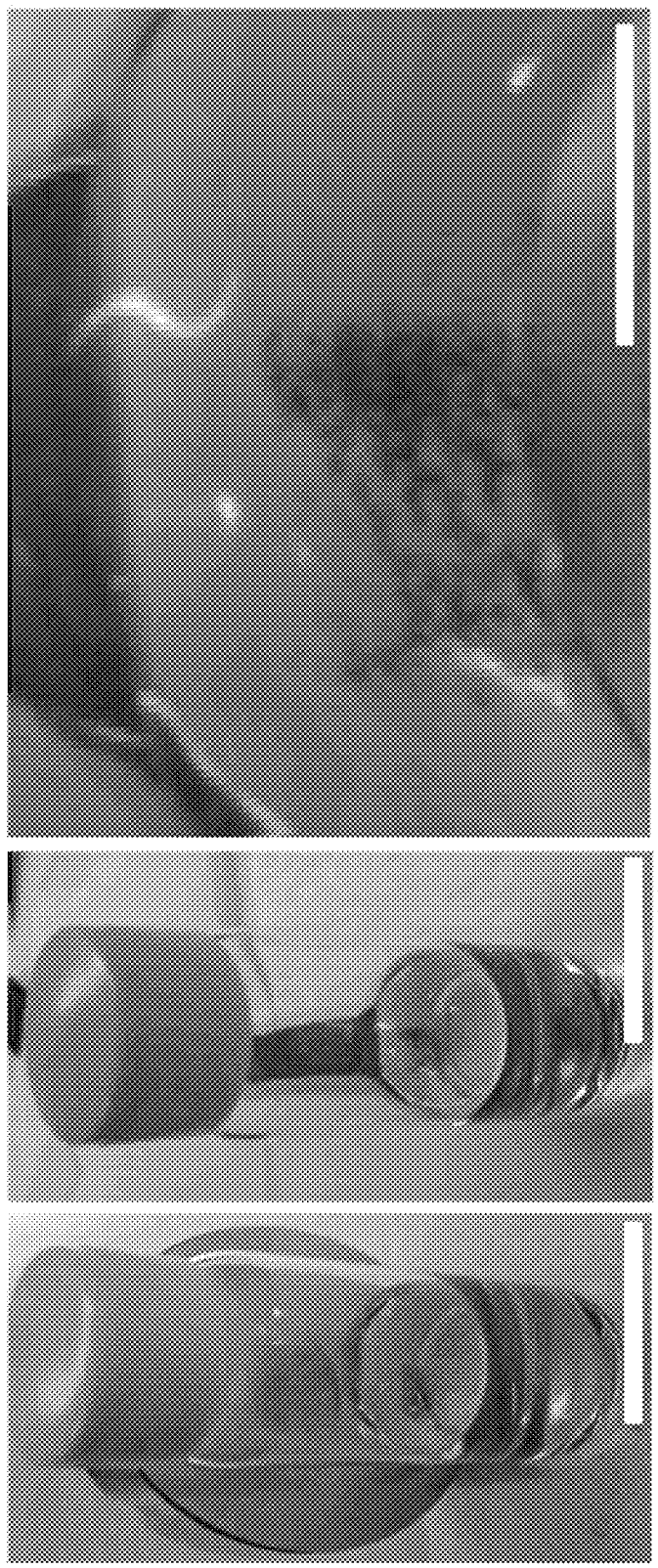
FIG. 20A-20C show magnetic adsorption of graphene microparticles in the water/ethanol (1:4). The particle has an interior composite fillers of iron oxide (0.9 wt %)/PS enclosed within bilayer graphenes. Iron oxide (II,III) nanoparticles with a mean particle size of 30 nm and PS latex nanoparticles with mean particle size=100 nm was mixed in water/ethylene glycol (1.25 wt %) for printing. Scale bars are 2.5 cm, 2.5 cm, and 0.5 cm.

Disclosed herein is an "autoperforation" method that exploits the strain field induced by the encapsulated materials to guide crack propagation within CVD-grown 2D films, and prepare microparticles consisting of functional nanoparticles sandwiched in between two graphene membranes (FIGS. 11B-11H). Specifically, two copper-supported graphene sheets (monolayer or bilayer)—graphene A and B, after a series of manipulations (including functionalization (optional), spin-coating of poly(methyl methacrylate) (PMMA) layer, copper etching, and inkjet printing), are stacked, encapsulating a printed microspot array, to form a sandwiched structure on a PDMS or $SiO_2$/Si substrate (FIG. 11B). For the inkjet printing, 1 nL ink of polystyrene (PS) latex nanoparticle solution (1.2 wt %, mean particles size=50 or 100 nm, see ink composition and particle size effect in FIGS. 15A-15B and 16A-16C) or its composites with other nanoparticles like 30 wt % ZnO (8-16 nm size), 1.9 wt % iron oxide(II, III) (30 nm), or 0.9 wt % black phosphorous (BP) (liquid-exfoliated, 1-3 layers, ~280 nm size, see characterization data in FIGS. 17A-17G and 18A-18B) was used. After stacking, drying at ambient temperature induces capillary forces that can promote the folding/attaching of graphene A onto the array. Further annealing at 120° C. softens PMMA layer and enhances the binding between two graphene layers and their interaction with the microspots. Lifting off the sandwiched structure by selectively dissolving the PMMA layer in EtOH/H$_2$O (4:1) at 80° C. (a case of solvency (see, Polymer Hand Book, 2nd ed; Brandrup, J., Immergut, E. H., Eds.; John Wiley & Sons: New York, Chapter IV, p-244, which is incporated by reference in its entirety), see solvent effect in FIGS. 19A-19C) "hatches" all the microspots from the substrate into the solution (FIGS. 20A-20C). The microspot array guides the crack path of graphene sheets along the spot edges during this liftoff (FIGS. 11E and 11F), and this process was termed as "autoperforation". Magnetic agitation accelerates autoperforation and "cutting out" pancake-shaped microparticles with diameters 260 μm and some of them may have tails (FIGS. 11A-11G and 21A-21B). They are essentially graphene laminated colloid particles that can freely rotate, flow, and interact with each other in solution. Not only can their locomotion be manipulated by tuning the laminar flow patterns, embedding iron oxide nanoparticles inside enables magnetic propulsion. They can be sampled together with solvents and dried on glass slides for further characterization.

For example, an addition to the particles that could grant them locomotion is putting Pt on one side in such a way that they will move in a H$_2$O$_2$ bath by decomposition of this molecule to O$_2$ and H$_2$O. The use of glucose oxidase near the Pt could result in the same locomotion with glucose in the medium instead of H$_2$O$_2$, since glucose reacts at this enzyme to the lactone, yielding H$_2$O$_2$ which then can decompose. This ability to use a chemical bath to power the particle and give it the ability to move solves the problem of finite energy storage inside of the particle itself. One can also design a 'governor' in the form of a hydrogel that is porous, which can swell and contract in response to some input stimulus. Temperature, pH and specific chemical binding can all be used to dynamically control this swelling. If the Pt catalyst is placed on the other side of this hydrogel, separated from the solution, then the reaction and the resulting impulse for motion can be slowed or accelerated by the contracting or expanding of the hydrogel, respectively. This can allow functions within the particle such as detection and memory to control motion, via stimuli to the hydrogel such as temperature, pH, chemical binding etc. A particle that releases acid, for example, can influence this governor and control motion. This release can also stimulate other nearby moving particles, causing them to move or stop collectively, hence mimicking aspects of the human immune system where signaling, recruitment and locomotion are controlled for a collection of actors.

In another example, 2D materials can be implemented as atomically-thin molecular barriers. These barriers can encapsulate analytes inside microparticle with an ability of releasing analytes through pores in 2D materials. Additionally, these pores can allow flux of analytes inside microparticles. Such liquid and gas exchange can also take place inside the microparticle, where 2D materials form isolated volumes, similarly to cells' organelles.

In certain embodiments, outer surface can have patterned electronic layouts. The interaction of several microparticles with such layouts can shortcut electrical connection, altering electronic layout and changing particle functions and capabilities. Microparticle function is therefore determined by the presence of other microparticles. Different microparticles can induce different circuits on top of the microparticle upon their contact.

Figure 22B:
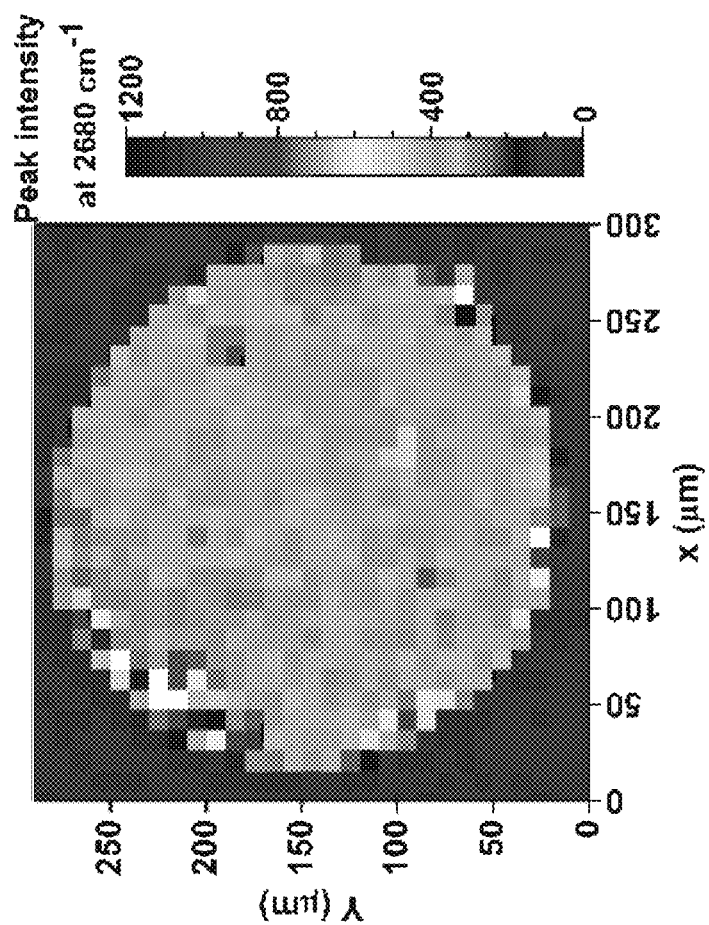
FIG. 22B shows Raman mapping of its 2D peak intensity at 2680 $cm^{-1}$ with a pixel size of 5×5 μm.
Figure 22A:
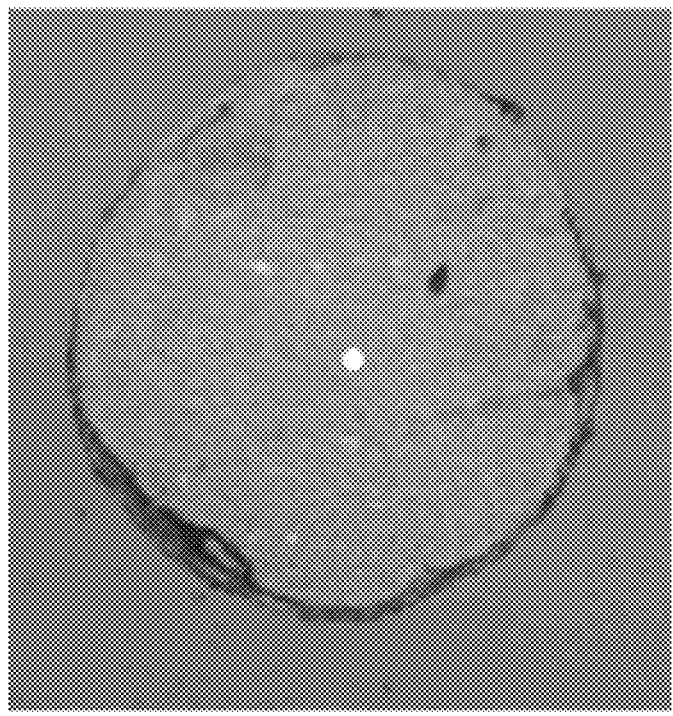
FIG. 22A shows optical microscopy image of the microparticle G-ZnO (30 wt %)/PS-G with scale bar of 100 μm.
Figure 24A:
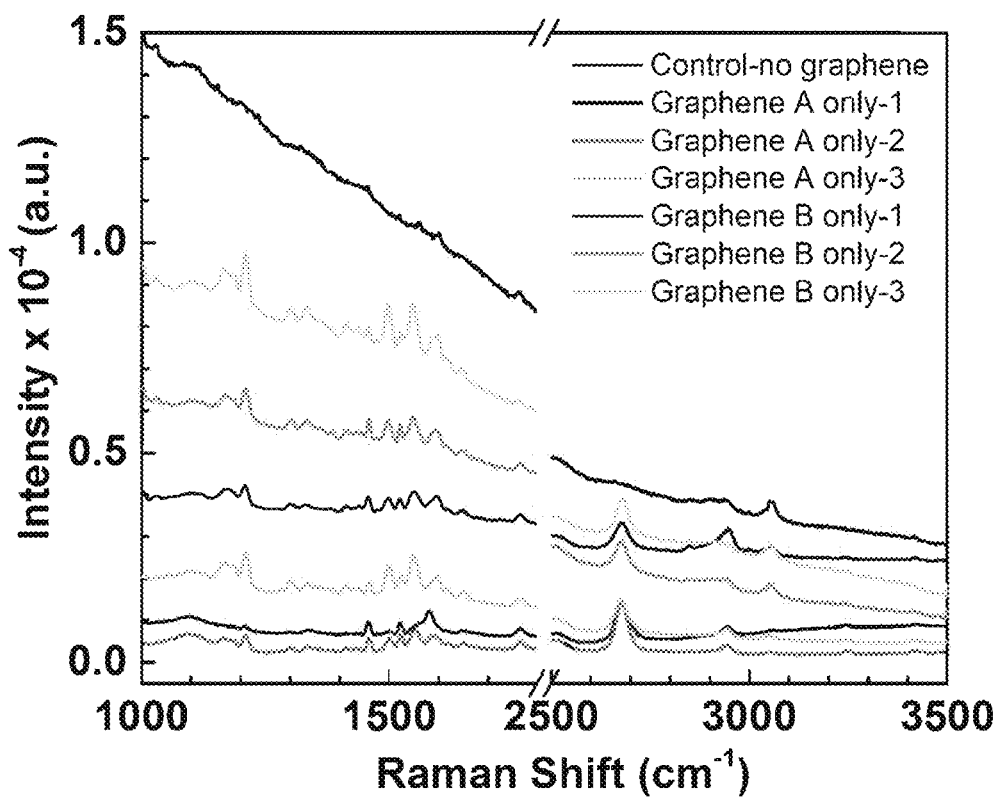
FIGS. 24A-24B show Raman spectra of microparticles only having one layer of graphene (Graphene A or Graphene B only, bilayer).
Figure 24B:
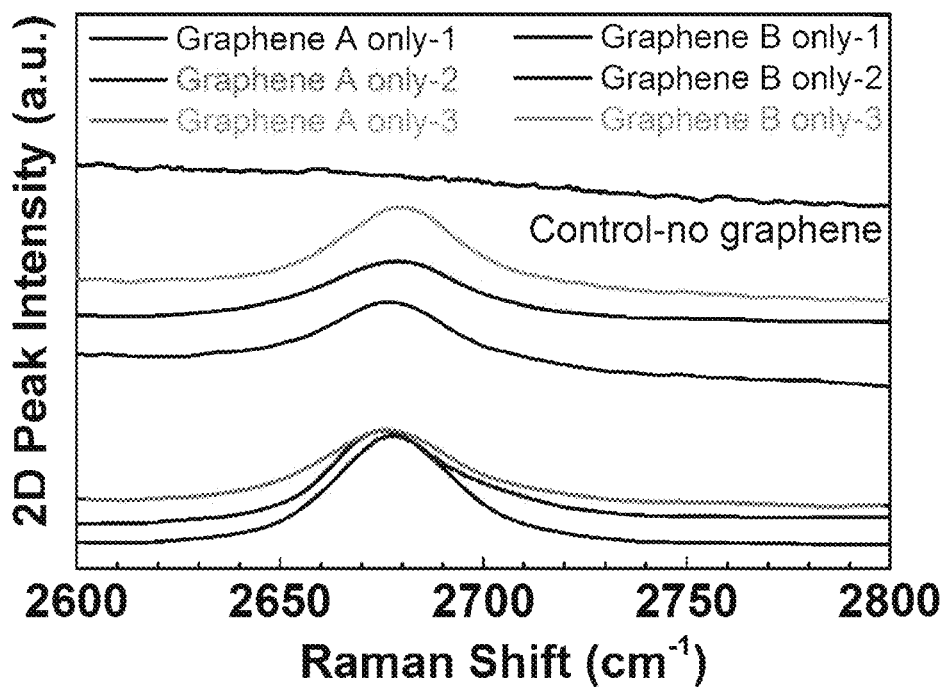
Figure 25:
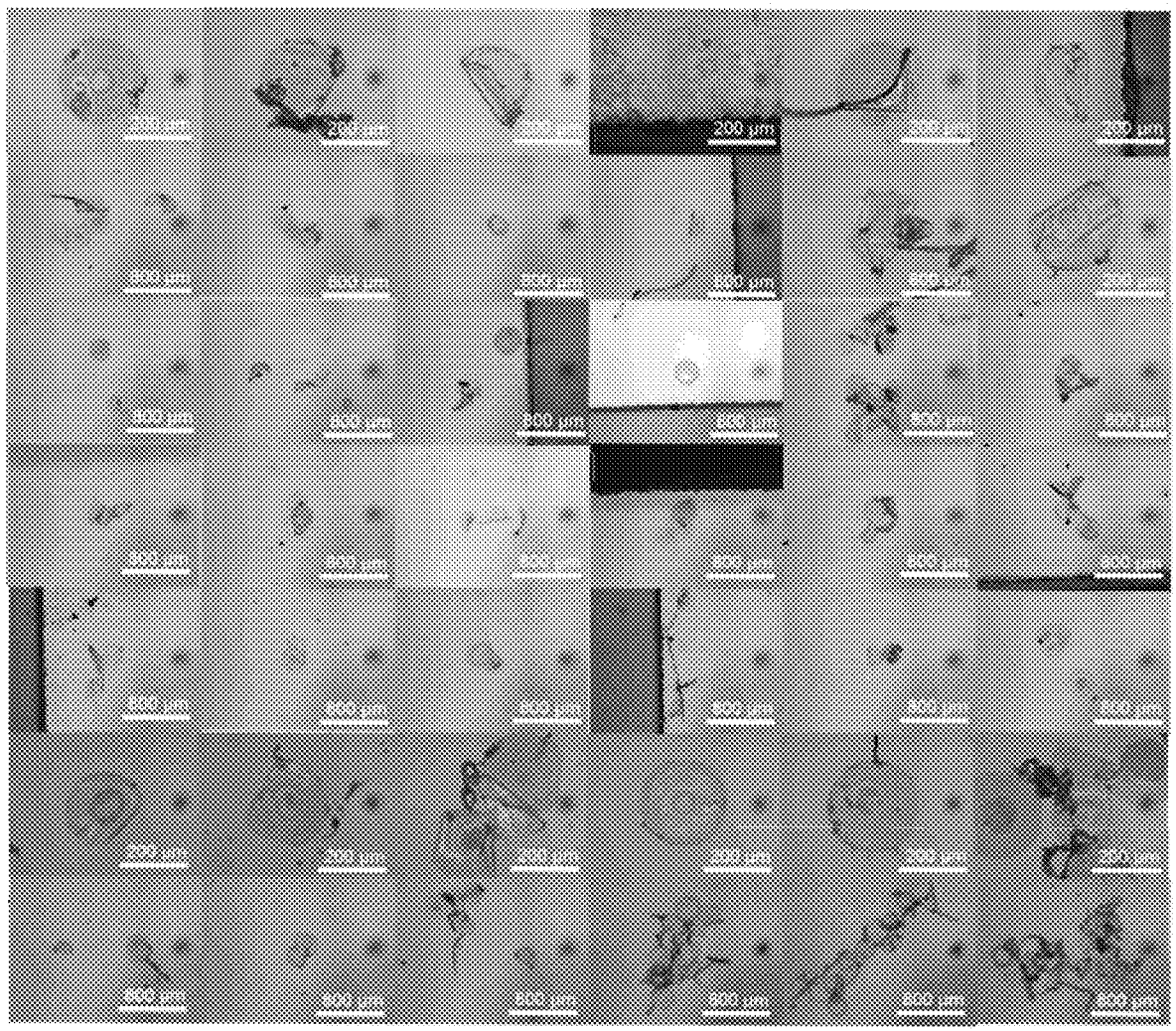
FIG. 25 shows a statistical study of the yield of the as-prepared G-PS-G microparticles fished out after liftoff, 86 microparticles of 115 are good without breakage with a yield ~80%. Bilayer graphene and 1 nL of PS latex nanoparticle ink (1.2 wt % in mixture of water and ethylene glycol (1:1), mean particle size=100 nm) were used for printing, and an annealing temperature of 120° C. in the fabrication. All the microparticles were naturally dried on glass slides after fishing out via dropper and counted under microscopy with 5× or 20× objectives.
Figure 26:
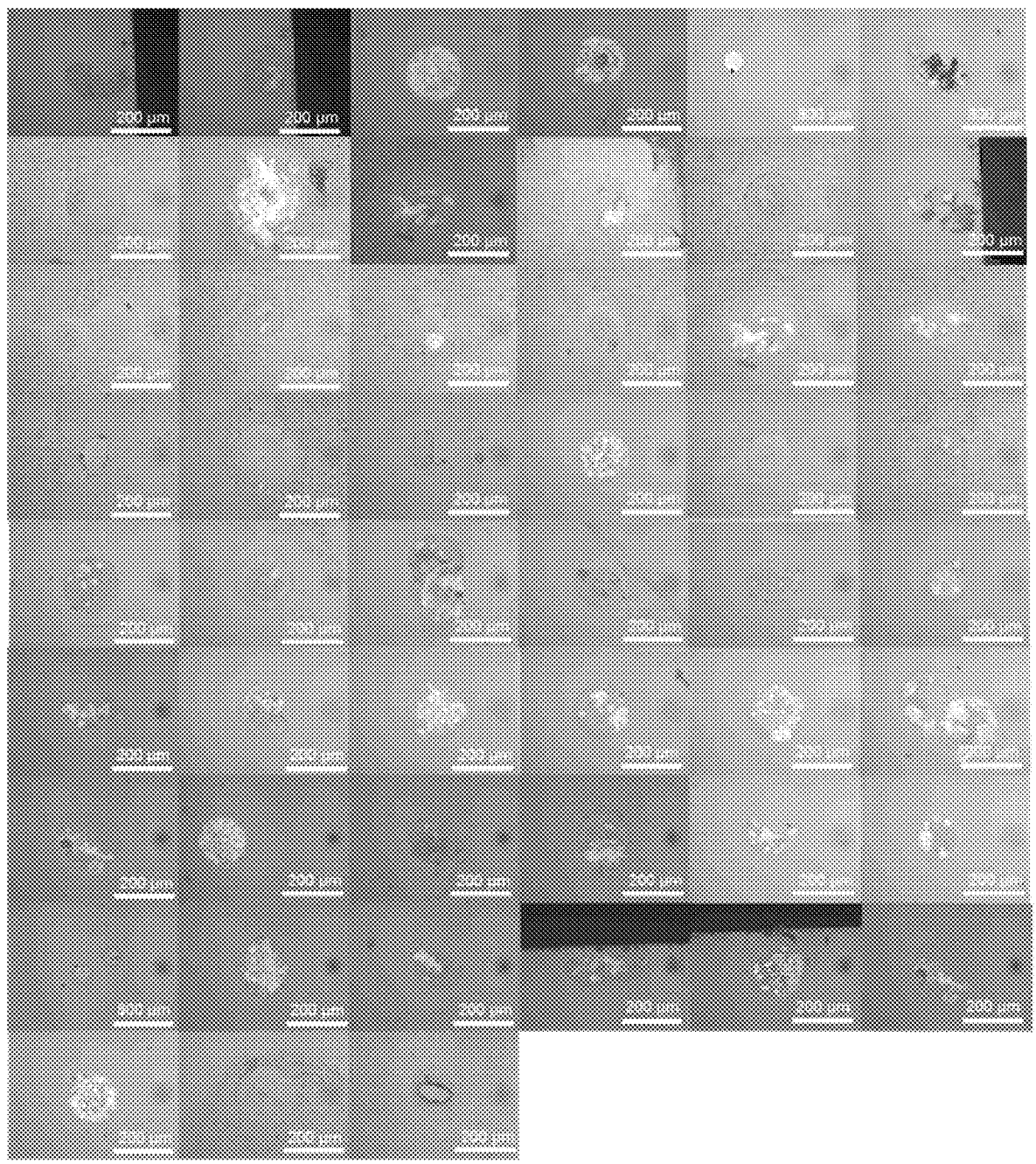
FIG. 26 shows a statistical study of the yield of the PS microparticles fished out after liftoff immediately, 36 microparticles of 66 have good shape without breakage with a yield ~55%. All the fabrication operation are the same as G-PS-G in FIG. 25 except no use of graphene. All the microparticles were naturally dried on glass slides after fishing out via dropper and counted under microscopy with 5× or 20× objectives.
Figure 27A:
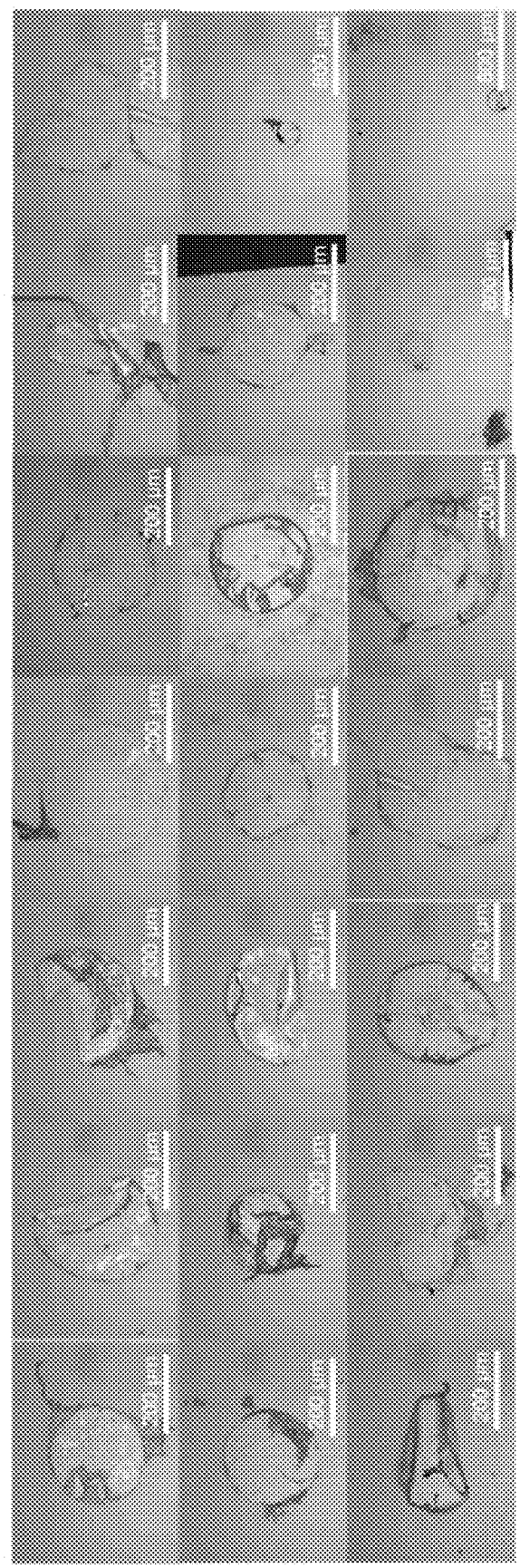
FIGS. 27A-27E show a statistical study of the yield of the G-PS-G micoparticles after a storage time of one week (FIG. 27A), with 18 particles of 24 are good; three weeks, 24/31 (FIG. 27B); 100 weeks, 39/58 (FIG. 27C); and 4 months, 34/63 (FIG. 27D). All the particles are the same as that in FIG. 24.
Figure 27B:
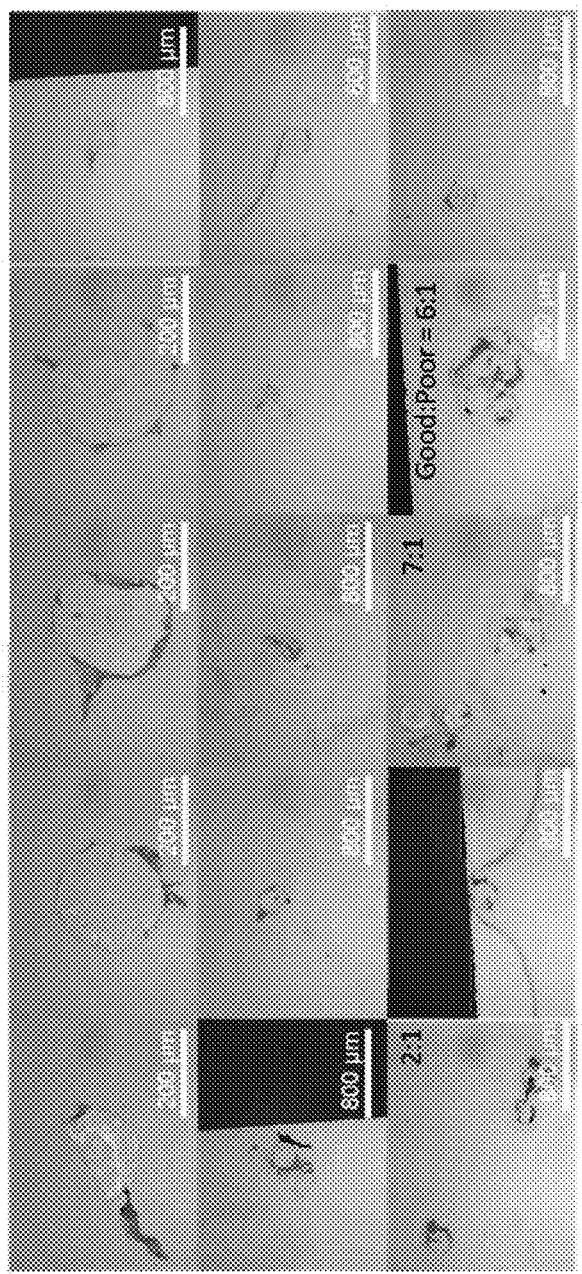
Figure 27C:
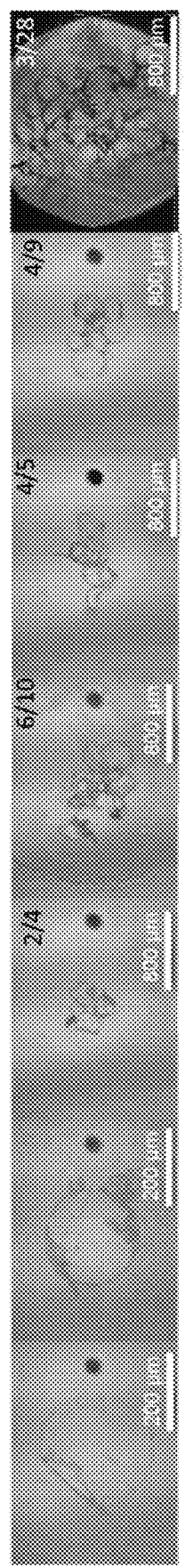
Figure 27D:
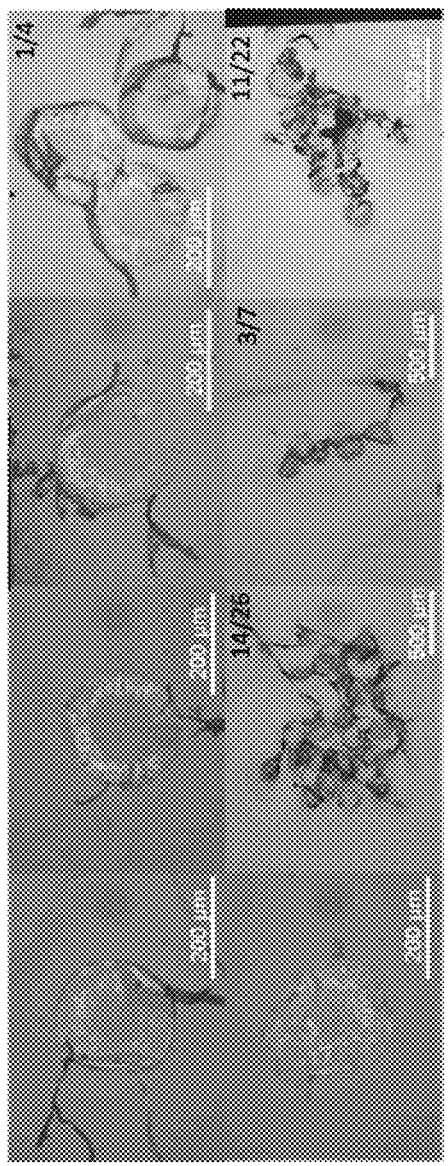
Figure 27E:
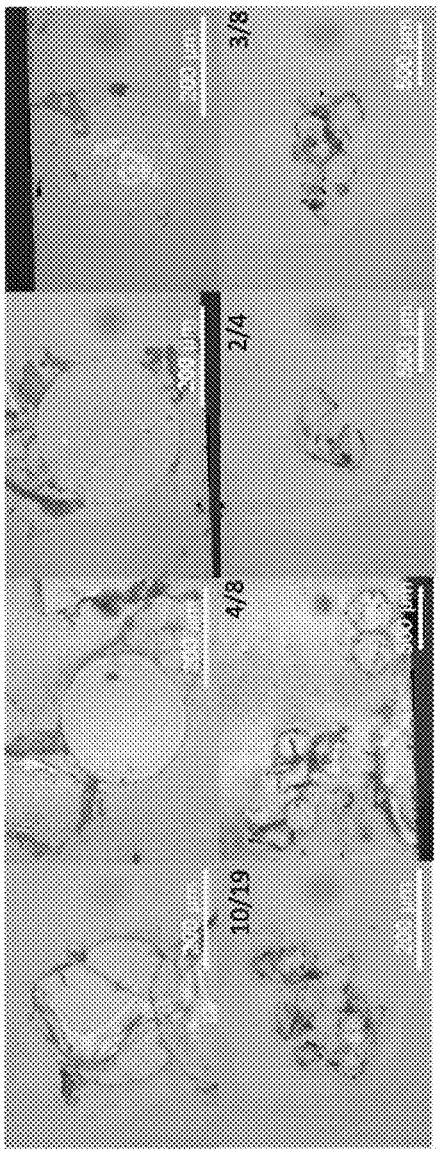
Figure 28A:
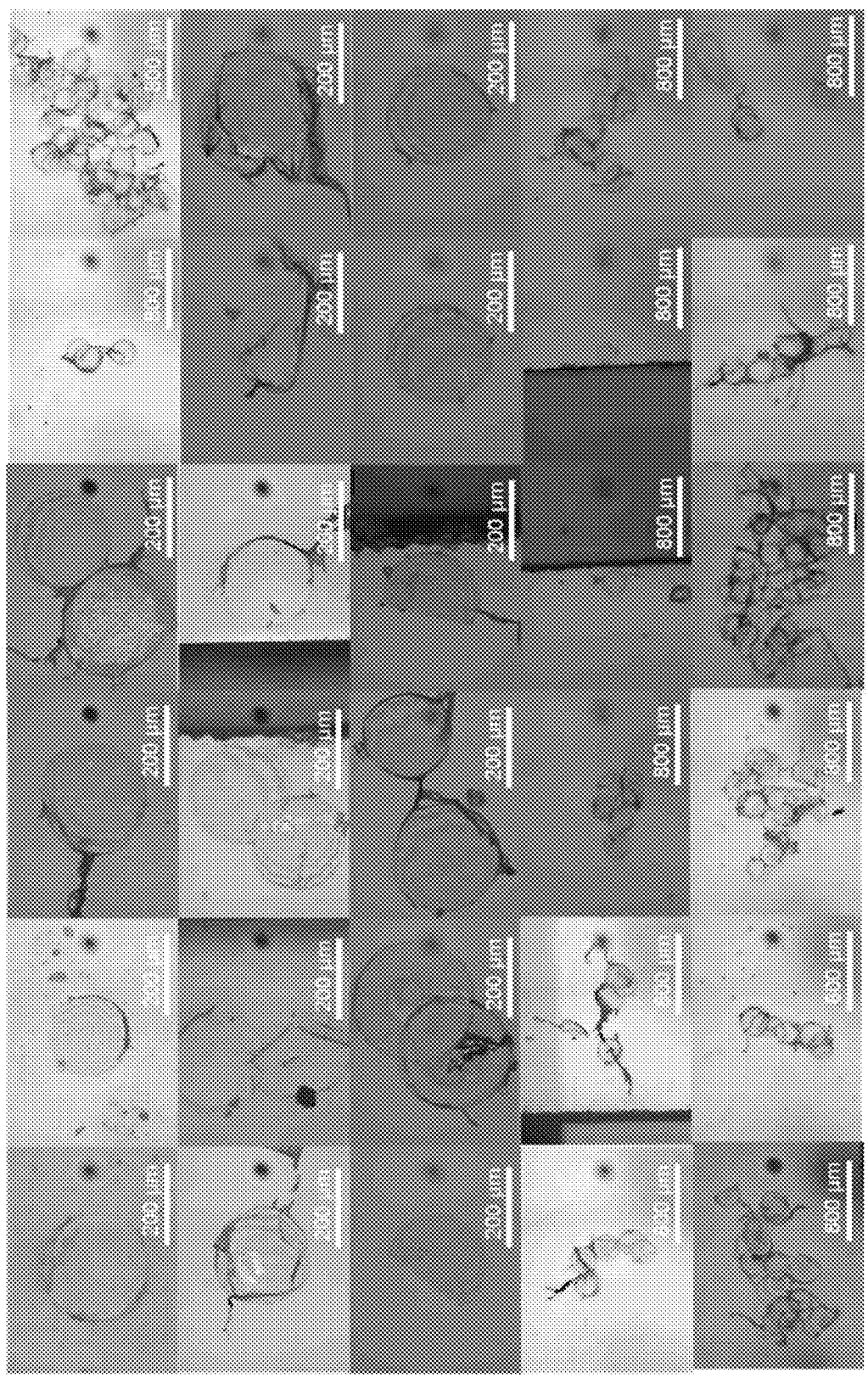
FIGS. 28A-28B show statistical study of the yield of the G-BP (0.9 wt %)/PS-G micoparticles.
Figure 28B:
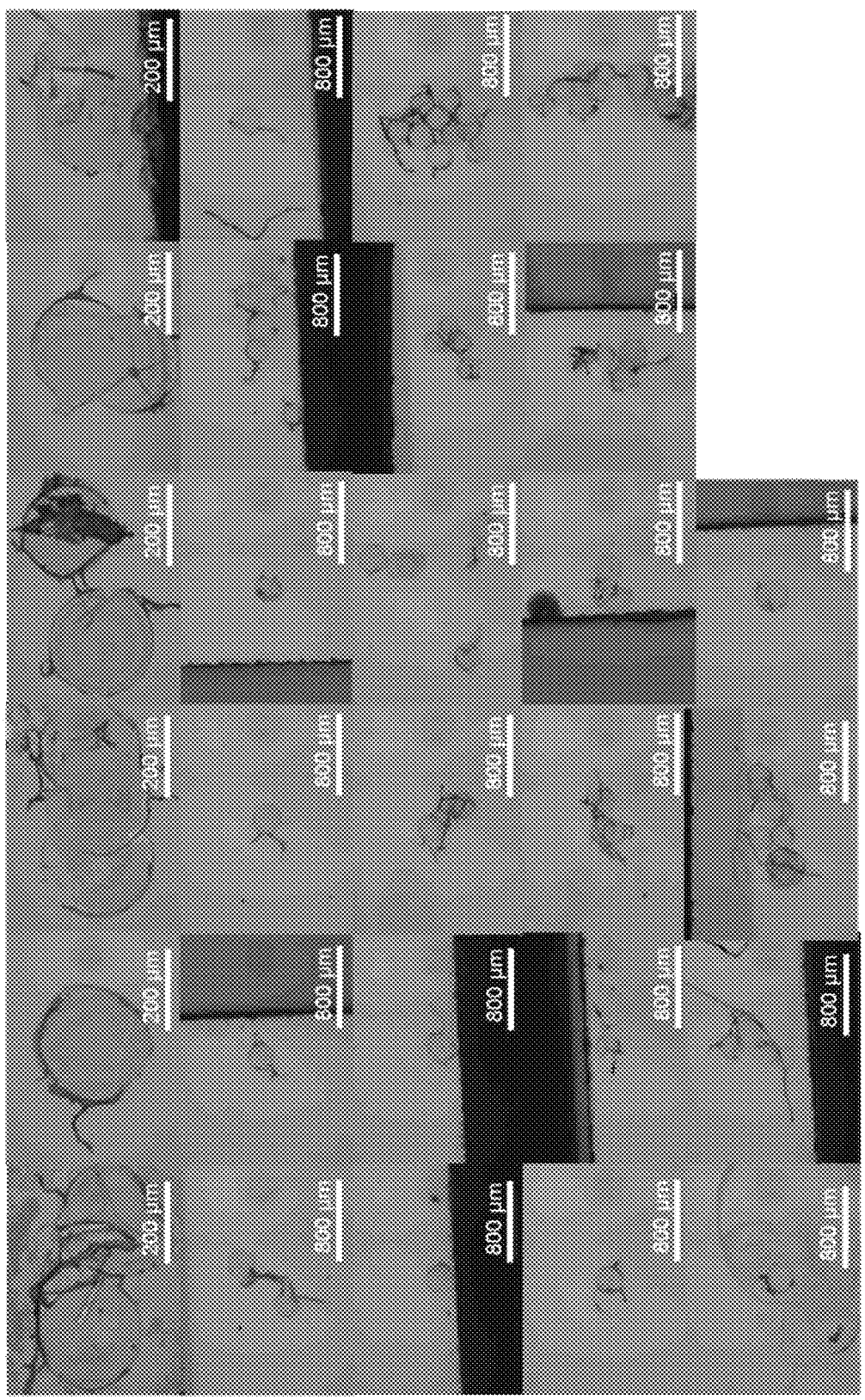
Figure 29:
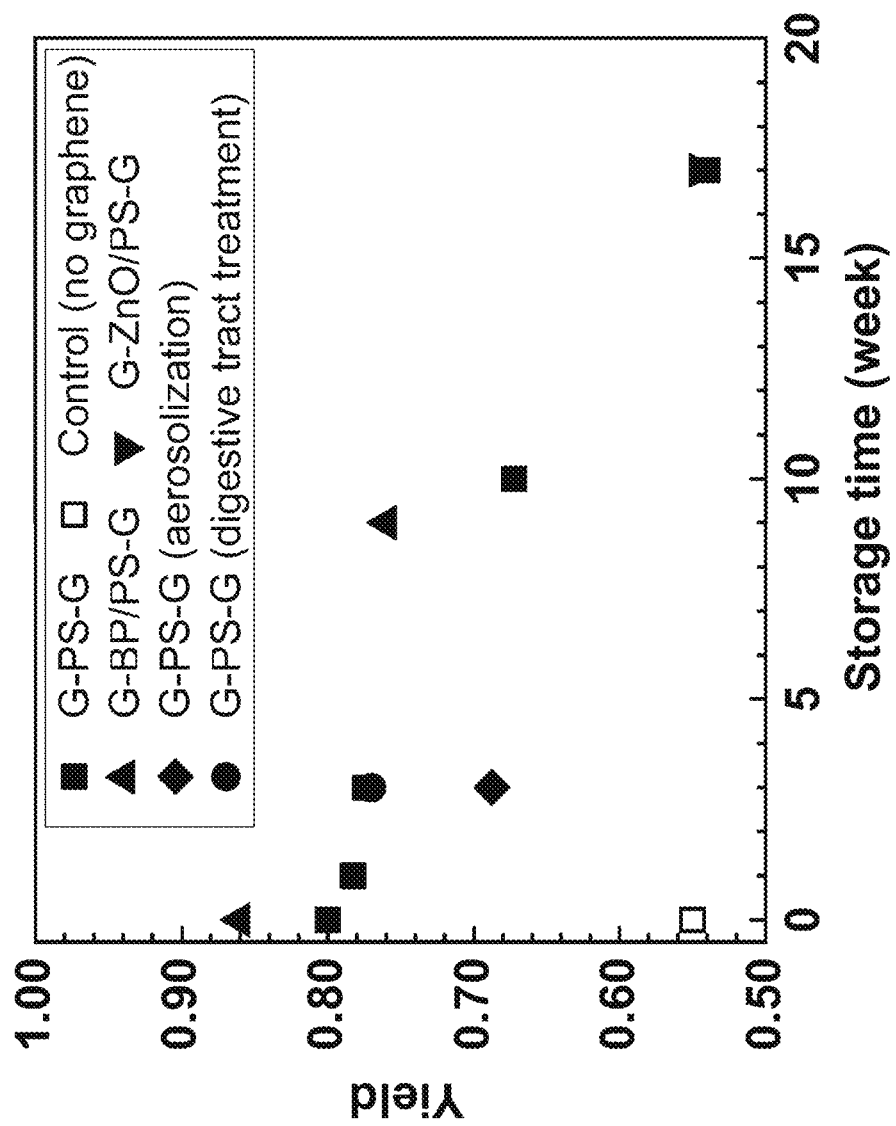
FIG. 29 shows plot of the yield (or survival rate) of various graphene microparticles after different storage time and treatment.
Figure 30:
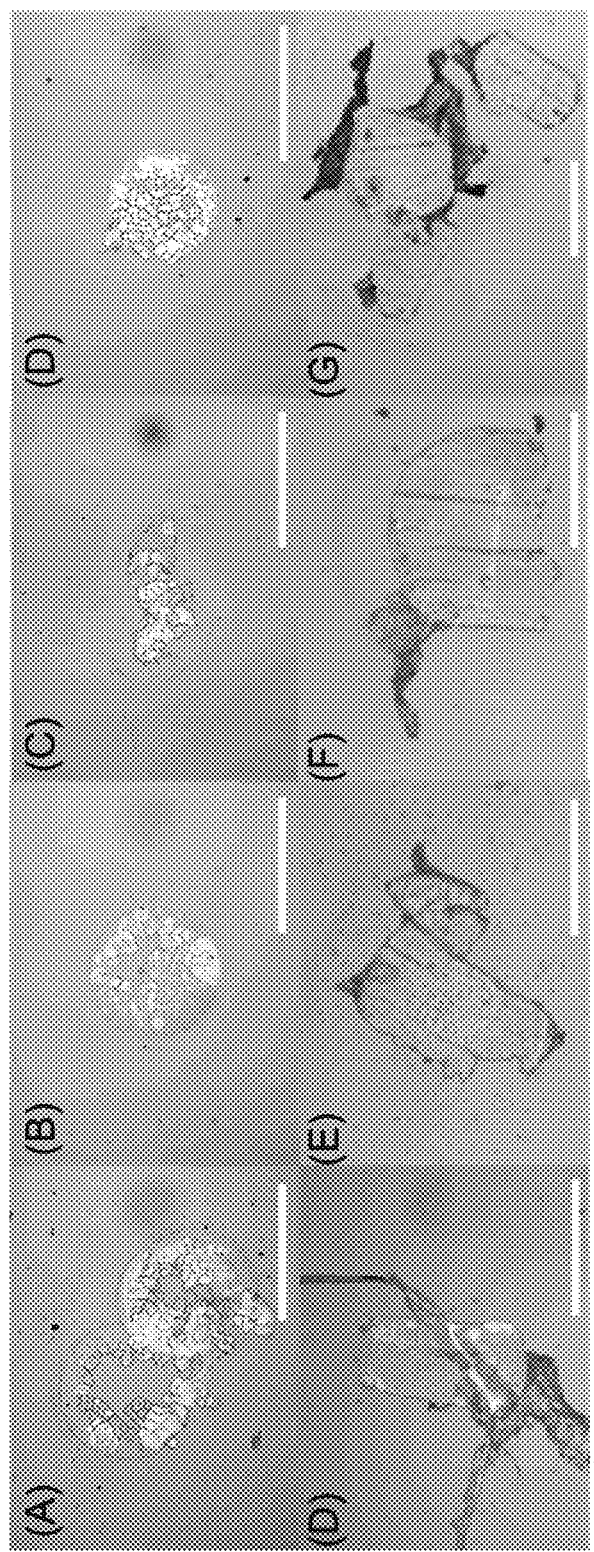
FIG. 30 shows a comparison of the breakage of microparticles with or without graphene under microscope: (A)-(D) are the PS control particles without graphene coverage; (D)-(G) are G-PS-G microparticles with bilayer graphene coverage. The two particles were prepared with a same procedure and same PS latex ink (1 nL, 1.2 wt %, 100 nm), scale bars are 200 μm.
Figure 31A:
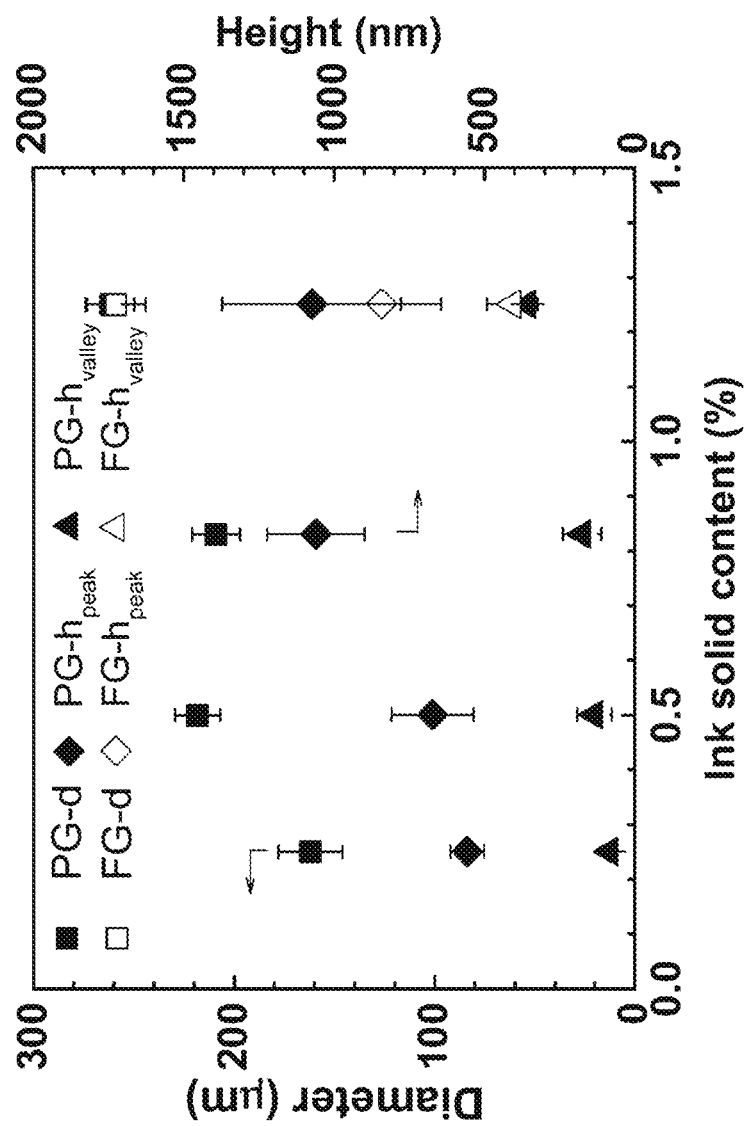
FIGS. 31A-31D show effect of solid content of ink (0.2-1.2 wt %) on the diameters and profiles of the microparticles.
Figure 31B:
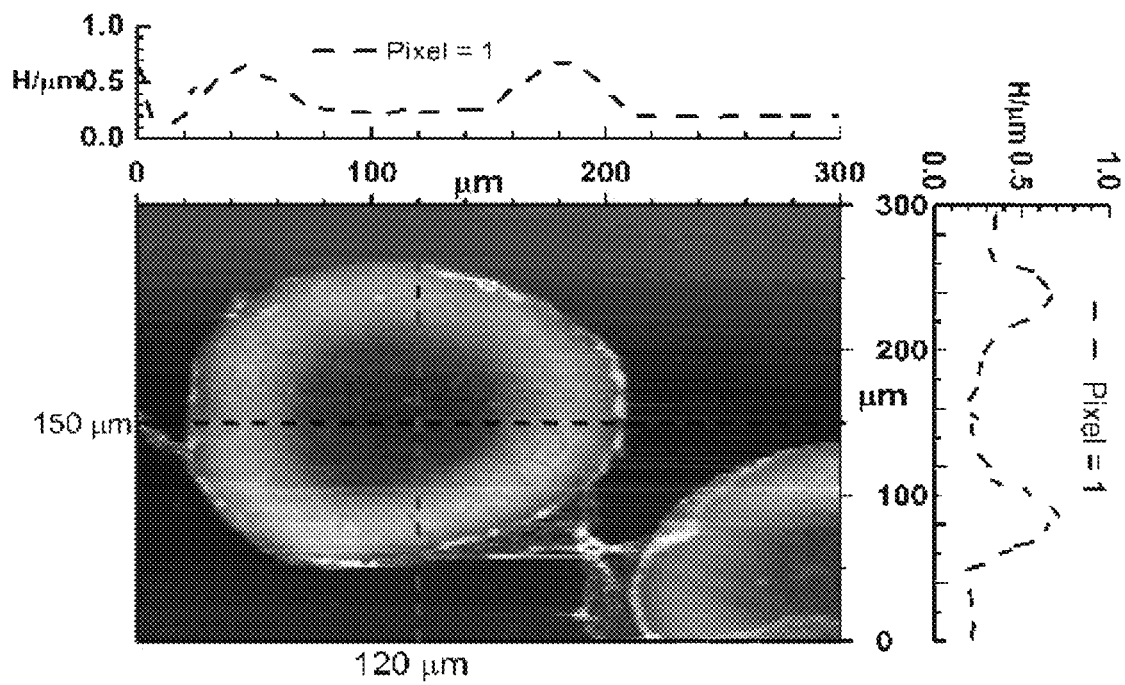
Figure 31C:
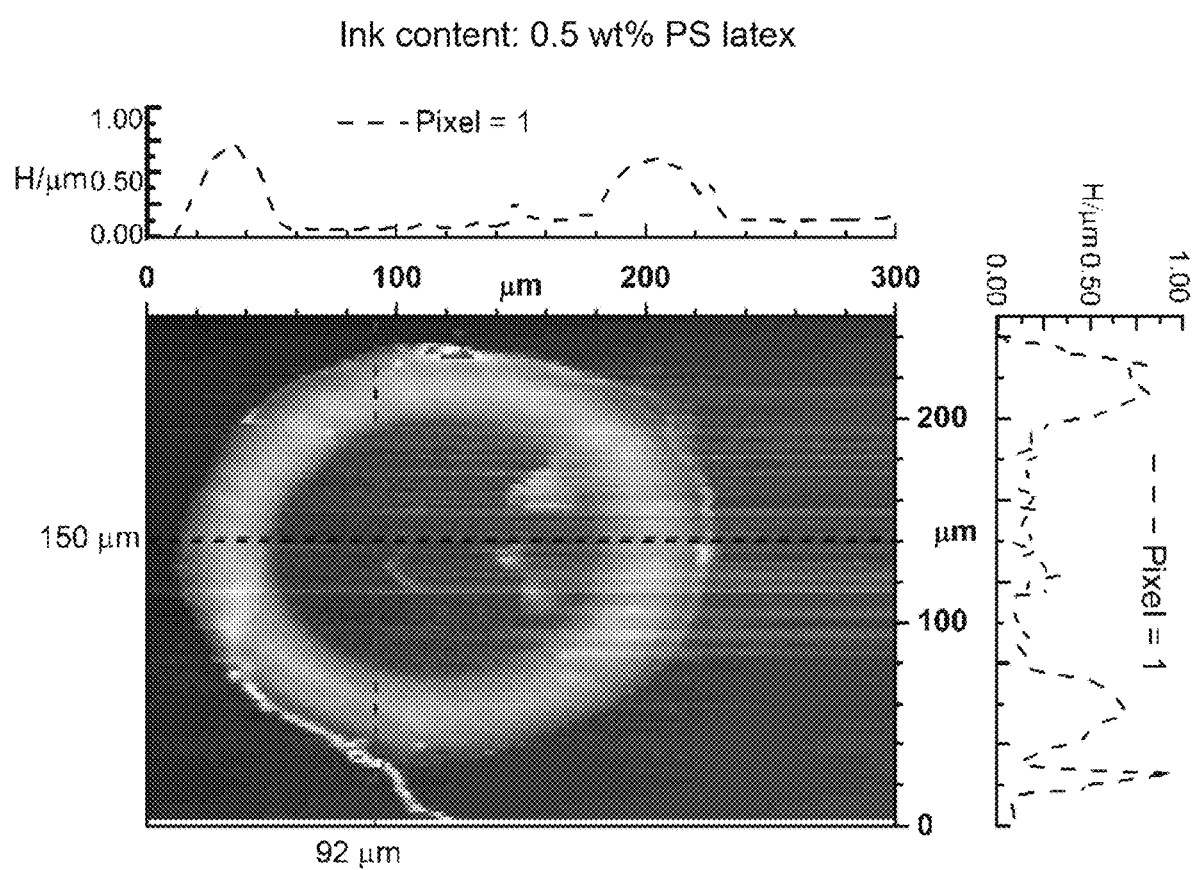
Figure 31D:
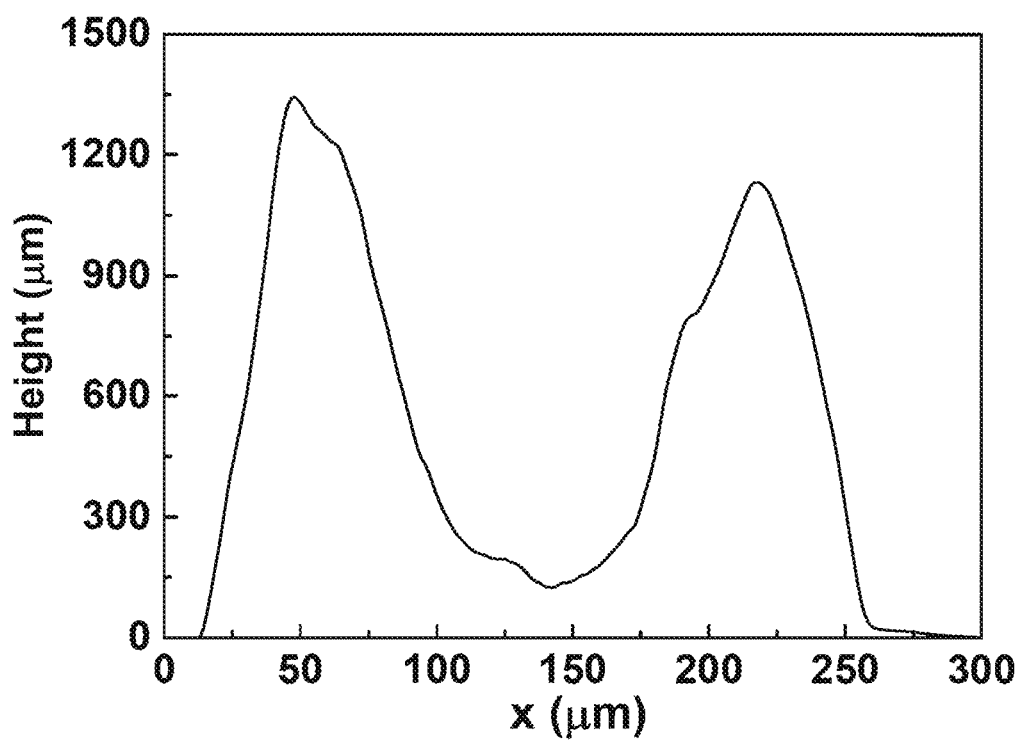
Figures 32D, 32E:
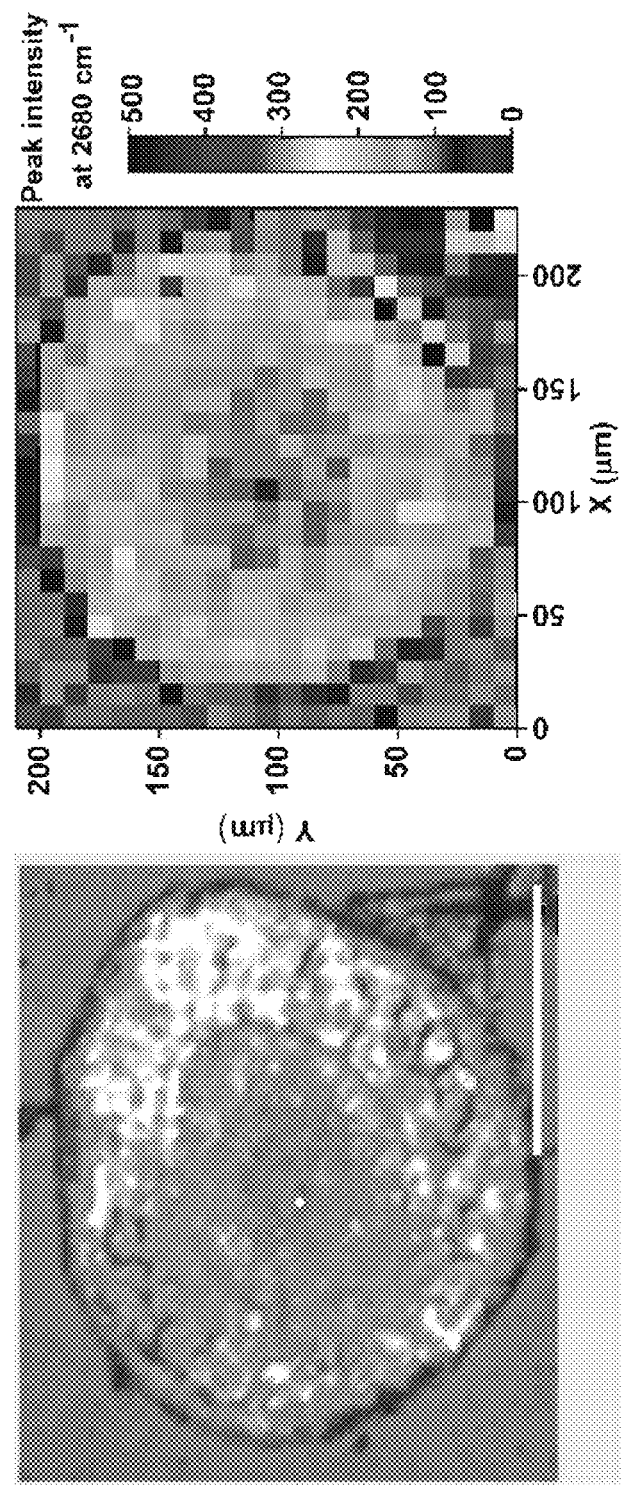
Figure 34A:
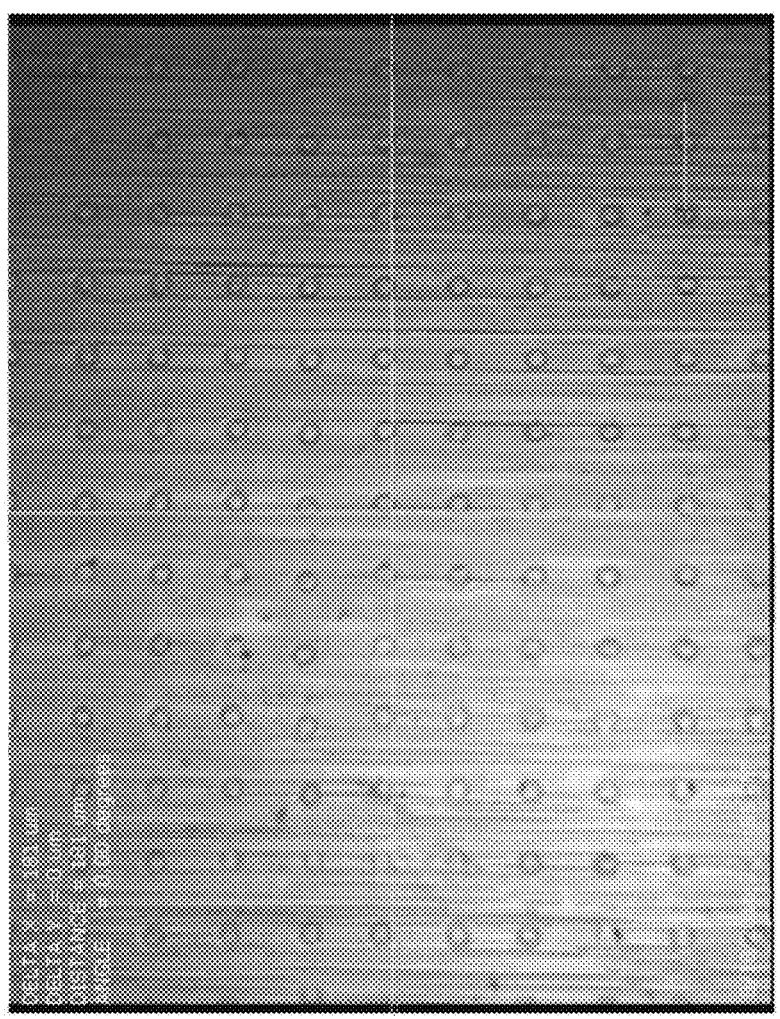
FIG. 34A shows the printed microspot array on graphene/PMMA/PDMS substrate with an ink (1.25% PS latex, ~50 nm, in mixture of water and ethylene glycol (1:1)) volume of 10 pL, the scale bar is 180 μm.
Figure 34B:
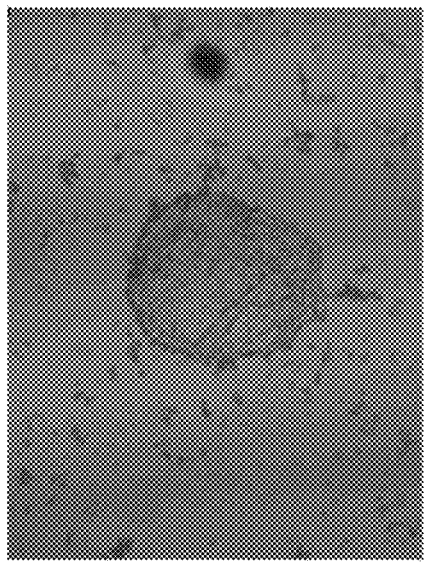
FIG. 34B-34I show optical images of G-PS-G particles after liftoff the microspot array in FIG. 34A, the average diameter is determined to be 34.2±1.4 urn, all figures have the same scale bars of 40 μm.
Figure 34C:
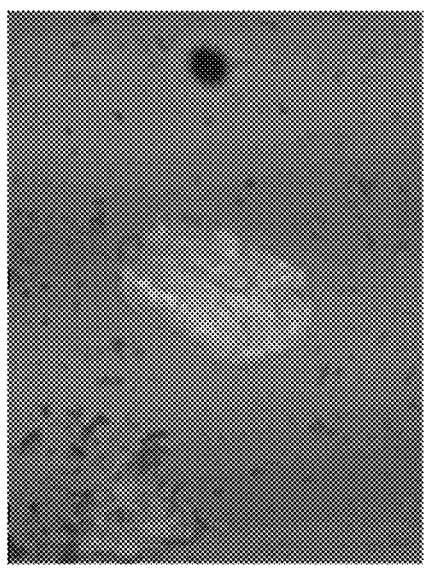
Figure 34D:
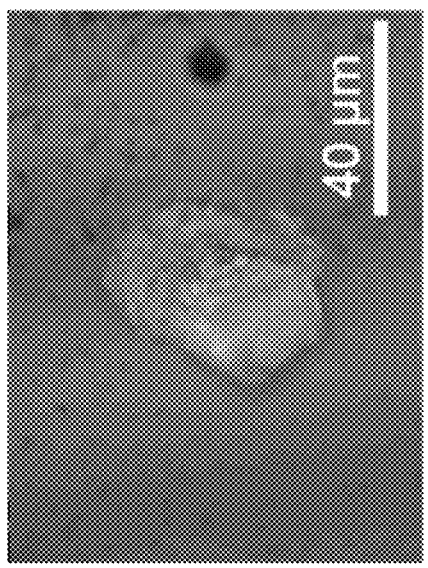
Figure 34E:
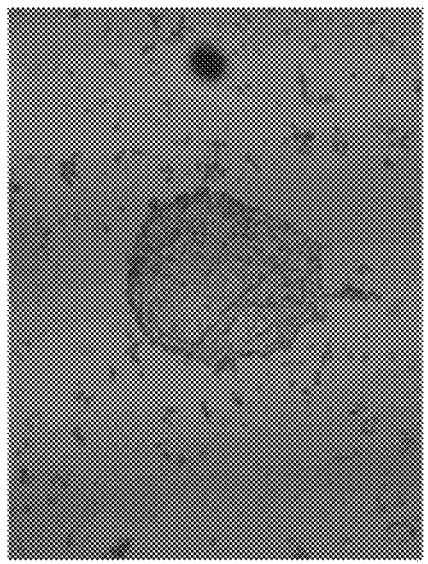
Figure 34F:
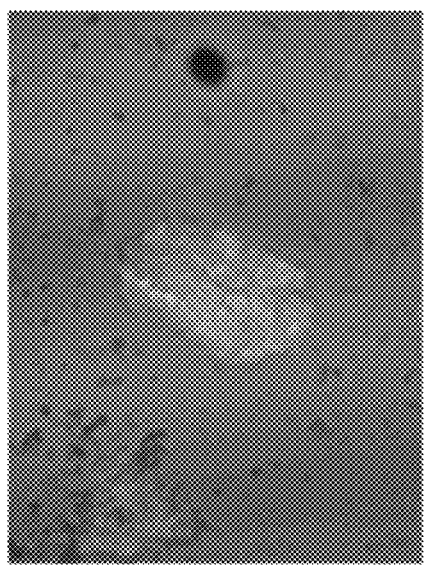
Figure 34G:
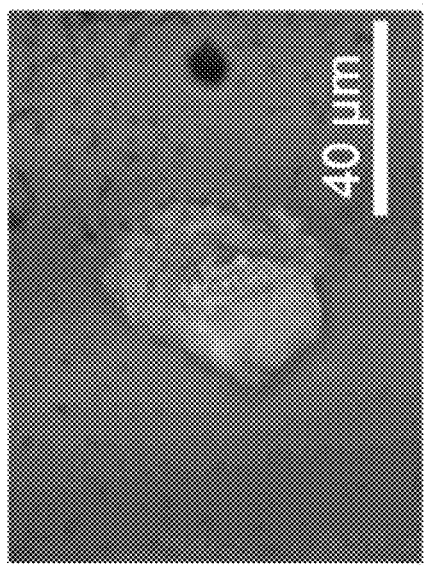
Figure 34I:
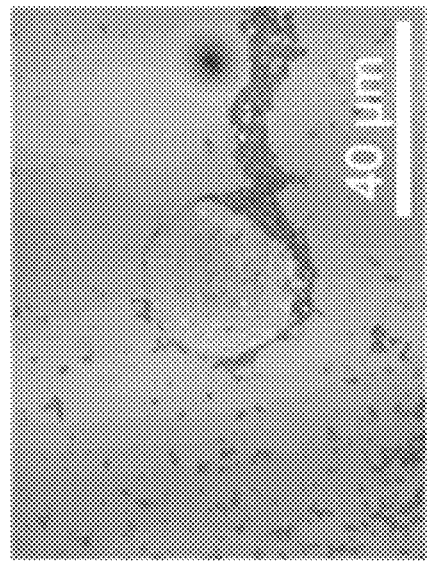
Figure 34H:
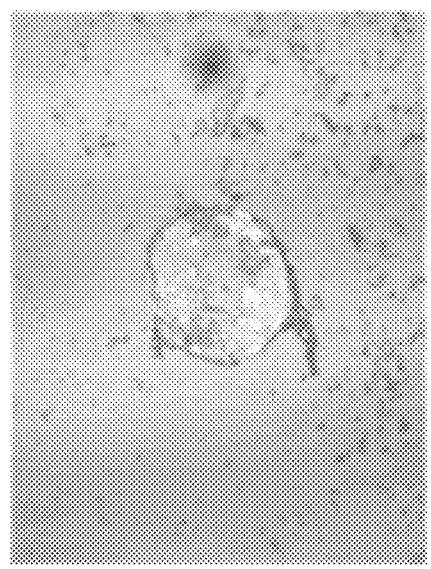
Figure 34J:
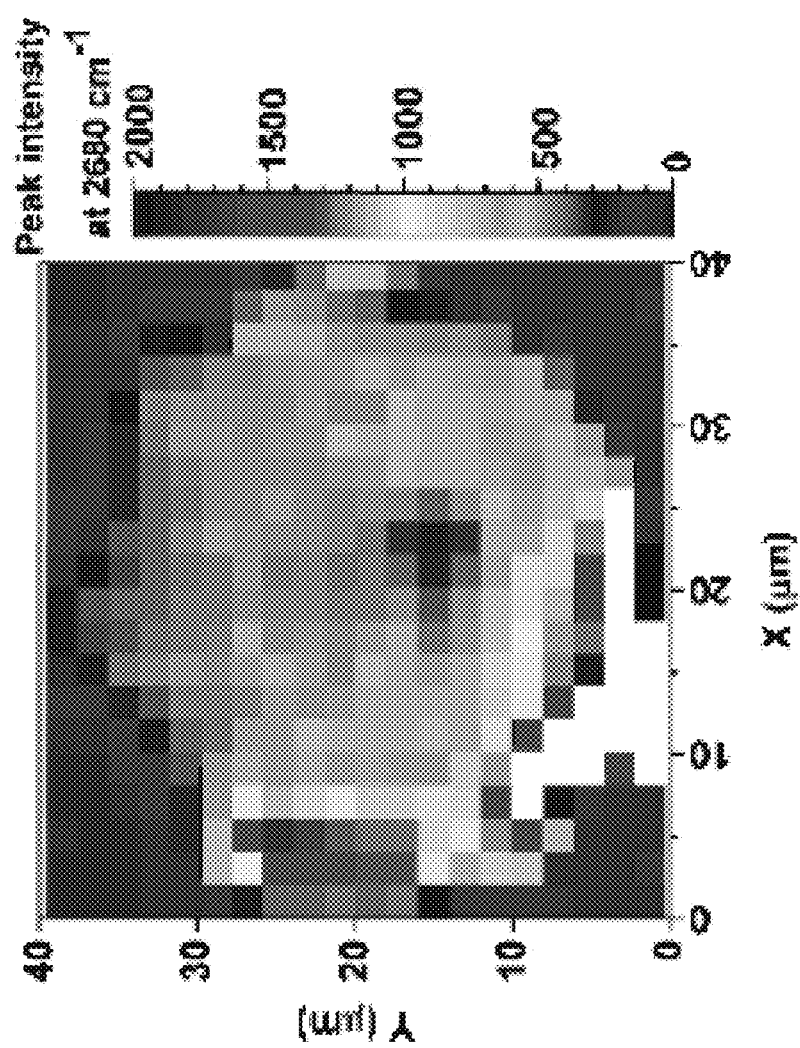
FIG. 34J shows Raman mapping of the 2D peak from graphene on the particle shown in FIG. 34I.

The microparticle has well-preserved graphene on both surfaces and the graphene sheet significantly improves the colloidal stability during the liftoff and storage (FIGS. 11H and 11I). Raman mapping the 2D peak signal at 2680 cm$^{-1}$ of the graphene-PS-graphene (G-PS-G) microparticle confirms the complete coverage of bilayer graphene on its surface (FIG. 11H and G-ZnO/PS-G in FIGS. 22A-22B). Little change occurs to the graphene G and 2D peak intensity as well as their ratios before and after liftoff (FIGS. 23A-23B). Only one layer of graphene (either graphene A or B) can be introduced on to the particle via autoperforation (see Raman spectra results in FIGS. 24A-24B). To study the stability (measured in "yield", or survival rate) of the microparticles in ethanol/water (1:1) over time, particles were sampled out with a number up to 170 at different storage time and documented the percentage with no visible physical damage, i.e., in good circular shape (see microscopy images of all particles in FIGS. 25-29). G-PS-G has a yield of 0.80 after liftoff, substantially higher than 0.55 for control particles without any graphene protection (FIG. 34I). This yield slowly decreases with time and goes down linearly to 0.54 after 4 months. Compositing PS with BP nanoflakes increases the yield appreciably, reaching 0.85 at the beginning and 0.76 after 9 weeks of the aqueous storage (FIG. 34I). Note that the fracture modes of graphene microparticles are different from the controls, with graphene ones more likely to break via tearing while controls typically smash to tiny fragments quickly from the center (FIG. 30).

Figure 12A:
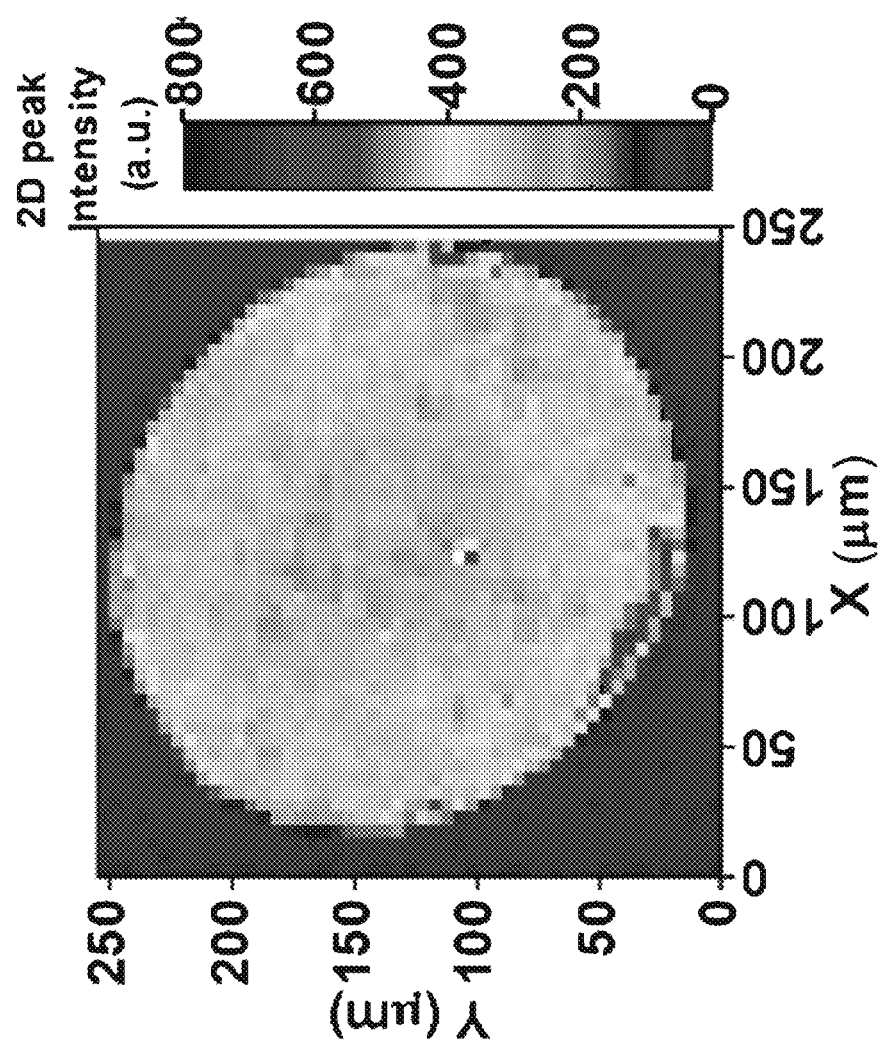

The lateral profiles of microparticles were measured (FIGS. 12A-12C) and the geometry data were combined with modeling (FIGS. 12D-12F) to understand the above process. G-PS-G microparticle approximates a concave toroid (FIG. 12A) with average peak height (h$_{peak}$) of 1.1 μm and valley height (h$_{valley}$) of 0.4 μm, affording the observed "M-shaped" profile (FIG. 12C). Lowering ink concentration to 0.2 wt % can linearly reduce h$_{peak}$ to 0.6 μm, h$_{valley}$ 0.1 μm, and the diameter about 160 μm (FIGS. 12C and 31A-31D). Compositing PS with BP or ZnO nanoparticles will alter the particle to a convex dome (FIG. 12C) with a similar diameter ~260 μm and tunable h$_{peak}$s between 0.8 and 1.2 μm (FIGS. 12C and 32A-32D).

Figure 12D:
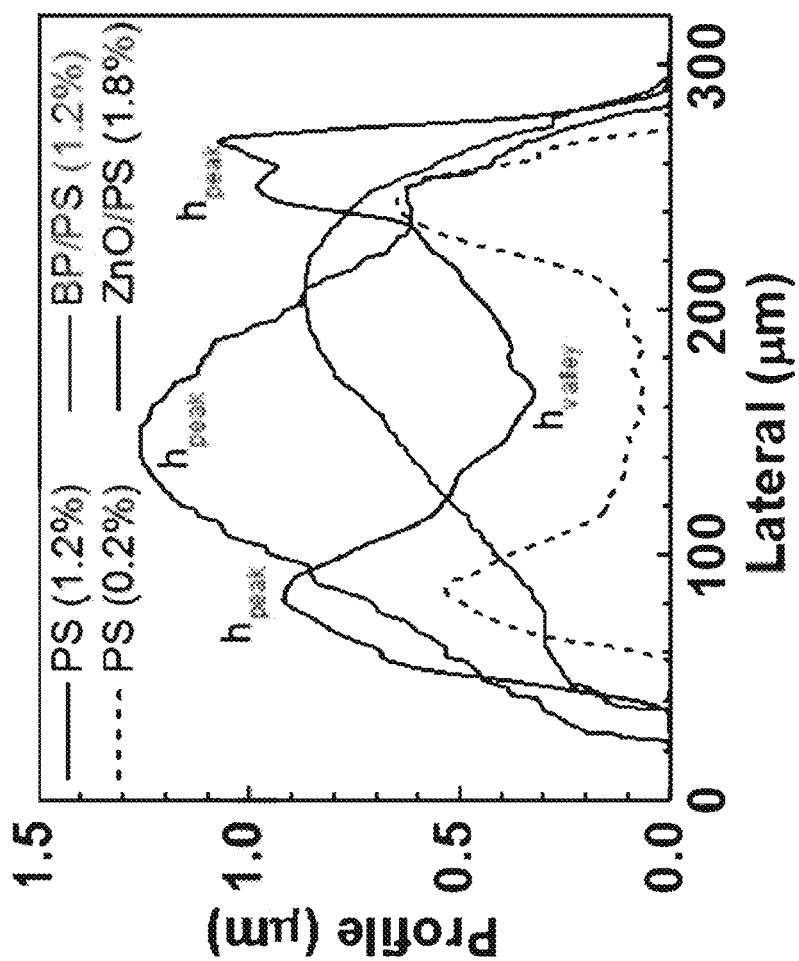
Figure 12E:
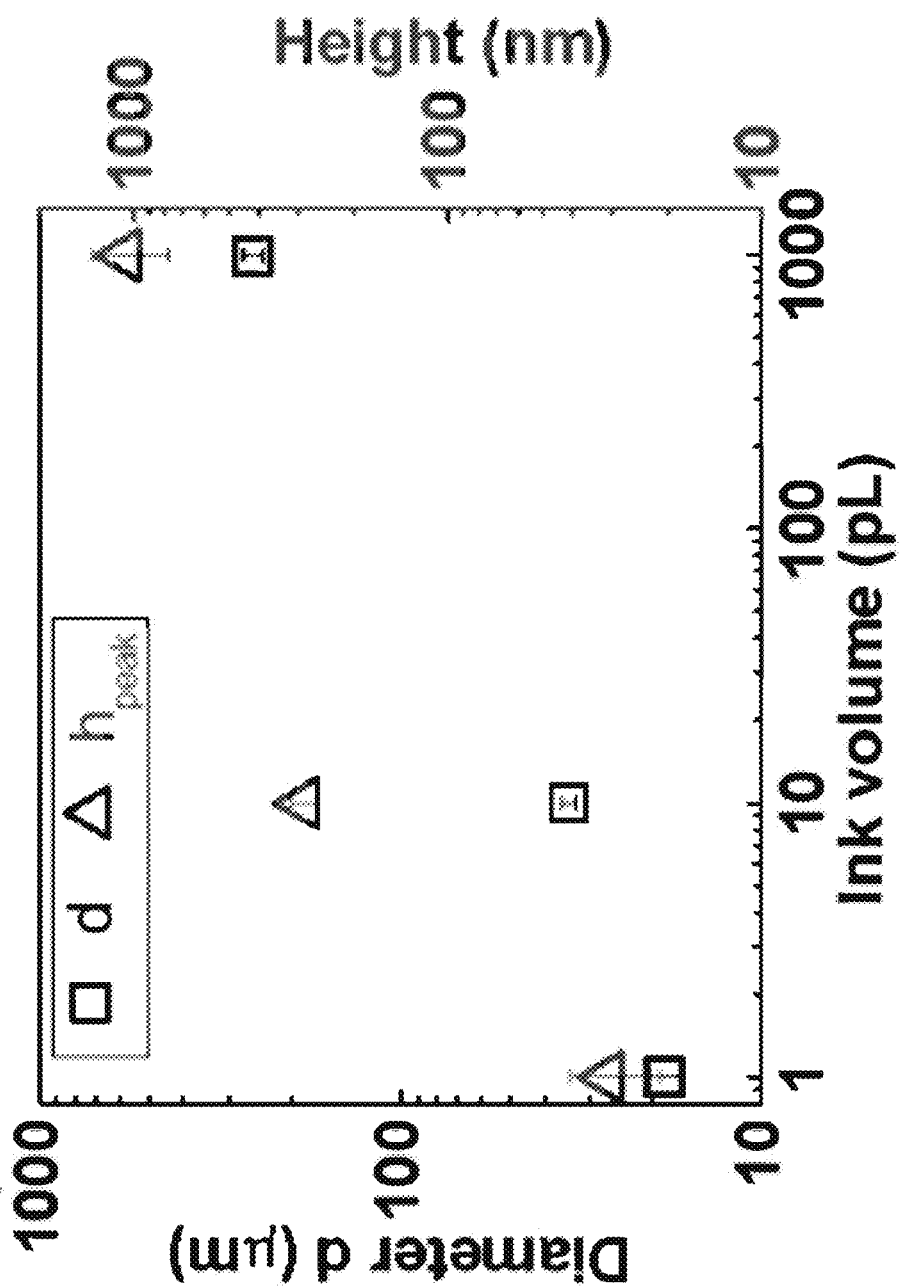

A coarse grained finite element model was first constructed to visualize the folding dynamics of a PMMA/graphene film onto the printed microspots (regular microcylinders with an aspect ratio h/D=1/100 were used in the model, FIG. 12D). The relative lattice strain of each structural unit was evaluated over time, and units at the cylinder edge have the highest strain up to 0.8% and form a distinct hoop (FIG. 12D). Liftoff via dissolving PMMA exposes the graphene layers and the sandwiched microspots to external force fields, led by liquid agitation and heat induced cavitation. A force balance under a uniform outward stretch (FIG. 12E), assuming no delamination between graphene and the microspot underneath, can be reduced to $$\varepsilon_1(r) = \frac{2T_G \varepsilon_2(r) E_G}{\{2E_G T_G + E_P h(r)\}}, \text{ and } 4\pi r E_G T_G \varepsilon_2(r) = F \qquad (1)$$

where $\varepsilon_1$ and $\varepsilon_2$ refer to the graphene lattice strain under tensile force F, interior and exterior to the microspot, respectively. The microspot height h (μm) is a function of its radius r (FIG. 12E), and $T_G$ represents the graphene thickness. $E_P$ and $E_G$ are the elastic modulus of PS (or its composites) and graphene, respectively. The mismatch between the effective elastic moduli of the freestanding graphene and those laminated to the polymer or its composite substantially increase the lattice strain (0.2%) near the microspot radius with a assumed boundary condition of F (r=250 μm)=1.1 mN (corresponding the strain of bilayer graphene=0.1%, FIG. 12F). This, together with the folding dynamics, further augments graphene strain up to 1.0% towards the polymer edges at r=100 μm (FIG. 12F).

Figure 12G:
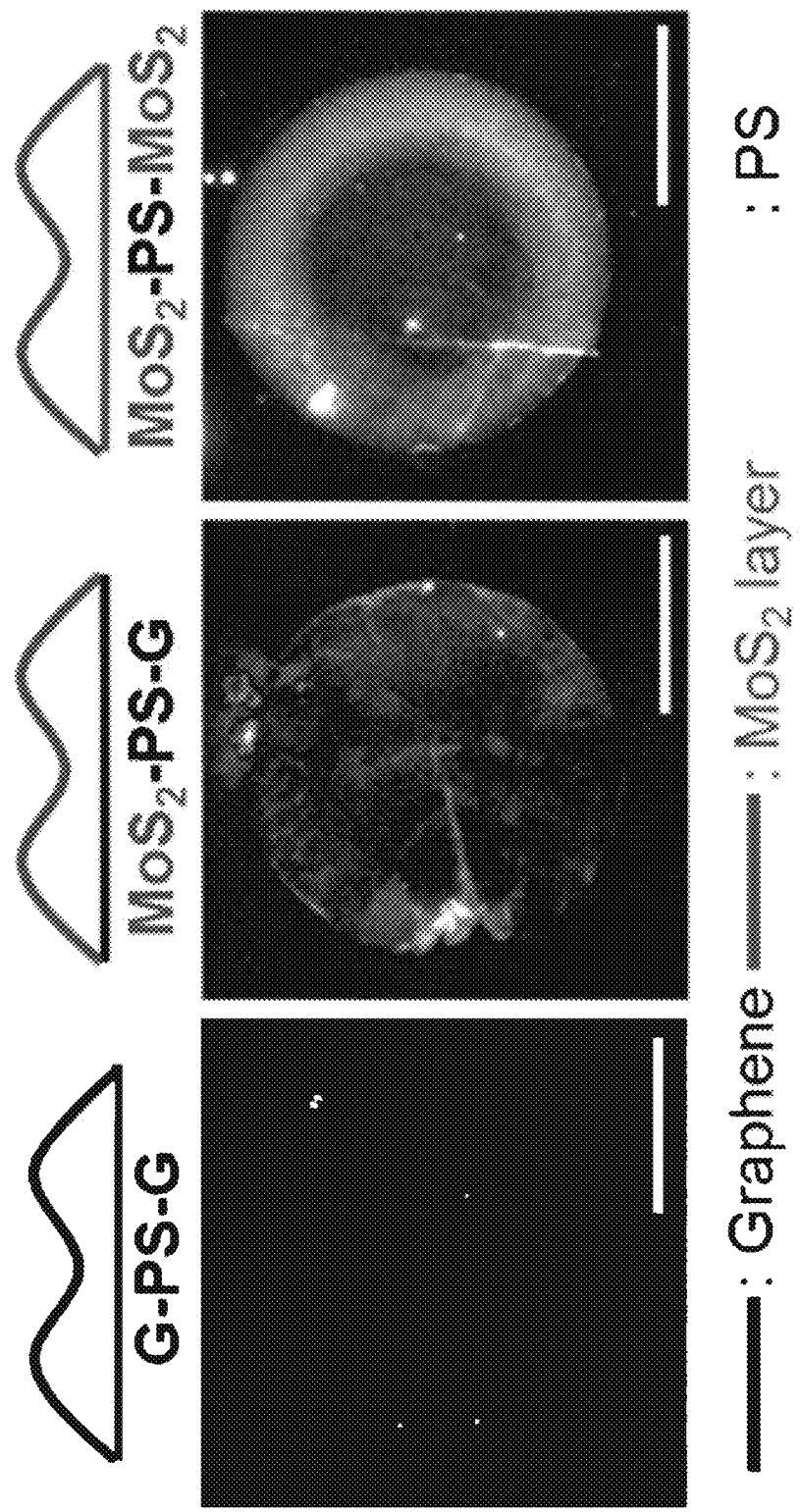

The graphene fracture process was numerically simulated with randomized initial seed cracks, and observed that this strain heterogeneity can both attract crack growth, and guide the crack trajectory along the maximum hoop strain (FIG. 12G). This agrees with microscopic measurements (FIG. 12H), and recent work that curvature can control the failure and crack propagation of an elastic polymer sheet at a macroscopic scale[34]. Lowering h will moderate the strain heterogeneity, thus weakening the autoperforation degree, consisting with observations that lifting-off microparticle array printed with 0.2 wt % PS ink generated a cluster of unperforated microparticles (FIG. 30).

TABLE 1

Figures 33A, 33B:
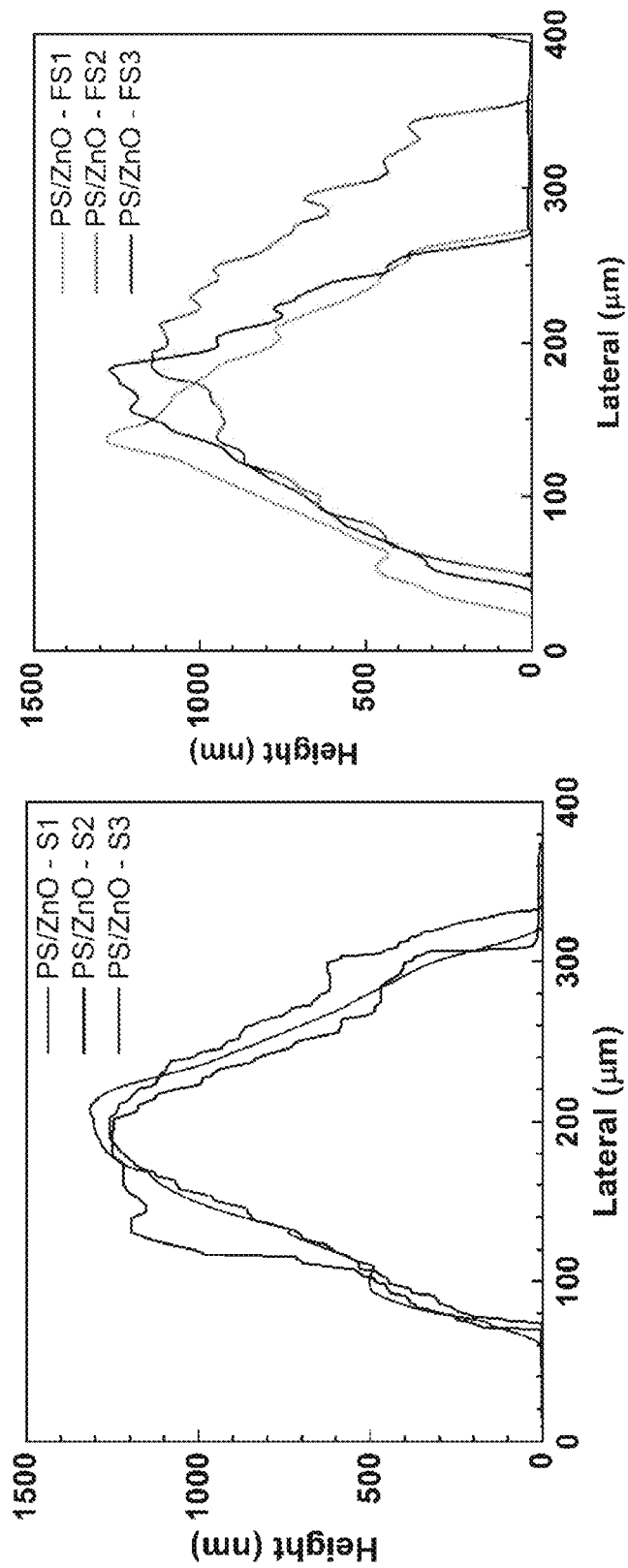
FIGS. 33A-33B show profile results of graphene particles with inner PS/ZnO (30 wt %) (G-PS/ZnO-G) on pristine (FIG. 33A) and 1-pyrenebutyric acid N-hydroxysuccinimide ester-functionalized (FIG. 33B) graphene.
Figure 33C:
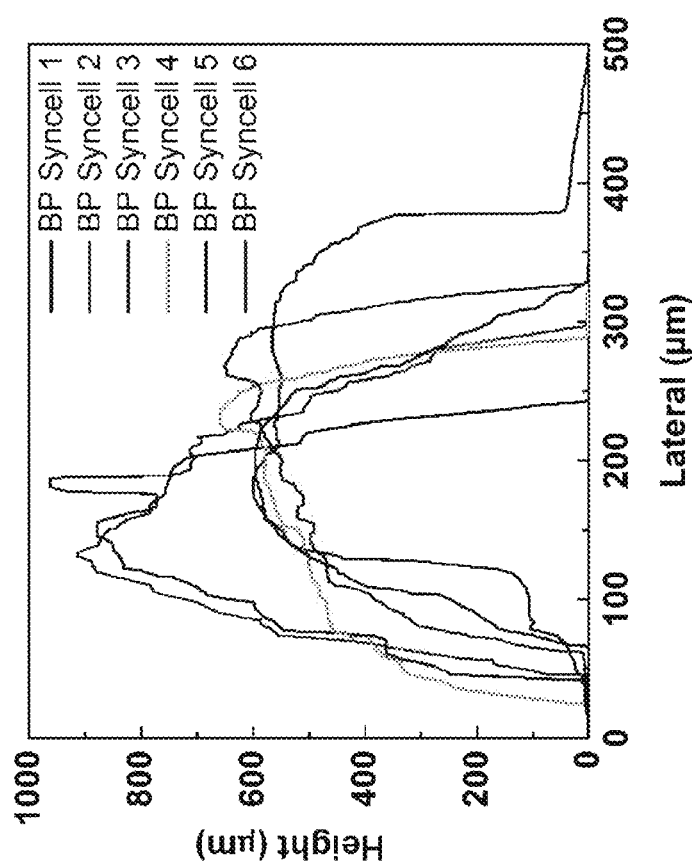
FIG. 33C show profile data of G-PS/BP (0.9 wt %)-G microparticles on pristine graphene. Tables 1, 2, and 3 are the profiling results of multiple microparticles for statistical studies. All particles have a same ink volume of 1 nL, 1.8 wt % ink for G-PS/ZnO-G and 1.2 wt % ink for G-PS-G.

On pristine graphene (FIGS. 33A-33B)

| PS/ZnO Samples | Peak Height/nm |
|---|---|
| S1 | 1415 |
| S2 | 1258 |
| S3 | 1348 |
| S4 | 1199 |
| S5 | 1275 |
| S6 | 1008 |
| S7 | 1318 |
| S8 | 1187 |
| S9 | 1277 |
| S10 | 1008 |
| S11 | 907 |
| S12 | 1047 |
| S13 | 959 |
| Avg. | 1170 |
| St. | 158 |

TABLE 2

On functionalized graphene

| PS/ZnO Sample | Height/nm |
|---|---|
| FS1 | 1165 |
| FS2 | 1061 |
| FS3 | 1228 |
| FS4 | 895 |
| FS5 | 1881 |
| FS6 | 1353 |
| FS7 | 725 |
| FS8 | 812 |
| FS9 | 1498 |
| Avg. | 1180 |
| St. | 344 |

TABLE 3

G-PS/BP-G on pristine graphene

| G-PS/BP-G particles | Height |
|---|---|
| 1 | 874 |
| 2 | 888 |
| 3 | 603 |
| 4 | 580 |
| 5 | 592 |
| 6 | 597 |
| 7 | 721 |
| 8 | 725 |
| 9 | 1230 |
| 10 | 1087 |
| 11 | 871 |
| 12 | 868 |
| 13 | 858 |
| 14 | 873 |
| 15 | 858 |
| Avg. | 815 |
| St. | 179 |

Figure 13A:
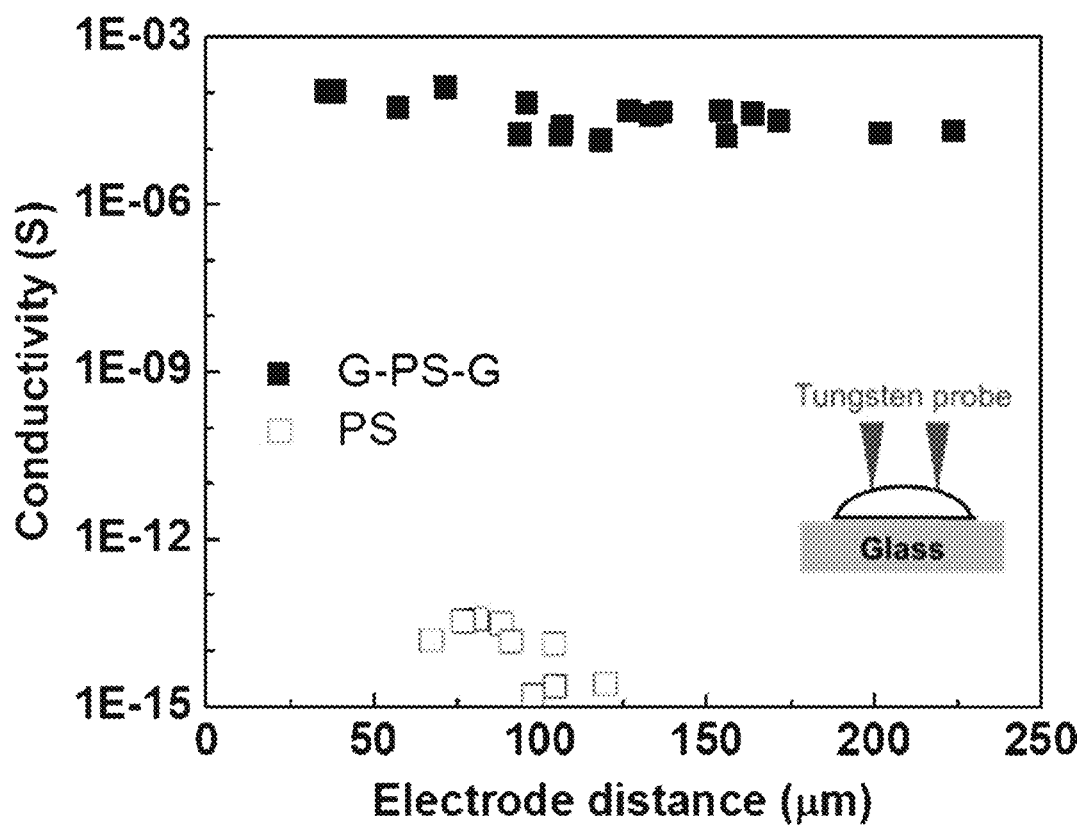
FIGS. 13A-13H show electrical properties and memory behavior of the graphene (bilayer) microparticles.
Figure 13B:
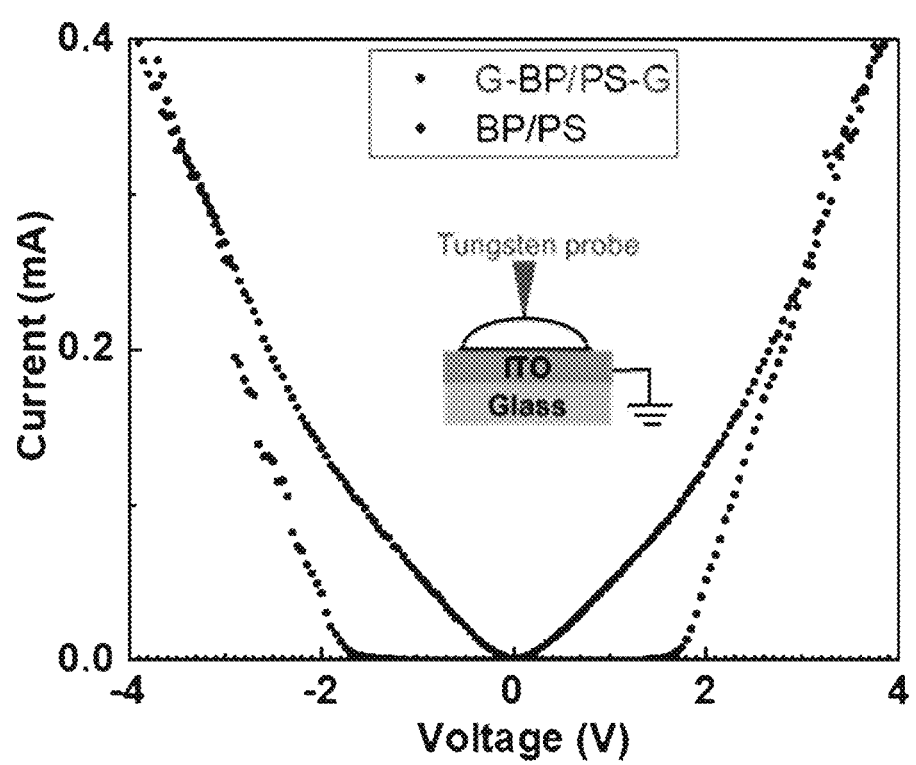
Figures 17A, 17B:
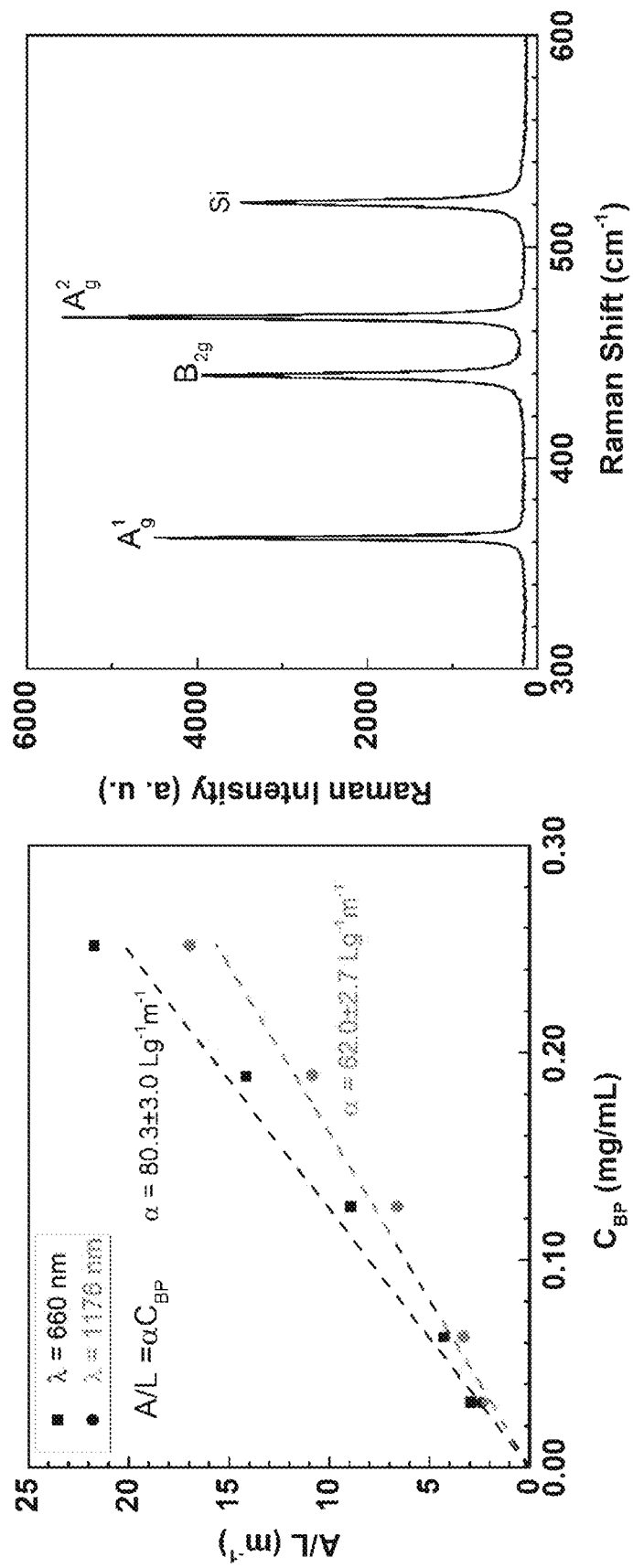
FIG. 17G shows selected area (electron) diffraction pattern (SADP) of BP nanoflakes.
Figures 17C, 17D:
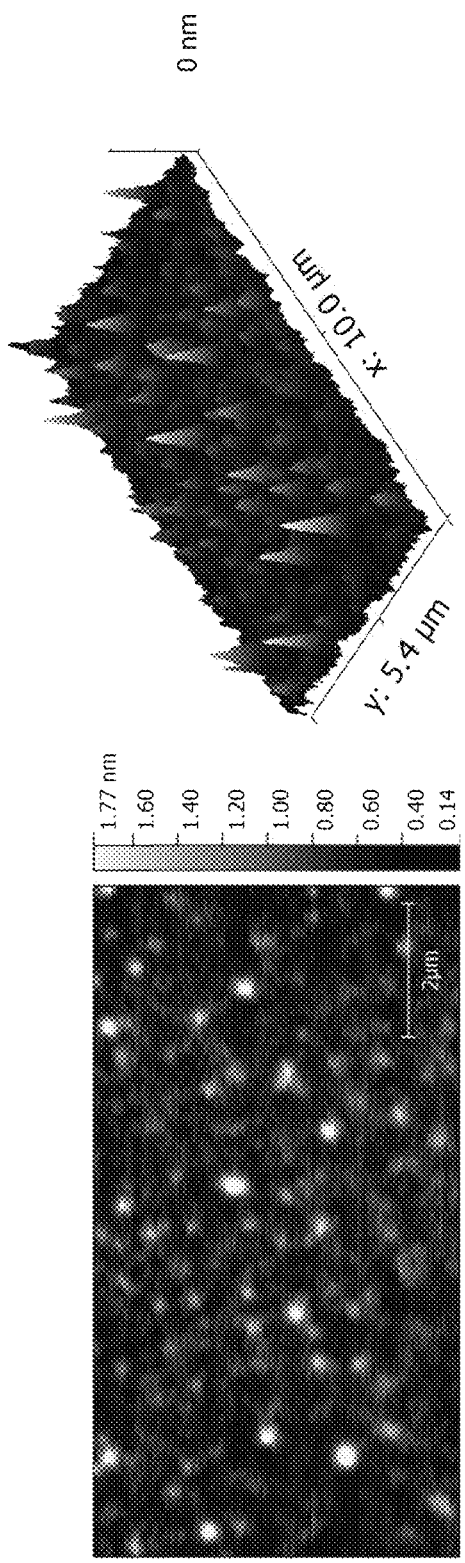
Figure 17E:
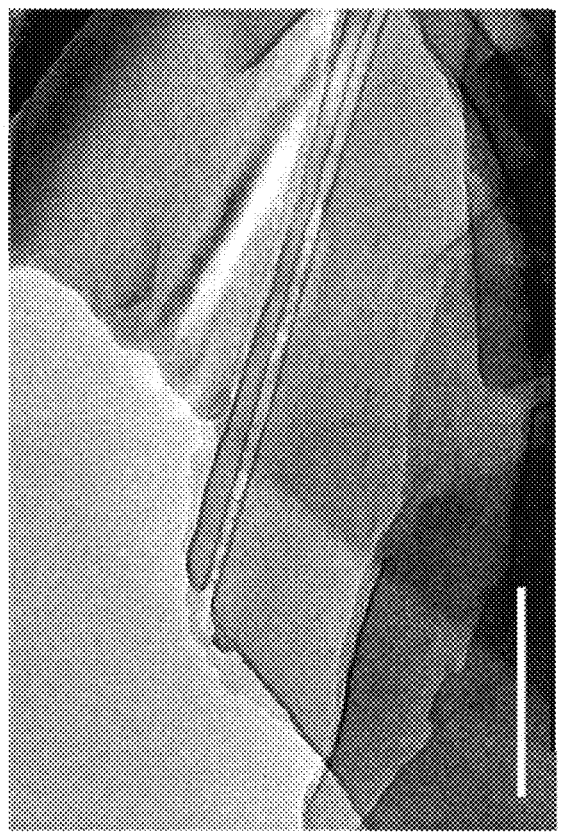
Figure 17F:
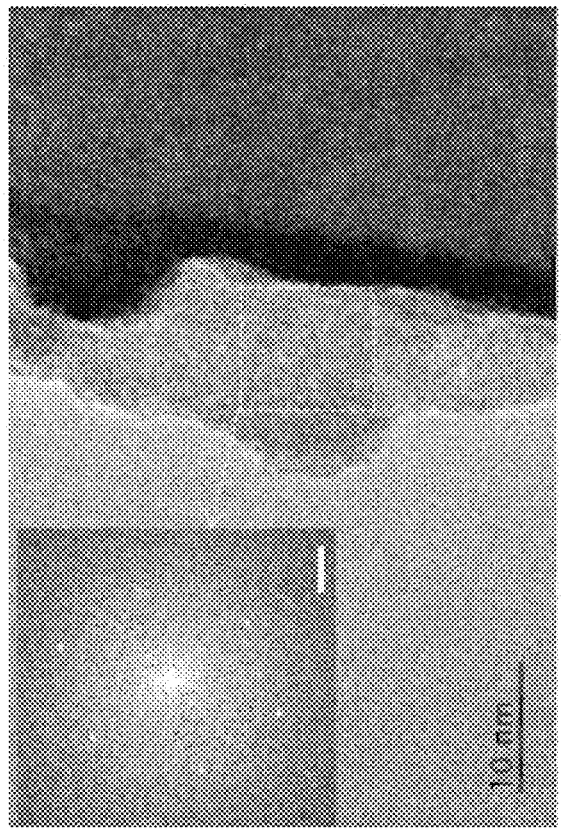
Figure 17G:
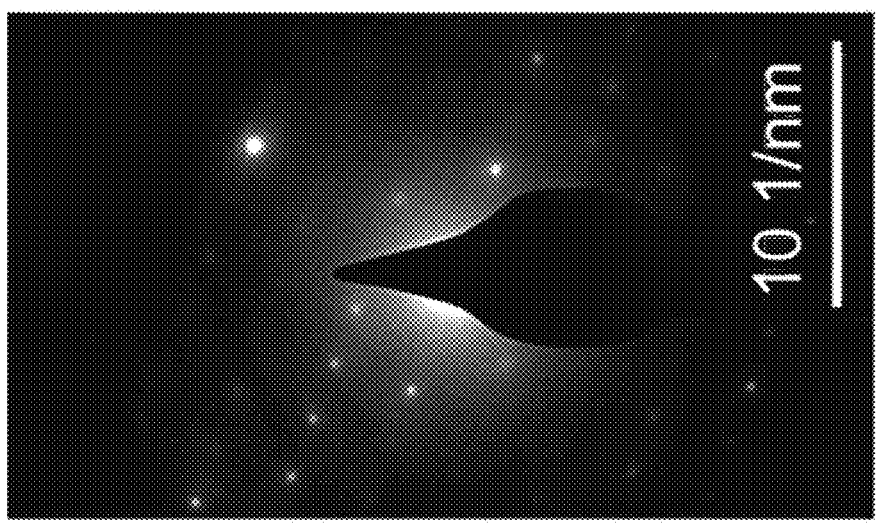
Figure 18B:
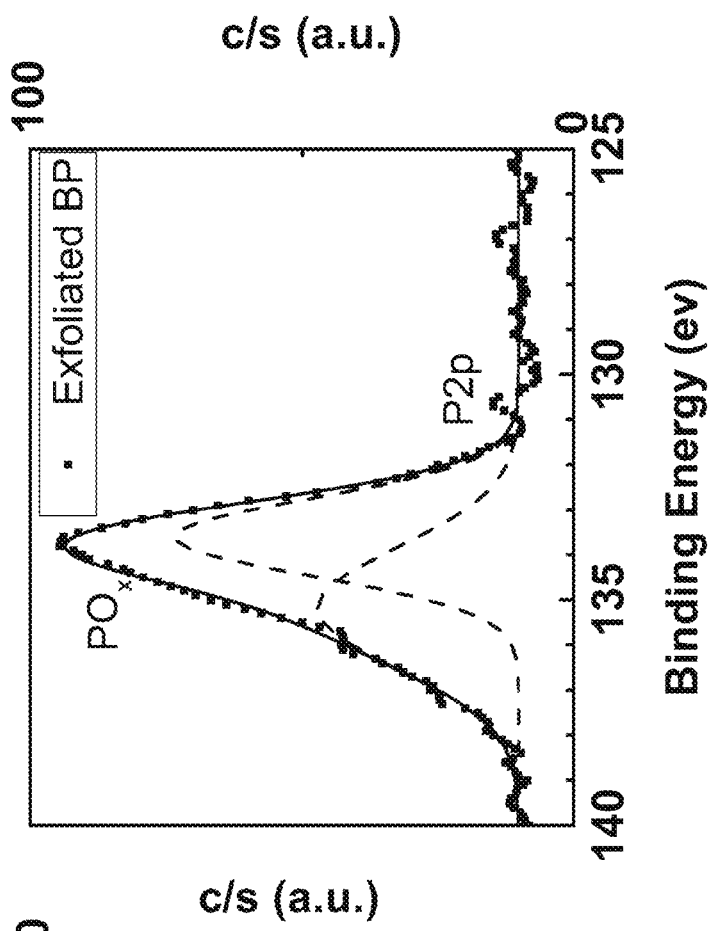
FIGS. 18A-18B show X-ray photoelectron spectroscopy (XPS) spectra of the exfoliated BP (FIG. 18A), P2p core-level XPS spectra of the exfoliated BP (FIG. 18B).
Figure 18A:
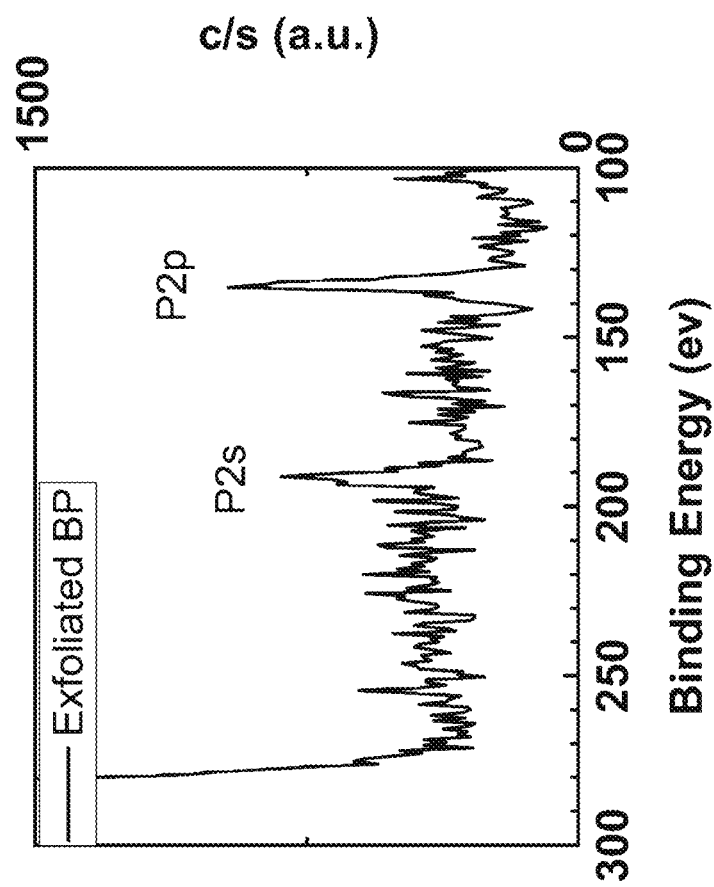
Figure 18C:
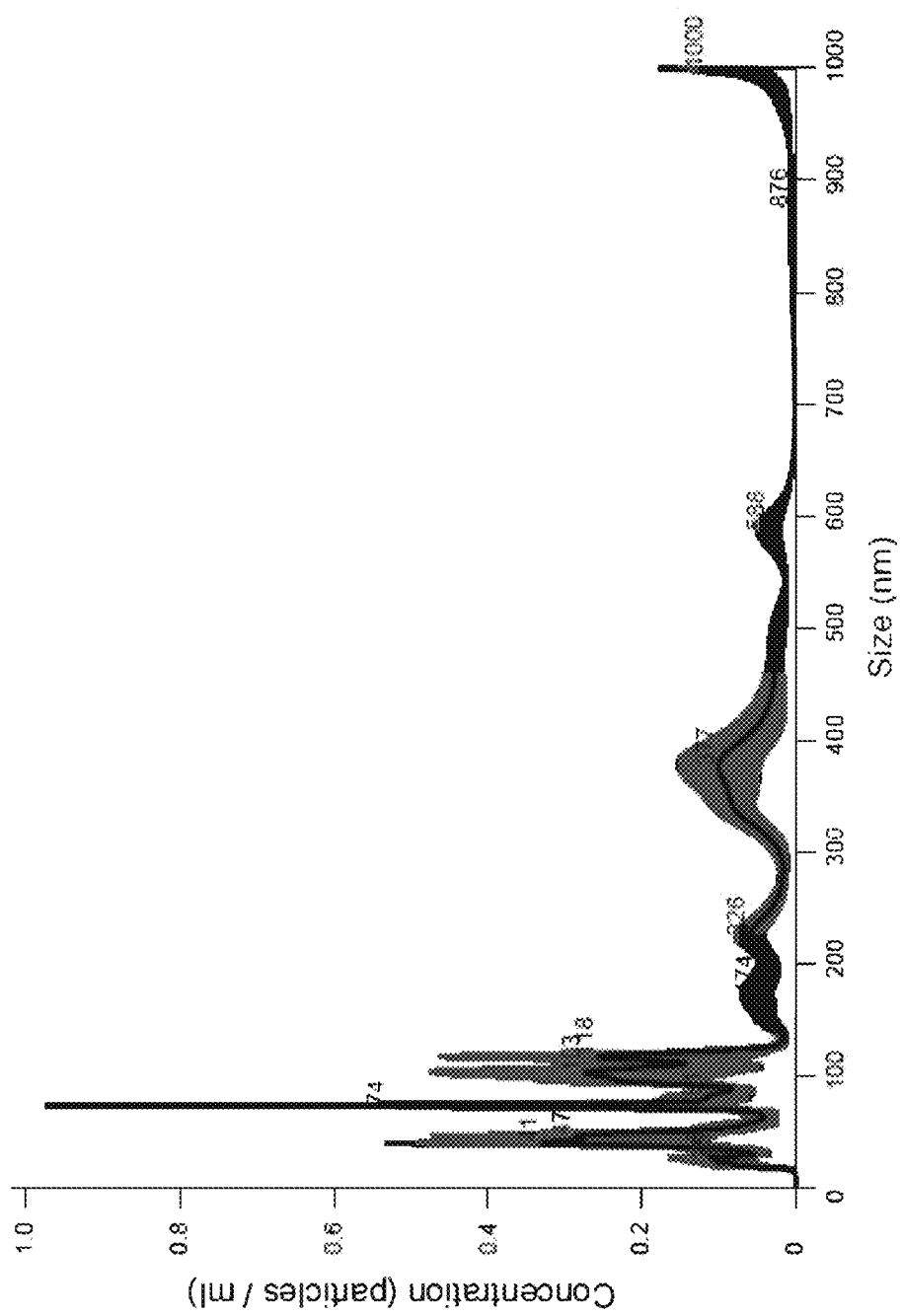
FIG. 18C shows the size distribution of BP nanoflakes in ethylene glycol (EG) measured by Nanosight at room temperature and the statistical mean size is 278.5±23.7 nm.
Figure 21A:
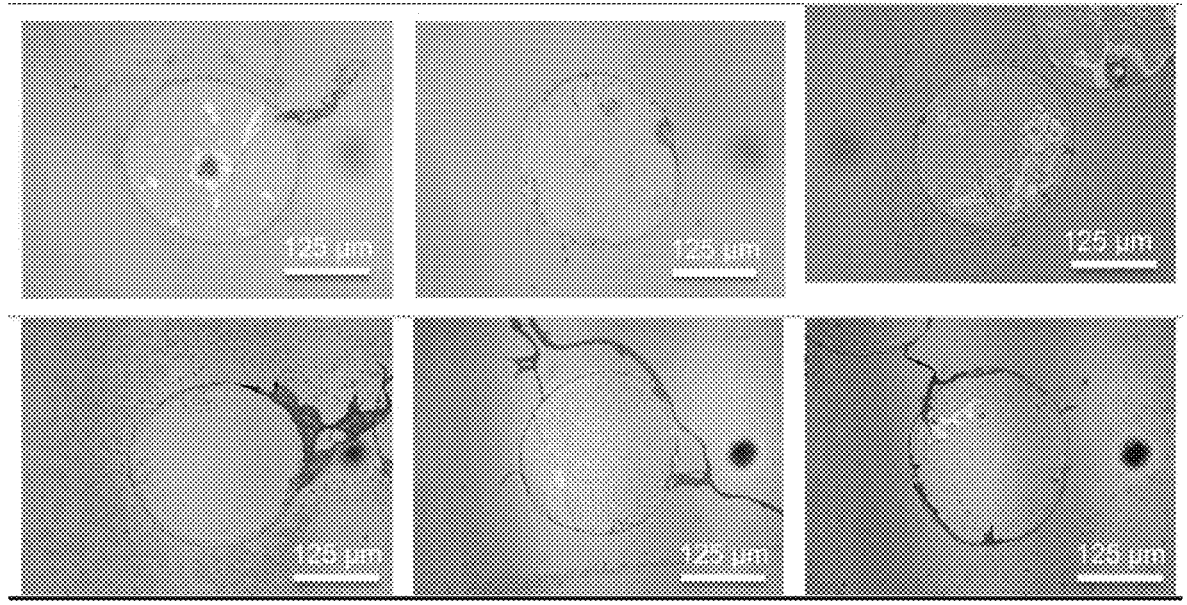
FIG. 21A shows nanoparticles with pristine graphene, microparticles may have tiny tails, using pristine CVD bilayer graphene and PS interior filler.
Figure 21B:
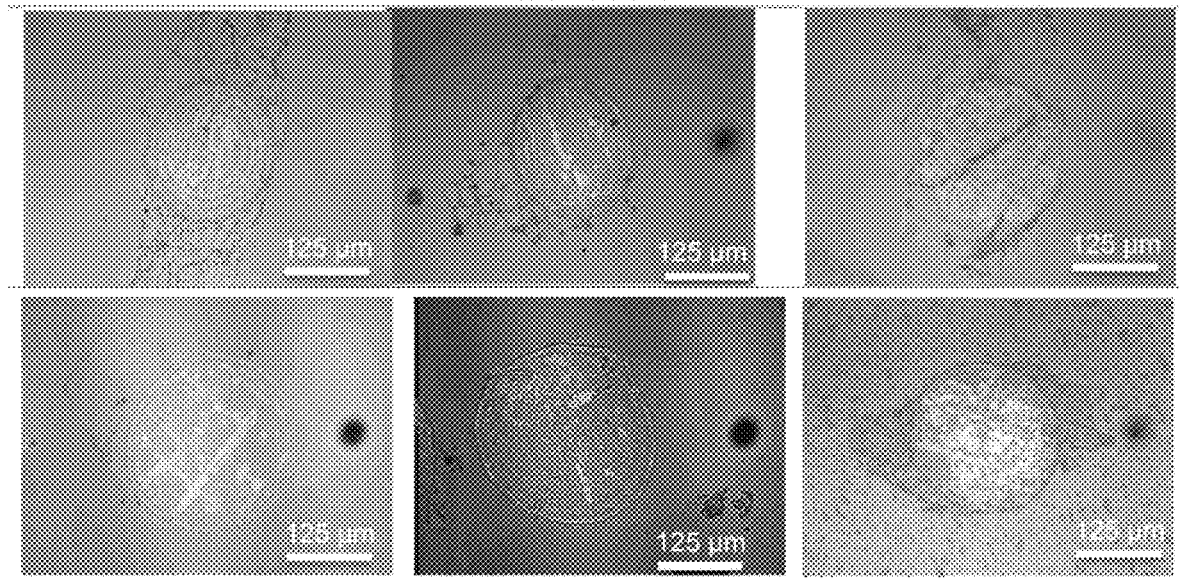
FIG. 21B shows nanoparticles two sides functionalized graphene, microparticles have edges or wings, using 1-aminopyrene and 1-pyrenebutyric acid N-hydroxysuccinimide ester functionalized bilayer graphene as Graphene A, and 1-pyrenebutyric acid and 1-pyrenebutyric acid N-hydroxysuccinimide ester functionalized graphene as Graphene B. Amine-functionalized PS latex nanoparticles (mean particle size=100 nm, 1.2 wt % in water/ethylene glycol (1:1)) as interior filler for both cases.
Figure 35A:
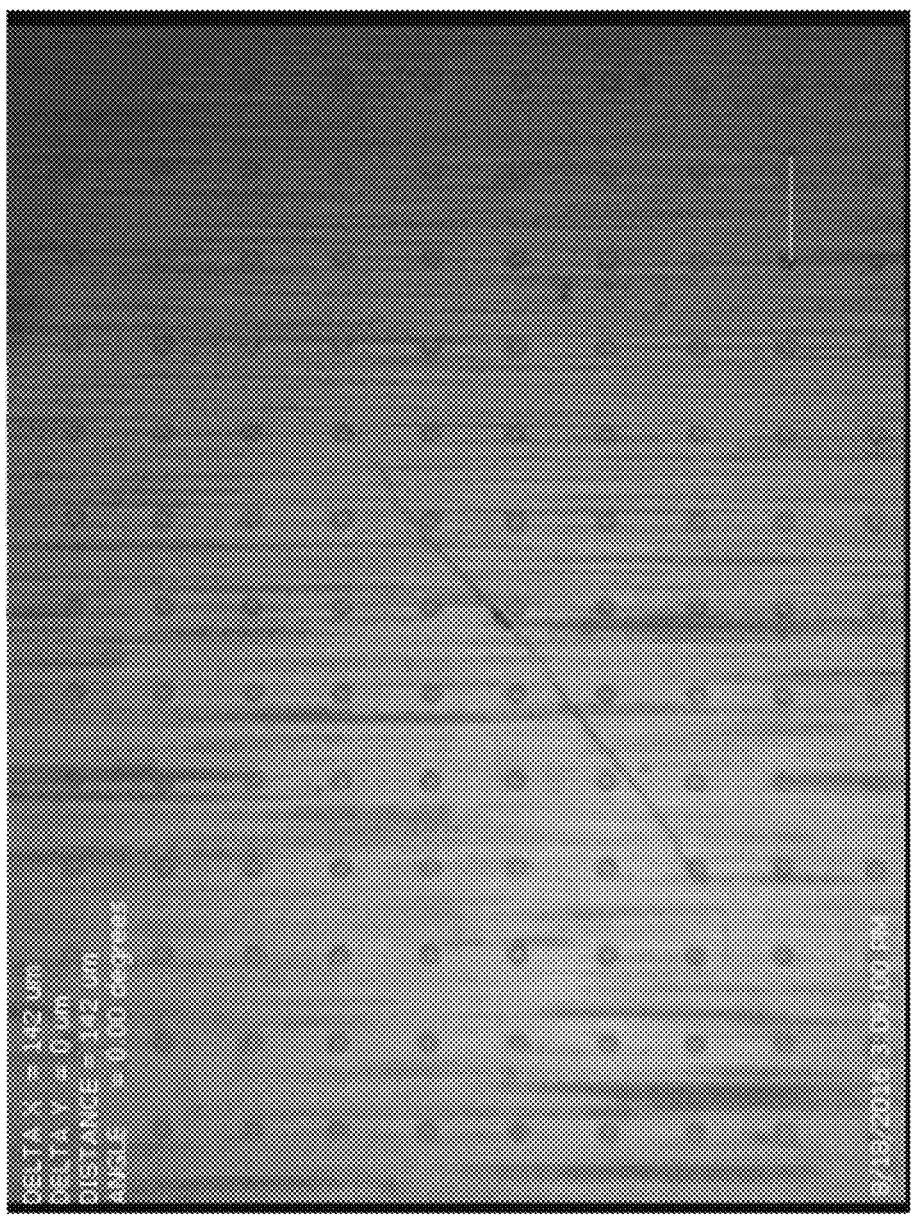
FIG. 35A shows the printed microspot array on graphene/PMMA/PDMS substrate with an ink (1.25% PS latex, ~50 nm, in mixture of water and ethylene glycol (1:1)) volume of 1 pL, the scale bar is 140 um.
Figure 35B:
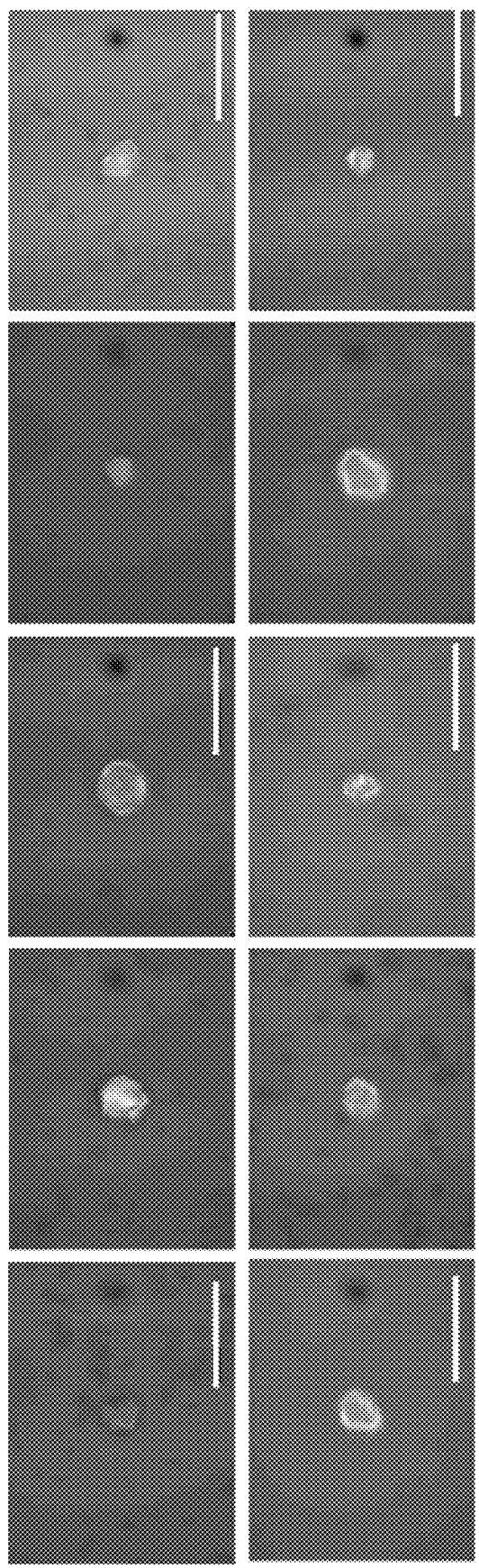
FIG. 35B shows optical microscopy images of the fished particles after liftoff, the average diameter is 18.6±2.2 urn, all figures have the same scale bars of 40 μm.
Figure 36:
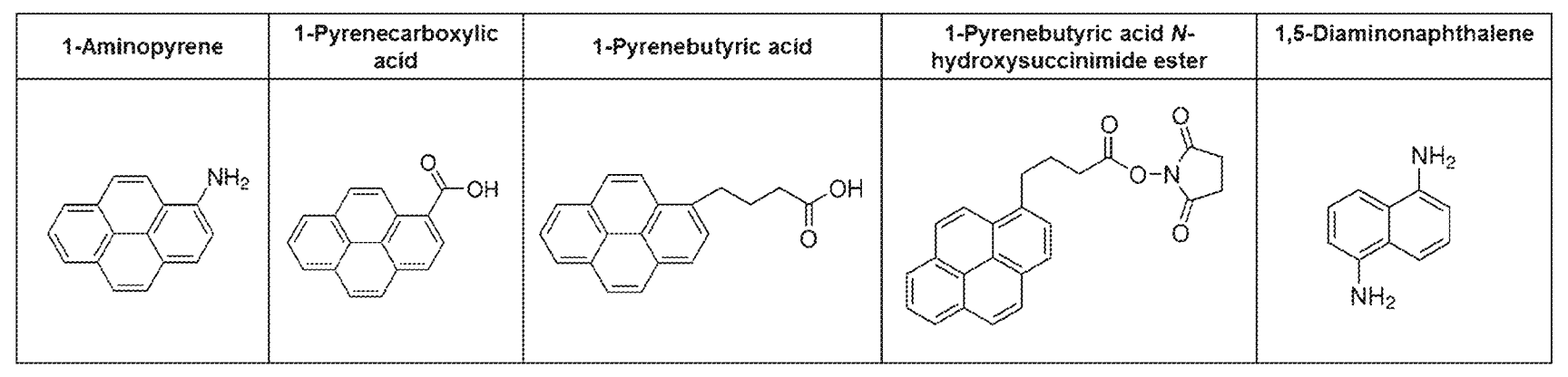
Figure 37A:
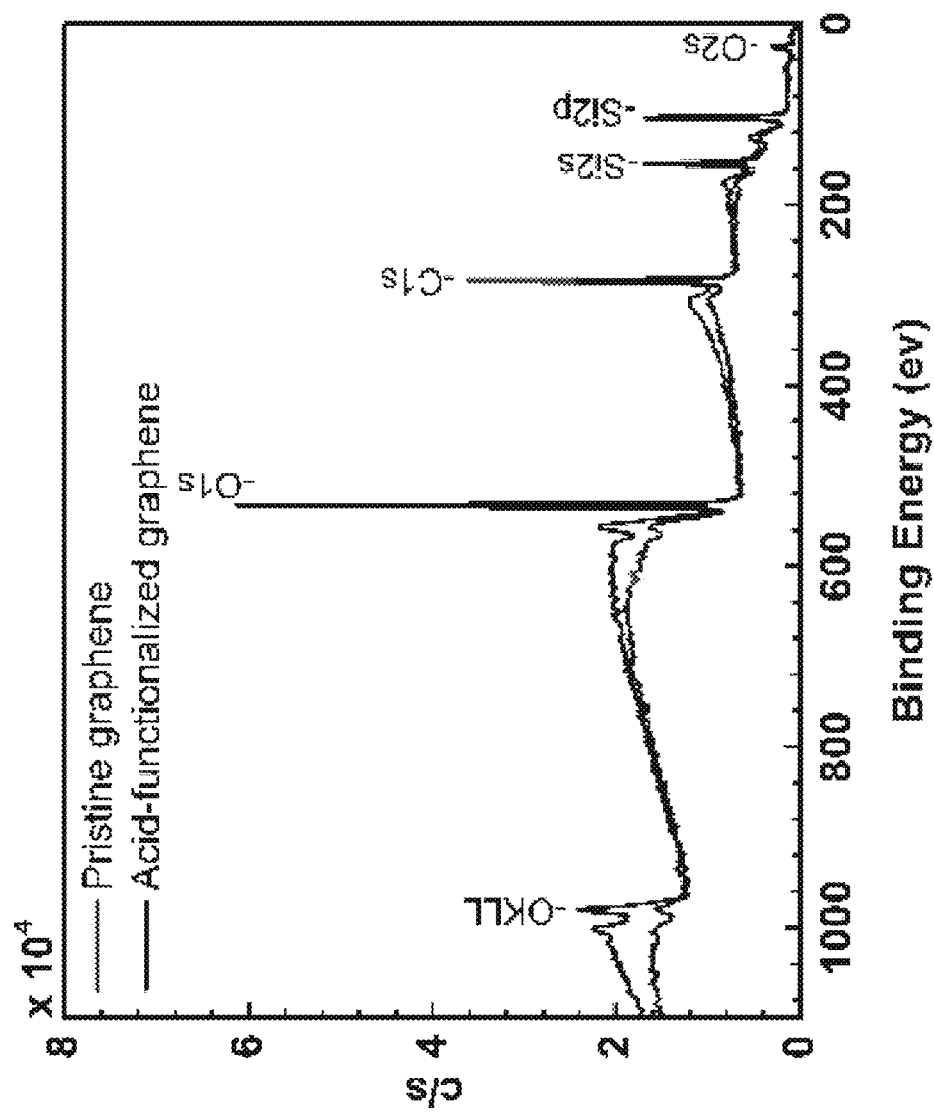
FIG. 37A shows X-ray photoelectron spectroscopy (XPS) results of pristine bilayer graphene and 1-pyrenebutyric acid-functionalized bilayer graphene on $SiO_2$/Si substrate.
Figure 37C:
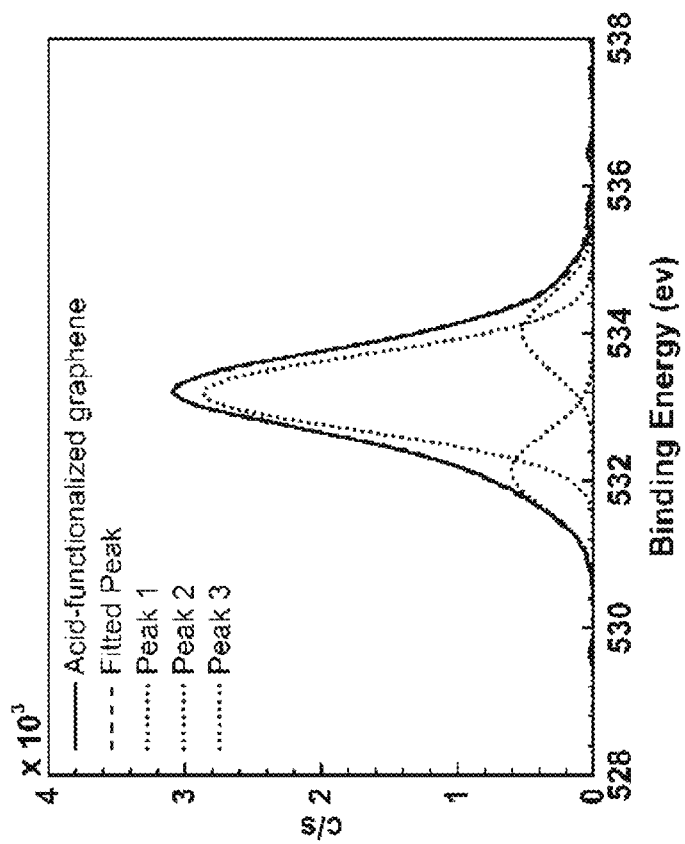
FIG. 37C shows the —O1s peak of the acid-functionalized graphene can be deconvolved into three peaks, which belong to $SiO_2$, and the 2 oxygen atoms from 1-pyrenebutyric acid.
Figure 37B:
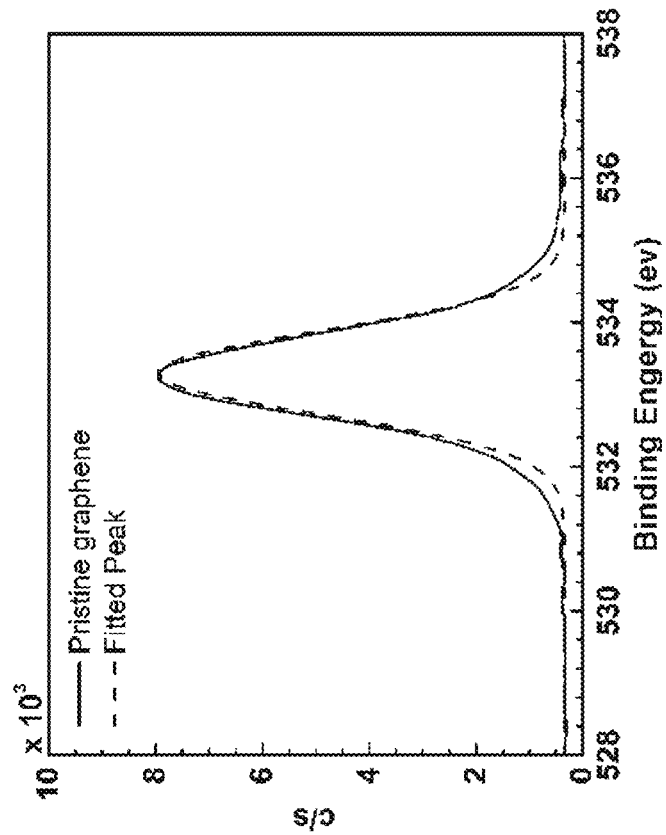
FIG. 37B shows the —O1s peak of the graphene sample can fit into a single peak, which bellows to oxygen from the $SiO_2$ substrate.
Figure 38A:
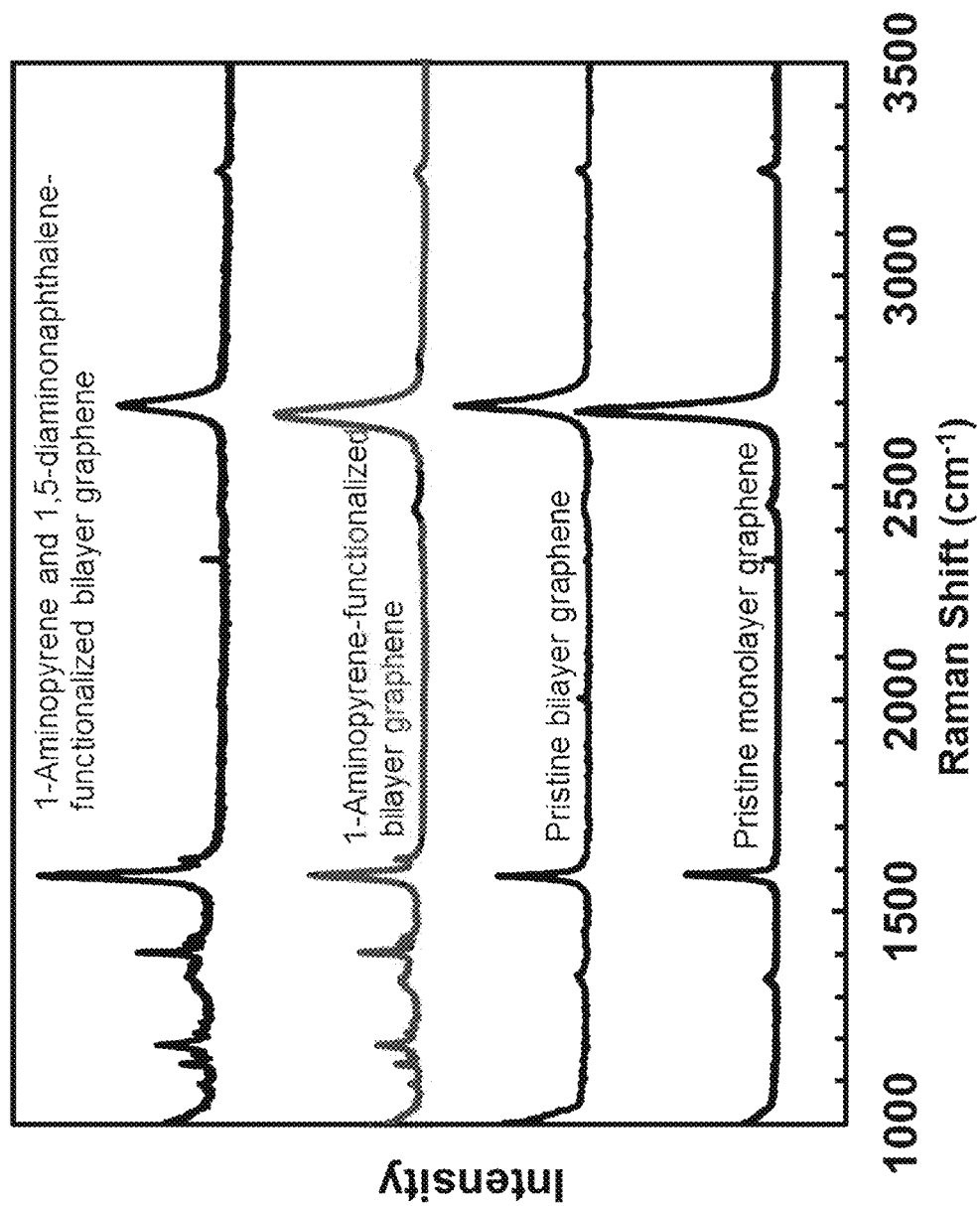
FIGS. 38A-38C show Raman spectroscopy characterization of mono- or bilayer graphenes with one side or both sides being functionalized noncovalently (chemistry symmetry breaking).
Figure 38B:
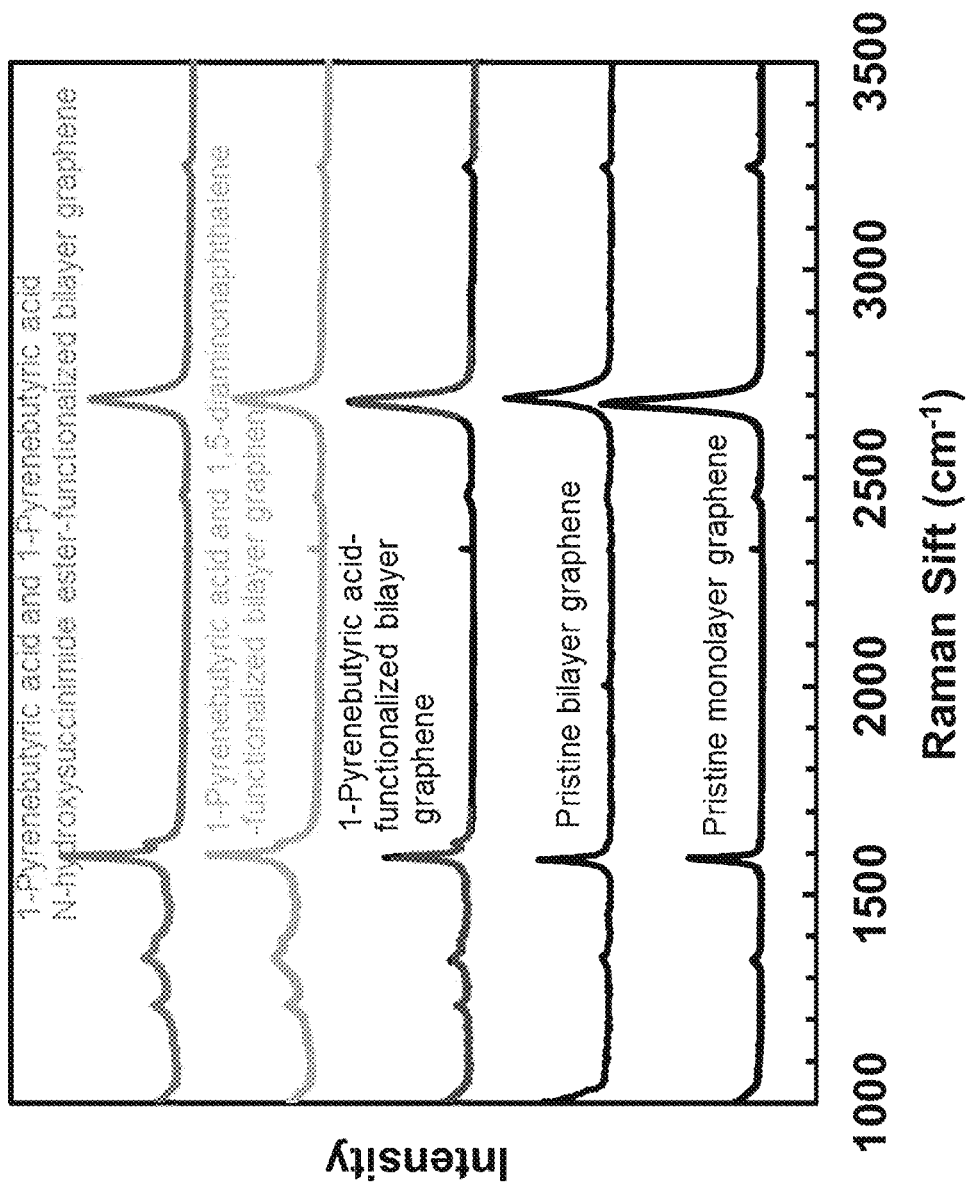
Figure 38C:
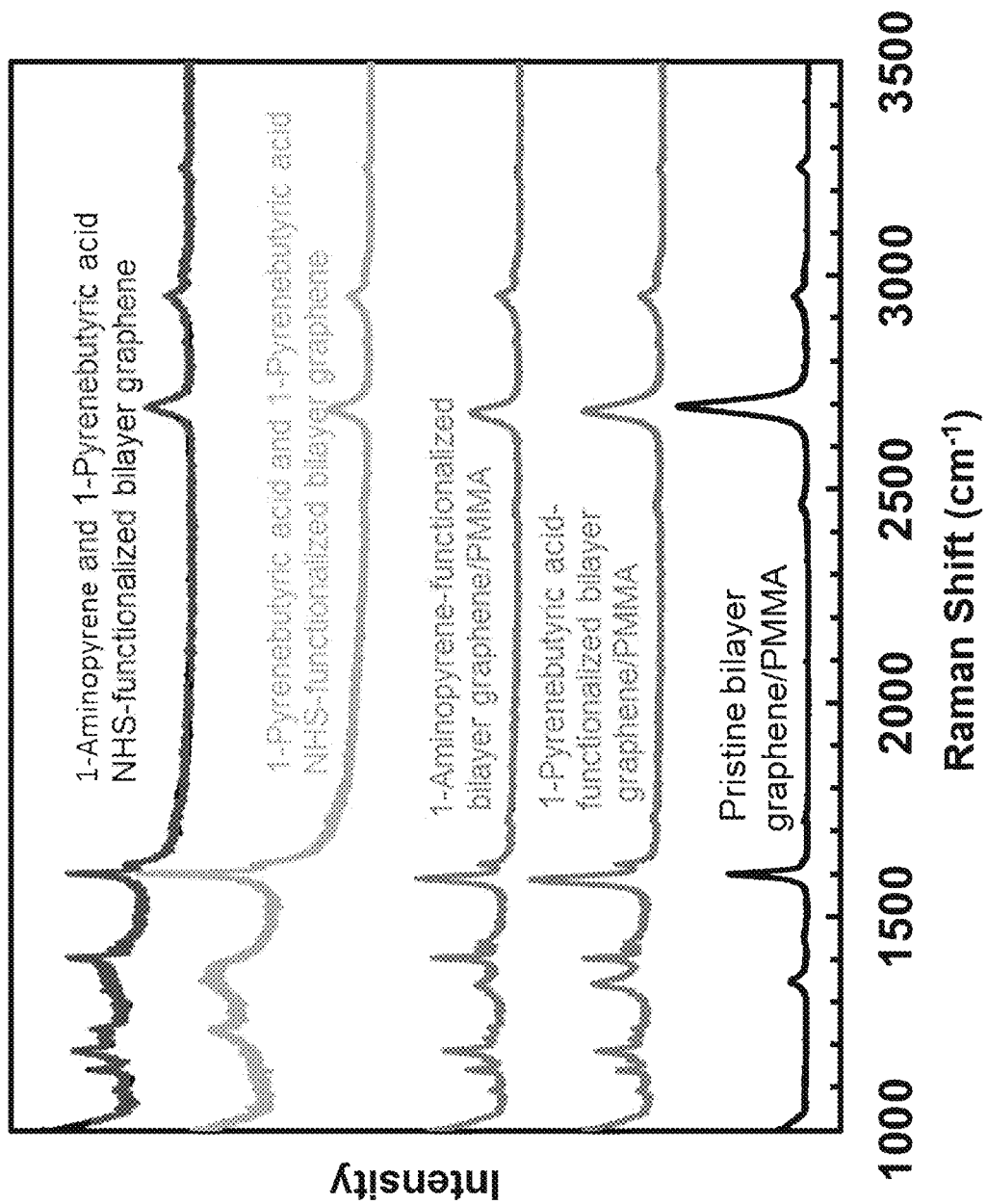

The graphene microparticle has high surface conductivity and can function as a two-terminal electronic device when compositing PS with BP (FIGS. 13A-13l1). The in-plane conductivity of the G/PS/G microparticle is on the order of $10^{-5}$ S, 10 orders of magnitude higher than that of the PS control ($10^{-15}$S) (FIG. 13A). The calculated sheet resistance of the PS supported graphene is 890 Ω/sq compared to the $4.3 \times 10^{13}$ Ω/sq for pure PS (FIGS. 13A and 35A-35B and 36), consistent with reported values. See, Yang, J. J. et al. Memristive switching mechanism for metal//oxide//metal nanodevices. Nat Nano 3, 429-433 (2008), which is incorporated by reference in its entirety. The conductivity reduced by 33% after storage in ethanol/water (4:1) for four months (FIG. 35D). When applying an electrical potential via a tungsten probe across the G/PS/G particle grounded on top of ITO/glass, a vertical conductivity of the order $10^{-6}$ S was measured (FIGS. 13B and 37A-37D). Graphene A and B could contact after liftoff, as evidenced by those tails attached to the particles (FIGS. 11G and 21A). Interestingly, this conductive mode can be manipulated to an electrically bistable resistive switch by compositing a very small amount (0.9 wt %) of liquid-exfoliated BP nanoflakes (1-3 layers, FIGS. 17A-17G and 18A-18B) to the PS (FIG. 13B). FIGS. 17E-17F show TEM images of the BP nanoflakes at scale of 100 nm and 10 nm, the insert shows the fast Fourier transform (FFT) of the TEM image at the selected area. Atomically structured P arrangements can be seen, echoing the FFT of the TEM image, which suggests the crystalline nature of the BP nanoflakes (see, Yasaei, P., et al., *High-Quality Black Phosphorus Atomic Layers by Liquid-Phase Exfoliation*. Advanced Materials, 2015. 27(11): p. 1887-1892., which is incorporated by reference in its entirety). FIG. 17G shows selected area (electron) diffraction pattern (SADP) of BP nanoflakes. SAD patterns are a projection of the reciprocal lattice, with lattice reflections showing as sharp diffraction spots. The scale bar represent 10 l/nm in the reciprocal lattice space.

Figure 13C:
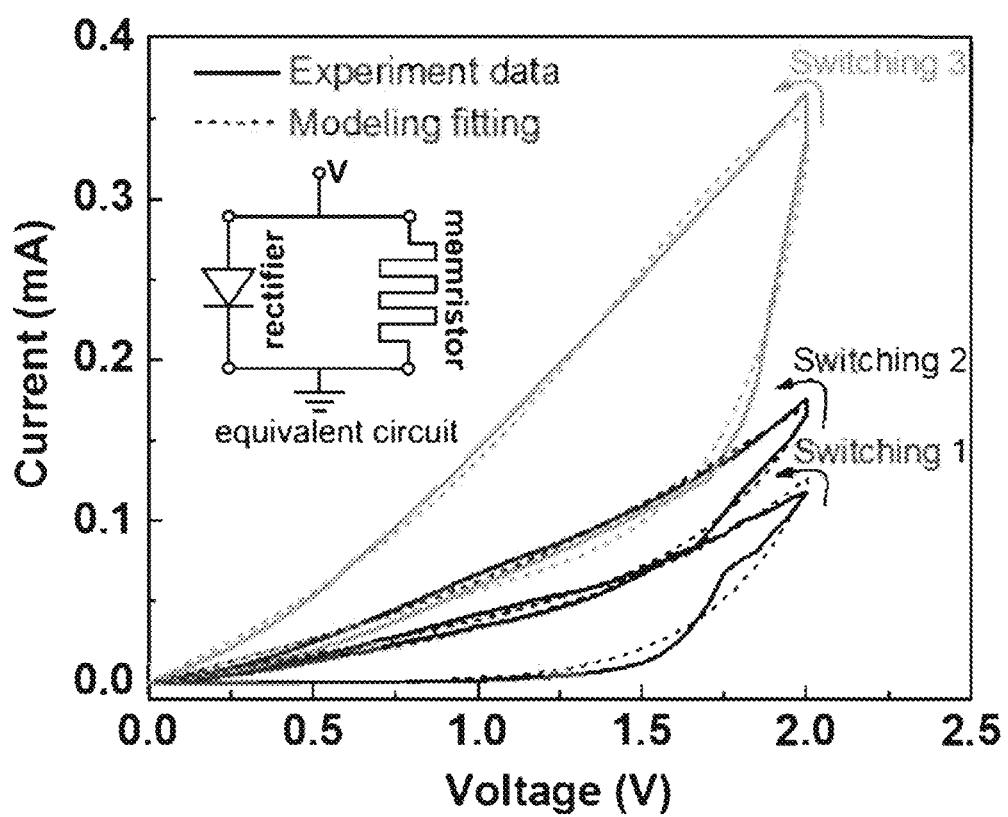
Figures 39A, 39B:
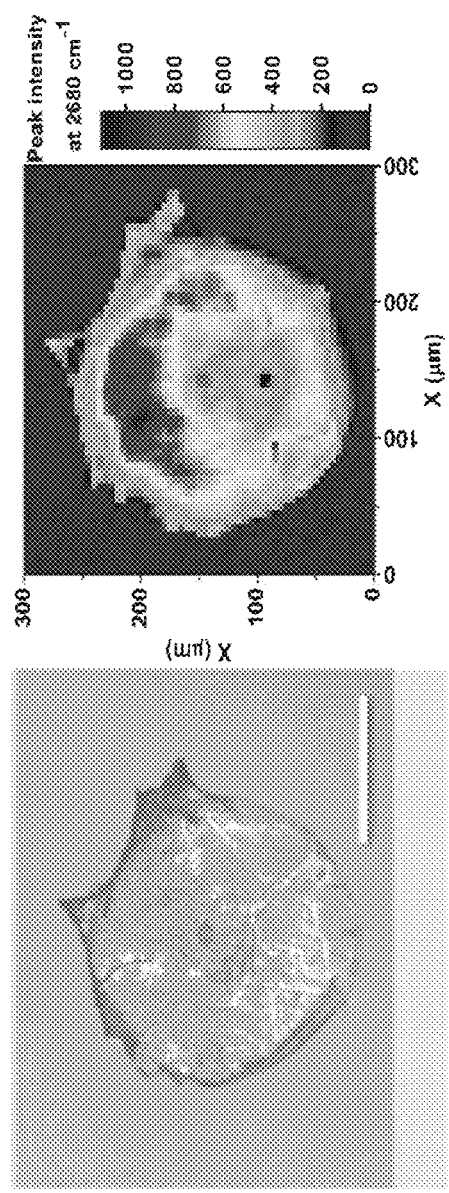
FIGS. 39A-39B show Raman mapping of the microparticels with four-side functionalized graphene, the used functional molecules are 1-pyrenecarboxylic acid (exterior surface)/1-pyrenebutyric acid N-hydroxysuccinimide ester (interior surface) and 1-aminopyrene (exterior surface)/1,5-diaminonaphthalene (interior surface).

The G-PS/BP-GS microparticle is essentially a non-volatile reversible random access memory (RRAM) device. FIGS. 13B and 37A-37D show the typical current-voltage (I-V) characteristics of this two-graphene-terminal resistive switch. The device is initially in a high resistance state (HRS, i.e., OFF state) and a voltage sweep from 0 to 4 V switches the device to a low resistance state (LRS, ON state), corresponding to "writing" a digital memory. A reverse sweep from 0 to −4 V switches the device "OFF", analogous to "erasing", and this OFF state persists until the subsequent 0-4 V sweep in the next cycle. Remarkably, the ON/OFF ratio (N) reaches up to $10^4$ at a 0.2 V readout voltage, although the microparticle only contains 0.9 wt % of BP. Graphene is indispensable and PS/BP particle alone is almost insulated (FIGS. 13B and 39A-39B). To further confirm the non-volatile nature of this electrical memory, three consecutive low voltage scans were run and a signature sequential step-wise conductivity increase was found ("switch 1" and "switch 2"), and these traces agree well with the diode-memristor model (see, Yang, J. J. et al. Memristive switching mechanism for metal//oxide//metal nanodevices. *Nat Nano* 3, 429-433 (2008), which is incorporated by reference in its entirety, and FIGS. 13C and 40).

The unique chemistry of BP nanoflakes and the percolated structure of BP/PS composite made this memory. BP nanoflakes degrade and react with oxygen and/or solvent molecules during liquid exfoliation and generate complex functional groups with oxygen atoms (e.g., phosphates and phosphonates) on the flake surface or edge (see, Brent, J. R. et al. Production of few-layer phosphorene by liquid exfoliation of black phosphorus. *Chemical Communications* 50, 13338-13341, (2014), and Hanlon, D. et al. Liquid exfoliation of solvent-stabilized few-layer black phosphorus for applications beyond electronics. *Nature Communications* 6, 8563, doi:10.1038/ncomms9563 (2015), each of which is incorporated by reference in its entirety, and XPS results of FIG. 18A). These oxygen-containing moieties can act as insulating charge traps initially and conductive channels/filaments above a threshold voltage, through electromigration of the mobile oxygen vacancies. See, Hao, C. et al. Liquid-Exfoliated Black Phosphorous Nanosheet Thin Films for Flexible Resistive Random Access Memory Applications. *Advanced Functional Materials* 26, 2016-2024 (2016), which is incorporated by reference in its entirety. Within the BP/PS composite, the atomically thin BP nanoflakes interpolate in between vicinal PS nanoparticles, and form a percolated network, thereby allowing effective resistive switching using a relatively low BP content (0.9 wt %). Previous work compositing single-walled-carbon-nanotube with polymer latex nanoparticles produces conductive polymer nanocomposites with a percolation threshold as low as 0.04 wt %. See, Grunlan, J. C., Mehrabi, A. R., Bannon, M. V. & Bahr, J. L. Water-Based Single-Walled-Nanotube-Filled Polymer Composite with an Exceptionally Low Percolation Threshold. *Advanced Materials* 16, 150-153 (2004), which is incorporated by reference in its entirety.

Figure 13D:
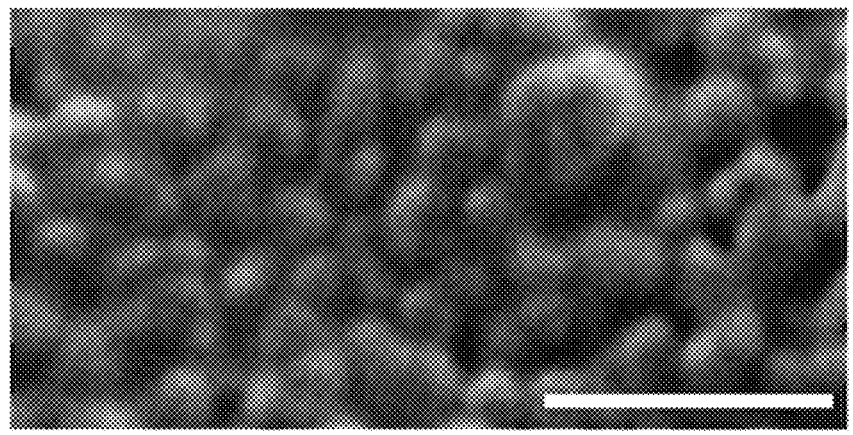
Figure 13E:
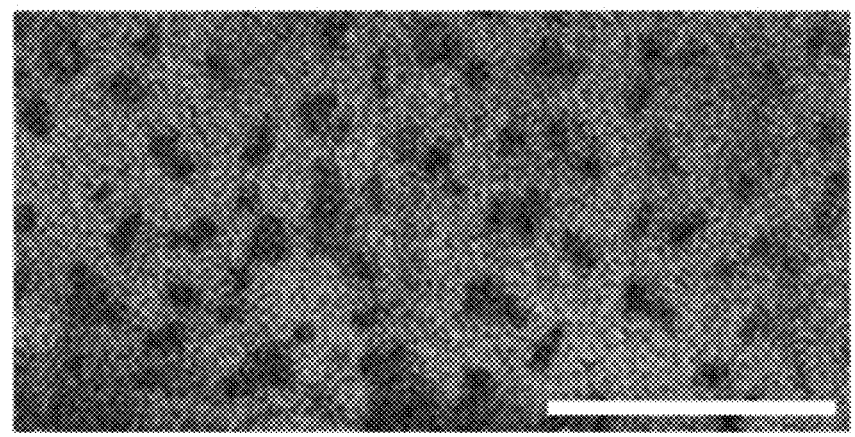
Figure 13F:
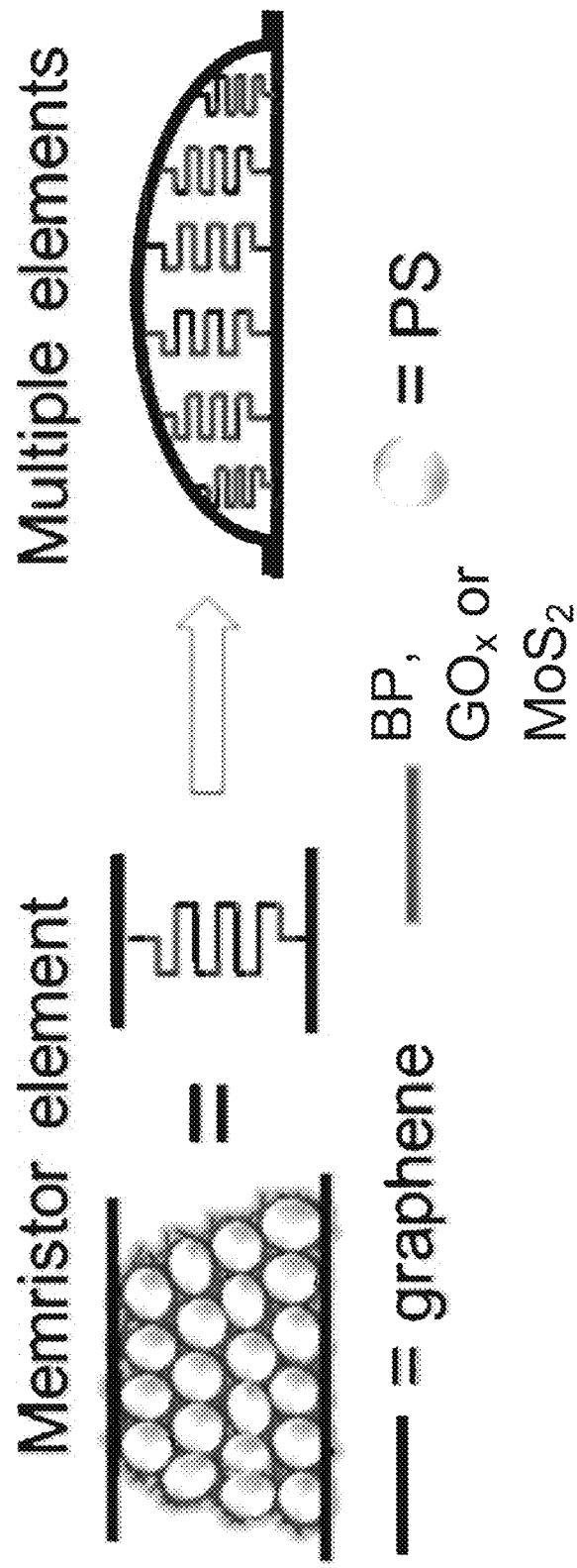
Figure 13G:
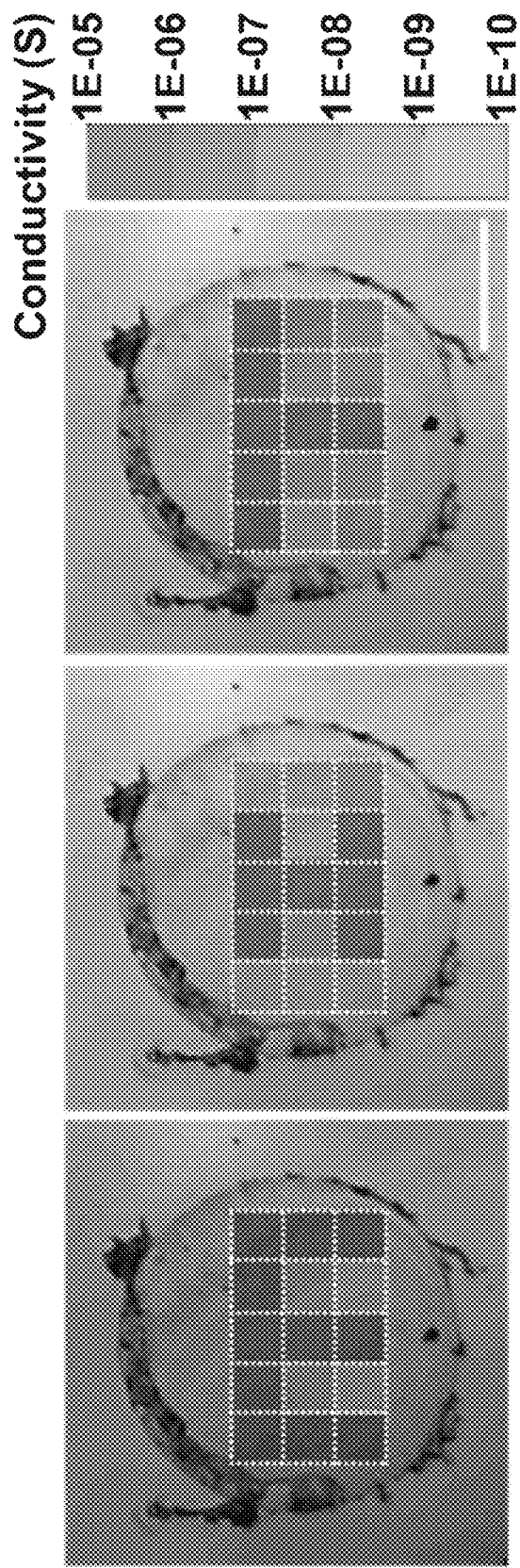

Scanning electron microscope (SEM) image of the PS/BP composite in FIG. 13D presents the exact morphology of such a network. FIG. 13E is the image from the energy selective backscattered detector of SEM, which can distinguish elements by atomic number and heavier elements have brighter colors. The isolated dark spots were identified as the carbons from PS nanoparticles among a brighter BP matrix. A scheme (FIG. 13F) illustrates such a percolated BP/PS composite structure and a memristor element is proposed with graphene layers as terminal electrodes, the percolated BP (or GO., $MoS_2$) network as charge trapping (or memory storage) material, and PS as structural support. Note that the presented percolated structure exit vertically at a submicron scale, and a microparticle with diameter ~260 µm possesses numerous such BP channels in between the graphene terminals, that is, it has multiple memristor elements (FIG. 13F). Predictably, by applying a local electrical potential, one can selectively turn these elements ON or OFF if the BP charge trapping is effective and the voltage-spreading radius is small. As a demonstration, using a probe with a tip diameter of 5 µm and a "write-read-erase-rewrite" procedure, the letters "M", "I", "T" were successfully mapped out contrasting high-conductivity (ON) and low-conductivity (OFF) states on a 5×3 grid (or 15-bit) inside the microparticle (FIG. 13G), with an average ON/OFF ratio N≈$10^4$.

Figure 13H:
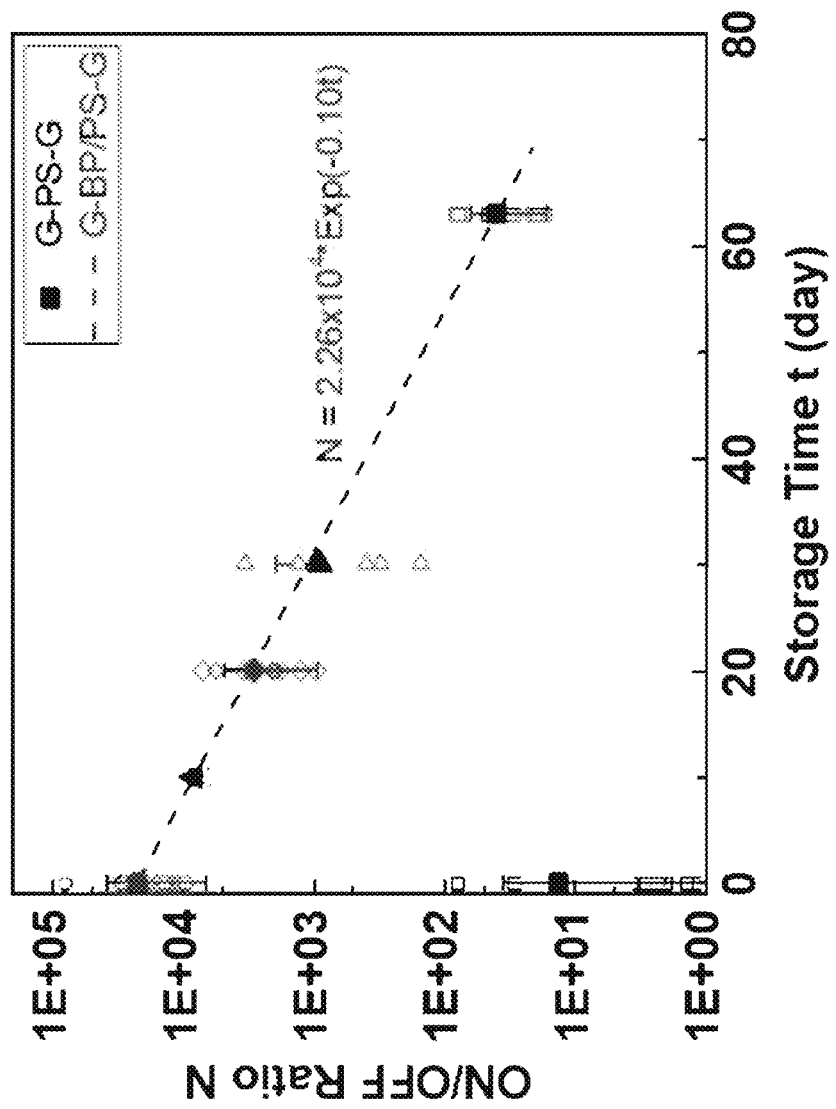
Figure 40:
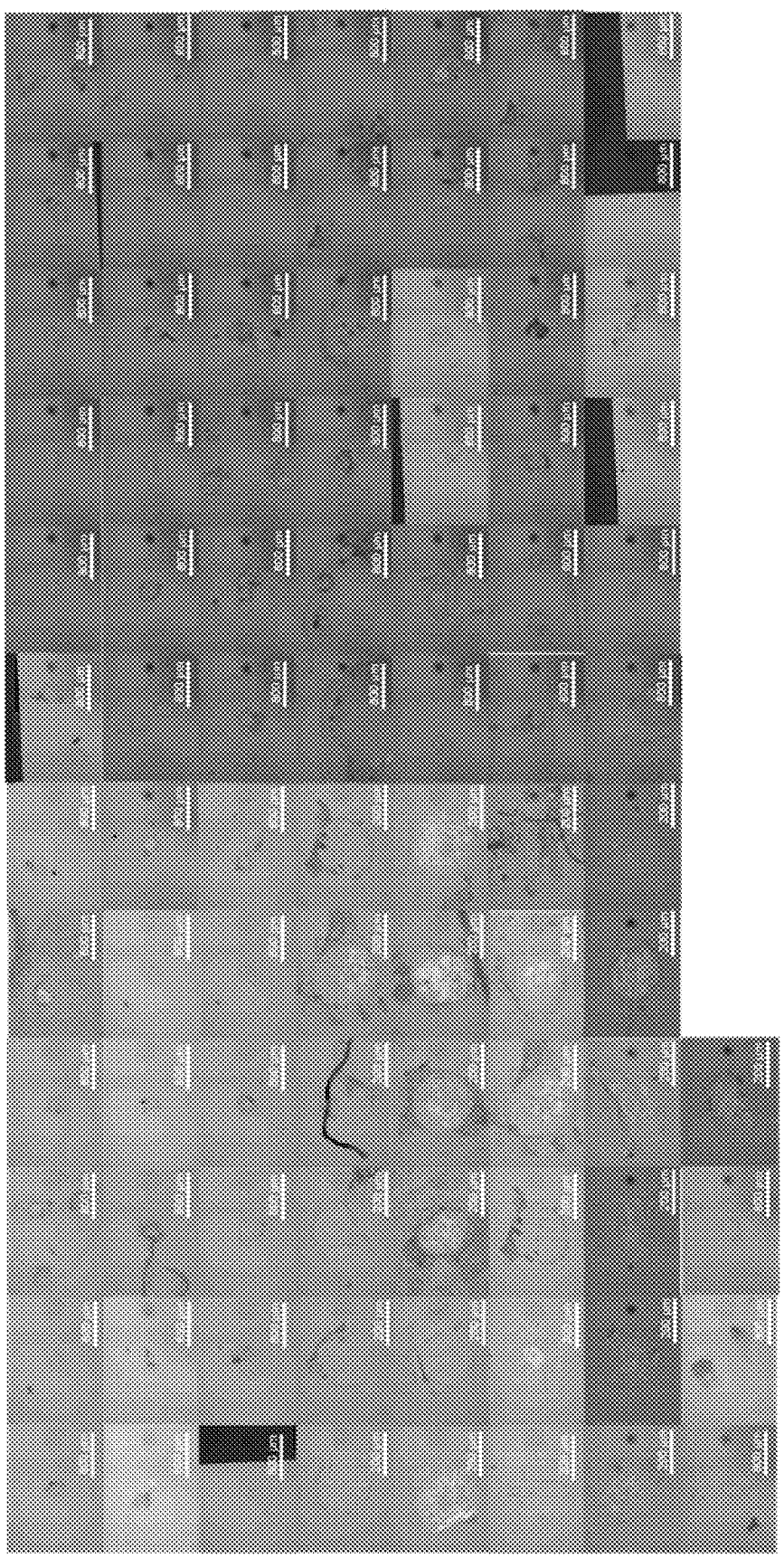
FIG. 40 shows a statistical study of the yield of functionalized graphene microparticles (see FIG. 39 for structure information) after a storage time of 8 months, 94 particles are good in 135, with a yield of 69.6%.
Figure 41A:
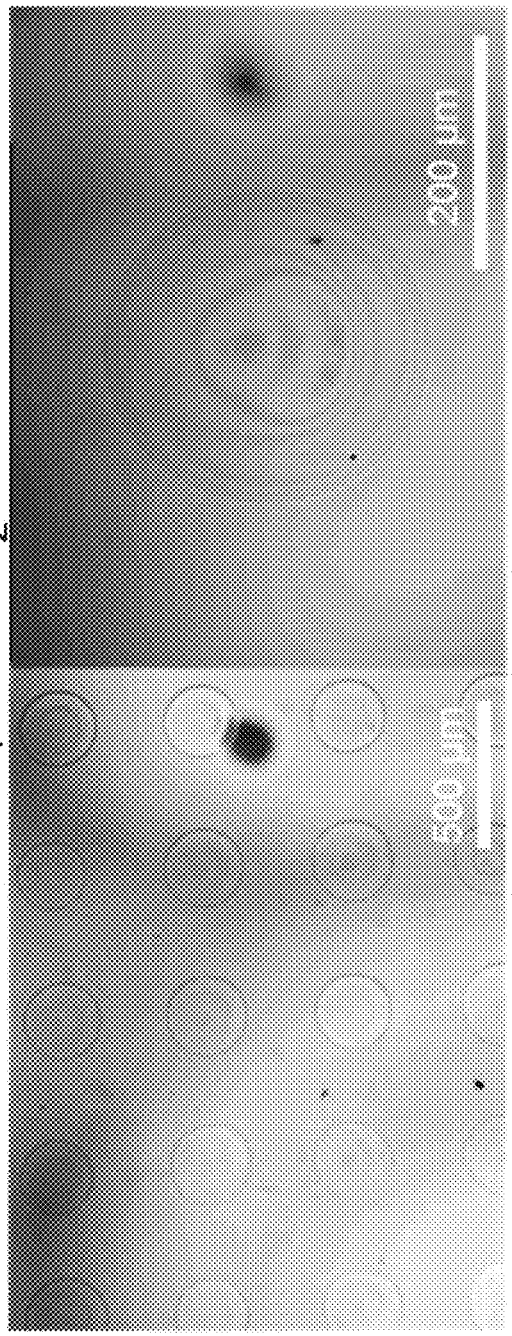
FIGS. 41A-41G show characterization of monolayer $MoS_2$ and $MoS_2$—PS-$MoS_2$ particles.
Figure 41B:
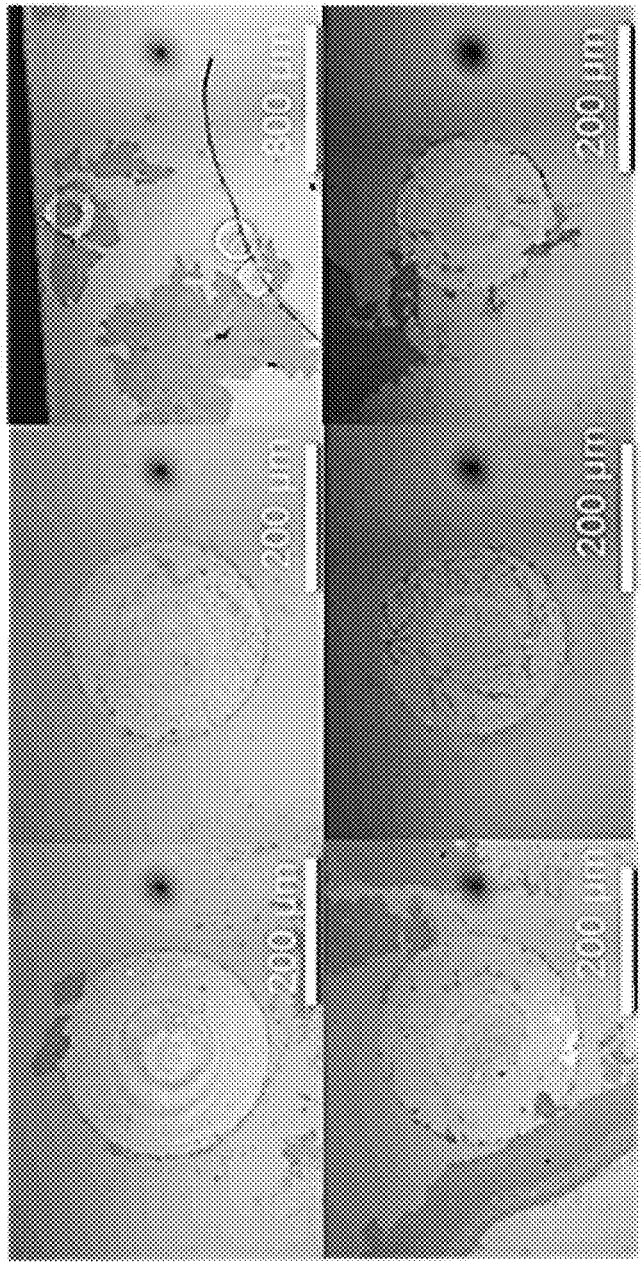
Figure 41C:
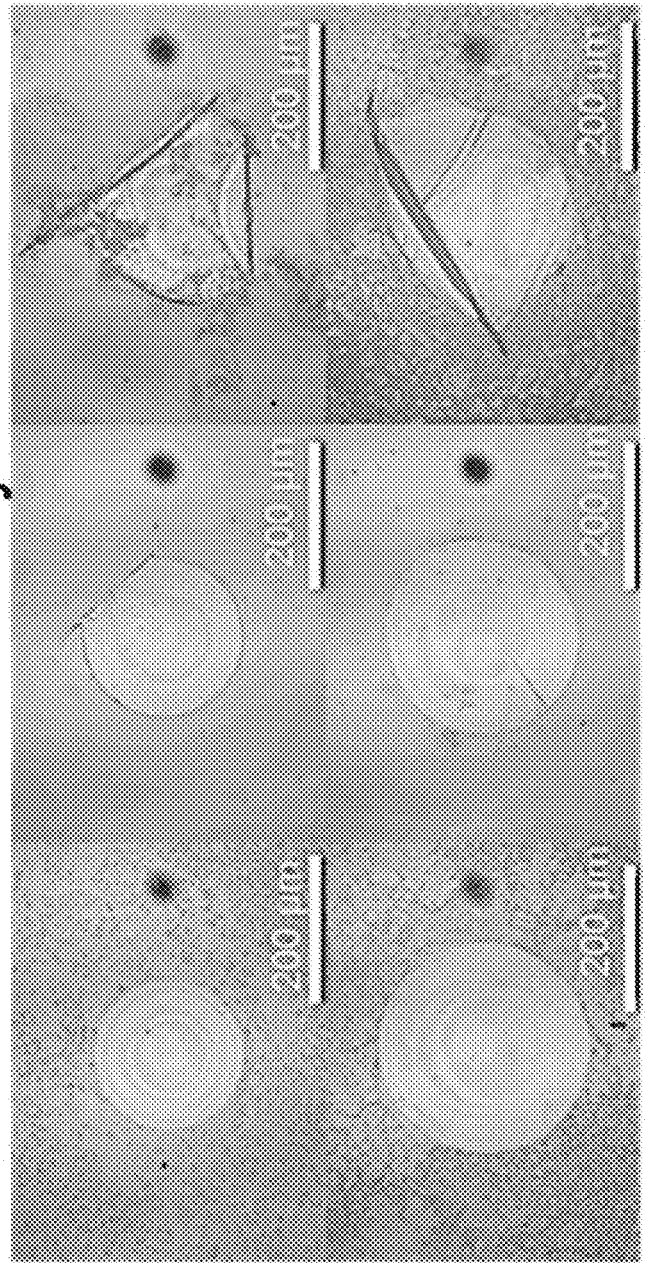
Figure 41D:
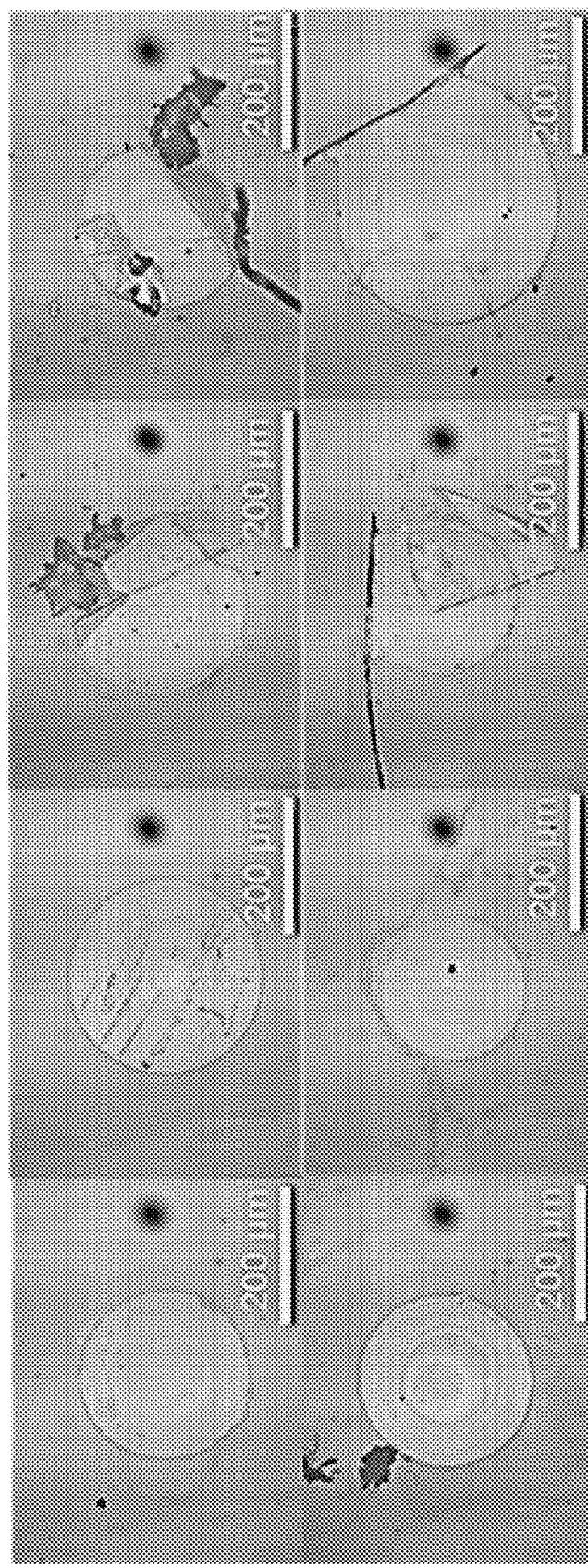
Figure 41E:
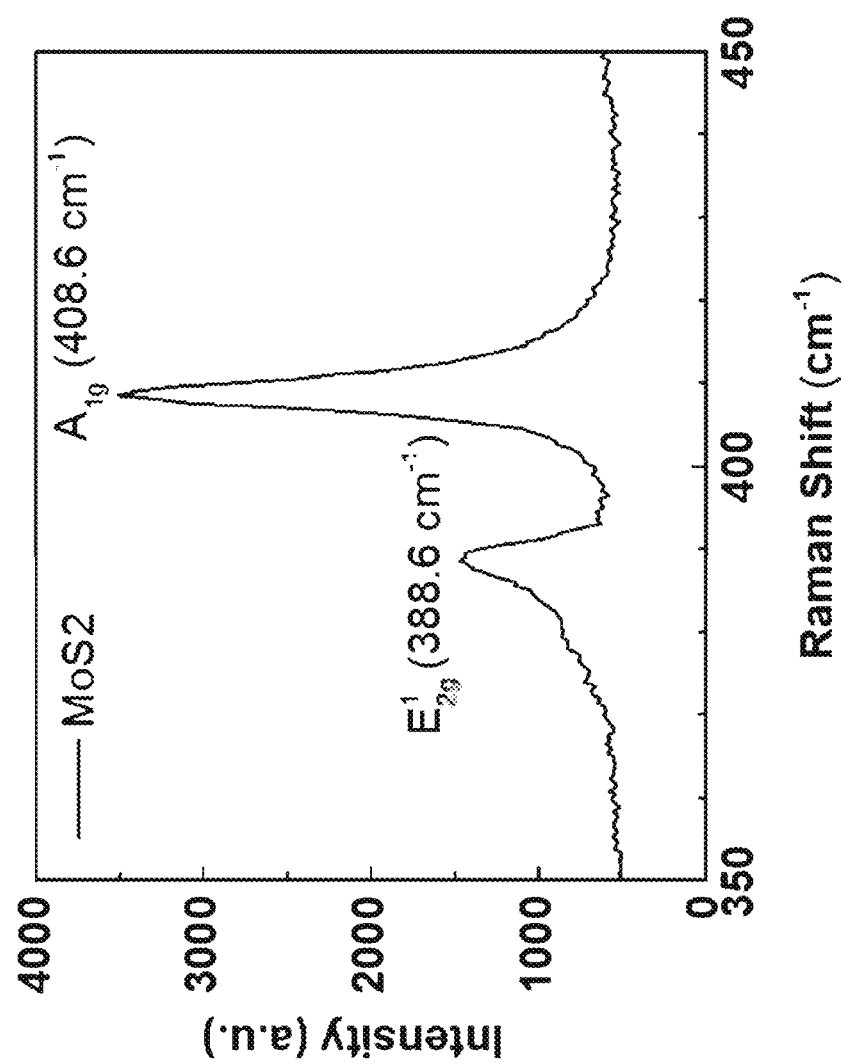
Figure 41F:
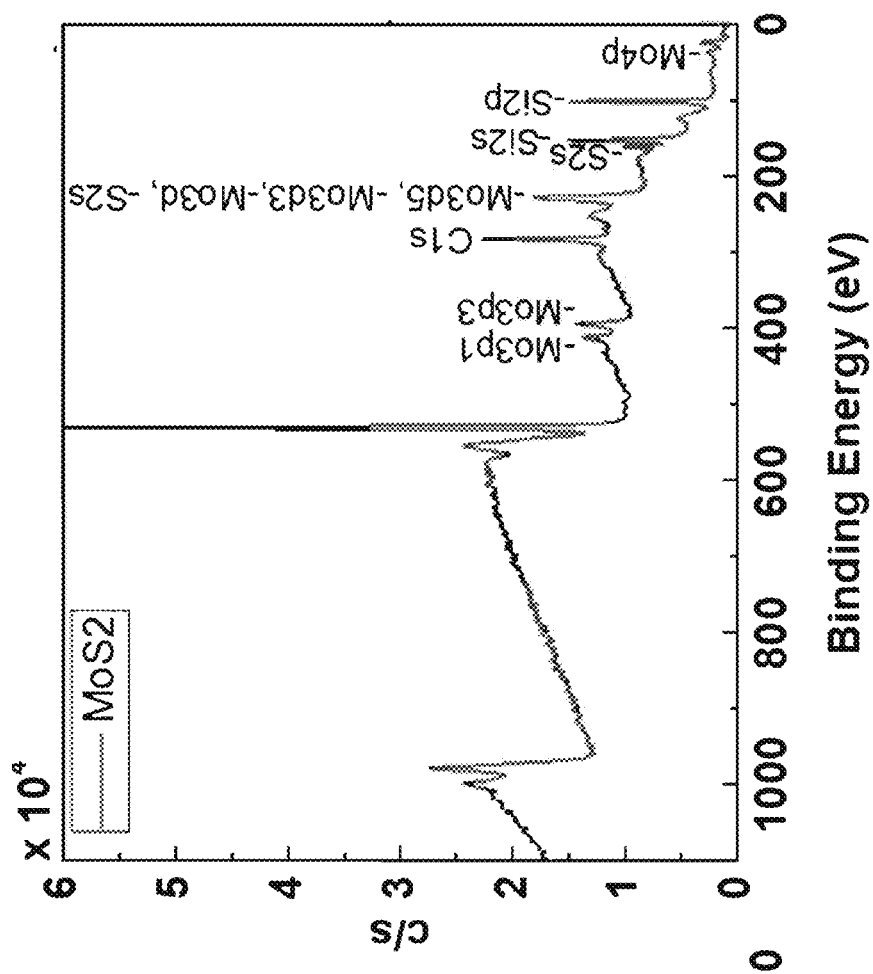
Figure 41G:
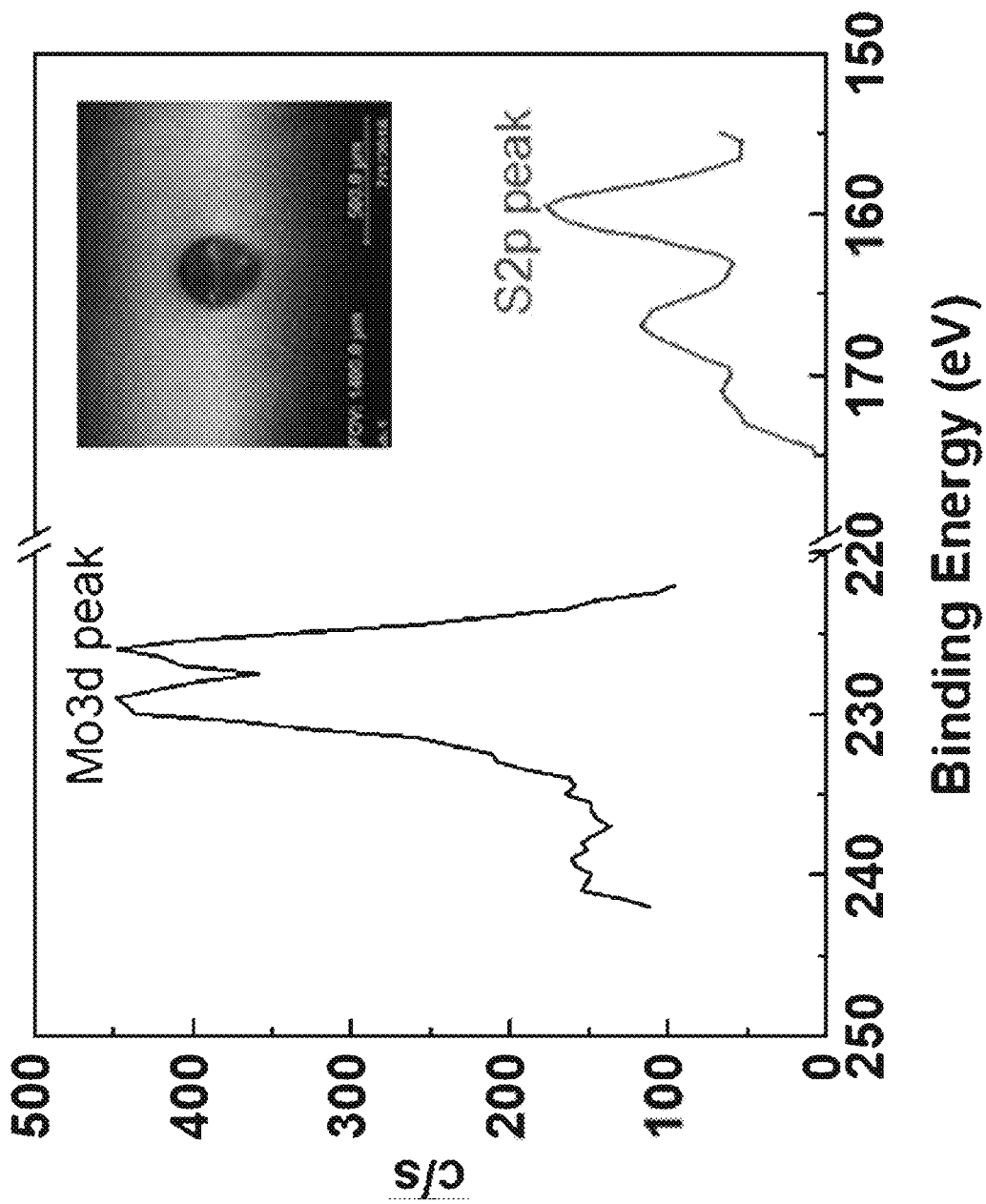
Figures 42A, 42B:
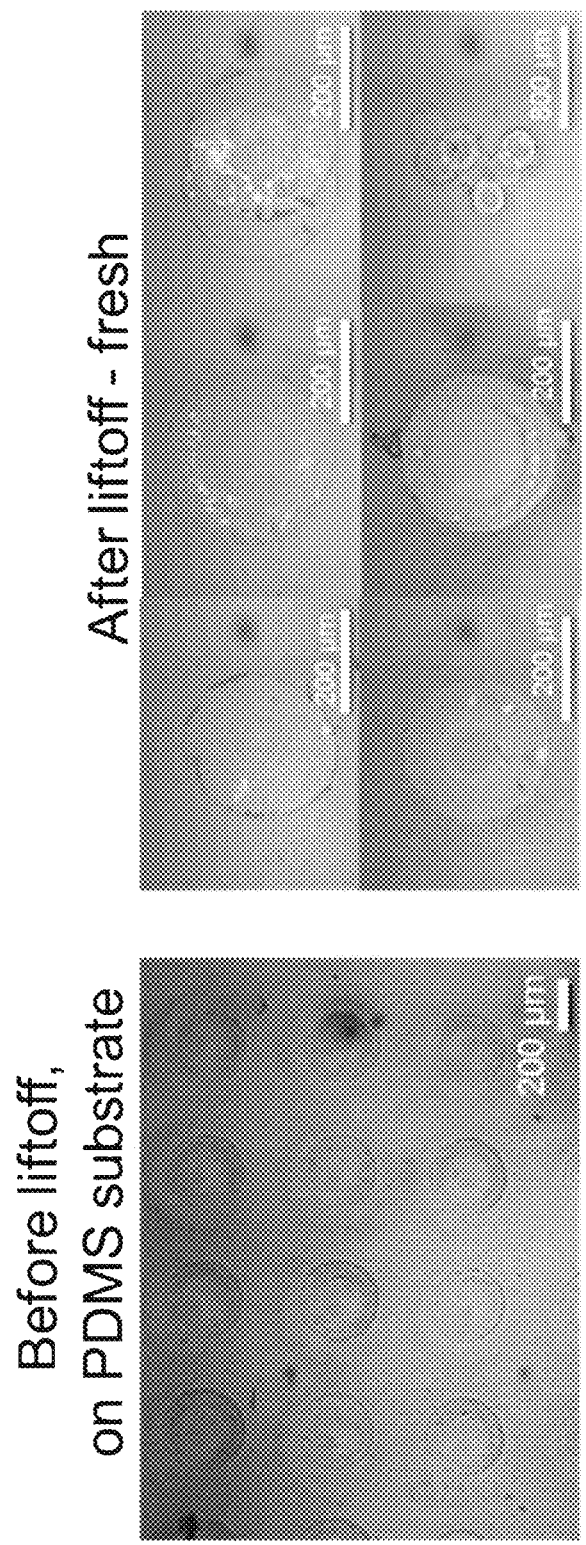
FIGS. 42A-42G show characterization of multilayer hBN and hBN-PS-hBN particles.
Figure 42C:
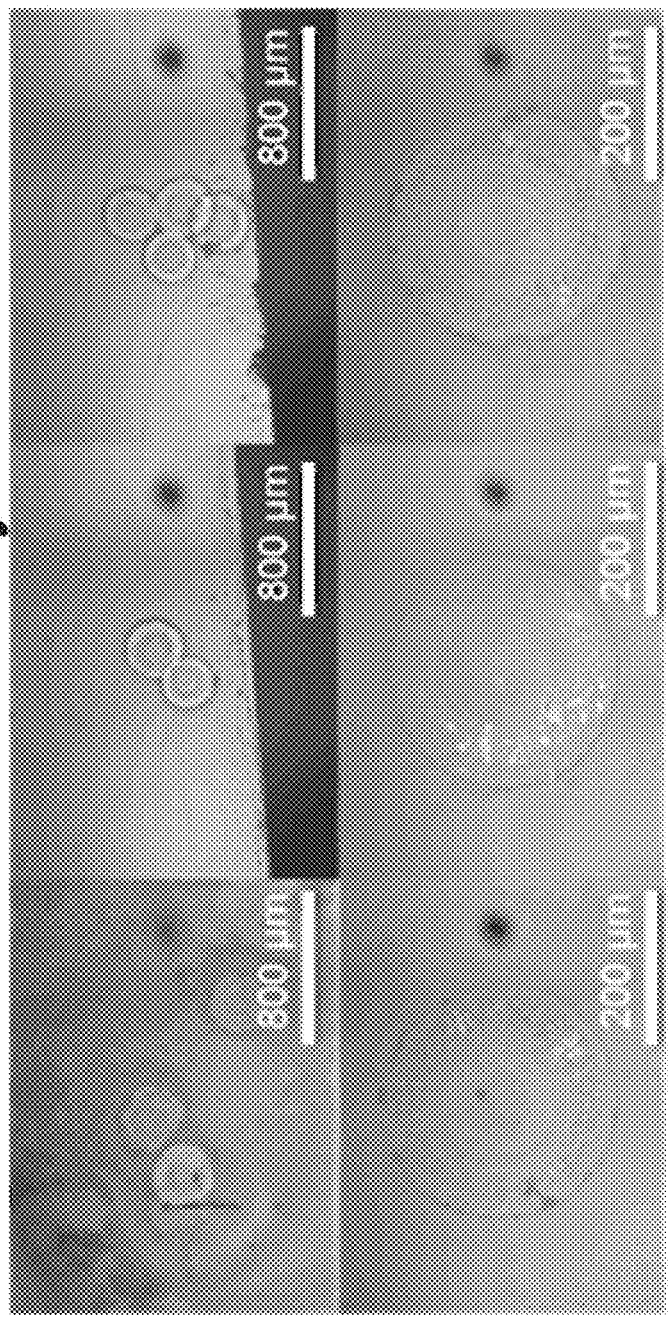
Figure 42D:
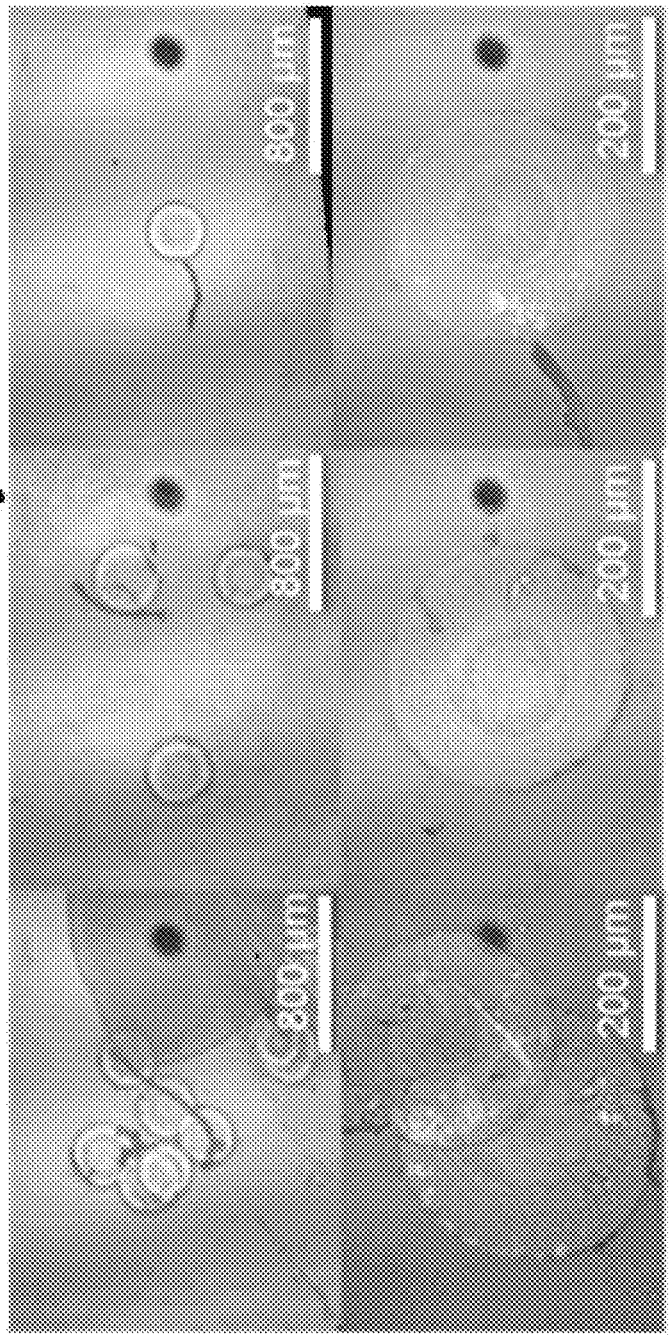
Figure 42E:
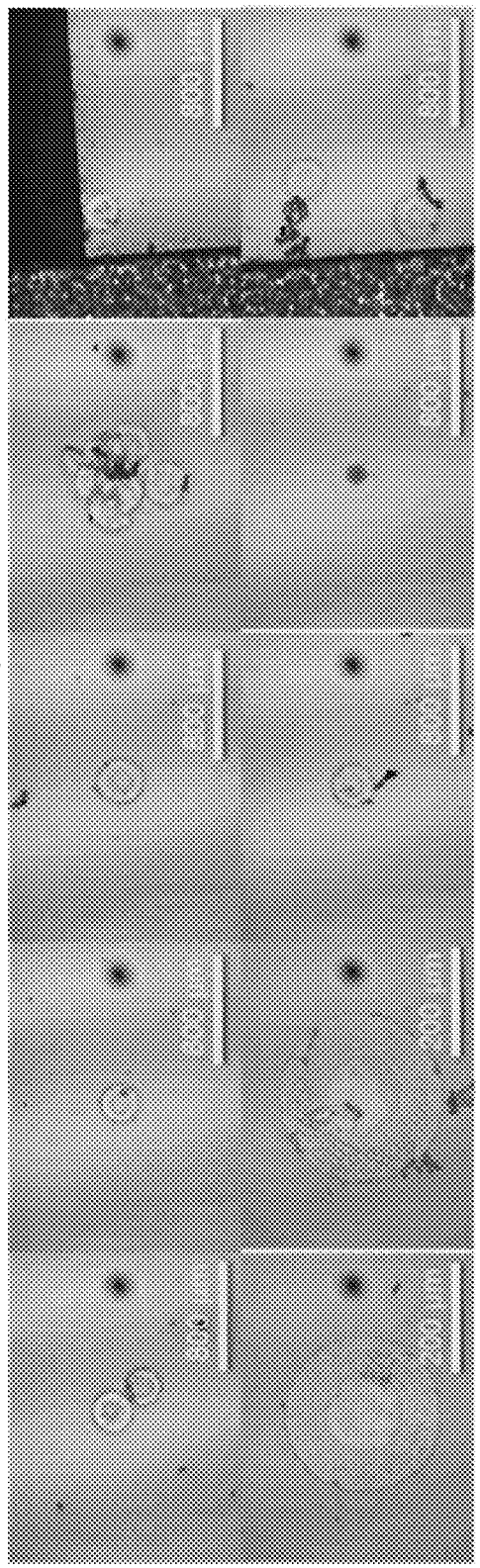
Figures 42F, 42G:
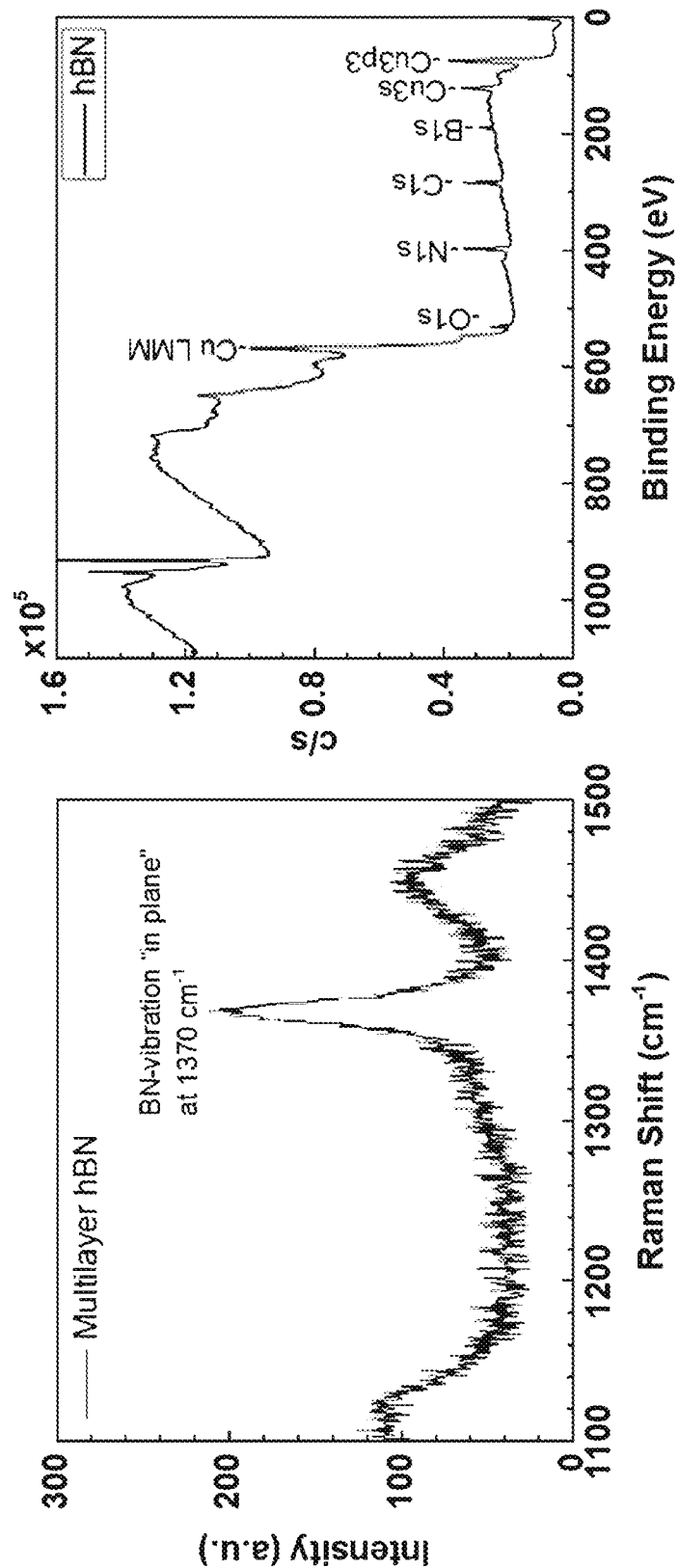
Figure 42H:
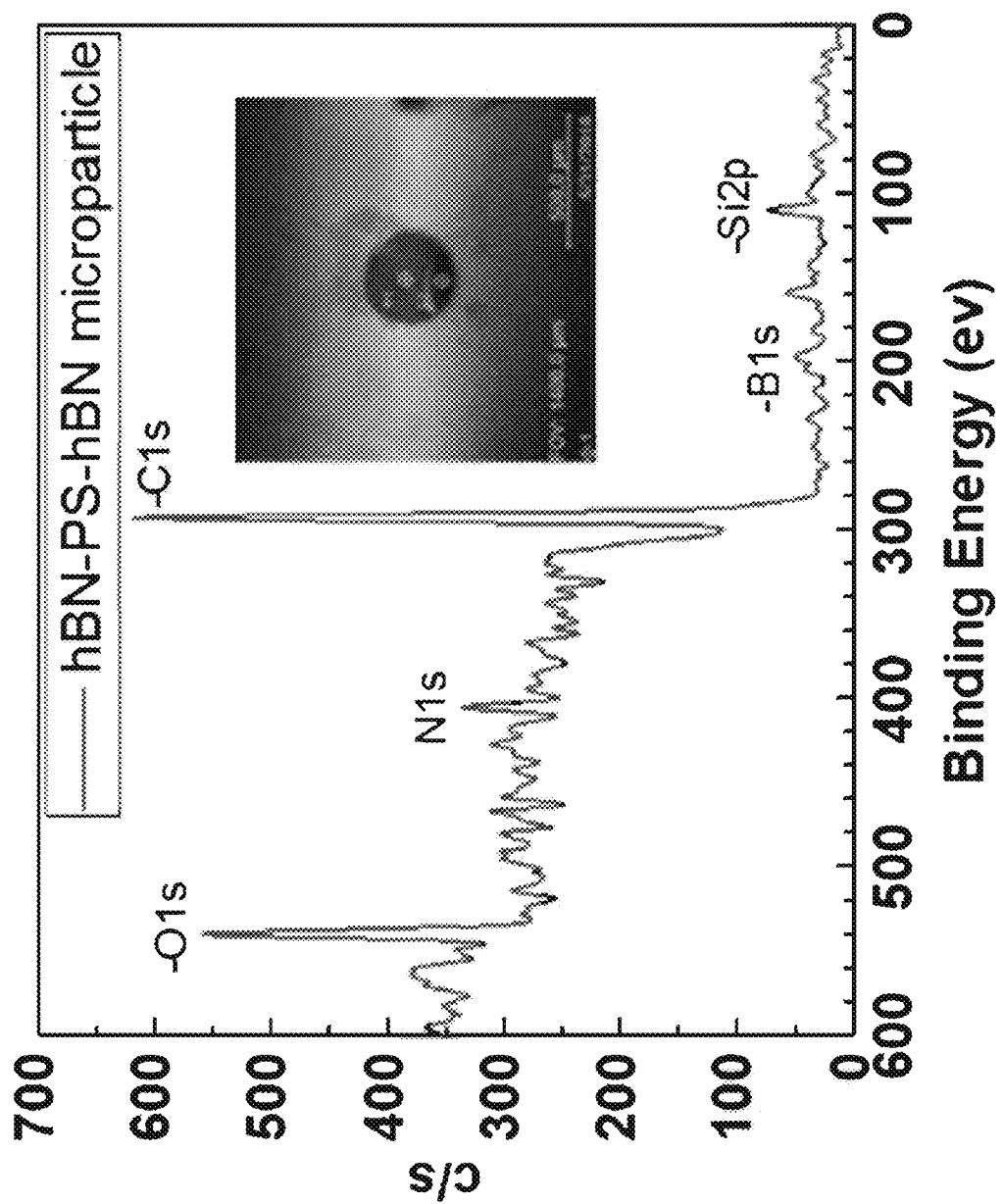
FIG. 42H shows XPS characterization of hBN-PS-hBN particle (the inserted picture), peaks of N1s and B1s are identified. Raman spectroscopy study of the particles fails due the interference of PS on the characteristic peaks of BN vibration.
Figure 43:
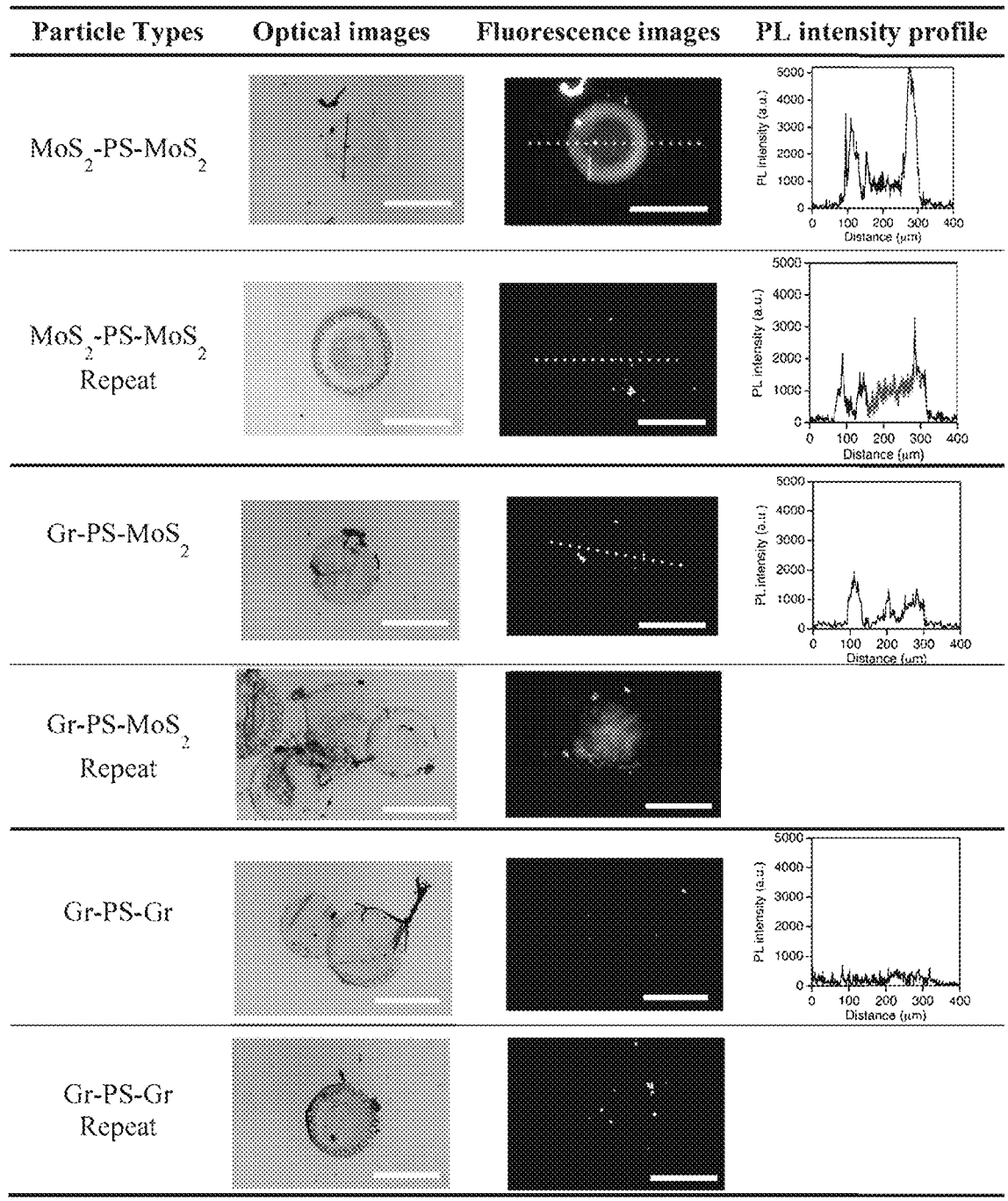
FIG. 43 shows fluorescence imaging of multiple 2D Janus particles with $\lambda_{exc}$=550 nm, PL intensity is normalized by exposure time, 10× objective lens, background is subtracted, scale bars are all 250 μm.
Figure 44:
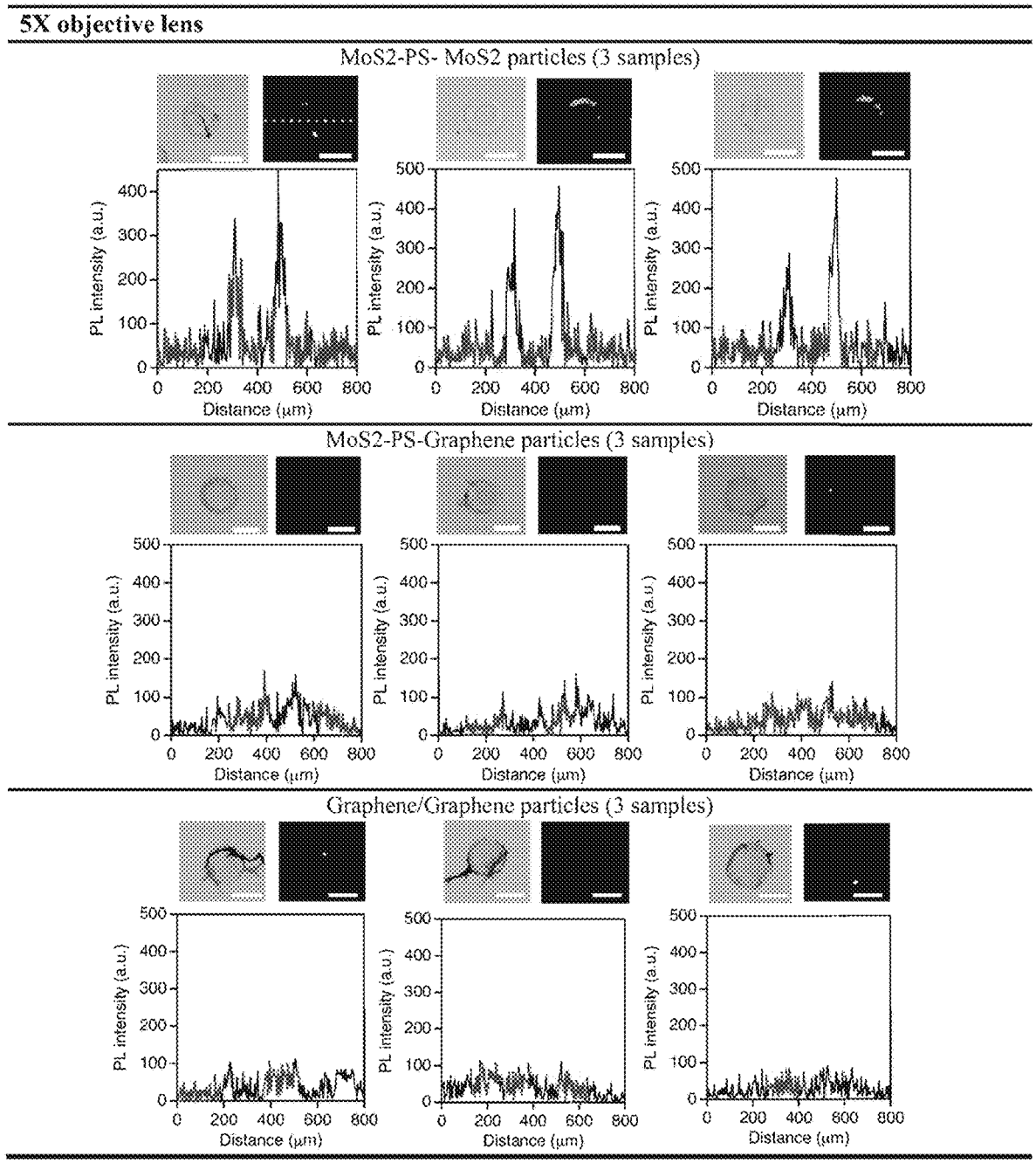
FIG. 44 shows fluorescence imaging of multiple 2D Janus particles with $\lambda_{exc}$=550 nm, PL intensity is normalized by exposure time, 5× objective lens, background is subtracted, scale bars are all 200 μm.
Figure 45A:
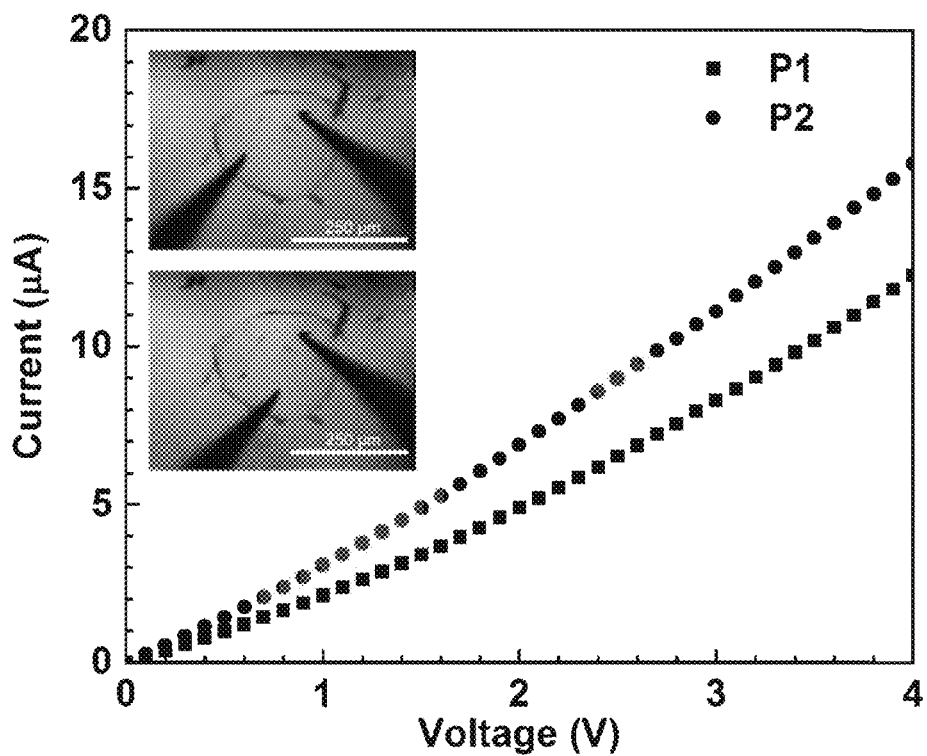
FIG. 45A shows typical I-V curves in the measuement of in-plane conductivity of G-PS-G (bilayer graphene was used) microparticles in plane.
Figure 45B:
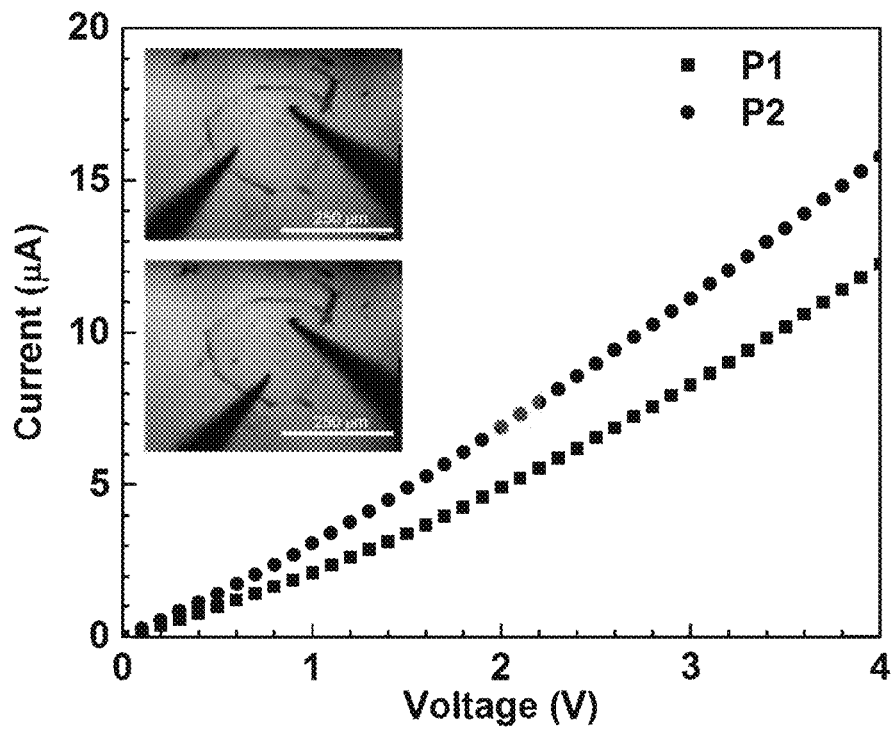
FIG. 45B shows the plot of resistnace agaist the distance between two eleoctrode for various G-PS-G micropoarticles.
Figure 45C:
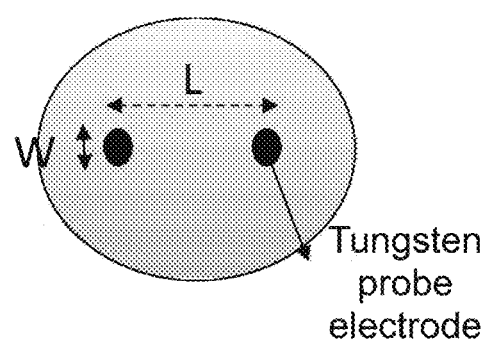
FIG. 45C shows the calculation of the sheet resistance of the microparticle and the contact resistance between the two electrodes and graphene surface. The sheet resistance data of FIG. 45B was used and the sheet resistance is determined to be 890±420 Ω/sq with contact resistance of 5540Ω.
Figure 45D:
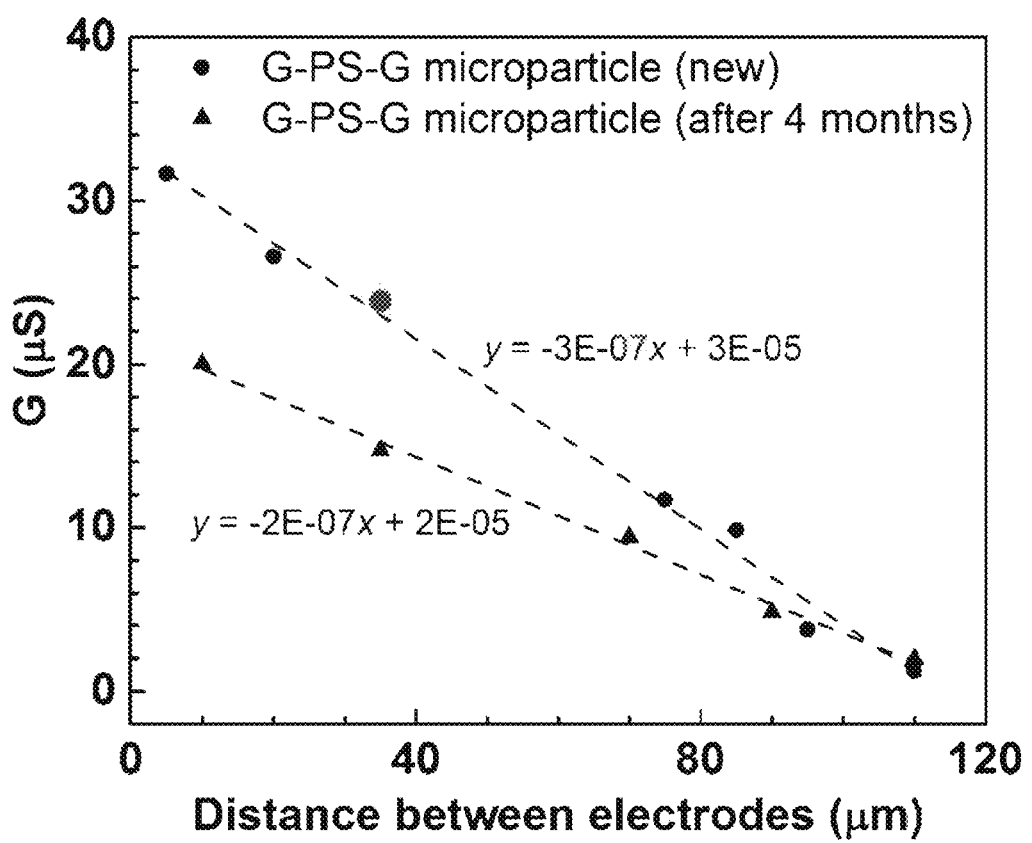
FIG. 45D shows the conductivity of the G-PS-G particles reduced by ⅓ after a storage time of 4 months in ethanol/water (4:1).
Figure 46A:
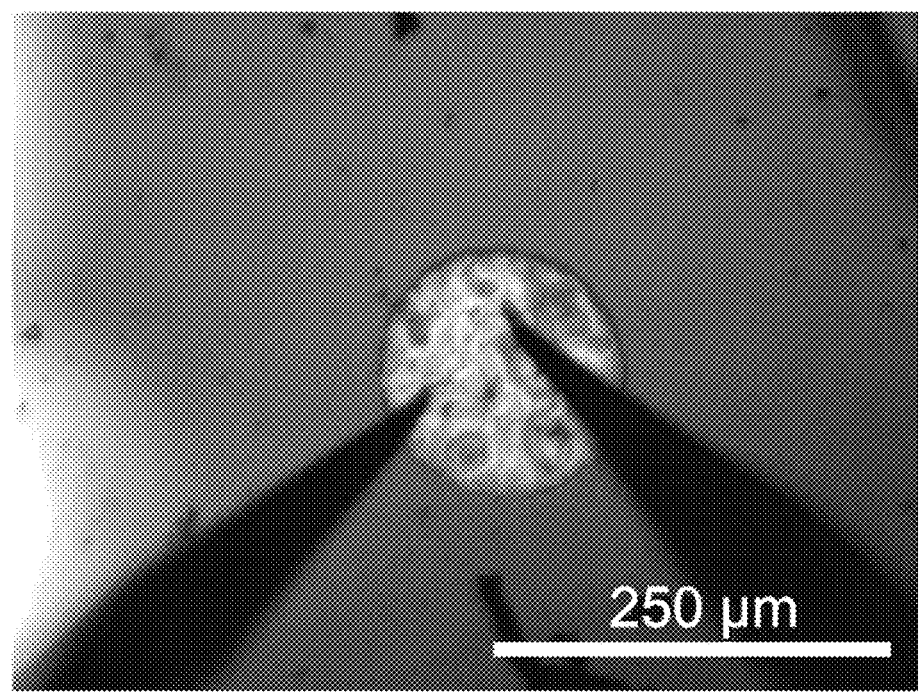
FIGS. 46A-46D show the measurement and calculation of in-plane sheet resistance and contact resistance between the probe electrode and PS surface.
Figure 46B:
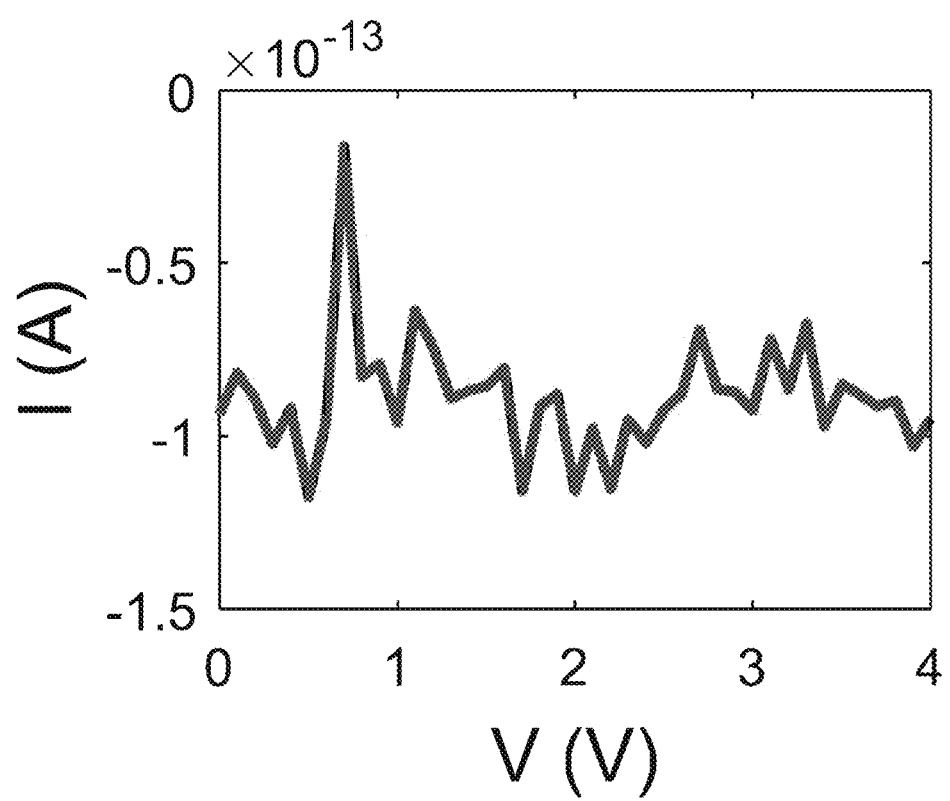
Figure 46C:
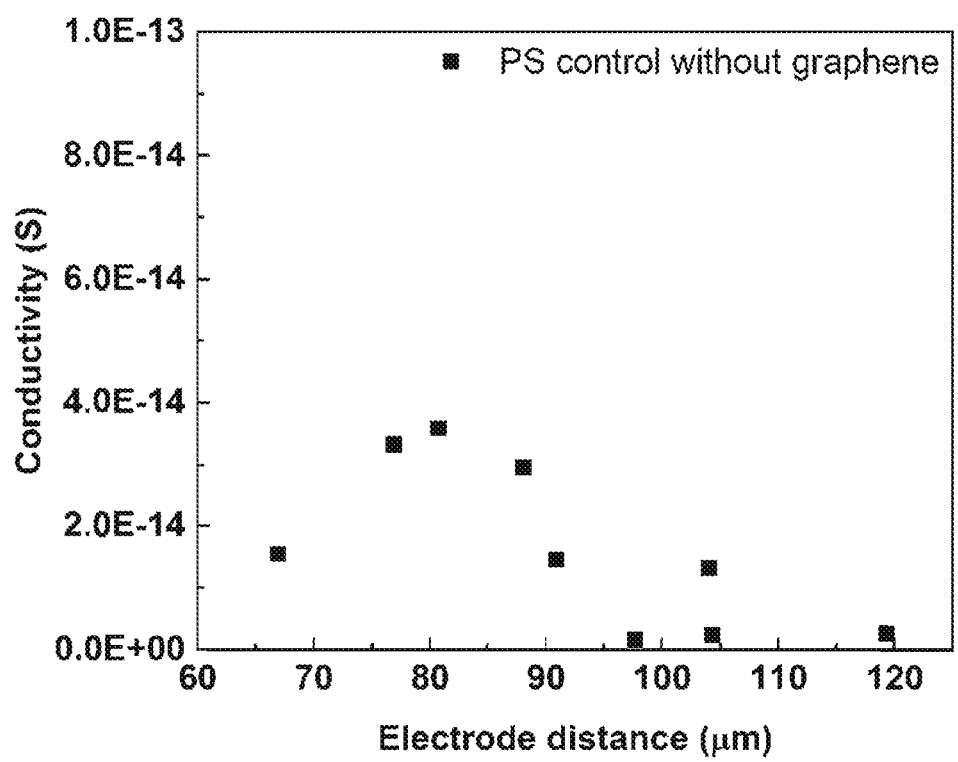
Figure 46D:
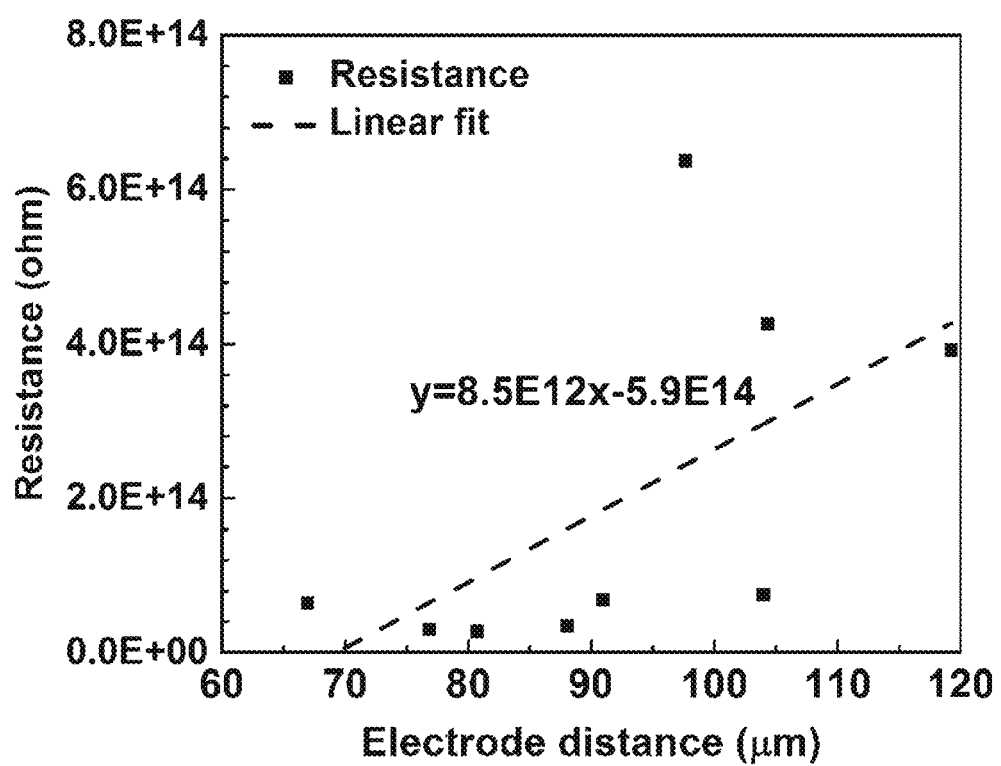
Figure 47A:
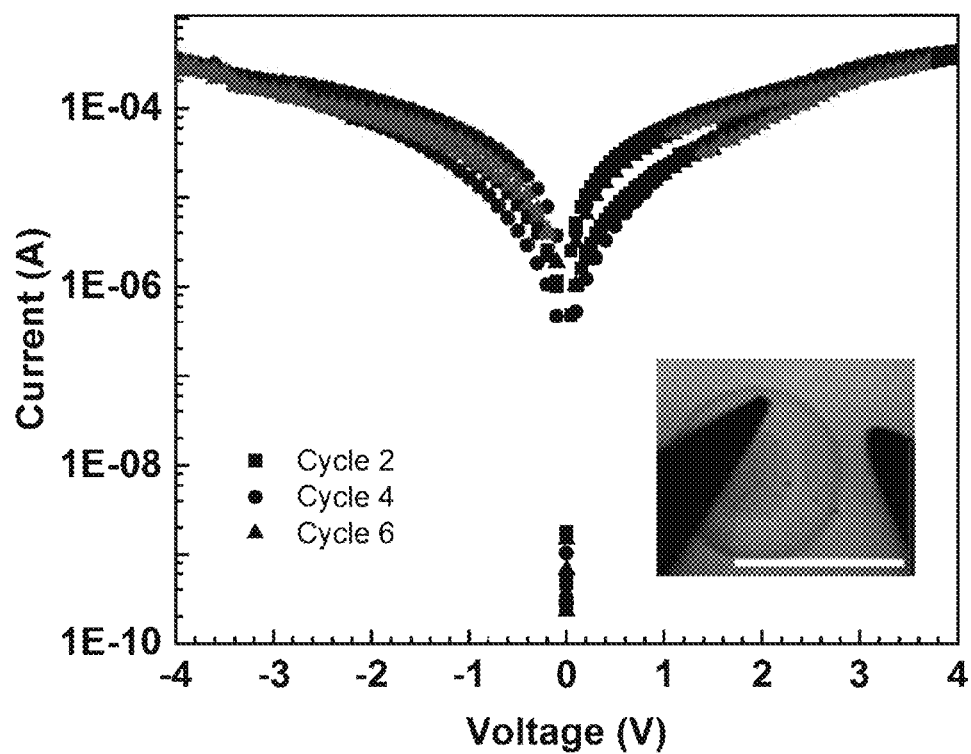
FIGS. 47A-47C shows the measured I-V curves from of three G-PS-G microparticles without BP, three different cycles with a same procedure 0 V→4 V→0 V→−4 V→0 V was listed for each particle.
Figure 47B:
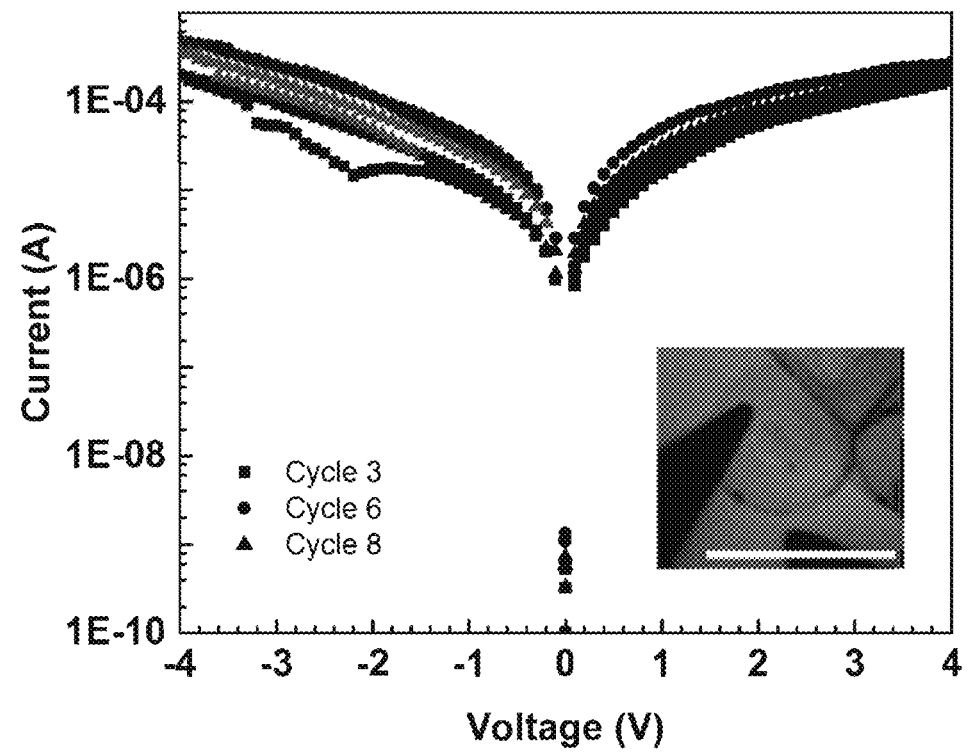
Figure 47C:
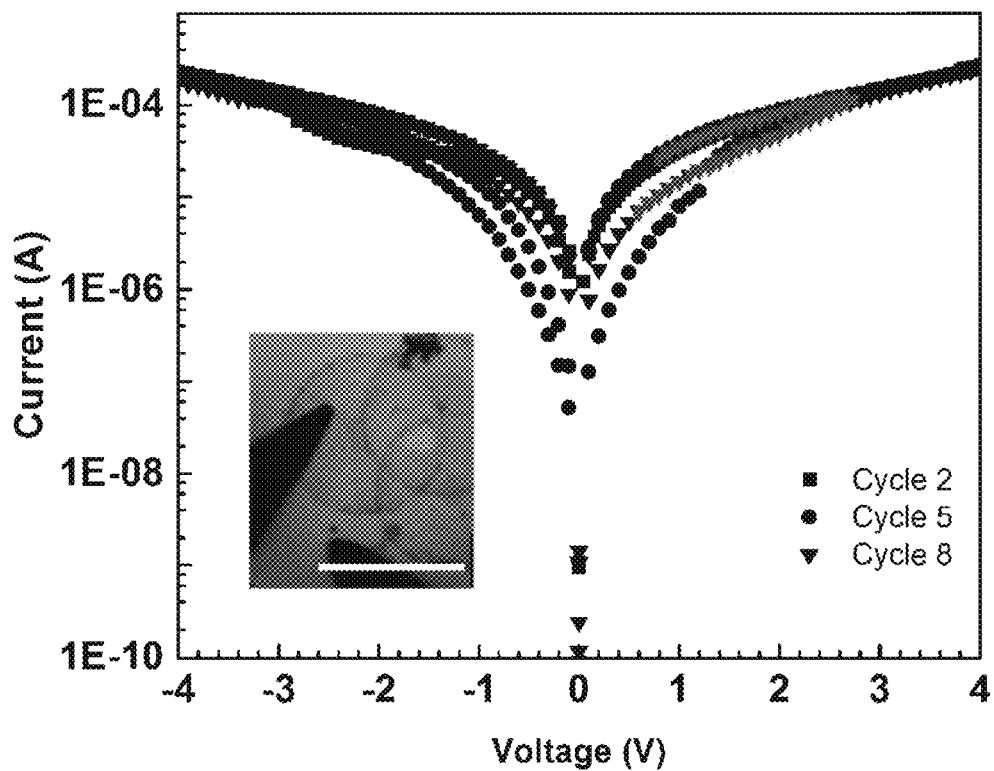
Figure 47D:
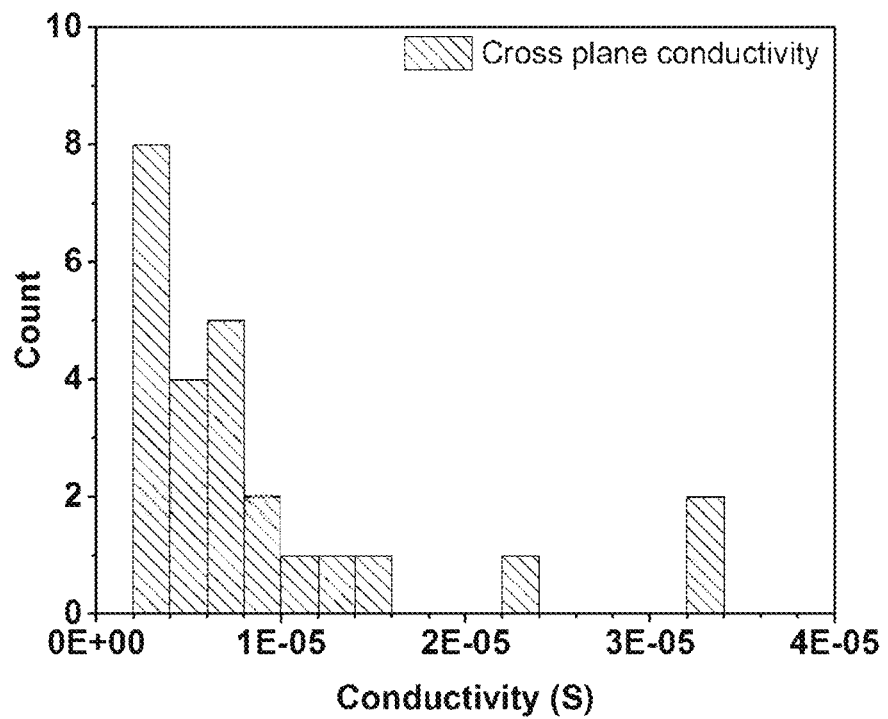
FIG. 47D shows a statistical study of the cross-plane conductivity of various G-PS-G microparticles at 0.2 V.
Figure 48A:
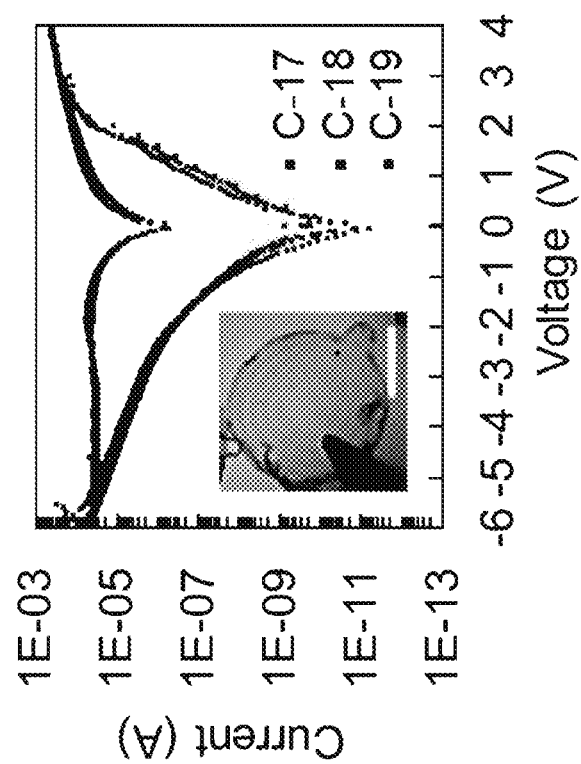
FIGS. 48A-48C show I-V characteristics of three fresh Gr-BP/PS-Gr microparticles. Vertical conductivity hysteresis can be observed and ON/OFF ratios over $10^4$ can be found in all samples tested. Each CV scan follows a 0V→4V→0V then 0V→–6V→0V pre-programmed procedure where a larger negative voltage (–6V) is applied to ensure a fully switched-OFF conductivity state. Each plots shows three sets of consecutive cycles, with the cycle number labeled by the data. Insets shows the optical image of the microparticle tested, with scale bar marking 100 μm.
Figure 48B:
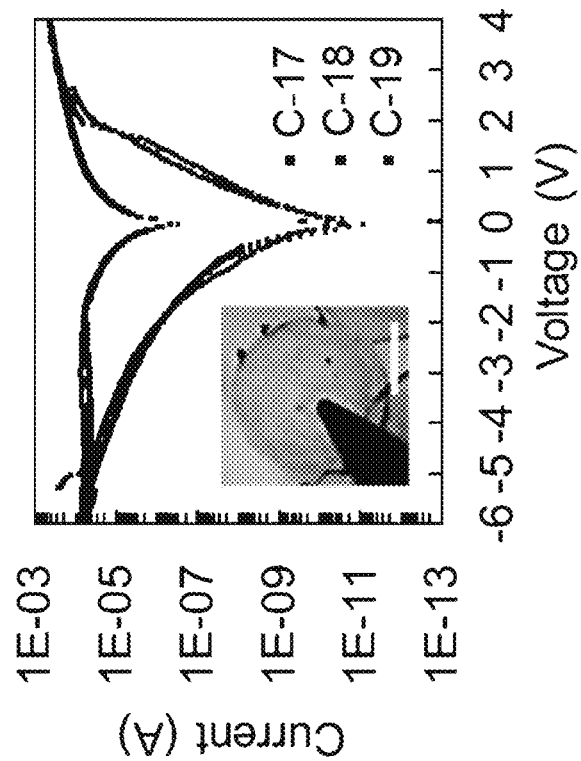
Figure 48C:
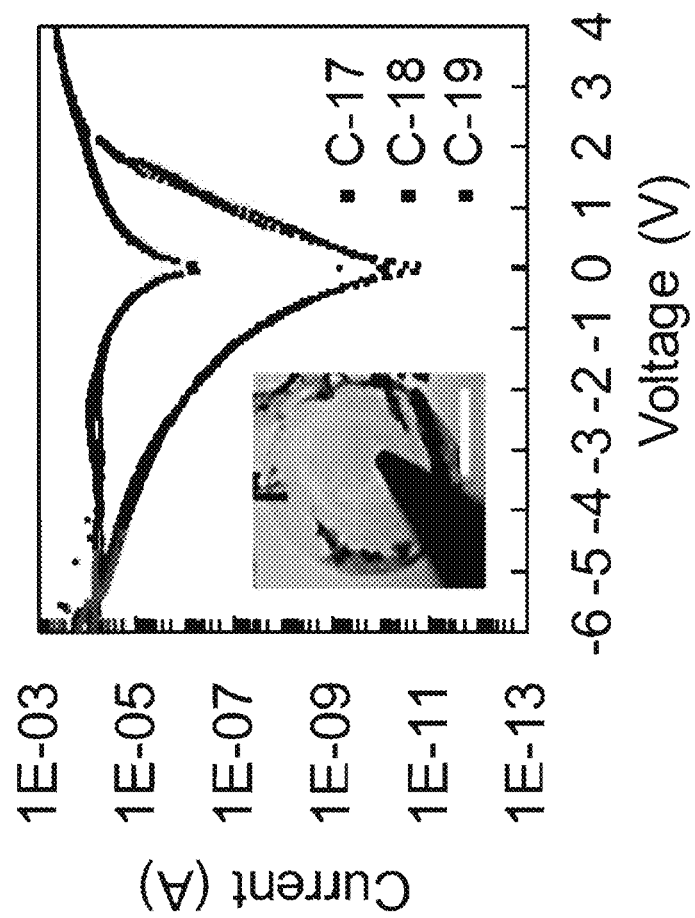
Figure 49:
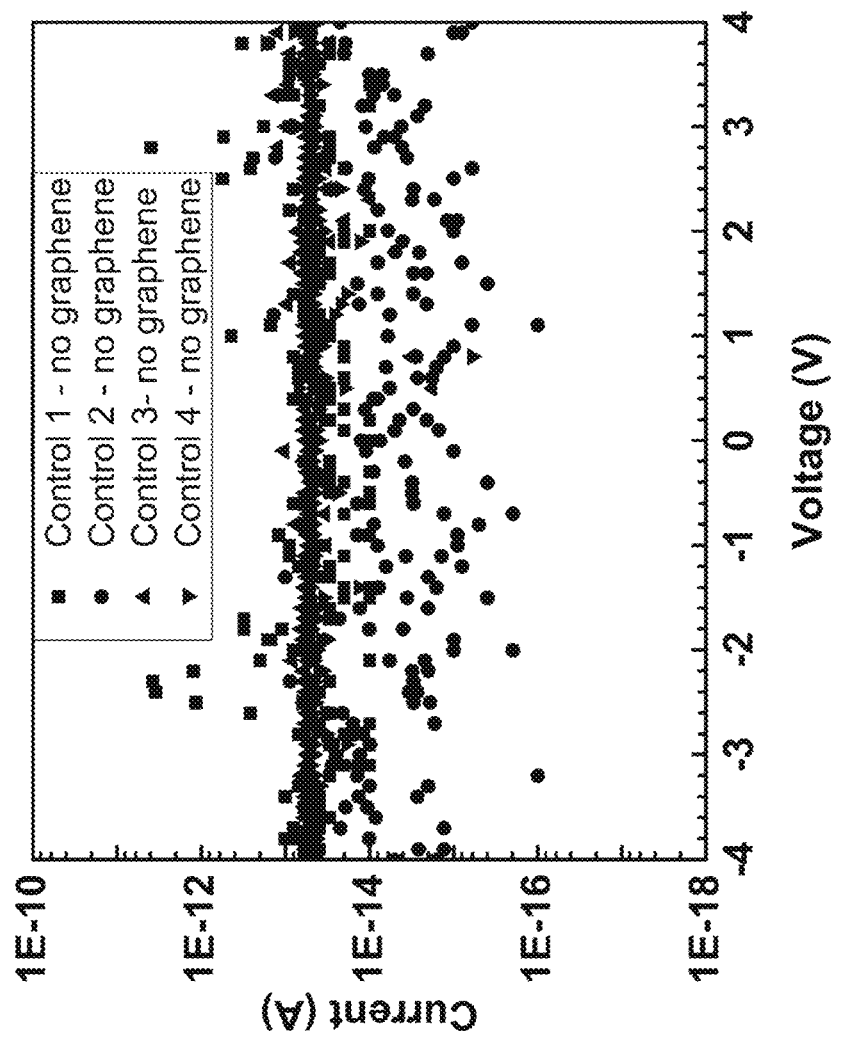
FIG. 49 shows the cross-plane I-V curves of four PS microparticles without graphene at CV scan0 V→4 V→0V then 0 V→–4 V→0 V.
Figure 50B:
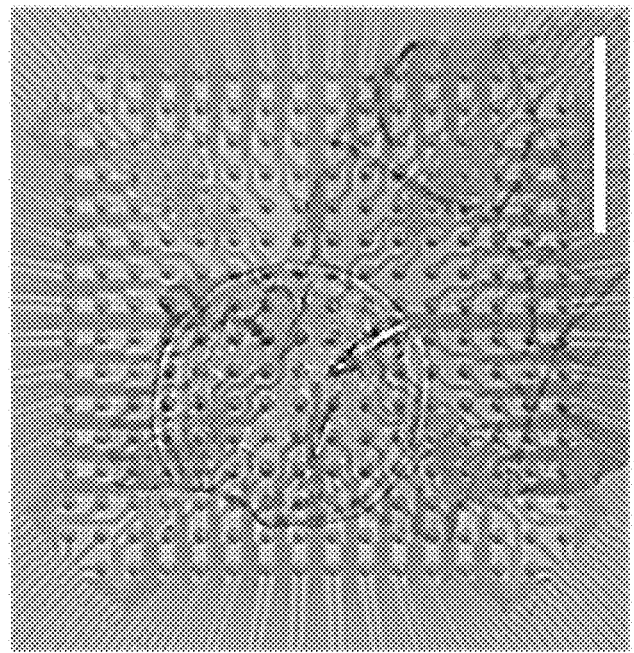
FIG. 50B shows optical micrograph of a Gr-BP/PS-Gr microparticle sandwiched in between a standard 16×16 gold electrode array (256MEA30/8iR-ITO, Multichannel Systems) and an ITO glass slide. Each contacted electrode is capable of readout particle vertical conductivity.
Figure 50A:
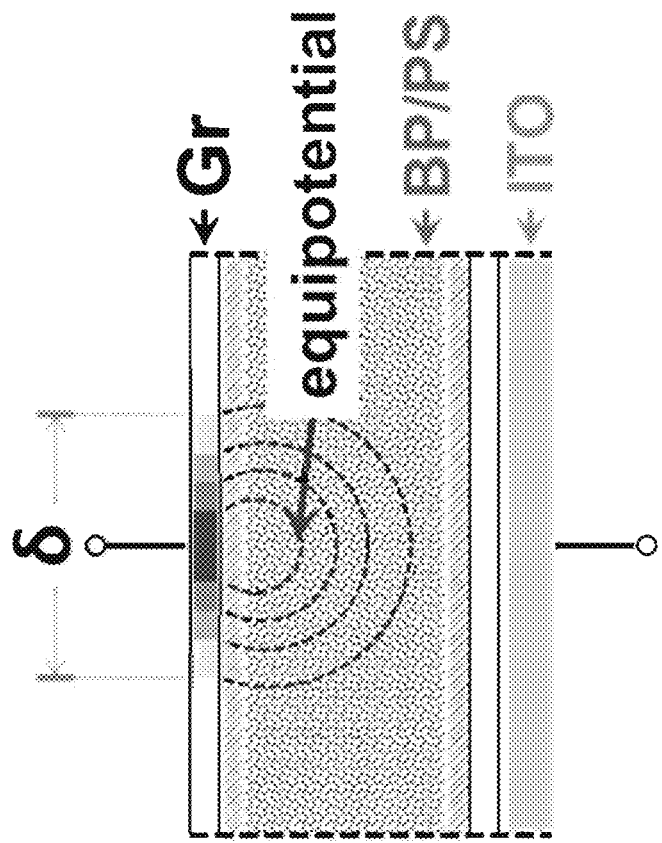
FIG. 50A shows schematic illustration of the spreading current and equipotential line within the Gr-BP/PS-Gr vertical stack (side view). Since the BP/PS composite can use the spreading electrons and drain the applied voltage to move the oxygen vacancies around its interior structure, there is a limited radius of the effective voltage, δ, beyond which the BP is virtually unaffected.
Figure 50C:
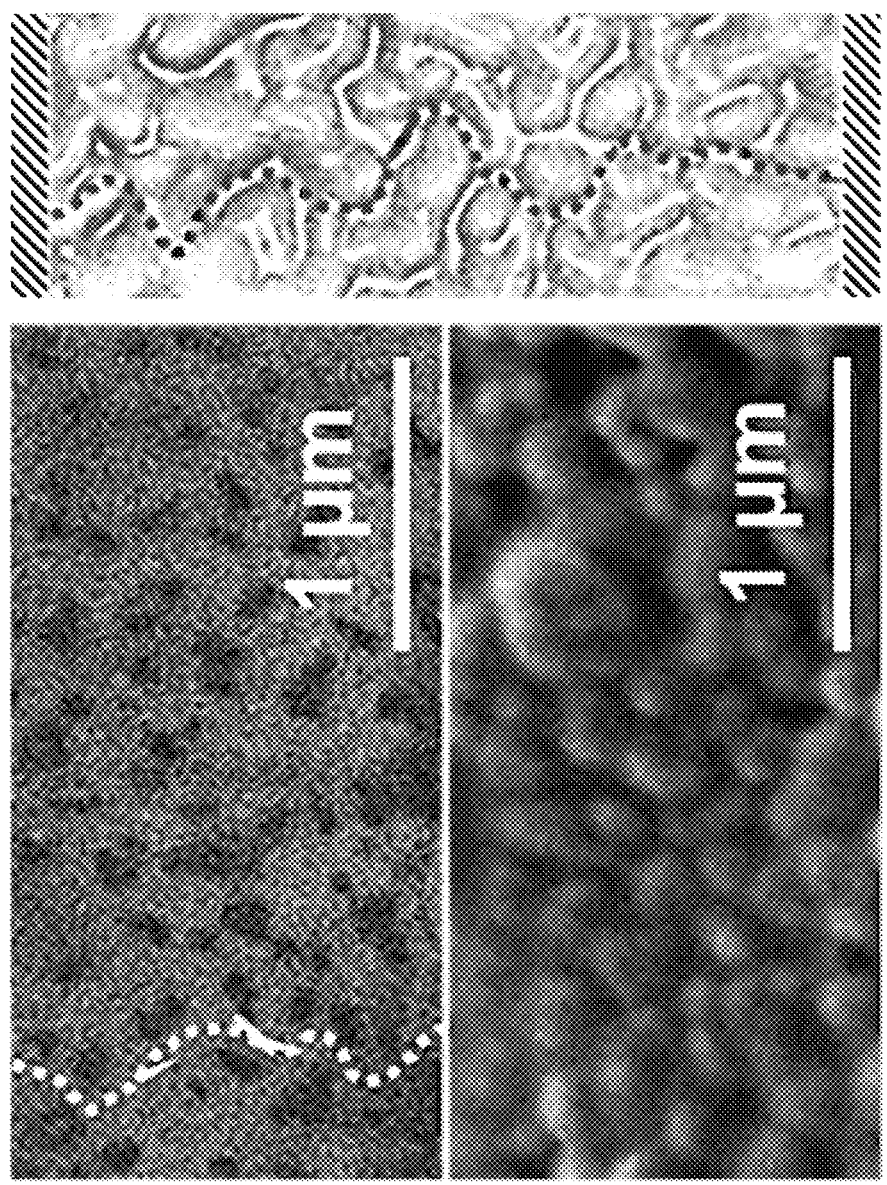
FIG. 50C shows scanning electron micrographs (top, Signal=ESB, EHT=1.50 kV, WD=5.4 mm, I probe=100 pA, Mag=9.63k, Column mode=Analytic; bottom, Signal=HE-SE2, EHT=1.00 kV, WD=5.3 mm, I probe=50 pA, Mag=9.63k, Column mode=Analytic) of the Gr-BP/PS-Gr cross section. White dash illustrate a potential BP pathway formed within the vertical structure. Right figure is a schematic illustration of this vertical stack, with black shades as graphene terminals, blue as PS nanoparticles, white as BP nanoflakes, red dash as potential pathways connecting the two graphene terminals.
Figure 50E:
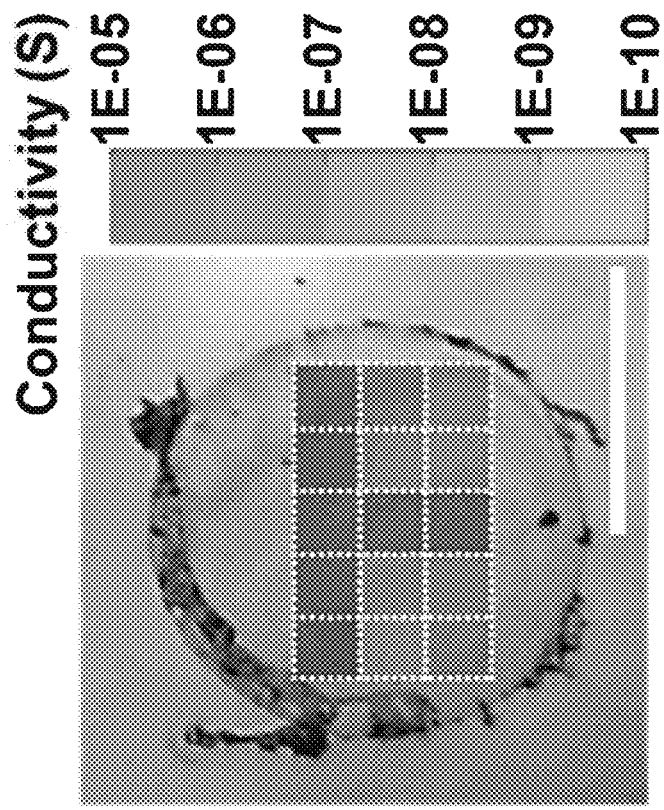
FIG. 50E shows measured conductivities at 0.2 V readout voltage after written-in the letter "T" in a 15-bit map, as designed in part FIG. 50D.
Figure 50D:
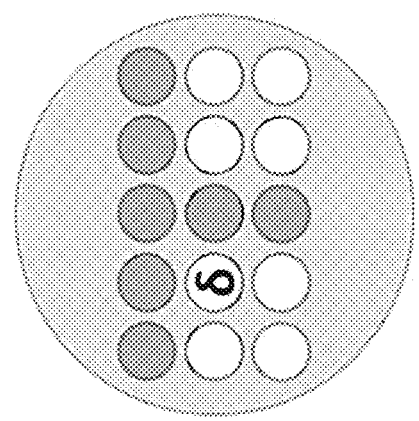
FIG. 50D shows schematic illustration of a multiple-bit (15) memory array on top of a single Gr-BP/PS-Gr microparticle, with each bit covering an area of radius δ, the critical voltage spreading radius. Red shade refers to written-in high conductivity bits, and white shades refers to non-written low conductivity points.
Figure 50F:
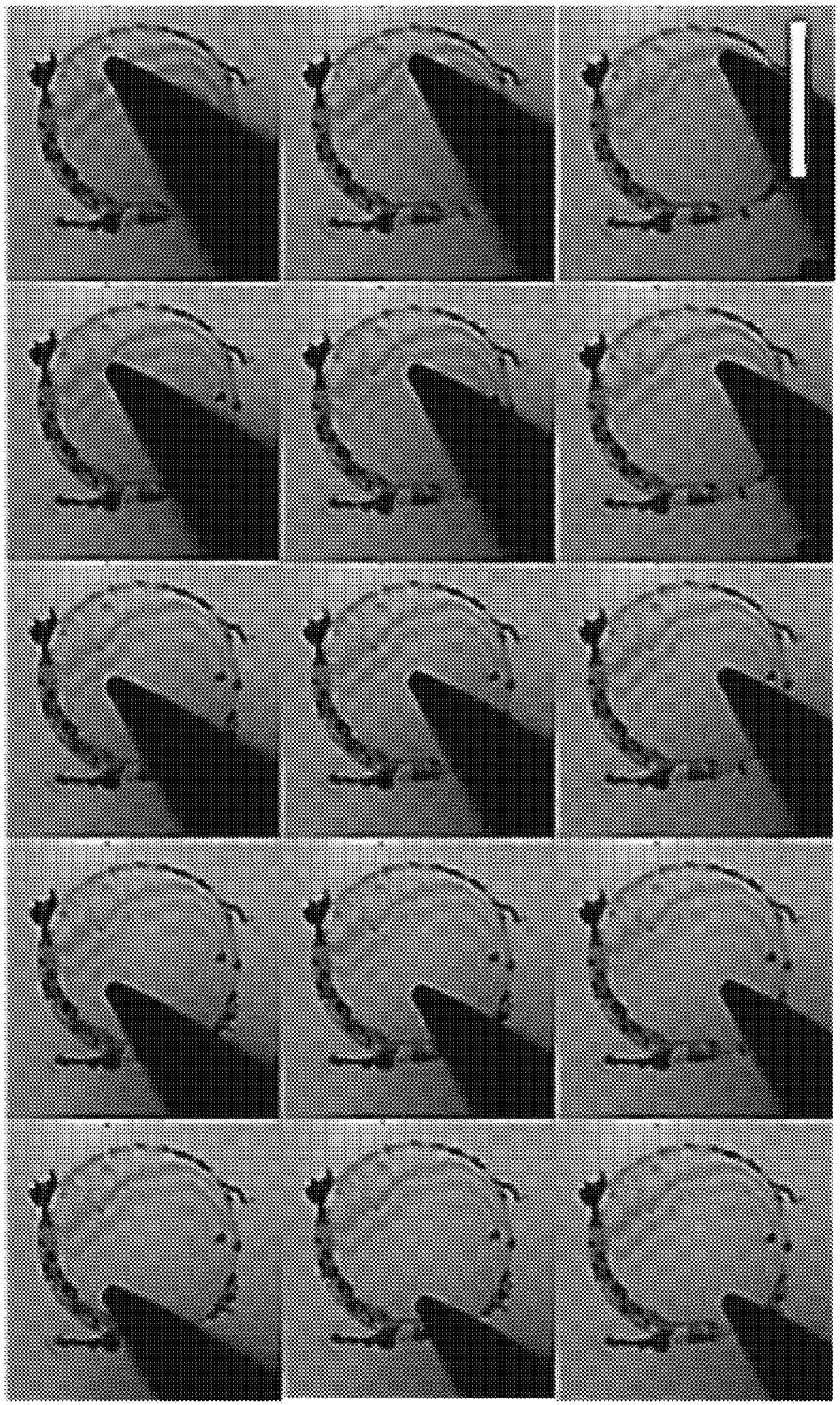
FIG. 50F shows snap shot of the probe testing vertical conductivity of each of the 15 bit for the experiment shown in FIG. 50E. All scale bars represent 200 μm except for those labeled in FIG. 50C.

Interestingly, the long-term memristor behavior of these microparticles, i.e., ON/OFF ratio N, depends on the time they spend in solution (FIG. 13H). Microparticles were sampled with various storage times of 0-63 days and measured the respective N values for a large number of candidates. For each test, N is relatively constant for over 100 cycles of reversible switching (FIG. 40). FIG. 13H plots all the N values measured along with their statistics (see histograms in FIGS. 41A-41G for details) against storage time t (days), which appears to obey the following equation $$N = 2.26 \times 10^4 e^{-0.10t} \quad (2)$$

This yields a half-life of 7 days for the N decay. Therefore, even though these microparticles seem to remain their robustness (or sustained N values) upon subjected to water with a relatively short time, e.g., 8×10 min (see FIG. 40), water and the dissolved oxygen molecules in the solution may gradually permeate into the interior BP/PS through those intrinsic nanopores in the CVD graphene membrane (see, O'Hern, S. C. et al. Selective Molecular Transport thrOugh Intrinsic Defects in a Single Layer of CVD Graphene. *ACS Nano* 6, 10130-10138, doi:10.1021/nn303869m (2012), which is incorporated by reference in its entirety), and react with/etch out the superficial BP irreversibly (see, Island, J. O., Steele, G. A., van der Zant, H. S. J. & Castellanos-Gomez, A. Environmental instability of few-layer black phosphorus. *2d Materials* 2, 6, doi:10.1088/2053-1583/2/1/011002 (2015), and Huang, Y. et al. Interaction of Black Phosphorus with Oxygen and Water. *Chemistry ofMaterials* 28, 8330-8339, doi:10.1021/acs.chemmater.6b03592 (2016), each of which is incorporated by reference in its entirety, and XPS results of the fresh and 63 day microparticle in FIGS. 41A-41G). This is a relatively slow process due to the slow reaction rate (see Island, J. O., Steele, G. A., van der Zant, H. S. J. & Castellanos-Gomez, A. Environmental instability of few-layer black phosphorus. *2d Materials* 2, 6 (2015), which is incorporated by reference in its entirety) and graphene acting as a protective layer, but will eventually lead the breakdown of BP network and thus its capability of charge trapping and resistive switching.

Figure 57A:
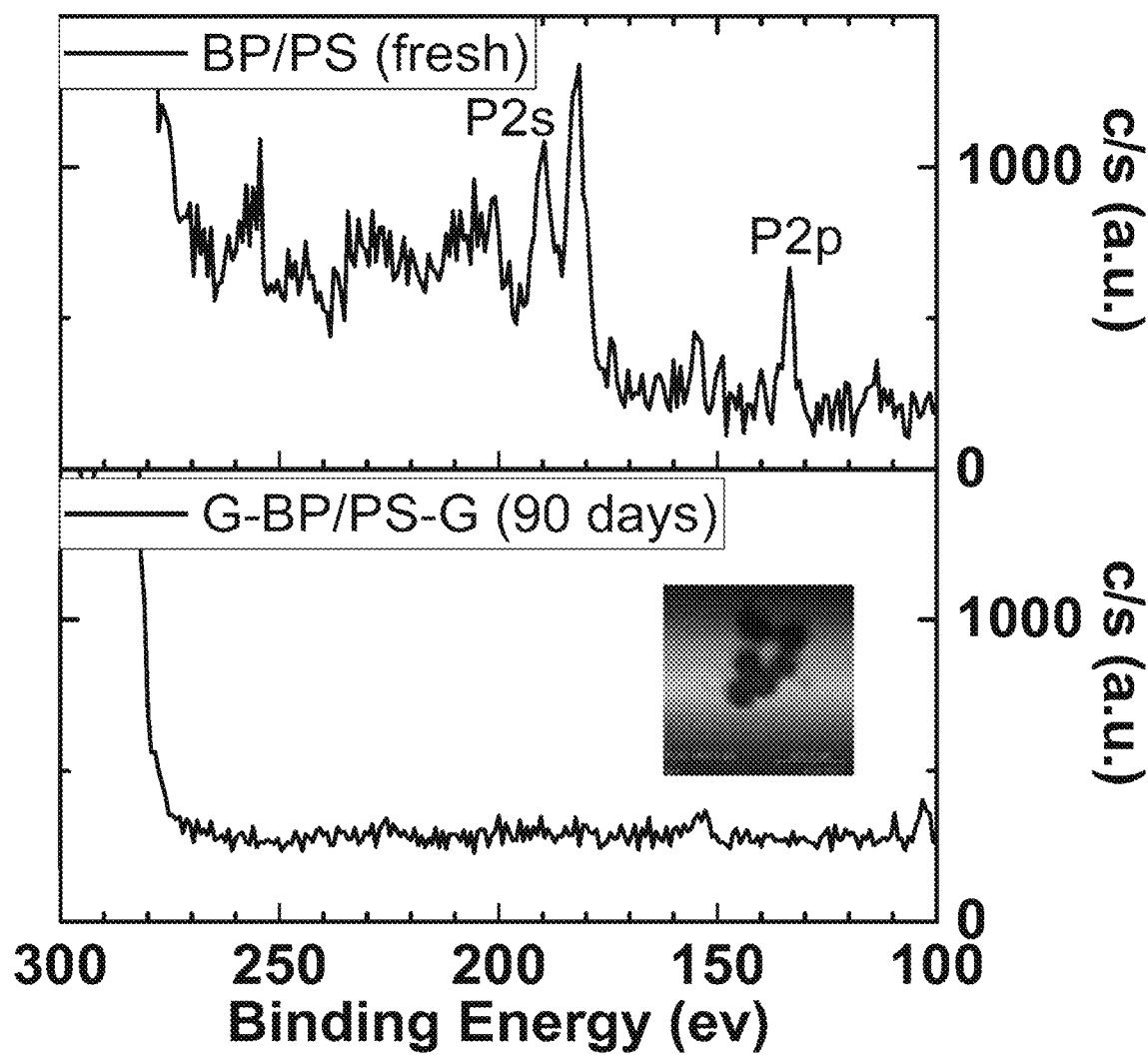
FIG. 57A shows X-ray photoelectron spectroscopy (XPS) spectra of freshly prepared BP/PS, and 90-day G-BP/PS-G microparticles, no phosphorus elements retains in the last sample.
Figure 57B:
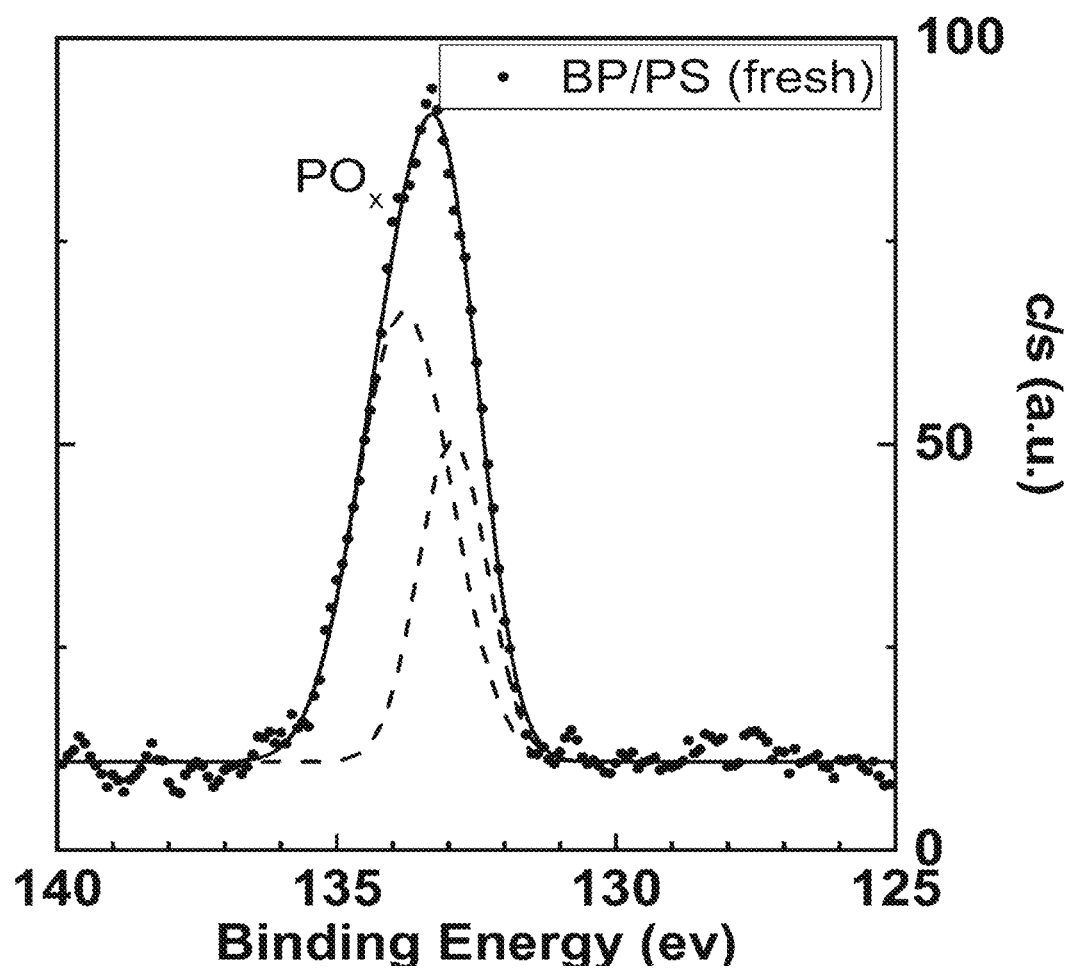
FIG. 57B shows P2p core-level XPS spectra of the freshly prepared BP/PS. Note that changes in elemental composition with a maximum depth of about 10 nm can be documented nondestructively by XPS.
Figure 58:
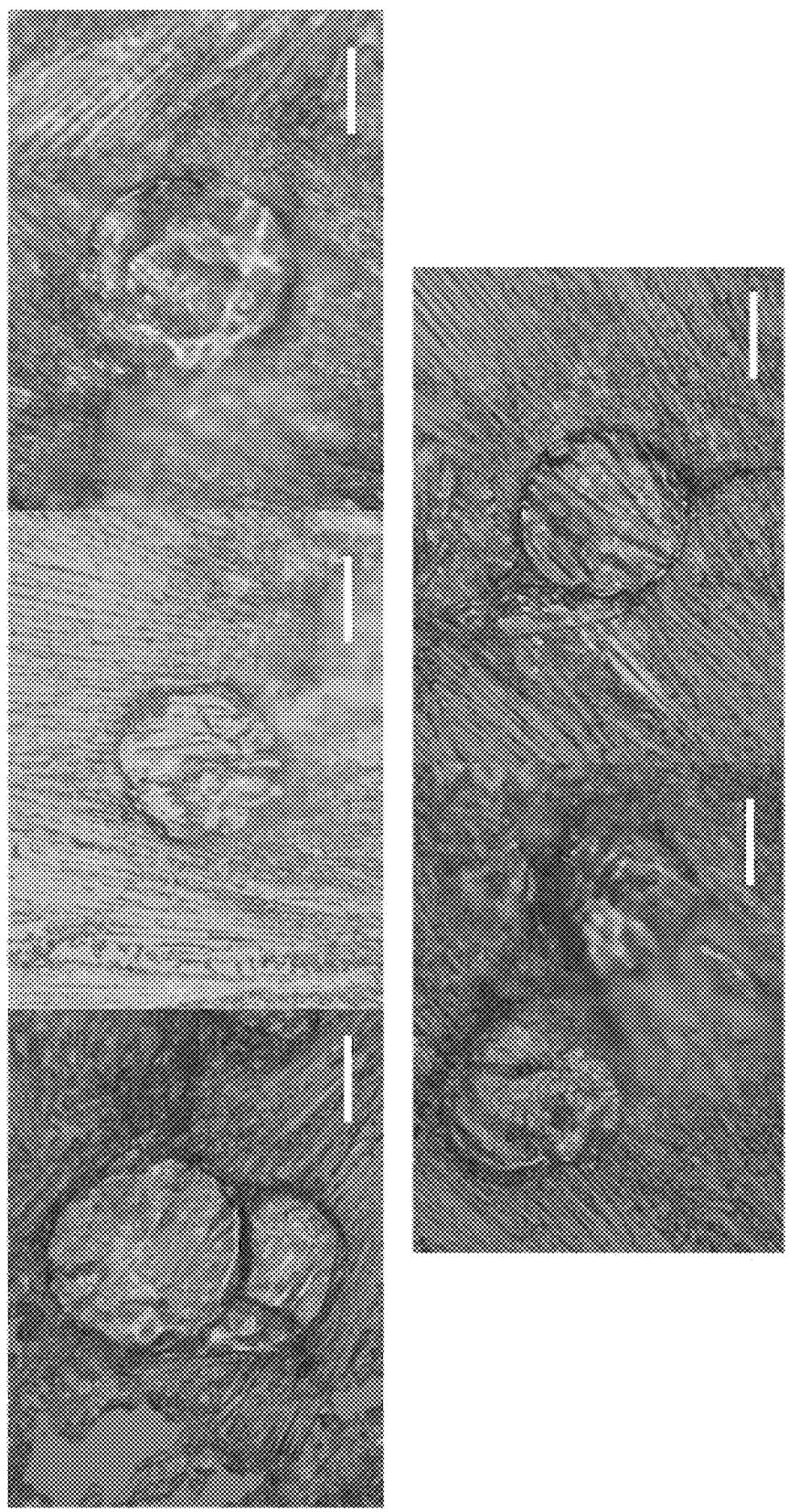
FIG. 58 shows optical microscopy images of G-PS-G microparticles with good circular shapes after an overnight treatment in a pH=1.5 solution of 0.4 M glycine adjusted by concentrated HCl mimicking the mammalian digestive track, scale bars, 100 μm.
Figure 59B:
FIGS. 59A-59D shows aerosolization of the G-PS-G microparticles with an airbrush and their collection.
Figure 59A:
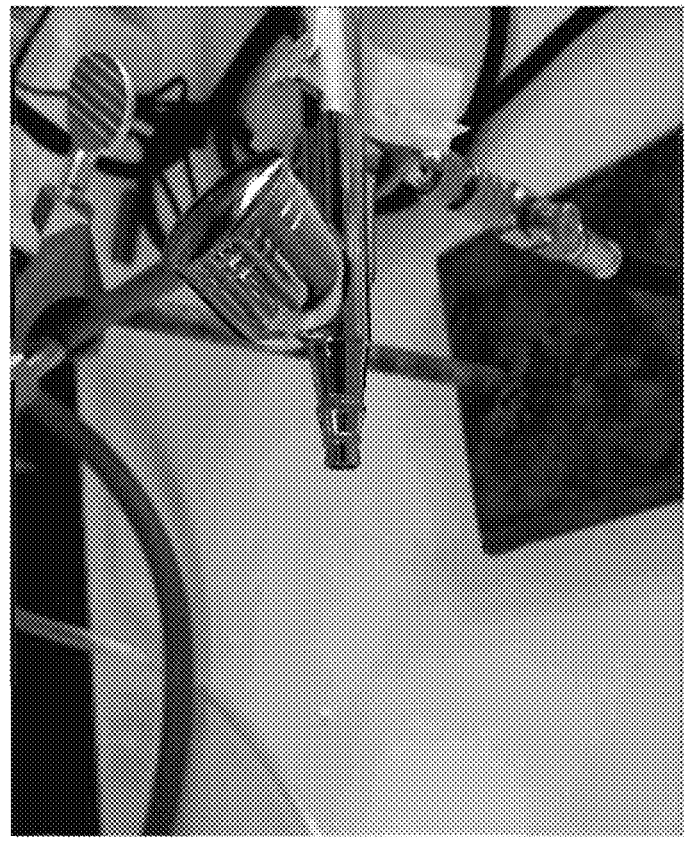
Figure 59D:
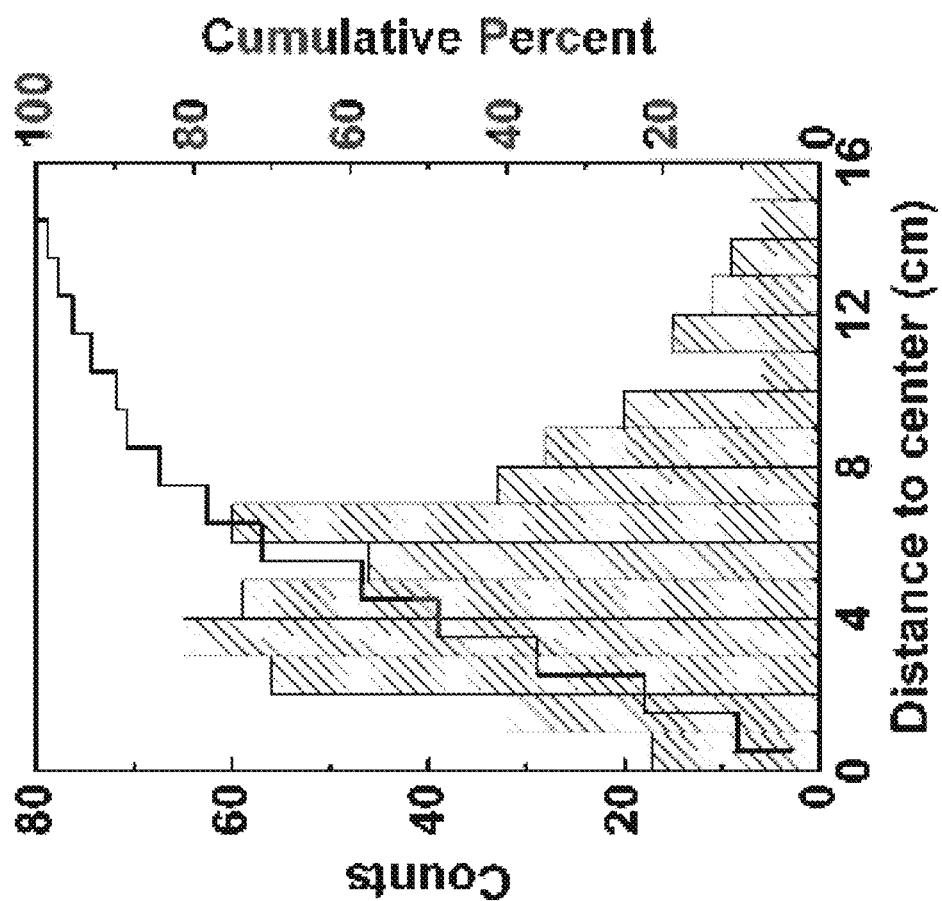
Figure 59C:
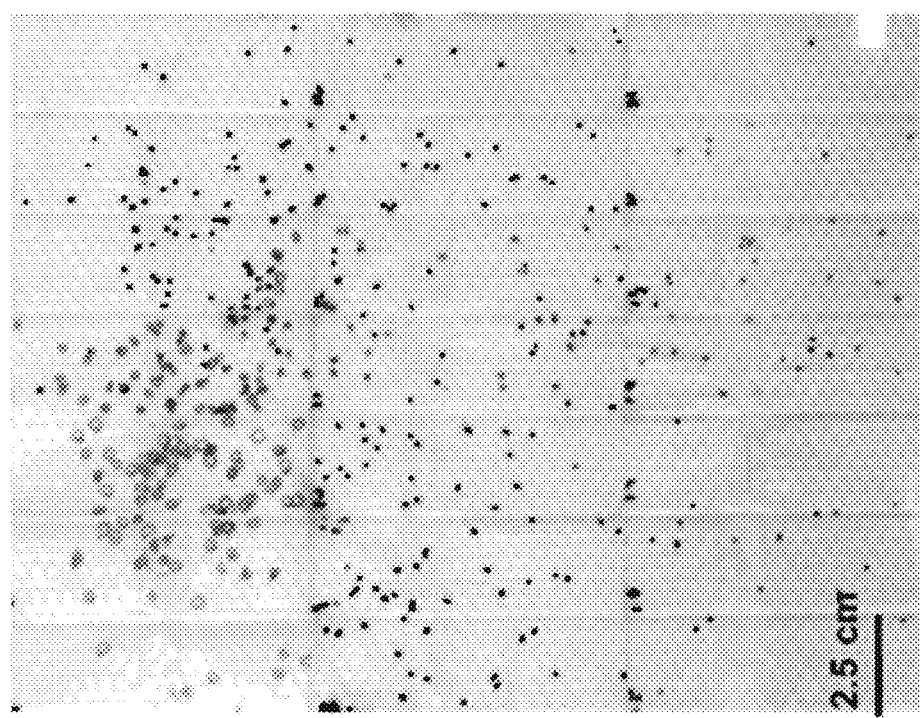
Figure 60:
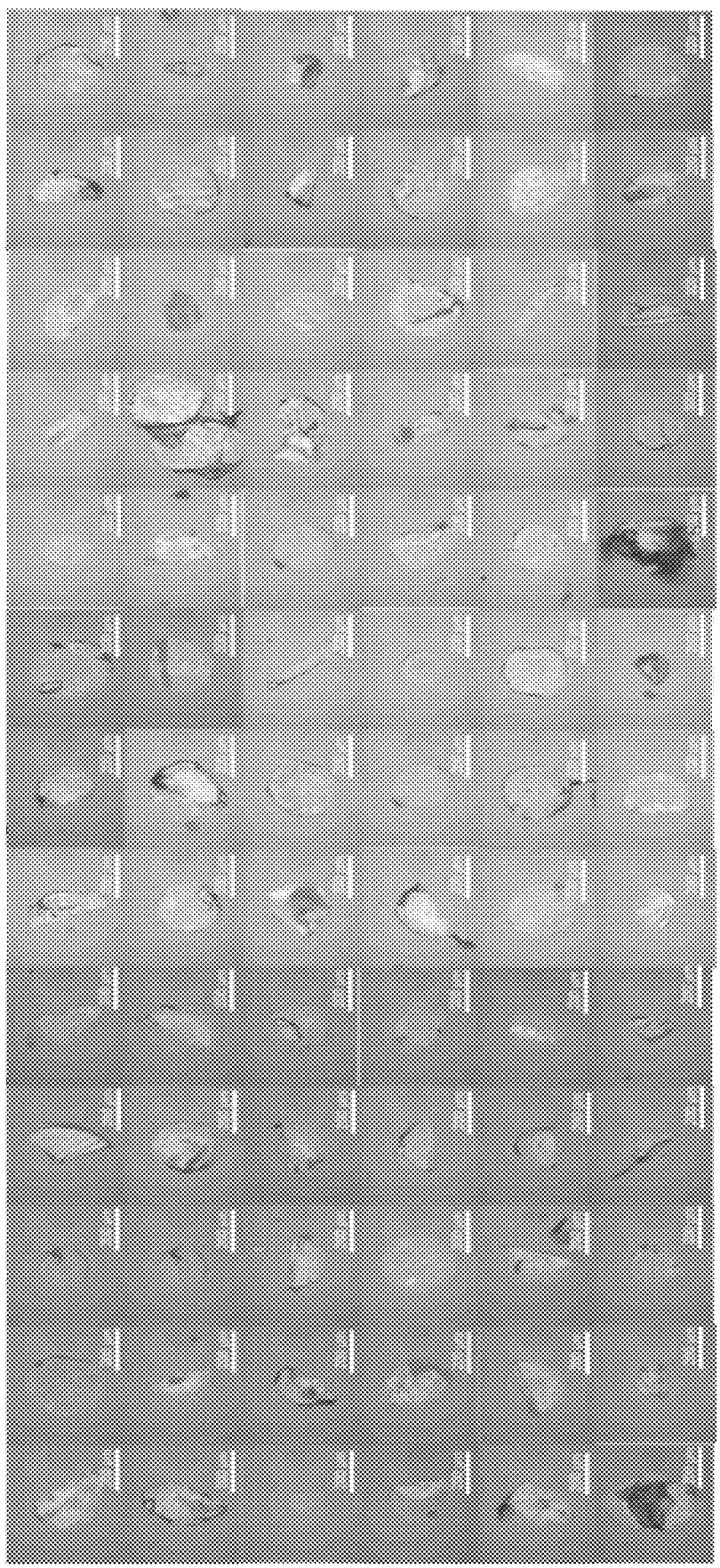
FIG. 60 shows a statistical study of the yield of the G-PS-G microparticles (same as that in FIGS. 24A-24B) after a storage time of 3 weeks (77% yield via natural drying) via aerosolization. 55 particles of 80 are good and the yield is 69%, scale bars, 200 μm.
Figure 61A:
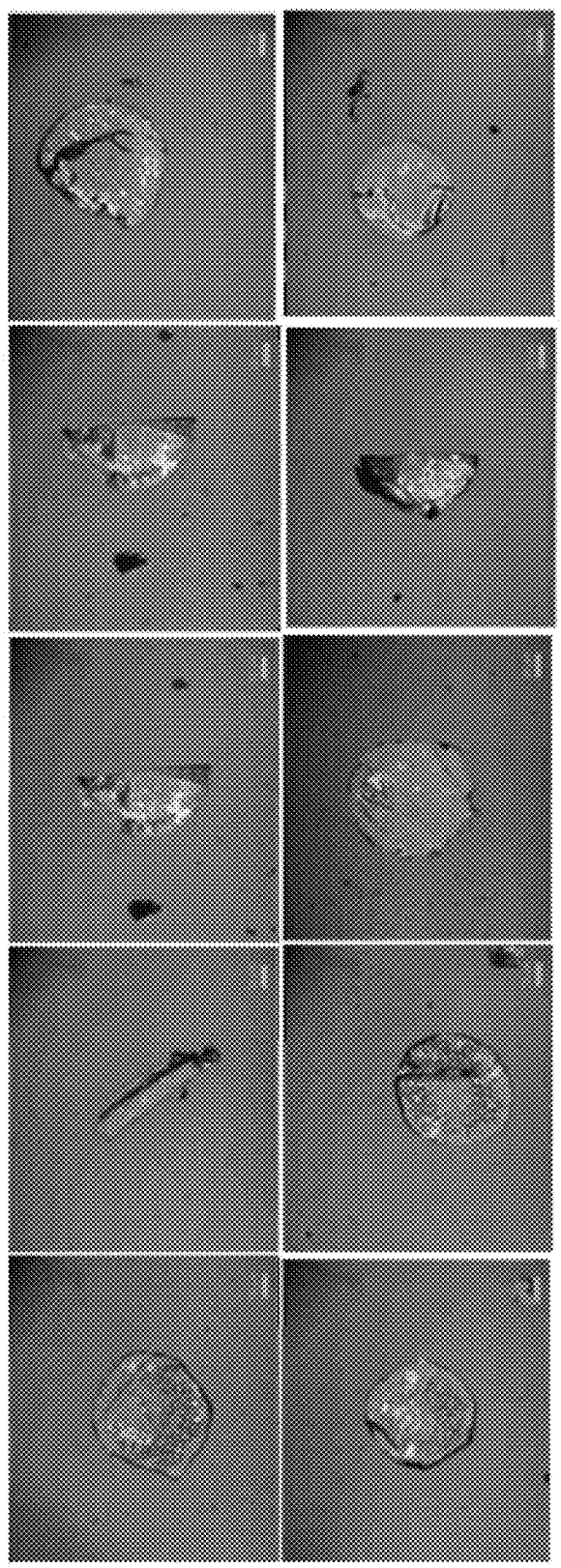
FIG. 61A shows optical images and FIG. 61B shows Raman spectra of 10 Gr-PS-Gr microparticles after airbrush, collected with glass slide. Both folded and unfolded microparticles have graphenes, scale bars, 50 μm.
Figure 61B:
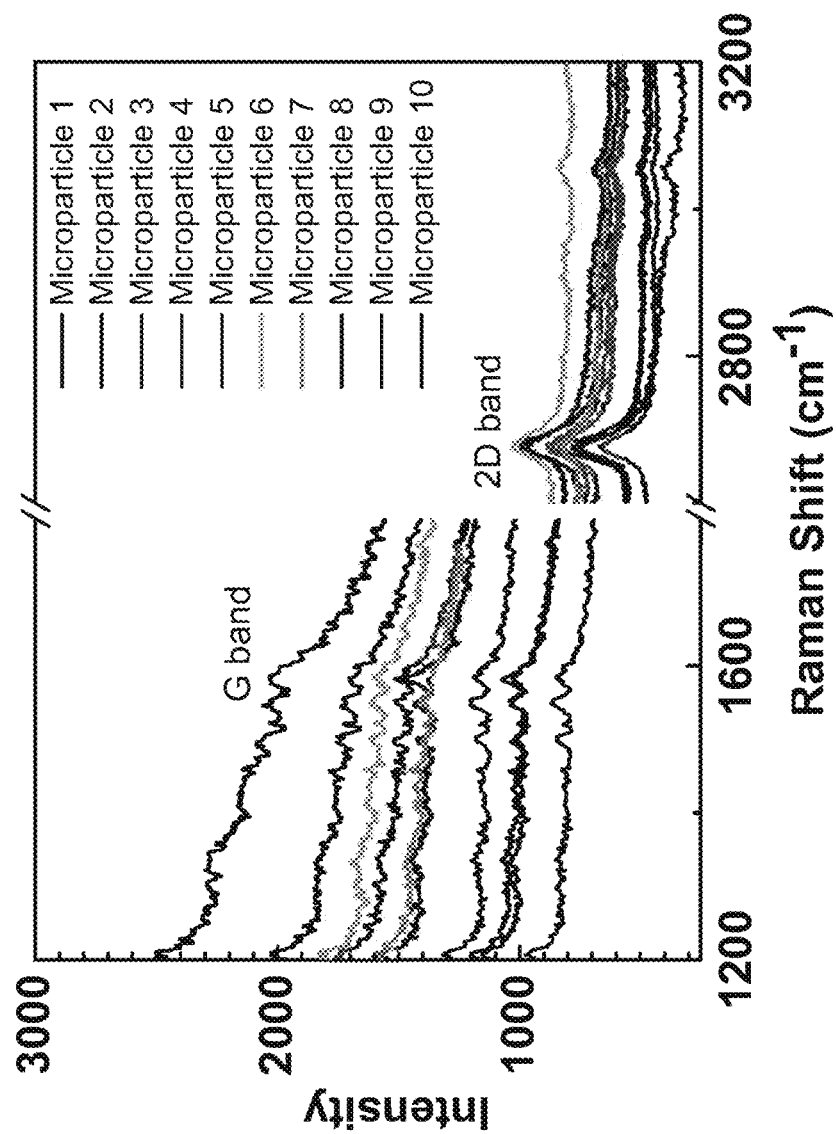

The scaling suggests that dissolved oxygen and/or water may gradually permeate into the BP/PS interior through intrinsic defects and nanopores within the CVD graphene membranes.26 Water and oxygen can react with and etch out superficial BP irreversibly, 27, 28 as evidenced by XPS comparisons between 0 and 90-day microparticles (FIGS. 57A-57B). Using 2D materials with fewer of these porous defects may increase the persistence of N, and therefore information retention. One the other hand, if the 2D surface layer have controlled nanopore size and density, the use of these microparticles could be a valid nano/micro extraction technique to selectively interact and record more sophisticated chemicals in complex environments.

Figure 14C:
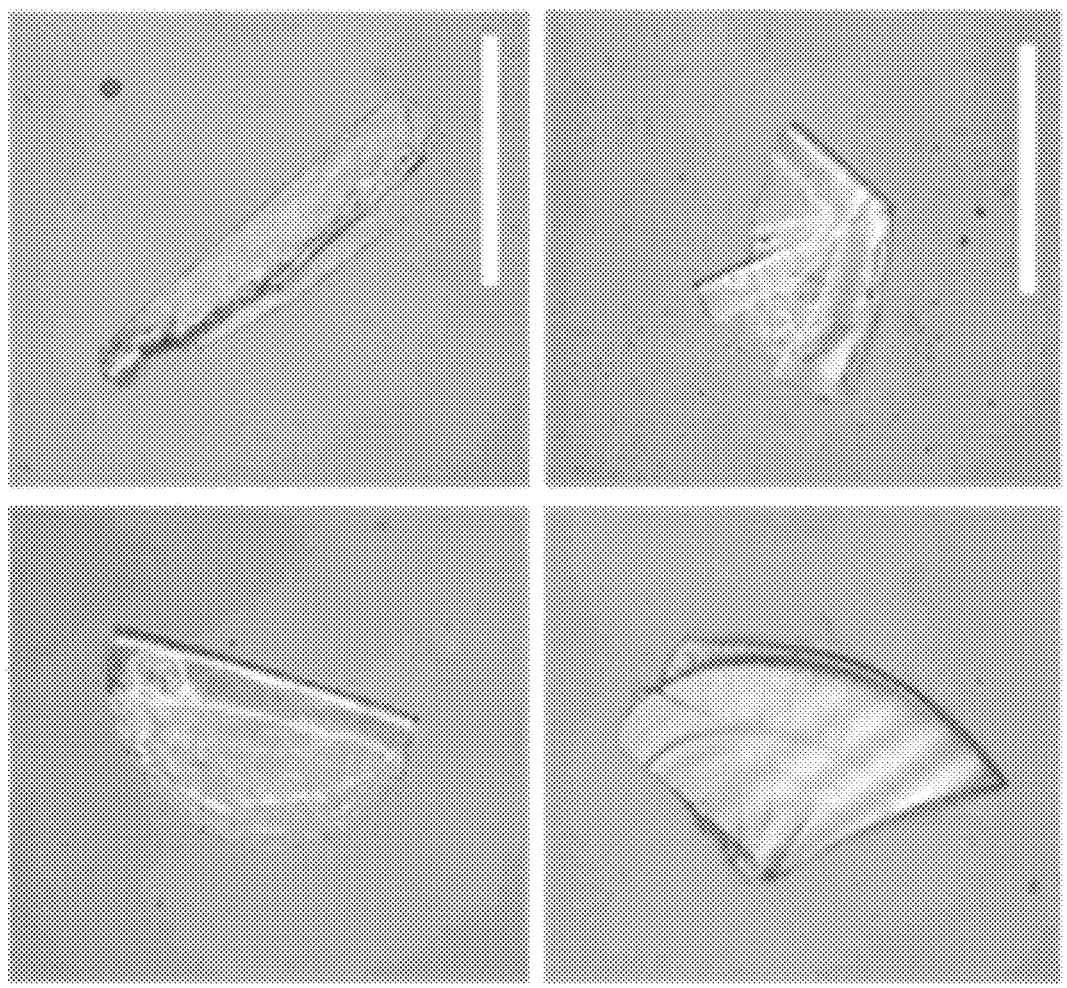
Figure 14D:
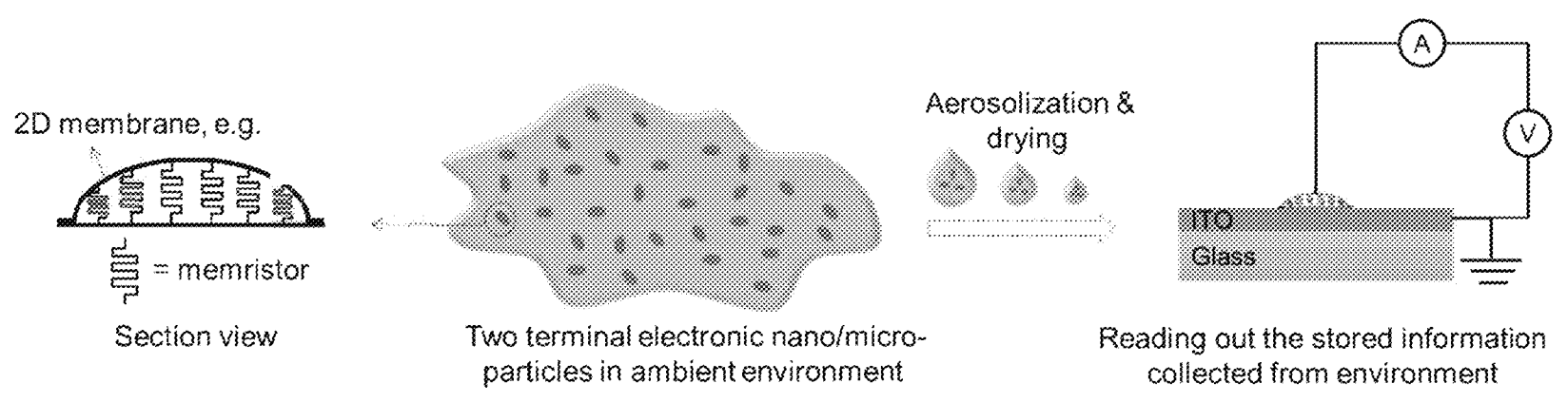
Figure 14E:
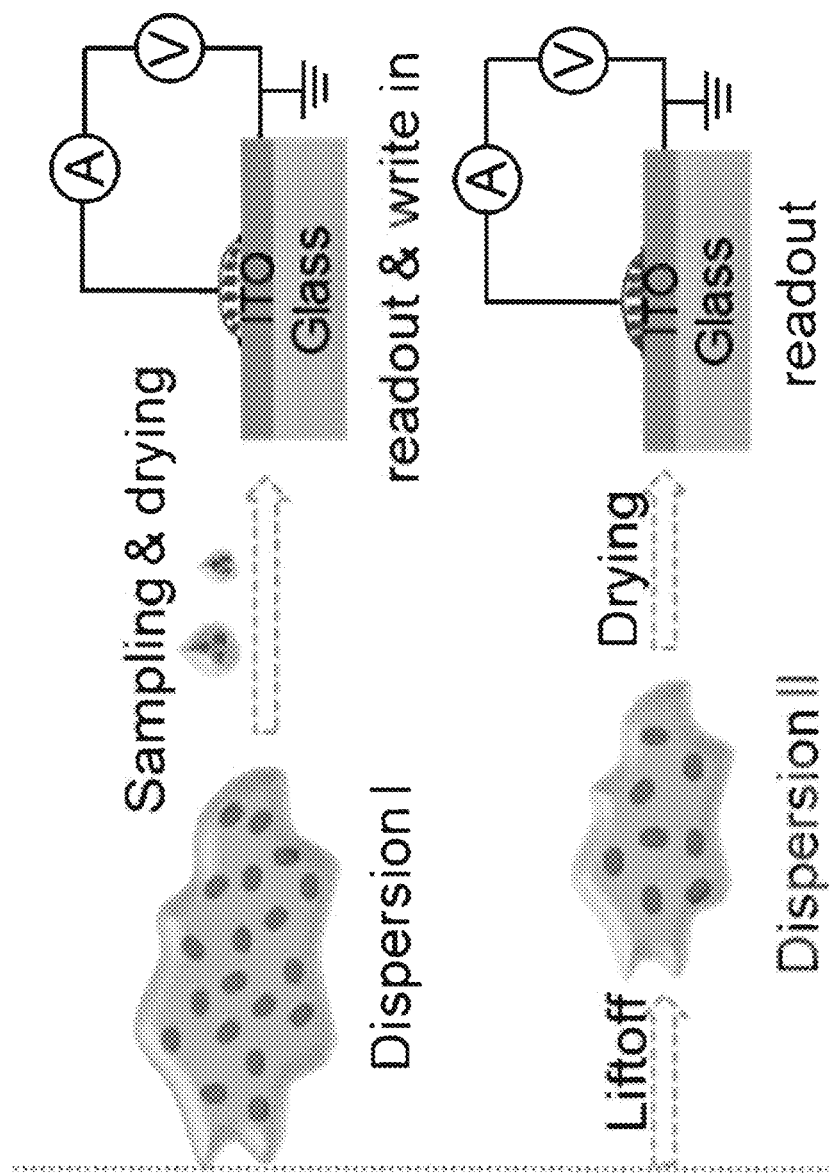
Figure 14F:
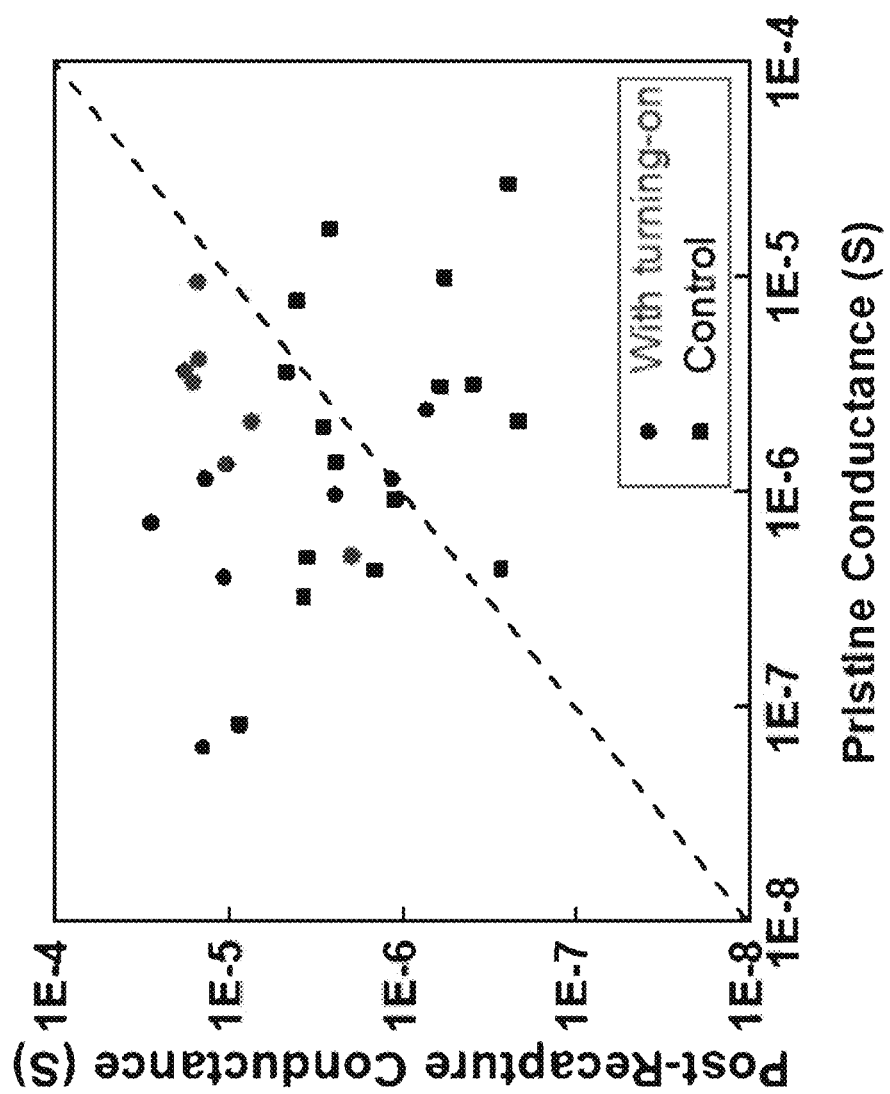
Figure 16A:
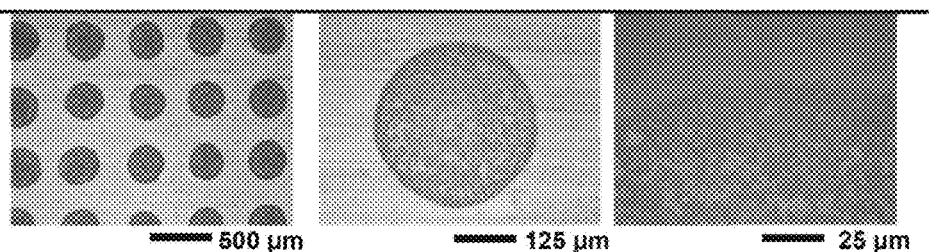
Figure 16B:
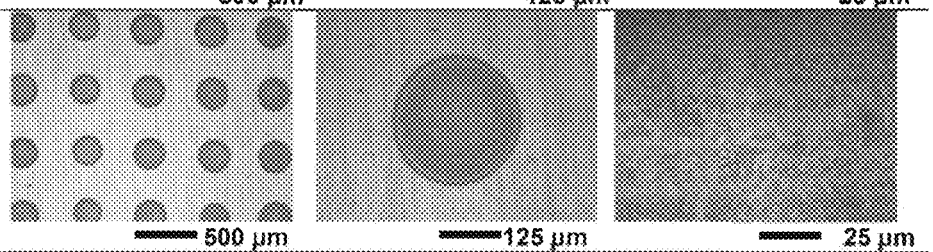
Figure 16C:
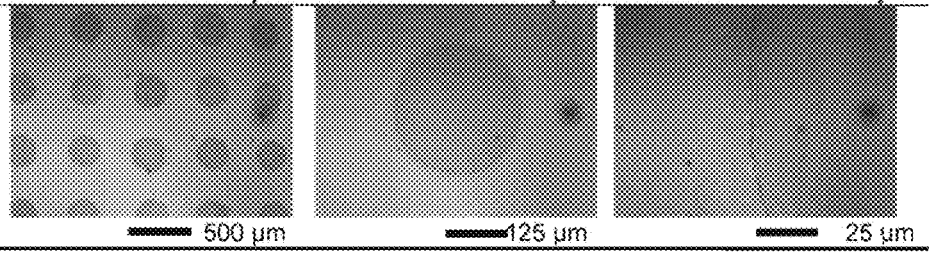
Figure 96A:
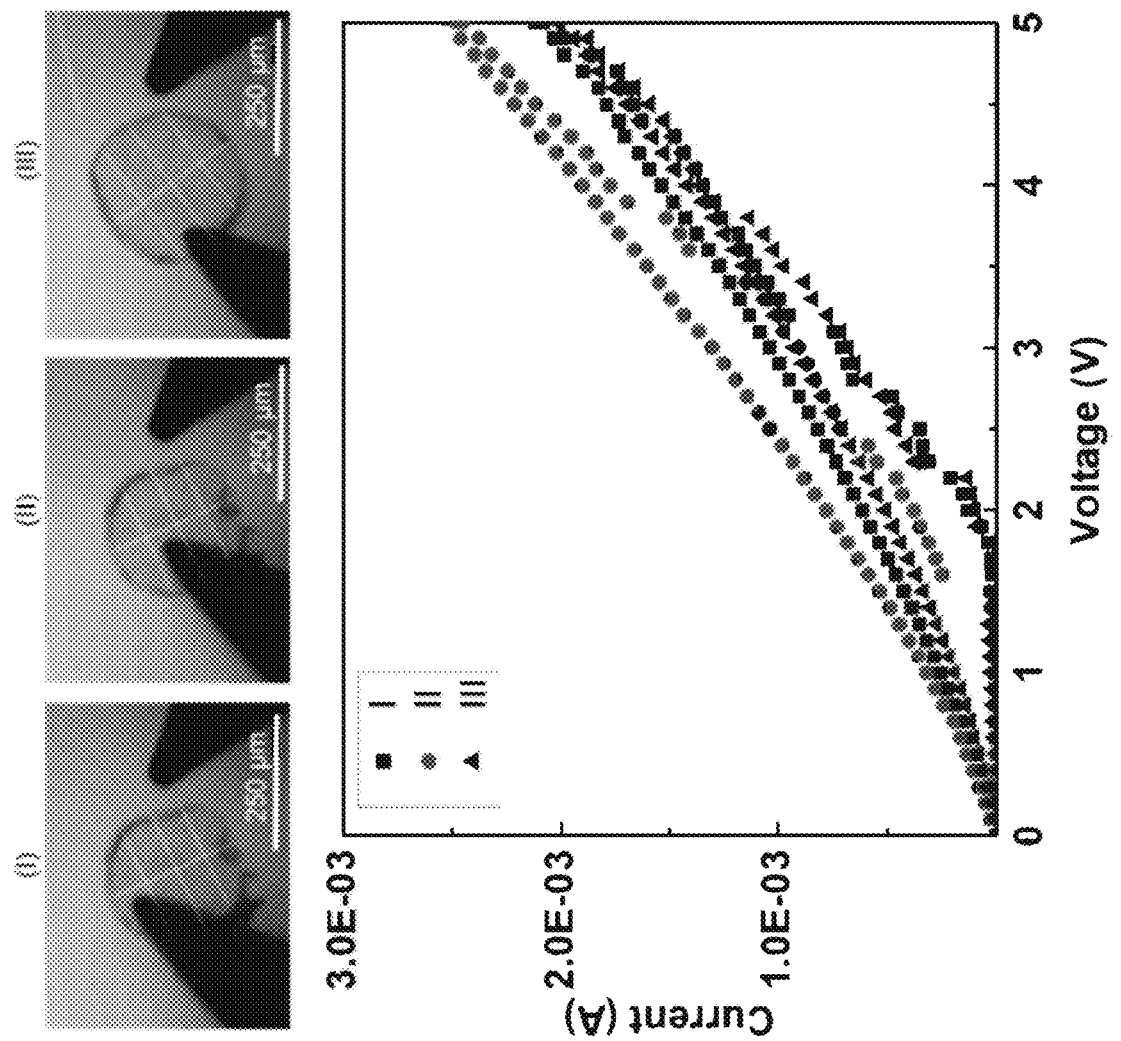
FIG. 96A shows typical I-V curve of G-MoS$_2$/PS-G when applying a voltage sweep from 0→5→0 V in the initial run to switch on, I and II are from the same microparticle but tested at different positons, III is from a different microparticle. The two microparticles are sampled out from their dispersion in ethanol after two months of storage, scale bars, 250 µm.
Figure 96B:
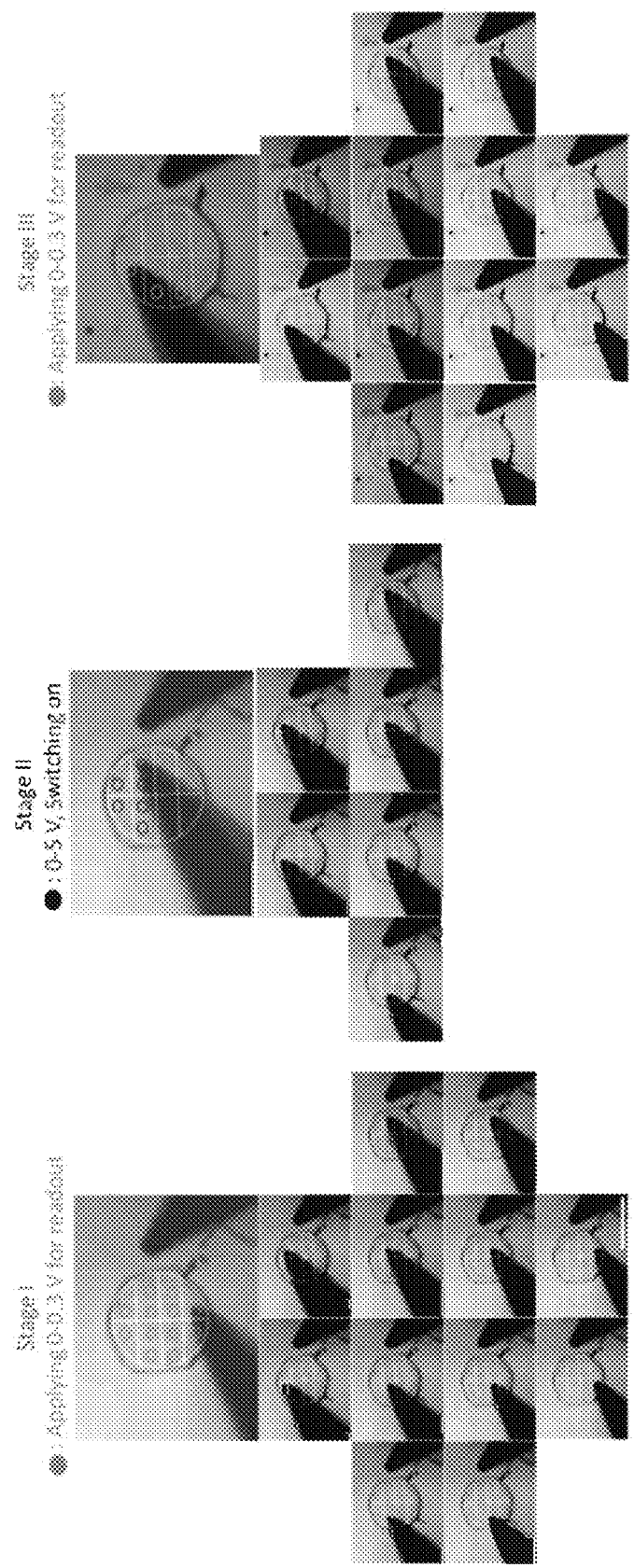
FIG. 96B shows the captured optical images of 12 spots on a typical microparticle at the stage of initial reading out (Stage I, 0-0.15 V), writing in (Stage II, 0-5 V), and the later reading out after liftoff and recapturing (Stage III, 0-0.15 V), scale bar, 250 µm. In the experiment, after sampling and drying the microparticle onto an ITO-coated glass, a grid Was drawn to approximately define 12 or 8 domains on the microparticle approximately to facilitate the use of microprobe for reading out and writing in. The vertical resistance of each domain was first read out by applying a low-voltage sweeping from 0 to 0.15 V without switching on the memresistive element (Stage I). A high voltage sweep was subsequently applied from 0 to 5 V to switch on the six spots labeled with red color, while keeping the other 6 spots unchanged as control (Stage II). Ethanol solvent was further added onto the ITO/glass slides and lift off the microparticles under mechanical agitation. Drying the dispersion and the microparticles will sit on the ITO/glass, and a voltage sweeping can be applied from 0-0.15 V to read out the vertical conductance of the 12 again (Stage III).
Figure 97:
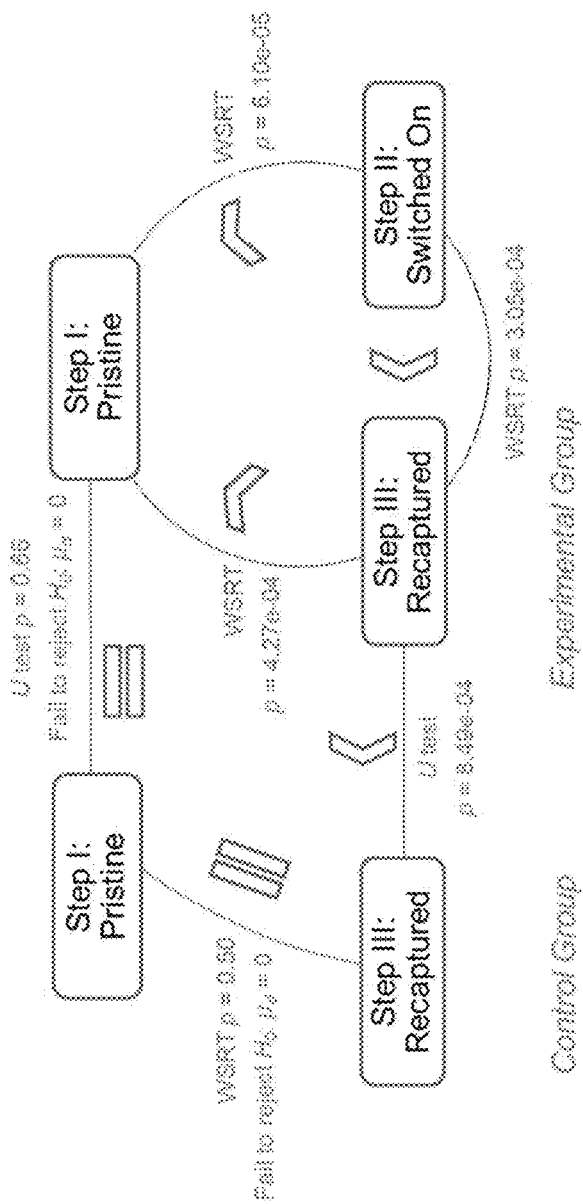
FIG. 97 shows results of Mann-Whitney U-tests and Wilcoxon signed rank tests (WSRT) upon conductance of control and experimental groups at each stage (data points from FIG. 14F in the main text). Statistical analysis confirmed an increase in conductance between Steps I and III for the control group. No overall change is observed in conductance of the control group. Symbols in the figure represent statistical (in) equalities between the two sets of conductance measurements.
Figure 98A:
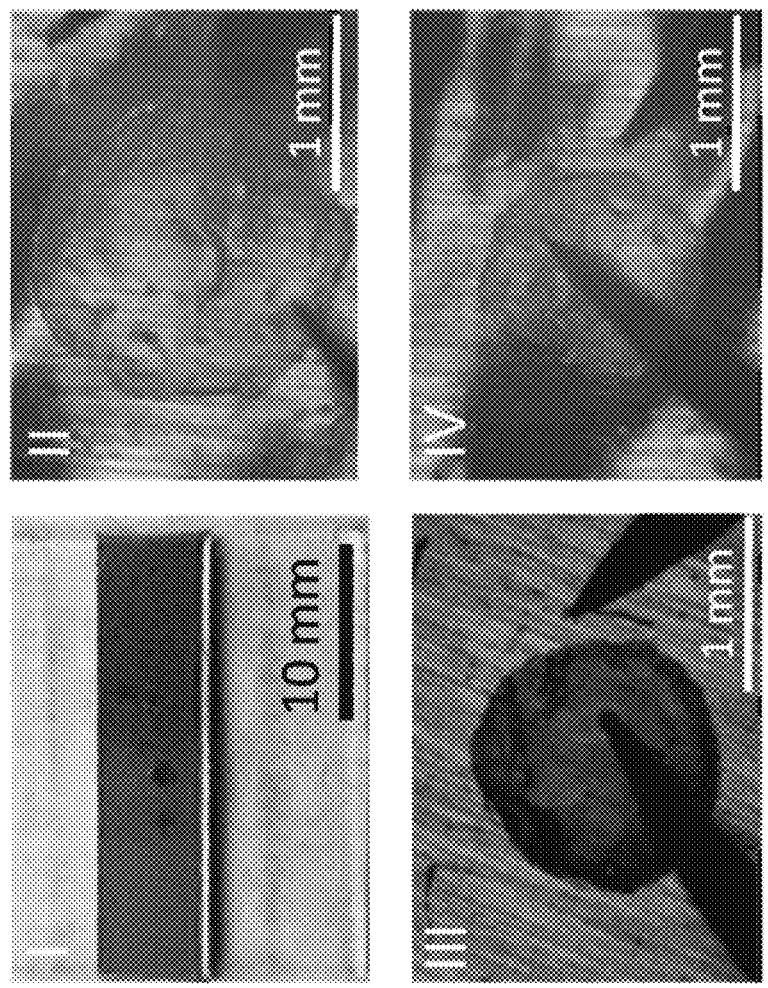
FIG. 98A shows optical images of the collected G-GOx (1 wt %)/PS-G particles on copper foil tape.
Figure 98B:
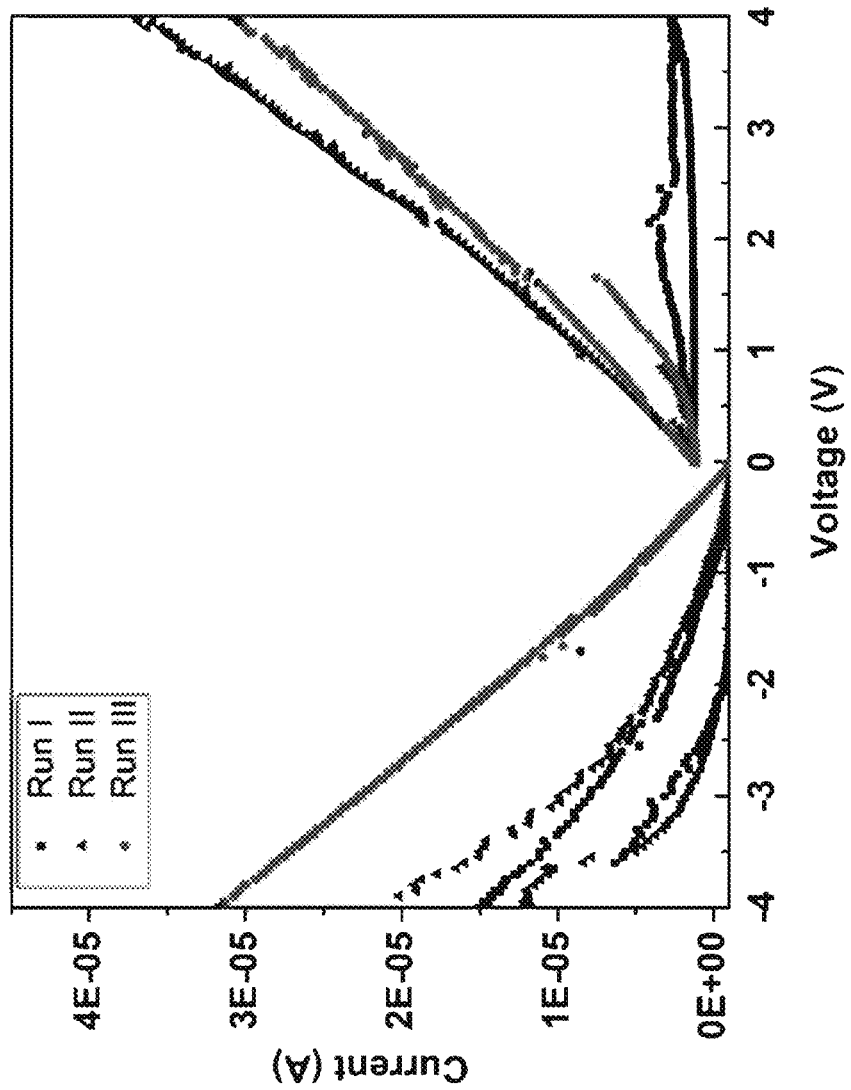
FIGS. 98B-98C show the I-V characteristics of G-GOx (1 wt %)/PS-G particles I and II in FIG. 98A on the conductive copper surface, respectively.
Figure 98C:
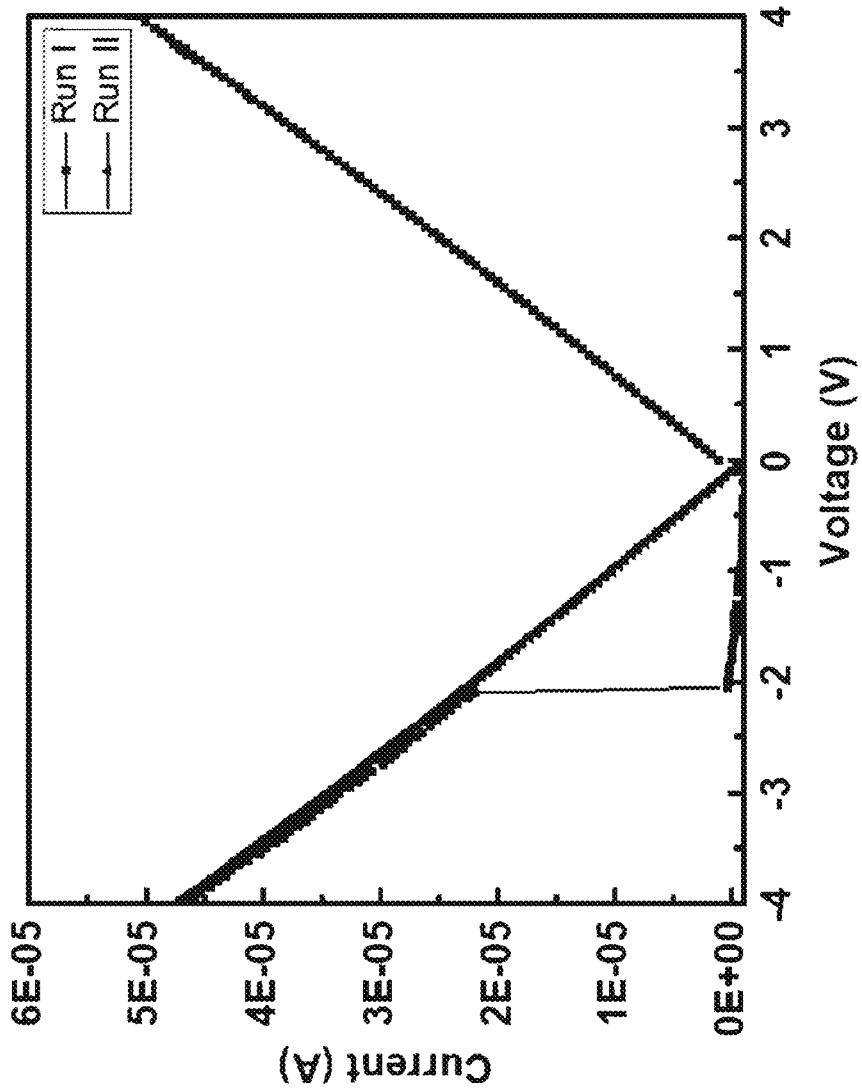

Digital information can be electrically written to the microparticles by lifting them off as freely dispersing colloids into a solvent like ethanol and then recapturing them with a subsequent read out the written information (FIG. 14E). G-$MoS_2$ (0.07 wt %)/PS-G was used for this demonstration because it is relatively easy to turn on with a voltage about 2.0 V in the initial run even after a storage time of 2 months (FIG. 96A). Almost an order of conductance increase was observed when comparing 14 domains with turning-on treatment before and after liftoff from three different G-MoS$_2$/PS-G microparticles (FIG. 14F and more details in FIGS. 96A-96B). The Wilcoxon signed rank test upon initial and final conductance data confirms such an increase with a p-value of 0.0004. On the contrary, the same analysis of the results from 25 control domains without turning-on treatment is failed with a p-value of 0.2216, meaning a statistically insignificant change (FIG. 97). These experiments support the potential of these microparticles to utilize internal or external power to generate or capture information, storing it for a duration in the memristor for read-out at a later time.

Figure 51B:
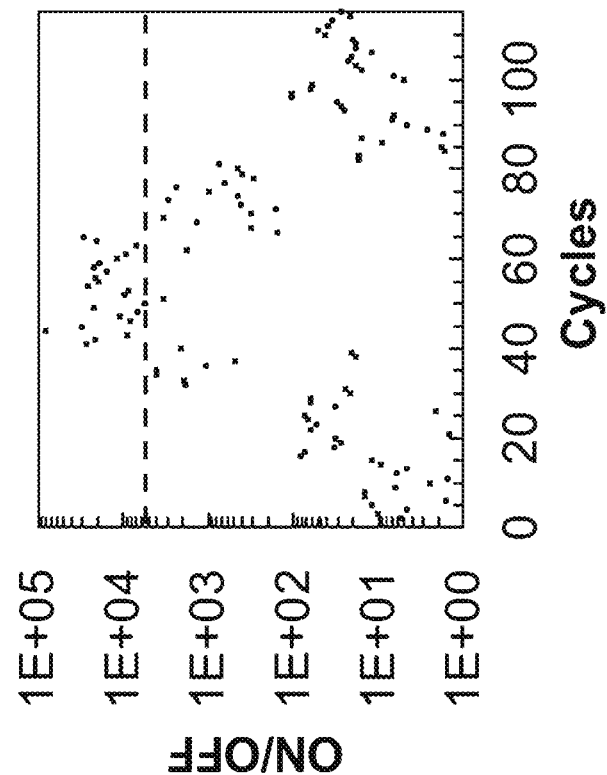
FIG. 51B shows measured Gr-BP/PS-Gr vertical conductivity ON/OFF ratios at 0.2 V querying source-drain voltage for 100 cycles. A slow pre-conditioning process can be found for the first 20 cycles, a previously unidentified trait unique for this 2D-material-polymer composite system, presumably due to the large vertical distance the composite covers (1 μm). The excellent ON/OFF ratio maintains above $1.0 \times 10^3$ from cycle 40 to cycle 80 and falls off afterwards. This could due to the worn-out graphene electrodes due to repeated CV scanning. The average ON/OFF ratio across all 100 cycles tested is marked with the red dotted line, and has a numerical value of 4160.
Figure 51A:
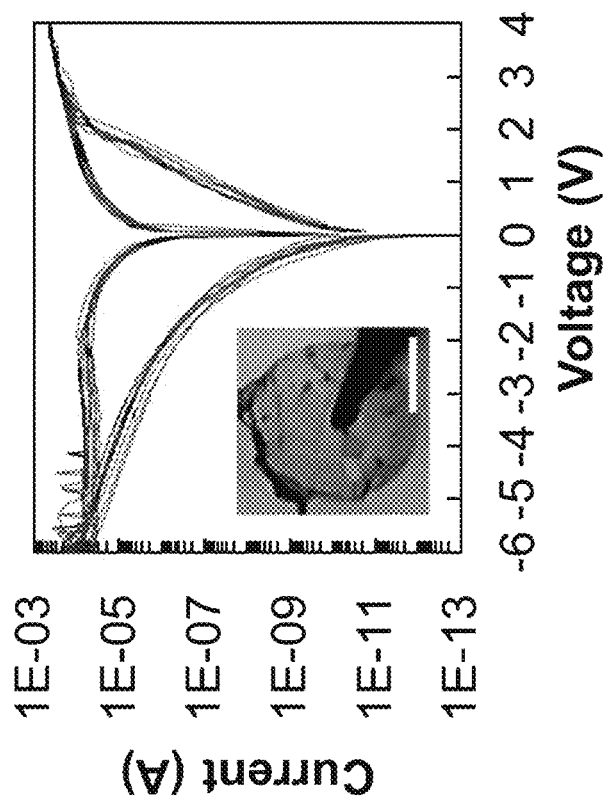
FIG. 51A shows I-V characteristics of an example Gr-BP/PS-Gr microparticle stored in ethanol/water (4:1) solution for 10 days. Vertical conductivity is measured following a 0 V→4V→0V then 0V→–6V→0V procedure for 100 consecutive cycles (with virtually no intermittence between each cycle). Presented here are I-V characteristics of cycle 41 through 50. Insets shows the optical image of the microparticle tested, with scale bar marking 100 μm.
Figure 52B:
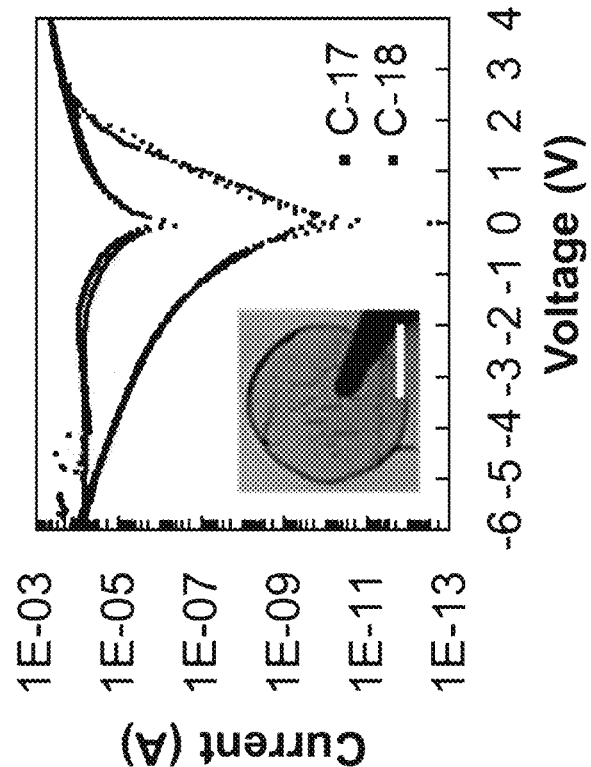
FIGS. 52A-52C show I-V characteristics of three Gr-BP/PS-Gr microparticles submerged in ethanol/water (4:1) solution for 20 days. Vertical conductivity hysteresis can be observed and ON/OFF ratios over $10^4$ can be found in all samples tested. Each CV scan follows a 0V→4V→0V then 0V→–6V→0V pre-programmed procedure where a larger negative voltage (–6V) is applied to ensure a fully switched-OFF conductivity state. Each plots shows three sets of consecutive cycles, with the cycle number labeled by the data. Insets shows the optical image of the microparticle tested, with scale bar marking 100 μm.
Figure 52A:
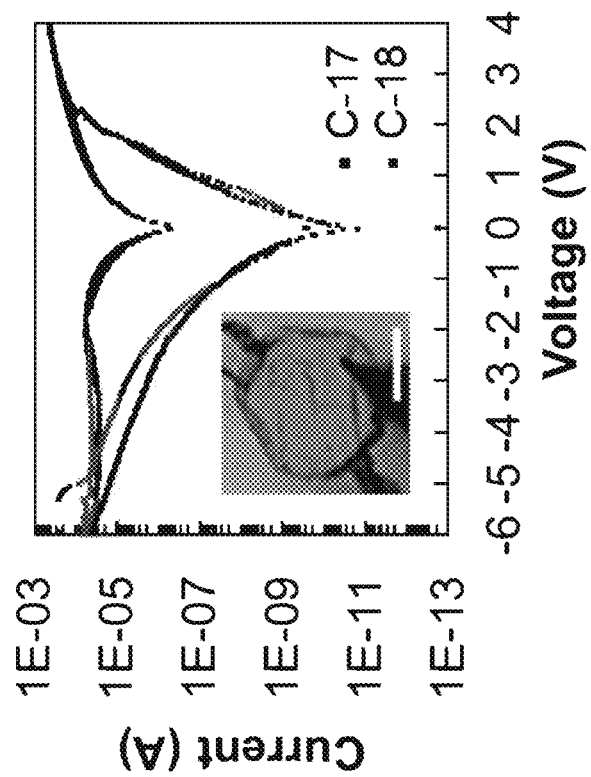
Figure 52C:
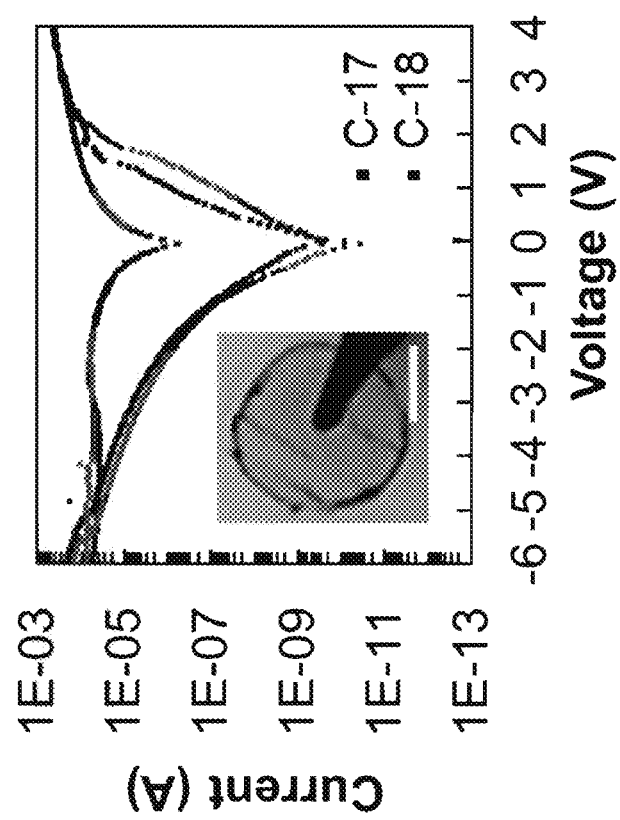
Figure 53C:
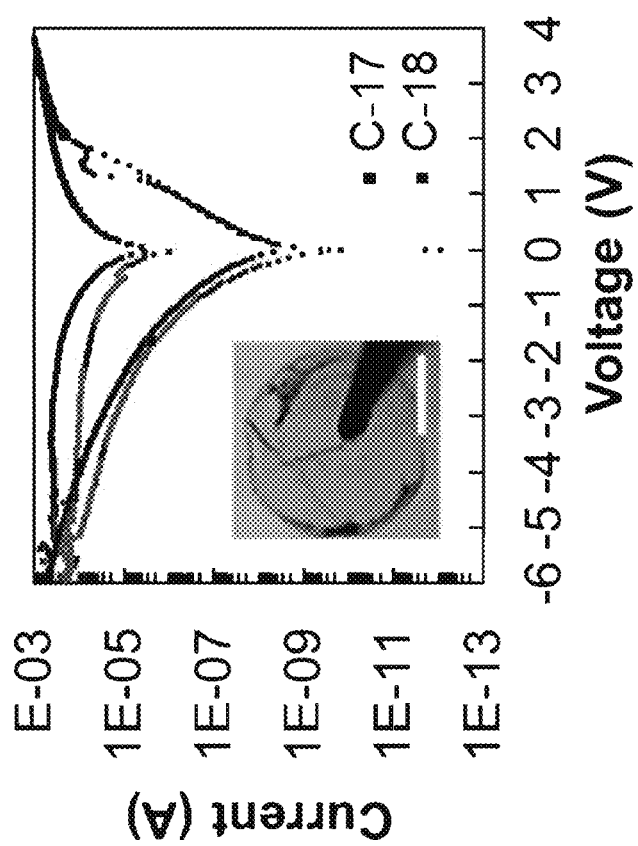
Figure 54B:
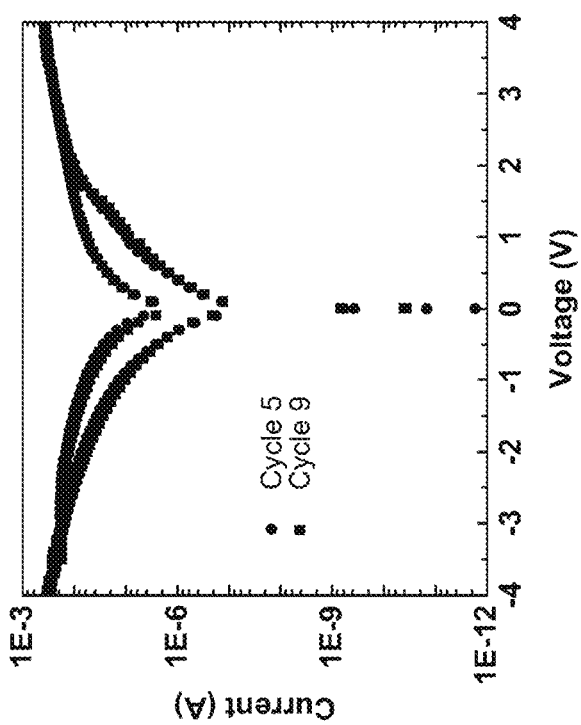
FIGS. 54A-54C show I-V characteristics of three Gr-BP/PS-Gr microparticles submerged in ethanol/water (4:1) solution for 63 days.
Figure 54A:
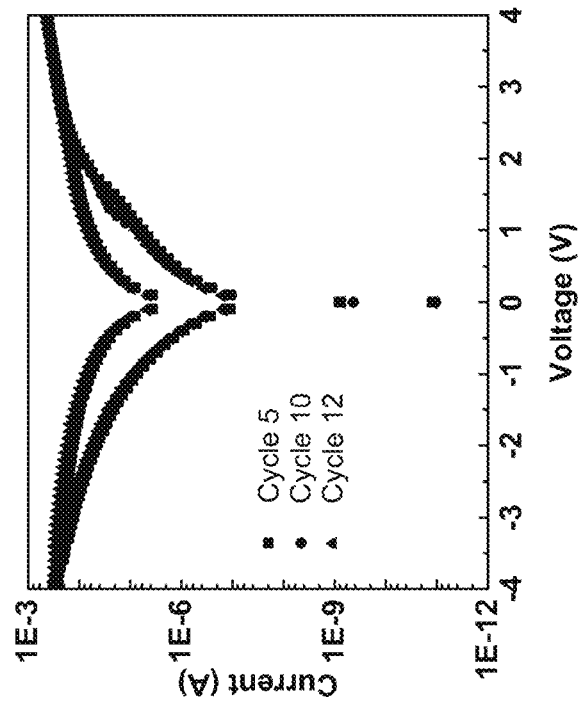
Figure 54C:
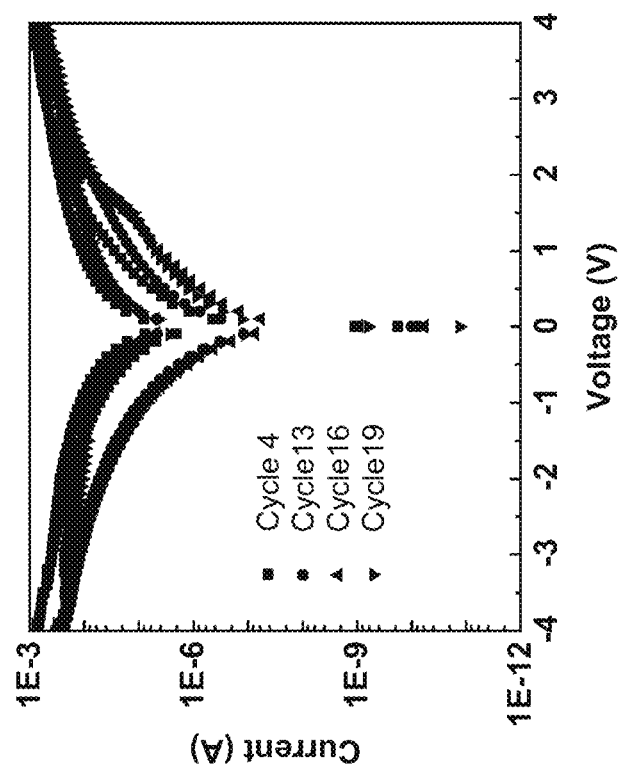
Figure 55:
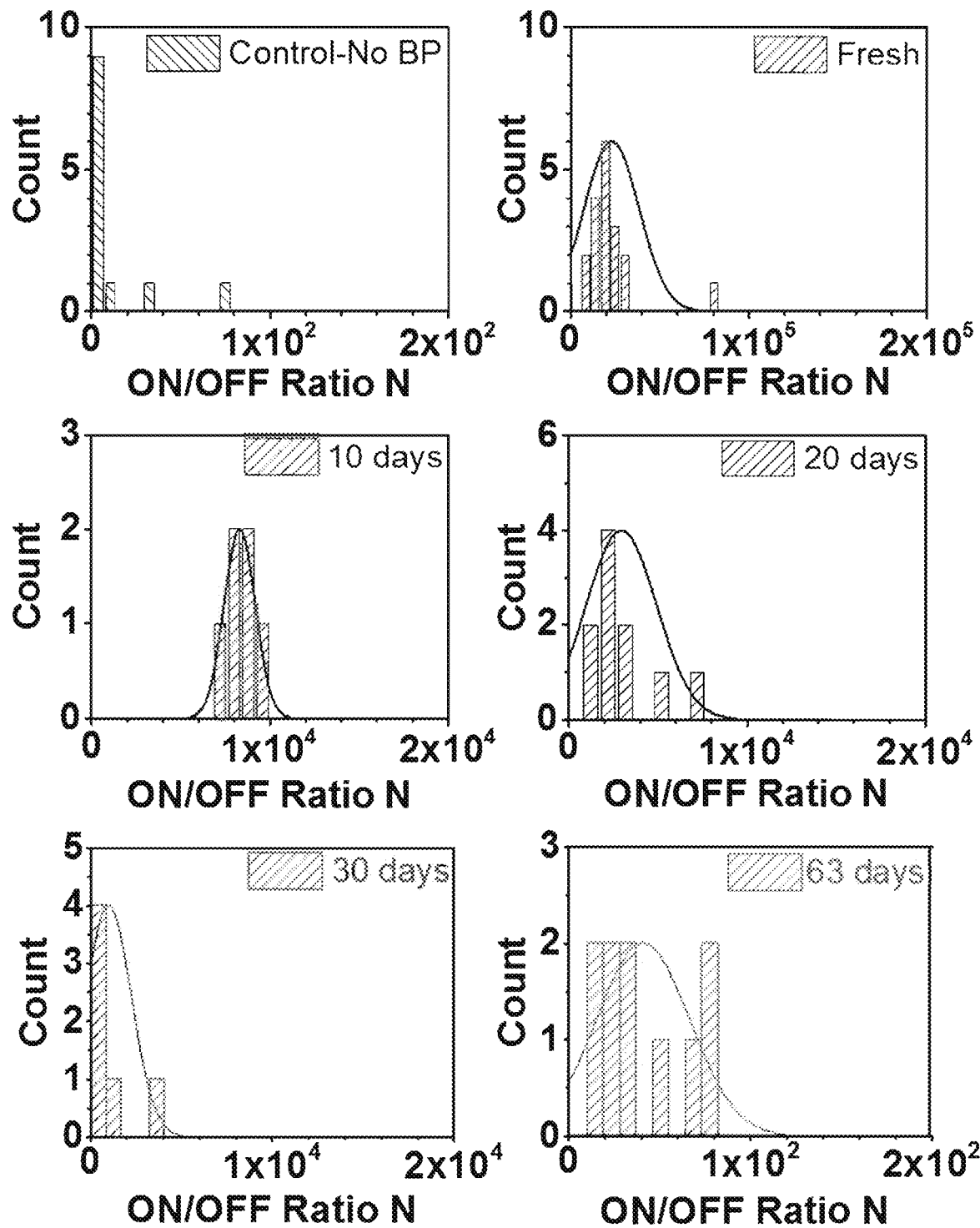
FIG. 55 shows histograms of the ON/OFF ratio N values for various G-PS-G (Control-No BP) and Gr-BP/PS-Gr microparticles sampled out at different time periods of 0 (fresh), 10, 20, 30, and 63 days.
Figure 56:
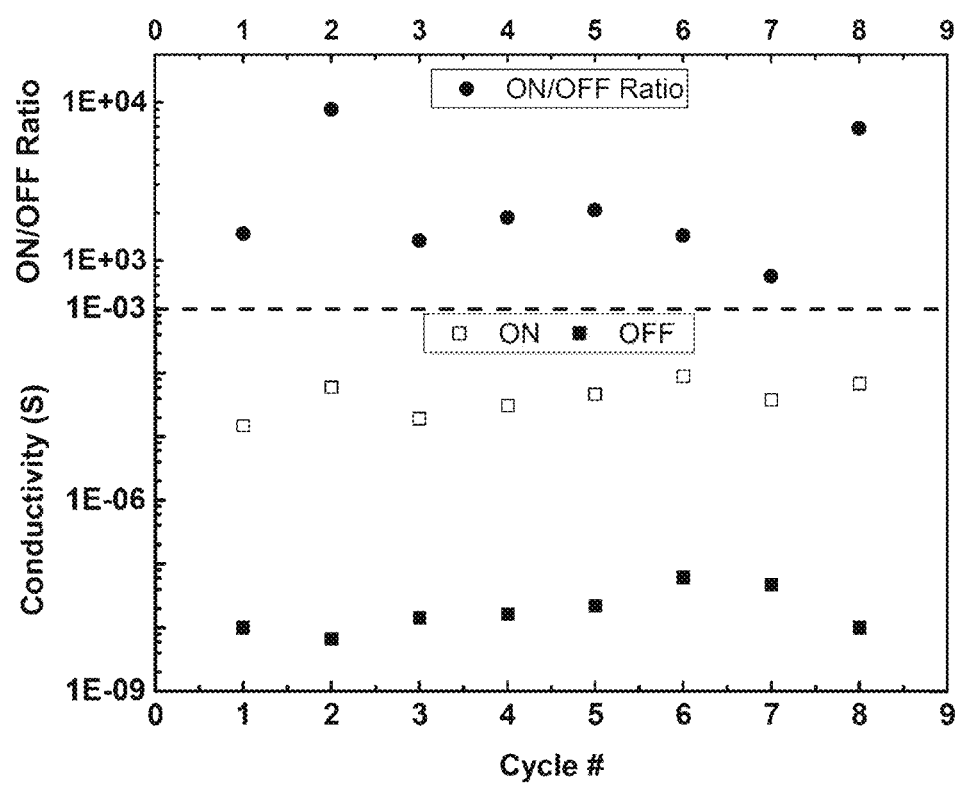
FIG. 56 shows the effect on the successive water treatment on the ON/OFF ratio of G-BP/PS-G microparticles (20 days) for 8 cycles, for each cycle, the interrogated microparticle was immersed in $H_2O$ for 10 mins before drying under vacuum for the next cycle of testing. A 1000+ON/OFF ratio (N) remains during these 8 cycles.

The particulate nature of these two-terminal devices renders them the property of fluid dispersion, and therefore convective mobility, which allows one to bring electronics to otherwise inaccessible locations. Applications include "aerosolizable electronics" as probes for remote sensing and recording of environmental information from unconventional spaces. To test the ability of aerosolization of G-PS-G particles, an airbrush at 1.7 atm (FIGS. 86A-86D) was loaded with a 10-mL dispersion of microparticles and sprayed over 30 cm onto a target collector (FIGS. 86A and 59A-59D). A microscope was used to study a sampling of collected microparticles for changes in morphology and deposited location relative to the ejection centerline. FIG. 86B presents the positions of 460 collected microparticles with 80% located isotropically within a distance of 8 cm from this centerline (FIG. 59D). Microparticles appear flexible with some collected samples folded into various 3D structures during the nebulization process without fracture, and the survive yield is approximately 10% lower than that by evaporative drying (FIG. 60). Notably, the graphene surfaces remain intact upon capture (FIGS. 61A-61B), preserving the integrity of the device for the further write-in or read-out electrically. The use of adhesive tapes, such as a flexible paper tape or conductive copper foil tape that can easily transfer the dried particles out from its initial sitting surface onto the tape (FIG. 86A). If a copper foil tape is used, in the digital information of the particles can be also read out or written using probes (FIGS. 98A-98C).

The unique capability of the autoperforation technology to engineer the surface chemical functionalities and the interior filler composition of the microparticles can further bring the two-terminal electronic devices desirable functions. For example, possessing capture sites to react specific impurity metals and ions in water samples and soil matrices, respectively, and the good recoverability (FIG. 86B). Specifically, graphene-based microparticles with surface amine groups can interact with citrate-coated gold nanoparticles in water (~6.0E+12 particles/mL, 10 nm) (FIG. 86B, a), and those with surface nitrilotriacetic acids (NTA ligands) can capture $Zn^{2+}$ ions (an essential nutrient for plant growth[29], 10 mM), while traversing the soil bed (FIG. 86B, b). Such interactions change the electrical states of the two-terminal devices, i.e., the amine ones show more than one order of the surface conductance increase after bonding gold nanoparticles (FIG. 86C, blue triangles), while the NTA ones have two orders of magnitude reduction upon $Zn^{2+}$ capture (FIG. 86C, red triangles). Raman spectroscopy confirms the two bonding events with an observed redshift of the graphene 2D Raman peak about 3.7 $cm^{-1}$ (FIG. 86D, blue squares) and a blueshift of the same peak about 6.2 $cm^{-1}$ (FIG. 86D, red squares) correspondingly. Besides, incorporating 1.9 wt % iron oxide nanoparticles into the interior filler generates ferromagnetic microparticles, and these particles can be captured and separated with magnets from the extracted water passing the rough the soil bed, as compared to a centrifugation separation of G-PS-G microparticles (FIG. 86B).

The graphene microparticles are acid proof and mechanically stable and flexible. For example, G-PS-G can retain their circular shapes after treated with a pH=1.5 solution (0.4 M glycine adjusted by concentrated HCl) mimicking human gastrointestinal tract overnight (FIGS. 41A-41G). Besides, the particles can be aerosolized via an airbrush at 1.7 atm (FIGS. 14A-14C and 42A-42G). Specifically, an airbrush was loaded with 10-mL dispersion of microparticles, and sprayed onto a collection board consisting of 21 glass slides 30 cm away (FIGS. 14A and 41A-41G). The morphology was studied and the position of the collected microparticles were located under microscope. FIG. 14B presents the exact locations of ~460 microparticles on the board and 80% of them located at a distance 8 cm away from the spraying center (FIG. 14C). The yield is only 10% lower than that by natural drying (FIG. 43). These microparticles are flexible and some of them have folded into different 3D structures like "Taco" "Roll", "Cone" during the nebulization process, and others without breakage (FIGS. 14B and 43), and most notably, graphene still remains on the particle surface (see Raman spectra of the collected 10 particles in FIG. 44).

Autoperforation is highlighted as a platform technology that can also generate 2D Janus particles with different surface chemistry and/or 2D surfaces (FIGS. 14E and 14F). Functional pyrene or naphthalene molecules (M1-M4 of FIG. 11B, see chemical structures in FIG. 44) containing different functional groups (e.g., —COOH, —$NH_2$) can modify the two sides of each graphene film noncovalently (see XPS and water-contact angle characterization data in FIG. 43 and Raman spectroscopy results in FIG. 44). The surface chemistry symmetry of the particle completely breaks and thus forming Janus particles with four different surface functionalities (FIG. 14A). Functionalization will not affect the coverage of graphene on the particle (see Raman mapping of the 2D peak signal in FIGS. 45A-45D) and only slightly change the profile of the PS or its composite microparticles (FIGS. 31A-31D and 32A-32D), but will significantly change their appearance. Generally, 2D Janus particles have "wings" and a better encapsulation of PS (FIGS. 14A and 20B), as evidenced by a yield of 70% even after a storage time of 8 months (FIGS. 46A-46D). Functionalization enhances the graphene thickness and the bonding between graphene and the interior filler, and thus reduces the strain heterogeneity and weakens autoperforation degree, according to eq. (1).

Microparticles were also prepared with various 2D surfaces, like G/PS/$MoS_2$, $MoS_2$/PS/$MoS_2$ (FIGS. 46A-46D), and hBN/PS/hBN (FIG. 47). Interestingly, the fluorescence imaging of G/PS/G, G/PS/MoS2, and $MoS_2$/PS/$MoS_2$ microparticles at $\lambda_{exc}$=550 nm shows a stepwise increase of the photoluminescence (PL) intensity. With only $MoS_2$ having PL (see, Splendiani, A. et al. Emerging Photoluminescence in Monolayer $MoS_2$. *Nano Letters* 10, 1271-1275, doi:10.1021-/n1903868w (2010), which is incorporated by reference in its entirety), G/PS/G is dark without PL, while the latter two both have PL, and the intensity of $MoS_2$/PS/$MoS_2$ is almost twice that of G/PS/$MoS_2$ (FIGS. 14B and 48A-48C and 49). In addition, the minimum feature size of the printed spot can be manipulated by tuning ink volume, 10 or 1 pL for example, generating a smaller spot with d=34±1.4 and 18.6±2.2 μm, $h_{peak}$=290±29.8 and 31±9.8 nm, respectively (FIG. 14C). Liftoff of the 34-μm spots can generate smaller microparticles with graphene surface (FIGS. 51A-51B).

In summary, an autoperforation method is developed to guide the fracture of 2D materials, by controlling its strain filed with a sandwiched microspot array. Using this method, a free-flowing two-terminal electronic device was prepared—a microparticle consisting of two graphene sheets as surface electrodes and the percolated BP/PS composites as interior memory storage materials. It functions as an aerosolizable and multi-bit memristor device and the memory behavior (i.e. ON/OFF ratio) depends on its storage time in the aqueous environment. The autoperforation is also a platform technology to prepare 2D Janus particles with broken chemical symmetry using various 2D surfaces and interior fillers. The autoperforation technology for the scalable development of 2D microparticles can pave the way for next generation free-floating electronics or state-machines that can integrate into a nanonetwork for complex tasks.

This is the first example of scaling electronics down to a micro-particular level that can survive in harsh conditions. Any other technology based "smart dust", "smart colloidal particles" on the market or in academia is either orders of magnitude larger than the ones disclosed herein (2 $mm^3$ as demonstrate by Berkeley recently) or not qualified as electronics (pH sensing colloids using polymer chemistry). This is also the first time that one can fabricate 2d material electric/colloidal devices on such a large scale with a lithography-free industrially scalable method. There aren't many competing visions in this space. Immense commercial applications are within reach followed by the mature development of this technology. Portable micro-meter scaled random access memory (RAM) devices as well as "aerosolizable chemical sensor" are demonstrated, which should both find immediate applications in the biomedical and chemical industry space. These devices should find applications in scavenging environments that are otherwise unattainable: such as in an oil well or human digestive track and relay valuable information out.

1. Chemical Vapor Deposition (CVD) Growth of Graphene (G), $MoS_2$, and Hexagonal Boron Nitride Monolayer and multilayer h-BN (Boron Nitride) film (2"×1") grown in copper foil was purchased from Graphene Supermarket and used as received. Monolayer and bilayer graphene and $MoS_2$ were grown in the lab with the following procedures:

For Graphene:

CVD graphene sheets were produced with a procedure same as in Liu et al. See, Liu, P., et al., *Layered and scrolled nanocomposites with aligned semi-infinite graphene inclusions at the platelet limit*. Science, 2016. 353(6297): p. 364-367, which is incorporated by reference in its entirety. Briefly, copper foil (Alfa Aesar, 99.8%, 25 μm thick, for graphene growth) with a size of 2.0×2.2 cm was used as substrate, the copper was annealed at 30 sccm $H_2$ gas flow (~560 mTorr) for 30 min at 1000° C. and then 0.5 sccm (for single layer graphene) or 10 sccm (for bilayer graphene, see Tu, Z., et al., *Controllable growth of* 1-7 *layers of graphene by chemical vapour deposition*. Carbon, 2014. 73: p. 252-258., which is incorporated by reference in its entirety) methane was introduced for 15 min or 10 min, respectively. After that, the furnace was kept at 1000° C. for another 5 min and turned off. Cu foil was cooled down and removed out at room temperature.

For $MoS_2$:

Sapphire or $SiO_2$ substrate (7.0 cm×1.7 cm) washed with acetone (5 min) and isopropyl alcohol (IPA, 5 min) was used in the growth of $MoS_2$, $MoCl_5$ powders (Sigma Aldrich, 99.99%, ~4 mg) was loaded onto a $SiO_2$/Si substrate and placed in the central part of the heating zone, the sulfur powder (Sigma Aldrich, 99.998%, ~0.5 g) was added in a separate $Al_2O_3$ boat and placed at the upper stream side of the tube where the temperature was about 200° C. during the reaction. The sapphire or $SiO_2$ substrate was placed at the downstream side 1 cm next to $MoCl_5$. The tube was purged with 50-sccm Ar under vaccum for 30 min, then the furnace was heat to 850° C. in 30 min. The Ar flow kept at 50 sccm and the displayed pressure was about 1.13 torr. The tube was kept at the same temperature for another 10 min and then cooled down to room temperature naturally.

2. Liquid Exfoliation of the Black Phosphorus (BP) 60 mg of black phosphorus dispersed in 20 mL EG and a tip sonicator with a power of (10% maximum power) sonicated the mixture for 10 hours with liquid cooling at 4° C. to get the exfoliated solution. This solution was centrifuged at 2000 rpm at room temperature for 20 min and the final dispersion of BP nanoflakes was obtained. To determine the concentration of BP nanoflakes, 1.5 g solution was sampled and filtered using 0.2 μm-sized PTFE syringe filter, and weighted the BP nanoflakes left on the filter after drying under vacuum overnight. The dispersion was diluted to solutions with different concentrations for the UV-Vis test. Spin coating was used to prepare samples of BP nanoflakes on $SiO_2$/Si (or gold-coated) substrate for AFM, Raman spectroscopy, and X-ray photoelectron spectroscopy (XPS) test. A droplet of the dispersion was added on to a Holy-carbon grid and dried under vacuum to prepare the specimen for TEM.

3. The Preparation of Graphene a Layer

In the fabrication, (1) pristine graphene, $MoS_2$, or hBN grown by CVD method directly or alternatively, (2) functionalized graphene were used to produce Janus particles with a broken chemistry symmetry.

For (1), a PMMA layer was spin-coated around 230 nm onto the surface of the graphene/copper foil (or $MoS_2$/$SiO_2$) using 950PMMA A4 (MicroChem) at 3000 rpm for 1 min. The copper layer (or $SiO_2$ layer) was etched out with ammonium persulfate (APS-100, TRANSENE CO INC) (or 1 M KOH solution at 80° C. for $SiO_2$), and the left graphene (or MoS2)/PMMA film was rinsed with deionized water. Then Si/$SiO_2$ substrate was picked up with the graphene side up (attaching the film from top side of the floating film on water) or a polydimethylsiloxane (PDMS) stamp (2.5×2.5 cm, 2 mm thickness) which has been attached to the graphene/PMMA layer already before the etching step.

For (2), a noncovalent functionalization strategy via π-π stacking was used to modify the graphene layer first before spin coating and etching. Specifically, the copper/graphene (single layer or bilayer) and a size of 2.0×2.2 cm was incubated in the dimethyl formamide (DMF) solution of functional molecules for 1 h and washed with fresh DMF, ethanol, and dried at room temperature (the washing step can remove those excess molecules which were not attached to the graphene surface). 2 mL DMF solution of 1-pyrenebutyric acid (97%, Sigma Aldrich), 1-aminopyrene (97%, Sigma Aldrich), 1,5-diaminonaphthalene (97%, Sigma Aldrich), or other functional molecules (2 mmol/L) was added into a 10 mL-beaker with copper foil, and mechanically shaken for 1 h, then the copper foil was removed out and rinsed with DMF and ethanol in sequence, with each of 30 s. After drying, following steps including spin-coating, etching, and transfer are the same as above. For characterization, the film was transferred onto Si/$SiO_2$ substrate with the graphene side down and characterized with Raman spectroscopy with or without washing out the PMMA layer using acetone, to compare with the pristine graphene.

To functionalize the other side of the graphene film, in this step, methanol, a poor solvent of PMMA was used to prepare the solution of functional molecules. Functional molecules like 1-pyrenebutyric acid N-hydroxysuccinimide ester (95%, Sigma Aldrich) (4 mmol/L) and 1, 5-diaminonaphthalene were used in this step (1-pyrenebutyric acid N-hydroxysuccinimide ester dissolves in methanol at 80° C.). A few drops of the solution (~0.5 mL) were added to overcover the surface of PMMA/graphene film on the $SiO_2$/Si or PDMS substrate and the incubation time is 15 min. After that, the film was rinsed with fresh methanol for 30s to remove any residual functional molecules that are not attached to the graphene surface. After drying, the film is ready for the ink-jet printing in the next step. The $SiO_2$/Si-supported film was characterized with Raman spectroscopy to confirm the functionalization.

4. Ink-Jet Printing of Polymer Latexes or their Composite Solution with Nanoparticles In this step, polystyrene (PS) latex nanoparticles ink or its composite ink with various nanoparticles was printed onto Graphene A to generate a microspot array. Specifically, polystyrene (PS) latex solutions (Sigma Aldrich, PS or amine-modified PS, 0.10 μm or 0.05 μm mean particle size, 2.5 wt %) for example, were diluted with ethylene glycol (EG) to 1.2% (vol:vol=1:1), 0.83% (1:2), 0.50% (1:4), and 0.25% (1:9) as inks for the printing. The PS latex nanoparticles solution was also mixed with zinc oxide (ZnO) nanoparticle ink (2.5 wt. %, viscosity 10 cP, work function –4.3 eV, Sigma Aldrich) and further diluted with EG ($V_{PS}$:$V_{ZnO}$:$V_{EG}$=2:1:1) to prepare ZnO/PS ink; or iron oxide(II,III), magnetic nanoparticles solution (30 nm avg. part. size, 1 mg/mL, Sigma Aldrich) and dilute with EG (2:1:1) to prepare magnetic nanoparticle/PS ink; or the exfoliated BP solution (0.25 mg/mL, 1:1) to prepare BP/PS ink for printing. In the inkjet printing (MICROSYS, Cartesian Technologies) at room temperature, a ceramic printer needle was used and the printed ink volume is 1 nL for each dot, the space between the two adjacent dots is 500 and the printing area is typically 1.5-2.0 cm in length and width. After printing, the ink was dried at room temperature overnight and further under house vacuum for 1 h. The printed dot array together with Si/$SiO_2$ or PDMS-supported graphene/PMMA film was annealed at 120° C. for 10 min and cooled down to room temperature, and ready for the next step. The printer Fujifilm Dimatrix Materials Printer DMP-2850 was used and an ink volume of 10 pL or 1 pL was printed to prepare smaller-sized microspot with PS latex ink (1.25 wt %, 50 nm mean particle size, in mixture of water and ethylene glycol (1:1)).

5. The preparation of the second piece of graphene/PMMA film (graphene B)

Same as the preparation of graphene A above, (1) pristine 2D sheets or (2) functionalized 2D sheets was used to generate graphene B/PMMA film as the cover layer for stacking. Particularly, one-side functionalized graphene/PMMA film in step 4 was transferred onto a relatively larger Si/SiO2 wafer (5×5 cm) with graphene underneath. Drops of the solution of functional molecules such 1-pyrenebutyric acid N-hydroxysuccinimide ester, 1,5-diaminonaphthalene in methanol were added until the complete infusion of the solution into the underlying surface of the graphene/PMMA film. The film was incubated for 10 mins and after that, washed with fresh methanol, transferred back to the deionized water, and rinsed with water for 4 times with 10 mins each time. This film was floated in water and ready for the next step.

6. Stacking, Liftoff, and Auto-Perforation

This stacking and liftoff procedure is the same for the pristine graphene or functionalized graphene. Specifically, the annealed graphene/PMMA film on $SiO_2$ or PDMS substrate with the printed array of Step 6 severs as the bottom layer to pick up the cover layer of Step 6 from water. The two films with the sandwiched microspot array were dried at room temperature for 1 h and then annealed at 120° C. for 15 mins. After that, the films together with the substrate were placed into a 50-mL beaker with a magnetic stir bar, 15 mL of ethanol/water (4:1 in volume) was added, the beaker was sealed with paraffin and heated to 80° C. under magnetic stirring (1000 rpm) for 10 mins, after that, the solution was cooled down to room temperature, with visible, dark particles suspending in the solution. After standing overnight, these particles were settled down and the solution was replaced with fresh ethanol/water (4:1). The heating, stirring, settling down, and solution replacement procedure was repeated another two time to remove any residual PMMA in the solution or on the graphene surface and after that, these particles were stored in the solution and sampled out on to glass slide, $SiO_2$ substrate, or ITO-coated glass via dropper for further characterizations or measurements.

7. Microparticles with Molybdenum Disulfide ($MoS_2$) and Hexagonal Boron Nitride (hBN)

The preparation procedure is similar to that of graphene microparticles above. The only difference is the transfer of $MoS_2$ sheet. Monolayer $MoS_2$ grown on Si/$SiO_2$ substrate was spin-coated with a thin PMMA layer and the $MoS_2$/PMMA film was removed out from the $SiO_2$ substrate using KOH solution (2 M in water) as etchant at 80° C. The film was rinsed with deionized water 5 times and used for the further printing and stacking to prepare microparticles with $MoS_2$ surface. For hBN syncell, single layer or multi-layer CVD hBN film grown on copper foil was used, so the transfer and further preparation of hBN microparticles are the same as that of the graphene particles above.

8. Characterization and Measurement

The optical images of microparticles were acquired from ZEISS Axio Scope A1 with magnification of 5 and 20 times. The visualization of the liftoff process was also monitored the same microscope. Raman spectroscopy was performed on a Horiba Jobin Yvon LabRAM HR800 system using a 532 nm excitation laser, 10× objective lens with ~10 μm diameter spot size, and 1800 lines/mm grating. The profile data of the micropartilces were obtained with Tencor P-16 Surface Profilometer™ using a 2 um radius diamond tipped stylus Step height, with a measurement range of 20 Angstroms to 1 mm. Static water contact angle was measured by rame-hart Model 590 goniometer. The transmittance of BP solution was measured with Shimadzu UV-3101PC Spectrophotometer at wavelength of 660 and 1176 nm, freshly exfoliated BP solution was used as stock solution and dilute with different times for the measurement.

Atomic force microscopy (AFM) was performed using Asylum MFP-3D-BIO in tapping/AC mode with Si tips (Asylum, AC240TS). The scan rate was 0.7 Hz and scan angle was set to be 0°. Black phosphorus (BP) samples was prepared via spin-coating onto a plasma-treated $SiO_2$/Si substrate. Scanning electron microscope was conducted on Zeiss Merlin High-resolution SEM, which is equipped with an in-lens energy selective backscatter detectors for back-scattered electron imaging and the visualization of regions of different composition. The BP/PS composite sample was prepared via mixing of 100 μL of PS latex nanoparticle dispersion (2.5 wt %) and 100 μL of BP dispersion in ethylene glycol (0.25 mg/mL) and drying on hot plate of 120° C. for 10 mins. Transmission Electron Microscopes (TEM) of BP nanoflakes was carried on JEOL 2010 Advanced High Performance TEM and BP nanoflakes were suspended on holy-carbon grid for the characterization. For the fluorescence imaging of MoS2 or graphene microparticles, the particles together with solvent were sampled and naturally dried on glass slides, a broadband supercontinuum white light source (NKT Photonics, SuperK EXTREME EXR-15) was attenuated with a neutral density filter. Fluorescence signal was filtered with band-pass and collected on a 512×512 pixel imaging area of electron multiplying charge coupled device (EMCCD) camera (Andor, iXon3). X-ray photoelectron microscopy (XPS, Kratos AXIS Ultra spectrometer with a monocromatized Al Kα source) was used to analyze the surface chemistry and compositions of various samples including microparticles with different 2D materials and different storage time, funtinalized graphene, BP nanoflakes, and others.

9. Study the Electrical Properties of Graphene Microparticles with Probe Station A MATLAB code was written to execute commands over a semiconductor parameter analyzer (SPA) (Agilent E5262A Source Measure Units), which is used to query electrical information of the microparticles aided by a probe station. The microparticles were loaded into a probe station chamber and the electrical measurements were carried out in an ambient environment at room temperature with sweeping voltage rate was 50-100 mV/s. In general, the electrical properties of these 2D materials microparticles can be categorized into two major modes: in-plane mode and vertical (out-of-plane) mode. In the in-plane mode, the microparticles are placed onto an insulating surface (typically glass) with one of the 2D material (typically graphene) surfaces facing up, and the Tungsten (W) probe head gently placed on the material surface. In order to aid the process of locating a microparticle under the microscope atop the probe station, its location is separately located under an optical microscope and marked before it was placed in the probe station. In the vertical mode, vertical conductivities (or through-plane conductivity of the 2D material-composite vertical stack, i.e. Gr-PS/BP-Gr) are typically tested. In this case, a conductive substrate for the microparticle is needed to complete the probe-particle-substrate circuit. ITO substrate was selected for its robustness.

10. Experimental Demonstration of the Potential Application of the Microparticles 10.1. The Readout, Write in, Liftoff, and Readout Experiment Microparticles G-MoS2 (0.07 wt %)/PS-G after a storage time of 2 months in the ethanol solution were used in the experiment. Specifically, a few droplets of microparticle solution were sampled and transferred it onto an ITO-coated glass. After drying the solvent under ambient conditions and further at vacuum for 1 h, the ITO/glass was placed with the deposited microparticles onto the probe station. A grid was drawn on the real-time image of the microparticles on the screen to facilitate the location of 12 spots on the microprobe (tip diameter=5 μm) for reading out and the write-in. A voltage sweeping of 0-0.15 V was first applied to read out the initial conductance status of the 12 spots and later selectively switching on 6 spots with a voltage sweeping of 0-5 V, and at the same time, keeping the other 6 spots unchanged. After this, the ITO/glass was removed out from the probe station and added ethanol solvent on to the surface to lift off the microparticles on the surface. Mechanical agitation was applied using I fine glass tube or needles to assist the liftoff and the liftoff process was also visualized under the optical microscope. The microparticles will stay in the solution for 10 min after liftoff and is dried the solution under ambient conditions and further at vacuum again. The conductance of the twelve spots were read out on the probe station by applying a voltage sweeping of 0-0.15 V again. Here each microparticle has its own tails or shapes that differentiates it from others so that the same microparticle was identified before and after liftoff. The same grid was drawn to locate the spots with turning on treatment in previous so that the microprobe can read out the vertical conductance change of these same spots after liftoff for comparison.

10.2. Aerosolization of the Graphene Microparticles Via Airbrush

Aerosolization of the dispersion of graphene microparticles was conducted with an airbrush (Master Airbrush G222 Pro SET, 0.5 mm set size) with a working pressure of 1.7 atm (25 psi) and distance of 30 cm. Specifically, 5 mL of microparticles (G-PS-G) solution was loaded and sprayed out using the air pressure generated by an air compressor (Master Airbrush Model C16 Black Mini Air Compressor). The microparticles together with the aerosolized solution were flying in air and collected by a board consisting of 21 (7×3) glass sides, which is 30 cm away from the airbrush. The microparticles collected by the glides have been further investigated with optical microscope for counting, morphology study, and position tracking, and Raman microscopy to study the graphene coverage.

If the collecting slides have a conductive surface, a thin ITO coating layer for example, the collected microparticles via either aerosolization or natural drying, with the substrate, can be placed onto the probe station for the direct writing-in and erasing-out of the digital memory, i.e., using the probe to switch on and off locally. If regular glass slides or other materials with an insulating surface were used, a contact transfer printing method that using an adhesive tape, e.g., conductive copper foil tape was applied to stick onto and transfer the particles out from the insulating surface to the desired copper foil tape. For the demonstration at a macroscopic level, G-PS/GOx (1 wt %)-G and G-PS/$MoS_2$ (0.07 wt %)-G particles fabricated via capillary printing with a diameter around 1-2 mm were used, with or without silver. The dispersion of the particles were sampled and dried on a glass slide, and then used both paper tape and conductive copper foil tape to conduct the contact transfer printing on a cm-sized area. In addition, the individual dried particles can also be picked up and transferred onto the tape via tweezers.

10.3. Mammalian Digestive Track Test

The mammalian digestive track corrosive environment was mimicked to test the chemical stability of G-PS-G, an in vitro protocol that was widely used as the test environment. Specifically, in a SBET (Simple Bioaccessibility Extraction Test) (see Oomen A G, Hack A, Minekus M, Zeijdner E, Cornelis C, Schoeters G, et al. Comparison of Five In Vitro Digestion Models To Study the Bioaccessibility of Soil Contaminants. *Environ. Sci. Technol.* 2002, 36(15): 3326-333, and Ruby M V, Davis A, Link T E, Schoof R, Chaney R L, Freeman G B, et al. Development of an in vitro screening test to evaluate the in vivo bioaccessibility of ingested mine-waste lead. *Environ. Sci. Technol.* 1993, 27(13): 2870-2877, each of which is incorporated by reference in its entirety), 100±0.5 mL extraction fluid (0.4 M glycine adjusted to pH 1.5 with concentrated HCl) was added to 1.0±0.5 g of dry weight of things to be digested. This mixture is rotated end-over-end at 37° C. at 30±2 rpm for 1 h. Similarly, G-PS-G microparticles placing on glass slides were treated with same acidic mixture overnight rather than 1 h.

10.4. Amine Functionalized Graphene Microparticles for the Detection and Memorizing Gold Nanoparticles in the Water Sample Graphene microparticles (G-PS-G) were used with surface —NH$_2$ functionalities for the demonstration. Briefly, the 1, 5-diaminonaphthalene-functionalized microparticles in ethanol/water (4:1) solution were concentrated by centrifugation, a small droplet (about 0.1 mL) of the dispersion was sampled out with a large number of microparticles, added it to 2-mL gold nanoparticle solution (~6.0E+12 particles/mL in citrate buffer, Sigma-Aldrich, 10 nm diameter), and incubated for 1 h. The microparticles were then separated from the solution via centrifugation. After three cycles of washing with fresh ethanol/water mixture and centrifugation, a droplet of the solution was finallyretraced out with the dispersed microparticles and placing it on an ITO-coated glass. After drying overnight at vacuum overnight at room temperature, the surface conductivity of the microparticles and Raman spectra of 10 different microparticles were measured for a statistically study.

10.5. Nitrilotriacetic Acid (NTA) Ligand Modified Graphene Microparticles for the Detection and Memorizing Zn$^{2+}$ Concentration in Soil To demonstrate the ability to deploy these microparticles to function as stand-alone detectors in this practical scenario, both outer surfaces of the graphene layer of the microparticles were non-covalently functionalized with the nitrilotriacetic acid (NTA) ligand, and turn them into retractable sensor nodes for trace amounts of Zn$^{2+}$ ions present in the ground soil, which is a crucial plant micronutrient that involves in many physiological functions of plants. Specifically, the microparticles were fabricated with polystyrene (PS)-Fe$_3$O$_4$ magnetic nanoparticle composite core, flanked by two double-layer graphene sheets on the top and bottom, following the standard procedure introduced previously. To functionalize the NTA ligand onto the outer surface of the graphene layers, a pyrene-containing linker, 1-pyrenebutyricacid-N-hydroxysuccinimide ester (Sigma Aldrich), then reacted with N,N-bis(carboxymethyl)-L-lysine hydrate (Sigma Aldrich) were used at room temperature, after adjusting the pH to 9.0, using an NHS ester amine-reactive cross-linking chemistry.

III. Modeling of the Autoperforation Process
A. Strain Guided Fracture Propagation with Stochastic Seed Crack Formation
a. An Existing Model There is an existing model on soft material fracturing within a strain field induced by curvature.

B. Algebraic Estimation of the Tensile Strain Due to Material Thickness and Elasticity
a. Model Derivation There will be fluctuating tensile stretches in the graphene lattice once the PMMA layer is removed by the ethanol/water solution due to turbulent fluid flow. The primary purpose of this section is to estimate the strain distribution due to this random stretching/compressing of the freestanding graphene lattice by the external forces.

1. Consideration of a 2D Slice

Figures 64A, 64B:
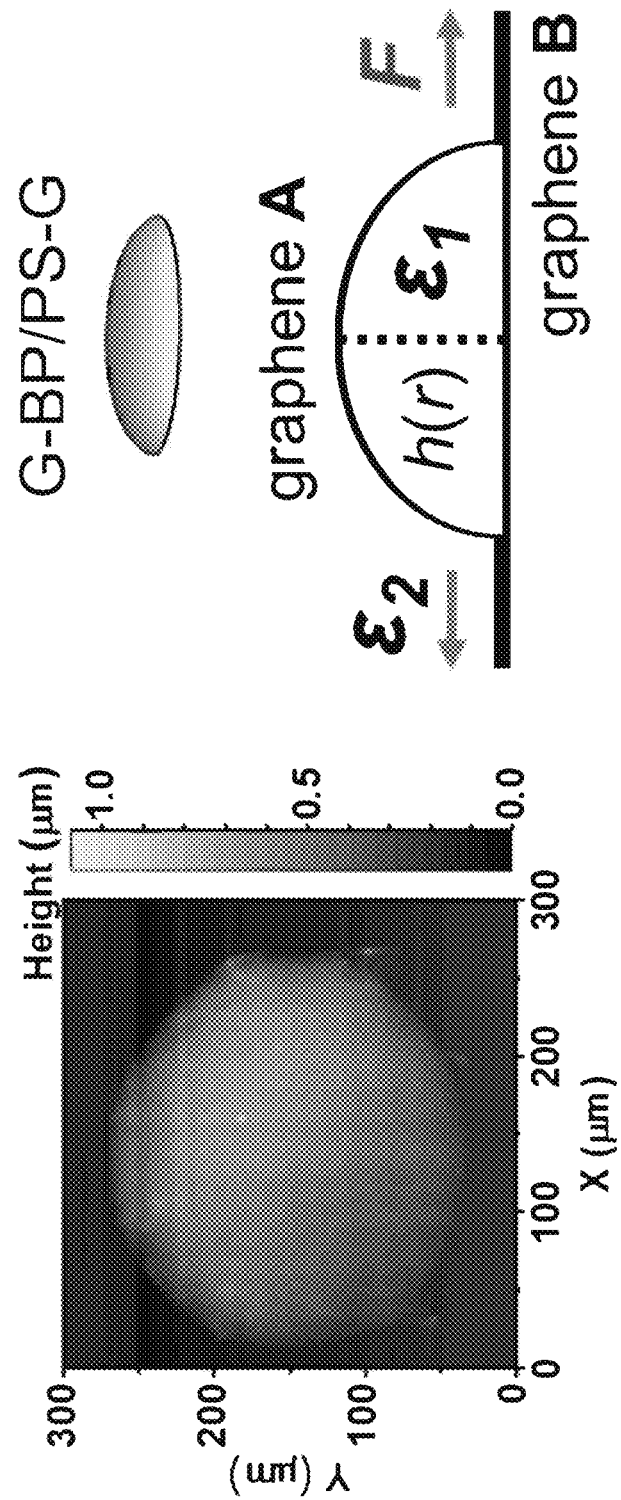
FIG. 64A shows strain built-up due to tensile force stretching of the graphene lattice laminated with polystyrene (PS) core. Scale bar marks 100 μm, and inset shows the interior cross section of the microparticle.
FIG. 64B shows relative strain of the graphene lattice and particle height as a function of the particle radius, with the strain induced by the initial folding and the subsequent tensile stretching adding into the total strain.

To get started, a simple 2D slice is considered to find the relation between strain and elastic moduli of materials involved as well, as their thickness, as informed by the vertical profile measurement of the microparticle (FIG. 64A).

Figures 63A, 63B:
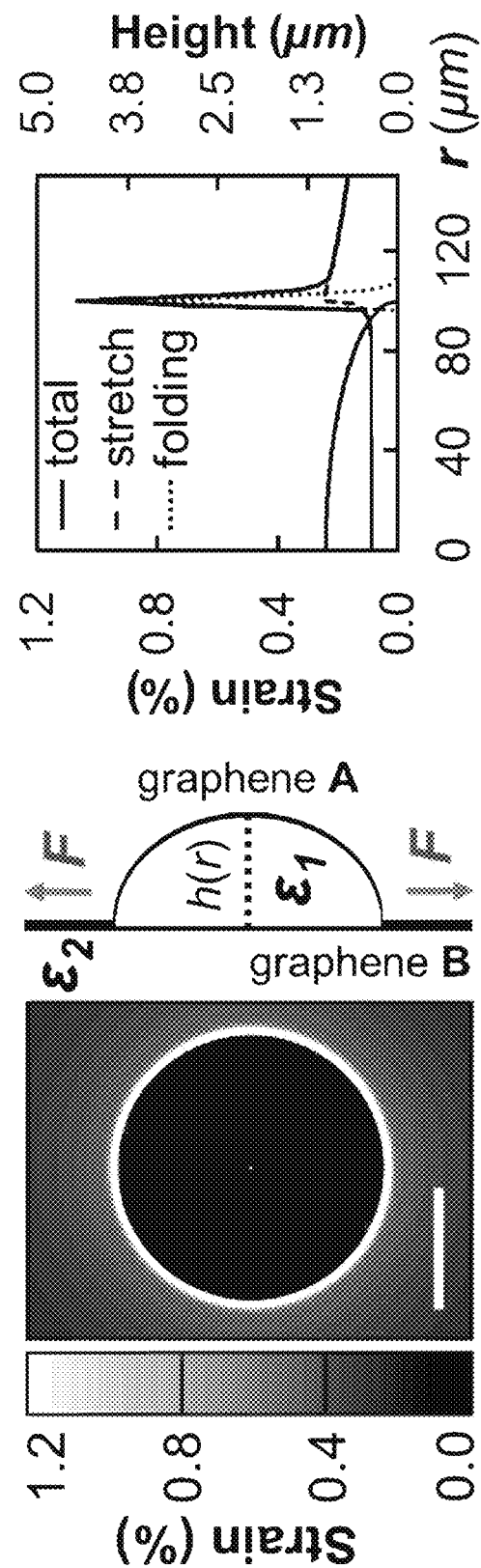
FIG. 63A shows vertical profile measurement of a G-BP/PS-G micro-particle, with its height reaching 1 μm at the maximum towards the center of the particle.
FIG. 63B shows schematic of the side view of a microparticle as considered by this model, the curvature of the particle is embedded in the height h(r), and the $\varepsilon_1$ and $\varepsilon_2$ describe relative strain for the PS/PS/graphene composite and two bilayer graphene layers, respectively.

This concave-down dough shape is captured by the sketched profile (FIG. 64B), where a BP/PS dough is considered being encapsulated within two bilayer graphene sheets. If one imagines a force F pulling on such a sandwich structure of width w on either side, then a force balance can be obtained:

$$2F = E_{Gr}\varepsilon_2(r) 2T_{Gr} w = \varepsilon_1(r) E_{PMMA} h(r) w + \varepsilon_1(r) E_{Gr} 2T_{Gr} w \quad (9)$$

where F is the magnitude of force F, and $\varepsilon_1$, $\varepsilon_2$ are the material relative strain for Gr-BP/PS-Gr composite and Gr-Gr, respectively. Note PS was used to approximate the BP/PS composite, which is reasonable considering BP's low concentration within the PS matrix. This yields the following relationship:

$$\frac{\varepsilon_2(r)}{\varepsilon_1(r)} = \frac{2E_{Gr}T_{Gr} + E_{PMMA}h(r)}{2E_{Gr}T_{Gr}} \quad (10)$$

which relates the relative strain outside the PS microspot to that within. Now that all is needed is to set an appropriate boundary condition to correctly evaluate the force F.
1. A Radially Symmetric 3D Model By taking advantage of radial symmetry, one can easily generalize this 2D slice into a 3D model. It should be noted that since there is less and less material towards the middle of the microparticle, in order to withstand the same amount of force outward (which is clearly conserved), then materials closer to the center need to be stretched more, thereby having a larger strain. Without loss of generality, the center of the microparticle was set as the origin of the cylindrical coordinates, it then follows from Eq. (10) and the corresponding 3D force balance, $$\varepsilon_1(r) = \frac{2E_{Gr}T_{Gr}\varepsilon_2^{R_F} R_F}{\{2E_{Gr}T_{Gr} + E_{PMMA}h(r)\}}, \text{ where } \varepsilon_2^{R_F} = \frac{F}{4\pi R_F T_{Gr}} \quad (11)$$

where $\varepsilon_2^{RF}$ is defined as the relative strain at which force of magnitude F is applied to the ring of materials at radius $R_F$. And if $R_F$=250 μm and $\varepsilon_2^{RF}$=0.1% is set, and to approximate the dough shape of the microparticle, its vertical profile is approximated as:

$$h(r) = \frac{1}{R_0}\sqrt{R_0^2 - r^2} + 2T_{Gr} \quad (12)$$

where $R_0$ is the radius of the PS microspot, which is set to 100 μm to the best estimation. This model yields a strain contour for the graphene materials that shows maximum strain built-up right outside the microspot (FIG. 63A), with the height profile shown in FIG. 63B. FIG. 63A shows the well-dispersed BP nanoflakes/EG solution follows Lambert-Beer law at λ=660 and 1176 nm, with the extinction coefficient (α)=80.3±3.0 Lg$^{-1}$m$^{-1}$ and 62.0±2.7 Lg$^{-1}$m$^{-1}$, BP concentration ($C_{BP}$) was determined via filtration method. In FIG. 63B, the three sharp Lorentzian-shaped peaks demonstrate the crystalline nature of BP nanosheets (see, Kang, J., et al., *Solvent Exfoliation of Electronic-Grade, Two-Dimensional Black Phosphorus.* ACS Nano, 2015. 9(4): p. 3596-3604, which is incorporated by reference in its entirety). This tensile strain, in additional to the folding strain discussed in the previous section, combines into a total strain field which is followed by a strain induced crack propagation that finishes the auto-perforation process.

C. Finite Element Coarse Grained MD Simulation for Mold-Based Graphene Folding a. Overview A theoretical model that simulates the kinetic process involved in the first step of the autoperforation of bi-layer graphene during the microparticle fabrication process is developed. A mathematical model implemented in MATLAB allows us to predict the shape of the system after the first step as well as where the graphene sheets are most strained. A more thorough understanding of the mechanics of autoperforation, and how varying parameters affect the resultant shape, is crucial in order to be able to design customizable microparticles of different shapes, sizes, and materials.

b. Theoretical Considerations

1. A Kinetic Process

This model numerically solves the differential equations of motion that govern the auto-perforation process. The advantages of a kinetic model, as opposed to a thermodynamic—or equilibrium—model, are that it allows us to observe the kinetic trapped states during graphene folding. Additionally, there is an option in the model that allows graphene to tear once it reaches a certain specified strain.

2. Spring Force

The 2D sheet is broken down into a square lattice with nodes representing material points, each node accounting for the mass of all the materials within that unit lattice. Each node experiences a spring force from each of its four neighbors. For a material with linear elasticity, such as PMMA, this force $F_{LS}$ is:

$$F_{LS} = E\varepsilon A_0 \tag{1}$$

where E is the Young's modulus of the relevant material, $\varepsilon$ is the strain, and $A_0$ is the cross sectional area of the section. However, graphene is known to have a nonlinear elasticity, and the non-linear spring force a node feels from one of its neighbors, $F_{NLS}$ is:

$$F_{NLS} = (E\varepsilon + D\varepsilon^2)A_0 \tag{2}$$

where D is a third order elastic modulus to account for the non-linearity, and typical values for $E_{Gr}$ and $D_{Gr}$ are 1.0 TPa and −2.0 TPa, respectively. In this model, the material connecting the nodes is a two-layer composite of PMMA and graphene, which is modeled as two parallel springs, giving the total spring force $F_s$:

$$F_s = (E_{Gr}\varepsilon + D_{Gr}\varepsilon^2)T_{Gr}L_0 + (E_{PMMA}\varepsilon)T_{PMMA}L_0 \tag{3}$$

where $T_{Gr}$ and $T_{PMMA}$ are the thicknesses of the graphene and PMMA layer, respectively, and $L_0$ mesh size perpendicular to the force direction.

3. Van Der Waals Force

Van der Waals forces are weak intermolecular forces that arise due to permanent and induced dipole moments in molecules. Each particle in this model experiences attractive van der Waals forces towards the bottom sheet of graphene, and also to the polystyrene pellet. The potential for the surface-surface interaction (per unit area), W, is given by, $$W = \frac{-H}{12\pi\delta^2} \tag{4}$$

and the corresponding van der Waals force, $F_{vdW}$, is $$F_{vdW} = -\frac{dW}{d\delta} = \frac{HL_0^2}{6\pi\delta^2} \tag{5}$$

where H is the Hamaker constant, and $\delta$ is the distance between the two interacting surfaces. The surface-surface interaction is the most appropriate for this model (as opposed to an atom-surface or sphere-surface interaction), since the discretization of the graphene sheet produces planar units with large aspect ratios.

4. Capillary Interaction

Capillary forces (i.e. water-graphene attractive interactions) play a large role in many graphene folding and transfer applications. However, the exact nature and magnitude of the capillary interaction between water and graphene is not well understood, and is the topic of many different studies. The binding energy $W_{adh}$ for water on bilayer graphene is 58.9±1.9 mJ·m$^{-2}$. Further, the maximum traction reported by one study is $\sigma_m \approx 90$ MPa. This traction due to capillary forces is crucial to the first step of the auto-perforation process.

5. Gravity

Gravity acts on all particles, given by Newton's second law, $F_g = mg$, where g is the acceleration of gravity, and m is the mass of one node. The mass of one node is found by dividing the total mass of the system by the number of nodes in the system:

$$m = \frac{(T_{Gr}\rho_{Gr} + T_{PMMA}\rho_{Gr})LW}{N} \tag{6}$$

where $\rho_{Gr}$ and $\rho_{PMMA}$ refer to material densities, and N is the number of nodes in the system.

6. Viscous Dissipation

The Reynolds number is a non-dimensional number that represents the ratio of inertial to viscous forces in a fluid. The Reynolds number of the composite folding system, Re, at 20° C. is given by:

$$Re = \frac{\rho v L}{\mu} = \frac{998.2 \text{ kg} \cdot m^{-3} \times 10^{-6} m \cdot s^{-1} \times 10^{-4} m}{1.002 \times 10^{-3} m^3} \approx 10^{-4} \tag{7}$$

where $\mu$ is the dynamic viscosity of the liquid, and v is the velocity of a given node. The Re<<1 means that viscous effects cannot be ignored. Therefore, a Stokes' drag force $F_d$ acting opposite to sheet's downward velocity is included:

$$F_d = 6\pi\mu R v \tag{8}$$

where R is the Stokes' radius (approximated as the thickness of the PMMA support layer). The graphene sheet does not actually fall through water, the Stokes' drag is meant to account for the fact that water is displaced.

c. Model Implementation

1. Nodes and Springs

The structure of this model is an extended system of nodes and springs. For a square mesh with n nodes on a side, there are a total of $n^2$ nodes total, and $2n(n-1)$ springs since $n(n-1)$ springs are initially parallel to each of the x and y directions. Note that if the nodes are contained in a 2D array, the ordered pair (i,j) is equivalent to (row, column). Additionally, the nodes are numbered from 1 to $n^2$, starting with (1, 1) and ending with $(n_x, n_y)$. This is because the ordinary differential equation (ODE) solvers work with 1D vectors of variables. However, it is much more concise and efficient to work with these variables in a 2D array, and then convert it to a 1D vector right before calling the ODE solver. These naming conventions are needed in order to precisely define the relationship between the 1D and 2D representations.

2. Periodic Boundary Conditions

This model utilizes a periodic boundary condition. This means that the "unit cell" modeled behaves as if it was repeated infinitely on all sides. Specifically, edge nodes are nodes with $i=1$, $i=n_x$, $j=1$, or $j=n_y$. Most nodes have four springs attached to them, but these edge nodes only have two or three. The periodic boundary condition is achieved by modifying the forces felt by edge nodes so that the "missing" forces are taken from the opposite side of the unit cell. For example, node $(i, n_y)$ has no neighbor to the right; there is no node $(i, n_y+1)$. The spring force node $(i, n_y)$ feels to the right is then the same force that node $(i, 1)$ feels to the right. In the code, this is implemented by using logic to determine if a node is an edge node, and if so substituting the missing forces with forces from the opposite edge. The periodic boundary condition has the effect of fixing the edge nodes in the x-y plane. This is because the edge treatment described above treats opposite edge nodes as the same point—when the unit cell is repeated, the edges overlap. Intuitively, this also makes sense because in an infinitely extended grid of microparticles, the edge nodes lie exactly halfway between two microparticles.

d. Results Summary

The output of this model is the shape of the graphene/PMMA sheet during and after the folding process. This section is intended to show results obtained from the model and in this example, a 250×250 mesh is used, with an aspect ratio of 1:100 (microcylinder height to radius). This level of resolution is needed in order to observe the shape of the resulting profile in the region near the edge of the polystyrene pellet.

Using the native values of the materials (250 nm thick PMMA and 0.67 nm bilayer graphene composite) and the appropriate microspot form factor, a maximum of 0.78% relative strain was obtained within the composite film right outside of the microspot edge, which hence forth shall be referred to as the "folding strain" (FIGS. 62A and 62B). FIGS. 62A-62B show effect the ink composition in the inkjet-printing process, adding 50% ethylene glycol into the ink can reduce the evaporation speed of the solvent and thus suppress the formation of coffee ring (see Kim, D., et al., *Direct writing of silver conductive patterns: Improvement of film morphology and conductance by controlling solvent compositions*. Applied Physics Letters, 2006. 89(26): p. 264101, which is incorporated by reference in its entirety). The strain is built-up over time (FIG. 62C), and stabilizes into either an equilibrium or kinetically-trapped equilibrium state.

IV. A Semi-Empirical Model for the BP/PS Composite Memresistors

1. Theoretical Construct

Figure 65B:
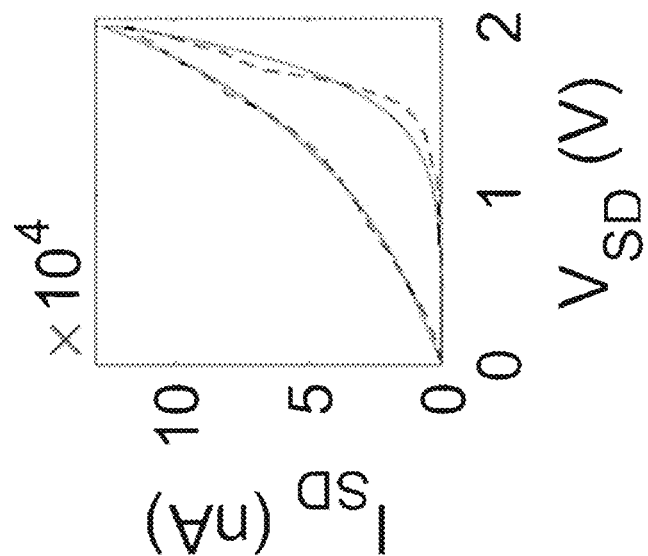
Figure 65A:
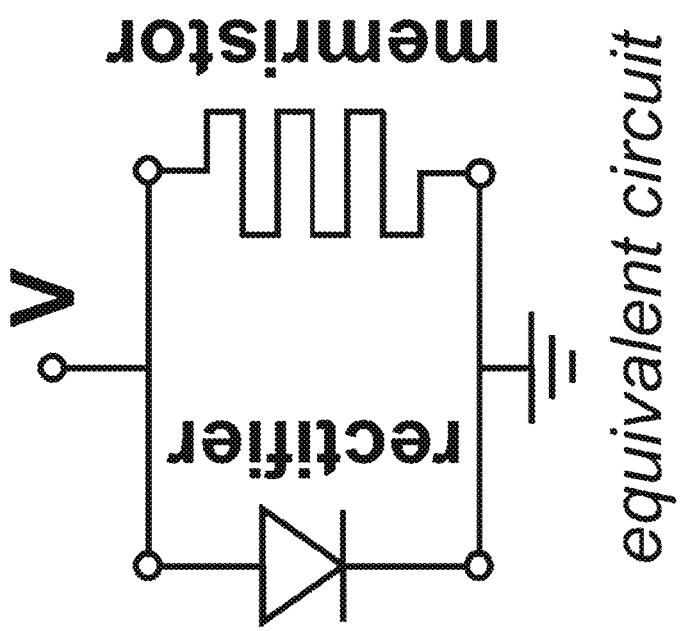
FIG. 65A shows equivalent circuit diagram for the parallel rectifier and memristor model.

This model is adapted from the seminal work by Stewart and Williams et. al. in the Hewlett-Packard laboratories, where an equivalent circuit model consisting of a rectifier in parallel with a memristor is constructed (FIG. 65A). For each of these microparticle memristor element, the following equation describes its I-V switching characteristics, derived from the equivalent circuit:

$$I = I_m + I_r = w^n \beta \sinh(\alpha V) + \chi \{\exp(\gamma V) - 1\} \quad (13)$$

which is chosen more for its simplicity and ability to reproduce the I-V behavior than as a detailed physics model. In the first term, $I_m$, which represents a flux-controlled memristor, $\beta \sinh(\alpha V)$ is the approximation used for the ON state of the memristor, which is essentially electron tunneling through a thin residual barrier; $\alpha$ and $\beta$ are fitting constants that are used to characterize the ON state, and w is the state variable of the memristor. In this case w is proportional to the applied electric field. The second term in Eq. (13), $I_r$, represents the I-V character for the rectifier, and $\chi$ and $\gamma$ are the fitting constants used to characterize the net electronic barrier when the memristor is switched OFF. The exponent n of the state variable is used as a free parameter in the model, which is adjusted to modify the switching between the ON and OFF states of the device to be consistent with the experimental observations. A large n is typically interpreted as evidence for a highly nonlinear dependence of the effective vacancy drift velocity on the voltage applied to the device.

2. Model Implementation

In order not to limit the scope of search space for the curve fitting, nonlinear programming was used to locate the minimum of the unconstrained multivariable objective function. The objective functions themselves are simply sums of least square differences between the I-V curves derived from Eq. (13) and experimental data. This semi-empirical model is capable of fitting, to great success, all the I-V behaviors for the two-terminal memristors tested, and some of the fits are shown here as an example (FIGS. 65B-65D).

Experimental data are represented as solid red lines, and model fits as black dashed lines. These fittings yield parameters that can provide deeper insights toward each memristor element. For instance, a closer inspection of the fitting parameters (Table 4) for data presented in FIGS. 65A-65D, which are collected for a progressively switched-on memristor, offers qualitative agreement between theory and the nature of the device.

TABLE 4

Fitting parameters corresponding to FIGS. 65B-D.

| Parameters | B | C | D |
| --- | --- | --- | --- |
| n | 2.30E+00 | 1.31E+00 | 2.67E+00 |
| β | 2.01E+04 | 8.75E+03 | 1.99E+04 |
| α | 1.86E+00 | 1.96E+00 | 2.44E+00 |
| χ | 1.33E+01 | 5.32E+05 | 8.50E+05 |
| γ | 4.41E+00 | 6.68E−02 | 6.42E−02 |

If the left term $I_m = x^n \beta \sinh(\alpha V)$ is compared with the $\alpha$ values, it is observed an increase of $\alpha$ as the memristor is switched from an OFF state to an ON state. Mathematically, the smaller $\alpha$ is, the further along in the V-axis does the $I_m$ start to kink up, meaning the more voltage it requires to turn the memristor ON. As more charges are put into the memristor, the memristor is closer to its ON state, which coincides with the experimental observation. If the second term $I_r = \chi \{\exp(\gamma V) - 1\}$ that characterizes the rectifier component is focused on, this is just a recast of the Shockley diode equation, where $\chi$ is known as the reverse bias saturation current (or OFF state current), and $\gamma$ is just the inverse product of the ideality factor and the thermal voltage. In the first run, the reverse bias saturation current is notably smaller and the diode is much closer to ideal. Both of these observations agrees with the fact that the memristor is initially in the OFF state.

Micrometer-Size Electrical State Machines Based on 2D Materials for Aerosolizable Electronics Reduction in machine size down to micrometers will dramatically decrease their fabrication cost, along with yielding the possibility to explore environments that are too small or too dangerous for humans or larger robots. To date, the development of such machines was hindered by both energy-thirsty electronics and limited, on-board energy storage capacity. Disclosed herein is a syncell, a micrometer-size particle capable of changing their electronic state. Compared to the state-of-the-art millimeter-size robots, the syncell's size shrinkage is enabled by developments in 2D materials that considerably reduce operational power requirements. The syncell state machine ($100 \times 100 \times 5$ $\mu m^3$, making them invisible to the human eye) is composed of a power source, a switch, and a memory element that form a closed electronic circuit. This circuit remains operational even after travelling inside a turbulent droplet a distance of 0.6 m in air. Syncells successfully detect analytes while in air and store this information in the memory using power harvested by a photodetector. This layout represents a concept of aerosolizable electronics with particles that can be dispersed in air while having active electronics on-board. To facilitate syncell collection, syncell standoff detection was realized with on-board retroreflectors. These aerosolizable electronics will allow rapid and cheap monitoring of viruses, bacteria, and fumes that spread over large areas.

Today there are two main tendencies in the field of micromachines: micro/nanoparticles and biorobotics. Decades of chemical synthesis have led to the development of complex core-shell particles with multifunctional capabilities that are widely used for drug delivery, biosensing, imaging, etc. See, Bao, G., S. Mitragotri, and S. Tong, *Multifunctional Nanoparticles for Drug Delivery and Molecular Imaging*. Annual Review of Biomedical Engineering, 2013. 15(1): p. 253-282, which is incorporated by reference in its entirety. Although micro- and nanoparticles are relatively simple to synthesize, they are significantly limited in their integration capability with conventional electronics and their development of complex logical operations. Biorobotics based on genetic engineering, in turn, was able to harness bacterial life and viruses to create micromachines. See, Smanski, M. J., et al., *Synthetic biology to access and expand nature's chemical diversity*. Nat Rev Micro, 2016. 14(3): p. 135-149, and Ravi, S. K. and S. C. Tan, *Progress and perspectives in exploiting photosynthetic biomolecules for solar energy harnessing*. Energy & Environmental Science, 2015. 8(9): p. 2551-2573, each of which is incorporated by reference in its entirety. Nevertheless, genetic engineering is also limited by intrinsic cell architecture and design. As an alternative, micro-scale electrical systems can be made from scratch with their architecture being optimized to the application at hand.

Cubic millimeter-size devices, called "smart dust", are the smallest dispersed electronic devices reported to date. See, Seo, D., et al., *Wireless Recording in the Peripheral Nervous System with Ultrasonic Neural Dust*. Neuron, 2016. 91(3): p. 529-539, which is incorporated by reference in its entirety. While the initial concept was developed more than 15 years ago, further progress was hindered by the lack of efficient energy storage technologies. Indeed, light-weight batteries do not provide enough power, often forcing small robots to rely on external energy harvesting. To this end, some versions of smart dust harvested energy from electromagnetic wireless radiation, limiting the devices' operation to a distance of a few meters. See, Seo; D., et al., *Wireless Recording in the Peripheral Nervous System with Ultrasonic Neural Dust*. Neuron, 2016. 91(3): p. 529-539, which is incorporated by reference in its entirety. Unfortunately, this approach cannot be scaled down, due to receiver size limitations. See, Seo, D., et al., *Model validation of untethered, ultrasonic neural dust motes for cortical recording*. Journal of Neuroscience Methods, 2015. 244: p. 114-122, which is incorporated by reference in its entirety. Alternative energy harvesting techniques (chemical power harvesting, bacteria-produced power, ultrasound, magnetic field and light) are continuously being developed, delivering microwatts of power on the micrometer scale but, so far, have had little to no success in powering energy-thirsty electronics (usually requiring milliwatts). See, Zebda, A., et al., *Single Glucose Biofuel Cells Implanted in Rats Power Electronic Devices*. Scientific Reports, 2013. 3: p. 1516, Kim, H. and M. J. Kim, Electric Field Control of Bacteria-Powered Microrobots Using a Static Obstacle Avoidance Algorithm. IEEE Transactions on Robotics, 2016. 32(1): p. 125-137, Servant, A., et al., *Controlled In Vivo Swimming of a Swarm of Bacteria-Like Microrobotic Flagella*. Advanced Materials, 2015. 27(19): p. 2981-2988, and Chang, S. T., et al., *Remotely powered self-propelling particles and micropumps based on miniature diodes*. Nat Mater, 2007. 6(3): p. 235-240, each of which is incorporated by reference in its entirety.

In a micrometer-size electronic state machines, or a "syncell" (an allusion to the biological term synthetic cell-minimal cell), the issue of energy deficiencies is circumvented using novel 2D devices that require only microwatts, or even nanowatts, of power. Built from 2D materials, these devices are only a few atoms thick, enabling a high integration density. Note that 2D devices are still in their infancy: Most publications to date demonstrate individual 2D devices fabricated on flat silicon wafers. See, Wang, Q. H., et al., *Electronics and optoelectronics of two-dimensional transition metal dichalcogenides*. Nat Nano, 2012. 7(11): p. 699-712, Radisavljevic B, et al., *Single-layer MoS2 transistors*. Nat Nano, 2011. 6(3): p. 147-150, Lopez-Sanchez, O., et al., *Ultrasensitive photodetectors based on monolayer MoS2*. Nat Nano, 2013. 8(7): p. 497-501, Cheng, R., et al., *Electroluminescence and Photocurrent Generation from Atomically Sharp WSe2/MoS2 Heterojunction p-n Diodes*. Nano Letters, 2014. 14(10): p. 5590-5597, and Lopez-Sanchez, O., et al., *Light Generation and Harvesting in a van der Waals Heterostructure*. ACS Nano, 2014. 8(3): p. 3042-3048, each of which is incorporated by reference in its entirety. Here, a complete electronic circuit composed of 2D devices is assembled, forming a 2D state machine that is operational when lifted-off of silicon.

Large area monitoring of various bacteria, spores, smokes, dust, and fumes is an important task, which currently requires a lot of resources. See, Hansen, M. C. and T. R. Loveland, *A review of large area monitoring of land cover change using Landsat data*. Remote Sensing of Environment, 2012. 122: p. 66-74, which is incorporated by reference in its entirety. In one implementation, satellite scanning can rapidly cover large areas, but it is costly and indirect (this translates into limited applicability). On-ground sensor installation is labor-intensive and can often be slow in comparison to analyte distribution. Employing a fleet of flying sensors (e.g., drones) is again associated with high costs. As an alternative, the concept of aerosolizable electronics is introduced. Syncells dispersed in the air carrying 2D electronic devices that remain operational even in flight. Air drag calculations demonstrate that these syncells will have <1 cm/s sedimentation speed (FIG. 70; compare this with 1 m/s for millimeter-size particles), potentially allowing them to float in air for several days without the need of external power. It is experimentally demonstrated how flying syncells can detect analytes dispersed in air, store this information in the on-board memory (power for this is delivered to the syncell via light), and be detected from standoff distances using a laser-scanning setup.

Syncell Design and Fabrication

Figure 71:
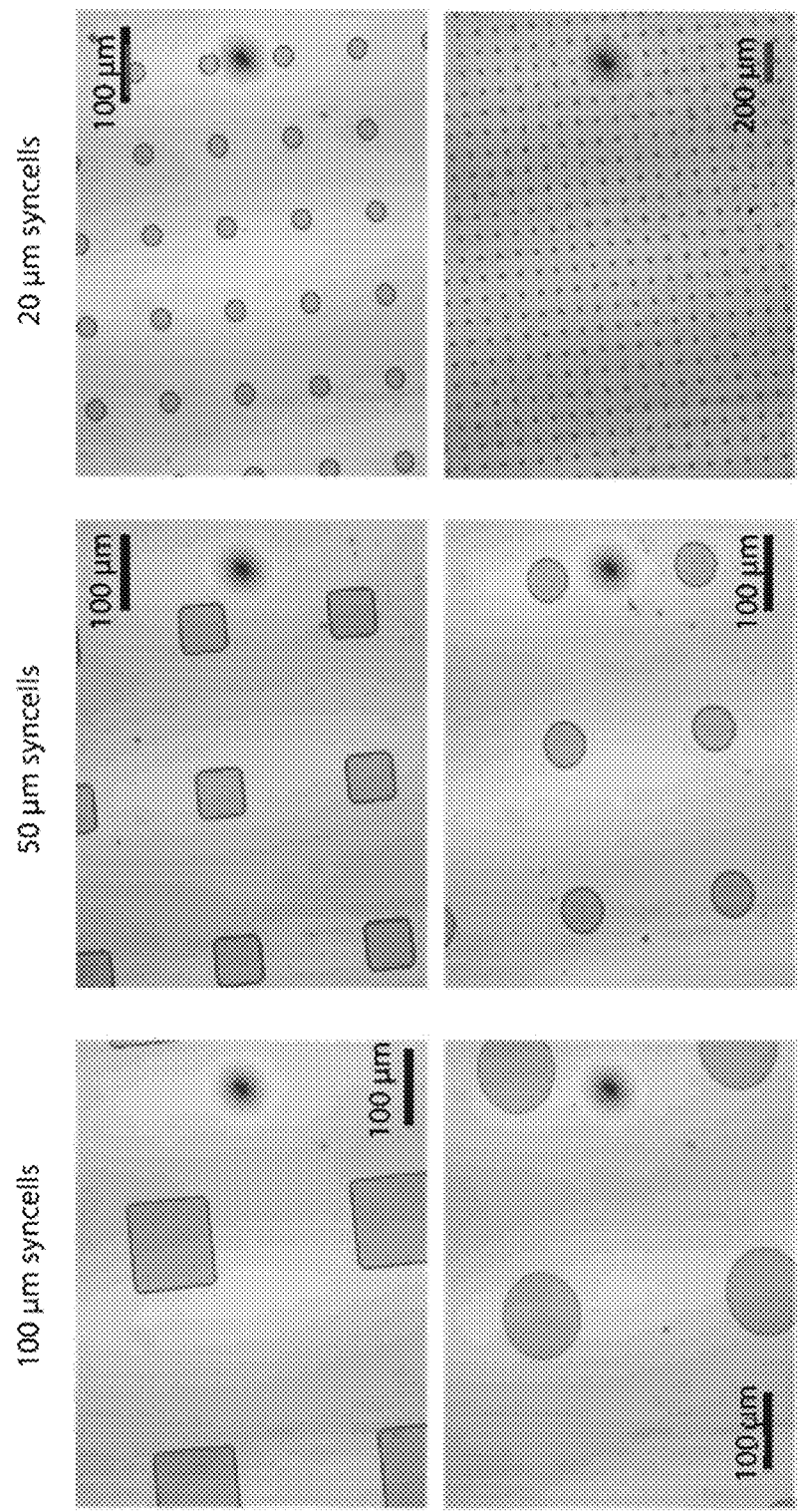
FIG. 71 shows syncell bases fabricated in different sizes and shapes.
Figure 72A:
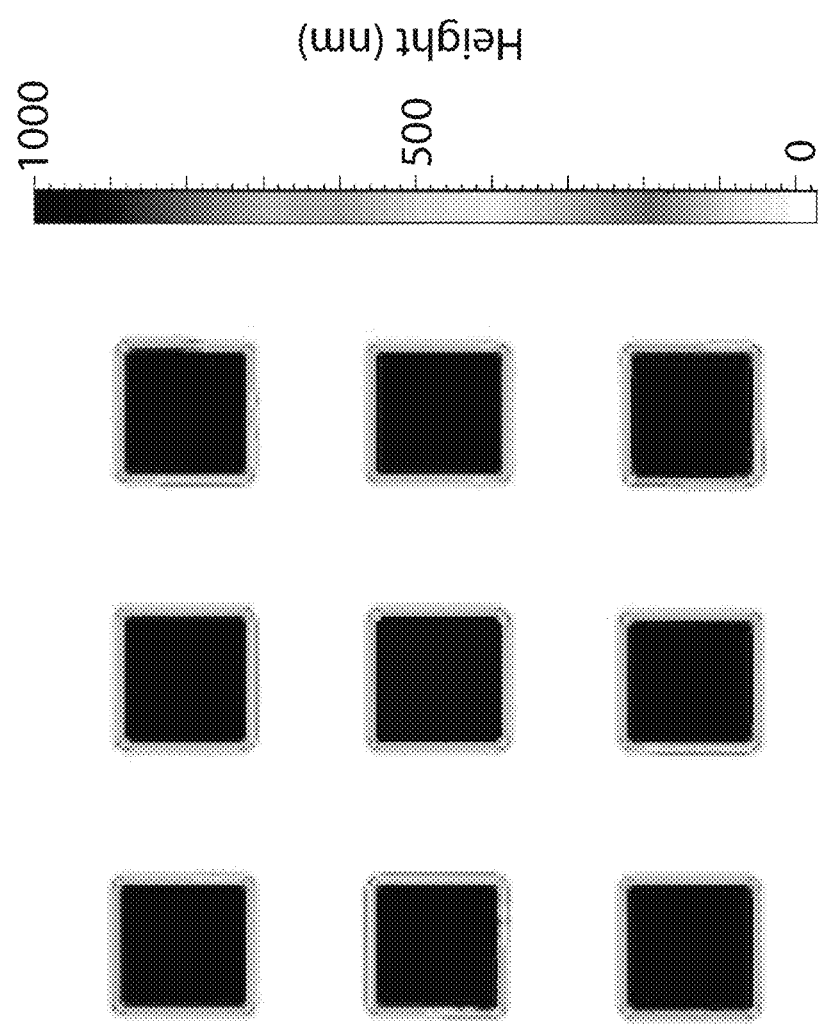
FIG. 72A shows syncell profile scan for 1 μm thick syncells. Scale bar: 50 μm.
Figure 72B:
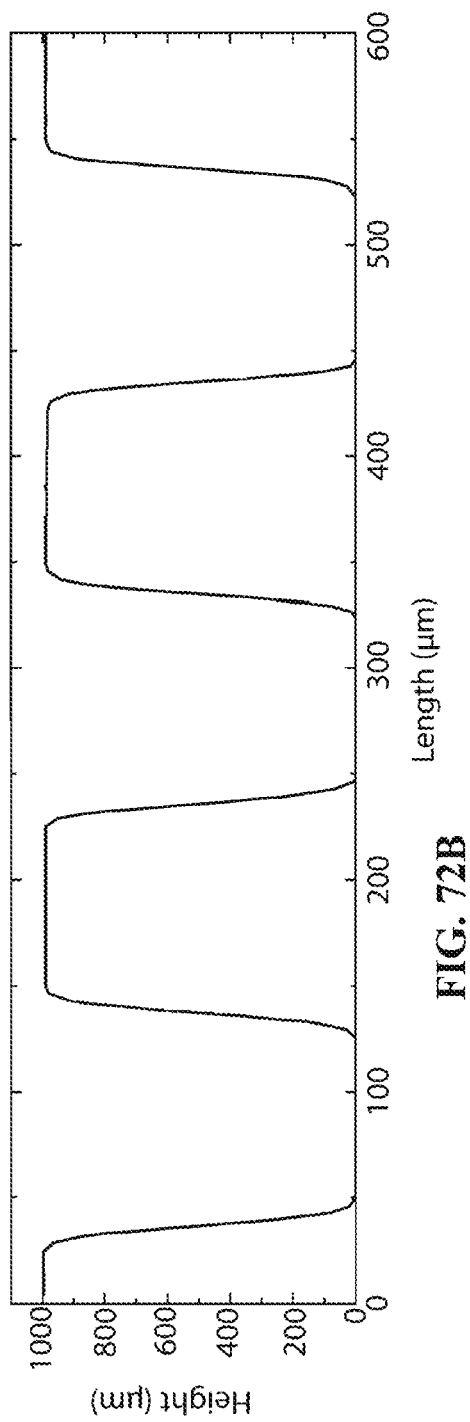
FIG. 72B shows a line scan extracted from FIG. 72A across several syncells.
Figure 72C:
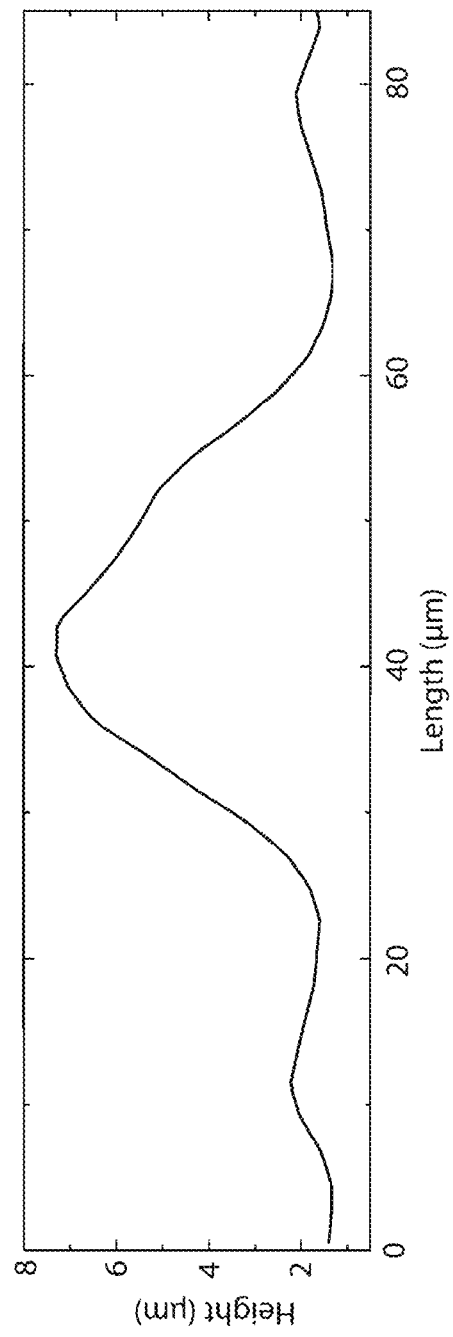
FIG. 72C shows a line scan extracted from FIG. 72A across the top surface of a single syncell.

Due to their high aspect ratio, micrometer-scale 2D materials have low mechanical stability that limits their application off-substrate. To circumvent this, a syncell base that plays a role of the carrier substrate for 2D devices was designed. The syncell base material is a critical choice: It should remain stable during various fabrication stages (2D material transfer, patterning, lift off, etc.) that often require development steps in different solvents. Using the SU-8 photoresponsive polymer, it can be processed with micrometer precision and becomes very stable after crosslinking. Conventional photolithography allows syncell bases' fabrication in different shapes and sizes that can be targeted for different designs and applications (FIG. 71). These fabricated bases (100×100×5 μm$^3$) demonstrate surface RMS roughness <5 nm, providing smooth surfaces for 2D devices (FIGS. 72A-72C). By etching away the silicon substrate, syncell bases can be further released from the substrate.

Figure 66A:
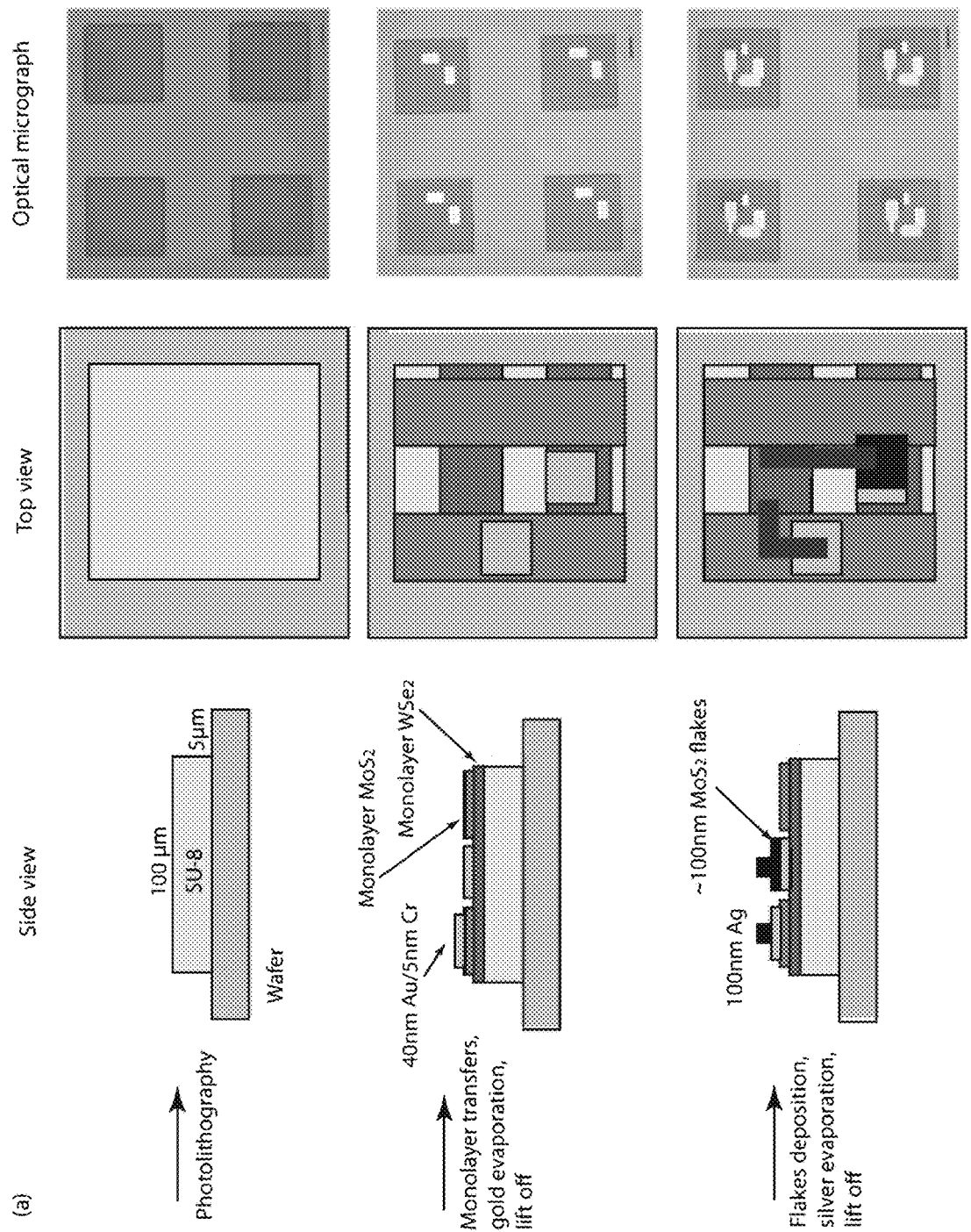
Figure 73:
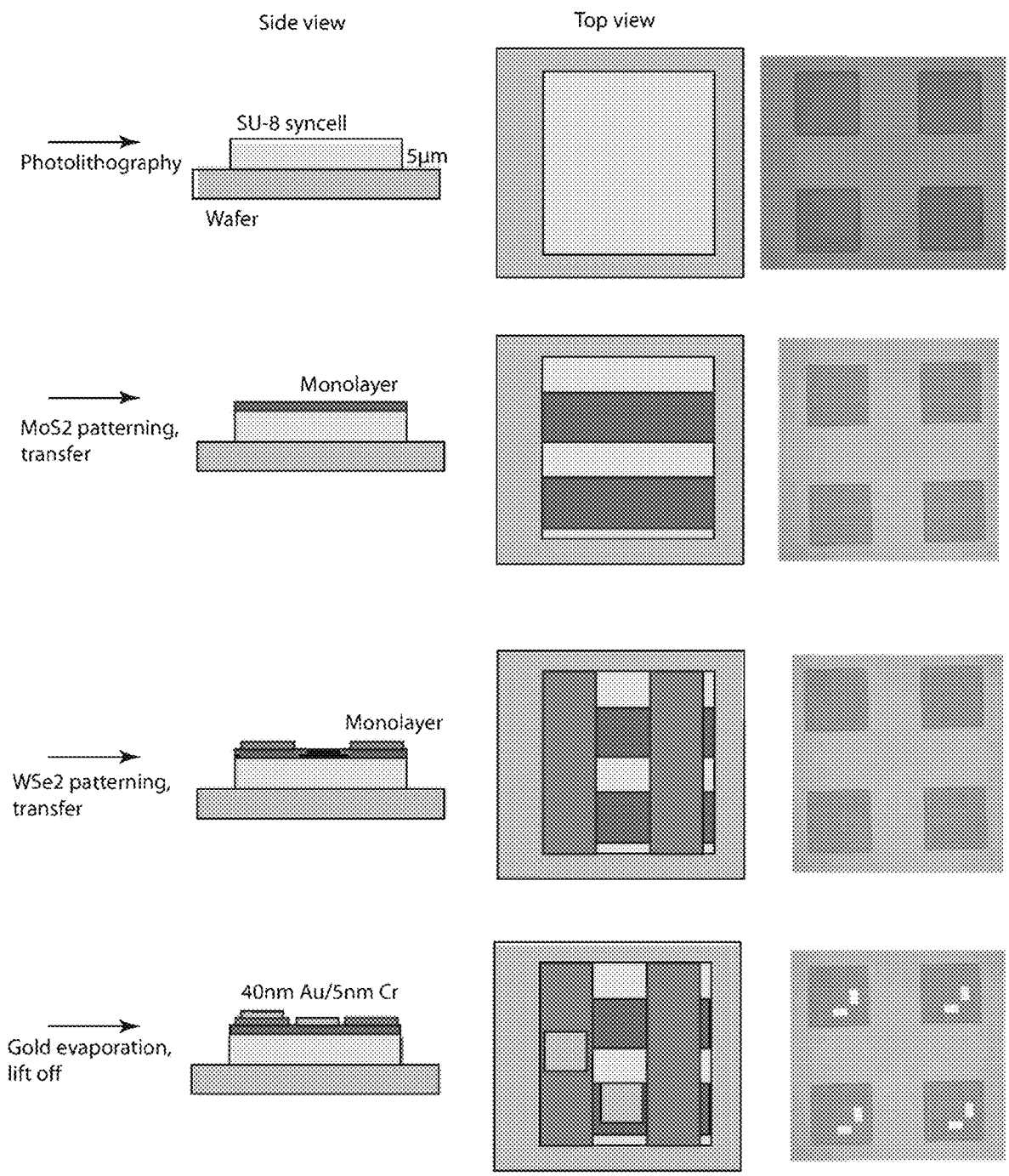
FIG. 73 shows syncell fabrication layout. Optical micrographs demonstrate 100 μm square syncells. Schematics are not to scale.
Figure 73:
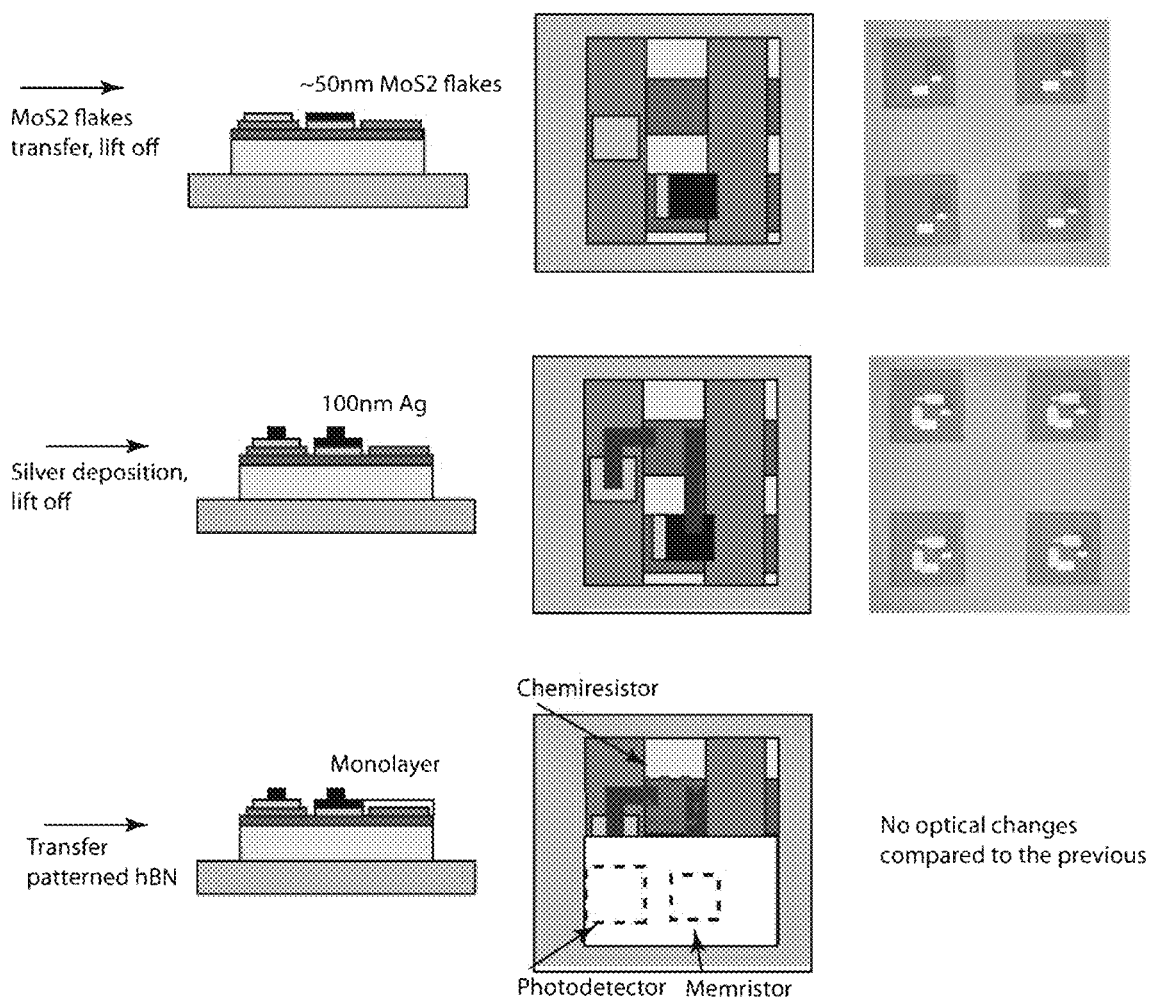
Figures 74A, 74B, 74C:
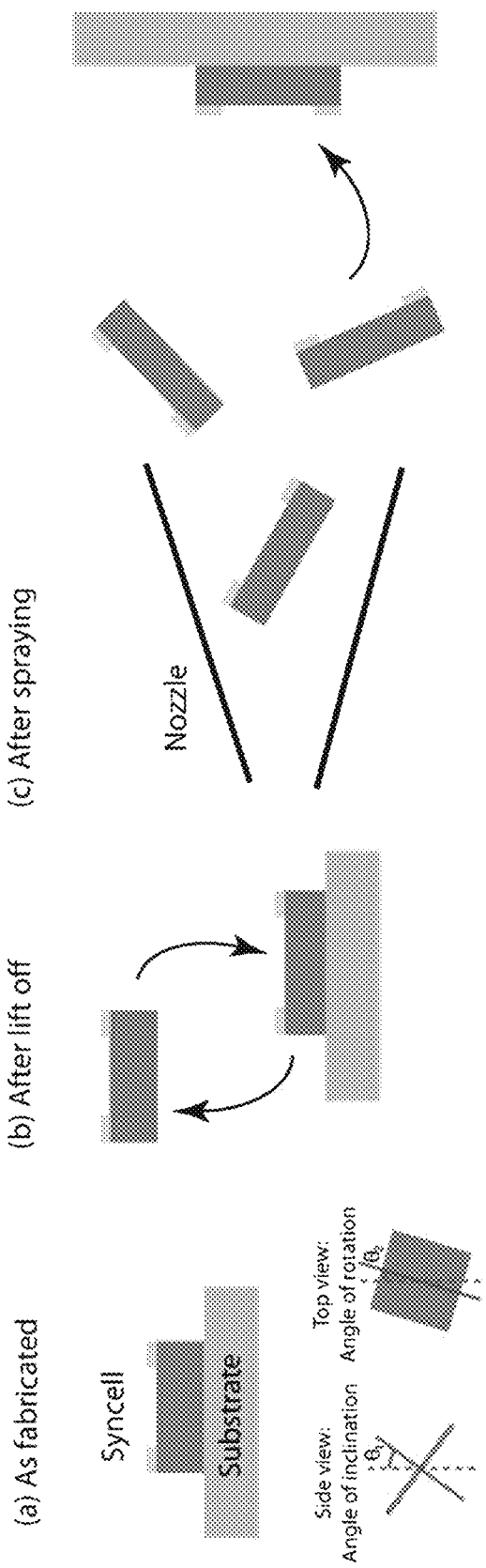
FIGS. 74A-74E show types of syncell testing.
Figures 74D, 74E:
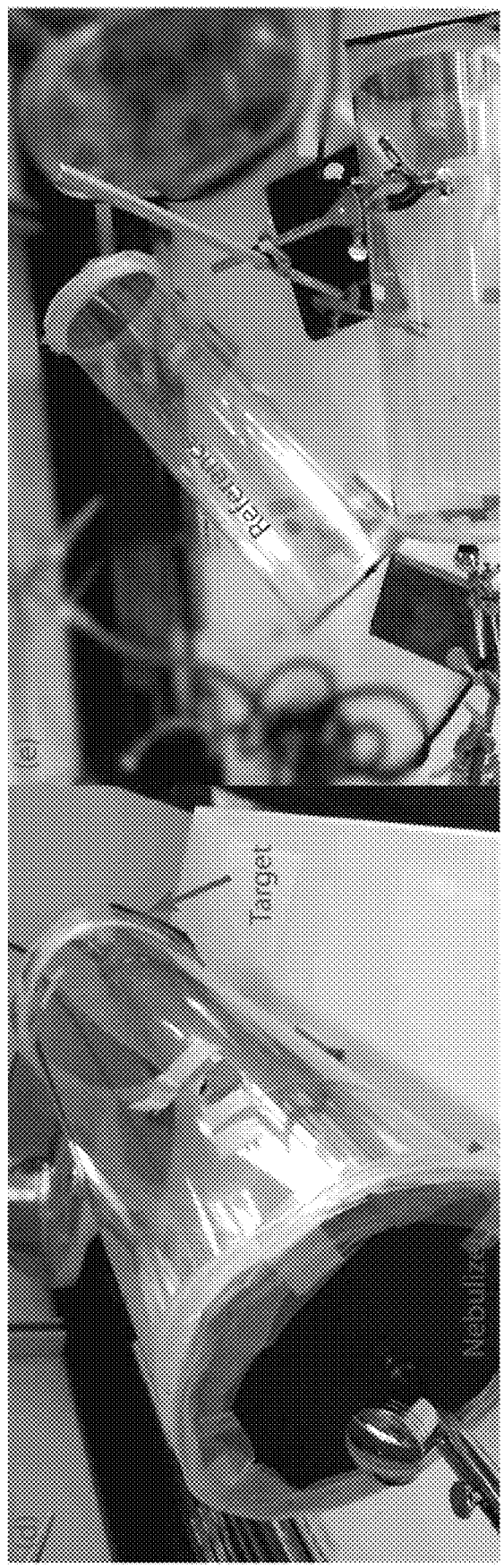

To demonstrate the performance of the electrical circuit on the syncell base, an electrical state machine was designed with elements of combinational logic. To this end, three components have been chosen: a power source, a switch, and a memory element that are implemented by a photodetector, a chemiresistor, and a memristor, respectively (FIG. 66B). These components have to fulfill two important aspects: power requirements (they should operate under power that can be harvested, stored, or delivered to a syncell) and material requirements (2D materials should be chosen from the ones that can be grown over large area to fabricate multiple identical syncells). As a solution, the photodetector is built based on a p-n heterojunction of MoS$_2$ and WSe$_2$ monolayers. Another MoS$_2$ monolayer serves as a chemiresistor that changes its conductance upon the binding of external analytes. Finally, the memristor is composed of MoS$_2$ flakes sandwiched between gold and silver electrodes. A high-throughput clean room fabrication process is developed to assemble these components into the 2D electrical circuit, producing >2500 syncells in one batch (FIGS. 66A and 73). The syncell operates in the following way: the photodetector generates voltage only if it is illuminated with light; the chemiresistor switches its conductance after the analyte binding; the memristor changes its state from OFF to ON if the applied voltage from the photodetector exceeds a threshold voltage. This configuration can be used as a state machine, using light and analyte as two inputs and the memory state as an output. This can be summarized as two IF blocks and the logic operator AND on the block diagram: The syncell memory changes its state from OFF to ON if both light shines on the photodetector and the analyte binds to the chemiresistor (FIG. 66C).

Basic Components

Figure 76B:
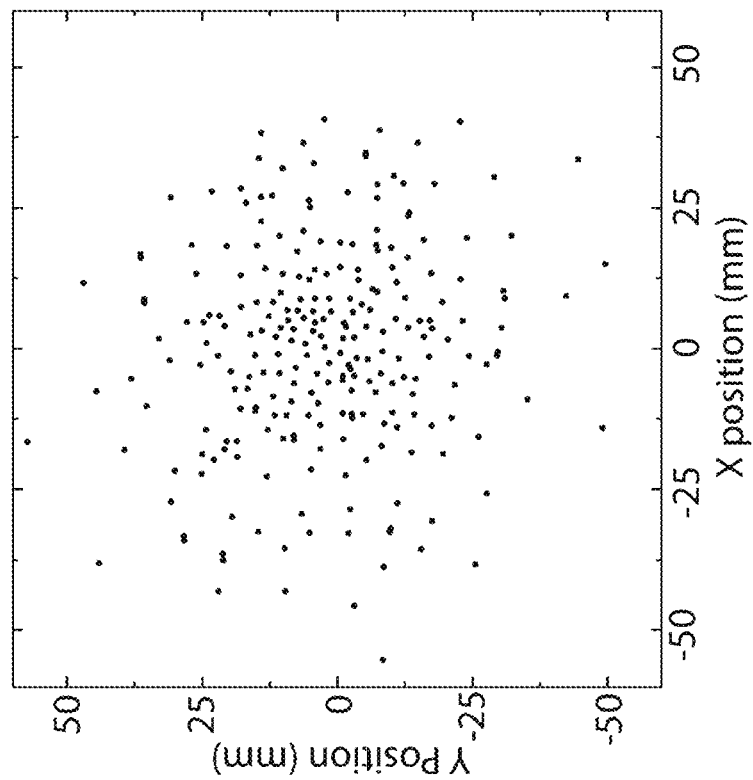
FIGS. 76A-76C show syncell distribution after the flight.
Figure 76A:
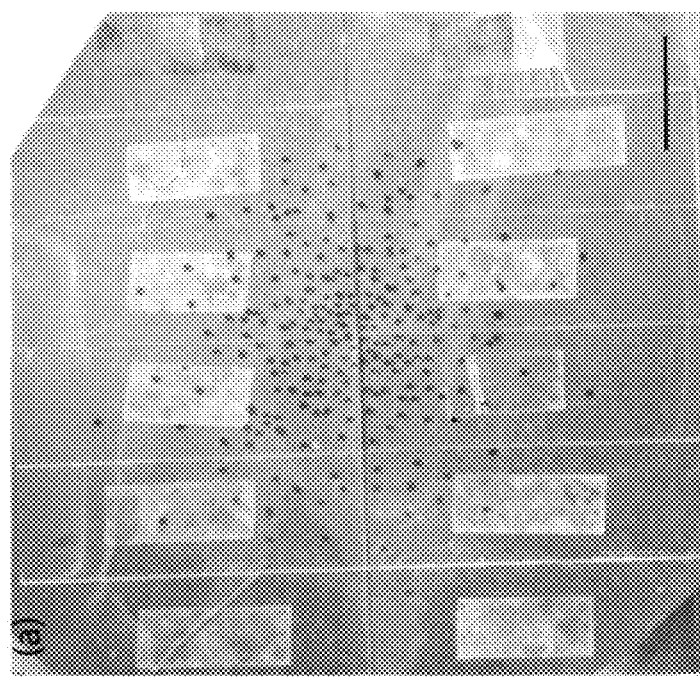
Figure 76D:
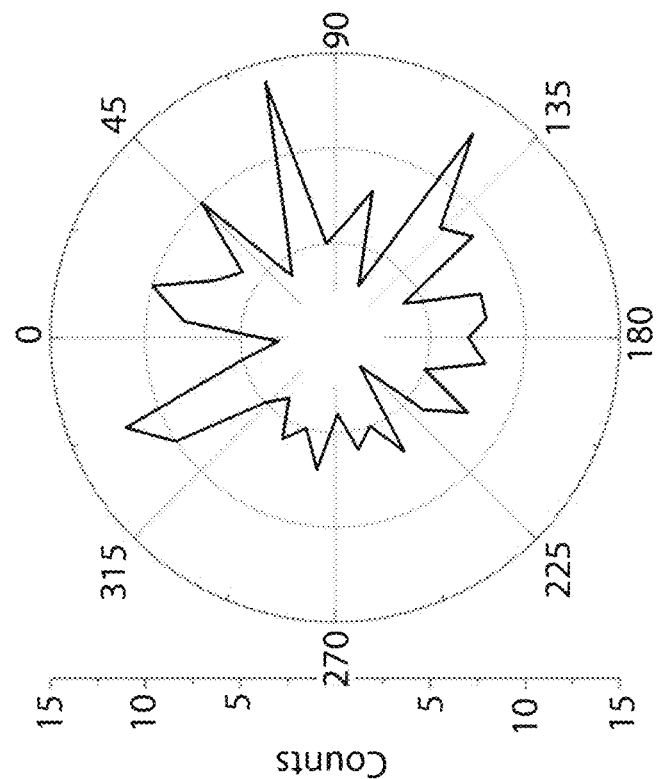
FIG. 76D shows angle distribution diagram extracted from FIG. 76B, showing no preferential direction.
Figure 76C:
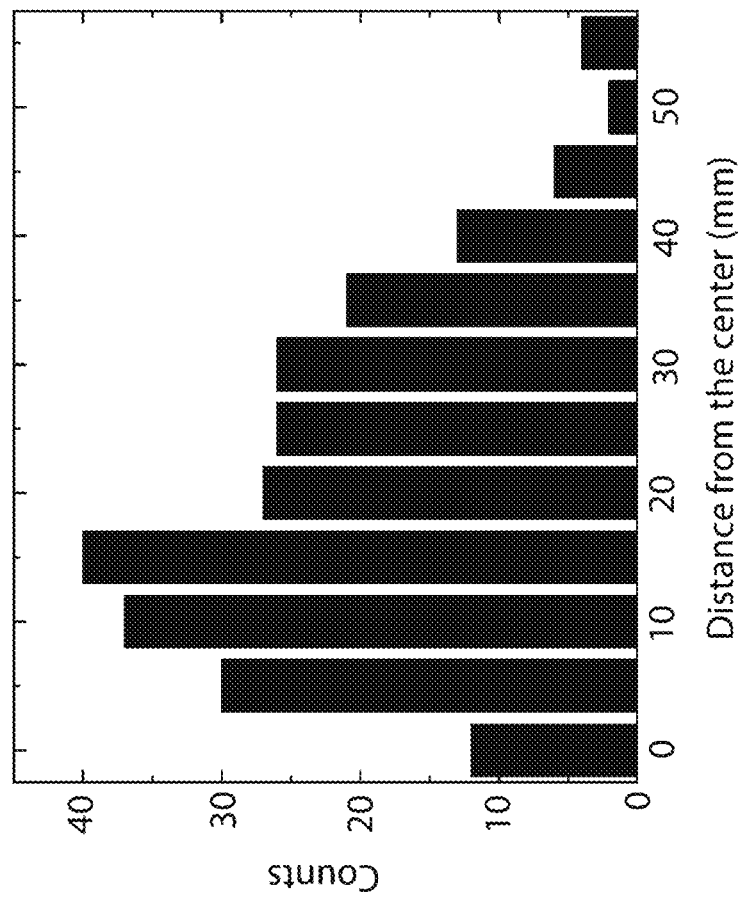
Figure 77B:
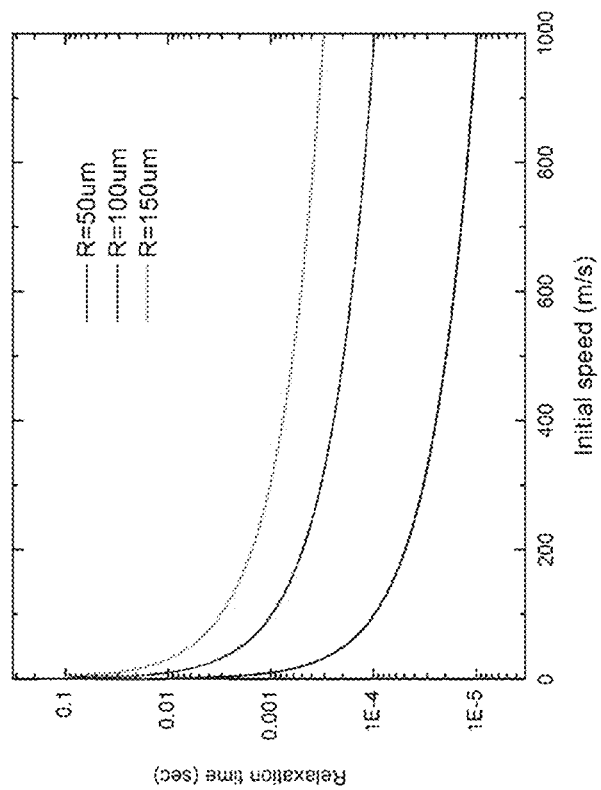
FIGS. 77A-77C show in flight kinetics.
Figure 77A:
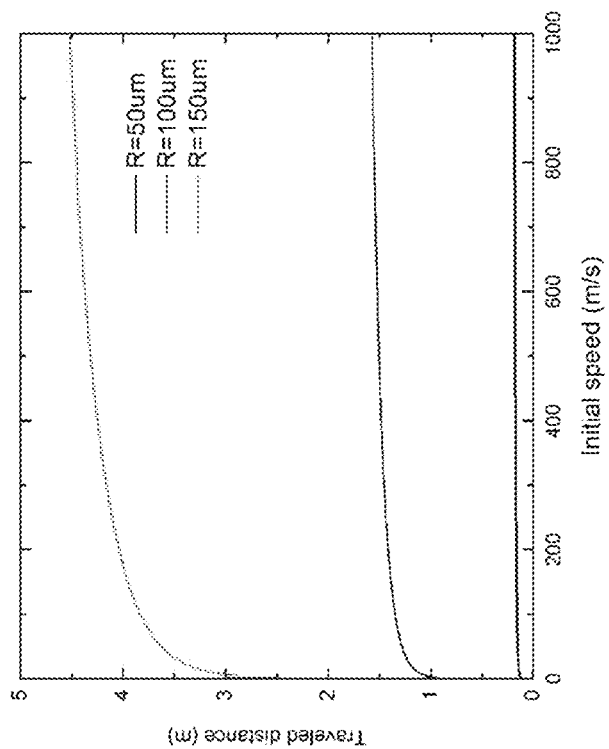
Figure 77D:
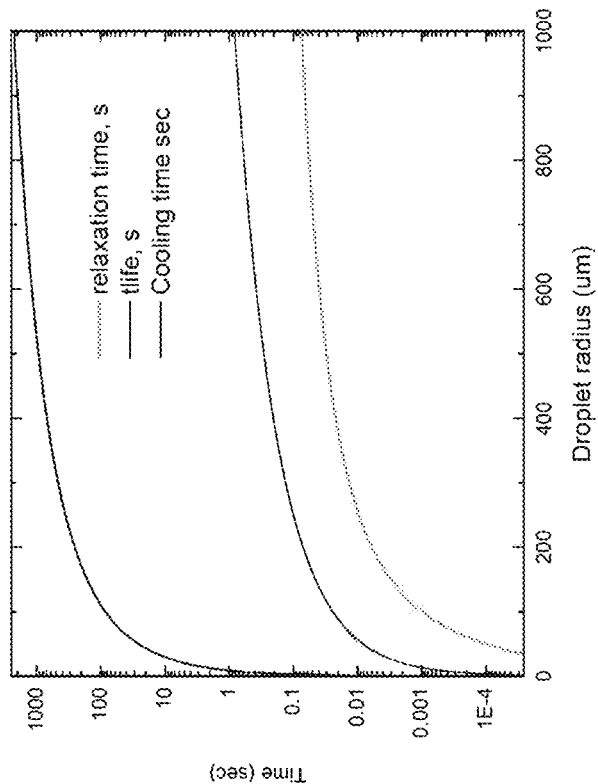
FIG. 77D shows comparison between relaxation time, cooling time (taking the initial speed to be 100 m/s), and lifetime shows that the relaxation time is much shorter as compared to the lifetime.
Figure 77C:
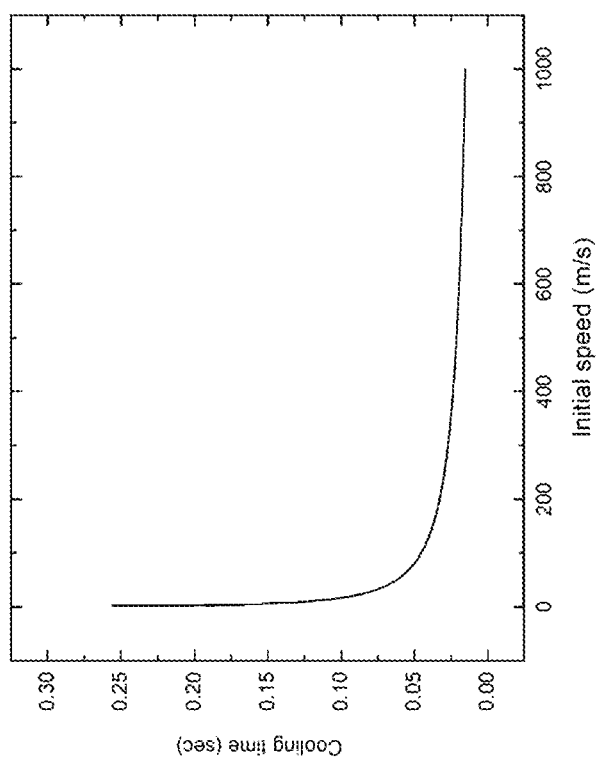
Figures 78A, 78B:
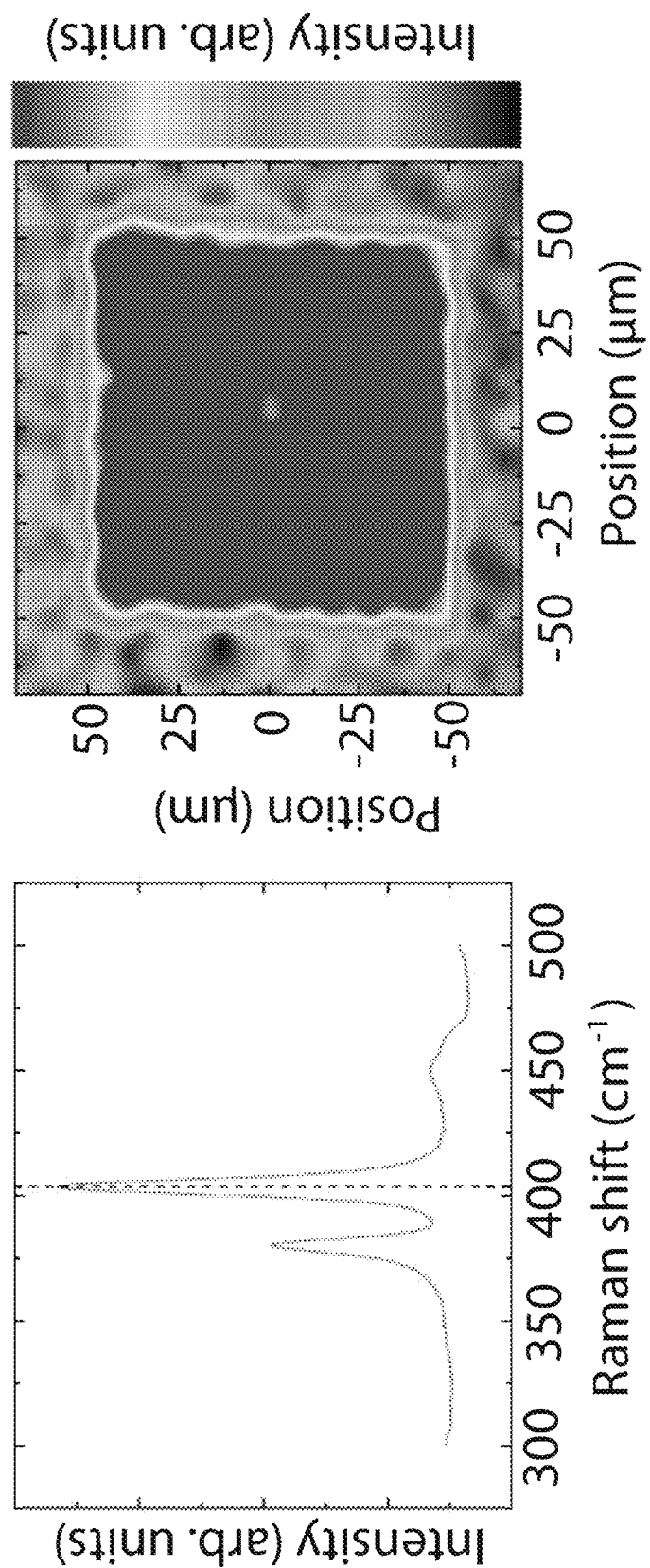
FIGS. 78A-78D show monolayer $MoS_2$ characterization.
Figure 78D:
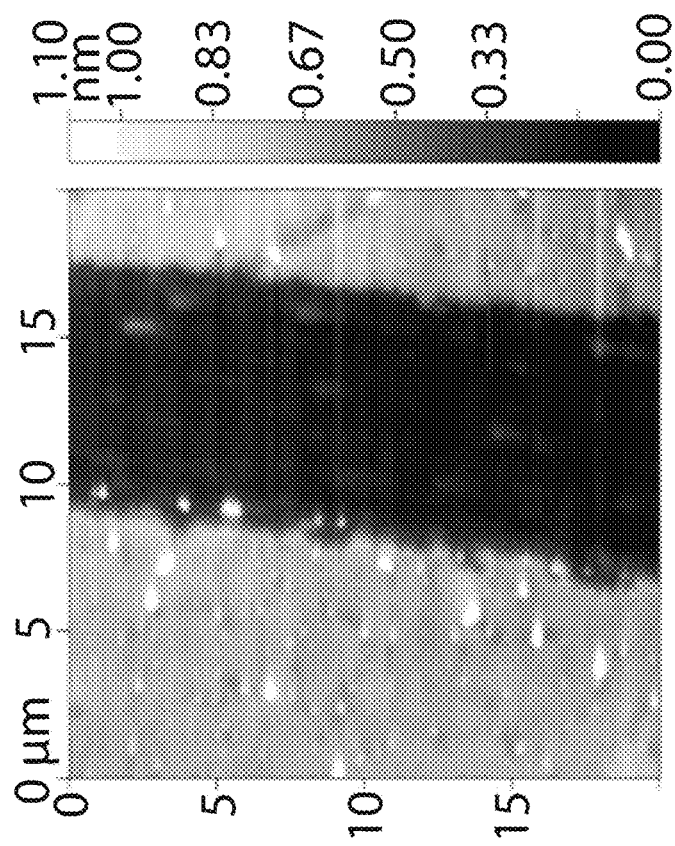
Figure 78C:
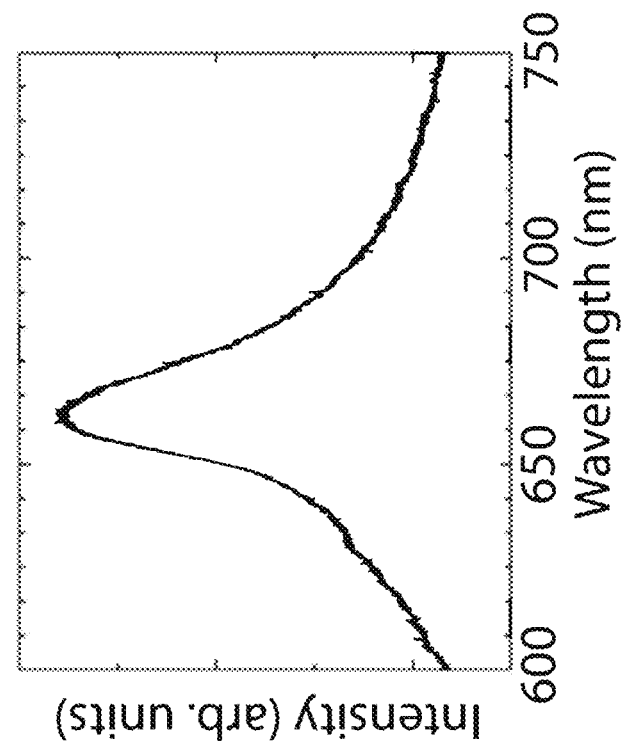
Figure 78E:
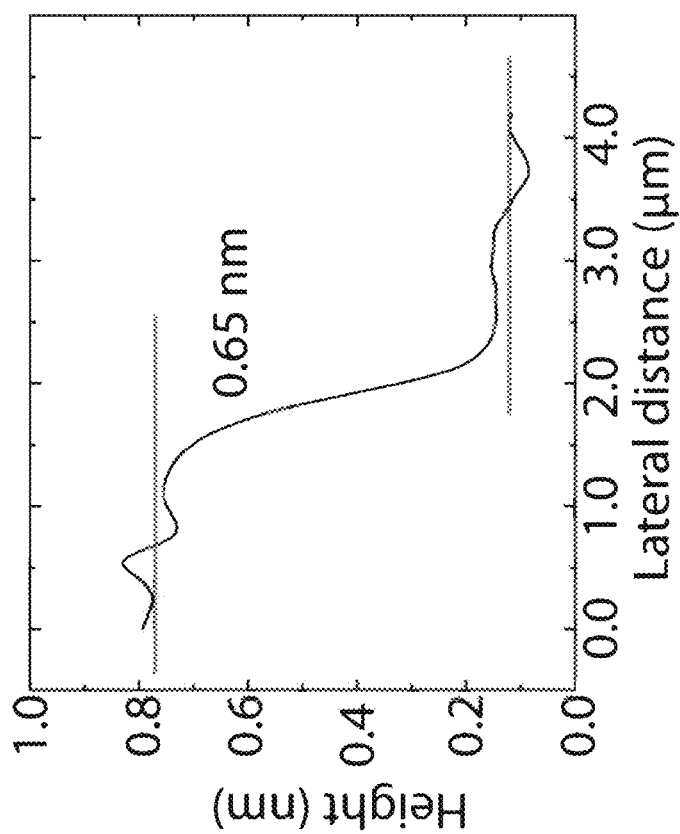
Figure 79B:
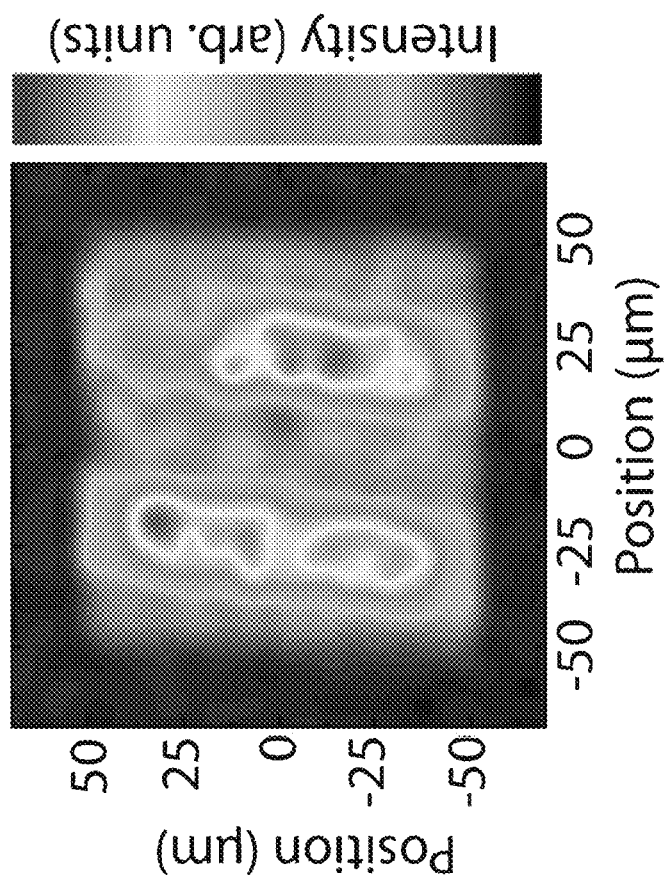
FIGS. 79A-79D show monolayer $WSe_2$ characterization.
Figure 79A:
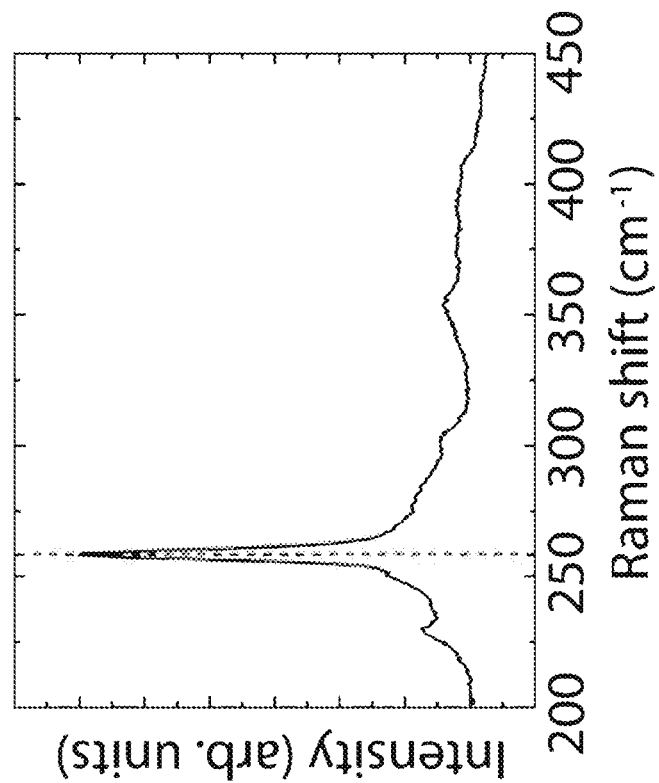
Figure 79D:
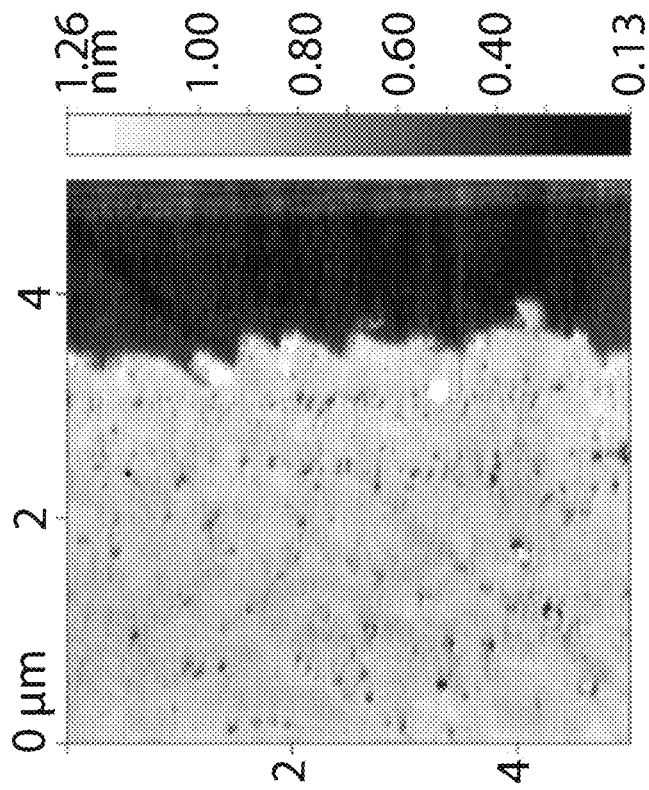
Figure 79C:
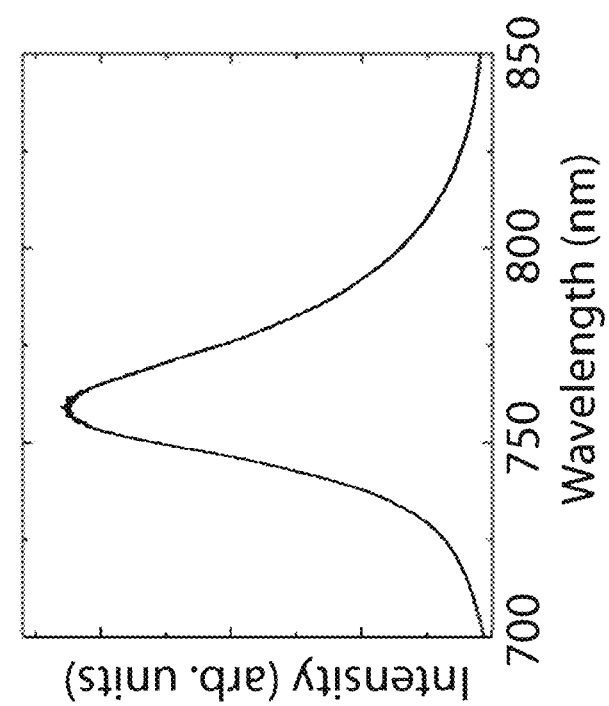
Figure 79E:
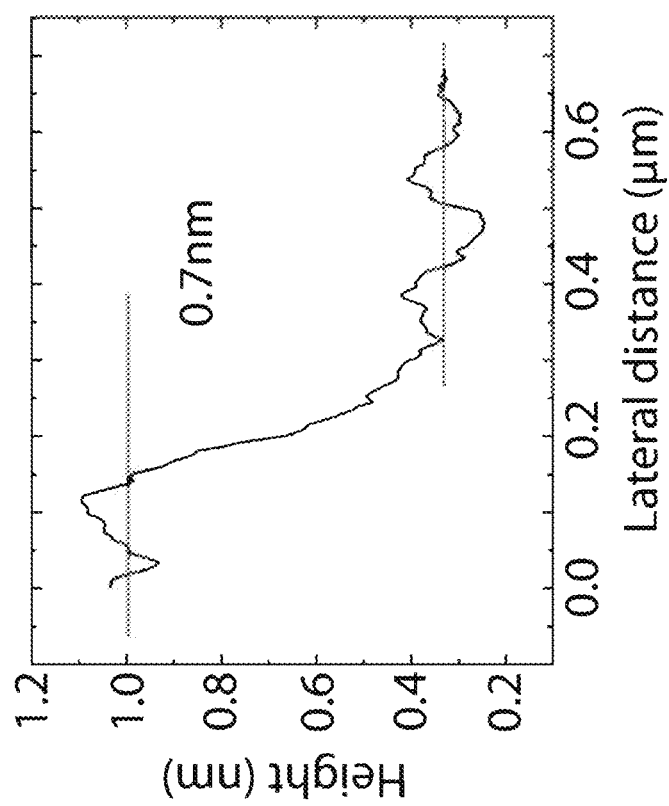

The performance of electronic devices changes when they are removed from a native substrate due to the imposed stretch and strain, however 2D materials possess higher strain limits as compared to the conventional III-V materials. See, Salvatore, G. A., et al., *Wafer-scale design of lightweight and transparent electronics that wraps around hairs*. Nature Communications, 2014. 5: p. 2982, and Akinwande, D., N. Petrone, and J. Hone, *Two-dimensional flexible nanoelectronics*. Nature Communications, 2014. 5: p. 5678, each of which is incorporated by reference in its entirety. To explore the performance of the devices, syncells were tested in three configurations: (1) as-fabricated on the silicon substrate, (2) after liftoff, and (3) after spraying using a nebulizer across a 0.6 m distance in a 0.15 m diameter tube (FIGS. 74A-74E). After liftoff, syncells can be occasionally bent or aggregated due to the capillary forces during drying (FIGS. 75A-75B). In a typical nebulizer experiment, using the microscope N=244 syncells had landed on the target at the other end of the tube, with most of them concentrated in 0.06 m diameter circle and having no preferential angular direction (FIGS. 76A-76C). Droplets ejected by the nebulizer have 7-100 m/s initial speed and <0.3 mm diameter. Numerical calculations show that such momentum allows them to travel 3.0-3.8 m (with travel times <3 ms) before the complete stop (FIGS. 77A-77C). Water droplets of this size dry within 25-160 sec, supporting that the droplets do not dry during flight.

Figure 67B:
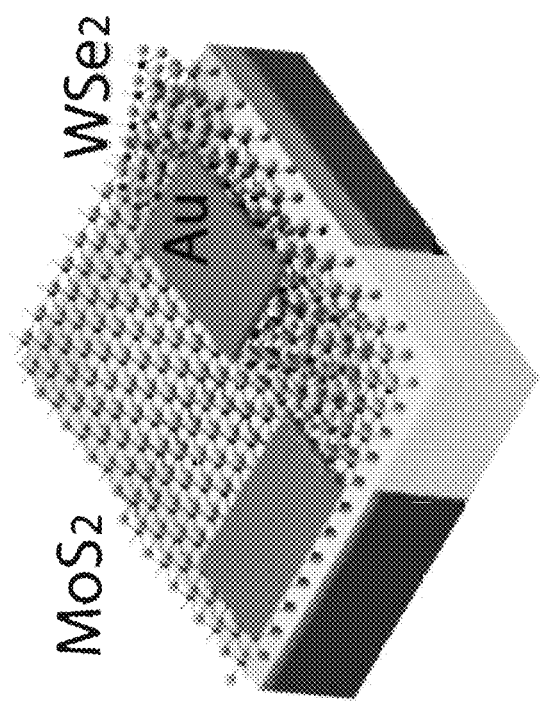
FIGS. 67A-67L show individual components of the syncell.
Figure 67A:
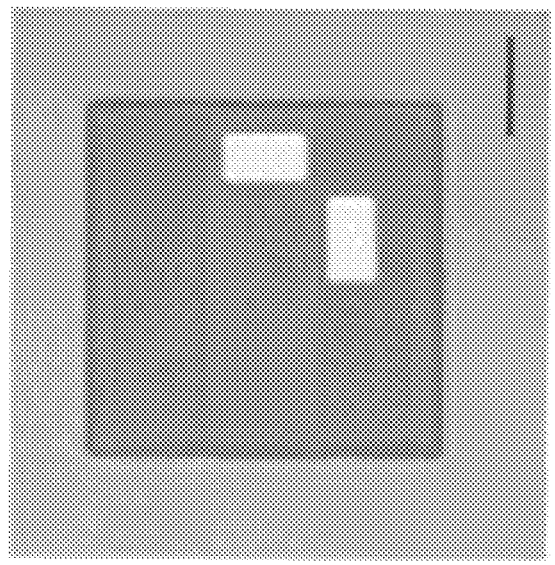
Figure 67D:
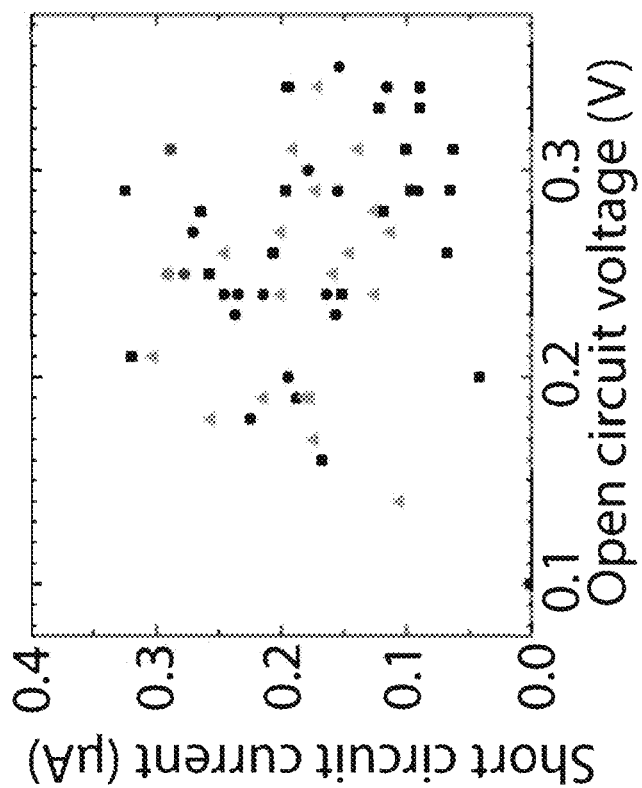
Figure 67C:
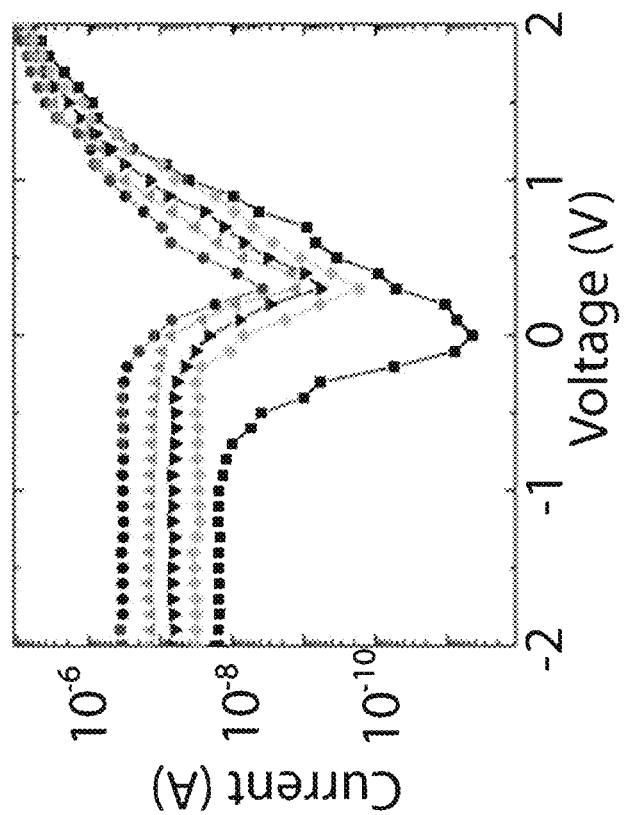
Figure 80B:
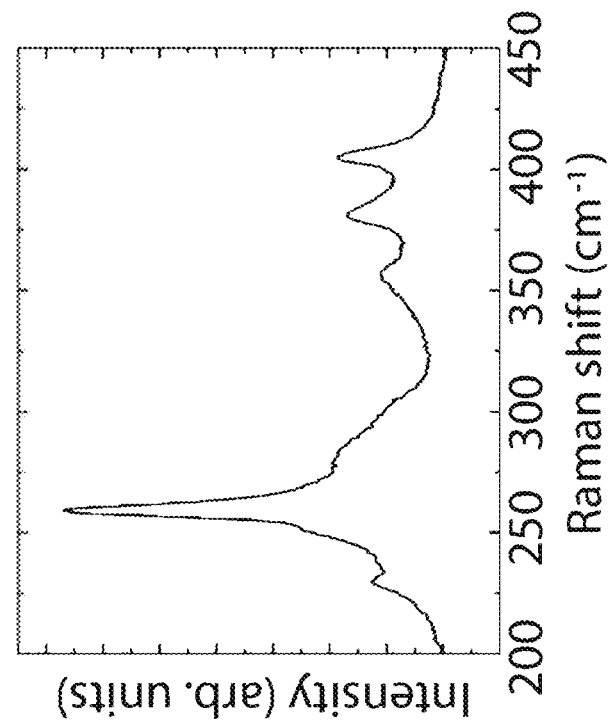
FIGS. 80A-80B show optical characterization of $MoS_2$/$WSe_2$ monolayer junction.
Figure 80A:
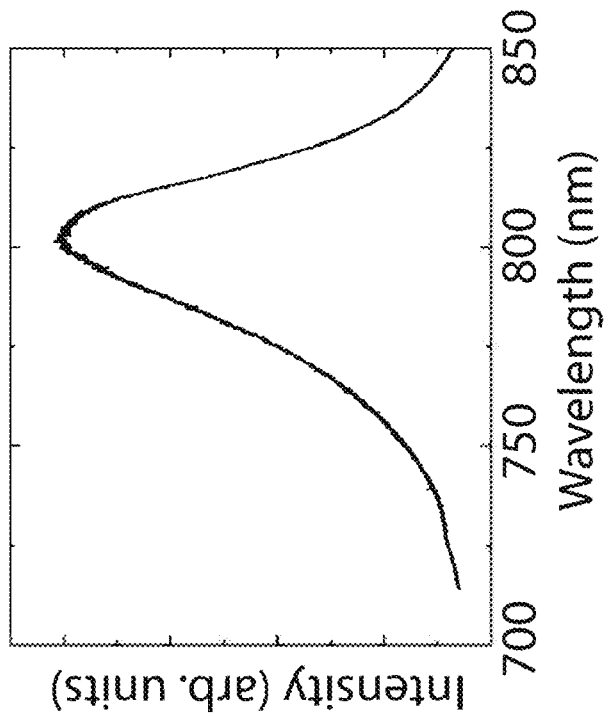
Figure 81D:
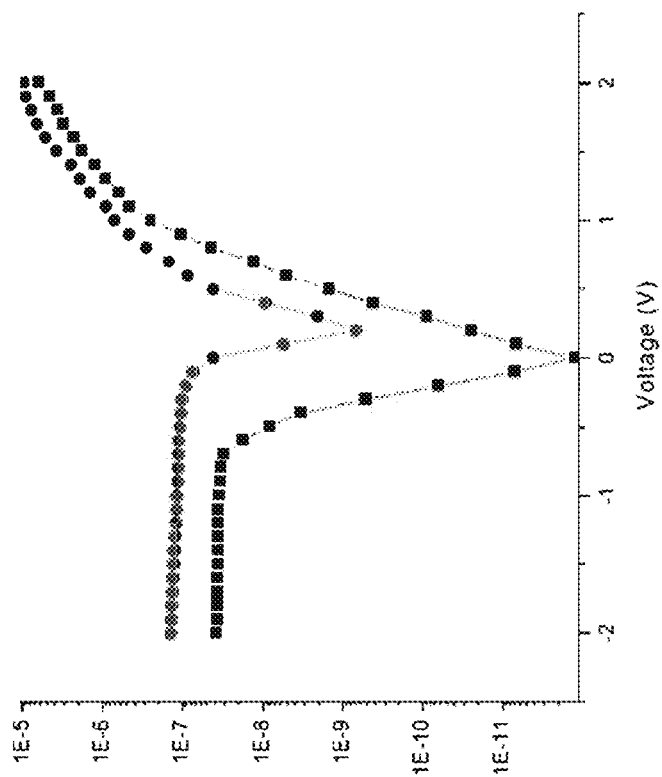
Figure 81C:
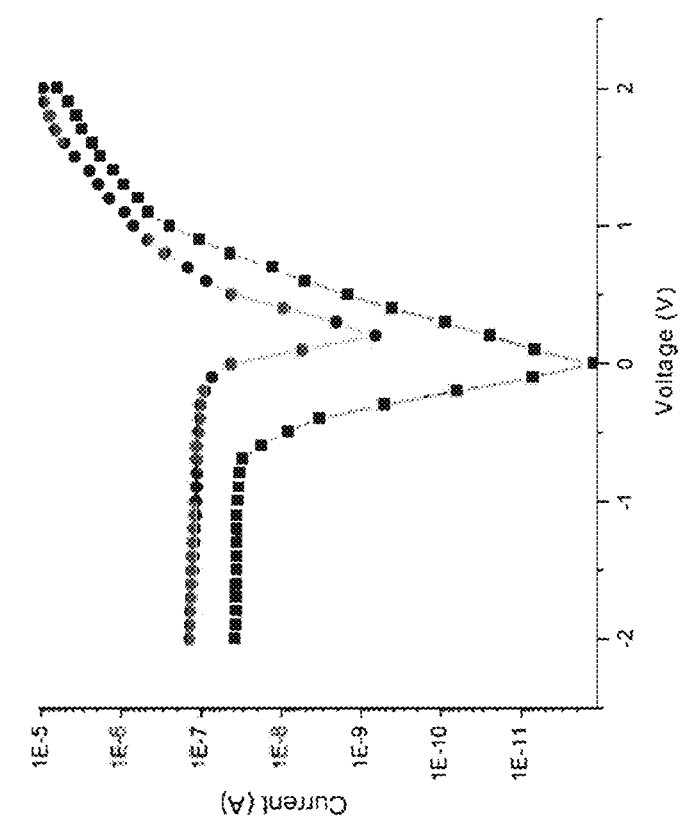
Figure 81F:
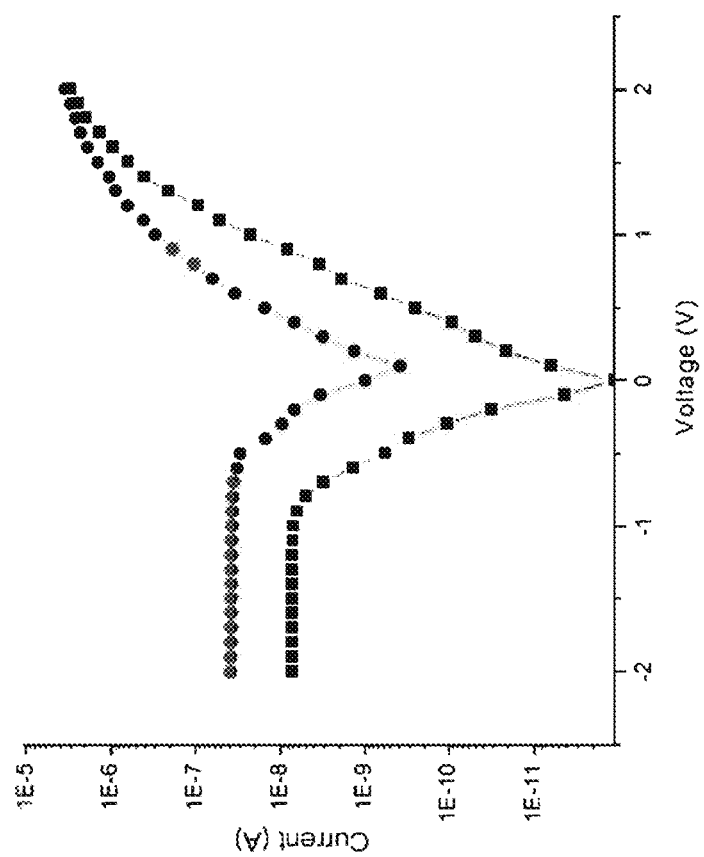
Figure 81E:
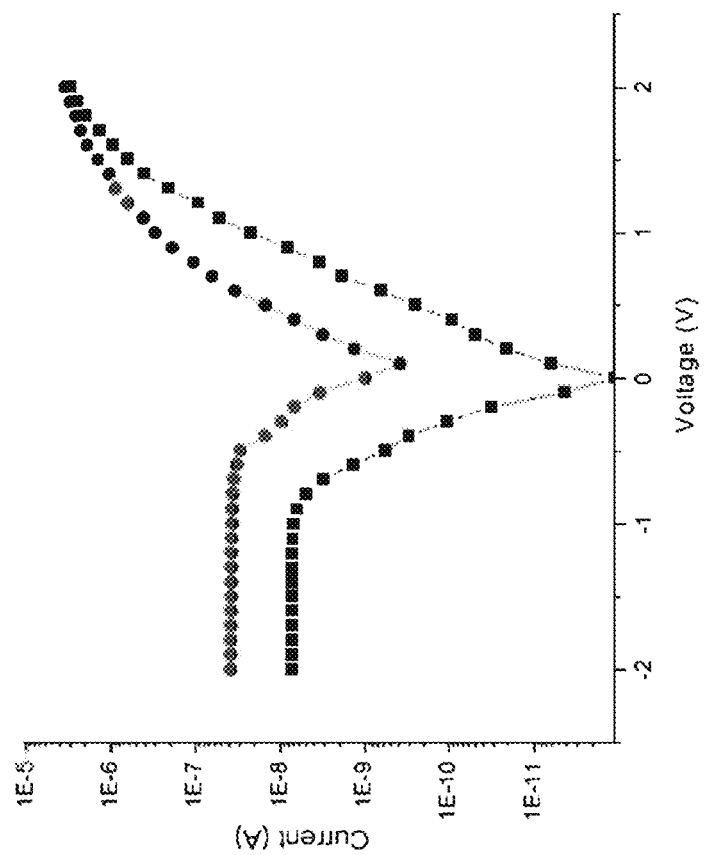
Figure 81H:
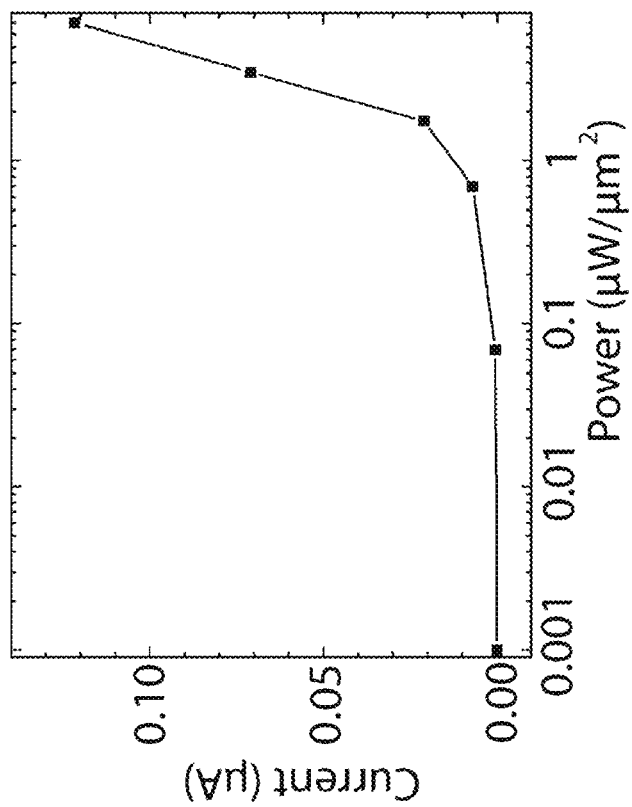
FIG. 81H shows a photocurrent generated by the device in FIG. 81G depending on the laser illumination intensity.
Figure 81G:
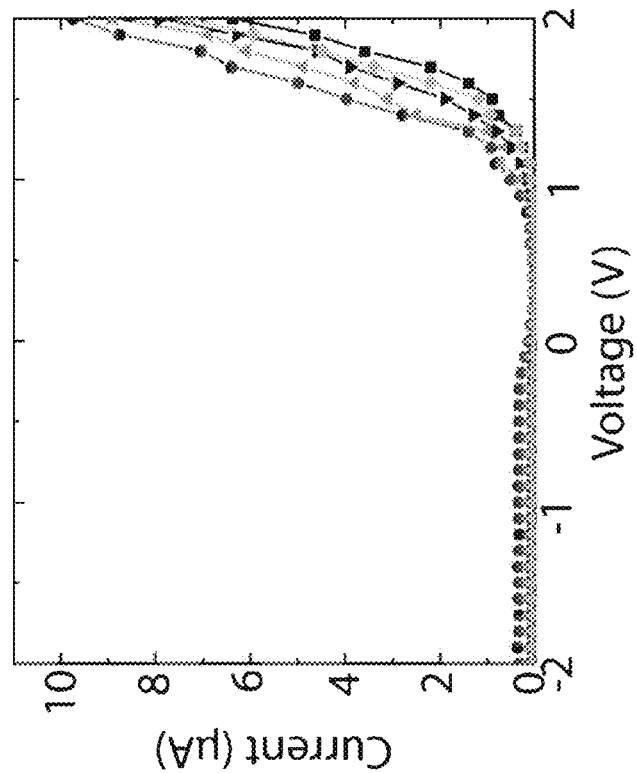
FIG. 81G shows a typical current-voltage characteristic plotted in the linear scale.

To test individual components, separate syncells were fabricated with isolated devices. The first component is the photodetector, serving as a photocell: It converts light into electrical current that, in turn, can be used to power other 2D components. The 2D photodetector is made of a p-n photodiode comprised of MoS2 and WSe2 monolayers with golden electrodes in a 90° configuration with the minimal distance of ~10 μm (FIGS. 67A and 67B). Photoluminescence measurements, AFM, and Raman mapping were performed (FIGS. 78A-78E and 79A-79E)—all confirming the continuous nature of the MoS$_2$ and WSe$_2$ monolayers. When MoS$_2$ is transferred onto WSe$_2$, a photoluminescence shift from 760 nm to 800 nm was observed (FIGS. 80A-80B) that corresponds to a staggered gap (type II) heterostructure (see Fang, H., et al., *Strong interlayer coupling in van der Waals heterostructures built from single-layer chalcogenides*. Proceedings of the National Academy of Sciences, 2014. 111 (17): p. 6198-6202, which is incorporated by reference in its entirety), proving successful formation of a p-n junction. The photodiode shows photocurrent generation under laser illumination, reaching ε=0.30 V open circuit voltage and $I_{sh}$=0.15 μA short circuit current under 532 nm laser 7 μW/m$^2$ (FIGS. 67C, 67D and 81A-81F), which is comparable to the state-of-the-art values. See, Cheng, R., et al., *Electroluminescence and Photocurrent Generation from Atomically Sharp WSe$_2$/MoS$_2$ Heterojunction p-n Diodes*. Nano Letters, 2014. 14(10): p. 5590-5597, and Ye, L., et al., *Near-Infrared Photodetector Based on MoS$_2$/Black Phosphorus Heterojunction*. ACS Photonics, 2016. 3(4): p. 692-699, each of which is incorporated by reference in its entirety. By testing N=20 random devices, photodetectors retain their characteristics after liftoff (ε=0.27±0.05 V, $I_{sh}$=0.20±0.01 μA), and after spraying (ε=0.24±0.05 V, $I_{sh}$=0.19±0.01 μA) as compared to the on-substrate devices (ε=0.27±0.06 V, $I_{sh}$=0.15±0.01 μA).

Figure 67F:
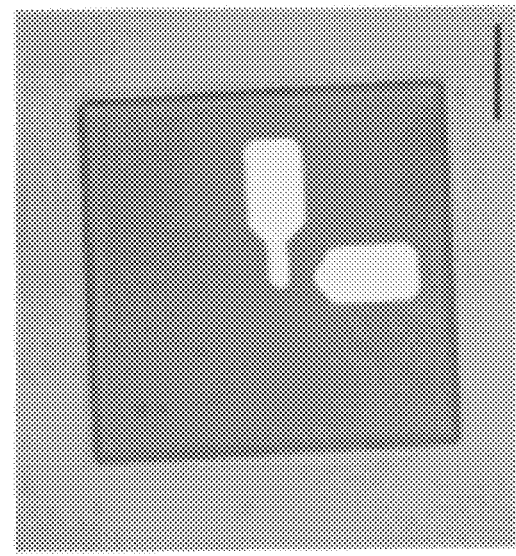
Figure 67E:
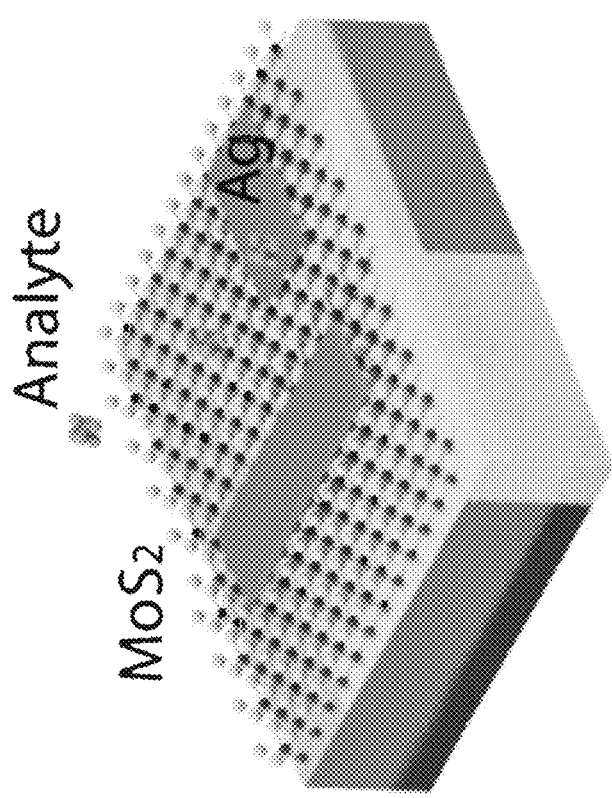
Figure 67H:
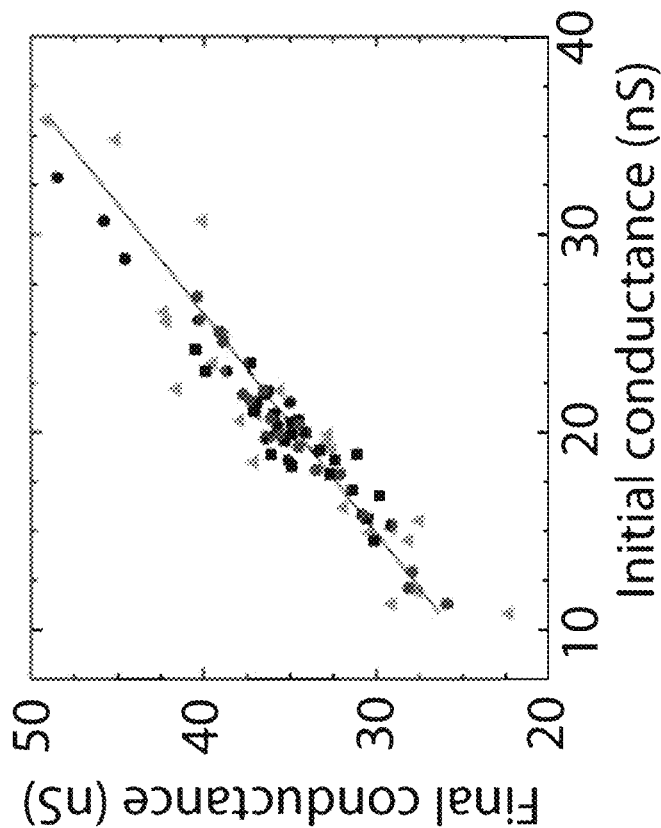
Figure 67G:
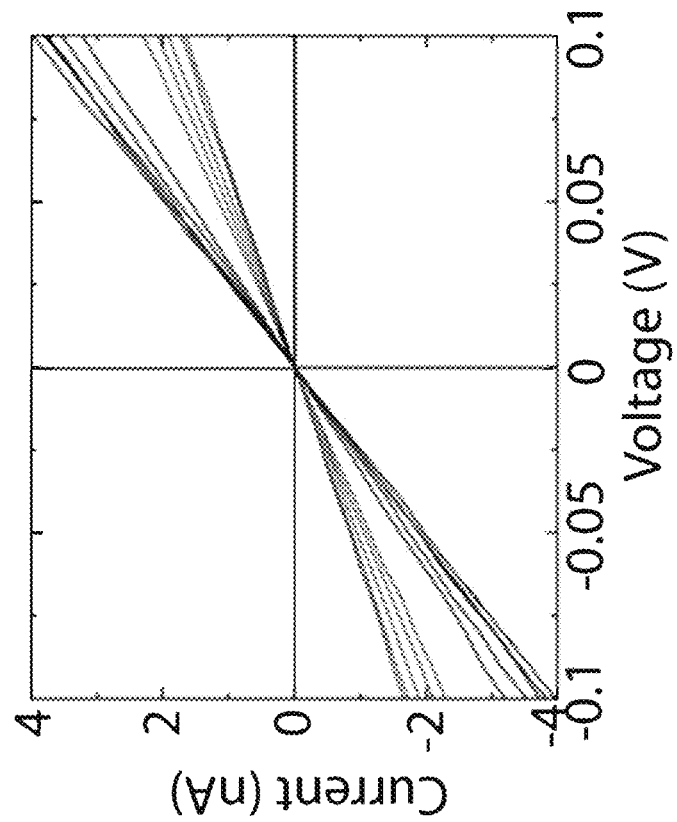
Figure 82A:
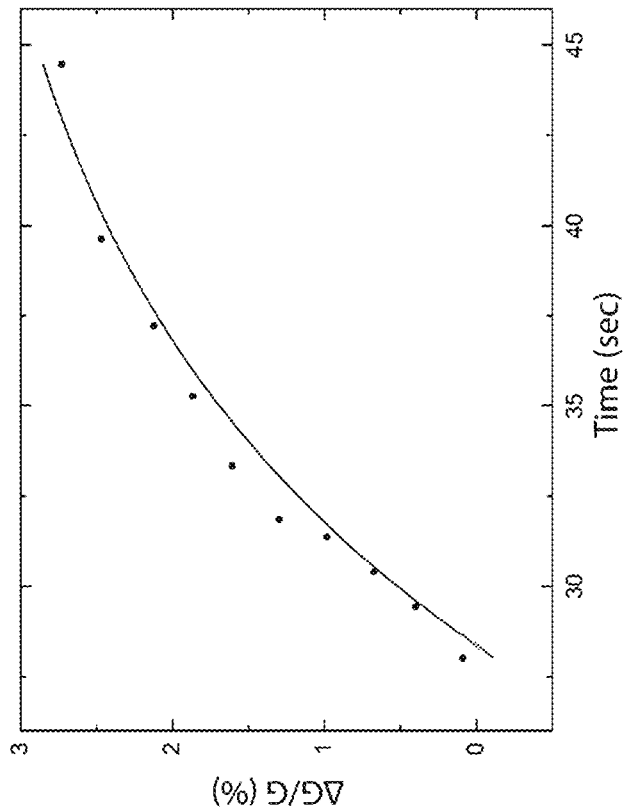
FIGS. 82A-82B show triethylamine-$MoS_2$ binding kinetics. Change in a monolayer $MoS_2$ conductivity during exposure to 1 ppm of TEA (FIG. 82A) and post-exposure recovery (FIG. 82B). Red lines represent theoretical fits.
Figure 82B:
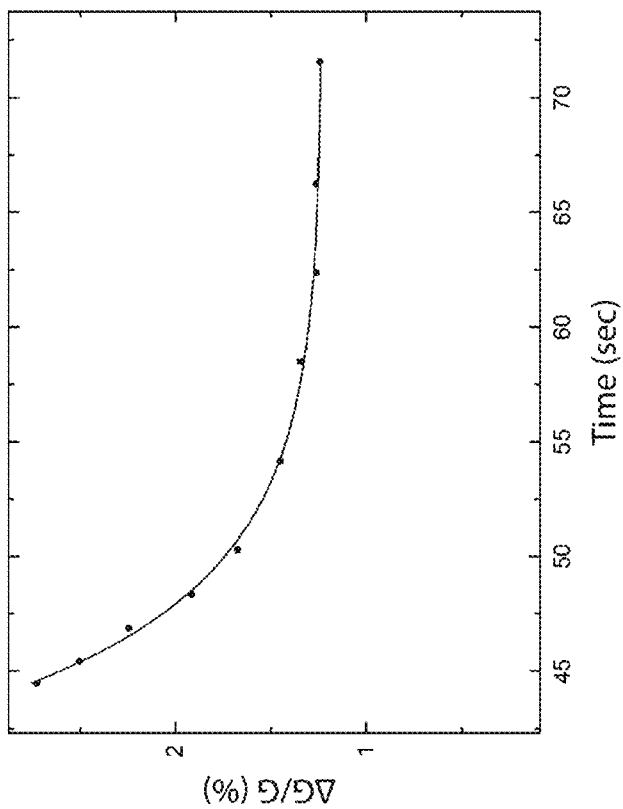

The second component is the chemiresistor. It consists of a MoS$_2$ monolayer that changes its electrical conductance upon molecular adsorption (FIGS. 67E and 67F). It is designed to act as a turn on switch in the state machine. To this end, MoS2 has to increase its conductance, which can be achieved by choosing an analyte with n-type doping. As one example, 10 mM triethylamine (TEA) sprayed on MoS$_2$ increases its conductance (FIGS. 67G and 67H): from $G_{ch}^{in}$=19.812.3 nS to $G_{ch}^{f}$=34.712.8 nS on the silicon; from $G_{ch}^{in}$=21.115.5 nS to $G_{ch}^{f}$=36.115.5 nS for lifted off; from $G_{ch}^{in}$=20.516.6 nS to $G_{ch}^{f}$=35.016.4 nS for sprayed syncells (the second nebulizer located at the top of the tube was used to spray the analyte across the syncell movement direction, FIG. 74E). To understand the reaction kinetics, MoS$_2$-TEA reaction constants were extracted by analyzing continuous conductance measurements of the MoS$_2$ chemiresistor (see Perkins, F. K., et al., Chemical Vapor Sensing with Monolayer MoS2. Nano Letters, 2013. 13(2): p. 668-673, which is incorporated by reference in its entirety): binding constant $k_f$=0.024±0.001 s$^{-1}$ μM$^{-1}$, dissociation constant $k_b$=0.23±0.01 s$^{-1}$, and irreversible constant $k_i$=0.06±0.01 s$^{-1}$ (FIGS. 82A-82B and see kinetics details). The process of MoS2-TEA charge transfer is limited by the surface coverage, providing the maximum of 95% of MoS2 resistance change. See, Mouri, S., Y. Miyauchi, and K. Matsuda, *Tunable Photoluminescence of Monolayer MoS$_2$ via Chemical Doping*. Nano Letters, 2013. 13(12): p. 5944-5948, which is incorporated by reference in its entirety.

Figure 67J:
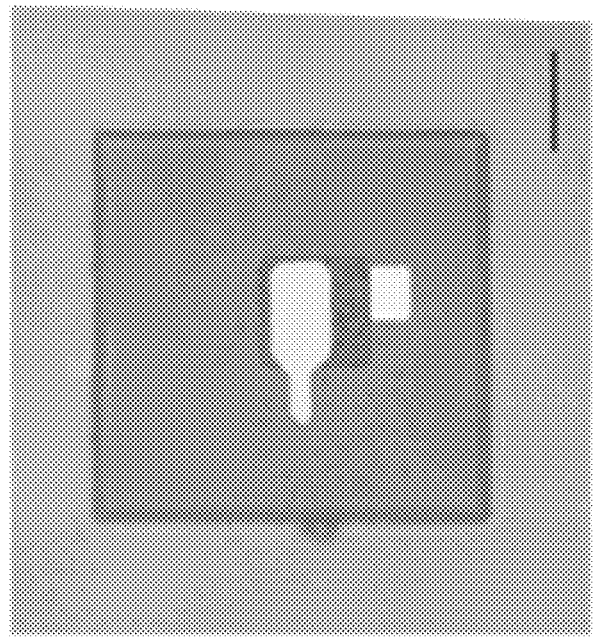
Figure 67I:
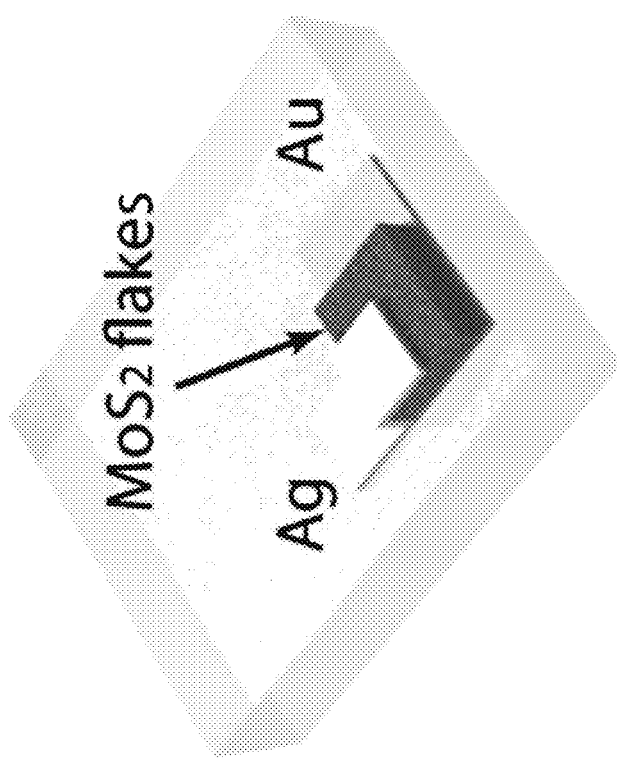
Figure 67L:
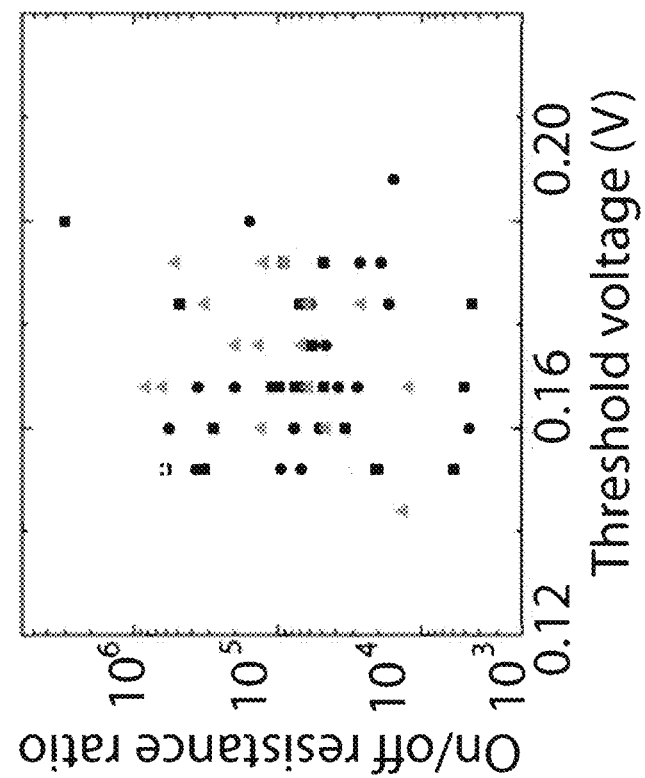
Figure 67K:
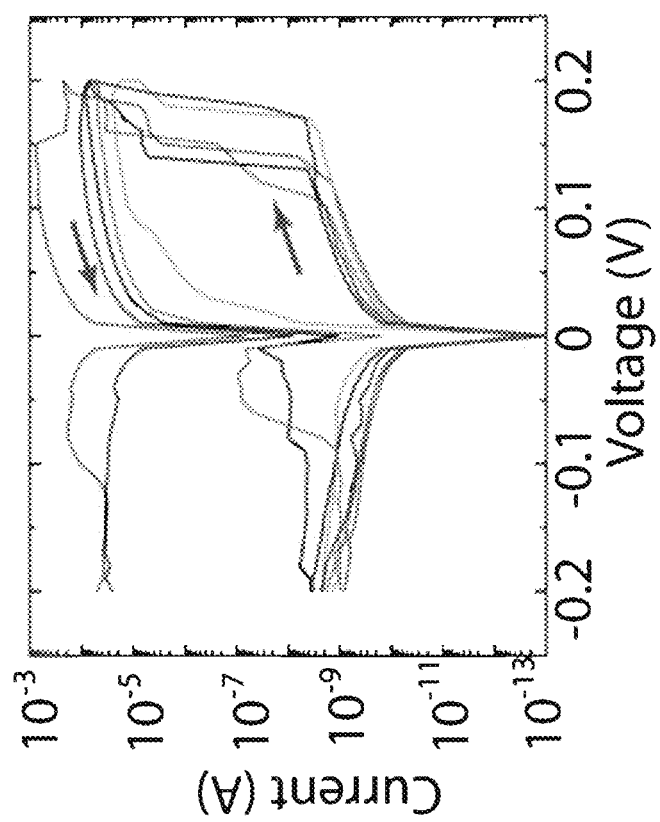
Figures 83A, 83B:
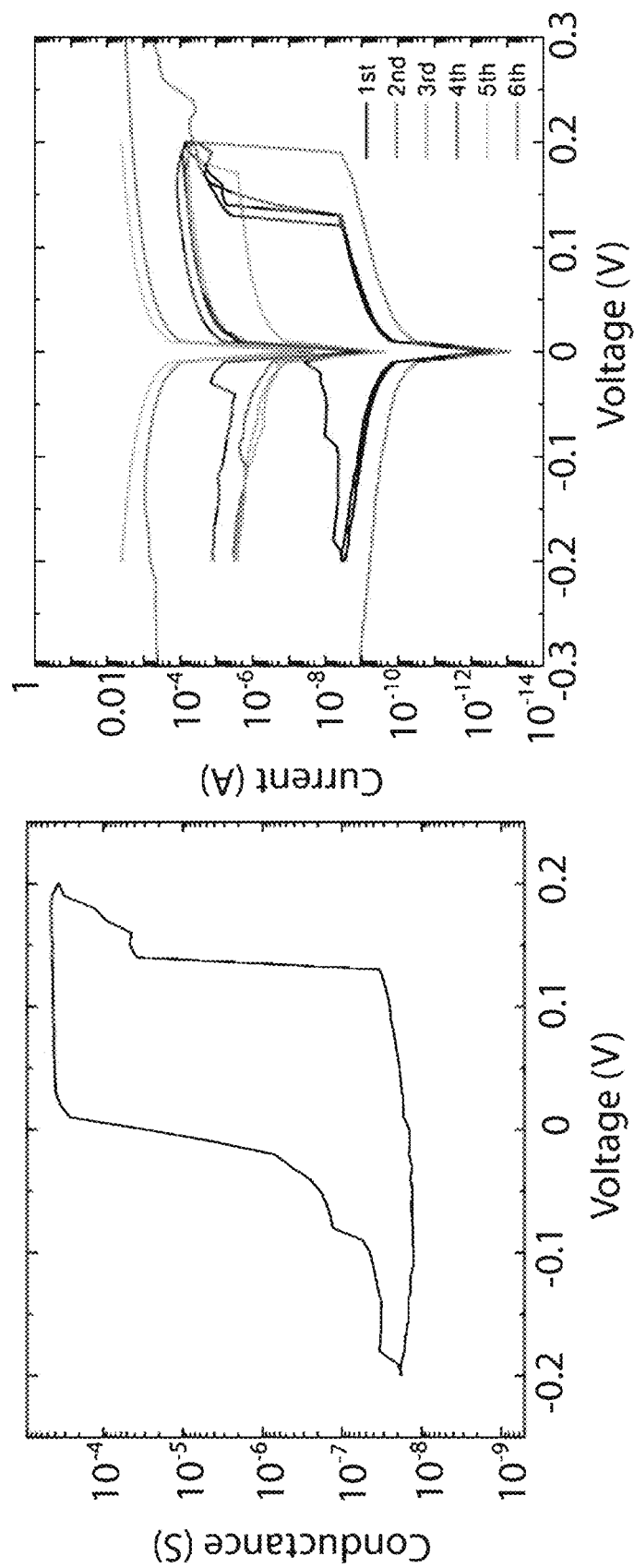
FIGS. 83A-83E show additional memory characteristics.
Figure 83C:
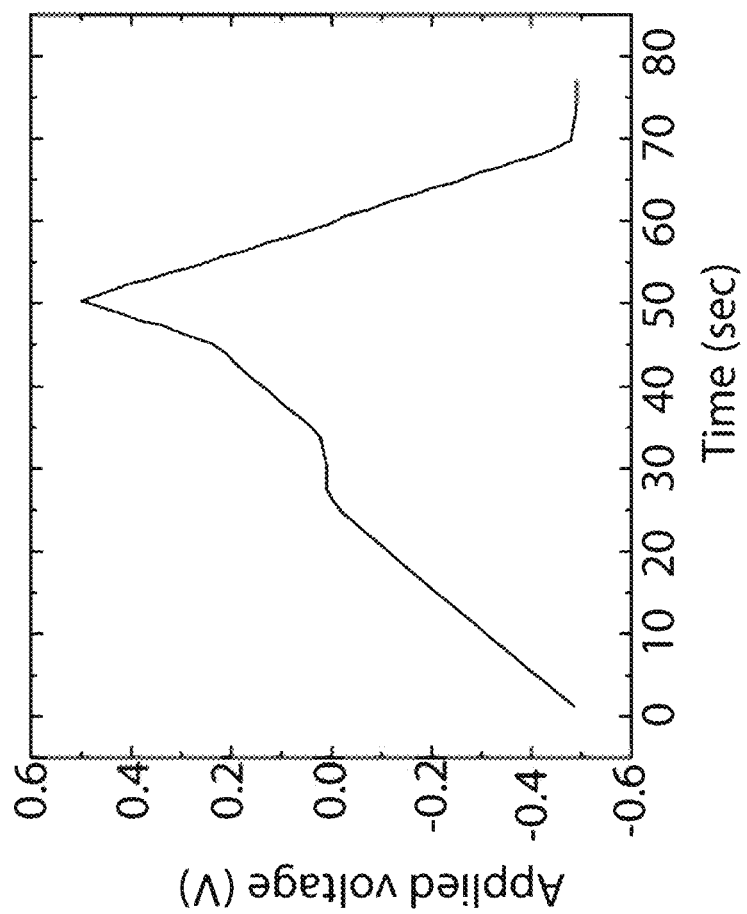
Figures 83D, 83E:
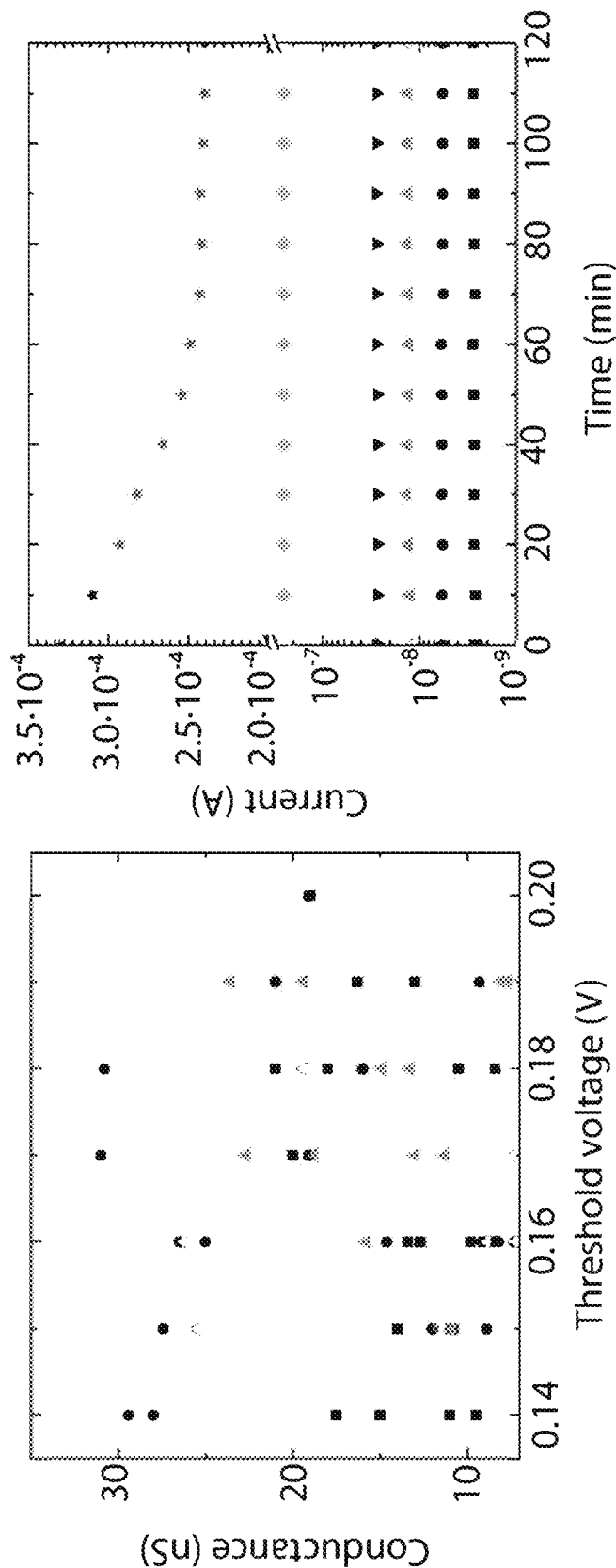
Figure 84A:
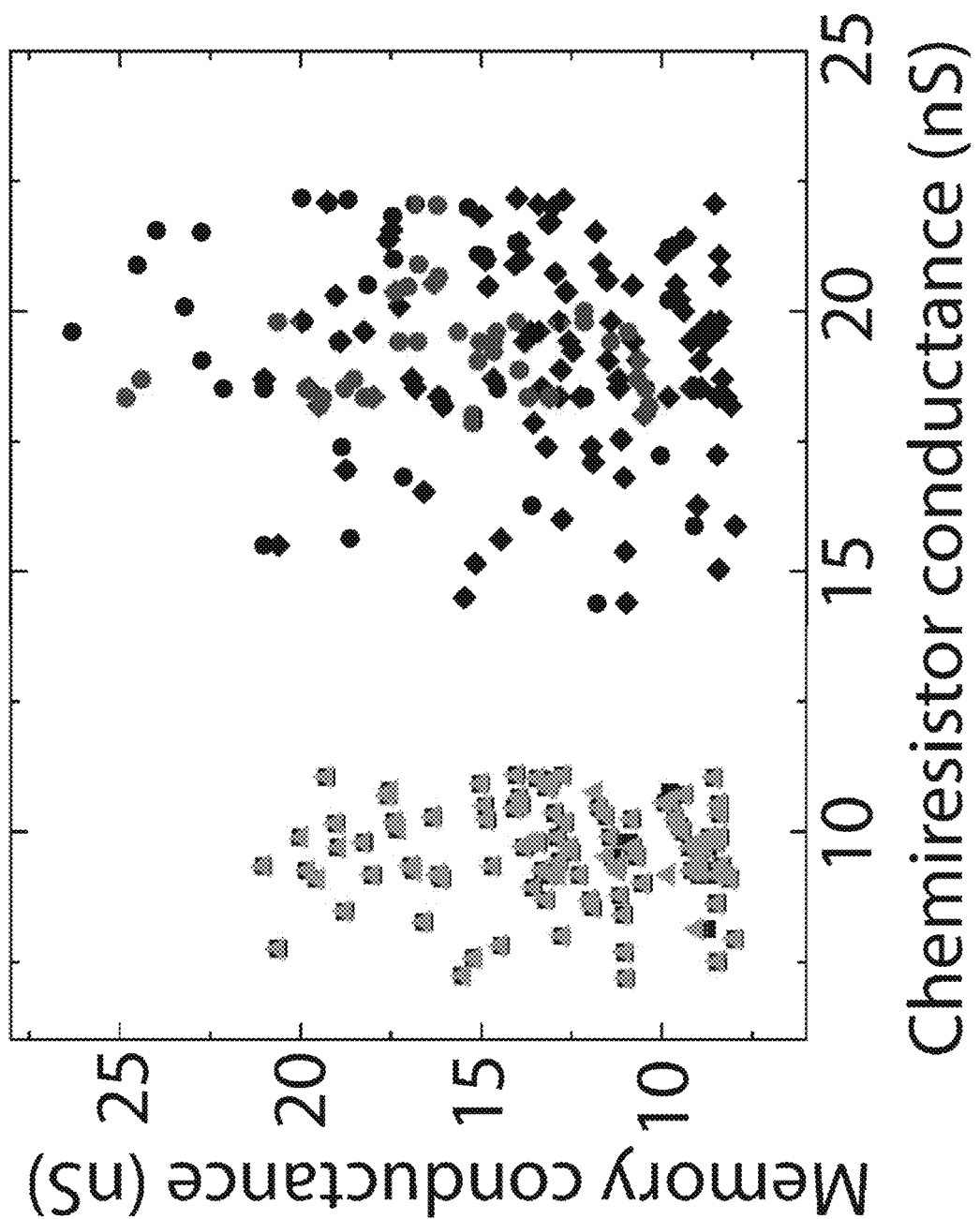
FIGS. 84A-84C show state machine analysis for as-fabricated syncells.
Figure 84C:
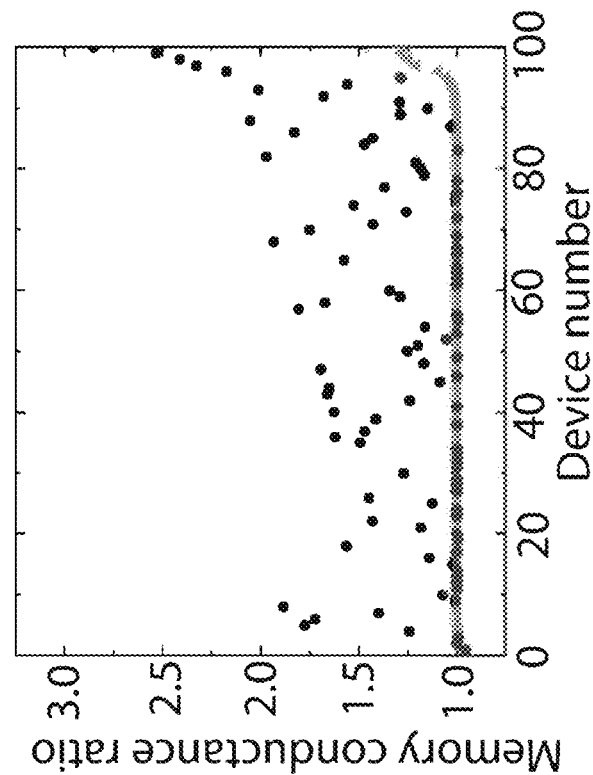
Figure 84B:
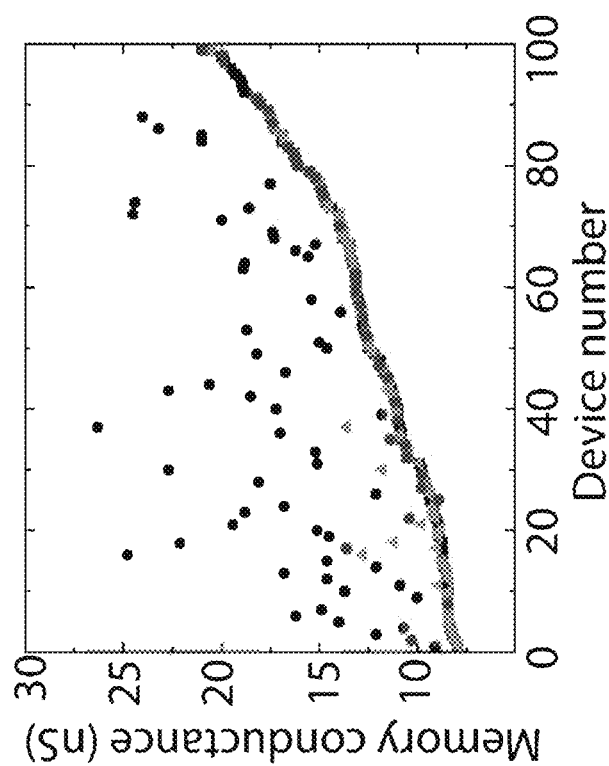

The third component is a memristor. It needs to operate with voltages harvested by the photodetector. To date, most memristors operate in the 1-3 V range (far higher than what the photocell can harness). See, Hao, C., et al., *Liquid-Exfoliated Black Phosphorous Nanosheet Thin Films for Flexible Resistive Random Access Memory Applications*. Advanced Functional Materials, 2016. 26(12): p. 2016-2024, Wang, W., et al., MoS$_2$ memristor with photoresistive switching. Scientific Reports, 2016. 6: p. 31224, and Sangwan, V. K., et al., *Gate-tunable memristive phenomena mediated by grain boundaries in single-layer MoS2*. Nat Nano, 2015. 10(5): p. 403-406, each of which is incorporated by reference in its entirety. Only one example satisfies the requirements (see, Bessonov, A. A., et al., *Layered memristive and memcapacitive switches for printable electronics*. Nat Mater, 2015. 14(2): p. 199-204, which is incorporated by reference in its entirety): A MoS$_2$ memristor fabricated between gold and silver electrodes (FIGS. 67I and 67J; with a size of 25×25×0.1 μm$^3$) has a turn on voltage ~0.15 V, 100 MΩ starting resistance, and its on/off ratio can reach millions (FIGS. 67K, 67I and 83E). The working principle relies on the formation of an ultrathin MoO$_x$ layer on the MoS$_2$ surface with subsequent charge trapping/detrapping at the Ag/MoO$_x$ interface. Notably, no memory effect was observed for devices without the oxide layer. See, Bessonov, A. A., et al., *Layered memristive and memcapacitive switches for printable electronics*. Nat Mater, 2015. 14(2): p. 199-204, which is incorporated by reference in its entirety. These memristors, written to various states during their virgin runs, demonstrate excellent retention over a period of 2 h (FIGS. 83A-83E). By testing N=20 random devices of one fabricated batch, both the threshold voltage and initial conductance only slightly depend on the testing conditions: $V_{th}$=0.16±0.02 V, $G_m^{OFF}$=13.4±4.0 nS on the silicon; $V_{th}$=0.17±0.02 V, $G_m^{OFF}$=18.4±8.4 nS for lifted off; $V_{th}$=0.17±0.02 V, $G_m^{FF}$=14.4±6.9 nS for sprayed syncells ($R_m^{OFF}$=1/$Gg_m^{OFF}$). While similar behavior was observed for multiple devices during their virgin runs, performance of these devices varies for the next cycles (contrasting with the previously observed stable behavior in Bessonov et al. (2015)): This is probably associated with non-uniform scanning voltage rate applied during the experiments (FIG. 83C).

State Machine Operation

Once assembled together, the developed components form a state machine. To operate reliably, the microcircuit has to meet specific energy and power requirements. The first one has already been briefly mentioned and satisfied by the choice of the appropriate memristor: Generated photodetector voltage a has to exceed the threshold memristor voltage $V_{th}$. The second criterion is that the memristor should not change its state if there is only an analyte. To this end, all devices were covered except the chemiresistor with a hBN monolayer, ensuring that no chemical reaction is happening with them (FIG. 73). Thirdly, the memristor should not change its state if there is only light. This is achieved by designing the chemiresistor with the initial conductance $G_{ch}^{in}$, such that the voltage generated across the memristor does not exceed $V_{th}$. This sets the lower limit for the initial chemiresistance ($R_{ch}^{in}$=1/$G_{ch}^{in}$), which can be determined by Ohm's law (see SI for details):

$$R_{ch}^{in} > R_m^{OFF}\left(\frac{\varepsilon}{V_{th}} - 1\right) - R_{ph}, \quad (3)$$

where $R_{ph}$ is the photodetector resistance. After the reaction with the analyte, the chemiresistor decreases its resistance to $R_{ch}^{f}$. This allows the memristor to change its state from $R_m^{OFF}$ to $R_m^{ON}$, which again can be assessed through the Ohm's law:

$$R_m^{ON} = \frac{R_{ch}^{f} + R_{ph}}{\frac{\varepsilon}{V_{th}} - 1}. \quad (4)$$

For memristor to change its state the following has to be satisfied: $R_m^{ON} < R_m^{OFF}$, yielding:

$$R_{ch}^{f} < R_m^{OFF}\left(\frac{\varepsilon}{V_{th}} - 1\right) - R_{ph}. \quad (5)$$

Equations (3) and (5) set requirements for the circuit design. In case of TEA, $R_{ch}^{f}$ can maximally reach≈$R_{ch}^{in}$/2, so MoS2 size should be carefully chosen to satisfy Eqs. (3) and (5).

Figure 68B:
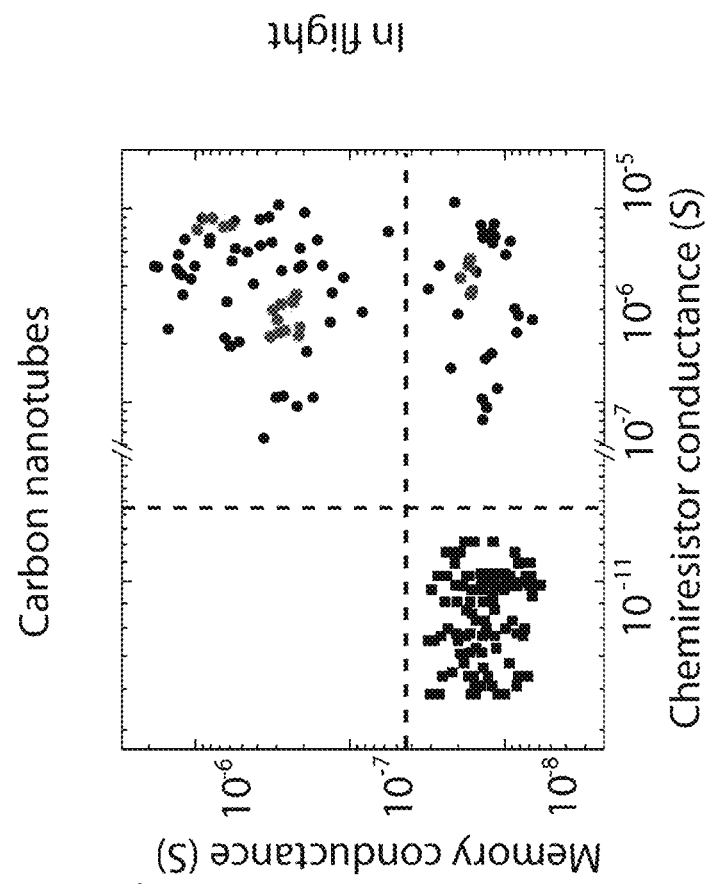
FIGS. 68A-68F show syncell state machine operation.
Figure 68A:
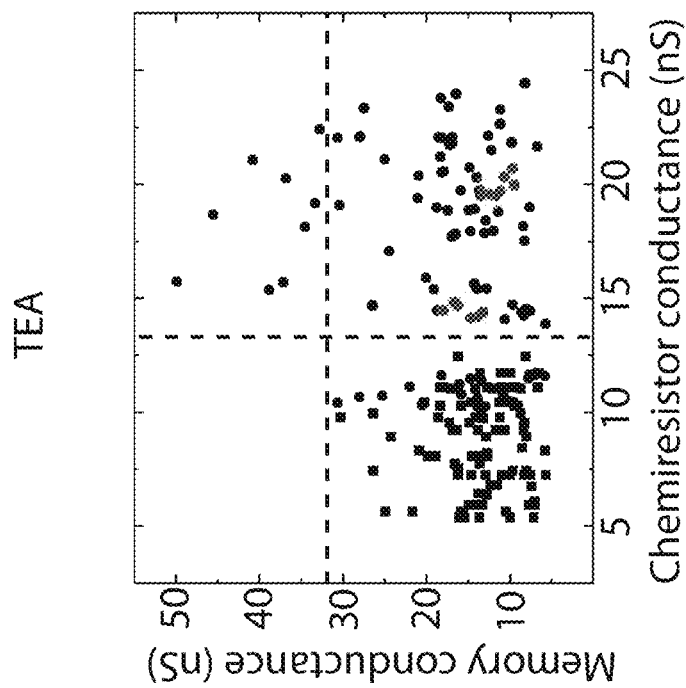

To demonstrate state machine operations, syncells were fabricated with three components assembled in one closed circuit (FIG. 66A) and tested them both (i) as fabricated on the silicon substrate and (ii) sprayed in the air. In a typical experiment, a portion of dispersed syncells is pipetted onto the silicon substrate and is left to dry until all water evaporates naturally. Next, the initial syncell state was queried: using probe manipulators, both the memristor and the chemiresistor conductances were measured on N=100 syncells. The remainder of the syncells is sprayed across in an enclosed tube; while on-the-substrate syncells are directly placed inside (FIGS. 74A-74E). The analyte is continuously sprayed using the second nebulizer from the top of the tube starting 5 s before and ending right after the syncells are sprayed across. Syncells are then left for 1-2 h inside to react with the analyte and dry. Then syncells were placed under the microscope and illuminate every photodetector individually for 5 s (532 nm laser, 7 μW/μm$^2$). Next, the final state of N=100 syncells were assessed, repeating the same measurements as for the initial state. While for sprayed experiments these are random syncells, syncells are identified for on-the-substrate experiments, extracting individual changes on every syncell. Upon exposure to 10 mM TEA, sprayed syncells change their chemiresistor conductance from $G_{ch}^{in}$=8.9±3.1 nS to $G_{ch}^{f}$=17.3±4.1 nS (in consistency with FIG. 67H), allowing memristor conductance change from $G_m^{OFF}$=13.3±4.8 nS to $G_m^{ON}$=17.3±8.9 nS after laser illumination (FIG. 68A). Similar results were obtained for syncells on the substrate: Chemiresistor conductance changed from $G_{ch}^{in}$=9.6±1.3 nS to $G_{ch}^{f}$=19.1±1.9 nS, enabling the memristor conductance change from $G_m^{OFF}$=12.6±3.5 nS to $G_m^{ON}$=16.0±4.0 nS (FIG. 68C), having 41 syncells that did not change their memristor state (red circles in FIG. 68E). The latter can be due to multiple reasons: power requirements are not met ($\varepsilon/V_{th}<1$), Eq. (5) is not satisfied, or component damage during the flight. Control experiments with light only showed that 6 syncells change the memory state in the absence of the analyte, meaning that Eq. (3) was not satisfied in their case (green triangles in FIG. 68E). Due to the limited range of $R_{ch}$ change, $R_m$ changes are not statistically significant. However, by tracking individual responses from syncells on the substrate, successful state changes are identified in some syncells (FIGS. 68E and 84A-84C).

Figures 68C, 68D:
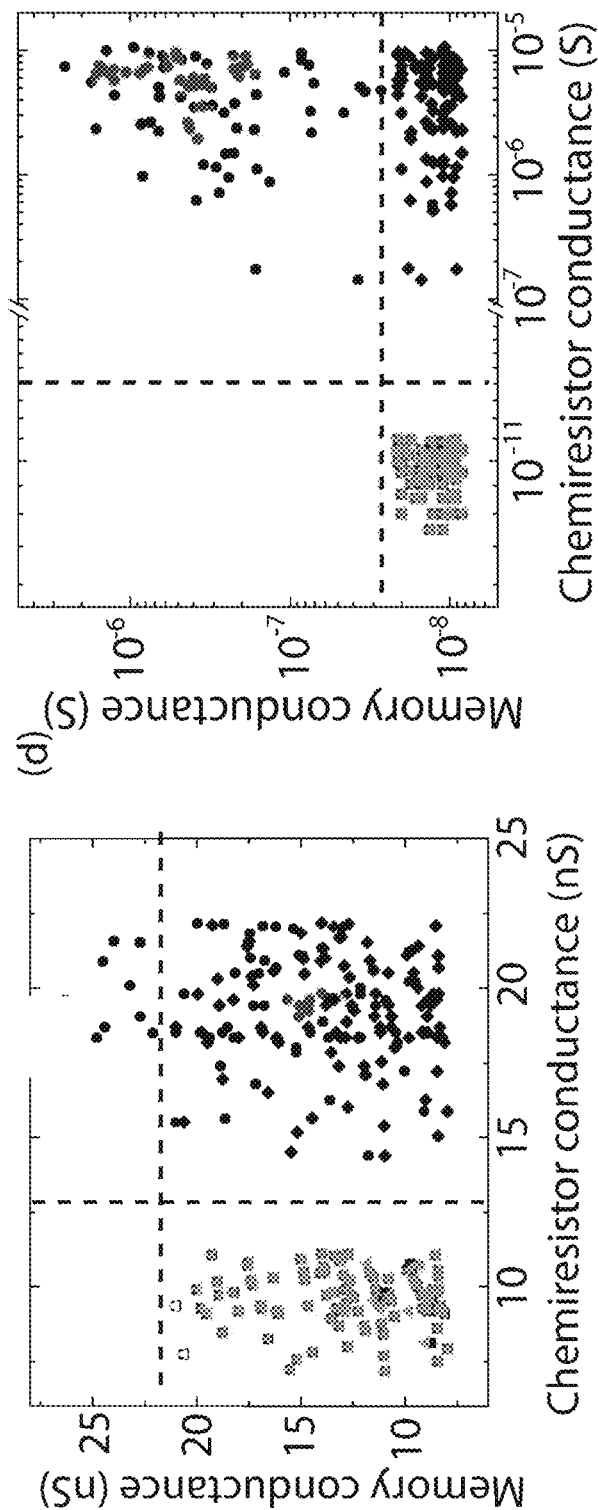
Figure 68E:
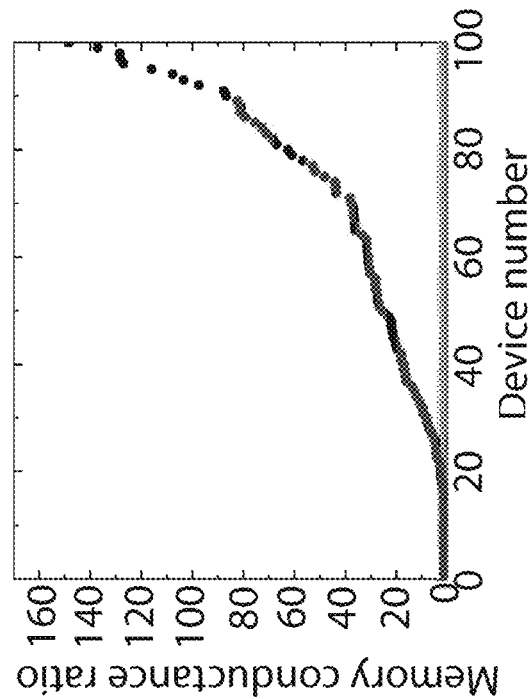
Figure 68F:
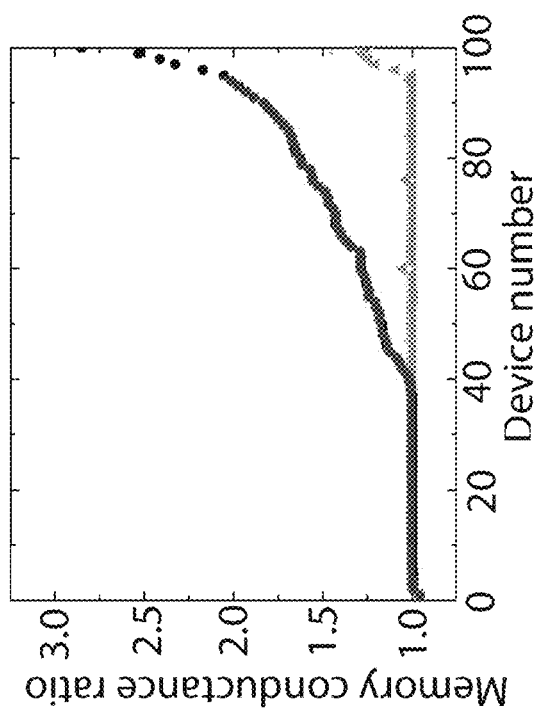
Figure 68G:
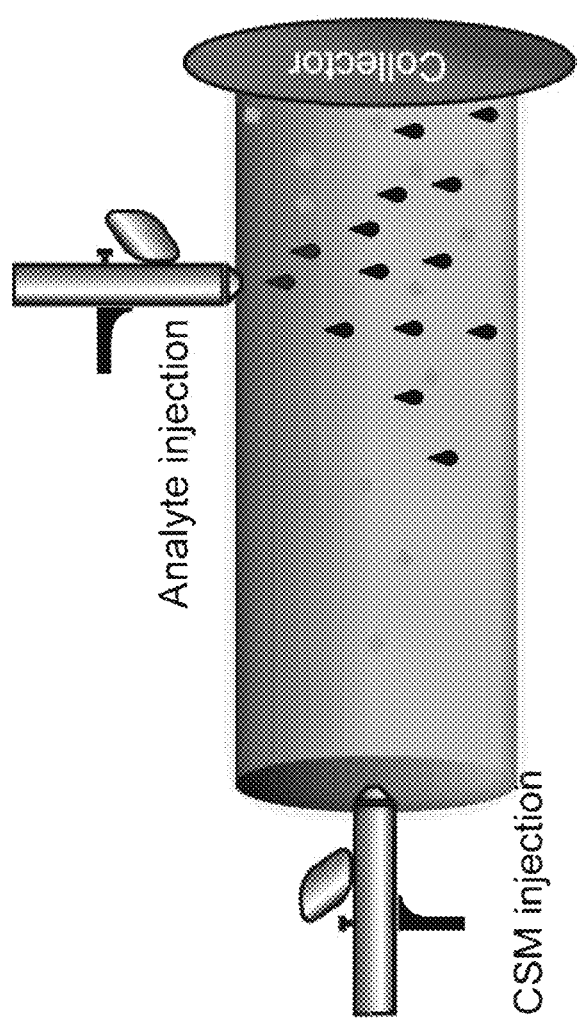
FIG. 68G shows experimental schematic demonstrating remote detection and memory storage in a constrained environment: the leftmost nebulizer injects CSMs (teal squares) across the enclosed tube injected with either TEA or aerosolized carbon nanotube particulates (dark blue droplets) using the topmost nebulizer. CSMs are collected on the collector, exposed to light, and their memory states are queried afterwards.
Figure 68H:
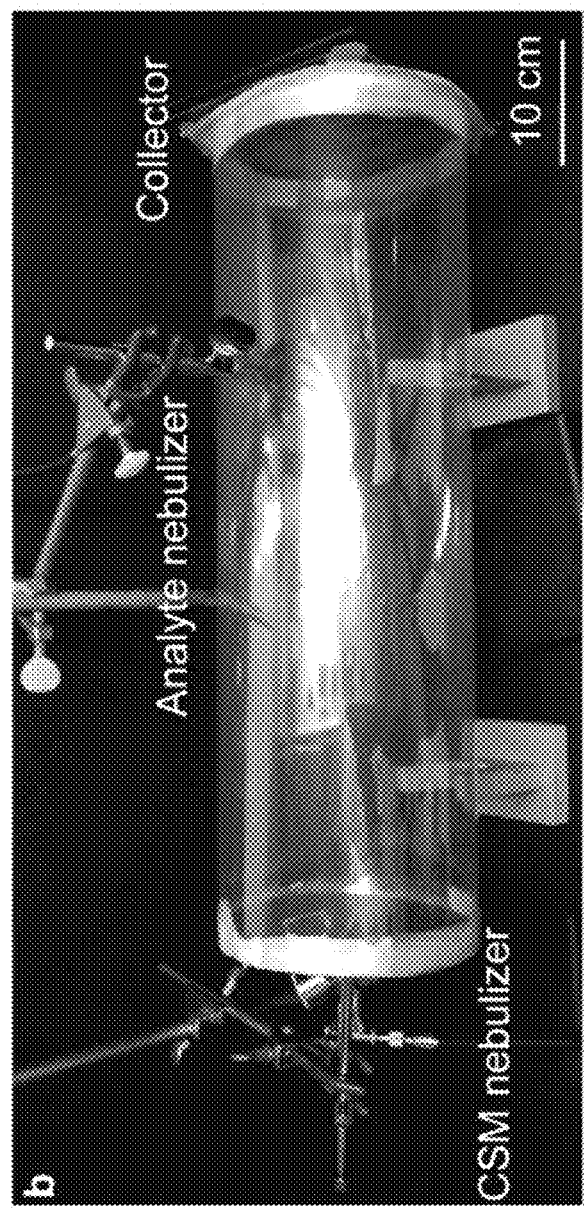
FIG. 68H shows a picture of the experimental setup.
Figure 85A:
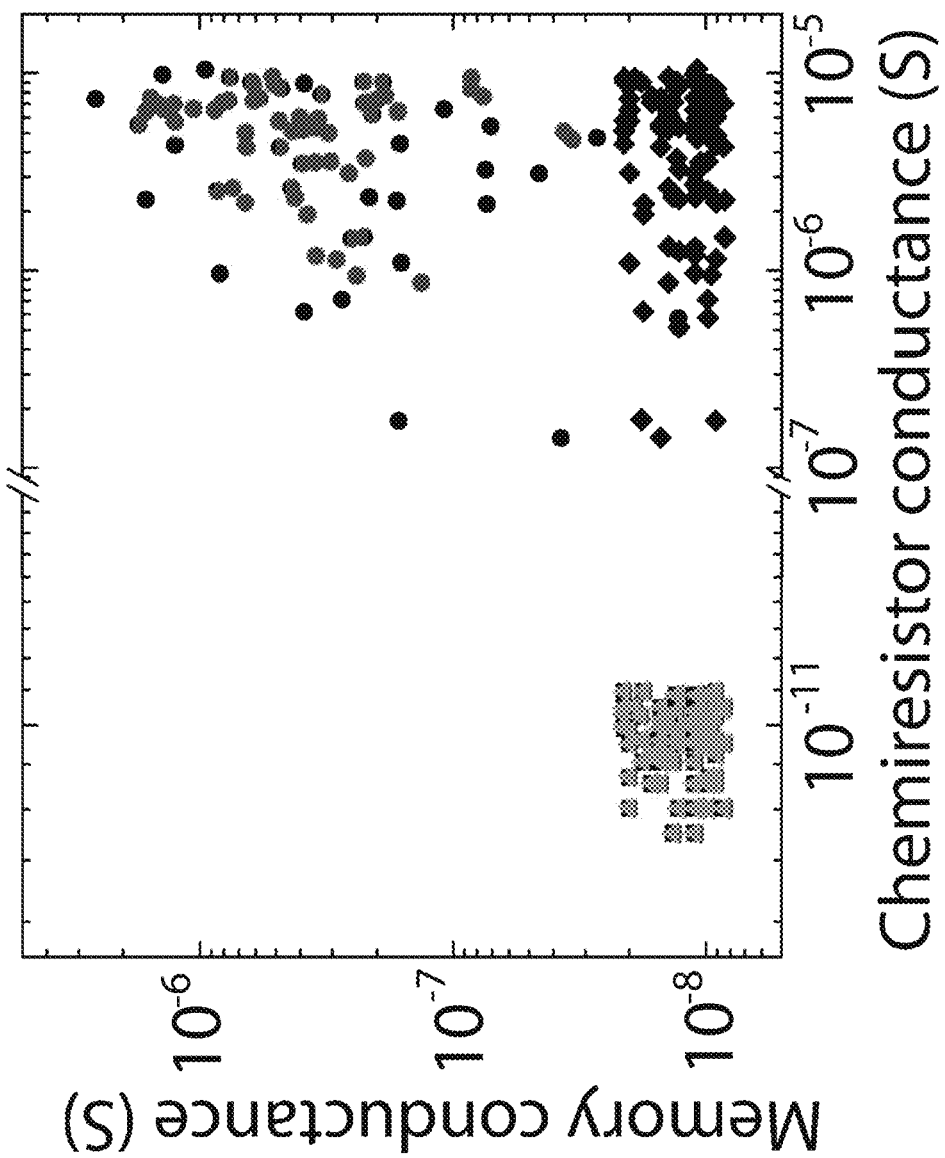
FIGS. 85A-85C show state machine analysis for as-fabricated syncells.
Figure 85C:
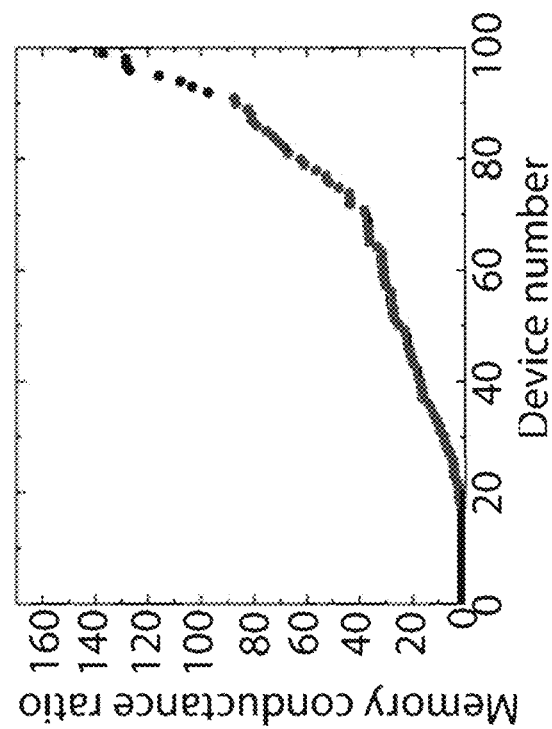
Figure 85B:
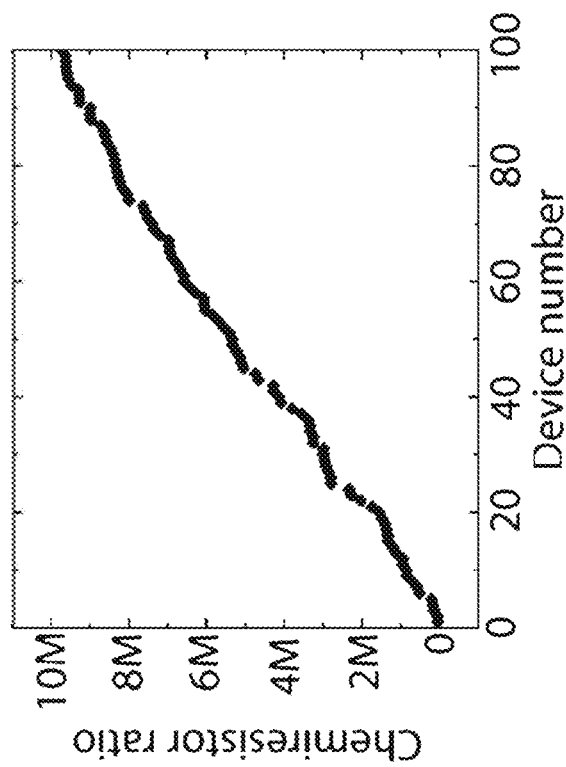
Figure 86A:
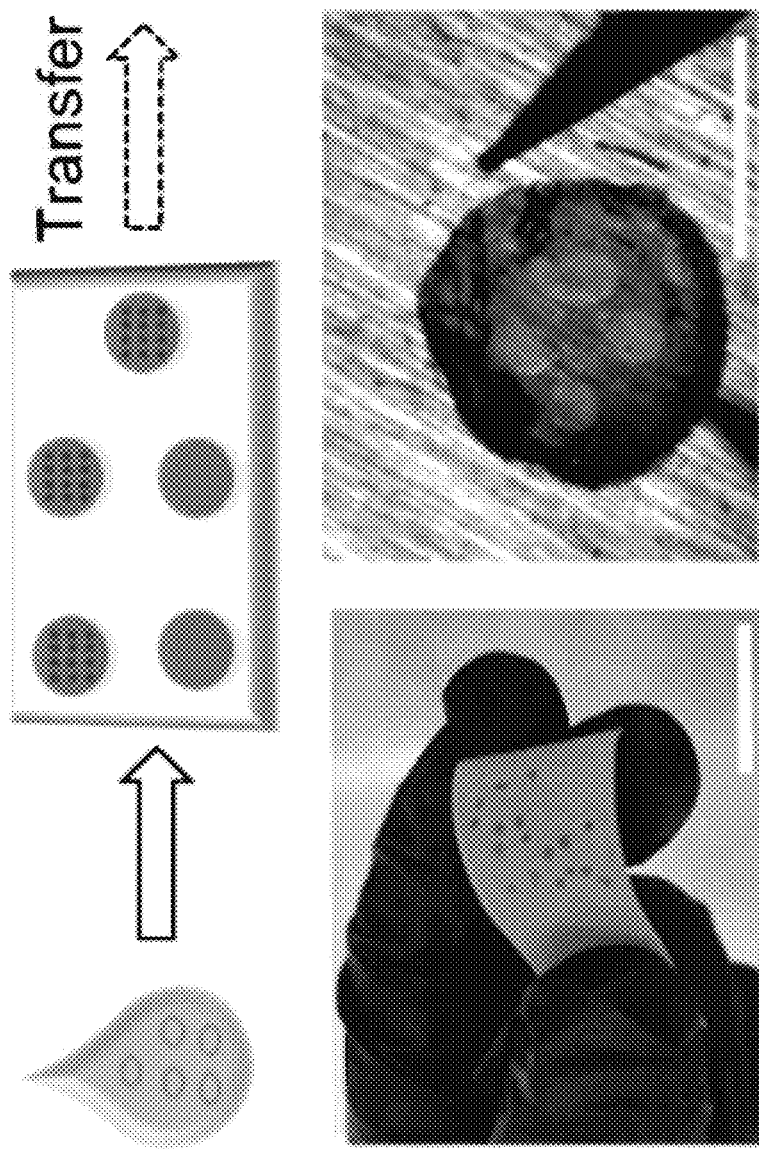
FIG. 86A shows the particles can be collected by a conductive surface via aerosolization or evaporative drying, or otherwise transfer to an adhesive tape for digital information encoding, scale bars are 20 mm and 1 mm.
Figure 86B:
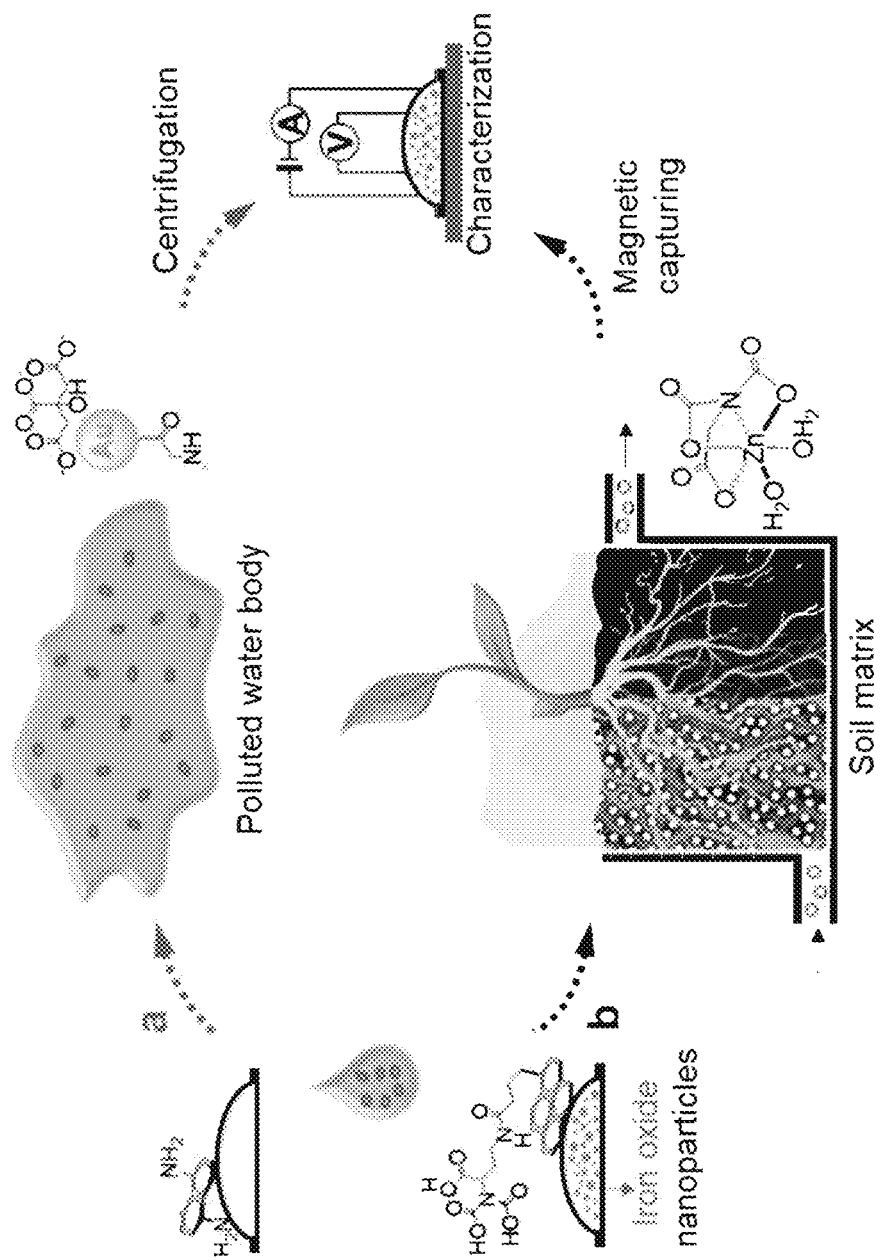
FIG. 86B shows schematic illustration of the application of surface-functionalized G-PS/G microparticles or their magnetic counterparts as probes to electronically sense and record chemical species such as metal nanoparticles and ions in (a) water and (b) soil matrix, these microparticles can be collected via centrifugation or magnetic capture for electronic read out.
Figure 86C:
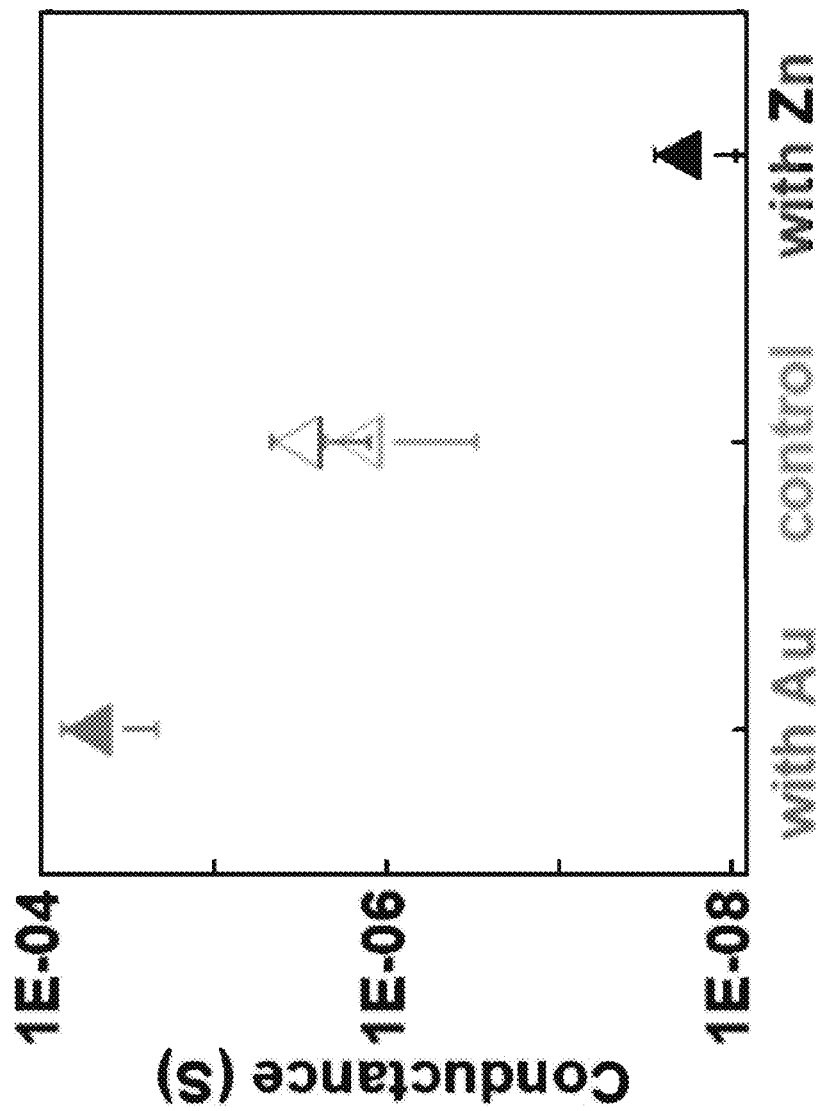
FIG. 86C shows the surface conductance and FIG. 86D shows the graphene 2D peak positon of the collected microparticles in FIG. 86B and their controls.
Figure 86D:
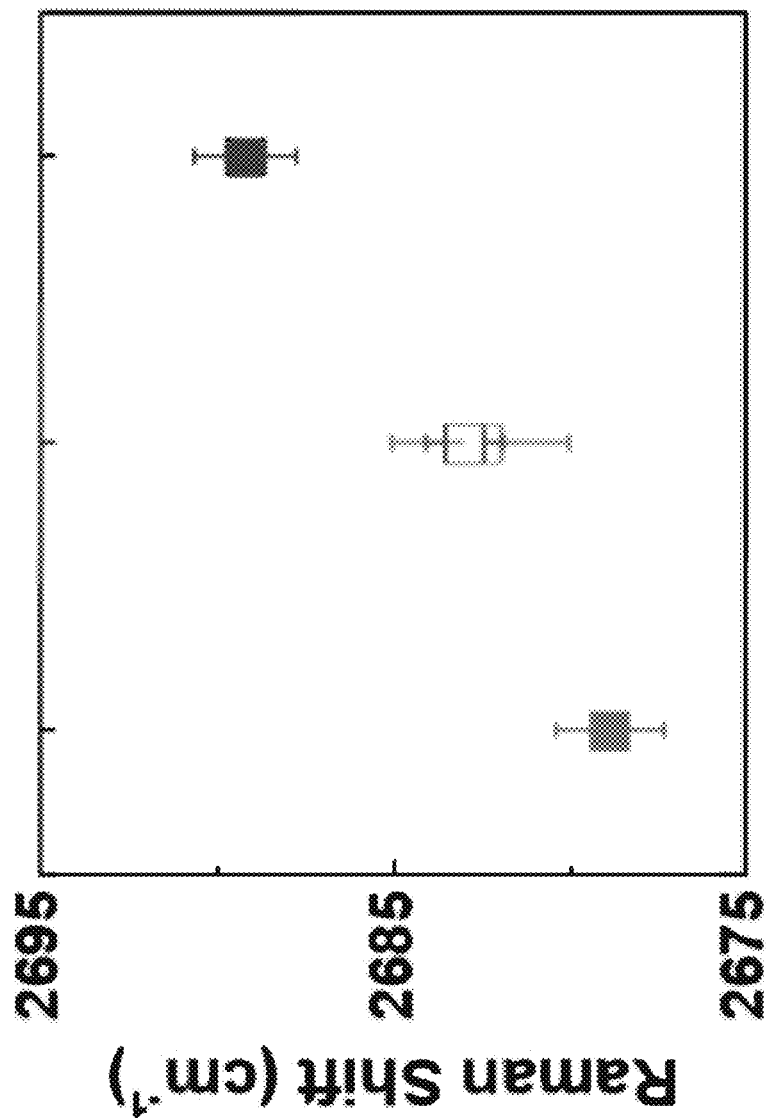

To further strengthen the demonstration, conductive carbon nanotube ink (0.2 g/l) was used as the analyte. For these experiments, the bare syncell substrate was used instead of MoS2 as the chemiresistor. SU-8 is an insulating material (sheet resistance ~10 pS), and its low conductance significantly strengthens condition of Eq. (3), while adsorbed carbon nanotubes form a percolated network with conductivities on the order of µS (FIGS. 85A-85C), providing high resistance modulation to satisfy Eq. (5). Control experiments with exposure of these syncells to light-only demonstrate that no syncell changed its memristor conductance (FIG. 68D). In a typical experiment, sprayed syncells change their chemiresistor conductance from $G_{ch}^{in}$=8.7+2.0 pS to $G_{ch}^{f}$=4.3+2.7 inducing memristor change from $G_m^{OFF}$=14.7+6.0 nS to $G_m^{ON}$=0.47+0.44 µS, having 29 syncells that did not work (FIG. 68B). For syncells on the substrate, chemiresistor conductance changed from $Gch^{in}$=9.6+1.1 pS to $G_{ch}^{f}$=4.9+2.9 µS, inducing memristor change from $G_m^{OFF}$=12.9+3.9 nS to $G_m^{ON}$=0.50+0.49 µS (FIG. 68D), having 16 syncells that did not work (FIG. 68F). FIGS. 68G-68H shows CSMs fabricated on the silicon substrate (FIG. 68G) and upon spraying in air within a confined chamber (FIG. 68H).

Demonstration of Constrained Environmental Sensing

Researchers have identified several important closed systems from which it is difficult to extract information or interface electronics within an inaccessible interior. See Lillesand, T., Kiefer, R. W. & Chipman, J. *Remote Sensing and Image Interpretation*. 1, 1-59 (2014), which is incorporated by reference in its entirety. Examples include oil and gas conduits, chemical and biosynthetic reactors, porous geological materials for upstream oil and mining exploration and the human digestive tract. See Brunete, A., Hernando, M., Torres, J. E. & Gambao, E. Heterogeneous multi-configurable chained microrobot for the exploration of small cavities. *Automat. Constr.* 21, 184-198 (2012), Murvay, P.-S. & Silea, I. A survey on gas leak detection and localization techniques. *J. Loss Prevent. Process Ind.* 25, 966-973 (2012), Rajtar, J. M. & Muthiah, R. Pipeline Leak Detection System for Oil and Gas Flowlines. *J. Manufact. Sci. Eng.* 119, 105-109 (1997), Gavrilescu, M. & Tudose, R. Z. Residence time distribution of the liquid phase in a concentric-tube airlift reactor. *Chem. Eng. Proces.* 38, 225-238 (1999), Kurt, S. K., Gelhausen, M. G. & Kockmann, N. Axial Dispersion and Heat Transfer in a Milli/Microstructured Coiled Flow Inverter for Narrow Residence Time Distribution at Laminar Flow. *Chem. Eng. Tech.* 38, 1122-1130 (2015), Tan, X., Sun, Z. & Akyildiz, I. F. Wireless Underground Sensor Networks: MI-based communication systems for underground applications. *IEEE* 57, 74-87 (2015), and Yamate, T., Fujisawa, G. & Ikegami, T. Optical Sensors for the Exploration of Oil and Gas. *J. Lightwave Technol.* 35, 3538-3545 (2017), each of which is incorporated by reference in its entirety. Several methods to probe such systems exist, but they are either indirect or very limited in their applicability. At the same time, fully autonomous electronic chips have been limited to the millimetre-range, which remains too large for addressing the above applications. See Kalantar-Zadeh, K. et al. A human pilot trial of ingestible electronic capsules capable of sensing different gases in the gut. *Nat. Electronics* 1, 79-87 (2018), and Costello, B. P. J. d. L., Ledochowski, M. & Ratcliffe, N. M. The importance of methane breath testing: a review. *J. Breath Res.* 7, 024001 (2013), each of which is incorporated by reference in its entirety. To this end, it was demonstrate that CSMs can be injected into a pipeline system, probe it, and then be successfully retrieved to deliver the captured information.

Figures 99A, 99B:
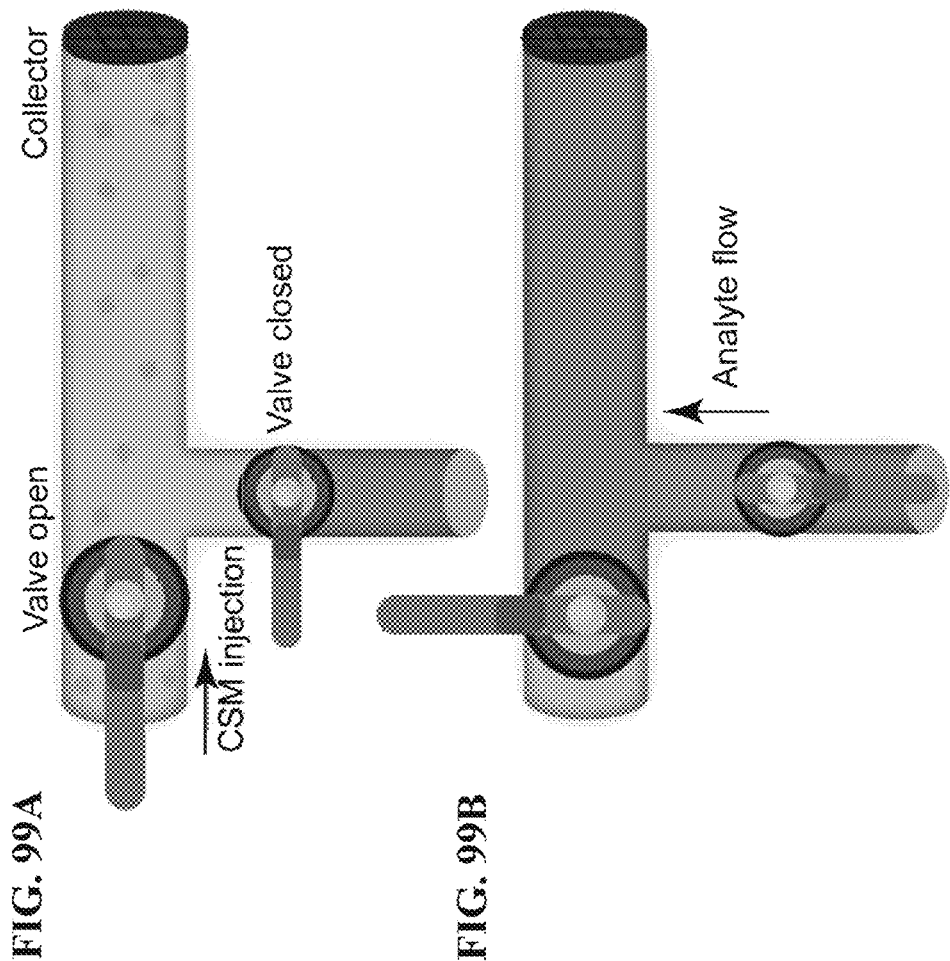
FIGS. 99A-99F show CSMs for monitoring pipeline status.
Figure 99C:
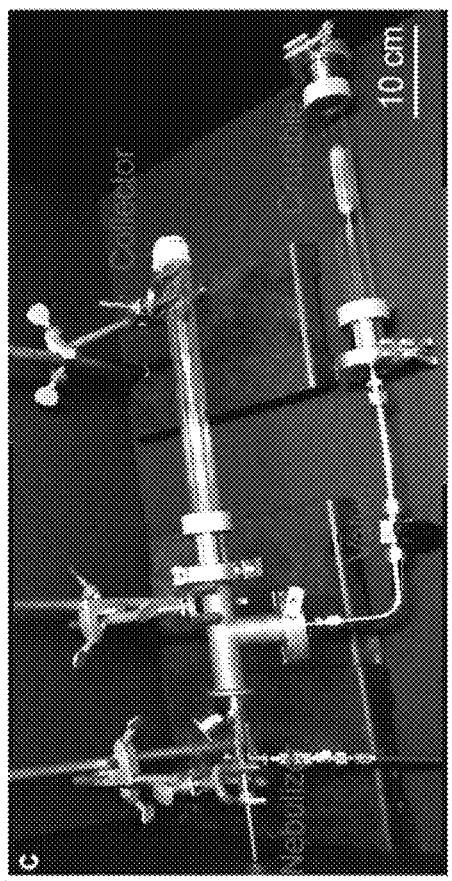
Figure 99D:
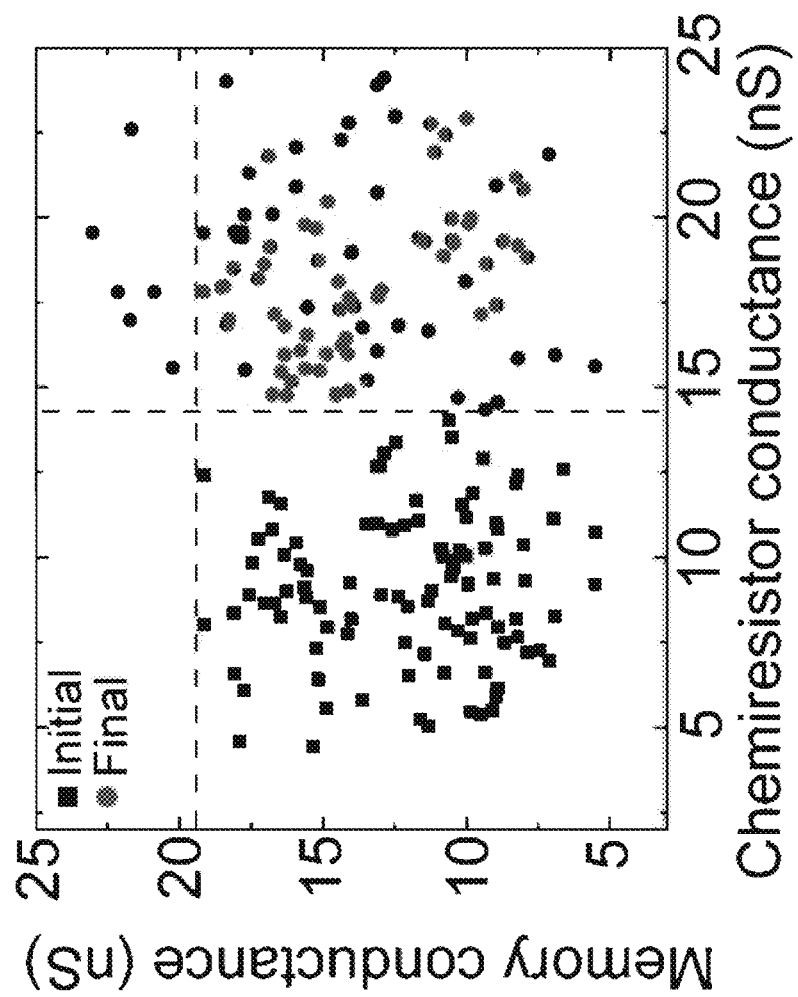
Figure 99E:
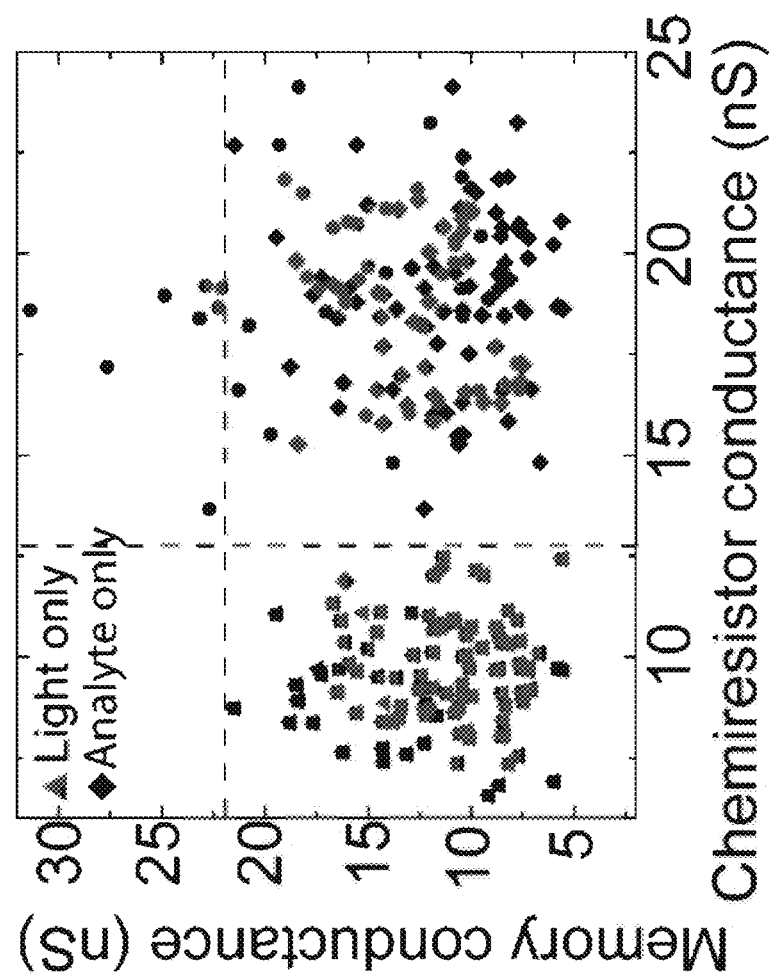
Figure 99F:
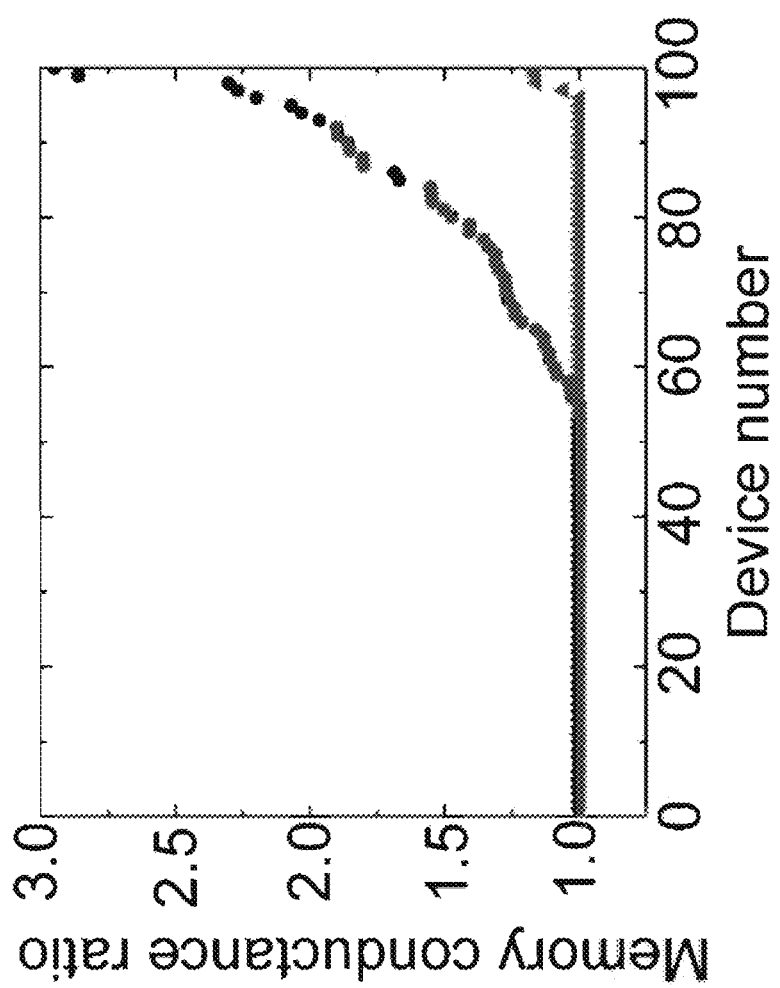

To illustrate, a model pipeline section was fabricated, into which gaseous ammonia was injected. Ammonia is a highly toxic gas used as a fertilizer in agriculture and as a refrigerant in the chemical industry. See Kalantar-Zadeh, K. et al. A human pilot trial of ingestible electronic capsules capable of sensing different gases in the gut. *Nat. Electronics* 1, 79-87 (2018), and Farra, R. et al. First-in-Human Testing of a Wirelessly Controlled Drug Delivery Microchip. *Sci. Trans. Med.* (2012), each of which is incorporated by reference in its entirety. It is also one of the most dangerous compounds to be transported through pipelines. See Timmer, B., Olthuis, W. & Berg, A. Ammonia sensors and their applications—a review. *Sens. Actuat. B* 107, 666-677 (2005), which is incorporated by reference in its entirety. To probe the pipeline internally, CSMs were first injected within the system (FIG. 99A) as a nebulized aerosol. A valve is then used to pulse ammonia vapour (~10 kPa) into the system, allowing the CSMs to interact with it for 30 min. Next, the ammonia valve is closed and the CSMs are retrieved from the collector (FIGS. 99B-99C). The experimental procedure is similar to the previous section, with some CSMs inserted into the tube on-the-substrate as a control. Ammonia vapour acts as an n-dopant for the $MoS_2$ layer (see Nielsen, A. *Ammonia: Catalysis and Manufacture* (ed Anders Nielsen) 329-346 (Springer Berlin Heidelberg, 1995), which is incorporated by reference in its entirety), changing $MoS_2$ conductances from $G_{ch}^{in}$=9.1±2.2 nS to $G_{ch}^{f}$=18.5±2.5 nS for the sprayed CSMs and, consequently, allowing memristor conductance change from $G_m^{OFF}$=12.5±3.9 nS to $G_m^{ON}$=14.5±4.3 nS after laser illumination (two-tailed p-value equals 0.0007, N=100, FIG. 99D) with similar results for the on-substrate CSMs (FIGS. 99E, 99F and 101A-101C).

State Machines for Soot Exposure Monitoring

Soot nanoparticles emitted by diesel engines, industrial emissions, and power plants pose health, climate, and environmental risks. See Cho, B. et al. Charge-transfer-based Gas Sensing Using Atomic-layer $MoS_2$. *Sci. Rep.* 5, 8052 (2015), which is incorporated by reference in its entirety. Aerosolized micro- and nanoparticles can travel thousands of kilometres before sedimentation (see Bernstein, J. A. et al. Health effects of air pollution. *J. Allergy Clin. Imm.* 114, 1116-1123 (2004), which is incorporated by reference in its entirety), making it challenging to predict soot distribution and impact. To date, the large area monitoring of soot remains an economically inviable task. To this end, CSMs as dispersed, printed devices can potentially cover large areas to successfully detect soot, remaining virtually invisible to the naked eye, but otherwise easily detectable on a surface (see below). In this case, aerosolization allows CSMs to be rapidly printed over a specific area of interest as intact, functional, autonomously powered devices.

Figure 100A:
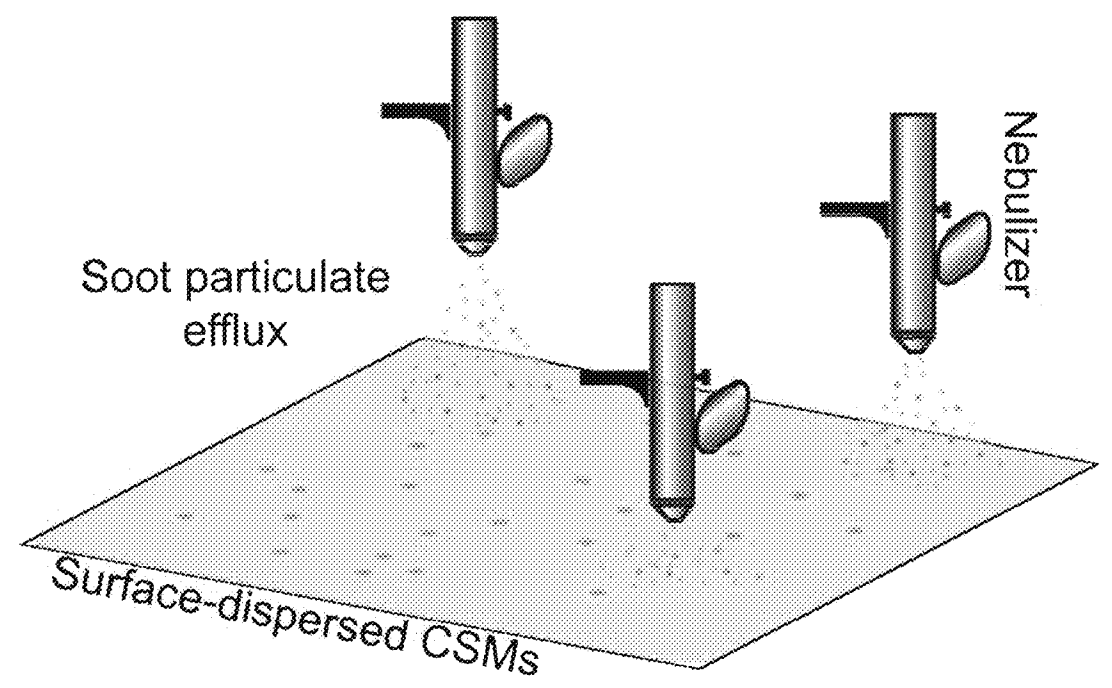
Figure 100B:
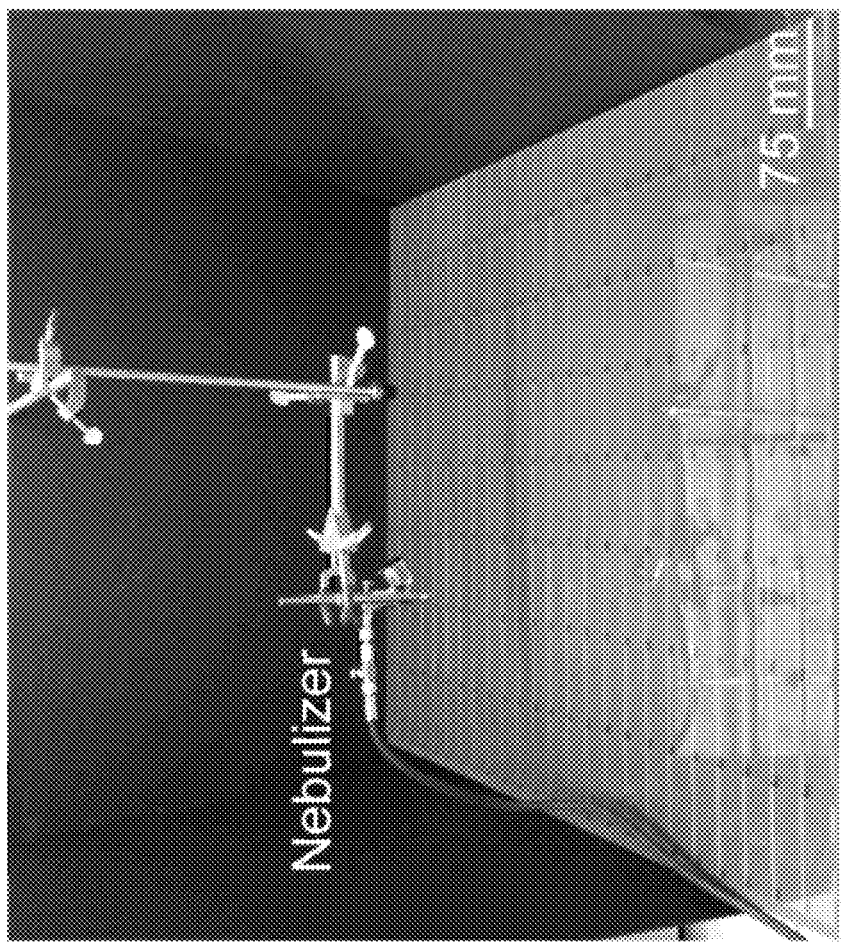
Figure 100C:
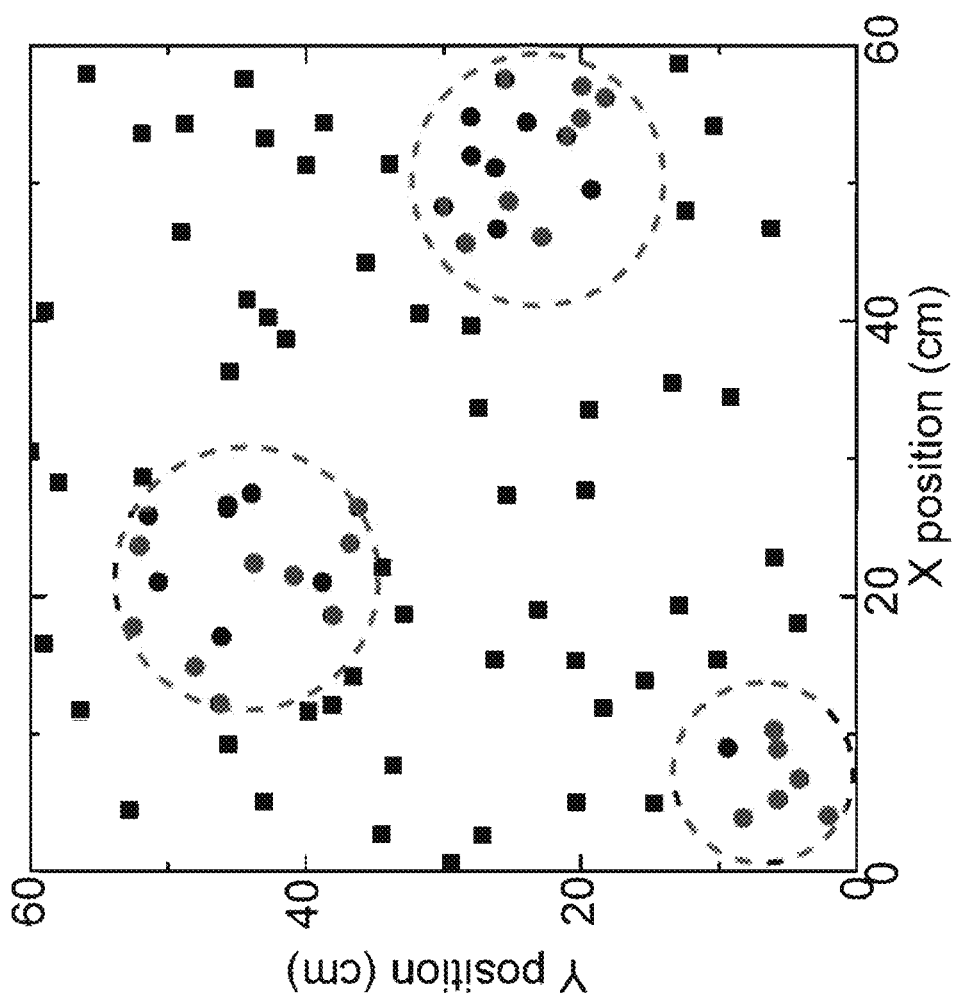
Figure 100D:
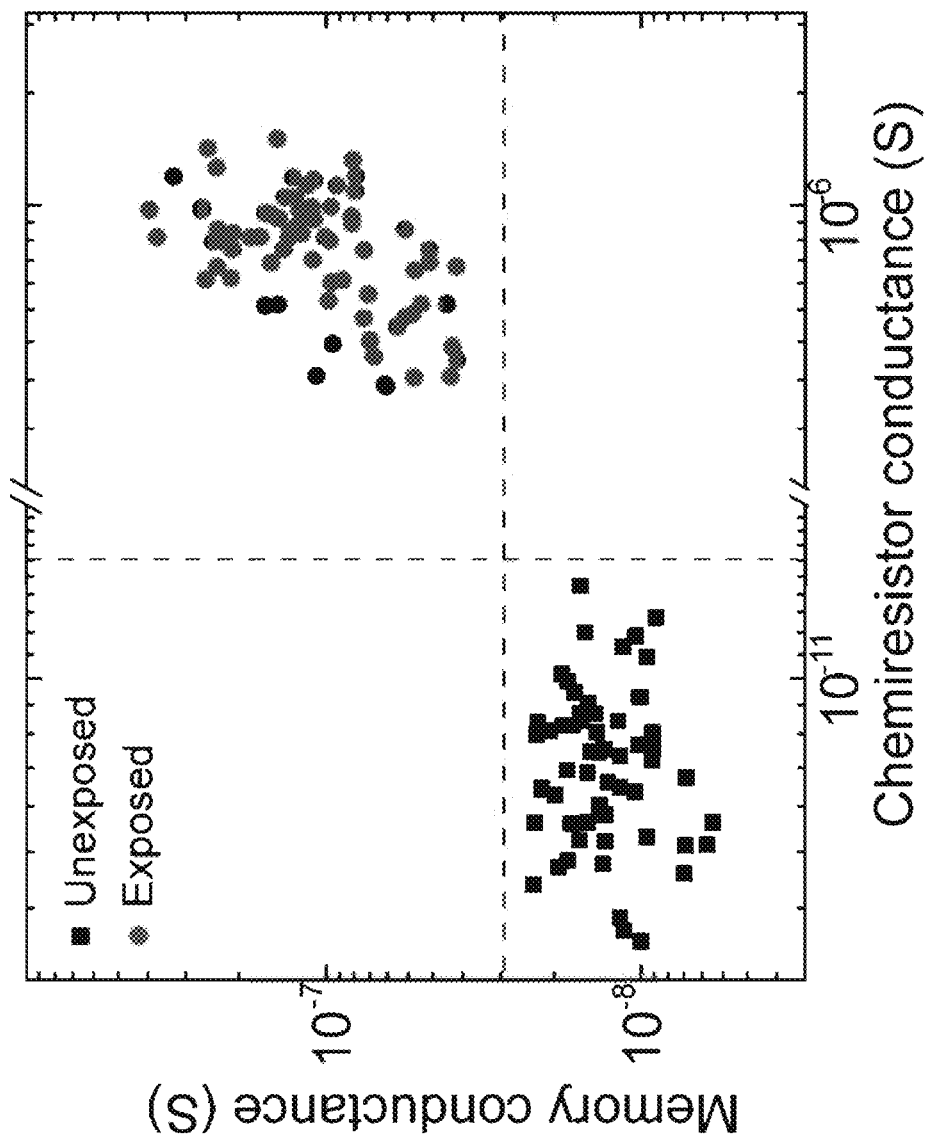
Figure 101A:
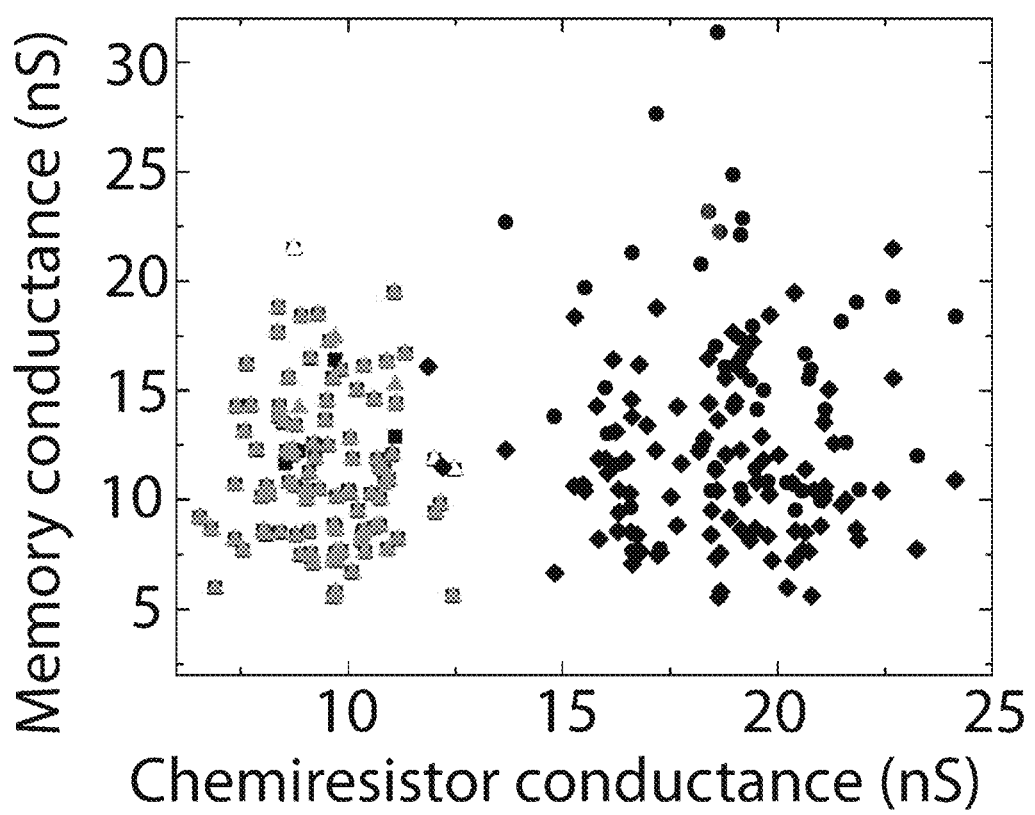
FIGS. 101A-101C show state machine analysis for as-fabricated CSMs.
Figure 101C:
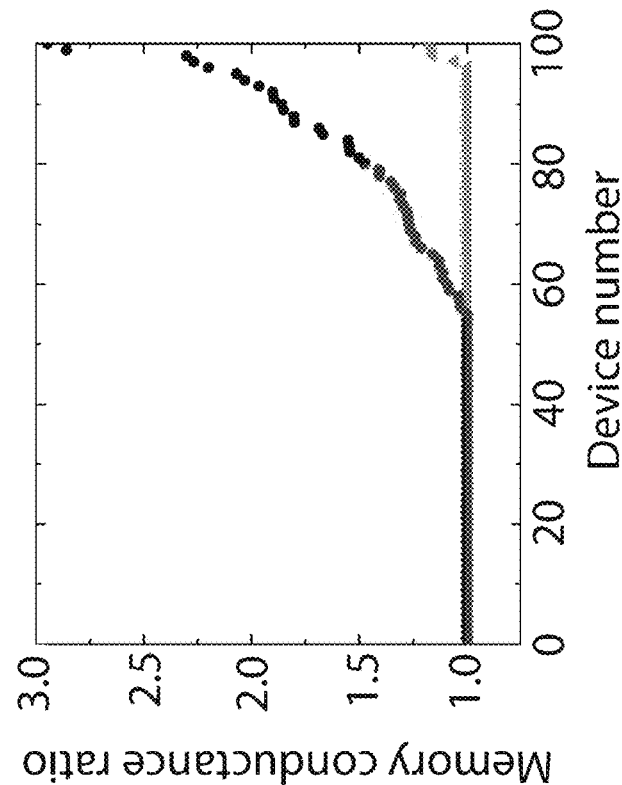
Figure 101B:
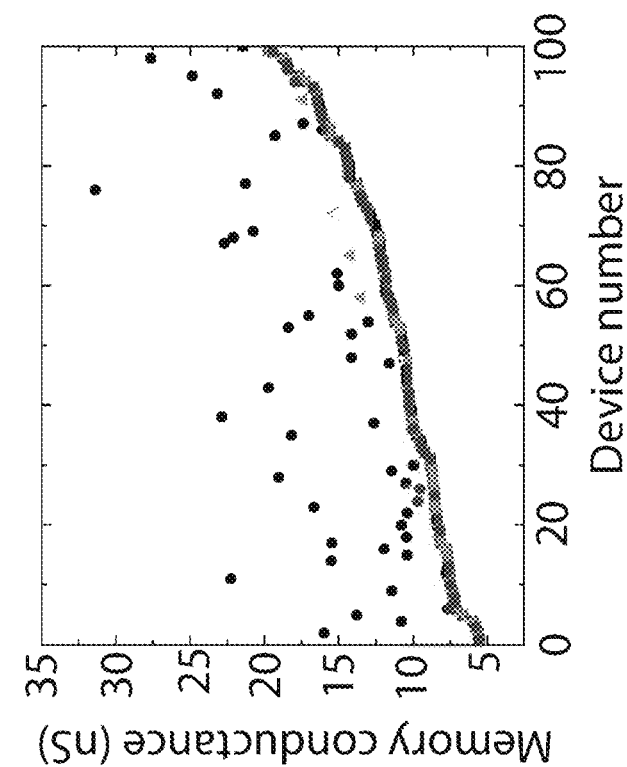
Figure 102B:
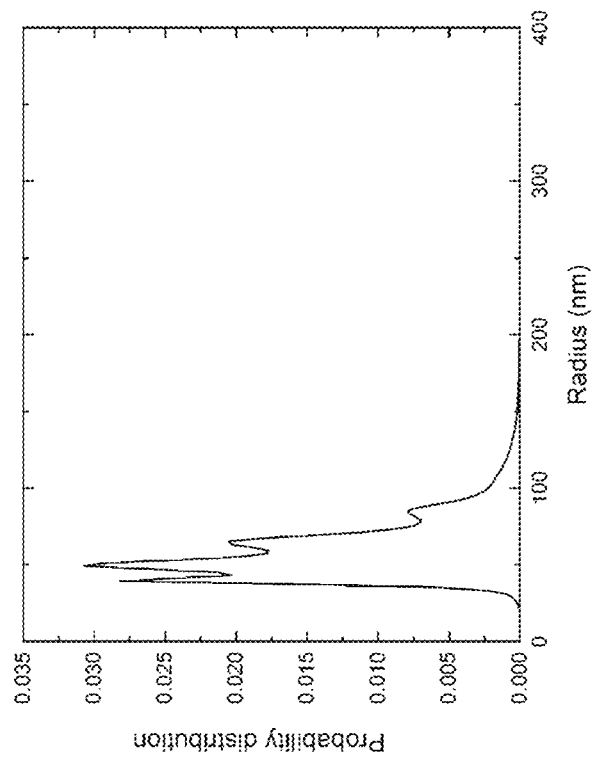
FIGS. 102A-102B show Soot characterization.
Figure 102A:
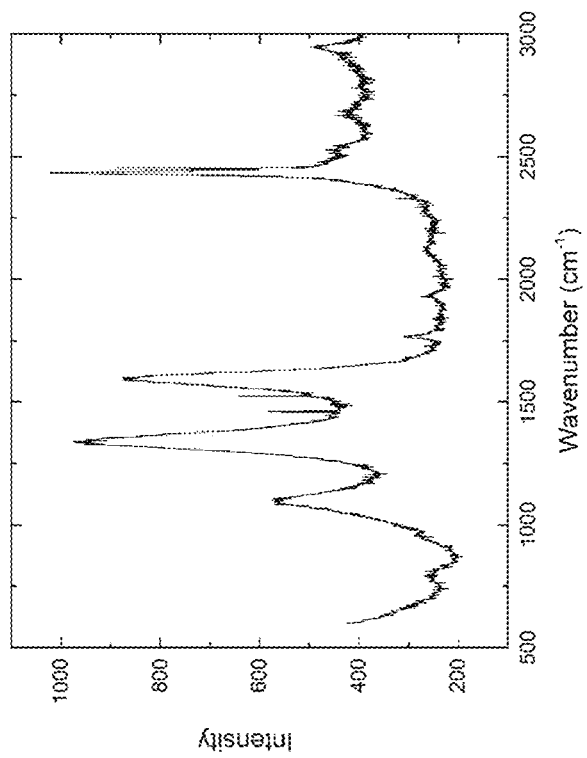

To demonstrate the monitoring of undesirable particulates from surface dispersed CSMs, the nebulized CSMs were deposited over an area of 0.6×0.6 m². Next, 2 g/l of Printex XE2-B soot was loaded into a separate nebulizer and sprayed over three distinct locations (FIGS. 100A, 100B and 102A-102B), simulating localized particulate efflux. For these experiments, an insulating substrate (SU-8, sheet resistance ~10 pS) instead of the $MoS_2$ was used as the CSM chemiresistor. The remainder of the experimental procedure is similar to previous experiments. By their nature, soot particles are highly conductive (see Derbyshire, E. Natural Minerogenic Dust and Human Health. *AMBIO* 36, 73-77 (2007), which is incorporated by reference in its entirety); thus, the chemiresistor element drastically changes its conductance from $G_{ch}^{in}=7.4\pm2.4$ pS to $G_{ch}^{f}=0.80\pm0.26$ μS upon exposure to soot. This further translates into memristor conductance changes from $G_m^{OFF}=13.7\pm4.2$ nS to $G_m^{ON}=127\pm72$ nS upon laser illumination (FIG. 100D). The retrieved CSM positions allow determination of the exposed and unexposed areas (FIG. 100C).

Enhancements of State Machines to Aid Standoff Detection

Figure 69A:
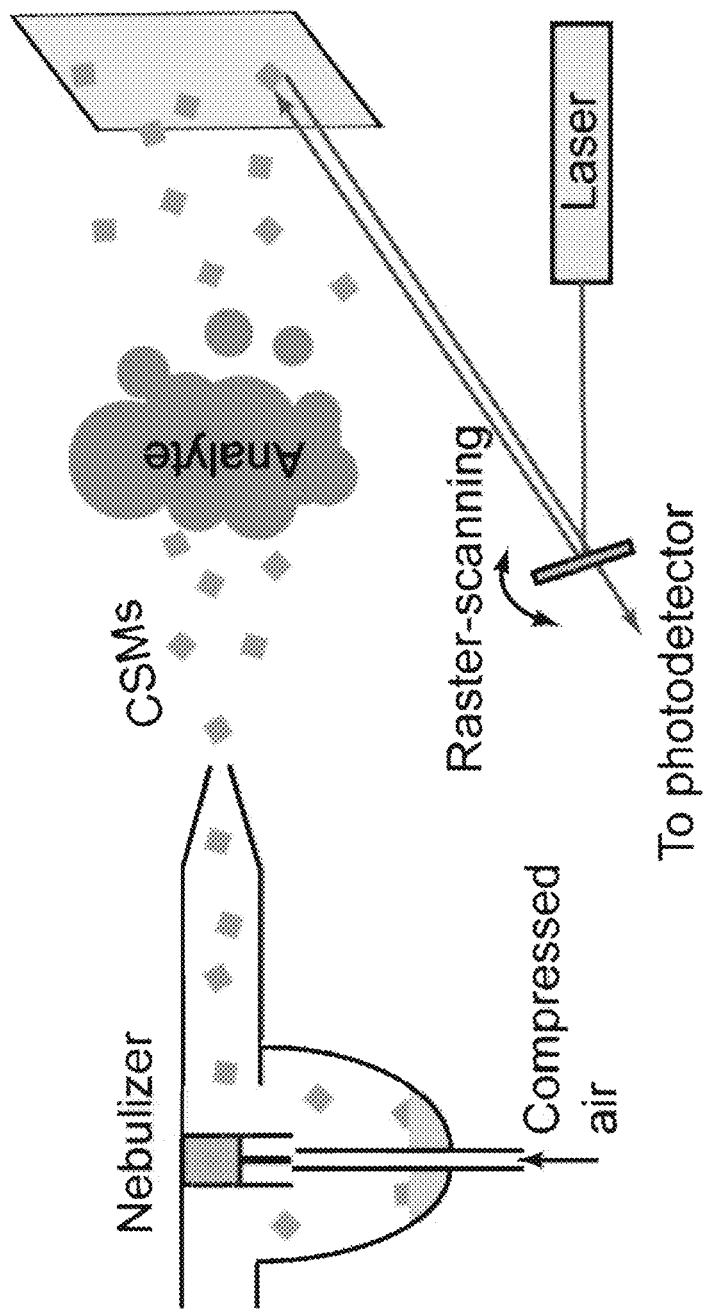
FIGS. 69A-69H show syncell (CSM) standoff detection.
Figure 69B:
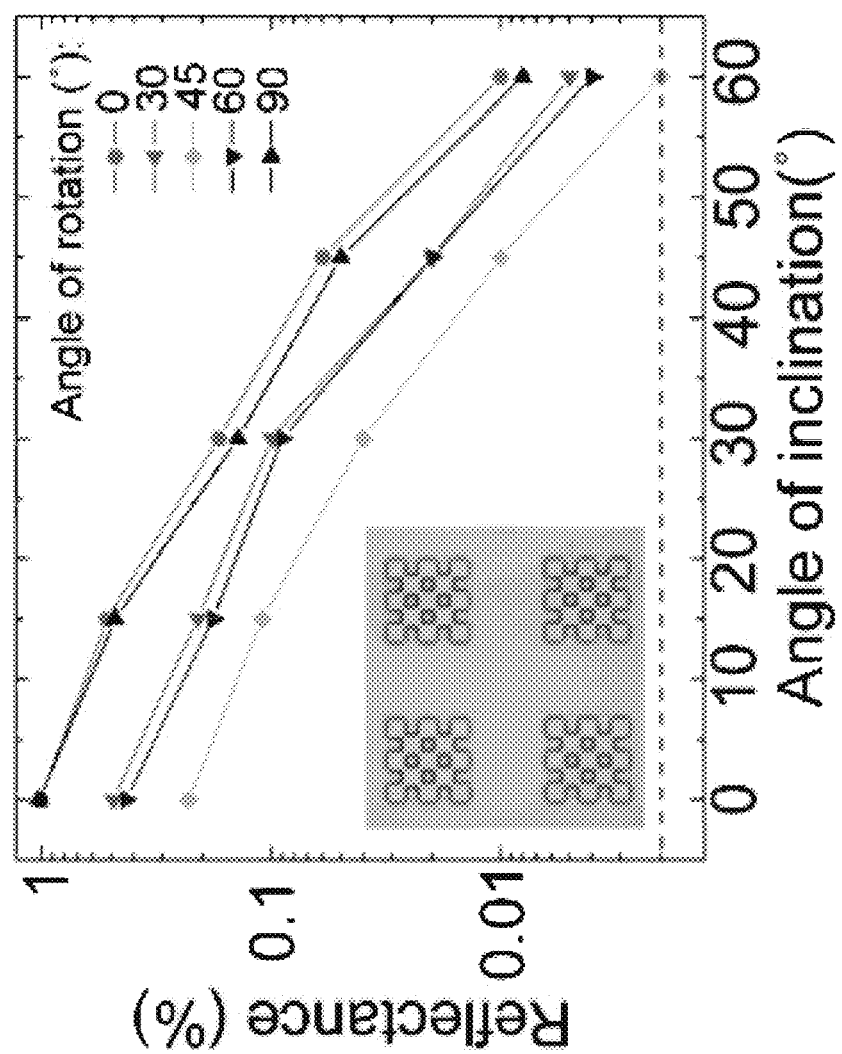
Figure 69C:
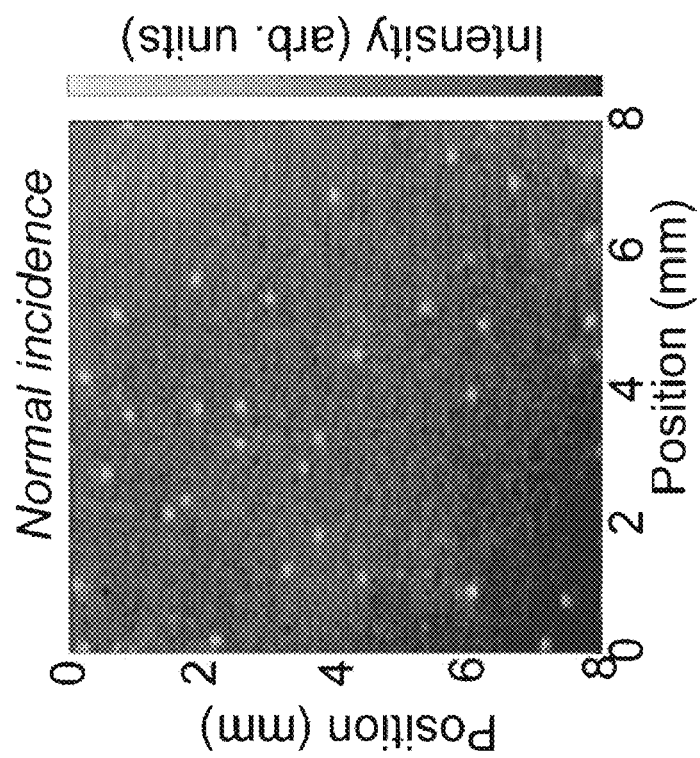
Figure 69D:
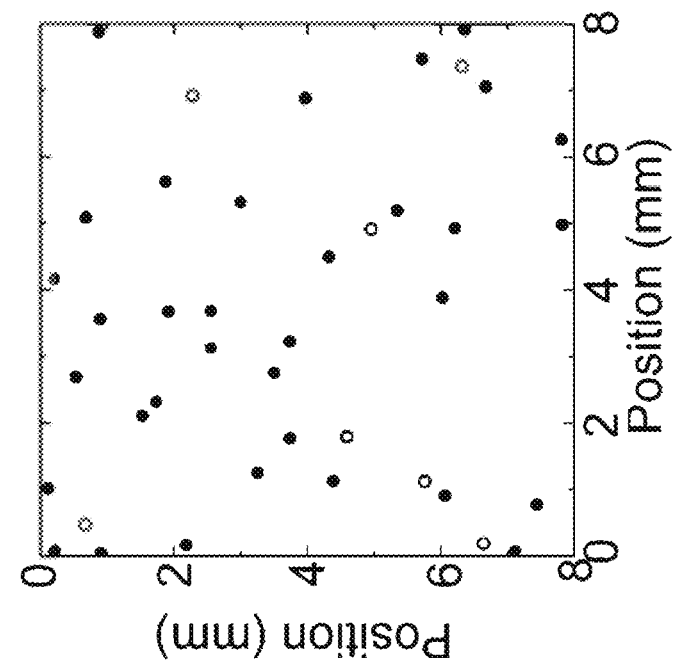
Figure 69E:
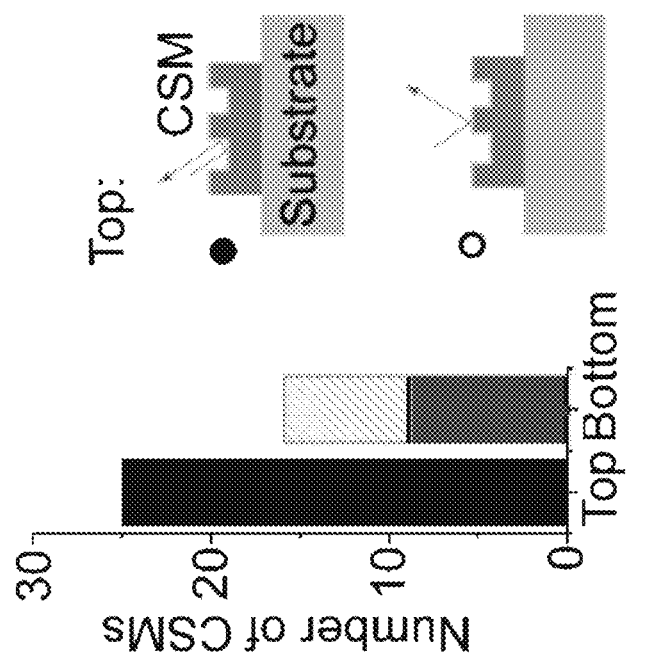
Figures 69F, 69G:
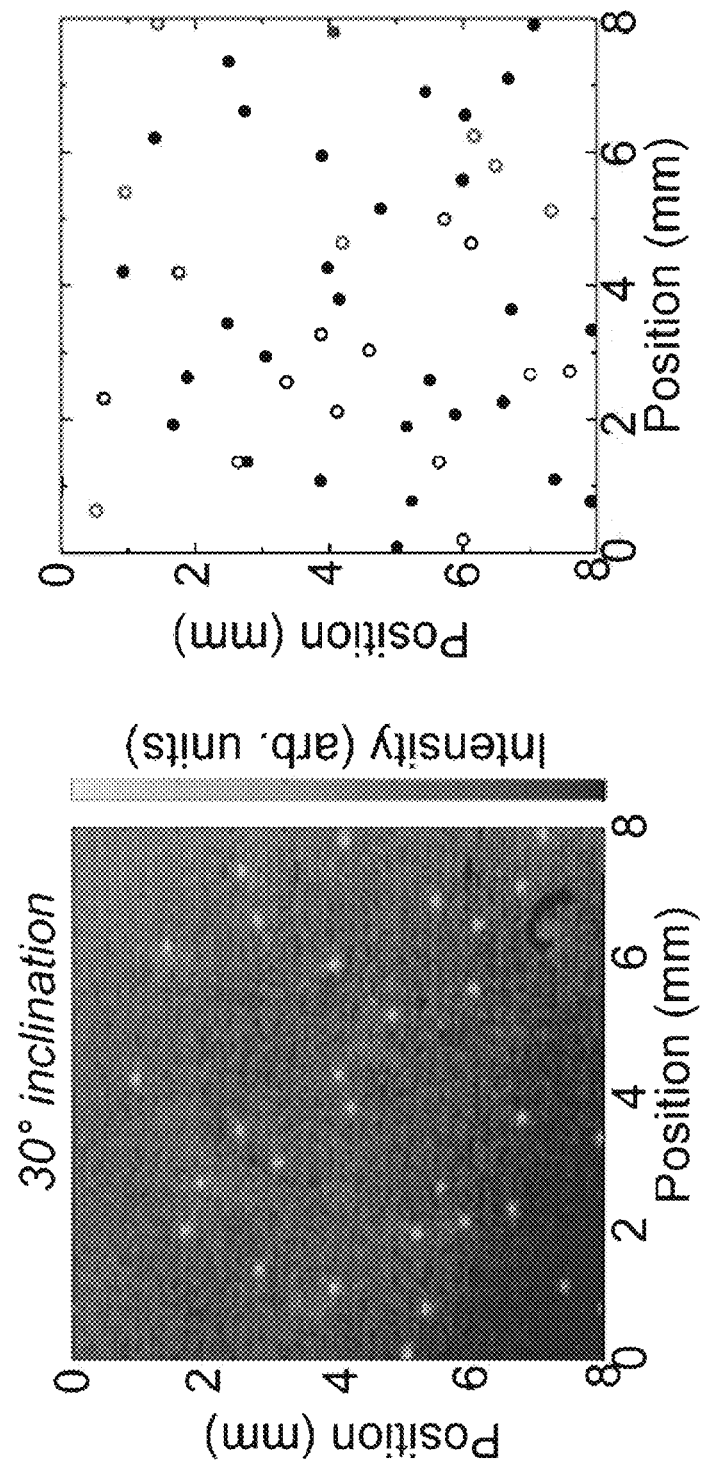
Figure 69H:
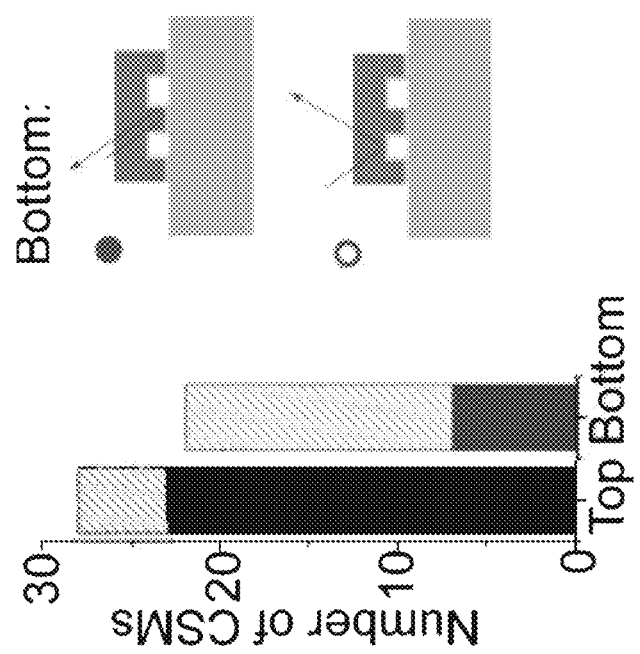
Figure 70B:
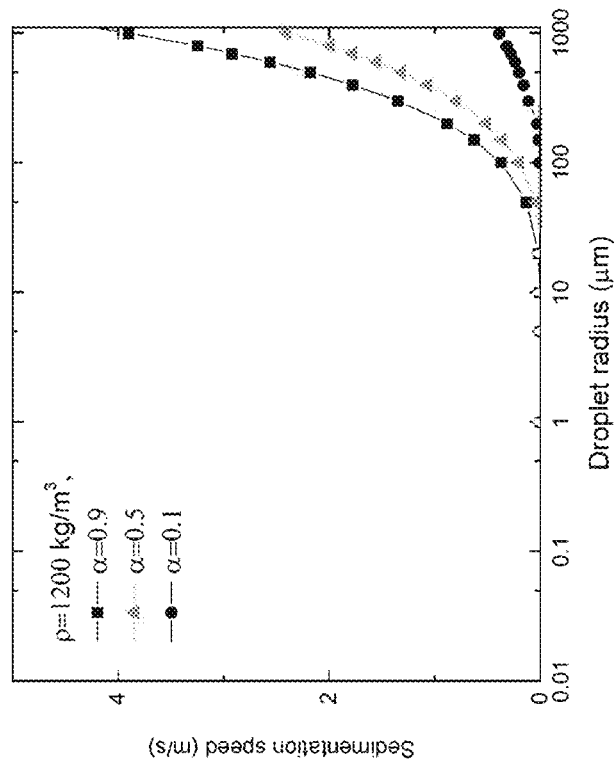
FIGS. 70B-70D show sedimentation speeds for particles of various sizes, densities, and aspect ratios in air under normal conditions.
Figure 70A:
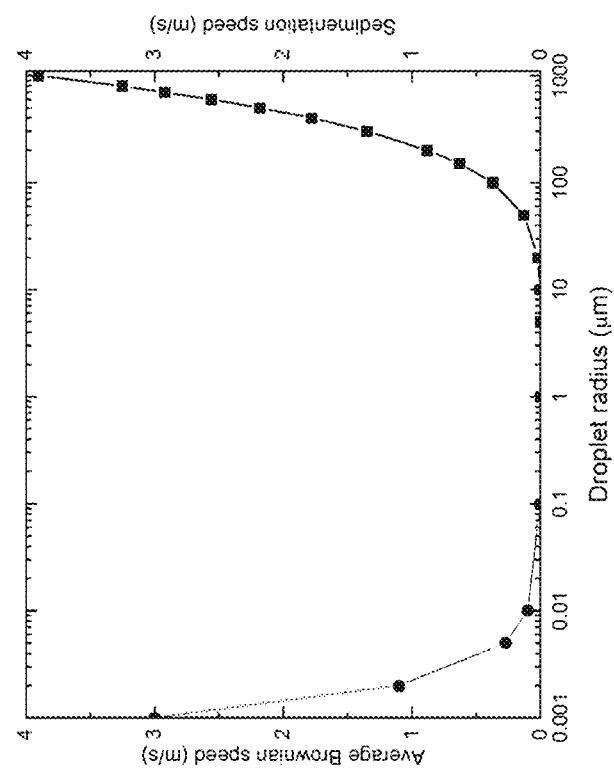
FIG. 70A shows comparison between sedimentation velocity and the average Brownian speed for particles of different sizes while in air under normal conditions (particle density p=1200 kg/m³ and aspect ratio α=0.9).
Figure 70D:
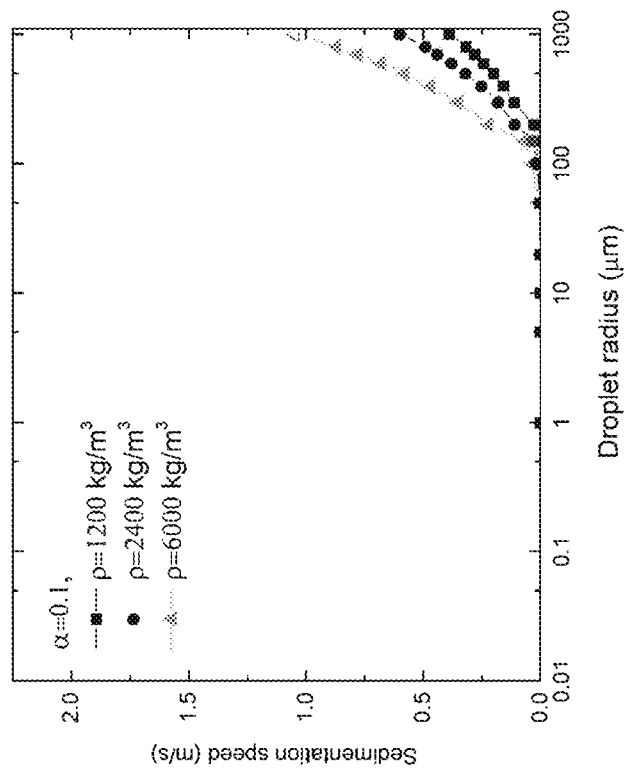
Figure 70C:
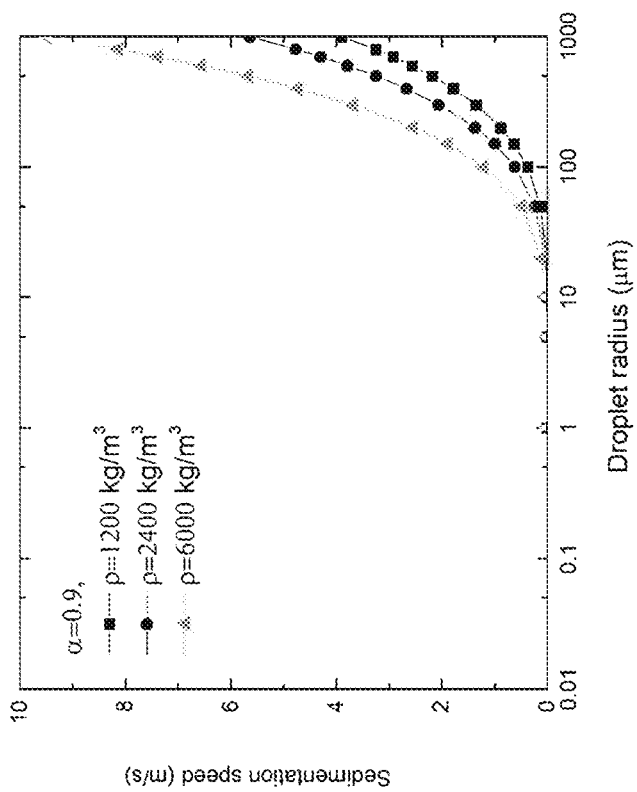

To efficiently detect the location of CSMs at standoff distances, a distinct batch was fabricated, where the CSM base consisted of a retroreflector design. The design follows that of Switkes et al. as 100 μm-size retroreflector for low intensity laser (10 mW/cm$^2$) reflected light from distances of up to 1 km. See Grob, B., Schmid, J., Ivleva, N. P. & Niessner, R. Conductivity for Soot Sensing: Possibilities and Limitations. *Anal. Chem.* 84, 3586-3592 (2012), and Switkes, M., Ervin, B. L., Kingsborough, R. P., Rothschild, M. & Sworin, M. Retroreflectors for remote readout of colorimetric sensors. *Sens. Actuat. B* 160, 1244-1249 (2011), each of which is incorporated by reference in its entirety. CSM retroreflectors were fabricated using SU-8 coated with 100 nm Ag designed in the checkered shape that allows them to reflect light back to the source from angles up to 60° (FIG. 69B). A custom laser-scanning system (FIG. 69A) was used to rapidly scan (<1 ms) and detect reflection from the CSMs that landed after spraying over an 8×8 mm$^2$ area at a 5 cm standoff distance (FIG. 69C). Careful examination under the microscope showed that N=34 CSMs were detected (FIGS. 69D and 69E): 25 CSMs (100% refers to the percentage of CSMs detected by laser scanning versus the total number of CSMs identified under the microscope for a given category) that had their reflectors facing up and N=9 (56%) that were flipped. The yield becomes slightly lower for CSM detection on the inclined substrate due to the imperfect backreflections (FIGS. 69F-69H): 23 CSMs (82%) were facing up and 7 CSMs (32%) that were flipped. These results suggest that this attribute of CSMs can aid in their tracking and recovery over large areas, and with refinements, could increase the detection threshold to 100% with a 10 cm$^2$/s scan.

The capability of grafting autonomous electronic circuits are capable of logical operation and information storage onto sub-millimetre-sized particles, forming what is termed Colloidal State Machines (CSMs). These particles can undergo aerosolization while carrying functional electronics on-board capable of interaction with the environment. With a thickness of 1.24 μm and weight of ~1.4 g/m$^2$, this CSM design represents one of the thinnest and lightest circuits produced to date. See Switkes, M., Ervin, B. L., Kingsborough, R. P., Rothschild, M. & Sworin, M. Retroreflectors for remote readout of colorimetric sensors. *Sens. Actuat. B* 160, 1244-1249 (2011), which is incorporated by reference in its entirety. In this design, the on-board circuit forms a state machine with two inputs (chemical and optical) and one output comprised of a memristor. Owing to the usage of 2D materials, CSM requires only 30 nW to irreversibly record events, granting it the ability to be powered from the energy harvested by the on-board 2D photodiode (30-100 nW). The results of chemical sensing are irreversibly stored in the memory (inducing memristor conductivity changes of up to 150 times). Furthermore, the addition of integrated retroreflectors allows the dispersed CSMs to be rapidly (<1 ms/frame) detected by a laser-scanning system. Colloidal state machines may find applications in a wide range of areas, including biosensing (e.g., within the human digestive tract), large-area sensing, confined space monitoring (e.g., chemical and biosynthetic reactors, oil and gas conduits), and aerospace programs.

Electronic Power Requirements

Batteries typically have 0.1 nW/μm$^3$ with energy capacities of 1 nJ/μm. See Spellings, M. et al. Shape control and compartmentalization in active colloidal cells. *Proceedings of the National Academy of Sciences* 112, E4642-E4650 (2015), and Ferrari, S. et al. Latest advances in the manufacturing of 3D rechargeable lithium microbatteries. *Journal of Power Sources* 286, 25-46 (2015), each of which is incorporated by reference in its entirety. Basic electronic devices, like a quartz oscillator and a radio frequency identification (RFID) tag made from conventional III-V electronics, consume approximately 100 nW and 10 μW, respectively. A sub-millimeter battery with 100×100×100 μm$^3$ dimensiOns should provide a power of 100 μW and store energy of 1 mJ, which is enough to power the above mentioned devices for 165 min and 100 sec, respectively. To ensure longer operational times, early attempts at autonomous microsystems often rely on external energy harvesting. In particular, some versions of smart dust harvested energy from wireless electromagnetic radiation, limiting the device operation to a distance of just a few meters. See Seo, D. et al. Wireless Recording in the Peripheral Nervous System with Ultrasonic Neural Dust. *Neuron* 91, 529-539 (2016), which is incorporated by reference in its entirety. Unfortunately, this approach does not appear capable of downward scaling, due to receiver size limitations. See Seo, D., Carmena, J. M., Rabaey, J. M., Maharbiz, M. M. & Alon, E. Model validation of untethered, ultrasonic neural dust motes for cortical recording. *Journal of Neuroscience Methods* 244, 114-122 (2015), which is incorporated by reference in its entirety. Alternative energy harvesting techniques, such as chemical power harvesting, bacteria-produced power, ultrasound, magnetic field and light, are continuously being developed. See Zebda, A. et al. Single Glucose Biofuel Cells Implanted in Rats Power Electronic Devices. *Scientific Reports* 3, 1516 (2013), Kim, H. & Kim, M. J. Electric Field Control of Bacteria-Powered Microrobots Using a Static Obstacle Avoidance Algorithm. *IEEE Transactions on Robotics* 32, 125-137 (2016), Servant, A., Qiu, F., Mazza, M., Kostarelos, K. & Nelson, B. J. Controlled In Vivo Swimming of a Swarm of Bacteria-Like Microrobotic Flagella. *Advanced Materials* 27, 2981-2988 (2015), and Chang, S. T., Paunov, V. N., Petsev, D. N. & Velev, O. D. Remotely powered self-propelling particles and micropumps based on miniature diodes. *Nat Mater* 6, 235-240 (2007), each of which is incorporated by reference in its entirety. They deliver between 0.1 and 10 nW/(100×100 μm$^2$) of power, which to date is not enough for conventional electronic needs. Fortunately, 2D material devices are predicted to bypass these difficulties, having a number of advantages, such as low-power performance as compared to Si (<0.5 V), acceptable gate control with subthreshold swings <<60 mV/dec, and large turn on currents (>10$^3$ μA/μm). See Ionescu, A. M. & Riel, H. Tunnel field-effect transistors as energy-efficient electronic switches. *Nature* 479, 329-337 (2011), and Fiori, G. et al. Electronics based on two-dimensional materials. Nat Nano 9, 768-779 (2014), each of which is incorporated by reference in its entirety. Most recent publications focus on individual 2D devices, while no integration of power harvesting and usage has been demonstrated yet. See Wang, Q. H., Kalantar-Zadeh, K., Kis, A., Coleman, J. N. & Strano, M. S. Electronics and optoelectronics of two-dimensional transition metal dichalcogenides. *Nat Nano* 7, 699-712 (2012), RadisavljevicB, RadenovicA, BrivioJ, GiacomettiV & KisA. Single-layer MoS$_2$ transistors. *Nat Nano* 6, 147-150 (2011), Lopez-Sanchez, O., Lembke, D., Kayci, M., Radenovic, A. & Kis, A. Ultrasensitive photodetectors based on monolayer MoS2. *Nat Nano* 8, 497-501 (2013), Cheng, R. et al. Electroluminescence and Photocurrent Generation from Atomically Sharp WSe$_2$/MoS$_2$ Heterojunction p-n Diodes. *Nano Letters* 14, 5590-5597 (2014), and Lopez-Sanchez, O. et al. Light Generation and Harvesting in a van der Waals Heterostructure. *ACS Nano* 8, 3042-3048 (2014), each of which is incorporated by reference in its entirety. Moreover, these efforts tend to describe 2D devices on flat silicon wafers, while their performance on substrates of high curvature is less understood.

Examples

Syncell Fabrication Process
(1). Chemical Vapor Deposition (CVD) Growth of Graphene (G), MoS$_2$ and Hexagonal Boron Nitride CVD graphene sheets were produced as follows: briefly, copper foil (Alfa Aesar, 99.8%, 25 μm thick, for graphene growth) with a size of 2.0×2.2 cm was used as substrate, the copper was annealed at 30 sccm H$_2$ gas flow (~560 mTorr) for 30 min at 1000° C. and then 0.5 sccm (for single layer graphene) or 10 sccm (for bilayer graphene. See Tu Z, Liu Z, Li Y, Yang F, Zhang L, Zhao Z, et al. Controllable growth of 1-7 layers of graphene by chemical vapour deposition. *Carbon* 2014, 73: 252-258, which is incorporated by reference in its entirety.) methane was introduced for 15 min or 10 min, respectively. After that, the furnace was kept at 1000° C. for another 5 min and turned off. Cu foil was cooled down and removed out at room temperature.
(2). Chemical Vapor Deposition (CVD) Growth of MoS$_2$ Sapphire or SiO$_2$ substrate (7.0 cm×1.7 cm) washed with acetone (5 min) and isopropyl alcohol (IPA, 5 min) was used in the growth of MoS$_2$, MoCl$_5$ powders (Sigma Aldrich, 99.99%, ~4 mg) was loaded onto a SiO$_2$/Si substrate and placed in the central part of the heating zone, the sulfur powder (Sigma Aldrich, 99.998%, ~0.5 g) was added in a separate Al$_2$O$_3$ boat and placed at the upper stream side of the tube where the temperature was about 200° C. during the reaction. The sapphire or SiO$_2$ substrate was placed at the downstream side 1 cm next to MoCl$_5$. The tube was purged with 50-sccm Ar under vaccum for 30 min, then the furnace was heat to 850° C. in 30 min. The Ar flow kept at 50 sccm and the displayed pressure was about 1.13 torr. The tube was kept at the same temperature for another 10 min and then cooled down to room temperature naturally.
(3). Liquid Exfoliation of the Black Phosphorus and Other Nanoparticles for Ink Application 60 mg of Black phosphorus was well grounded before being dispersed in 20 mL EG and a tip sonicator (10% maximum power) was used to sonicate the resulted mixture for 10 hours with liquid cooling at 4° C. The obtained solution was centrifuged at 2000 rpm at room temperature for 20 min to produce the final dispersion of BP nanoflakes. To determine the concentration of BP nanoflakes, we sampled 1.5 g solution and filtered it using a 0.2 μm-sized PTFE syringe filter, and weighted the BP nanoflakes left on the filter after drying under vacuum overnight. The dispersion was diluted to solutions with different concentrations to collect the UV-Vis absorption. The spin coating was used to prepare samples of BP nanoflakes on SiO$_2$/Si (or gold-coated) substrate for AFM, Raman spectroscopy, and X-ray photoelectron spectroscopy (XPS). A droplet of the dispersion was added on to a Holy-carbon grid and dried under vacuum to prepare the specimen for TEM.

For other 2D nanoflakes or nanoparticles, single layer graphene oxide dispersion in water (500 mg/L), molybdenum disulfide (MoS$_2$) pristine flakes in solution (1-8 monolayers, 18 mg/L), and MoS$_2$ ultrafine powder (~90 nm) were purchased from Graphene Supermarket and used as received. Ethylene glycol (Sigma Aldrich, 99.8%) was used to further disperse MoS$_2$ ultrafine powder for the ink application.
(4). Noncovalent Functionalization of CVD Graphene on Copper (Graphene A)

A procedure reported in literature was adopted for the noncovalent functionalization via π-π stacking. Generally, the copper foil with graphene (single layer or bilayer) and a size of 2.0×2.2 cm was incubated in the dimethyl formamide (DMF) solution of functional molecules for 1 h and washed with fresh DMF, ethanol, and dried at room temperature (the washing step can remove those excess molecules which were not attached to the graphene surface). Specifically, 2 mL DMF solution of 1-pyrenebutyric acid (97%, Sigma Aldrich), 1-aminopyrene (97%, Sigma Aldrich), 1,5-diaminonaphthalene (97%, Sigma Aldrich), or other functional molecules (2 mmol/L) was added into a 10 mL-beaker with copper foil, and mechanically shaken for 1 h, then the copper foil was removed out and rinsed with DMF and ethanol in sequence, with each of 30 s. After drying, the copper foil was spin-coated with a PMMA layer around 230 nm using 950PMMA A4 (MicroChem) at 3000 rpm for 1 min. The copper layer was etched out with ammonium persulfate (APS-100, TRANSENE CO INC) and the left graphene/PMMA film was rinsed with deionized water. For characterization, the film was transferred onto Si/SiO$_2$ substrate with the graphene side down and characterized with Raman spectroscopy with or without washing out the PMMA layer using acetone, to compare with the pristine graphene. For further fabrication and modification, the film was picked up with Si/SiO$_2$ substrate with the graphene side up or a polydimethylsiloxane (PDMS) stamp (2.5×2.5 cm, 2 mm thickness) has been attached to the graphene/PMMA layer before the etching step.
(5). Noncovalent Functionalization of Graphene (Graphene A) on PWA Film In this step, methanol, a poor solvent of PMMA, was used as the only solvent to prepare the solution of functional molecules or rinse in this step. Functional molecules like 1-pyrenebutyric acid N-hydroxysuccinimide ester (95%, Sigma Aldrich) (4 mmol/L) and 1,5-diaminonaphthalene were used in this step (a heating to 80° C. is required to dissolve like 1-pyrenebutyric acid N-hydroxysuccinimide ester in methanol). A few drops of the solution were added to overcover the surface of the SiO$_2$ wafer or PDMS-supported PMMA/graphene film and the incubation time is 15 min. After that, the film was rinsed with fresh methanol for 30 s to remove any residual functional molecules which were not attached to the graphene surface. After drying, the film is ready for the ink-jet printing in the next step. The SiO$_2$-supported film can be characterized with Raman spectroscopy, while the PDMS-supported film can be transferred to another piece of Si/SiO$_2$ wafer for characterization via washing out the PMMA layer.

(6). Ink-Jet Printing of Polymer Latexes or their Composite Solution with Nanoparticles Polymer latex, polystyrene (PS) latex (Sigma Aldrich, amine-modified polystyrene, fluorescent orange, 0.1 µm mean particle size, 2.5 wt %) for example, were diluted with ethylene glycol (EG) to 1.25% (vol:vol=1:1), 0.83% (1:2), 0.50% (1:4), and 0.25% (1:9) as inks for the printing. The PS latex was also composting with zinc oxide (ZnO) nanoparticle ink (2.5 wt. %, viscosity 10 cP, work function −4.3 eV, Sigma Aldrich) and further diluted with EG (vol:vol:vol=2:1:1), iron oxide(II,III), magnetic nanoparticles solution (10 nm avg. part. size, 5 mg/mL in $H_2O$, Sigma Aldrich) and further dilute with EG (vol:vol:vol=9:2:7), or exfoliated black phosphorus solution (vol:vol=1:1) to prepare functional inks for the printing. In the inkjet printing at room temperature using a MICRO SYS printer, from Cartesian Technologies, a ceramic printer needle was used and the printed ink volume is 1 nL for each dot, the spacing between the two adjacent dots is 500 µm, and the printing area is typically 1.5-2.0 cm in length and width. After printing, the ink was dried at room temperature overnight and further under house vacuum for 1 h. This $Si/SiO_2$ or PDMS-supported graphene/PMMA film with the printed dot array was annealed at 120° C. for 10 min and cooled down to room temperature, and ready for the next-step use. A printer from Fujifilm Dimatrix Materials (Printer DMP-2850) was also used and n ink volume of 10 pL or 1 pL was printed to prepare smaller-sized microspot with PS latex ink (1.2 wt %, 50 nm mean particle size, in a mixture of water and ethylene glycol (1:1)).

For the printing of conductive silver microspot array, silver dispersion (nanoparticle, 30-35 wt. % for printing on plastic films, Sigma-Aldrich) was diluted with ethylene glycol/water mixture (1:1 in volume) for 200 times as nanoink and the MICROSYS printer for the printing, with a printing volume of 1 nL. In addition to the use of printers above to print the microparticles, the contact printing was done with a capillary tube with an ink volume around 0.5 µL by hand, with this, larger spots were printed with a diameter about 1 mm. The sequential printing of silver microspot array and capillary contact printing allow users to print polymer or its composite particles with separated silver spots. As a simple demonstration, the silver microspot array was first printed with an ink volume of 1 nL for each spot a space of 500 µm for the two adjacent dots, and annealed at 120° C. for 10 mins. The polymer or its composite spots were printed by capillary contacting to cover the silver array, further annealing at 130° C. for 10 mins is applied to enhance the bonding between the two materials.

(7). The Preparation of the Second Piece of Graphene/PMMA Film (Graphene B)

To prepare the second piece of graphene/PMMA film (which will be used as the cover layer during the stacking process), a modified fabrication procedure was adopted. Particularly, one-side functionalized graphene/PMMA film in step 4 was transferred onto a relatively larger Si/SiO2 wafer (5×5 cm), and drops of the functional molecule (i.e., 1-pyrenebutyric acid N-hydroxysuccinimide ester, 1,5-diaminonaphthalene) solution in methanol were added onto the wafer until the complete infusion of the solution into the underlying surface of the graphene/PMMA film. The film was incubated for 10 mins and after that, washed with fresh methanol, transferred back to the deionized water, and rinsed with water for 4 times with 10 mins each time. This film was left in water and ready for the next step.

(8). Stacking, Liftoff, and Auto-Perforation

The annealed graphene/PMMA film on $SiO_2$ or PDMS substrate in Step 7 severing as the bottom layer to pick up the cover layer in Step 5 from water. The two films with the sandwiched PS or its nanocomposite dots were dried at room temperature for 1 h and then annealed at 120° C. for 15 mins. After that, the films together with the substrate were placed into a 50-mL beaker with a magnetic stir bar, 10-15 mL of ethanol/water (4:1 in volume) was added, the beaker was sealed with paraffin and heated to 80° C. under stirring for 10 mins, after that, the solution was cooled down to room temperature and water for 12 h, with visible, dark particles suspending in the solution. After standing overnight, these particles were settled down and the solution was replaced with fresh ethanol/water (4:1). The heating, stirring, settling, and solution replacement procedure was repeated another two time to remove any residual PM1VIA in the solution or on the graphene surface and after that, these particles were stored in the solution and fishing out on to glass slide, $SiO_2$ substrate, or ITO-coated glass via pipette for further characterization or measurement.

(9). The Preparation of 2D Syncell Particles with CVD Graphene without Fiinctionalization The preparation of syncell particles with pristine graphene as outer layer is simpler and faster than the above procedure to prepare the syncell particles with two-side functionalized graphene. Briefly, graphene (A) was transferred onto PMMA with either PDMS or $Si/SiO_2$ as substrate, the film with graphene layer up. The film was printed with PS or PS/nanoparticles dot array, and annealed at 120° C. for 10 mins. The other layer of graphene (B layer) was transferred to PMMA. This film was floated in water and stacked onto graphene A to form the sandwich. The stacked two graphene/polymer films with PS dots (or PS nanocomposite dots) dried at room temperature overnight and then annealed at 120° C. for 10 mins. The further liftoff operation was the same as above.

(10). The Preparation of 2D Syncell Particles with Molybdenum Disulfide ($MoS_2$) and Hexagonal Boron Nitride hBN (Syncell)

The preparation procedure is similar that in (9). The only difference is the transfer of $MoS_2$ sheet. $MoS_2$ grown on $Si/SiO_2$ substrate was spin-coated with a thin PMMA layer (same as above) and the $MoS_2$/PMMA film was liftoff from the $SiO_2$ substrate with KOH solution (2 M in water) as etchant at 80° C. The film was rinsed with deionized water 5 times and used for the further printing, stacking, and liftoff, to prepare $MoS_2$ syncell. For hBN syncell, single layer or multi-layer hBN film grown on grown on copper foil produced by CVD method was purchased from Graphene Supermarket, the transfer and further preparation of syncell particles are the same as that of the graphene syncell particles above.

(11). Characterization and Measurement

The optical images of microparticles were acquired from ZEISS Axio Scope A1 with a magnification of 5 and 20 times. The visualization of the liftoff process was also monitored the same microscope. A temperature controlled microscopic stage from Linkam Scientific was coupled to the microscope system for heating up solution during the liftoff. Raman spectroscopy was performed on a Horiba Jobin Yvon LabRAM HR800 system using a 532 nm excitation laser, 10× objective lens with ~10 µm diameter spot size, and 1800 lines/mm grating. The profile data of the microparticles were obtained with Tencor P-16 Surface Profilometer™ using a 2 um radius diamond tipped stylus Step height, with a measurement range of 20 Angstroms to 1 mm. Static water contact angle was measured by ramé-hart Model 590 goniometer. The transmittance of BP solution was measured with Shimadzu UV-3101PC Spectrophotometer at a wavelength of 660 and 1176 nm. Freshly exfoliated BP solution was used as a stock solution and dilute at different times for the measurement. NanoSight LM10 (Malvern) was used for the rapid and accurate analysis of the size distribution and population of BP nanoparticles from 10 nm to 2000 nm in diameter using single particle tracking.

Atomic force microscopy (AFM) was performed using Asylum MFP-3D-BIO in tapping/AC mode with Si tips (Asylum, AC240TS). The scan rate was 0.7 Hz, and scan angle was set to be 0°. Black phosphorus (BP) samples was prepared via spin-coating onto a plasma-treated $SiO_2/Si$ substrate. Scanning electron microscope was conducted on Zeiss Merlin High-resolution SEM, which is equipped with an in-lens energy selective backscatter detectors for backscattered electron imaging and the visualization of regions of different composition. For SEM observation, the BP/PS composite sample was prepared via mixing of 100 µL of PS latex nanoparticle dispersion (2.5 wt %) and 100 µL of BP dispersion in ethylene glycol (0.25 mg/mL) and drying on the hot plate of 120° C. for 10 min. Transmission Electron Microscopes (TEM) of BP nanoflakes was carried on JEOL 2010 Advanced High-Performance TEM, and BP nanoflakes were suspended on a holy-carbon grid for the characterization. For the fluorescence imaging of $MoS_2$ or graphene microparticles, the particles together with solvent were sampled and naturally dried on glass slides, a broadband supercontinuum white light source (NKT Photonics, SuperK EXTREME EXR-15) was attenuated with a neutral density filter. Fluorescence signal was filtered with band-pass filters and collected on a 512×512-pixel imaging area of electron multiplying charge coupled device (EMCCD) camera (Andor, iXon3). X-ray photoelectron microscopy (XPS, Kratos AXIS Ultra spectrometer with a monochromatized Al Kα source) was used to analyze the surface chemistry and compositions of various samples including microparticles with different 2D materials, functionalized graphene, BP nanoflakes, and others.

To study the electrical properties of microparticles with the probe station, a MATLAB code was written to execute commands over a semiconductor parameter analyzer (SPA) (Agilent E5262A Source Measure Units), which is used to query electrical information of the microparticles aided by a probe station. The microparticles were loaded into a probe station chamber, and the electrical measurements were carried out in an ambient environment at room temperature with sweeping voltage rate was 50-100 mV/s. In general, the electrical properties of these graphene microparticles can be categorized into two major modes: in-plane mode and vertical (out-of-plane) mode. In the in-plane mode, the microparticles are placed onto an insulating surface (typically glass) with one of the 2D material (typically graphene) surfaces facing up, and the Tungsten (W) probe head gently placed on the material surface. To aid the process of locating a microparticle under the microscope atop the probe station, its location is separately located under an optical lens and marked before it was placed in the probe station. In the vertical mode, vertical conductivities (or through-plane conductivity of the 2D material-composite vertical stack, i.e. Gr-PS/BP-Gr) are typically tested. In this case, a conductive substrate for the microparticle is needed to complete the probe-particle-substrate circuit. ITO substrate was selected for its robustness.

Syncell as an Aerosolizable Electronics

1. Fabrication

To define polymer syncell bases, the first photolithography step was performed using the negative photoresist SU-8 2002 on $SiO_2/Si$ wafer (FIGS. 72A-72C). Next, a monolayer of $MoS_2$ (patterned in 25 µm wide stripes using oxygen etching) with a PMMA support layer was transferred onto the structure with subsequent annealing at 80° C. for 1 h and 150° C. for 30 min. The wafer was then washed in acetone and ethanol and dried under nitrogen to remove the PMMA layer. In parallel, a monolayer of $WSe_2$ was prepared on a separate wafer: 25 µm wide $WSe_2$ stripes were defined using the second photolithography step with the positive photoresist Shipley S1805 and subsequent oxygen etching. The photoresist was removed in RemoverPG developer. The patterned $WSe_2$ monolayer was then transferred onto MoS2 using PMMA as the support layer, annealed at 80° C. for 1 h and 150° C. for 30 min. The wafer was washed in acetone and ethanol and dried under nitrogen. The third photolithography with a LOR30B sacrificial layer and a positive photoresist Shipley S1805 was used to define 40 nm-thick gold electrical contacts, which were deposited using a Denton E-beam evaporator. The lift off process was performed in Remover PG at 80° C.

The fourth photolithography step with a LOR30B sacrificial layer and Shipley S1805 was used to define the structure of subsequent $MoS_2$ film. The $MoS_2$ film was deposited using a modified Langmuir-Blodgett method, where the $MoS_2$ film was collected at an ethanol-hexane interface. See, Bessonov, A. A., et al., *Layered menzristive and memcapacitive switches for printable electronics*. Nat Mater, 2015. 14(2): p. 199-204, which is incorporated by reference in its entirety. To form the top oxide layer, the structure was annealed at 200° C. for 2h. The lift off process was performed in Remover PG at 80° C. The fifth photolithography with a LOR30B sacrificial layer and Shipley S1805 was used to define 100 nm-thick silver electrical contacts. The lift off process was performed in Remover PG at 80° C. A monolayer hBN (patterned in 50 µm wide stripes) was then transferred on top. Since hBN is transparent, its alignment on the syncell is very challenging. To this end, hBN was transferred with S1850 photoresist in order to help visualize the structure (the photoresist was removed afterwards). Finally, syncells were coated with a PMMA layer for support and lifted off the substrate using KOH solution. To disperse syncells, the PMMA was dissolved in acetone.

Retroreflectors were fabricated using SU-8 photolithography with subsequent evaporation of 100 nm silver.

2. Methods.

2D Materials.

Large-area $MoS_2$ films were grown by a chemical vapor deposition (CVD) process described elsewhere. See, Yu, Y., et al., *Controlled Scalable Synthesis of Uniform, High-Quality Monolayer and Few-layer MoS2 Films*. Scientific Reports, 2013. 3: p. 1866, which is incorporated by reference in its entirety. Briefly, solid 0.5 g S and 4 mg $MoCl_5$ were used as precursors, and a 2×1 $cm^2$ 300 nm SiO2/Si wafer piece was used as a growth substrate in a vacuum tube quartz furnace. The system was filled with 50 sccm Ar for 1 h with subsequent growth at 850° C. under 2 Torr pressure for 10 min and a 30 min temperature ramp. As-grown MoS2 films were coated with polystyrene and peeled from the substrate—taking advantage of the surface-energy-assisted method. See, Gurarslan, A., et al., *Surface-Energy-Assisted Perfect Transfer of Centimeter-Scale Monolayer and Few-Layer MoS2 Films onto Arbitrary Substrates*. ACS Nano, 2014. 8(11): p. 11522-11528, which is incorporated by reference in its entirety. Continuous films of hBN and WSe$_2$ monolayers were purchased from Graphene Supermarket and 6Carbon, respectively.

Characterization.

Raman and photoluminescence measurements were performed using a Raman spectrometer HR-800 (Horiba BY) with 532 nm laser. Height profiles were measured using a CCi BD optical profiler. Electrical resistance measurements were performed in the ARS PSF-10-1-4 Cryogenic Probe Station using micromanipulators as probes (7X, Micromanipulator). Conductance measurements were performed by scanning the voltage from −0.1 to 0.1 V.

Aerosol Experiments.

All aerosol experiments were performed with a Master Airbrush G22 nebulizer in a closed tube in the laminar flow hood. Syncells (dispersed in 80% water/20% ethanol) were sprayed under 2-15 psi pressure from a 300 μm nozzle. The second nebulizer was used to spray analyte droplets in the orthogonal direction (FIGS. 74A-74E). Aggregated syncells, syncells with visual defects, and syncells that landed upside down were excluded from analysis.

Standoff Detection.

Standoff syncell detection was performed using a setup with galvanized mirrors, a 532 nm laser, and a photodetector (H10330a-25, HAMAMATSU).

3. In-Flight Analysis

To further understand syncell in-flight behavior, rigorous mathematical calculations were performed on different aerosol aspects. The nebulizer provides 2-15 psi pressure over a 2 cm long tube with a diameter of 0.3 mm. This impulse provides initial droplet speeds of 7-100 m/s, which are rapidly slowed down due to the air drag. Time until the full stop in the horizontal direction is called relaxation time and can be calculated from the equation of motion:

$$\frac{dv}{dt} = -\frac{3\rho_{air}}{4\rho_{particle}D}v^2 C_d, \quad (6)$$

where v is the particle speed, $\rho_{air}$ is the air density, $\rho_{particle}$ particle density, $C_d$ drag coefficient and D the particle characteristic length. Travelled distance in the horizontal direction can be calculated by integrating the solution to Eq. (6). As will be shown in the following, drying time is much longer than the relaxation time; therefore, the particle can be treated as being a liquid droplet for relaxation calculations.

Droplets with 100-300 μm have relaxation times on the order of microseconds, with higher speeds increasing particle drag and, consequently, shortening relaxation time (FIG. 77A). As expected, smaller droplets have smaller inertia, losing their speed more rapidly than larger ones. This leads to longer travelled distance that increase with initial droplet speed (FIG. 77C). Interestingly, droplets with 100 μm diameter travel less than 0.3 m even with initial speed as high as 1000 m/s.

The drying process consists of two distinct parts. While evaporating, the droplet loses energy at the expense of its temperature. This happens until it reaches an equilibrium temperature where convective heat flux from the surroundings matches to energy lost due to evaporation. The time that it takes for the droplet to stabilize its temperature is called the cooling time. In the second part, the droplet temperature is stable while the diameter decreases. The time required for complete droplet evaporation is called the lifetime.

Cooling time can be calculated from a droplet energy balance (see Holterman, H. J., *Kinetics and Evaporation of Water Drops in Air, in Institute of Agricultural and Environmental Engendering.* 2003, which is incorporated by reference in its entirety):

$$\tau_c = -\frac{c_p D^2}{3h\xi(1+b\sqrt{Dv})\left(\frac{dp_{sat}}{dT}+\gamma\right)}, \quad (7)$$

where $c_p$ is the specific heat (water: $c_p$=4180 J kg$^{-1}$K$^{-1}$), h is the heat of evaporation (water: h=22.6 10$^5$ J/kg), b and ξ are special parameters (see below), $p_{sat}$ is the saturated vapor pressure, and γ is a constant (~67 Pa/K).

After the droplet temperature stabilizes, its diameter change can be approximated as in Holterman (2003):

$$\frac{dD}{dt} = -\frac{4M_L D_{vapor}}{D\rho_{particle}RT}\gamma(T-T_w)(1+0.276\text{Re}^{1/2}\text{Sc}^{1/3}), \quad (8)$$

where $M_L$ is the molecular weight of the evaporating liquid (water: 0.018 kg/mole), $D_{vapor}$ is the average diffusion coefficient for vapor molecules in the saturated film around the drop, T is the average absolute temperature, $T_w$ is the wet-bulb temperature (ΔT=T−$T_w$), Re is Reynold's number, Sc is Schmidt's number, and R is the gas constant (8.31 J ma$^{-1}$K$^{-1}$). Solving this yields the expression for the droplet lifetime:

$$t_{life} = \frac{2}{q_0 q_1^2 \Delta T}(q_1 D_0 - \ln(1+q_1 D_0)), \quad (9)$$

where $q_0$ and $q_1$ are parameters defined later in the text.

Numerical calculations showed that cooling time decreases with droplet speed, as vapor pressure decreases with speed, leading to faster evaporation and cooling. Interestingly, the droplet stops much faster compared to the cooling time (FIG. 77D). After its stop, the droplet starts to slowly sediment, cooling down for 0.01-0.1 sec (at 17° C., 100 μm droplet cools down by 4° C.). Finally, the droplet fully evaporates after 100-1000 sec of flight. Droplet lifetimes can be longer when multiple droplets coexist, increasing outer vapor pressure and consequently decreasing evaporation rate, such as what occurs in clouds.

Sedimentation speed is calculated from the equilibrium condition, where the drag on a particle is equal to the buoyant force $F_B$:

$$F_B = 1/2 \rho_{air} A C_d v^2. \quad (10)$$

For spherical objects under low Reynold's numbers, calculation follows the famous Stokes' law. However, dried syncell has a non-spherical shape and can possibly move into a non-Stokes regime. To account for this, the drag coefficient needs to be modified.

Correction factors were introduced for non-spherical particles. In the Stokes regime, the syncell will preferentially fall with the drag parallel to the axis of symmetry (a is aspect ratio) (see, Byron, M. L., *The rotation and translation of non-spherical particles in homogeneous isotropic turbulence.* arXiv:1506.00478, 2015, which is incorporated by reference in its entirety):

$$f = -\frac{\left(\frac{4}{3}\right)\alpha^{-\frac{1}{3}}(1-\alpha^2)}{\alpha + \frac{(1-2\alpha^2)\cos^{-1}\alpha}{\sqrt{1-\alpha^2}}}, \quad (11)$$

while in the non-linear regime, the syncell will rotate—having the following f:

$$f = -\frac{\alpha^{-\frac{1}{3}}\sqrt{1-\alpha^2}}{\cos^{-1}\alpha}. \quad (12)$$

The projected syncell is also different for Stokes and non-linear regimes:

$$A_p = \left(\frac{3\alpha}{2}\right)^{-2/3}, \quad (13)$$

$$A_p = \frac{1}{3}\left(\frac{8\alpha}{\pi}+1\right)\left(\frac{3\alpha}{2}\right)^{-2/3}. \quad (14)$$

Surface Area:

$$A_{surf} = \frac{2\alpha+1}{(18\alpha^2)^{1/3}}. \quad (15)$$

Shape Factor:

$$C_{shape} = 1 + 1.5(A_{surf}-1)^{1/2} + 6.7(A_{surf}-1). \quad (16)$$

Next, a corrected Reynolds number and a corrected drag coefficient are:

$$Re^* = \frac{C_{shape}Re}{f}, \quad (17)$$

$$C_d^* = \frac{24}{Re^*}(1+0.15Re^{*0.687}) + \frac{0.42}{1+\frac{42500}{Re^{*1.16}}}. \quad (18)$$

The drag coefficient is given by the product of the corrected drag coefficient and the shape factor: $C_d = C_d^* \cdot C_{shape}$.

Relaxation Time.

The drag coefficient for the relaxation time calculations is approximated using the following empirical formula:

$$C_d = \left(\left(\frac{a}{Re}\right)^c + b^c\right)^{1/c}, \quad (19)$$

with constants a=24, b=0.32 and c=0.52, where Re stands for the Reynolds number:

$$Re = \frac{\rho_{air}Dv}{\eta_{air}}, \quad (20)$$

with $\eta_{air}$ being the dynamic air viscosity.

Cooling Time.
The droplet energy balance is:

$$P_{evap} = P_{ambient} + P_{cooling}. \quad (21)$$

The required power to evaporate a volume dV during a small time interval dt is equal to:

$$P_{evap} = -\frac{1}{2}\pi h \rho_{particle} D^2 \frac{dD}{dt}. \quad (22)$$

The power withdrawn from the syncell for water evaporation is equal to:

$$P_{cooling} = -\frac{1}{6}\pi c_p \rho_{particle} D^3 \frac{dT}{dt}. \quad (23)$$

The heat withdrawn from ambient air (temperature $T_d$) by a drop at temperature T' can be expressed as:

$$P_{ambient} = \alpha(T_d - T), \quad (24)$$

where $\alpha$ is a heat transfer coefficient that can be determined from the steady-state evaporation rate. This yields:

$$\frac{dT}{dt} = -\frac{3h\xi}{c_p D^2}\left(1+b\sqrt{Dv}\right)\left(\frac{dp_{sat}}{dT}+\gamma\right)(T'-T_w), \quad (25)$$

where:

$$\xi = \frac{4M_L D_{vapor}}{\rho_{particle}RT}, \quad (26)$$

$$\frac{dp_{sat}}{dT} = \frac{b_0 b_1 \ln 10}{(T+b_1)^2} p_{sat}, \quad (27)$$

with constants $b_0$=7.5 and $b_1$=237.3 and $p_{sat}$, the saturated vapor pressure (empirical formula for water):

$$p_{sat} = 610.7 \cdot 10^{7.5T/(T+237.3)}, \quad (28)$$

and $T_w$ is the wet bulb temperature that can be related to relative humidity (RH) by the following empirical formula (again for water):

$$T_w = T - ((a_0+a_1 T) + (b_0+b_1 T)RH + (c_0+c_1 T)RH^2), \quad (29)$$

with constants: $a_0$=5.11, $a_1$=0.43 K$^{-1}$, $b_0$=−0.047, $b_1$=−0.0059 K$^{-1}$, $c_0$=−4×10$^{-5}$ and $c_1$=1.66×10$^{-5}$ K$^{-1}$.

Lifetime.

For lifetime calculations, the average diffusion coefficient for vapor molecules in the saturated film around the drop can be calculated using the empirical formula derived for water:

$$D_{vapor} = 21.2 \cdot 10^{-6} \cdot (1+0.0071(T-273)). \quad (30)$$

Schmidt's number is a dimensionless quantity relating the viscous transport of a material to its diffusive transport:

$$Sc = \frac{\eta_{air}}{\rho_{air} D_{vapor}}. \quad (31)$$

This yields the following formula:

$$\frac{dD}{dt} = -\frac{a}{D}\left(1+b\sqrt{Dv}\right), \quad (32)$$

where a and b are constants depending only on ambient conditions and liquid properties:

$$a = \frac{4\gamma M_L D_{vapor}}{\rho_{particle} RT} \Delta T, \quad (33)$$

$$b = 0.276 \left( \frac{\rho_{air}}{\eta_{air} D_{vapor}^2} \right)^{1/6}. \quad (34)$$

Solving this yields:

$$t_{life} = \frac{2}{q_0 q_1^2 \Delta T} (q_1 D_0 - \ln(1 + q_1 D_0)), \quad (35)$$

where $$q_0 = \frac{2a}{\Delta T}(1 + bs_0), \quad (36)$$

$$q_1 = \frac{br_0}{1 + bs_0}, \quad (37)$$

with $r_0 \approx 64.65$ s$^{-0.5}$ and $s_0 \approx -1.117 \times 10^{-3}$ m$^{-0.5}$.

4. MoS$_2$/TEA Binding Analysis

The reaction between MoS$_2$ and TEA can be summarized as follows:

$$MoS_2 + TEA \underset{k_b}{\overset{k_f}{\rightleftarrows}} MoS_2/TEA \overset{k_i}{\rightarrow} MoS_2 \sim TEA, \quad (38)$$

introducing the binding constant $k_f$, the association constant $k_b$, and the irreversible constant $k_1$. Rate equations:

$$\frac{dMoS_2}{dt} = -k_f \cdot MoS_2 \cdot TEA + k_b \cdot MoS_2/TEA, \quad (39)$$

$$\frac{dMoS_2/TEA}{dt} = k_f \cdot MoS_2 \cdot TEA - (k_b + k_i) \cdot MoS_2/TEA \quad (40)$$

To extract these binding constants, MoS$_2$ resistance changes previously measured are fitted by Perkins et al. (FIGS. 82A-82B). See, Perkins, F. K., et al., *Chemical Vapor Sensing with Monolayer MoS2*. Nano Letters, 2013. 13(2): p. 668-673, which is incorporated by reference in its entirety. The initial slope of TEA exposure to MoS$_2$ was used to extract $k_f$; $k_b$ was extracted from MoS$_2$ post-exposure response, while $k_i$—from the difference between the initial and final MoS$_2$ resistances.

5. State Machine Operation: Power Balance

A successful state machine should not change its state when there is no chemical, even under light illumination. Therefore, the following criteria should be met:

$$V_{th} > \frac{\varepsilon R_m^{OFF}}{R_{ph} + R_m^{OFF} + R_{ch}^{in}}, \quad (41)$$

which sets the boundary for the initial chemiresistance:

$$R_{ch}^{in} > R_m^{OFF} \left( \frac{\varepsilon}{V_{th}} - 1 \right) - R_{ph}, \quad (42)$$

In this case $R_m^{OFF} \gg R_{ph}$ and $\varepsilon/V_{th} \approx 2$, transforming Eq. (42) into $R_{ch}^{in} > R_m^{OFF}$. The larger the value of $R_m^{OFF}$, the stronger criteria Eq. (42) becomes.

After reaction with an analyte, chemiresistor decreases its resistance to $R_{ch}^f$. This allows the voltage across the memristor to reach $V_{th}$, changing its resistance:

$$V_{th} = \frac{\varepsilon R_m^{ON}}{R_{ph} + R_m^{ON} + R_{ch}^f}, \quad (43)$$

$$R_m^{ON} = \frac{R_{ch}^f + R_{ph}}{\frac{\varepsilon}{V_{th}} - 1}. \quad (44)$$

Estimating Mechanical Forces on CSM During Aerosolization

After liftoff and aerosolization, CSMs can occasionally be bent because of the following reasons: (1) turbulent forces during propulsion, (2) collision during landing, or (3) capillary forces during drying (FIGS. 75A-75B). The first two factors are similar in a way that they are caused by rotating dynamics of CSM that is caused by external turbulent forces. Hence, rotational force $F_r$, associated with these two effects, can be estimated as:

$$F_r = m\beta R, \quad (45)$$

where m is CSM mass and β CSM rotational acceleration. During propulsion, CSM experience turbulent flow, meaning that can β be approximated as $$\beta = \frac{d\omega}{dt} \approx \frac{1}{2R} \frac{dv}{dt},$$

where ω is CSM angular frequency. Taking the nebulizer tube length to be 2 cm long, CSM acceleration is estimated as $10^3$ m/s$^2$ and $F_r = 10^{-8}$ N.

Capillary forces $F_c$ during drying can be calculated as:

$$F_c = \sigma l, \quad (46)$$

where σ is water surface tension and l is water perimeter length over which CSM bending occurs. Taking σ=0.1 N/m and l=$10^{-4}$ m, $F_c = 10^{-5}$ N.

The bending force ($F_b$) for CSM is calculated as:

$$F_b = \frac{4wh^3 dE}{L^3}, \quad (47)$$

where w is the CSM width (50 µm), h CSM thickness (1 µm), d bending displacement, E SU-8 Young's modulus (2·10$^9$ Pa), and L bending length (50 µm). For minimal displacement of d=1 µm, $F_b \sim 10^{-6}$ N. These forces may fluctuate a lot due to nonlinear effects and CSM aggregation, however, capillary forces appear to be the most probable reason for CSM deflection, which is visible in FIGS. 75A-75B, where most CSMs have their edges folded. Water droplets of this size dry within 25-160 sec. This indicates that the droplets do not dry throughout their flight; the presence of a water envelope possibly enhances CSM stability during landing and further minimizes the effects of turbulent forces.

Strain Guided Fracture Propagation with Stochastic Seed Crack Formation a. An Existing Model There is an existing model on soft material fracturing within a strain field induced by curvature. See Mitchell N P, Koning V, Vitelli V, Irvine W T M. Fracture in sheets draped on curved surfaces. *Nat. Mater.* 2017, 16(1): 89-93, which is incorporated by reference in its entirety. Conforming materials to rigid substrates with Gaussian curvature—positive for spheres and negative for saddles—has proven a versatile tool to guide the self-assembly of defects such as scars, pleats, folds, blisters, and liquid crystal ripples. It has been shown that curvature can likewise be used to control material failure and guide the paths of cracks. A simple analytical model has been proposed to capture crack behavior at the onset of propagation, while a two-dimensional phase-field model with an added curvature term successfully captures the crack's path. Because the curvature-induced stresses are independent of material parameters for isotropic brittle media, these results apply across scales, particularly on the nanometer scale for the generation of microparticles reported thereof.

b. Crack Response to Curvature Stresses and Formulation in Terms of Curvature Potential Consider the stresses induced by curvature and their interaction with the crack tip in a flat sheet. Stresses generated in the bulk of a material become concentrated near a crack tip. In turn, a crack extends when the intensity of stress concentration exceeds a material-dependent, critical value. Expressed mathematically, in the local coordinates of the crack tip (r, θ), the stress in the vicinity of the tip takes the form $$\sigma_{ij} = \frac{K_I}{\sqrt{2\pi r}} f_{ij}^{I}(\theta) + \frac{K_{II}}{\sqrt{2\pi r}} f_{ij}^{II}(\theta) \tag{48}$$

where $f_{ij}^{I,II}$ are universal angular functions. The factors $K_I$ and $K_{II}$ measure the intensity of tensile and shear stress concentration at the crack tip, respectively, and are known as stress intensity factors. Thus, the Griffith length, $a_c$, is the length of the crack at which the intensity of stress concentration reaches the critical value, $K_c$. In curved plates or sheets, the near-tip stress fields display the same singular behavior as in Eq. (48), but the values of the stress intensity factors are governed by curvature.

Curving a flat sheet involves locally stretching and compressing the material by certain amounts at each point. According to the rules of differential geometry, this stretching factor, controlled by the field Φ(ρ), is determined by an equation identical to the Poisson equation of electrostatics, with the Gaussian curvature, G(ρ), playing the role of a continuous charge distribution $$\Delta^2\Phi(\rho) = -G(\rho) \tag{49}$$

As the sheet equilibrates, its elasticity tends to oppose this mechanical constraint, giving rise to stress. The isotropic stress from curvature is then related to the potential via $$\sigma_{kk}^{G} = E\Phi \tag{50}$$

where E is the Young's modulus, and the stress components are determined by integrals of the curvature potential. It has been reported previously that positive (negative) curvature promotes local stretching (compression) of an elastic sheet, leading to the enhancement (suppression) of crack initiation. Variations in the potential Φ(ρ) steer the crack path, with the form determined from the curvature distribution.

Curvature not only governs the critical length for fracture initiation, but also the direction of a crack's propagation. For cracks inclined with respect to the bump, the cracks change direction as they begin to propagate, kinking at the onset of crack growth and curving around the bump. Cracks kink and curve towards the azimuthal direction because a decaying curvature potential, Φ(ρ), creates a local stress asymmetry. As a result, the crack relieves more elastic energy by deflecting towards the azimuthal direction. Analytical prediction of the kink angle, $\theta_k$, has previously been made by selecting the direction of maximum hoop stress asymptotically near the crack tip.

Given knowledge of the stress field of an uncracked sheet on a curved surface, the stress intensity factors ($K_I$, $K_{II}$) for a crack on that curved surface has been calculated previously. See Zhang P, Ma L, Fan F, Zeng Z, Peng C, Loya P E, et al. Fracture toughness of graphene. *Nat. Commun.* 2014, 5: 3782, which is incorporated by reference in its entirety. These quantities measure the intensity of tensile and shear stress concentration at the crack tip. The stress intensity factors for each seed crack position and orientation follow from integrating the infinite-plane Westergaard solution over the crack length $$K_{I,II} = \frac{1}{\sqrt{\pi a}} \int_{-a}^{a} \sqrt{\frac{a+\xi}{a-\xi}}\, \tilde{\sigma}_{I,II}(\xi, 0) \tag{51}$$

where $\tilde{\sigma}_I(x,y)=\tilde{\sigma}_{xy}(x,y)$ and $\tilde{\sigma}_{II}(x,y)=\tilde{\sigma}_{yy}(x,y)$ are the tensile and shear stresses, respectively, in the crack's local x-y coordinate system. The tilde distinguishes $\tilde{\sigma}_{ij}(x,y)$ from $\sigma_{ij}(\rho,\phi)$, which is a function of the material coordinate system rather than the crack coordinate system and is therefore a different function of its arguments, despite being the same physical quantity. Here a is the crack length, and by selecting the direction of maximum hoop stress ($\tilde{\sigma}_{\theta\theta}$) at the crack tip as the direction of crack propagation, the kink angle at the onset of propagation takes the form $$\theta_k = 2\arctan\left(\frac{2\eta}{1+\sqrt{1+8\eta^2}}\right) \tag{52}$$

where $\eta=K_{II}/K_I$ and if a crack whose length is relatively small compared to the length scale over which the stress fields vary, that is, $$a\left|\frac{\partial \tilde{\sigma}_{iy}}{\partial x}\right| = \tilde{\sigma}_{iy},$$

the expression for η simplifies, because $$K_I = \sqrt{\pi\alpha}(\sigma_{\rho\rho}(\rho^*)\sin^2(\beta) + \sigma_{\phi\phi}(\rho^*)\cos^2(\beta)) \tag{53}$$

$$K_{II} = \sqrt{\pi\alpha}\{\sigma_{\phi\phi}(\rho^*) - \sigma_{\rho\rho}(\rho^*)\}\sin(\beta)\cos(\beta) \tag{54}$$

where the inclination angle β is the angle of the seed crack with respect to the radial direction. Since $K_{II}$ vanishes for radial and azimuthal cracks ($\beta=0$, $\pi/2$), these cracks do not kink, while for intermediate values of $\beta$, that is, for $\beta$ mod $$\left(\frac{\pi}{2}\right) \neq 0,$$

the shear stress on the crack, measured by $K_{II}$, will be nonzero. Therefore, if the crack grows, it will kink at the onset of propagation.

For azimuthal seed cracks ($\beta=\pi/2$), there is no kink because the loading is mode I (tensile) for small seed cracks, but as the crack grows, the asymmetric stresses from curvature direct the crack in a continuous arc. The Griffith length ($a_c$) of a crack is the length at which the energy released by extending the crack exceeds the fracture energy. This corresponds to the condition that the intensity of stress concentration in some direction $\bar{\theta}$ exceeds the critical stress intensity factor $K_c$. For a crack which is small compared to the scale of stress variations, again centered at $\rho=\rho^*$ with inclination angle $\beta$, the Griffith length can be expressed as $$a_c \approx \frac{K_c^2}{\pi \{\sigma_{yy}(\rho^*) f_{\theta\theta}^I(\bar{\theta}) + \sigma_{xy}(\rho^*) f_{\theta\theta}^{II}(\bar{\theta})\}^2} \quad (55)$$

where $\bar{\theta}=-\theta_k$ is the direction of maximum hoop stress, and $f_{ij}^{I,II}$ are universal angular functions, and the stresses are $$\sigma_{yy}(\rho^*)=\sigma_{\rho\rho}(\rho^*)\sin^2(\beta)+\sigma_{\phi\phi}(\rho^*)\cos^2(\beta) \quad (56)$$

$$\sigma_{xy}(\rho^*)=\{\sigma_{\phi\phi}(\rho^*)-\sigma_{\rho\rho}(\rho^*)\}\sin(\beta)\cos(\beta) \quad (57)$$

If small cracks were considered, expressions for the kink angle and Griffith length are in terms of the curvature potential $\Phi(\rho)$. For any rotationally symmetric curvature distribution $G(\rho)$, it has been shown that the ratio of the stress intensity factors of a small crack centered at $\rho^*$ is $$\eta = \frac{(\Phi - \Omega)\sin(2\beta)}{\Phi + (\Phi - \Omega)\cos(2\beta)} \quad (58)$$

where $$\Omega(\rho^*) \equiv \frac{2}{\rho^{*2}} \int_0^{\rho^*} \rho' \Phi(\rho') d\rho' \quad (59)$$

is the average value of the curvature potential in the region enclosed by the circle of radius $\rho^*$. Thus, the quantity $\Phi-\Omega$ appearing in Eq. (58) is the difference between the local value of the potential $\Phi(\rho^*)$ and the value of the potential averaged from the center to the location of the crack, and this quantity can be readily identified as the local stress asymmetry.

For the crack to propagate, the tractions along the crack faces must be positive. Therefore, the sign of this stress asymmetry determines whether the crack kinks towards the radial or azimuthal direction. For a crack in a potential "well" (where $\Phi$ increases with radial distance), the crack kinks toward the radial direction (with respect to the center of the well). For a crack in a potential "dome" or "peak" (where b decreases with radial distance), the crack kinks toward the azimuthal direction. Note this in turn establishes the guiding principle that directs crack propagation along "maximum hoop strain" that has been exploited to great effect in this work.

The Griffith length for the small crack can likewise be computed from a symmetric curvature potential, $\Phi(\rho)$, via $$a_c = \frac{4K_c^2}{\pi E^2 \{2\Phi F(\bar{\theta}, \beta)\cos(\beta) - \Omega F(\bar{\theta}, 2\beta)\}^2} \quad (60)$$

where $$F(\bar{\theta},\beta)=f_{\theta\theta}^I(\bar{\theta})\cos(\beta)+f_{\theta\theta}^{II}(\bar{\theta})\sin(\beta) \quad (61)$$

Note that the curvature potential measures the local isotropic compression $$\theta(\vec{x}) = \frac{\tilde{\sigma}_{xx}(\vec{x}) + \tilde{\sigma}_{yy}(\vec{x})}{E} \quad (62)$$

This implies that crack growth tends to be suppressed in regions where $\Phi<0$ and stimulated where $\Phi>0$. A local stress asymmetry, however, can play an important role in attenuating this generalization. A curvature potential which increases with radial distance (a potential "well") preferentially stimulates the growth of cracks which are oriented along the radial direction, so that the Griffith length of a radial crack in a potential well is smaller than that of an azimuthal crack centered the same distance $\rho^*$ from the minimum of $\Phi$. Conversely, potentials, which decrease with distance from the center preferentially, stimulate the growth of cracks oriented along the azimuthal direction.

a. Estimation of the Griffith Length for Free-Standing Graphene

The minimum seed crack needed for run-away fracture propagation on freestanding graphene is estimated using Eq. (60) and (61). First, it is needed to figure out what function form each term takes on. In terms of the universal angular functions, coordinate transformation is performed (from local Cartesian to global Polar) for mode I as such $$f_{xx}^I(\bar{\theta}) = \cos\left(\frac{1}{2}\theta\right)\left\{1 - \sin\left(\frac{1}{2}\theta\right)\sin\left(\frac{3}{2}\theta\right)\right\} \quad (63)$$

$$f_{xy}^I(\bar{\theta}) = \cos\left(\frac{1}{2}\theta\right)\sin\left(\frac{1}{2}\theta\right)\cos\left(\frac{3}{2}\theta\right) \quad (64)$$

$$f_{yy}^I(\bar{\theta}) = \cos\left(\frac{1}{2}\theta\right)\left\{1 + \sin\left(\frac{1}{2}\theta\right)\sin\left(\frac{3}{2}\theta\right)\right\} \quad (65)$$

Recall that $$f_{\theta\theta}^I = \vec{e}_\theta \cdot \underline{f}^I \cdot \vec{e}_\theta \quad (66)$$

and $$\vec{e}_\theta = -\sin(\theta)\vec{e}_x + \cos(\theta)\vec{e}_y \quad (67)$$

where a universal function angular function tensor $\underline{f}^I$ was defined with the following form $$\underline{f}^I = \begin{bmatrix} f_{xx}^I & f_{xy}^I \\ f_{yx}^I & f_{yx}^I \end{bmatrix} \quad (68)$$

If $f^I$ is a symmetric tensor (i.e., $f_{ij}^I = \theta_{ji}^I$), it follows that $$f_{\theta\theta}^I(\overline{\theta}) = \sin^2(\overline{\theta}) f_{xx}^I(\overline{\theta}) - 2\sin(\overline{\theta})\cos(\overline{\theta}) \theta_{xy}^I(\overline{\theta}) + \cos^2(\overline{\theta}) f_{yy}^I(\overline{\theta}) \quad (69)$$

Similarly, mode II is calculated, $$f_{\theta\theta}^{II}(\overline{\theta}) = \sin^2(\overline{\theta}) f_{xx}^{II}(\overline{\theta}) - 2\sin(\overline{\theta})\cos(\overline{\theta}) f_{xy}^{II}(\overline{\theta}) + \cos^2(\overline{\theta}) f_{yy}^{II}(\overline{\theta}) \quad (70)$$

given that $$f_{xx}^{II}(\overline{\theta}) = -\sin\left(\frac{1}{2}\theta\right)\left\{2 + \cos\left(\frac{1}{2}\theta\right)\cos\left(\frac{3}{2}\theta\right)\right\} \quad (71)$$

$$f_{xy}^{II}(\overline{\theta}) = \cos\left(\frac{1}{2}\theta\right)\left\{1 - \sin\left(\frac{1}{2}\theta\right)\sin\left(\frac{3}{2}\theta\right)\right\} \quad (72)$$

$$f_{yy}^{II}(\overline{\theta}) = \sin\left(\frac{1}{2}\theta\right)\cos\left(\frac{1}{2}\theta\right)\cos\left(\frac{3}{2}\theta\right) \quad (73)$$

Figure 87:
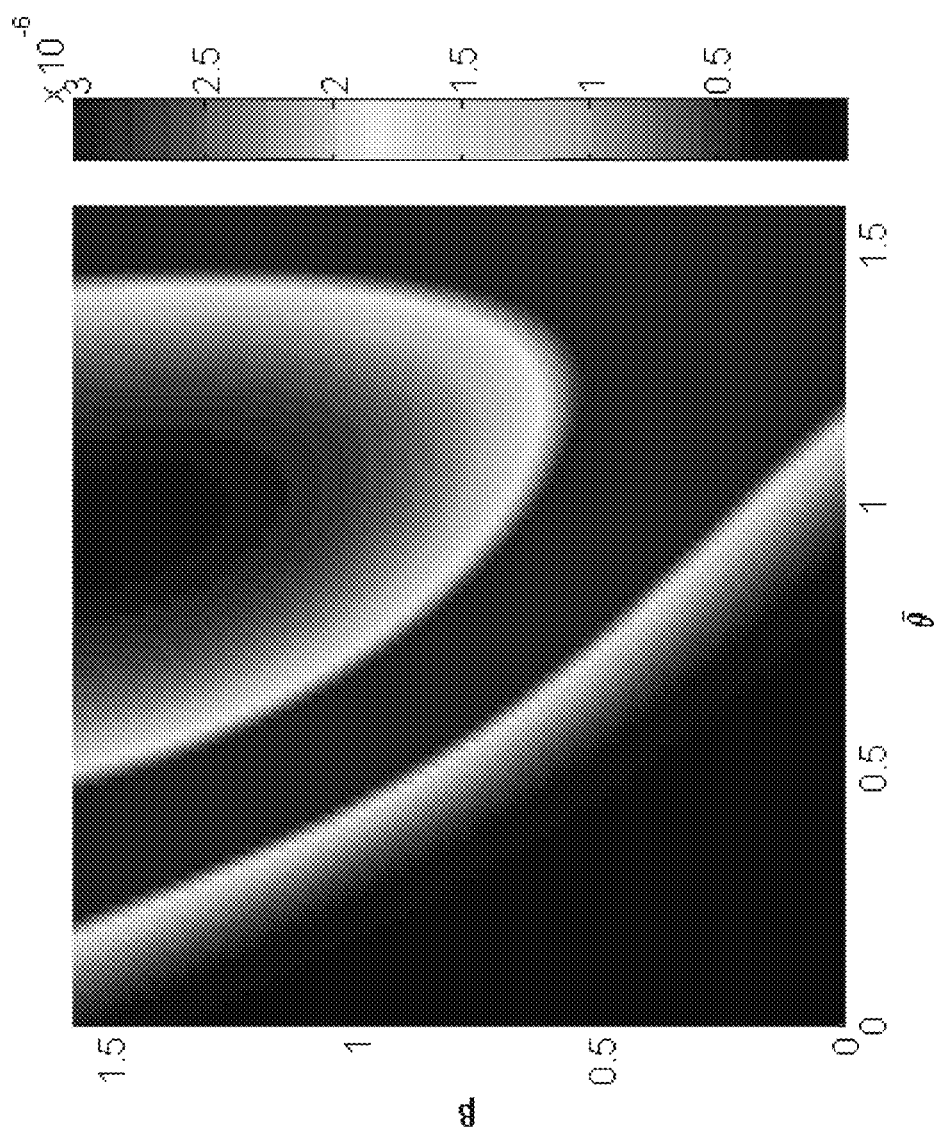
FIG. 87 shows Griffith length scans over all possible fracture angles and seed crack angles from 0° to 90° (referenced to radial direction).

In terms of the other parameter values, the critical stress intensity factor for monolayer graphene, $K_c$, has recently been experimentally measured to be $4.0 \pm 0.6$ MPa·m$^{1/2}$ (see Zhang P, Ma L, Fan F, Zeng Z, Peng C, Loya P E, et al. Fracture toughness of graphene. Nat. Commun. 2014, 5: 3782, which is incorporated by reference in its entirety) and the Young's modulus of graphene, E, is approximately 1 TPa (see Lee G-H, Cooper R C, An S J, Lee S, van der Zande A, Petrone N, et al. High-Strength Chemical-Vapor-Deposited Graphene and Grain Boundaries. *Science* 2013, 340(6136): 1073-1076, which is incorporated by reference in its entirety); as for Φ, it is just the curvature potential (or lattice strain), which according to the simulation in the above sections, is estimated to be around 1% at the point of maximum strain. With these, all possible values of β's can be scanned over and $\overline{\theta}$'s and plot the Griffith lengths in units of meters. In this phase space, there are large areas where the Griffith lengths are as low as 10 nm, which will automatically perforate under this strain, given the random seed cracks/defects present in monolayer graphene grown under laboratory CVD conditions (FIG. 87).

e. Kinetic Monte-Carlo Simulation of Crack Propagation

A kinetic Monte-Carlo model (rejection KMC method) is created to simulate the stochastic crack initiation and propagation. To monitor the fracture path at the micrometer level, 2D square lattice is used to capture the birds-eye geometry of the graphene-polystyrene-graphene ink-jet printed array. Crack initiation is assigned randomly with a given probability over the entire graphene lattice at each iteration step. Transition rates for continued propagation at each of the four possible directions are then calculated and executed accordingly. Upon the creation of the 2D lattice, the key iteration steps can be summarized generically as following:

1. Set the time t=0.
2. Choose an initial state k.
3. Get the number $N_k$ of all possible transition rates, from state k into state i.
4. Find the propagation event to carry out i by uniformly sampling from the $N_k$ transitions above.
5. Accept the event with probability $f_{ki} = r_{ki}/r_0$, where $r_0$ is a stuitable upper bound for $r_{ki}$.
6. If accepted, update the current state from k to i.
7. Geta new uniform random number u' from 0 to 1.
8. Update the time with $t = t + \Delta t$, where $\Delta t = (N_k r_0)^{-1} \ln(1/u')$.
9. Return to step 3.

Figure 88:
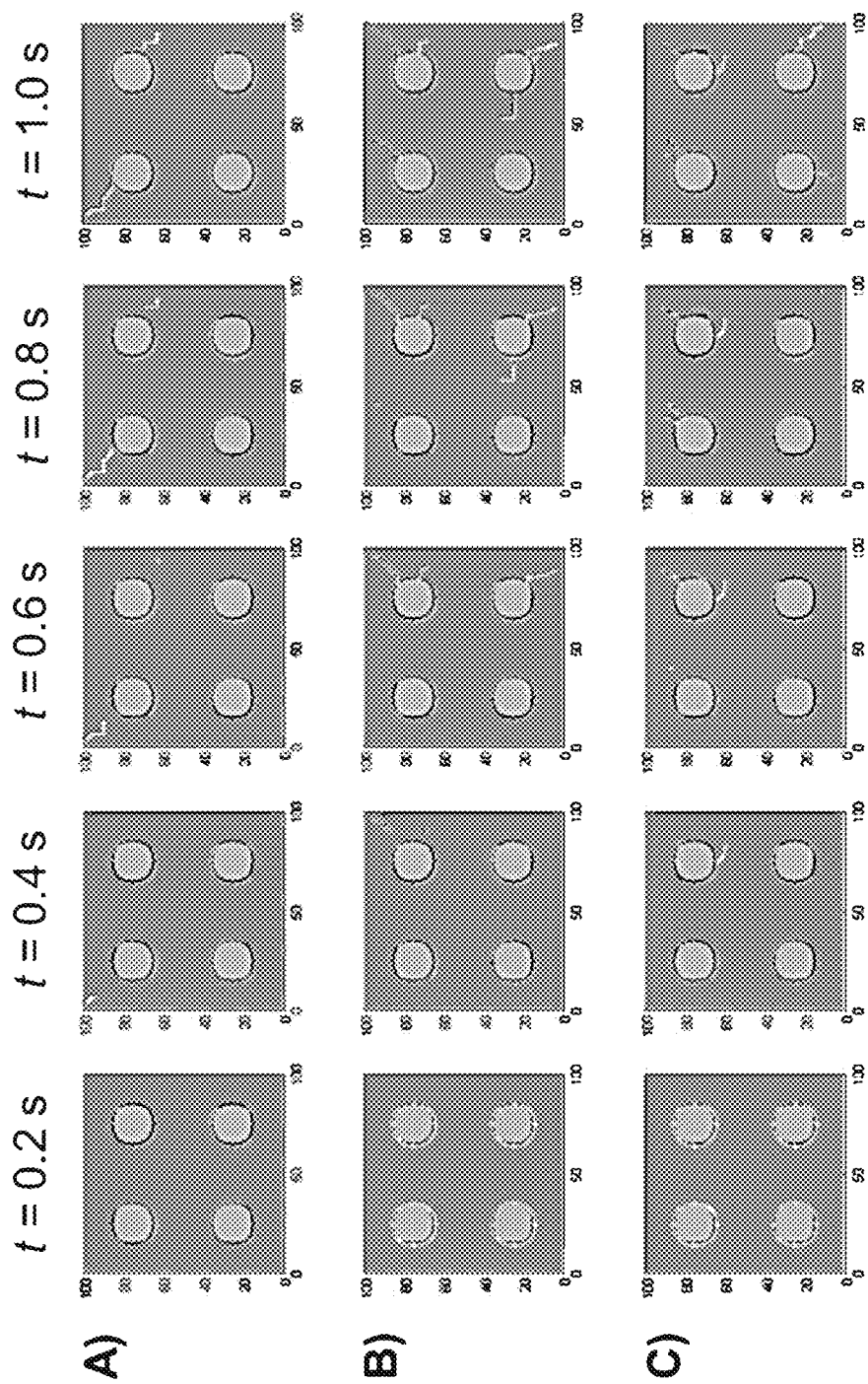
FIG. 88 shows A), B), and C) display 5 time elapsed states for three individual crack propagation events. The time evolution of the crack path can be seen as white, and ink-jet printed microspots are displayed as yellow, where as non-supported graphene double layers (top and bottom) are colored blue.

Three example simulation results are shown (FIG. 88). The propagation events are captured and the polystyrene microspots serve to attract propagating cracks as well as directing the cracks around their perimeters to guide and ensure a perfect autoperforation process.

Figure 89:
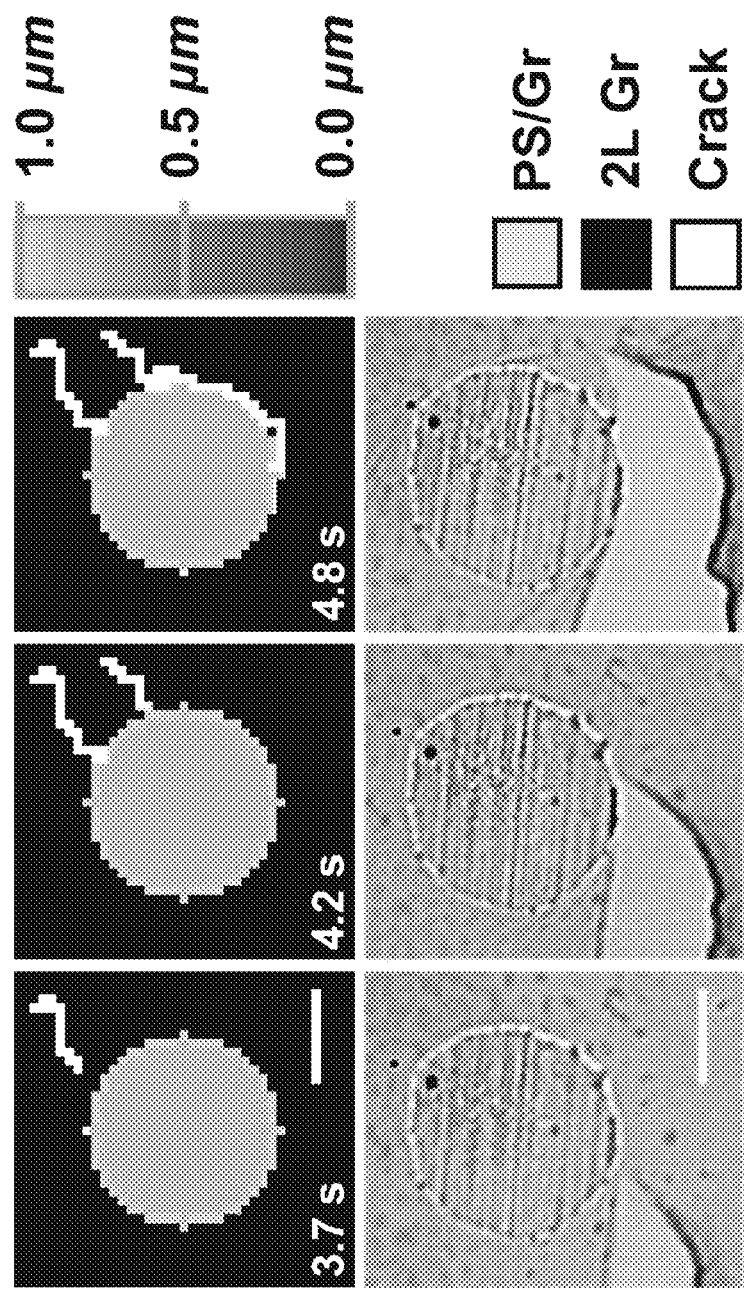
FIG. 89 shows comparison of crack formation around a single ink-jet printed microspot with experimental observation under optical microscope. PS stands for polystyrene, Gr stands for graphene.
Figure 90:
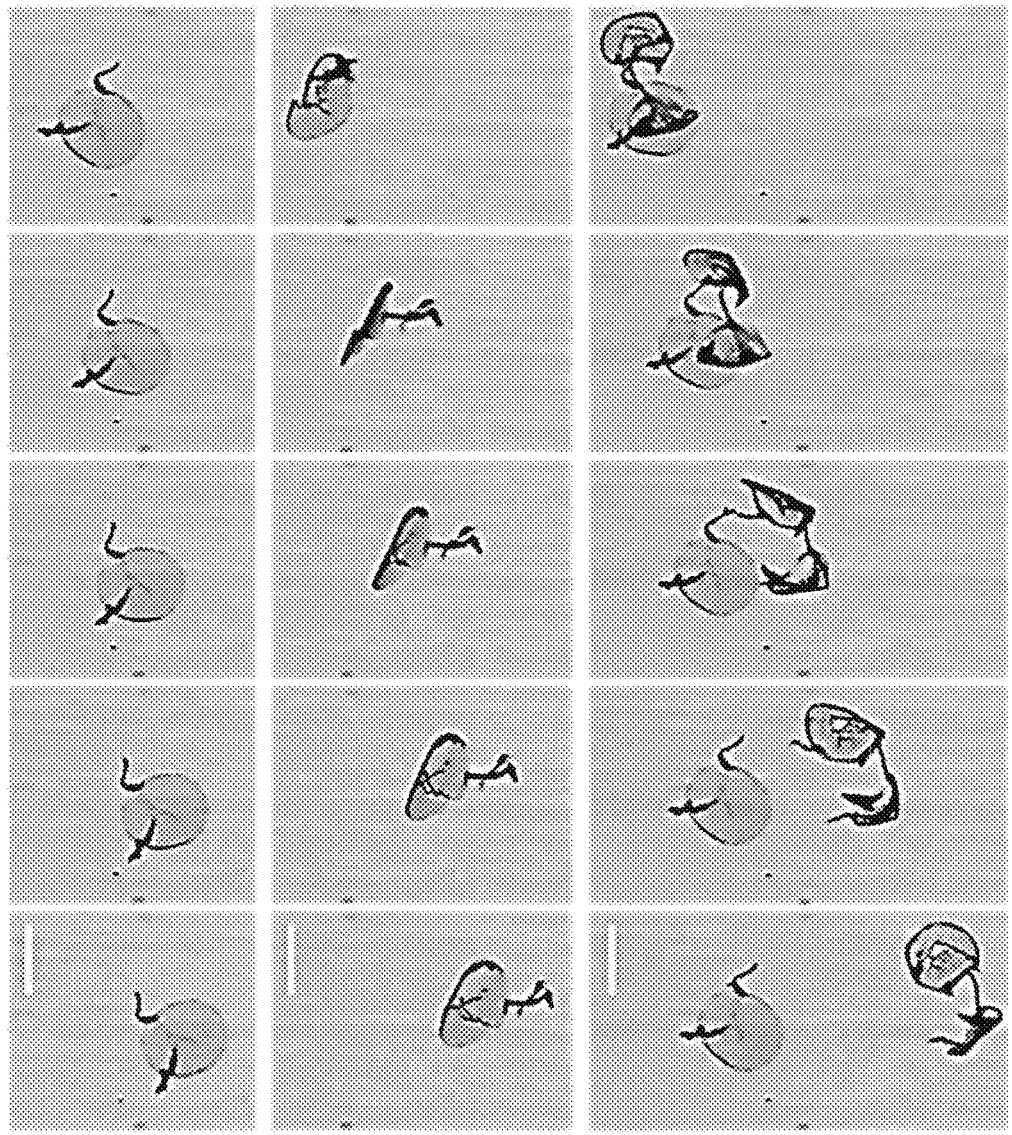
Figure 91:
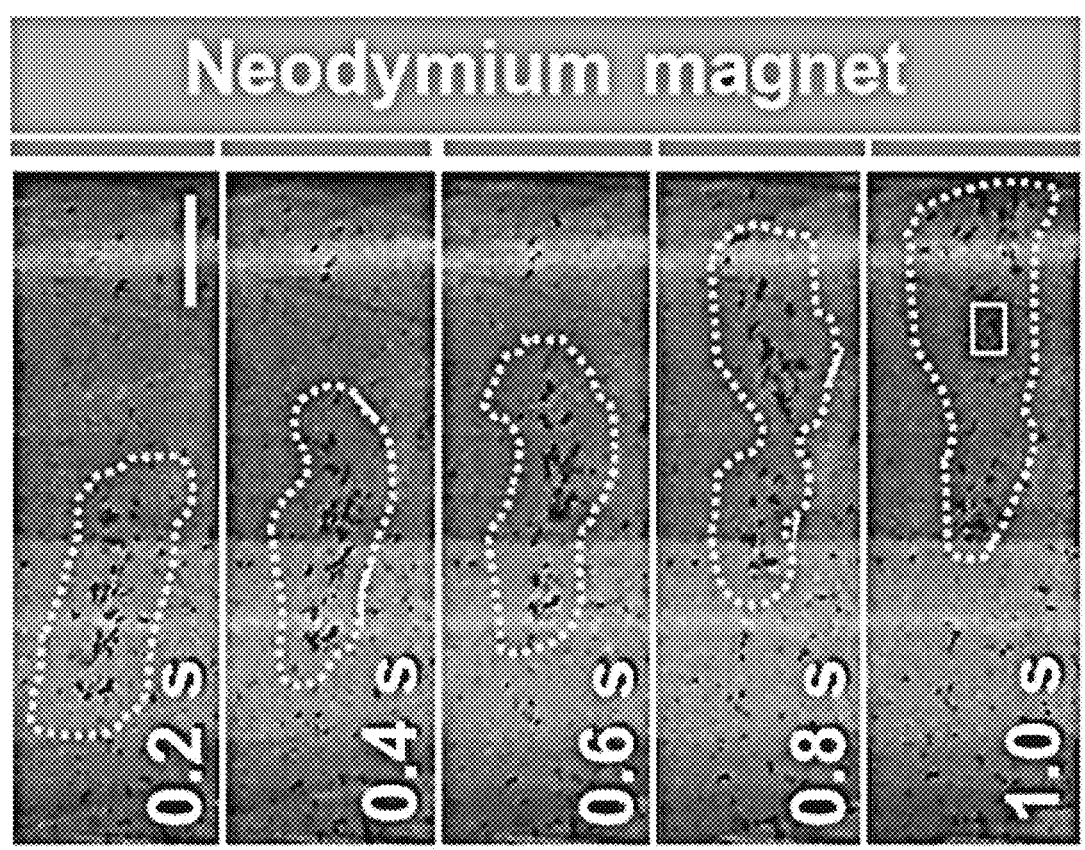
FIG. 91 shows time elapsed optical images of Gr-$Fe_3O_4$/PS-Gr microparticles suspended in solution under the influence of a neodymium magnet on the right hand side of the image. Black dots are microparticles. Each image is time stamped. Scale bar represents 1.0 cm. A group of microparticles were circled by white dotted line and their trajectories are followed as time evolves.
Figure 92A:
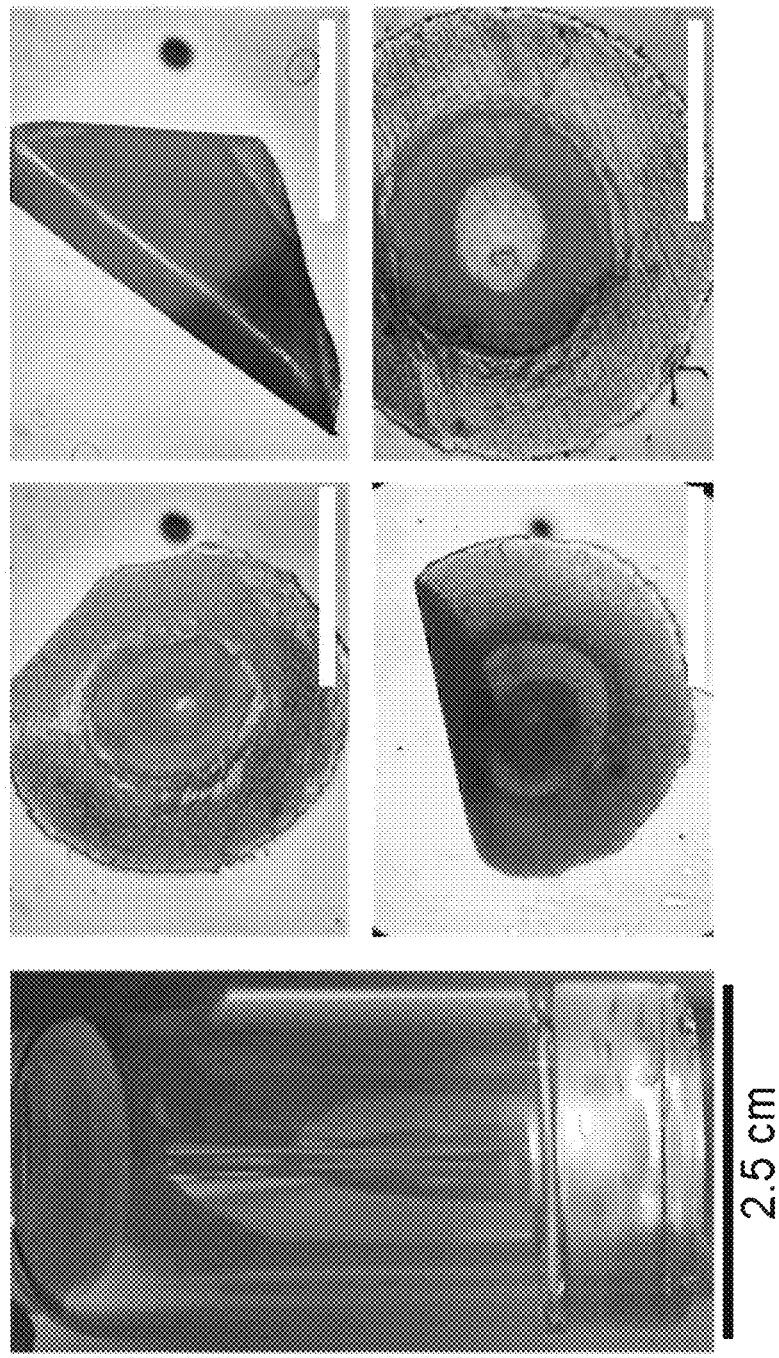
FIGS. 92A-92B show optical images of G-PS-G particles (same ink above) printed by capillary glass tube manually, with a printing volume about 0.1-0.5 μL. The resulted particles have mm-sized diameters, a folded structure can be found after drying, scale bars are 1 mm for the right four subfigures.
Figure 92B:
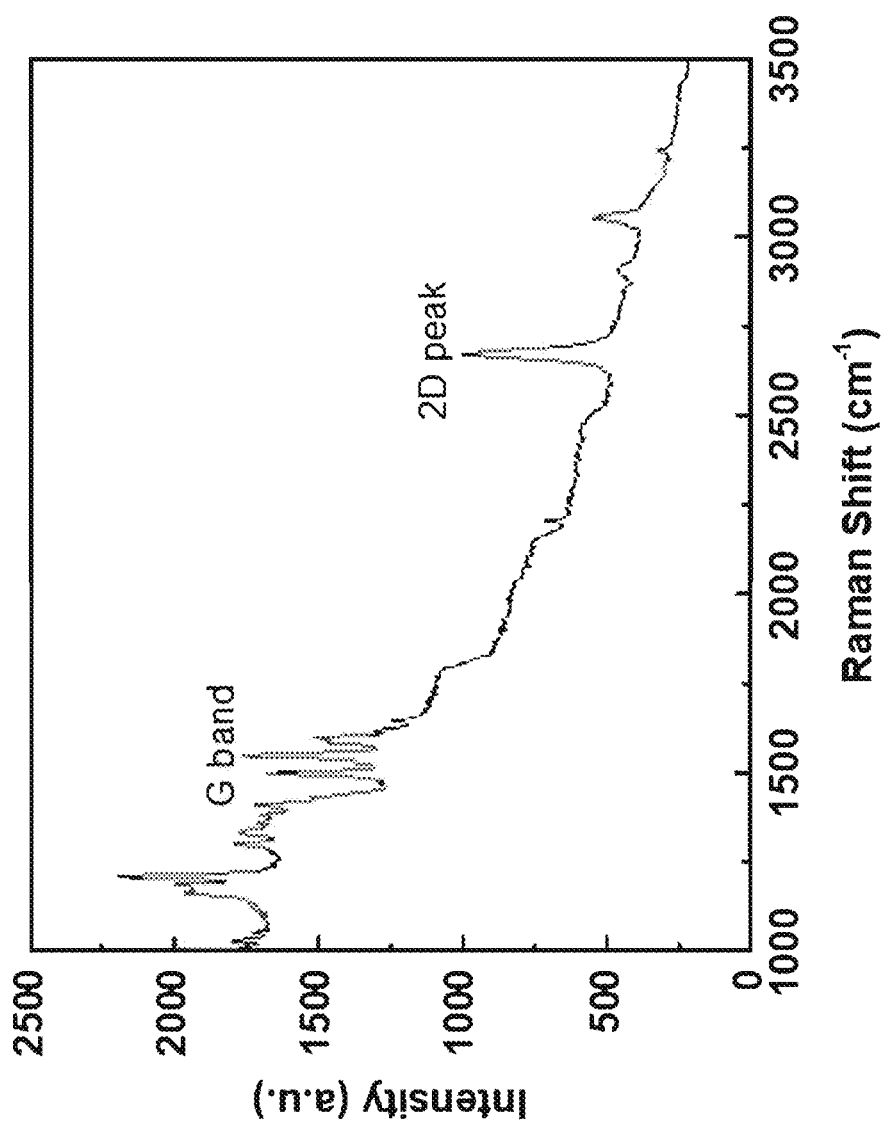
Figure 93:
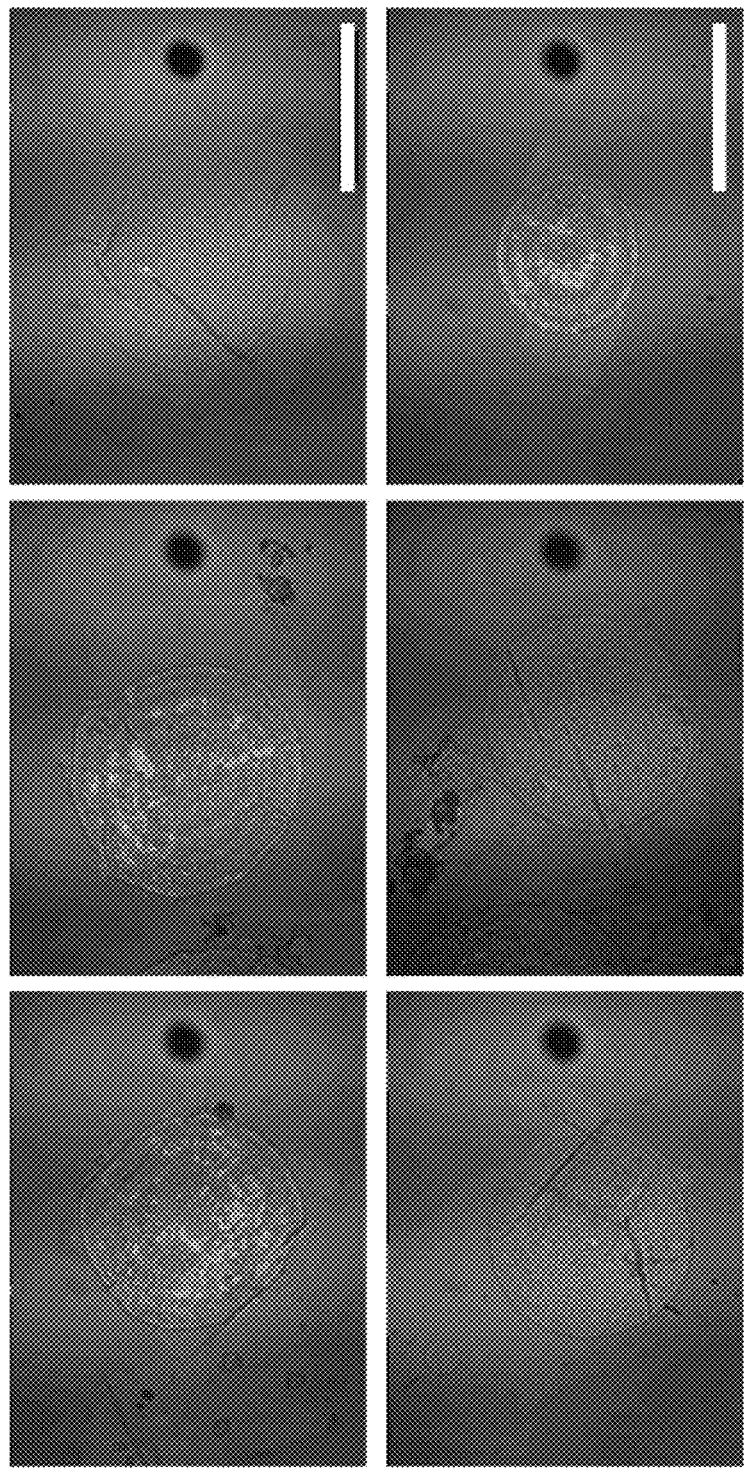
FIG. 93 shows the effect of the inner functionalization of graphene sheets on the morphology of the microparticles, visible wings similar to FIG. 21B above were evidenced by the microscope images of the microparticles, scale bar, 200 µm. The functional molecules 1-pyrenecarboxylic acid and 1-aminopyrene were used for the non-covalent functionalization of the two interior surfaces that contact the printed PS spots, while the outer surface of the graphene layers remain pristine without chemical modification. 1.2 wt % PS latexes (100 nm mean particle size, amine-functionalized) with a volume of 1 nL was used for inkjet printing.
Figures 94A, 94B:
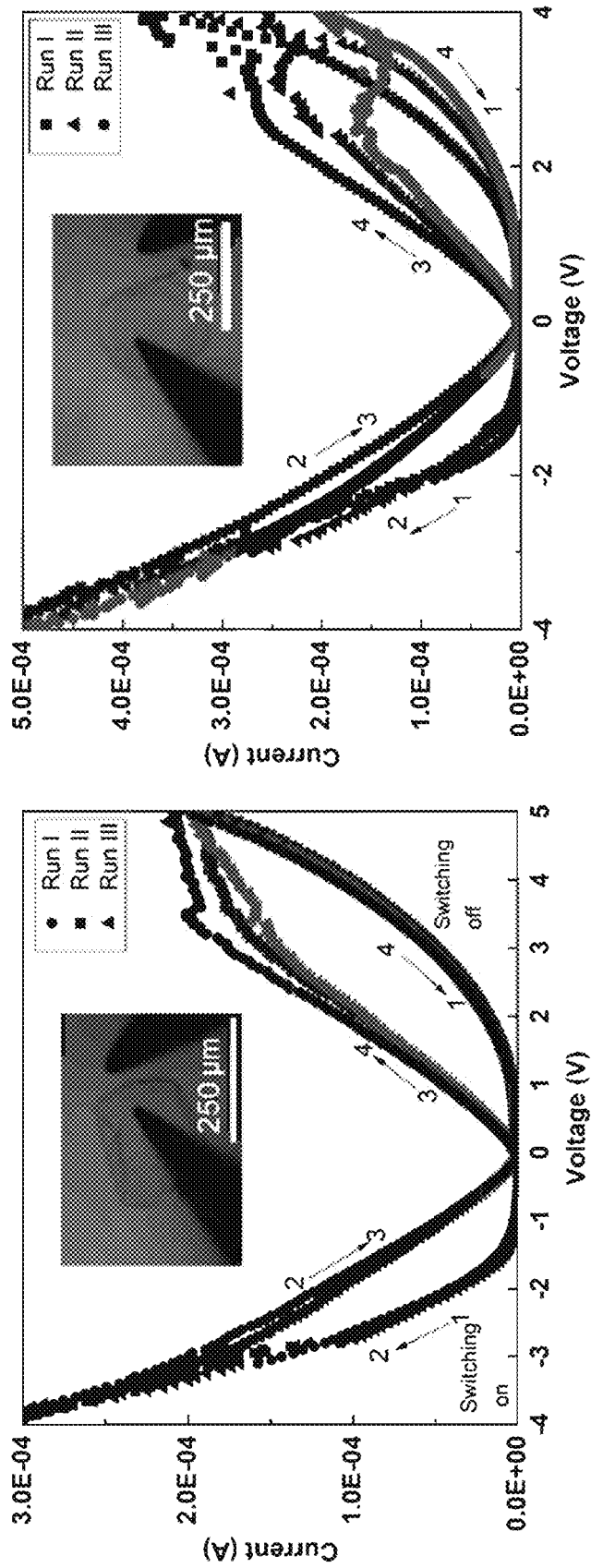
FIGS. 94A-94B shows typical I-V characteristics of G-GOx (1 wt %)/PS-G (FIG. 94A) and G-MoS$_2$ (0.07 wt %)/PS-G (FIG. 94B) microparticles at CV scan 0 V→−4 V→0 V→4 V→0 V. The insets of show the tested particles with the left probe contacting the top surface of the microparticles, and right probe contacting the ITO/glass substrate, the whole particle is placed on ITO/glass surface.
Figure 95A:
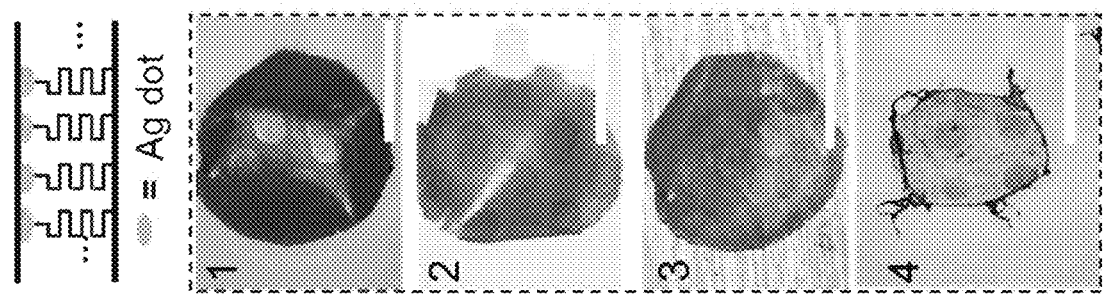
FIG. 95A shows illustration of the cross-plane view of multiple memristor elements with Ag spots underneath a graphene layer and the fabricated particles with silver microspot array: 1-3 are G-GOx (1 wt %)/PS-G particles, GOx/PS composite ink with solid content of 1.25 wt % and silver dispersion with a concentration about 0.15-0.175 wt % were used in the fabrication; 4 is G-MoS$_2$ (0.07 wt %)/PS-G particle, the 0.625 wt % composite ink and 0.15-0.175 wt % silver dispersion were used for the fabrication. Scales bars, 1 mm.
Figures 95B, 95C:
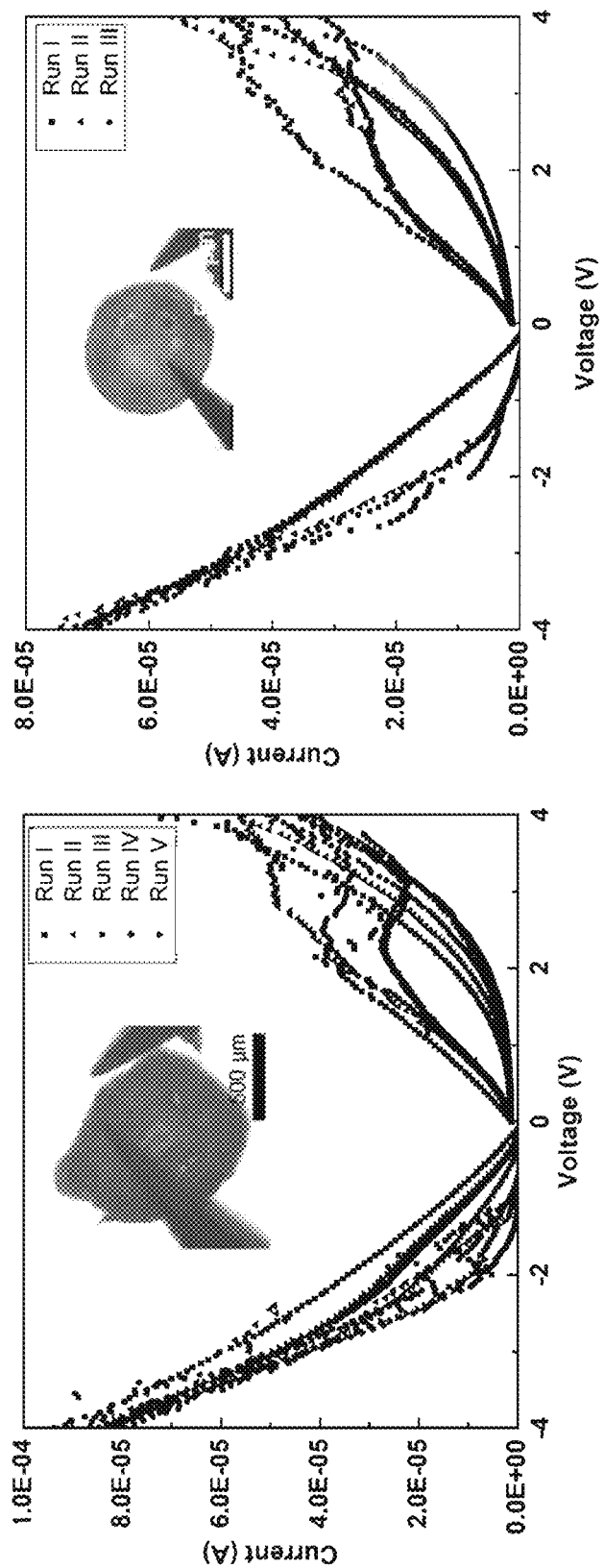
FIGS. 95B-95E show typical I-V characteristics of G-GOx (1 wt %)/PS-G (FIG. 95B), G-MoS$_2$ (1 wt %)/PS-G microparticles (FIG. 95C), and G-MoS$_2$ (0.07 wt %)/PS-G microparticles at various CV scans 0 V→−4 V→0 V→4 V→0 V (FIGS. 95D-95E). The insets of FIGS. 95C-95E show the test particles, the left probe contacting the position of Ag spot right underneath the top graphene layer, and right probe contacting the ITO/glass substrate, the whole particle is placed on ITO/glass surface.
Figures 95D, 95E:
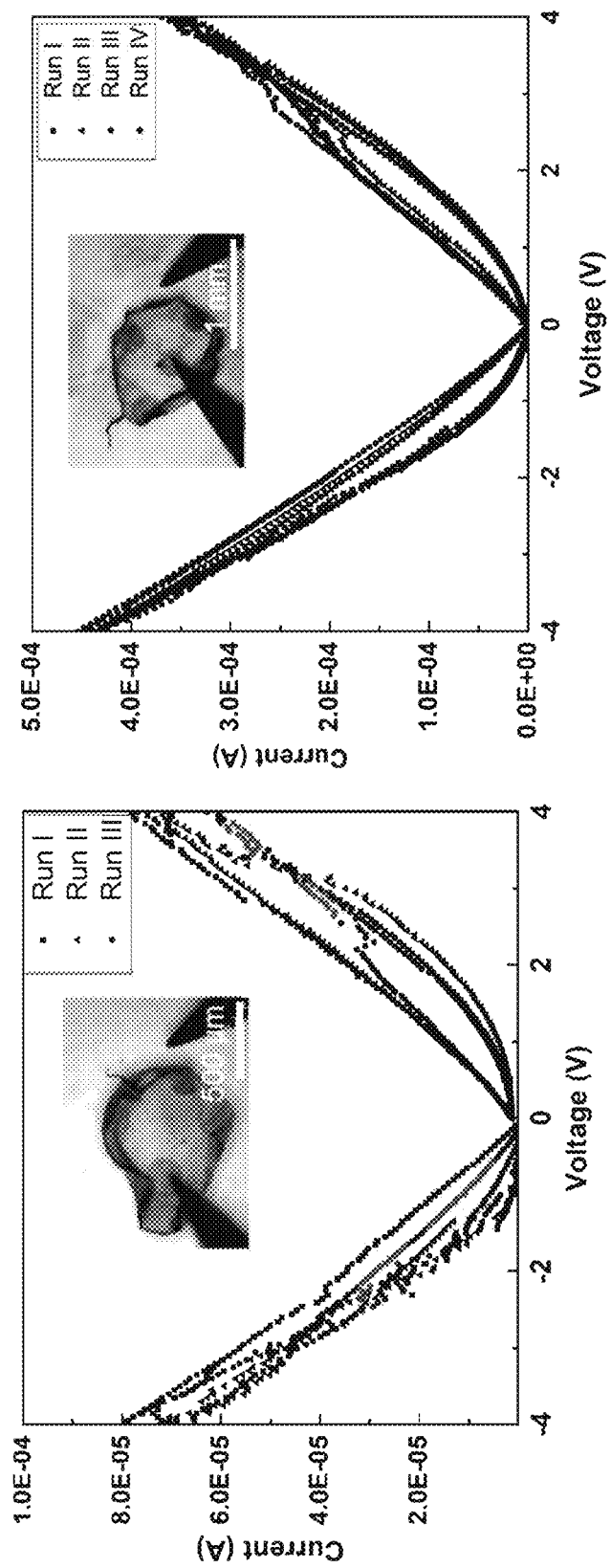

If the crack formation can be zoomed in and compared with microscopy results, the simulation seems to corroborate well with experimental observations (FIG. 89), further establishing the validity of the model based approach.

Other embodiments are within the scope of the following claims.

What is claimed is:

1. A particle comprising: a first sheet comprising a layer including a first material, wherein the first sheet includes a first outer surface and a first inner surface; and a second sheet comprising a layer including a second material, wherein the second sheet includes a second outer surface and a second inner surface, wherein the first sheet and the second sheet form a space, the space including a composition having a nanoparticle, the space encapsulated by the first sheet annealed with the second sheet, wherein the first sheet further comprises a second layer including the first material and the second sheet further comprises a second layer including the second material, and the first outer surface is functionalized.

2. The particle of claim 1, wherein the first material is graphene, molybdenum disulfide, hexagonal boron nitride (hBN), molybdenum diselenide, tungsten disulfide, tungsten diselenide, rhenium diselenide, rhenium disulfide, black phosphorus, platinum diselenide, tin sulfide, or tin selenide.

3. The particle of claim 1, wherein the second material is graphene, molybdenum disulfide, hexagonal boron nitride (hBN), molybdenum diselenide, tungsten disulfide, tungsten diselenide, rhenium diselenide, rhenium disulfide, black phosphorus, platinum diselenide, tin sulfide, or tin selenide.

4. The particle of claim 1, wherein the first outer surface is covalently functionalized.

5. The particle of claim 1, wherein the first outer surface is noncovalently functionalized.

6. The particle of claim 4, wherein the first outer surface is functionalized via .pi.-.pi. stacking.

7. The particle of claim 1, wherein the first inner surface is functionalized.

8. The particle of claim 7, wherein the first outer surface is covalently functionalized.

9. The particle of claim 7, wherein the first outer surface is noncovalently functionalized.

10. The particle of claim 9, wherein the first outer surface is functionalized via .pi.-.pi. stacking.

11. The particle of claim 1, wherein the second outer surface is functionalized.

12. The particle of claim 11, wherein the first outer surface is covalently functionalized.

13. The particle of claim 11, wherein the first outer surface is noncovalently functionalized.

14. The particle of claim 13, wherein the first outer surface is functionalized via .pi.-.pi. stacking.

15. The particle of claim 1, wherein the second inner surface is functionalized.

16. The particle of claim 15, wherein the first outer surface is covalently functionalized.

17. The particle of claim 15, wherein the first outer surface is noncovalently functionalized.

18. The particle of claim 17, wherein the first outer surface is functionalized via .pi.-.pi. stacking.

19. The particle of claim 1, wherein the first sheet includes a plurality of nanopores.

20. The particle of claim 1, wherein the second sheet includes a plurality of nanopores.

21. The particle of claim 1, wherein the composition includes electronics.

22. The particle of claim 1, wherein the composition includes liquid.

23. The particle of claim 1, wherein the composition includes gel.

24. A method of making an particle comprising: preparing a first sheet including a first substrate and a first layer comprising a first material on a first substrate, wherein the first sheet includes a first outer surface and a first inner surface; depositing a composition; preparing a second sheet including a second substrate and a second sheet comprising a second material on the second substrate, wherein the second sheet includes a second outer surface and a first inner surface; annealing the first sheet and the second sheet such that the space including a composition having a nanoparticle, the space is encapsulated by the first sheet annealed with the second sheet; and autoperforating the first sheet and the second sheet, wherein the first sheet further comprises a second layer including the first material and the second sheet further comprises a second layer including the second material, and the first outer surface is functionalized.

25. A method of detecting an analyte comprising: applying the particle of claim 1, wherein the space includes a sensor; and detecting the analyte with the sensor.

* * * * *